US012484442B2

(12) United States Patent
Kaneko et al.

(10) Patent No.: US 12,484,442 B2
(45) Date of Patent: Nov. 25, 2025

(54) PHOTOELECTRIC CONVERSION ELEMENT, IMAGING ELEMENT, OPTICAL SENSOR, AND COMPOUND

(71) Applicant: FUJIFILM Corporation, Tokyo (JP)

(72) Inventors: Kazuhei Kaneko, Kanagawa (JP); Yosuke Yamamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 556 days.

(21) Appl. No.: 18/050,047

(22) Filed: Oct. 26, 2022

(65) Prior Publication Data

US 2023/0144755 A1 May 11, 2023

Related U.S. Application Data

(63) Continuation of application No. PCT/JP2021/016702, filed on Apr. 27, 2021.

(30) Foreign Application Priority Data

Apr. 30, 2020 (JP) ................................ 2020-080573
Oct. 30, 2020 (JP) ................................ 2020-182647

(51) Int. Cl.
*H10K 85/60* (2023.01)
*H10K 30/00* (2023.01)
(Continued)

(52) U.S. Cl.
CPC ........... *H10K 85/657* (2023.02); *H10K 30/20* (2023.02); *H10K 30/30* (2023.02); *H10K 30/353* (2023.02);
(Continued)

(58) Field of Classification Search
CPC ...... H10K 30/00; H10K 30/20; H10K 30/353; H10K 30/82; H10K 85/657; H10K 85/654;
(Continued)

(56) References Cited

U.S. PATENT DOCUMENTS

| | | | |
|---|---|---|---|
| 10,903,433 B2 | 1/2021 | Miyashita et al. | |
| 2013/0042918 A1 | 2/2013 | Evans et al. | |

(Continued)

FOREIGN PATENT DOCUMENTS

| | | |
|---|---|---|
| CN | 109096312 | 12/2018 |
| JP | 2019073471 | 5/2019 |

(Continued)

OTHER PUBLICATIONS

Podlesný et al, Small isomeric push-pull chromophores based on thienothiophenes with tunable optical (non)linearities, Org. Biomol. Chem., 2019, 17, 3623-3634. (Year: 2019).*

(Continued)

*Primary Examiner* — Andrew J Golden
(74) *Attorney, Agent, or Firm* — JCIPRNET

(57) ABSTRACT

An object of the present invention is to provide a photoelectric conversion element that exhibits excellent external quantum efficiency and responsiveness to light at all wavelengths in a red wavelength region, a green wavelength region, and a blue wavelength region. Another object of the present invention is to provide an imaging element, an optical sensor, and a compound related to the photoelectric conversion element.
The photoelectric conversion element includes, in the following order, a conductive film, a photoelectric conversion
(Continued)

film, and a transparent conductive film, in which the photoelectric conversion film contains a compound represented by Formula (1).

(1)

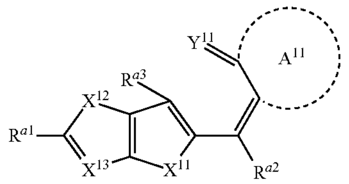

14 Claims, 1 Drawing Sheet

(51) Int. Cl.

| | |
|---|---|
| ***H10K 30/20*** | (2023.01) |
| ***H10K 30/30*** | (2023.01) |
| ***H10K 30/82*** | (2023.01) |

(52) U.S. Cl.
CPC ........... *H10K 30/82* (2023.02); *H10K 85/631* (2023.02); *H10K 85/654* (2023.02); *H10K 30/00* (2023.02)

(58) Field of Classification Search
CPC ................ H10K 85/631; C07D 487/04; C07D 491/048; C07D 495/04; C07D 498/04; C07D 513/04
See application file for complete search history.

(56) References Cited

U.S. PATENT DOCUMENTS

| | | | | |
|---|---|---|---|---|
| 2017/0352811 | A1 | 12/2017 | Choi et al. | |
| 2020/0135951 | A1 | 4/2020 | Yoshioka et al. | |
| 2021/0126040 | A1* | 4/2021 | Moriwaki | H10F 39/12 |

FOREIGN PATENT DOCUMENTS

| | | | |
|---|---|---|---|
| KR | 1020120046916 | 5/2012 | |
| KR | 1020190009523 | 1/2019 | |
| KR | 1020190018281 | 2/2019 | |
| WO | 2014026244 | 2/2014 | |
| WO | 2019009249 | 1/2019 | |
| WO | WO-2019203268 A1 * | 10/2019 | H01L 21/02565 |

OTHER PUBLICATIONS

Puterová et al, Reaction of Substituted Furan-2-carboxaldehydes and Furo[b]pyrrole Type Aldehydes with Hippuric Acid, Molecules 2004, 9, 11-21. (Year: 2004).*

Ti Wu et al., "Synthesis, Structures, and Properties of Thieno[3,2-b]thiophene and Dithiophene Bridged Isoindigo Derivatives and Their Organic Field-effect Transistors Performance," The Journal of Physical Chemistry, vol. 116, Oct. 2012, pp. 22655-22662.

"International Search Report (Form PCT/ISA/210) of PCT/JP2021/016702," mailed on Aug. 3, 2021, with English translation thereof, pp. 1-7.

"Written Opinion of the International Searching Authority (Form PCT/ISA/237)" of PCT/JP2021/016702, mailed on Aug. 3, 2021, with English translation thereof, pp. 1-8.

* cited by examiner

PHOTOELECTRIC CONVERSION ELEMENT, IMAGING ELEMENT, OPTICAL SENSOR, AND COMPOUND

CROSS-REFERENCE TO RELATED APPLICATIONS

This application is a Continuation of PCT International Application No. PCT/JP2021/016702 filed on Apr. 27, 2021, which claims priority under 35 U.S.C. § 119(a) to Japanese Patent Application No. 2020-080573 filed on Apr. 30, 2020 and Japanese Patent Application No. 2020-182647 filed on Oct. 30, 2020. Each of the above applications is hereby expressly incorporated by reference, in its entirety, into the present application.

BACKGROUND OF THE INVENTION

1. Field of the Invention

The present invention relates to a photoelectric conversion element, an imaging element, an optical sensor, and a compound.

2. Description of the Related Art

As a known solid-state imaging element, a planar solid-state imaging element in which photodiodes (PDs) are arranged two-dimensionally, and signal charges generated in each PD are read out through a circuit is widely used.

In order to achieve a color solid-state imaging element, a structure in which a color filter that transmits light at a specific wavelength is disposed on a light incident surface side of the planar solid-state imaging element is commonly adopted. Currently, a single plate-type solid-state imaging element in which color filters that transmit blue (B) light, green (G) light, and red (R) light are regularly arranged on each PD arranged two-dimensionally is well known. However, in this single plate-type solid-state imaging element, the light that has not passed through the color filters is not used, which causes poor light utilization efficiency.

In order to solve this disadvantage, a photoelectric conversion element having a structure in which an organic photoelectric conversion film is disposed on a substrate for reading signals has been developed in recent years.

For example, it is disclosed in JP2019-073471A that a photoelectric conversion element has a photoelectric conversion film containing a compound as described below.

(1)

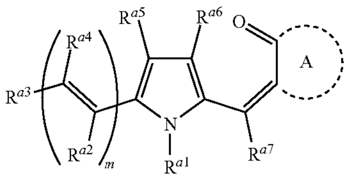

In addition, it is disclosed in WO2019/009249A that a photoelectric conversion element has a photoelectric conversion film containing a compound as described below.

[1]

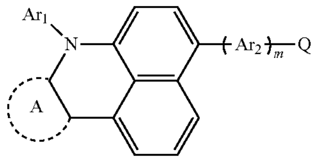

Furthermore, it is disclosed in WO2014/026244A that a photoelectric conversion element has a photoelectric conversion film containing a compound as described below.

Formula 2

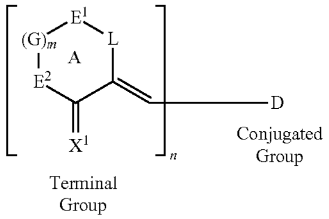

SUMMARY OF THE INVENTION

In recent years, along with the demand for improving the performance of imaging elements, optical sensors, and the like, further improvements are required for various characteristics required for photoelectric conversion elements used therein.

For example, there is a demand for performance exhibiting excellent external quantum efficiency and responsiveness to light at all wavelengths in a red wavelength region, a green wavelength region, and a blue wavelength region.

As a result of examining the photoelectric conversion elements described in JP2019-073471A, WO2019/009249A, and WO2014/026244A, the present inventors have clarified that the above-described performance does not reach the recent demanded level, and there is room for improvement.

Thus, an object of the present invention is to provide a photoelectric conversion element that exhibits excellent external quantum efficiency and responsiveness to light at all wavelengths in a red wavelength region, a green wavelength region, and a blue wavelength region.

Another object of the present invention is to provide an imaging element, an optical sensor, and a compound related to the photoelectric conversion element.

The present inventors have conducted extensive studies on the above-described problems, and as a result, the inventors have found that it is possible to solve the above-described problems by configurations described below and have completed the present invention.

[1] A photoelectric conversion element comprising, in the following order, a conductive film, a photoelectric conversion film, and a transparent conductive film, the photoelectric conversion film containing a compound represented by Formula (1) described below.

[2] The photoelectric conversion element according to [1], in which the compound represented by the above-described Formula (1) is a compound represented by Formula (2) described below.

[3] The photoelectric conversion element according to [1] or [2], in which the compound represented by the above-described Formula (1) is a compound represented by Formula (3) described below.

[4] The photoelectric conversion element according to [3], in which in the above-described Formula (3), $R^{c1}$ represents an aryl group, a heteroaryl group an alkenyl group, or an alkynyl group, which may have a substituent.

[5] The photoelectric conversion element according to [3] or [4], in which in the above-described Formula (3), $R^{c4}$ represents an alkyl group, an aryl group, or a heteroaryl group, which may have a substituent.

[6] The photoelectric conversion element according to any one of [3] to [5], in which in the above-described Formula (3), $Y^{51}$ represents an oxygen atom.

[7] The photoelectric conversion element according to any one of [1] to [6], in which the photoelectric conversion film further contains a n-type semiconductor material, and has a bulk hetero structure formed in a state where the compound represented by the above-described Formula (1) and the n-type semiconductor material are mixed with each other.

[8] The photoelectric conversion element according to any one of [1] to [7], in which the photoelectric conversion film further contains a p-type semiconductor material.

[9] The photoelectric conversion element according to any one of [1] to [8], further comprising one or more interlayers between the conductive film and the transparent conductive film, in addition to the photoelectric conversion film.

[10] An imaging element comprising the photoelectric conversion element according to any one of [1] to [9].

[11] An optical sensor comprising the photoelectric conversion element according to any one of [1] to [10].

[12] A compound represented by Formula (1) described below.

[13] The compound according to [12], in which the compound is represented by Formula (2) described below.

[14] The compound according to [12] or [13], in which the compound is represented by Formula (3) described below.

[15] The compound according to [14], in which in the above-described Formula (3), $R^{c1}$ represents an aryl group, a heteroaryl group, an alkenyl group, or an alkynyl group, which may have a substituent.

[16] The compound according to [14] or [15], in which in Formula (3), $R^{c4}$ represents an alkyl group, an aryl group, or a heteroaryl group, which may have a substituent.

[17] The compound according to any one of [14] to [16], in which in Formula (3), $Y^{51}$ represents an oxygen atom.

According to the present invention, it is possible to provide the photoelectric conversion element that exhibits excellent external quantum efficiency and responsiveness to light at all wavelengths in a red wavelength region, a green wavelength region, and a blue wavelength region.

In addition, according to the present invention, it is possible to provide the imaging element, the optical sensor, and the compound related to the photoelectric conversion element.

DESCRIPTION OF THE PREFERRED EMBODIMENTS

Figure 1:
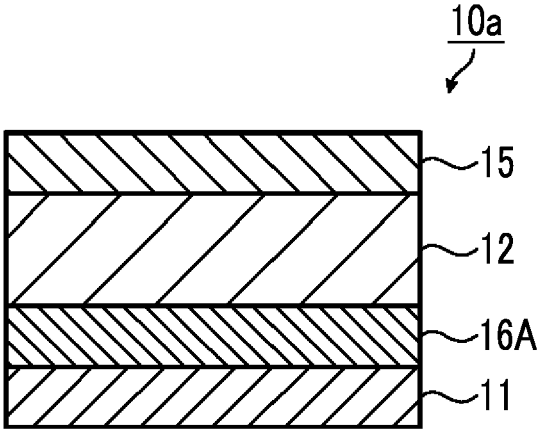
FIG. 1 is a schematic cross-sectional view illustrating a configuration example of a photoelectric conversion element.

Hereinafter, the present invention will be described in detail.

Configuration requirements will be described below based on the representative embodiments of the present invention, but the present invention is not limited to such embodiments.

In the present specification, a substituent for which whether it is substituted or unsubstituted is not specified may be further substituted with a substituent (for example, a substituent W described below) within the scope not impairing an intended effect. For example, the term "alkyl group" means an alkyl group, which may be substituted with a substituent (for example, a substituent W described below).

In addition, in the present specification, the numerical range represented by "to" means a range including numerical values denoted before and after "to" as a lower limit value and an upper limit value.

The bonding direction of a divalent group described in the present specification is not particularly limited, and for example, in a case of —CO—O—, both —CO—O— and —O—CO— may be adopted.

In the present specification, the term (hetero)aryl means aryl and heteroaryl.

[Photoelectric Conversion Element]

As a feature of the present invention, compared to the related art, there is a point that a compound represented by Formula (1) described below (hereinafter, also referred to as a "specific compound") is used in a photoelectric conversion film.

The above-described configuration enables the photoelectric conversion element according to an embodiment of the present invention to exhibit excellent external quantum efficiency and responsiveness to light at all wavelengths in a red wavelength region, a green wavelength region, and a blue wavelength region.

Although the action mechanism by which the photoelectric conversion element according to the embodiment of the present invention exhibits the above-described effect is not clear, it has been considered that ionization potential becomes deeper, and the overlap integral of highest occupied molecular orbital (HOMO) and lowest unoccupied molecular orbital (LUMO) is large because the electron donating property of a structural moiety (corresponding to a structural moiety including a structural moiety where two 5-membered rings specified in Formula (1) are fused, and $R^{a1}$) capable of functioning as a donor in a specific compound is small as compared with compounds disclosed in JP2019-073471A, WO2019/009249A, and WO2014/026244A. It is presumed that the specific compound exhibits the above-described effect based on characteristics caused by the above-described structure.

In particular, as will be described later, it is presumed that in a case where a group represented by $Y^{11}$ in the specific compound is an oxygen atom, the overlap integral of HOMO and LUMO becomes larger because the leveling of the specific compound becomes higher, resulting in achieving further excellent effect described above.

Hereinafter, the fact that the external quantum efficiency to light at each of wavelengths in a red wavelength region, a green wavelength region, and a blue wavelength region, and/or the responsiveness to light of each of the wavelengths in the red wavelength region, the green wavelength region, and the blue wavelength region are more excellent is also simply referred to as "the effect of the present invention is excellent".

Hereinafter, suitable embodiments of the photoelectric conversion element of the present invention will be described with reference to the drawings.

Figure 2:
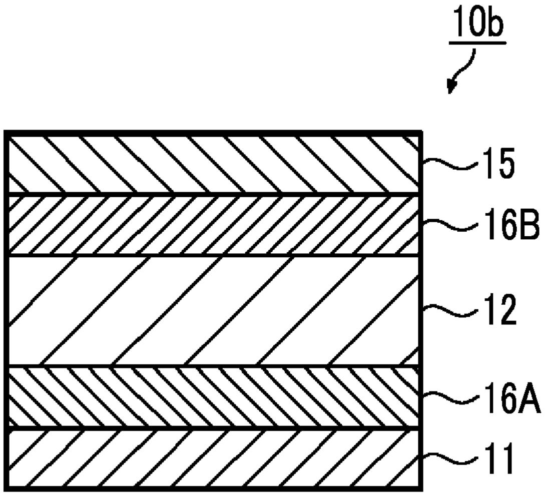
FIG. 2 is a schematic cross-sectional view illustrating a configuration example of the photoelectric conversion element.

FIG. 1 is a schematic cross-sectional view of one embodiment of a photoelectric conversion element of the present invention. A photoelectric conversion element 10*a* illustrated in FIG. 1 has a configuration in which a conductive film (hereinafter, also referred to as a lower electrode) 11 functioning as a lower electrode, an electron blocking film 16A, a photoelectric conversion film 12 containing the specific compound described later, and a transparent conductive film (hereinafter, also referred to as an upper electrode) 15 functioning as an upper electrode are laminated in this order. FIG. 2 is a schematic cross-sectional view of another embodiment of the photoelectric conversion element of the present invention. A photoelectric conversion element 10*b* illustrated in FIG. 2 has a configuration in which the electron blocking film 16A, the photoelectric conversion film 12, a positive hole blocking film 16B, and the upper electrode 15 are laminated on the lower electrode 11 in this order. The lamination order of the electron blocking film 16A, the photoelectric conversion film 12, and the positive hole blocking film 16B in FIGS. 1 and 2 may be appropriately changed according to the application and the characteristics.

In the photoelectric conversion element 10*a* (or 10*b*), it is preferable that light is incident on the photoelectric conversion film 12 through the upper electrode 15.

In a case where the photoelectric conversion element 10*a* (or 10*b*) is used, a voltage can be applied. In this case, it is preferable that the lower electrode 11 and the upper electrode 15 form a pair of electrodes, and a voltage of $1\times10^{-5}$ to $1\times10^{7}$ V/cm is applied between the pair of electrodes. From the viewpoint of the performance and power consumption, the applied voltage is more preferably $1\times10^{-4}$ to $1\times10^{7}$ V/cm, and still more preferably $1\times10^{-3}$ to $5\times10^{6}$ V/cm.

Regarding a voltage application method, in FIGS. 1 and 2, it is preferable that the voltage is applied such that the electron blocking film 16A side is a cathode and the photoelectric conversion film 12 side is an anode. In a case where the photoelectric conversion element 10*a* (or 10*b*) is used as an optical sensor, or also in a case where the photoelectric conversion element 10*a* (or 10*b*) is incorporated in an imaging element, the voltage can be applied by the same method.

As described in detail below, the photoelectric conversion element 10*a* (or 10*b*) can be suitably applied to applications of the optical sensor and the imaging element.

Hereinafter, the form of each layer constituting the photoelectric conversion element according to the embodiment of the present invention will be described in detail.

[Photoelectric Conversion Film]

<Compound (Specific Compound) Represented by Formula (1)>

Hereinafter, the specific compound will be described.

In the present specification, Formula (1) described below includes cis and trans isomers of geometric isomers, which can be distinguished based on a C═C double bond composed of a carbon atom to which $R^{a2}$ is bonded and a carbon atom adjacent to the carbon atom to which $R^{a2}$ is bonded in Formula (1). That is, both the cis isomer and the trans isomer, which are distinguished based on the C═C double bond, are included in the specific compound.

Geometric isomers that can be distinguished based on a C═C double bond composed of a carbon atom to which $R^{b2}$ is bonded and a carbon atom adjacent to the carbon atom to which $R^{b2}$ is bonded in Formula (2) described below are the same as well. In addition, geometric isomers that can be distinguished based on a C═C double bond composed of a carbon atom to which $R^{c2}$ is bonded and a carbon atom adjacent to the carbon atom to which $R^{c2}$ is bonded in Formula (3) described below are the same as well.

Furthermore, in the present specification, in a case where $Y^{11}$ represents $=CR^{a7}R^{a8}$ in Formula (1), Formula (1) described below includes cis and trans isomers of geometric isomers, which can be distinguished based on a C═C double bond composed of a carbon atom to which $R^{a7}$ and $R^{a8}$ are bonded and a carbon atom adjacent to the carbon atom to which $R^{a7}$ and $R^{a8}$ are bonded (corresponding to a carbon atom that is a constituent atom of a ring represented by $A^{11}$, which is specified in Formula (1)). That is, both the cis isomer and the trans isomer, which are distinguished based on the C═C double bond, are included in the specific compound.

In a case where $Y^{41}$ represents $=CR^{b6}R^{b7}$ in Formula (2) described below, geometric isomers, which can be distinguished based on a C═C double bond composed of a carbon atom to which $R^{b6}$ and $R^{b7}$ are bonded and a carbon atom adjacent to the carbon atom to which $R^{b6}$ and $R^{b7}$ are bonded (corresponding to a carbon atom that is a constituent atom of a ring represented by $A^{41}$, which is specified in Formula (2)), are the same as well. In addition, in a case where $Y^{51}$ represents $=CR^{c7}R^{c8}$ in Formula (3) described below, geometric isomers, which can be distinguished based on a C═C double bond composed of a carbon atom to which $R^{c7}$ and $R^{c8}$ are bonded and a carbon atom adjacent to the carbon atom to which $R^{c7}$ and $R^{c8}$ are bonded (corresponding to a carbon atom that is a constituent atom of a ring represented by $A^{51}$, which is specified in Formula (3)), are the same as well.

(1)

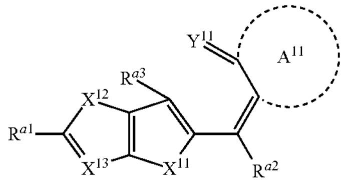

In Formula (1), $X^{11}$ and $X^{12}$ each independently represent an oxygen atom, a sulfur atom, a selenium atom, or $-NR^{a4}-$.

$R^{a4}$ represents a hydrogen atom or a substituent.

The type of a substituent represented by $R^{a4}$ is not particularly limited, and examples thereof include groups exemplified by the substituent W described later.

$R^{a4}$ preferably represents substituents from the viewpoint that the effect of the present invention is more excellent, and among these, an alkyl group, an aryl group, or a heteroaryl group, which may have a substituent, is more preferable, an alkyl group or an aryl group, which may have a substituent, is more preferable, and an alkyl group having 1 to 4 carbon atoms or a phenyl group having 1 to 4 carbon atoms, which may have a substituent, is still more preferable. In addition, examples of substituents that the above-described alkyl group, aryl group, and heteroaryl group may have include groups exemplified by the substituent W described later. In a case where the aryl group and the heteroaryl group each further have a substituent, the substituent is preferably an alkyl group having 1 to 6 carbon atoms.

Among these, $X^{11}$ is preferably a sulfur atom or —$NR^{a4}$—, and more preferably —$NR^{a4}$— from the viewpoint that the effect of the present invention is more excellent.

Among these, $X^{12}$ is preferably an oxygen atom, a sulfur atom, or —$NR^{a4}$— from the viewpoint that the effect of the present invention is more excellent.

$X^{13}$ represents a nitrogen atom or =$CR^{a5}$—.

$R^{a5}$ represents a hydrogen atom or a substituent.

The type of a substituent represented by $R^{a5}$ is not particularly limited, and examples thereof include groups exemplified by the substituent W described later.

$R^{a5}$ is preferably a hydrogen atom, an alkyl group, an aryl group, or a heteroaryl group, and is more preferably a hydrogen atom, from the viewpoint that the effect of the present invention is more excellent.

Among these, $X^{13}$ is preferably a nitrogen atom from the viewpoint that the effect of the present invention is more excellent.

$R^{a1}$ to $R^{a3}$ each independently represent a hydrogen atom or a substituent. The type of substituents represented by $R^{a1}$ to $R^{a3}$ is not particularly limited, and examples thereof include groups exemplified by the substituent W described later.

In a case where $R^{a1}$ represents a substituent, a molecular weight of the above-described substituent is preferably 700 or less, from the viewpoint that the vapor deposition suitability of the specific compound is further improved. In addition, in a case where $R^{a1}$ represents a substituent, the above-described substituent is preferably a substituent other than the substituents represented by Formulae (DK-1) to (DK-4) described later, from the viewpoint that the effect of the present invention is more excellent. The substituents represented by Formulae (DK-1) to (DK-4) will be described later.

In a case where $R^{a1}$ represents a substituent, examples of the above-described substituent also preferably include substituents other than substituents having a relatively strong electron donating property, such as an amino group, a substituted amino group, an indolin derivative group, a tetrahydroquinolin derivative group, a 2-pyrazoline derivative group, an oxindole derivative group, a hexahydropyrimidine derivative group, a rhodanine derivative group, a hydantoin derivative group, a thiohydantoin derivative group, a thiazolinone derivative group, a thiazolidinedione derivative group, an oxazolidinedione derivative group, an imidazoline derivative group, and a pyrazolidinedione derivative group, from the viewpoint that the effect of the present invention is more excellent.

$R^{a1}$ preferably represents a substituent from the viewpoint that the effect of the present invention is more excellent, and among these, an aryl group, a heteroaryl group, an alkenyl group, or an alkynyl group, which may have a substituent, is more preferable, an aryl group or an alkynyl group, which may have a substituent, is more preferable, a phenyl group or an alkynyl group having 1 to 4 carbon atoms, which may have a substituent (for example, an acetylynyl group, an ethynyl group, a propynyl group, a butynyl group, and the like), is still more preferable, and a phenyl group or an alkynyl group having 1 to 2 carbon atoms, which may have a substituent, is particularly preferable. In addition, examples of substituents that the above-described aryl group, heteroaryl group, alkenyl group, and alkynyl group may have include groups exemplified by the substituent W described later. In a case where the aryl group and the heteroaryl group each further have a substituent, the substituent is preferably a cyano group. In a case where the alkenyl group and the alkynyl group each further have a substituent, the substituent is preferably an aryl group (for example, a phenyl group) or the like.

$R^{a2}$ and $R^{a3}$ are each independently preferably a hydrogen atom, an alkyl group, an aryl group, or a heteroaryl group, and more preferably a hydrogen atom, from the viewpoint that the effect of the present invention is more excellent.

$A^1$ represents a ring containing at least two carbon atoms. The two carbon atoms are intended as a carbon atom to which $Y^{11}$ in Formula (1) is bonded and a carbon atom adjacent to the carbon atom to which $Y^{11}$ is bonded, and the two carbon atoms are also atoms that constitute $A^{11}$.

$A^1$ preferably has 3 to 30 carbon atoms, more preferably has 3 to 20 carbon atoms, and still more preferably has 3 to 15 carbon atoms. The number of carbon atoms described above includes two carbon atoms specified in Formula (1).

$A^{11}$ may have a heteroatom, and examples of the heteroatom include a nitrogen atom, a sulfur atom, an oxygen atom, a selenium atom, a tellurium atom, a phosphorus atom, a silicon atom, and a boron atom. Among these, the nitrogen atom, the sulfur atom, or the oxygen atom is preferable, and the oxygen atom is more preferable.

$A^{11}$ may have a substituent, and a halogen atom is preferable as the substituent.

$A^{11}$ preferably has 0 to 10 heteroatoms, more preferably has 0 to 5 heteroatoms, and still more preferably has 0 to 2 heteroatoms. The number of heteroatoms described above does not include the number of heteroatoms that the group represented by $Y^{11}$ in Formula (1) contains and the number of halogen atoms that $A^{11}$ can have as a substituent.

$A^{11}$ may or may not exhibit aromaticity.

$A^{11}$ may have a monocyclic structure or a fused-ring structure, but is preferably a 5-membered ring, a 6-membered ring, or a fused-ring containing at least any one of a 5-membered ring or a 6-membered ring. The number of rings forming the above-described fused-ring is preferably 2 to 4, and more preferably 2 to 3.

The ring represented by $A^{11}$ preferably has a group represented by Formula (A1). $*^1$ represents a bonding position with a carbon atom to which $Y^{11}$ specified in Formula (1) is bonded, and $*^2$ represents a bonding position with a carbon atom adjacent to the carbon atom to which $Y^{11}$ specified in Formula (1) is bonded.

$$*^1\text{-L-Y—Z—}*^2 \qquad \text{(A1)}$$

In Formula (A1), L represents a single bond or —$NR^L$—.

$R^L$ represents a hydrogen atom or a substituent. Among these, $R^L$ is preferably an alkyl group, an aryl group, or a heteroaryl group, and more preferably an alkyl group or an aryl group.

L is preferably a single bond.

Y represents —$CR^{Y1}$=$CR^{Y2}$—, —CS—$NR^3$—, —CS—, —$NR^4$—, or —N=$CR^5$—, and among these, —$CR^{Y1}$=$CR^{Y2}$— is preferable.

$R^{Y1}$ to $R^{Y5}$ each independently represent a hydrogen atom or a substituent. Among these, $R^{Y1}$ to $R^{Y5}$ are each independently preferably an alkyl group, an aryl group, or a heteroaryl group, and more preferably an alkyl group or an aryl group.

In a case where Y represents —$CR^{Y1}$=$CR^{Y2}$—, $R^{Y1}$ and $R^{Y2}$ are preferably bonded to each other to form a ring, and $R^{Y1}$ and $R^{Y2}$ are more preferably bonded to each other to form a benzene ring.

Z represents a single bond, —CO—, —CS—, —C(=$NR^{Z1}$)—, or —C(=$CR^{Z2}R^{Z3}$)—, and among these, Z more preferably represents —CO— or —C(═$CR^{Z2}R^{Z3}$)—, and still more preferably represents —CO—.

$R^{Z1}$ represents a hydrogen atom or a substituent.

The type of a substituent represented by $R^{Z1}$ is not particularly limited, and examples thereof include groups exemplified by the substituent W described later.

$R^{Z1}$ is preferably a hydrogen atom, an alkyl group, an aryl group, or a heteroaryl group, and is more preferably a hydrogen atom, from the viewpoint that the effect of the present invention is more excellent.

$R^{Z2}$ and $R^{Z3}$ each independently represent a cyano group or —$COOR^{Z4}$. $R^{Z4}$ represents an alkyl group, an aryl group, or a heteroaryl group, which may have a substituent.

Among these, $R^{Z2}$ and $R^{Z3}$ are each preferably a cyano group.

The combination of L, Y, and Z described above is preferably a combination of -L-Y—Z—, which is bonded to two carbon atoms specified in Formula (1) to form a ring that is a 5-membered ring or a 6-membered ring. However, as described above, the 5-membered ring or the 6-membered ring may be fused with a different ring (preferably a benzene ring) to form a fused-ring structure.

Among these, the group represented by Formula (A1) is more preferably a group represented by Formula (A2).

(A2)

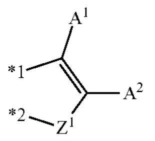

In Formula (A2), $A^1$ and $A^2$ each independently represent a hydrogen atom or a substituent.

$A^1$ and $A^2$ are preferably bonded to each other to form a ring, and $A^1$ and $A^2$ are more preferably bonded to each other to form a benzene ring.

The above-described benzene ring formed by $A^1$ and $A^2$ further preferably has a substituent. As the substituent, a halogen atom is preferable, and a chlorine atom or a fluorine atom is more preferable.

Substituents that the above-described benzene ring formed by $A^1$ and $A^2$ has may be further bonded to each other to form a ring. For example, substituents that the above-described benzene ring formed by $A^1$ and $A^2$ has may be further bonded to each other to form a benzene ring.

$*^1$, $*^2$, and $Z^1$ in Formula (A2) each have the same definitions as $*^1$, $*^2$, and Z in Formula (A1) described above, and the suitable embodiments thereof are also the same.

Among these, the group represented by Formula (A1) is still more preferably a group represented by Formula (A3).

(A3)

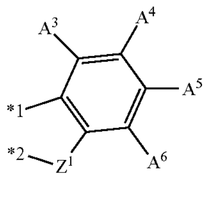

In Formula (A3), $A^3$ to $A^6$ each independently represent a hydrogen atom or a substituent. Among these, $A^3$ to $A^6$ are each independently preferably a hydrogen atom or a halogen atom, and more preferably a hydrogen atom, a chlorine atom, or a fluorine atom, and still more preferably a hydrogen atom.

$A^3$ and $A^4$ may be bonded to each other to form a ring, $A^4$ and $A^5$ may be bonded to each other to form a ring, and $A^5$ and $A^6$ may be bonded to each other to form a ring. Rings formed by respectively bonding $A^3$ and $A^4$, $A^4$ and $A^5$, and $A^5$ and $A^6$ are each preferably a benzene ring. Among these, $A^4$ and $A^5$ are preferably bonded to each other to form a ring, and the ring formed by bonding $A^4$ and $A^5$ to each other is preferably a benzene ring. The ring formed by bonding $A^4$ and $A^5$ to each other may be further substituted with a substituent.

$*^1$, $*^2$, and $Z^1$ in Formula (A3) each have the same definitions as $*^1$, $*^2$, and Z in Formula (A1) described above, and the suitable embodiments thereof are also the same.

As such a ring, a merocyanine coloring agent usually used as an acidic nucleus is preferable, and specific examples thereof include as follows:

(a) 1,3-dicarbonyl nuclei: for example, a 1,3-indandione nucleus, 1,3-cyclohexanedione, 5,5-dimethyl-1,3-cyclohexanedione, 1,3-dioxane-4,6-dione, and the like;

(b) pyrazolinone nuclei: for example, 1-phenyl-2-pyrazolin-5-one, 3-methyl-1-phenyl-2-pyrazolin-5-one, 1-(2-benzothiazolyl)-3-methyl-2-pyrazolin-5-one, and the like;

(c) isoxazolinone nuclei: for example, 3-phenyl-2-isoxazolin-5-one, 3-methyl-2-isoxazolin-5-one, and the like;

(d) oxindole nuclei: for example, 1-alkyl-2,3-hydro-2-oxindole, and the like;

(e) 2,4,6-trioxohexahydropyrimidine nuclei: for example, barbituric acid or 2-thibarbituric acid and derivatives thereof, and the like, and examples of the derivatives include 1-alkyl compounds such as 1-methyl and 1-ethyl, 1,3-dialkyl compounds such as 1,3-dimethyl, 1,3-diethyl, 1,3-dibutyl, 1,3-diaryl compounds such as 1,3-diphenyl, 1,3-di(p-chlorophenyl), 1,3-di(p-ethoxycarbonylphenyl), 1-alkyl-1-aryl compounds such as 1-ethyl-3-phenyl, 1,3-diheteroaryl compounds such as 1,3-di(2-pyridyl), and the like;

(f) 2-thio-2,4-thiazolidinedione nuclei: for example, rhodanine and derivatives thereof, and the like, and examples of the derivatives include 3-aklylrhodanine such as 3-methylrhodanine, 3-ethylrhodanine, 3-allylrhodanine, 3-arylrhodanine such as 3-phenylrhodanine, 3-heteroarylrhodanine such as 3-(2-pyridyl)rhodanine, and the like;

(g) 2-thio-2,4-oxazolidinedione (2-thio-2,4-(3H,5H)-oxazoledione nuclei: for example, 3-ethyl-2-thio-2,4-oxazolidinedione, and the like;

(h) thianaphthenone nuclei: for example, 3(2H)-thianaphthenone-1,1-dioxide, and the like;

(i) 2-thio-2,5-thiazolidinedione nuclei: for example, 3-ethyl-2-thio-2,5-thiazolidinedione, and the like;

(j) 2,4-thiazolidinedione nuclei: for example, 2,4-thiazolidinedione, 3-ethyl-2,4-thiazolidinedione, 3-phenyl-2,4-thiazolidinedione, and the like;

(k) thiazoliin-4-one nuclei: for example, 4-thiazolinone, 2-ethyl-4-thiazolinone, and the like;

(l) 2,4-imidazolidinedione (hydantoin) nuclei: for example, 2,4-imidazolidinedione, 3-ethyl-2,4-imidazolidinedione, and the like;

(m) 2-thio-2,4-imidazolidinedione (2-thiohydantoin) nuclei: for example, 2-thio-2,4-imidazolidinedione, 3-ethyl-2-thio-2,4-imidazolidinedione, and the like;

(n) imidazolin-5-one nuclei: for example, 2-propylmercapto-2-imidazolin-5-one, and the like;

(o) 3,5-pyrazolidinedione nuclei: for example, 1,2-diphenyl-3,5-pyrazolidinedione, 1,2-dimethyl-3,5-pyrazolidinedione, and the like;

(p) benzothiophen-3(2H)-one nuclei: for example, benzothiophen-3(2H)-one, oxobenzothiophen-3(2H)-one, dioxobenzothiophen-3(2H)-one, and the like;

(q) indanone nuclei: for example, 1-indanone, 3-phenyl-1-indanone, 3-methyl-1-indanone, 3,3-diphenyl-1-indanone, 3,3-dimethyl-1-indanone, and the like;

(r) benzofuran-3-(2H)-one nucleus: for example, benzofuran-3-(2H)-one, and the like; and (s) 2,2-dihydrophenalene-1,3-dione nucleus, and the like.

$Y^{11}$ represents an oxygen atom, a sulfur atom, $=NR^{a6}$, or $=CR^{a7}R^{a8}$, and among these, $Y^{11}$ is preferably an oxygen atom or $=CR^{a7}R^{a8}$, and more preferably an oxygen atom, from the viewpoint that the effect of the present invention is more excellent.

$R^{a6}$ represents a hydrogen atom or a substituent.

The type of a substituent represented by $R^{a6}$ is not particularly limited, and examples thereof include groups exemplified by the substituent W described later.

$R^{a6}$ is preferably a hydrogen atom, an alkyl group, an aryl group, or a heteroaryl group, and is more preferably a hydrogen atom, from the viewpoint that the effect of the present invention is more excellent.

$R^{a7}$ and $R^{a8}$ each independently represent a cyano group or $—COOR^{a9}$. $R^{ag}$ represents an alkyl group, an aryl group, or a heteroaryl group, which may have a substituent.

Among these, $R^{a7}$ and $R^{a8}$ are each preferably a cyano group, from the viewpoint that the effect of the present invention is more excellent.

Formula (1) satisfies the following conditions A and B.

Condition A: In a case where $X^{11}$ in Formula (1) represents $—NR^{a4}—$, $X^{13}$ represents a nitrogen atom.

Condition B: In a case in which $X^{11}$ and $X^{12}$ each represent a sulfur atom, and $X^{13}$ represents $=CR^{a5}—$ in Formula (1), $R^{a1}$ represents a hydrogen atom or represents a substituent having a molecular weight of 700 or less other than substituents represented by Formulae (DK-1) to (DK-4). That is, in Formula (1), in the case where $X^{11}$ and $X^{12}$ each represent a sulfur atom and $X^{13}$ represents $=CR^{a5}—$, $R^{a1}$ represents a hydrogen atom, or in the case where $R^{a1}$ represents a substituent, the above-described substituent is not a substituent represented by Formulae (DK-1) to (DK-4). Under the condition B, in the case where $R^{a1}$ represents a substituent, a molecular weight of the above-described substituent is 700 or less, from the viewpoint that the vapor deposition suitability of the specific compound is further improved.

(DK-1)

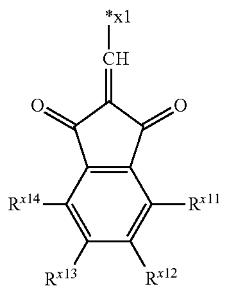

-continued (DK-2)

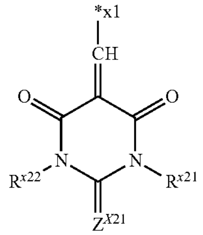

(DK-3)

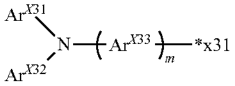

(DK-4)

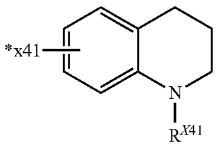

In Formula (DK-1), $R^{x11}$ to $R^{x14}$ each independently represent a hydrogen atom or a substituent. $R^{x11}$ and $R^{x12}$, $R^{x12}$ and $R^{x13}$, $R^{x3}$ and $R^{x14}$ may be bonded to each other to form a ring, respectively. *x1 represents a bonding position.

In Formula (DK-2), $R^{x21}$ and $R^{x22}$ each independently represent a substituent. $Z^{x21}$ represents an oxygen atom or a sulfur atom. *x2 represents a bonding position.

In Formula (DK-3), $Ar^{x31}$ and $Ar^{x32}$ each independently represent an aryl group or a heteroaryl group, which may have a substituent. $Ar^{x33}$ represents an arylene group or a heteroarylene group, which may have a substituent. $Ar^{x31}$ and $Ar^{x32}$ may be bonded to each other through a single bond or a divalent linking group. In a case where m is 1, $Ar^{x31}$ and $Ar^{x33}$ may be bonded to each other through a single bond or a divalent linking group. In a case where m is 1, $Ar^{x32}$ and $Ar^{x33}$ may be bonded to each other through a single bond or a divalent linking group. m represents 0 or 1. *x31 represents a bonding position.

In Formula (DK-4), $R^{x41}$ represents a substituent. *x41 represents a bonding position.

In Formula (DK-1), rings formed by respectively bonding $R^{x11}$ and $R^{x12}$, $R^{x12}$ and $R^{x13}$, and $R^{x13}$ and $R^{x14}$ each may be aromatic or non-aromatic, and examples thereof include a benzene ring.

In Formula (DK-3), an aryl group represented by $Ar^{x31}$ and $Ar^{x32}$ and an arylene group represented by $Ar^{x33}$ each may be a monocyclic ring, or may have a fused-ring structure (condensed ring structure) in which two or more rings are fused to form a ring. Examples of the fused-ring structure in which two or more rings are fused to form a ring include naphthalene and the like.

In Formula (DK-3), a heteroaryl group represented by $Ar^{x31}$ and $Ar^{x32}$ and a heteroarylene group represented by $Ar^{x33}$ each may be a monocyclic ring, or may have a fused-ring structure (condensed ring structure) in which two or more rings are fused to form a ring. Examples of the fused-ring structure in which two or more rings are fused to form a ring include benzothiophene and the like.

In Formula (DK-3), rings formed respectively bonding by $Ar^{x31}$ and $Ar^{x32}$, $Ar^{x31}$ and $Ar^{x33}$, and $Ar^{x32}$ and $Ar^{x33}$ through a single bond or a divalent linking group each may be aromatic or non-aromatic.

The specific compound preferably does not contain any of a carboxy group and a salt of the carboxy group, a phosphoric acid group and a salt of the phosphoric acid group, and a sulfonic acid group and a salt of the sulfonic acid group, from the viewpoint of avoiding deterioration of the vapor deposition suitability.

In addition to the above-described groups and salts thereof, the specific compound also preferably does not contain any of a monosulfate ester group, a monophosphate ester group, a phosphonic acid group, a phosphinic acid group, a boric acid group, and salts of these groups, from the viewpoint of avoiding deterioration of the vapor deposition suitability.

Among these, the specific compound is preferably a compound represented by Formula (2), and more preferably a compound represented by Formula (3), from the viewpoint that the effect of the present invention is more excellent.

Hereinafter, first, the compound represented by Formula (2) will be described in detail.

(2)

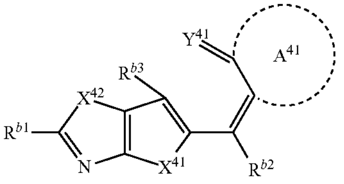

in Formula (2), $X^{41}$ and $X^{42}$ each independently represent an oxygen atom, a sulfur atom, a selenium atom, or —$NR^{b4}$—. $R^{b4}$ has the same definition as $R^{a4}$ in Formula (1), and the suitable embodiment thereof is also the same.

Among these, $X^{41}$ is preferably a sulfur atom or —$NR^{b4}$—, and more preferably —$NR^4$— from the viewpoint that the effect of the present invention is more excellent.

Among these, $X^{42}$ is preferably an oxygen atom, a sulfur atom, or —$NR^{b4}$ from the viewpoint that the effect of the present invention is more excellent.

$R^{b1}$, $R^{b2}$, and $R^{b3}$ each have the same definitions as $R^{a1}$, $R^2$, and $R^{a3}$ in Formula (1), and the suitable embodiments thereof are also the same.

$A^{41}$ represents a ring containing at least two carbon atoms. The two carbon atoms are intended as a carbon atom to which $Y^{41}$ in Formula (2) is bonded and a carbon atom adjacent to the carbon atom to which $Y^{41}$ is bonded, and the two carbon atoms are atoms that constitute $A^{41}$.

$A^{41}$ has the same definition as $A^{11}$ in Formula (1), and the suitable embodiment thereof is also the same.

$Y^{41}$ represents an oxygen atom, a sulfur atom, =$NR^{b5}$, or =$CR^{b6}R^{b7}$, and among these, $Y^{41}$ is preferably an oxygen atom or =$CR^{b6}R^{b7}$, and more preferably an oxygen atom, from the viewpoint that the effect of the present invention is more excellent.

$R^{b5}$ has the same definition as $R^{a6}$ in Formula (1), and the suitable embodiment thereof is also the same.

$R^{b6}$ and $R^{b7}$ each independently represent a cyano group or —$COOR^{b8}$, and is preferably a cyano group, from the viewpoint that the effect of the present invention is more excellent.

$R^{b8}$ represents an alkyl group, an aryl group, or a heteroaryl group, which may have a substituent.

Next, the compound represented by Formula (3) will be described in detail.

(3)

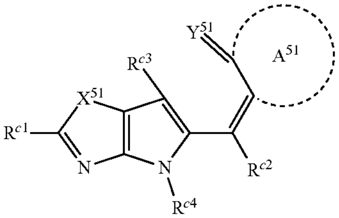

In Formula (3), $X^{51}$ represents an oxygen atom, a sulfur atom, a selenium atom, or —$NR^{c5}$—. $R^{c5}$ has the same definition as $R^{a4}$ in Formula (1), and the suitable embodiment thereof is also the same.

Among these, $X^{51}$ is preferably an oxygen atom, a sulfur atom, or —$NR^{c5}$ from the viewpoint that the effect of the present invention is more excellent.

$R^{c1}$, $R^{c2}$, and $R^{c3}$ each have the same definitions as $R^{a1}$, $R^2$, and $R^{a8}$ in Formula (1), and the suitable embodiments thereof are also the same.

$R^{c4}$ represents a hydrogen atom or a substituent.

The type of a substituent represented by $R^{c4}$ is not particularly limited, and examples thereof include groups exemplified by the substituent W described later.

$R^{c4}$ preferably represents substituents from the viewpoint that the effect of the present invention is more excellent, and among these, an alkyl group, an aryl group, or a heteroaryl group, which may have a substituent, is more preferable, an alkyl group or an aryl group, which may have a substituent, is more preferable, and an alkyl group having 1 to 4 carbon atoms or a phenyl group having 1 to 4 carbon atoms, which may have a substituent, is still more preferable. In addition, examples of substituents that the above-described alkyl group, aryl group, and heteroaryl group may have include groups exemplified by the substituent W described later. In a case where the aryl group and the heteroaryl group each further have a substituent, the substituent is preferably an alkyl group having 1 to 6 carbon atoms.

$A^{51}$ represents a ring containing at least two carbon atoms. The two carbon atoms are intended as a carbon atom to which $Y^{51}$ in Formula (3) is bonded and a carbon atom adjacent to the carbon atom to which $Y^{51}$ is bonded, and the two carbon atoms are also atoms that constitute $A^{51}$.

$A5^1$ has the same definition as $A^{11}$ in Formula (1), and the suitable embodiment thereof is also the same.

$Y^{51}$ represents an oxygen atom, a sulfur atom, =$NR^{c6}$, or =$CR^{c7}R^{c8}$, and among these, $Y^{51}$ is preferably an oxygen atom or =$CR^{c7}R^{c8}$, and more preferably an oxygen atom, from the viewpoint that the effect of the present invention is more excellent.

$R^{c6}$ has the same definition as $R^{a6}$ in Formula (1), and the suitable embodiment thereof is also the same.

$R^{c7}$ and $R^{c8}$ each independently represent a cyano group or —$COOR^{c9}$, and are each preferably a cyano group, from the viewpoint that the effect of the present invention is more excellent.

$R^{c9}$ represents an alkyl group, an aryl group, or a heteroaryl group, which may have a substituent.

Among these, the specific compound is preferably a compound that is represented by Formula (3) and that satisfies one or more of the following (X1) to (X3), more preferably a compound that is represented by Formula (3) and that satisfies two or more of the following (X1) to (X3), and still more preferably a compound that is represented by Formula (3) and that satisfies all of the following (X1) to (X3), from the viewpoint that the effect of the present invention is more excellent.

(X1) A group represented by $R^{c1}$ is an aryl group, a heteroaryl group, an alkenyl group, or an alkynyl group, which may have a substituent.

(X2) A group represented by $Y^{51}$ is an oxygen atom.

(X3) A group represented by $R^{c4}$ is an alkyl group, an aryl group, or a heteroaryl group, which may have a substituent.

(Substituent W)

A substituent W in the present specification will be described below.

Examples of the substituent W include a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group (may also be referred to as a heterocyclic group), a cyano group, a hydroxy group, a nitro group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or an arylsulfonylamino group, a mercapto group, an alkylthio group, an arylthio group, a heterocyclic thio group, a sulfamoyl group, an alkyl or an arylsulfinyl group, an alkyl or an arylsulfonyl group, an acyl group, an aryloxycarbonyl group, an alkoxycarbonyl group, a carbamoyl group, an aryl or a heterocyclic azo group, an imide group, a phosphino group, a phosphinyl group, a phosphinyloxy group, a phosphinylamino group, a phosphono group, a silyl group, a hydrazino group, a ureido group, a boronate group ($—B(OH)_2$), and other known substituents.

In addition, the substituent W may be further substituted with another substituent W. For example, an alkyl group may be substituted with a halogen atom.

The details of the substituent W are described in paragraph [0023] of JP2007-234651A.

However, as described above, the specific compound preferably does not contain any of a carboxy group and a salt of the carboxy group, a phosphoric acid group and a salt of the phosphoric acid group, and a sulfonic acid group and a salt of the sulfonic acid group, from the viewpoint of avoiding deterioration of the vapor deposition suitability.

(Alkyl Group, Aryl Group, or Heteroaryl Group that Compound Represented by any of Formulae (1) to (3) May have)

The number of carbon atoms of an alkyl group contained in the specific compound (compound represented by any of Formulae (1) to (3)) is not particularly limited, but the alkyl group preferably has 1 to 10 carbon atoms, more preferably has 1 to 6 carbon atoms, and still more preferably has 1 to 4 carbon atoms. The alkyl group may be any of linear, branched, or cyclic. In addition, the alkyl group may be substituted with a substituent (for example, a substituent W).

Examples of the alkyl group include a methyl group, an ethyl group, a n-propyl group, an i-propyl group, a n-butyl group, a t-butyl group, a n-hexyl group, a cyclohexyl group, and the like.

The number of carbon atoms of an aryl group contained in the specific compound (compound represented by any of Formulae (1) to (3)) is not particularly limited, but the aryl group preferably has 6 to 30 carbon atoms, more preferably has 6 to 18 carbon atoms, and still more preferably has 6 carbon atoms. The aryl group may have a monocyclic structure or a fused-ring structure (condensed ring structure) in which two or more rings are fused to form a ring. In addition, the aryl group may be substituted with a substituent (for example, a substituent W).

Examples of the aryl group include a phenyl group, a naphthyl group, an anthryl group, a pyrenyl group, a phenanthrenyl group, a methylphenyl group, a dimethylphenyl group, a biphenyl group, a fluorenyl group, and the like, and a phenyl group, a naphthyl group, or an anthryl group is preferable.

The number of carbon atoms of a heteroaryl group contained in the specific compound (compound represented by any of Formulae (1) to (3)) is not particularly limited, but the heteroaryl group (monovalent aromatic heterocyclic group) preferably has 3 to 30 carbon atoms, and more preferably has 3 to 18 carbon atoms. The heteroaryl group may be substituted with a substituent (for example, a substituent W).

The heteroaryl group contains a heteroatom in addition to a carbon atom and a hydrogen atom. Examples of the heteroatom include a sulfur atom, an oxygen atom, a nitrogen atom, a selenium atom, a tellurium atom, a phosphorus atom, a silicon atom, and a boron atom, and a sulfur atom, an oxygen atom, or a nitrogen atom is preferable.

The number of heteroatoms of the heteroaryl group is not particularly limited, but is usually about 1 to 10, preferably 1 to 4, and more preferably 1 and 2.

The number of ring members of the heteroaryl group is not particularly limited, but is preferably 3 to 8, more preferably 5 to 7, and still more preferably 5 to 6. The heteroaryl group may have a monocyclic structure or a fused-ring structure (condensed ring structure) in which two or more rings are fused to form a ring. In a case of a fused-ring structure, an aromatic hydrocarbon ring having no heteroatom (for example, a benzene ring) may be contained.

Examples of the heteroaryl group include a pyridyl group, a quinolyl group, an isoquinolyl group, an acridinyl group, a phenanthridinyl group, a pteridinyl group, a pyrazinyl group, a quinoxalinyl group, a pyrimidinyl group, a quinazolyl group, a pyridazinyl group, a cinnolinyl group, a phthalazinyl group, a triazinyl group, an oxazolyl group, a benzoxazolyl group, a thiazolyl group, a benzothiazolyl group, an imidazolyl group, a benzimidazolyl group, a pyrazolyl group, an indazolyl group, an isoxazolyl group, a benzisoxazolyl group, an isothiazolyl group, a benzisothiazolyl group, an oxadiazolyl group, a thiadiazolyl group, a triazolyl group, a tetrazolyl group, a furyl group, a benzofuryl group, a thienyl group, a benzothienyl group, a dibenzofuryl group, a dibenzothienyl group, a pyrrolyl group, an indolyl group, an imidazopyridinyl group, a carbazolyl group, and the like.

The specific compounds are exemplified below.

In a case where the compounds were applied to Formula (1), structural formulae shown below are intended to include both cis and trans isomers, which can be distinguished based on a group corresponding to a C═C double bond composed of a carbon atom to which $R^{a2}$ is bonded and a carbon atom adjacent to the carbon atom to which $R^{a2}$ is bonded. In a case where $Y^{11}$ represents $═CR^{a7}R^{a8}$, it is intended to include both cis and trans isomers, which can be distinguished based on the C═C double bond composed of a carbon atom to which $R^{a7}$ and $R^{a8}$ are bonded and a carbon atom adjacent to the carbon atom to which $R^{a7}$ and $R^{a8}$ are bonded (corresponding to a carbon atom that is a constituent atom of a ring represented by $A^{11}$, which is specified in Formula (1)).

In the following examples, "TMS" is intended to represent a trimethylsilyl group.
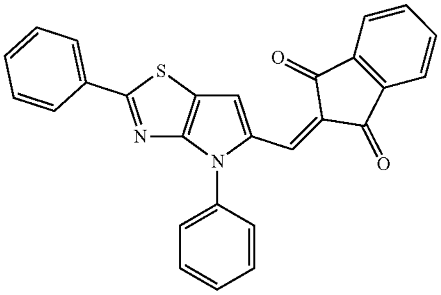
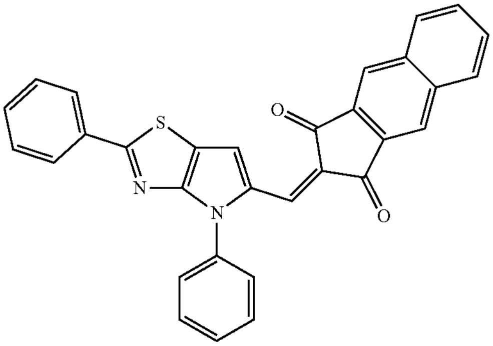
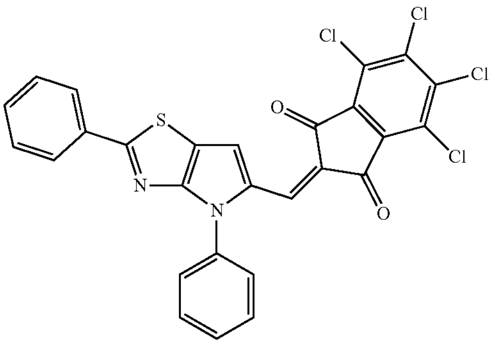
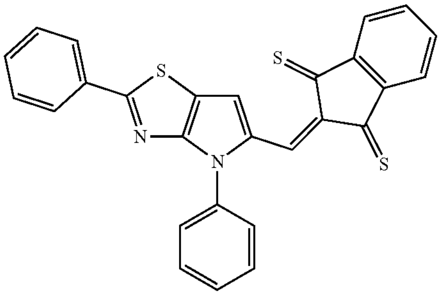
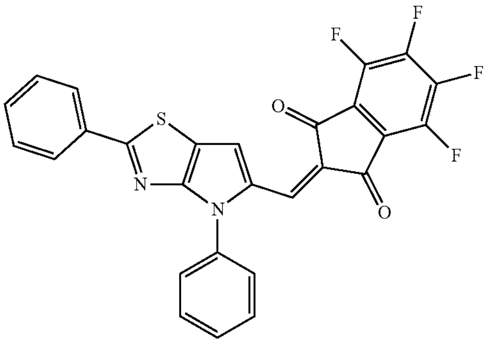
-continued
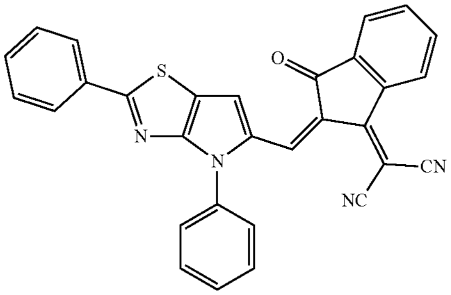
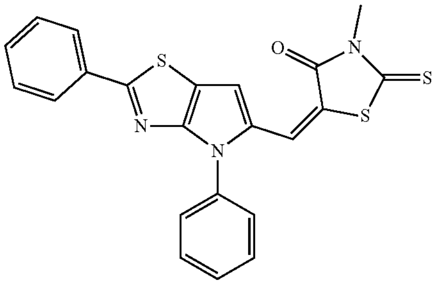
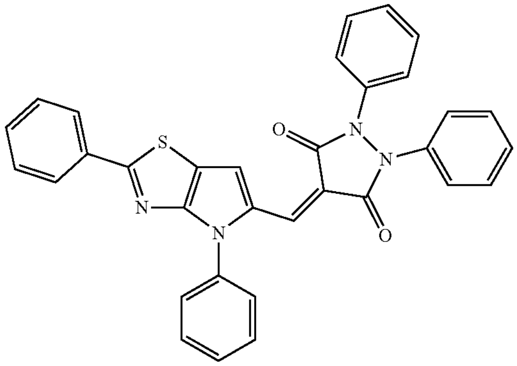
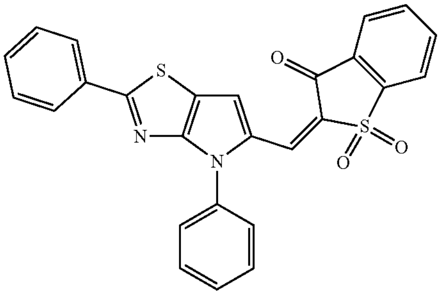
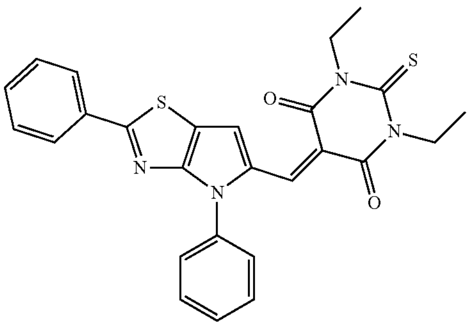

-continued
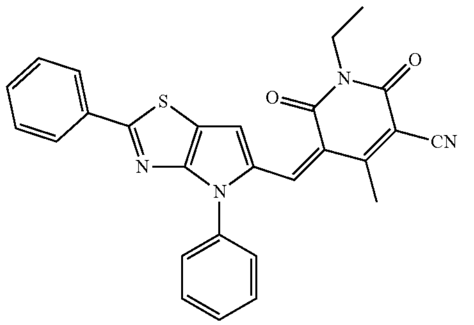
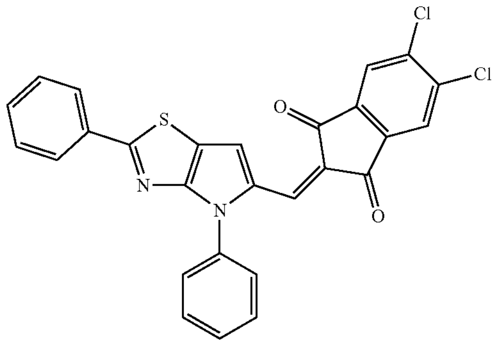
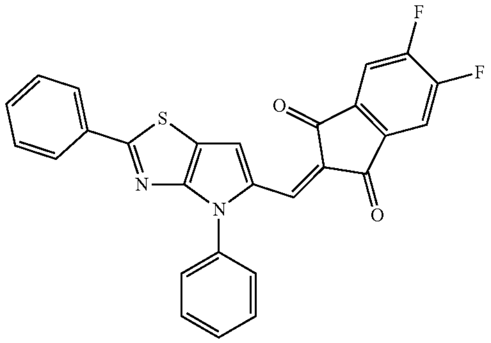
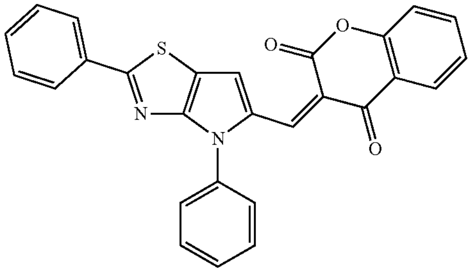
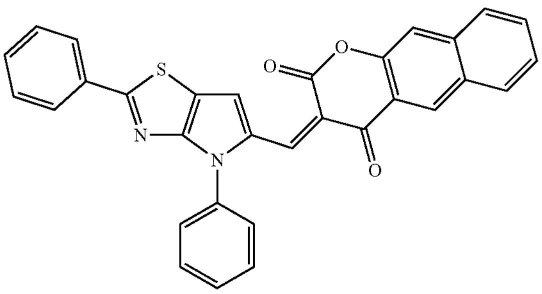
-continued
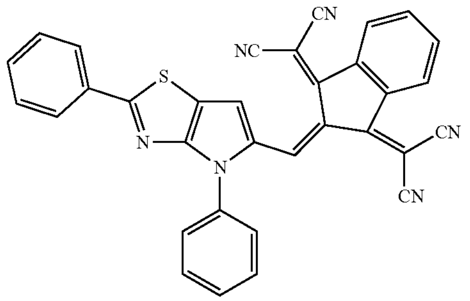
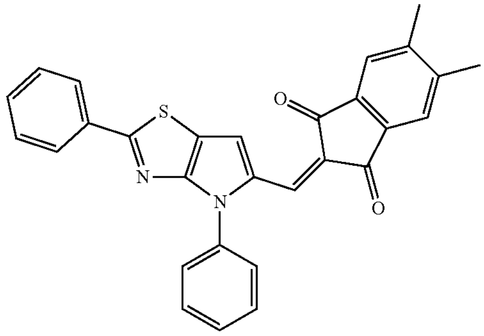
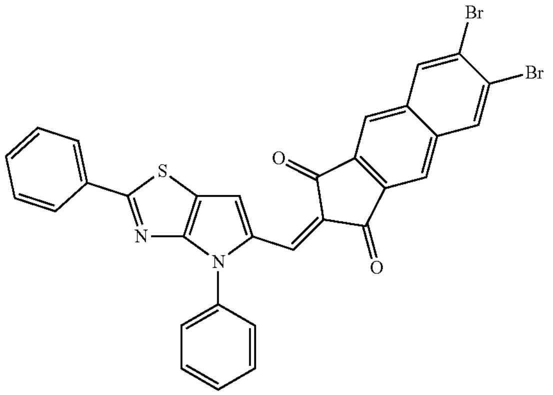
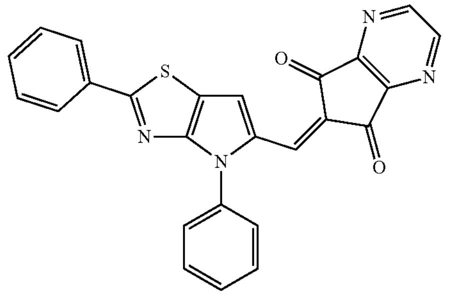
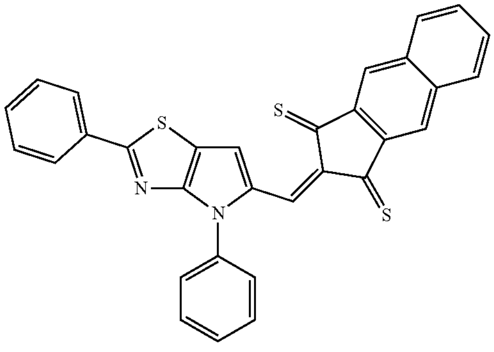

-continued
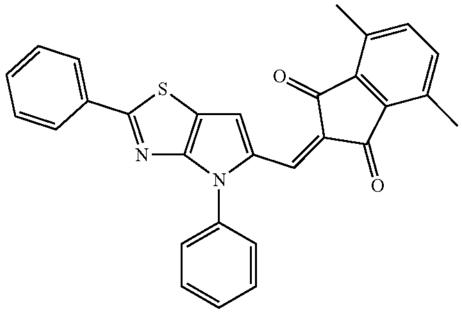
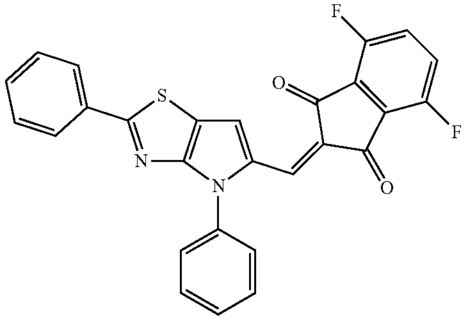
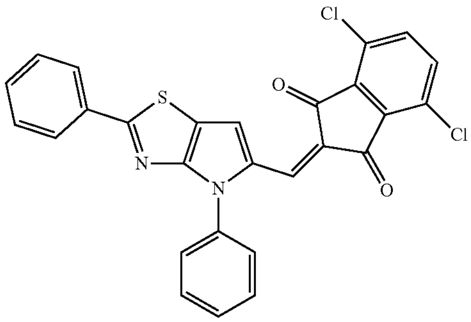
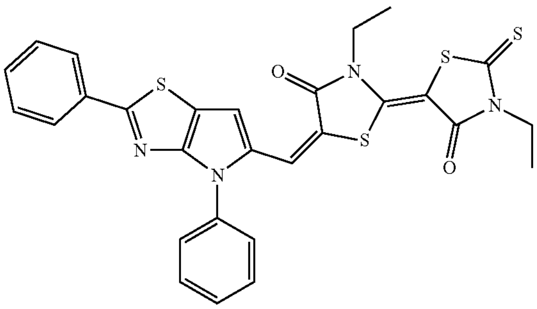
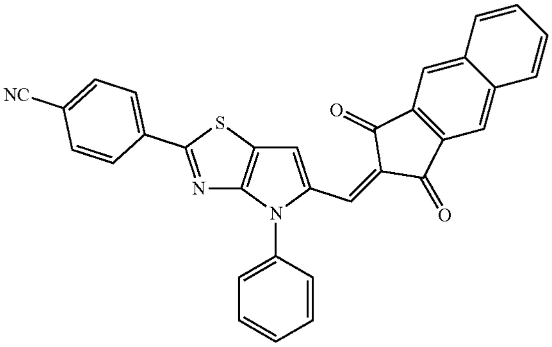
-continued
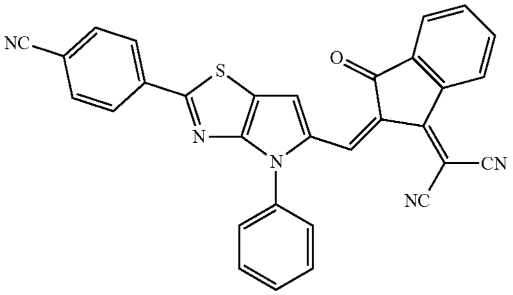
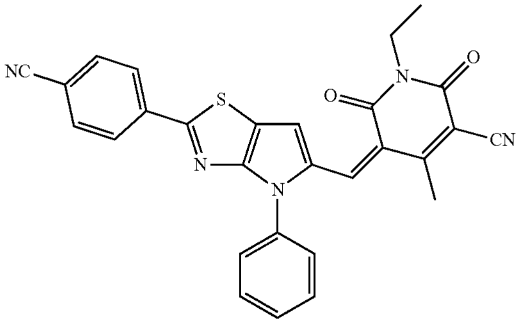
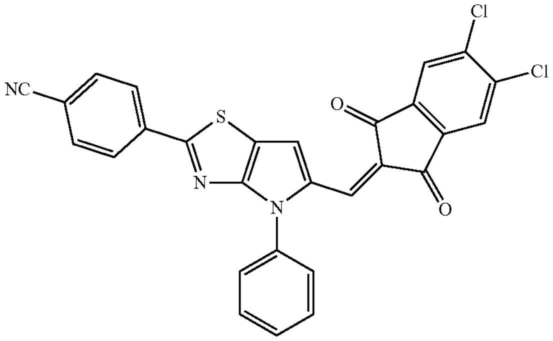
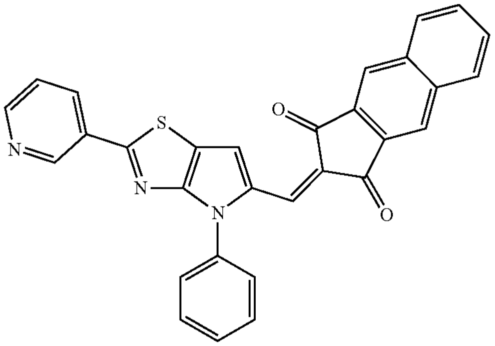
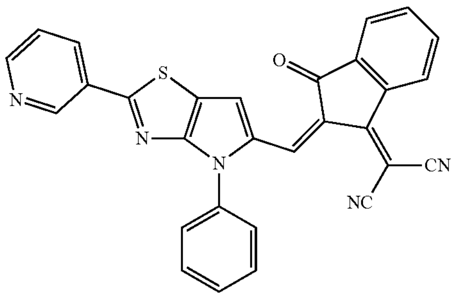

-continued
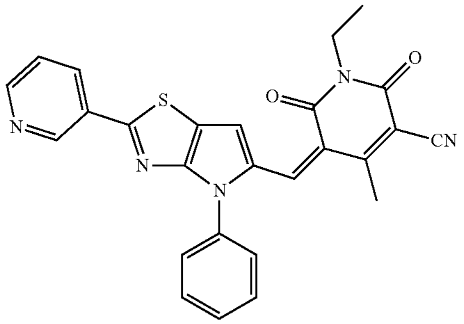
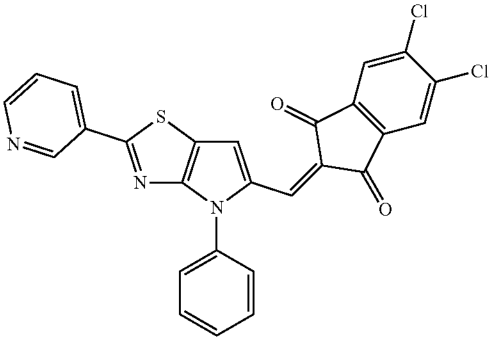
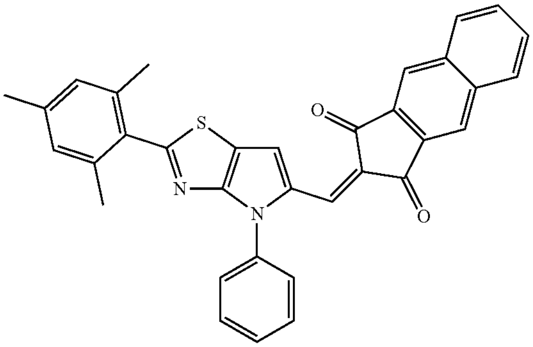
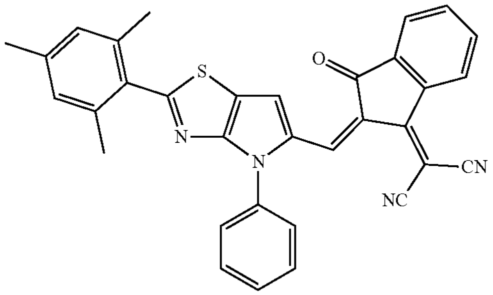
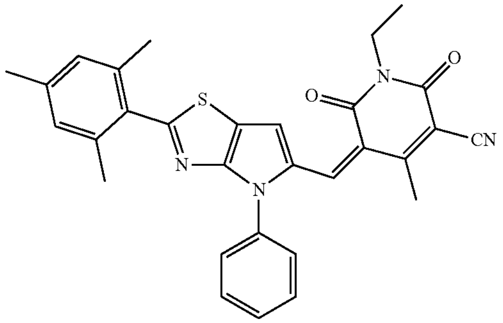
-continued
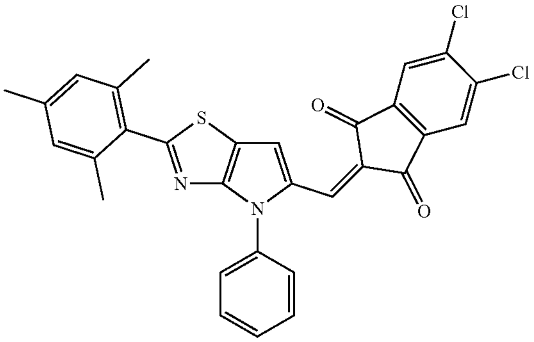
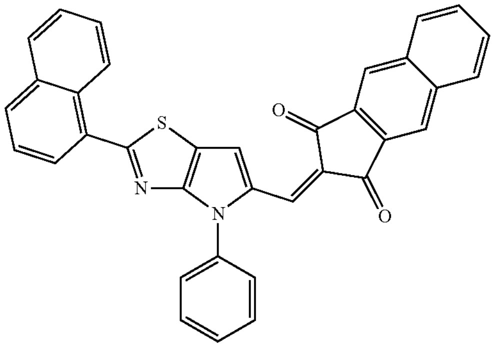
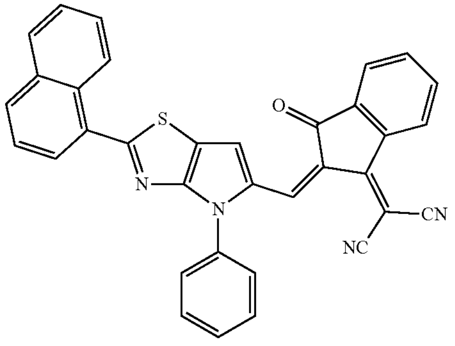
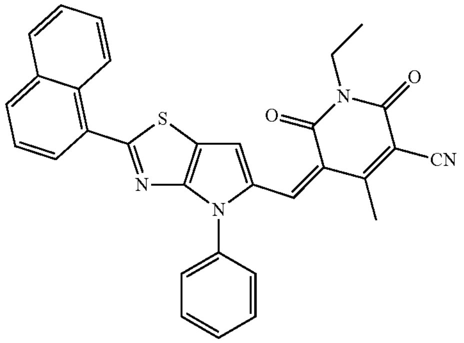
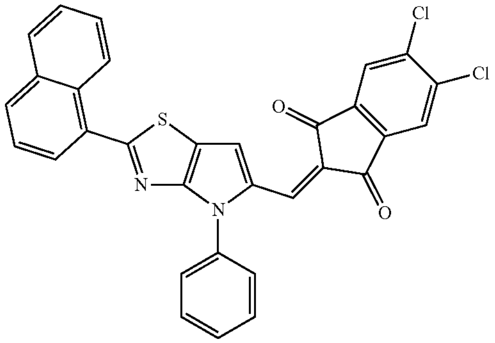

-continued
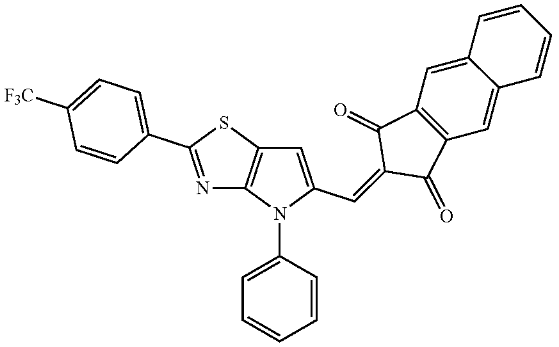
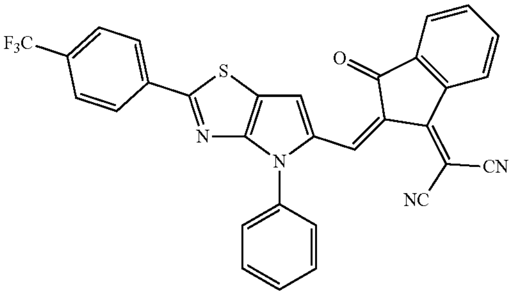
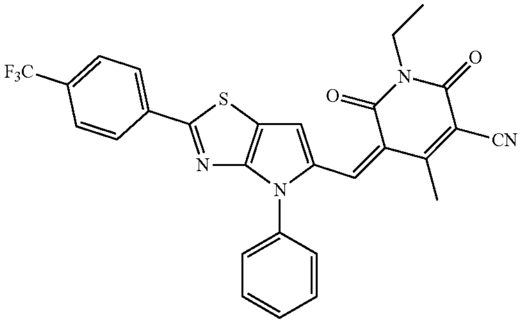
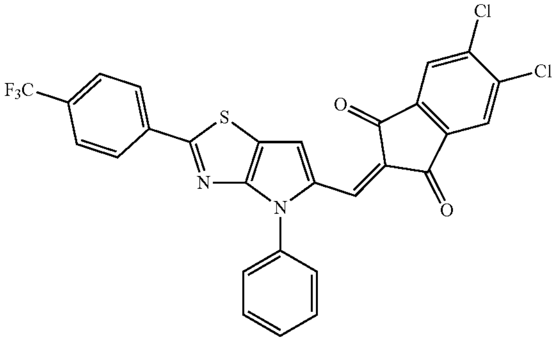
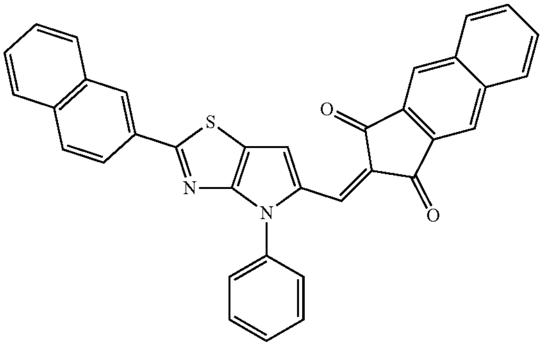
-continued
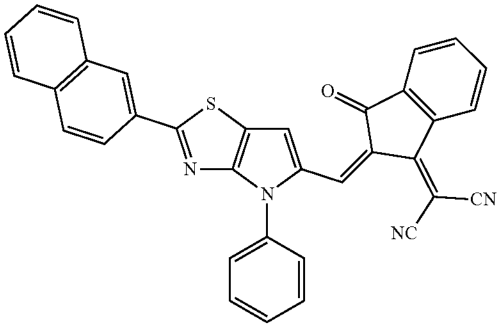
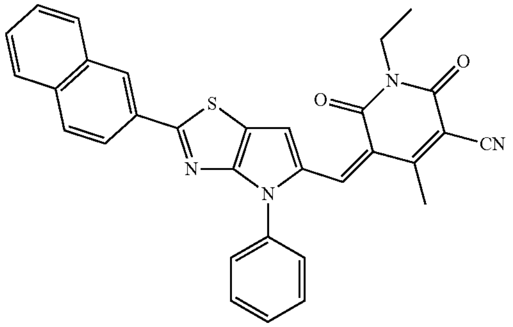
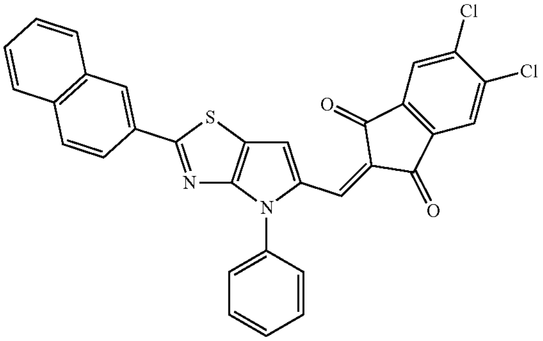
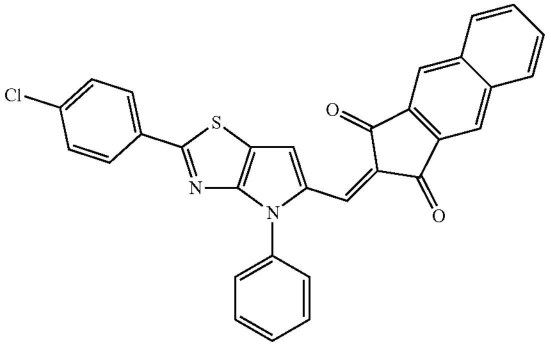
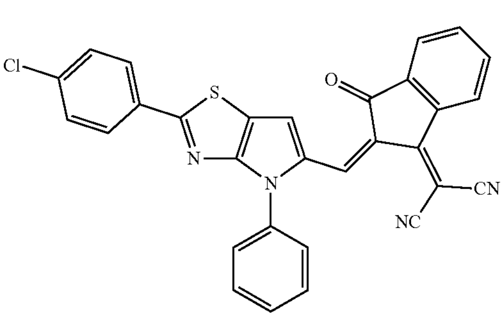

-continued
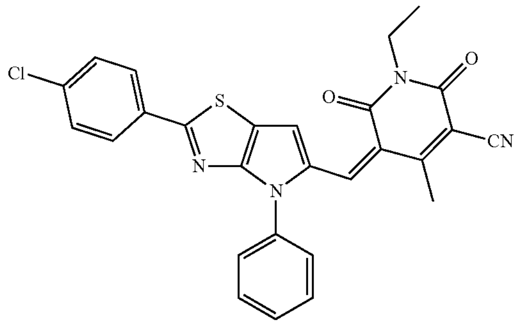
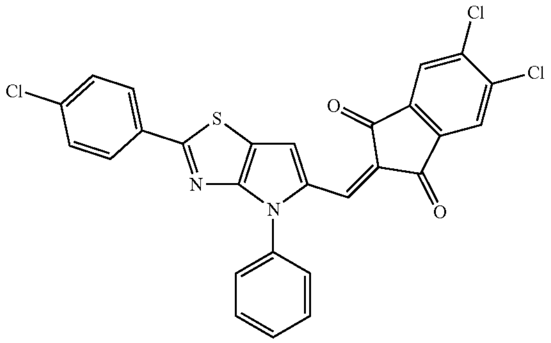
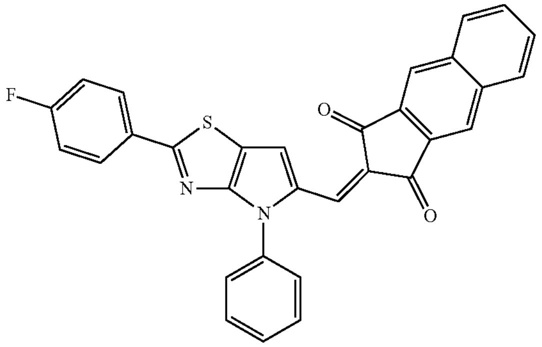
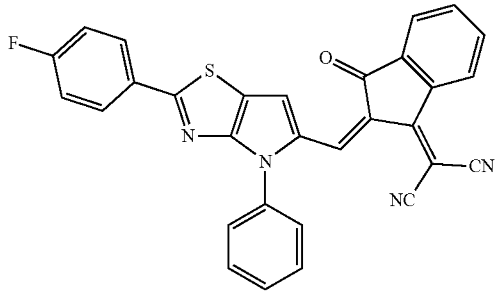
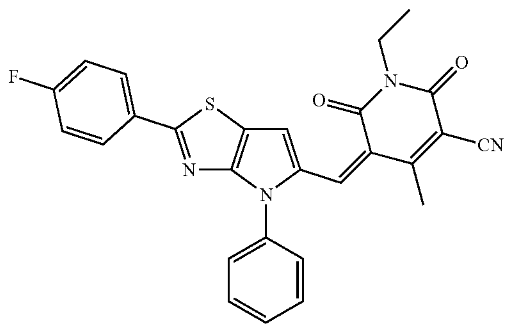
-continued
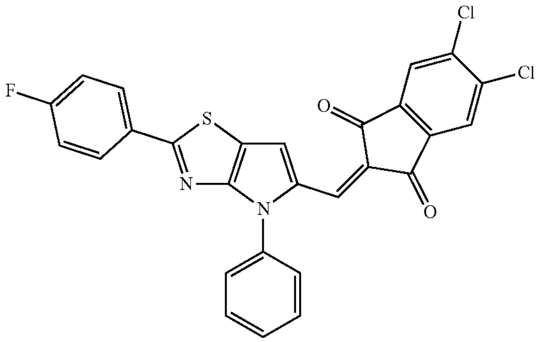
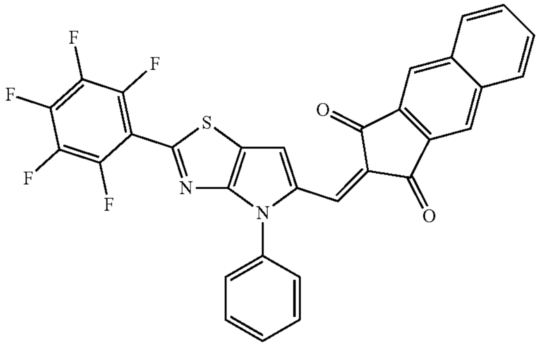
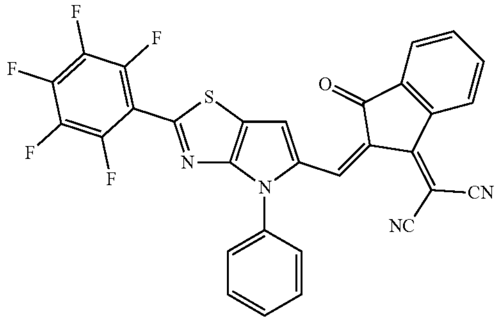
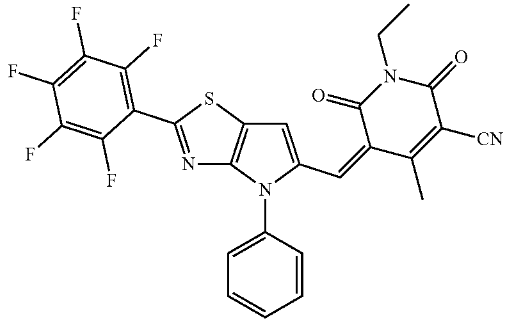
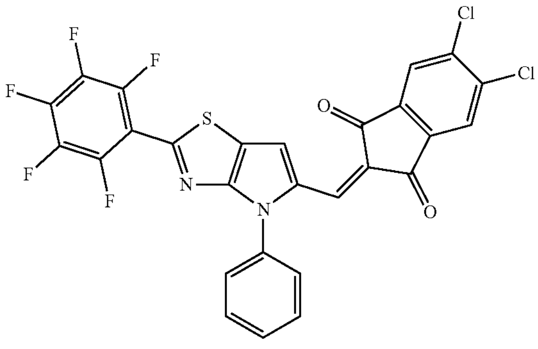

-continued
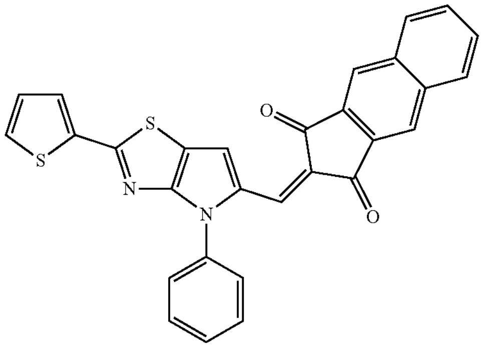
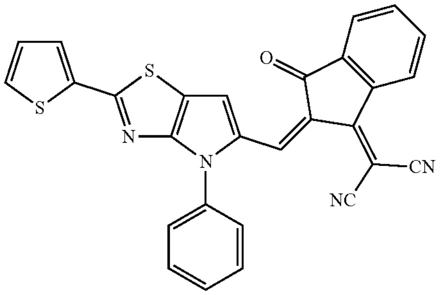
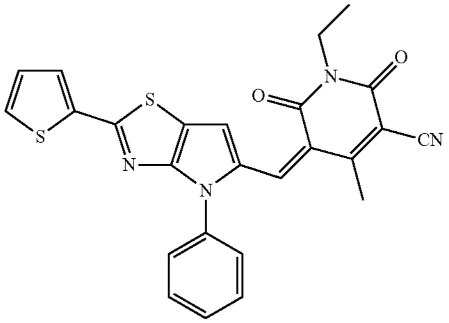
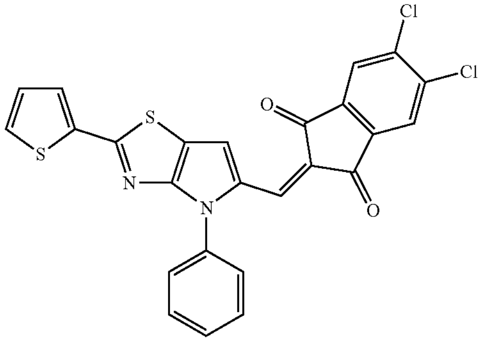
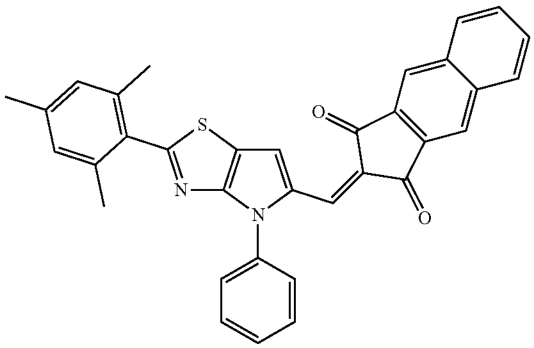
-continued
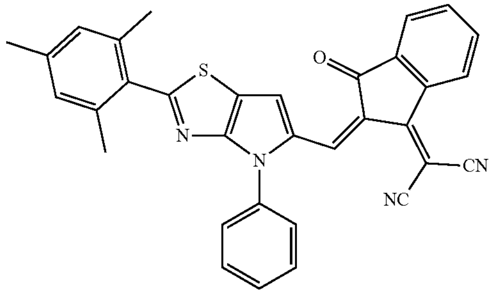
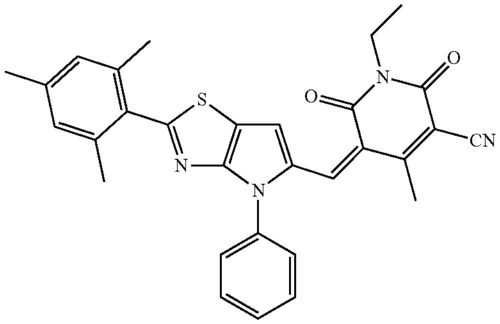
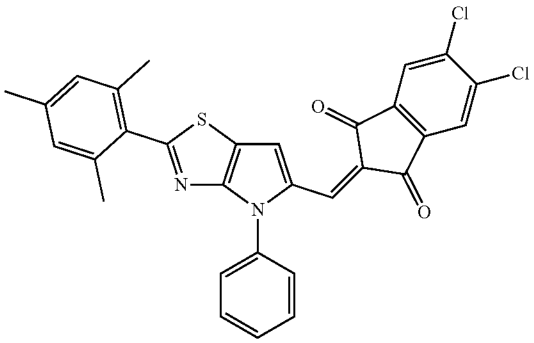
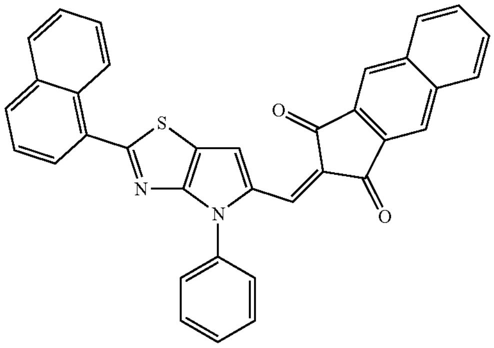
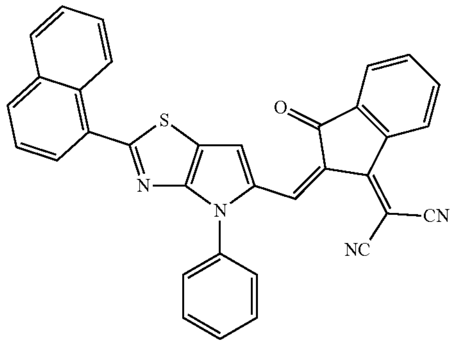

-continued
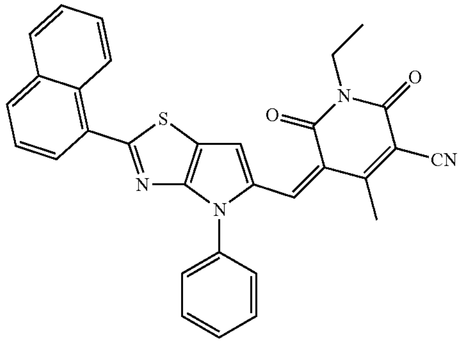
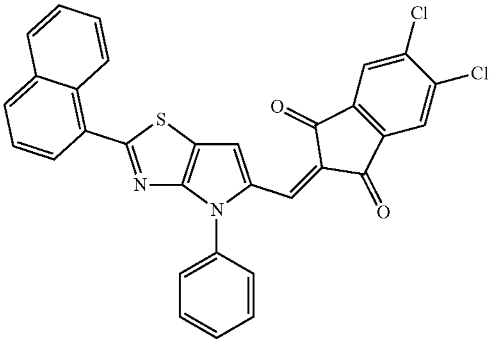
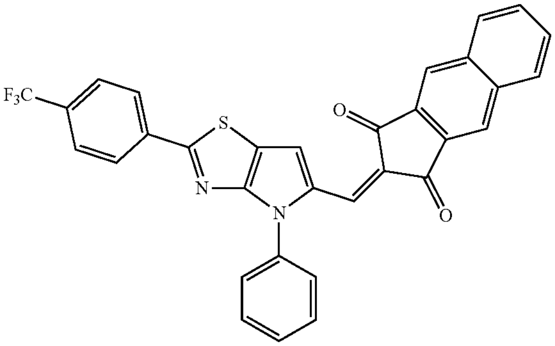
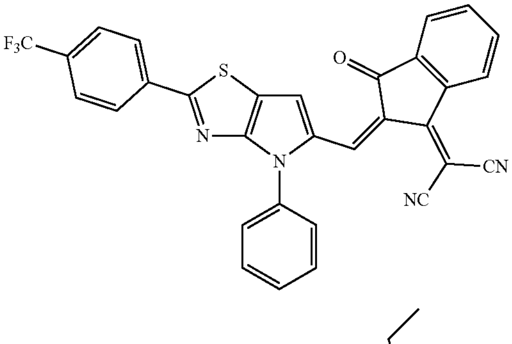
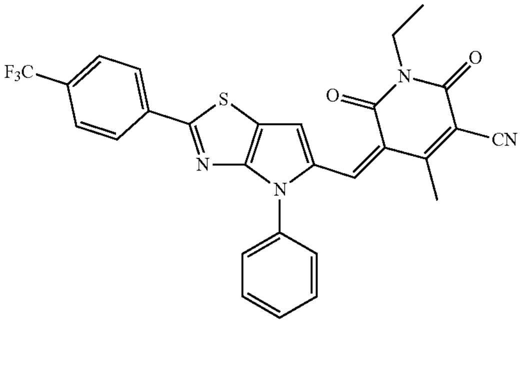
-continued
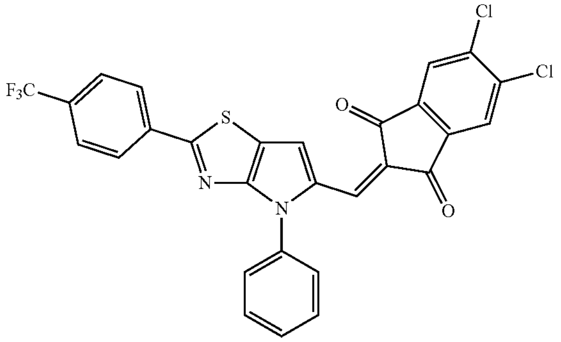
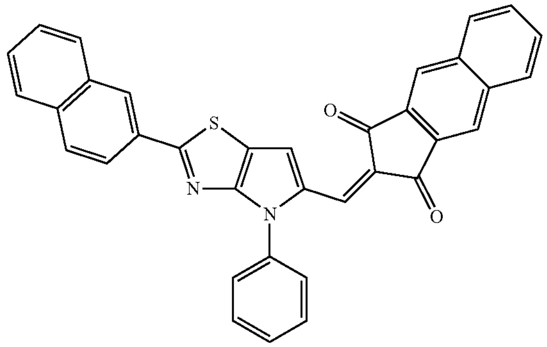
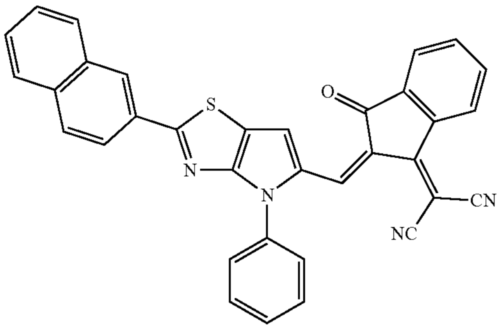
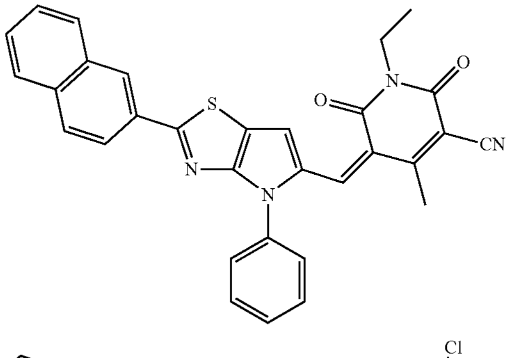
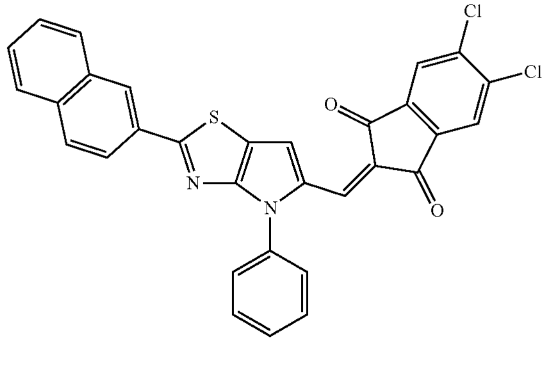

-continued
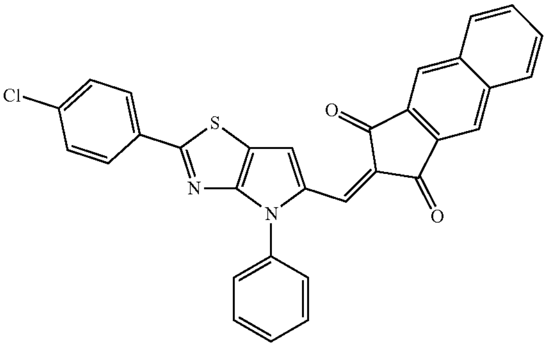
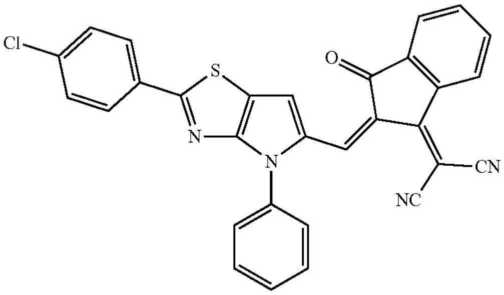
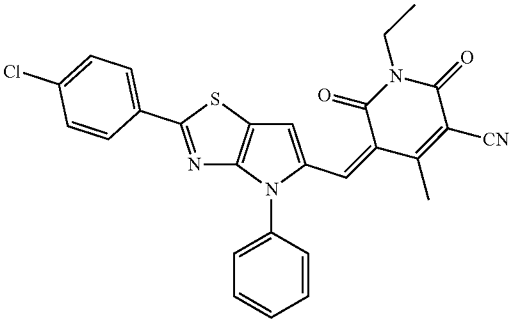
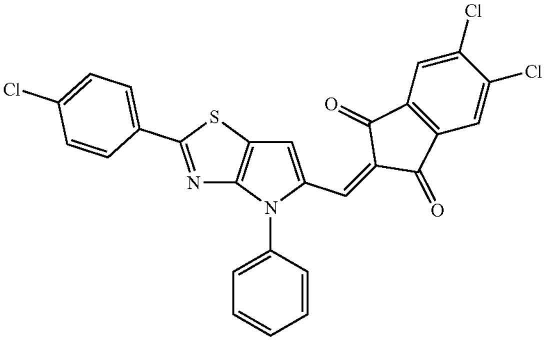
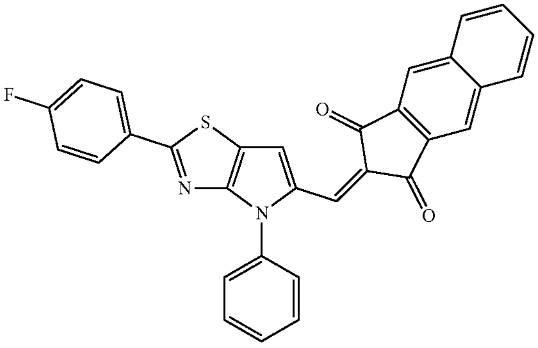
-continued
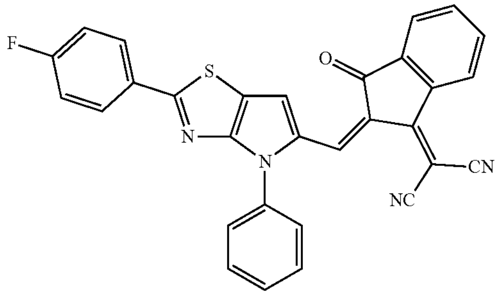
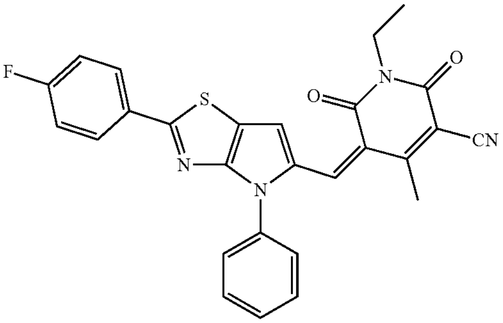
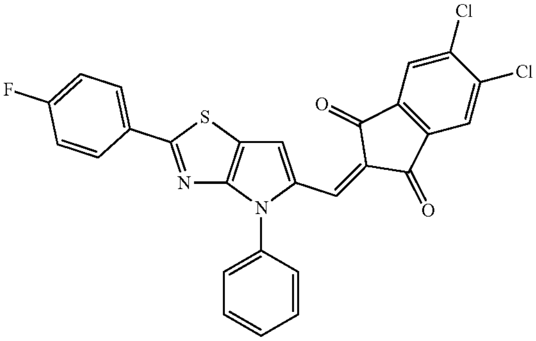
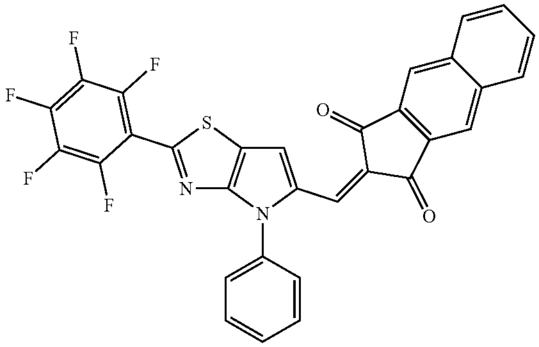
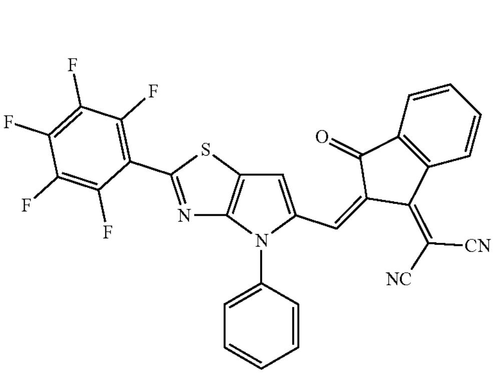

-continued
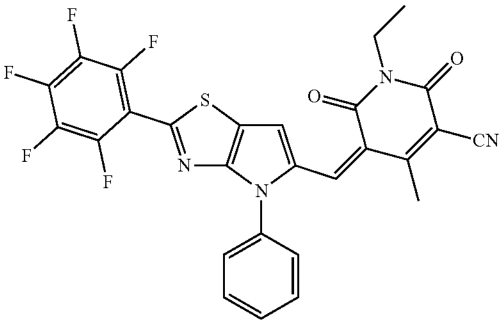
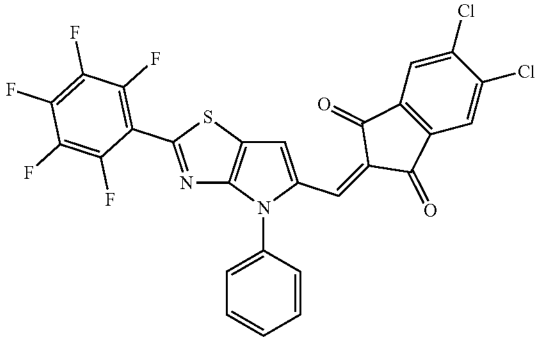
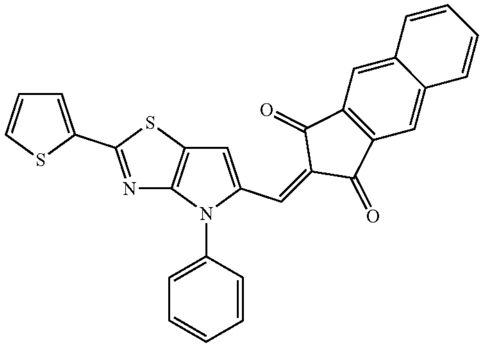
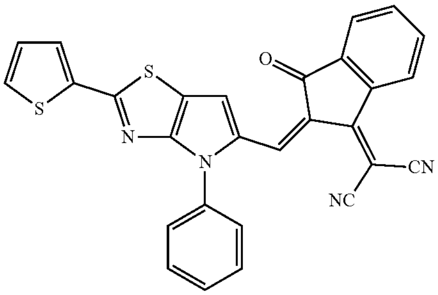
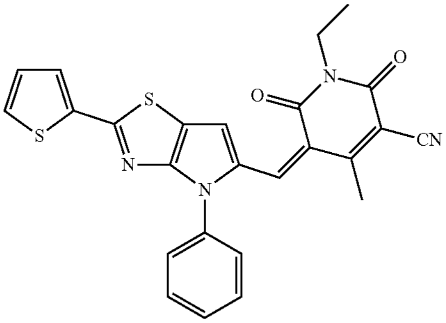
-continued
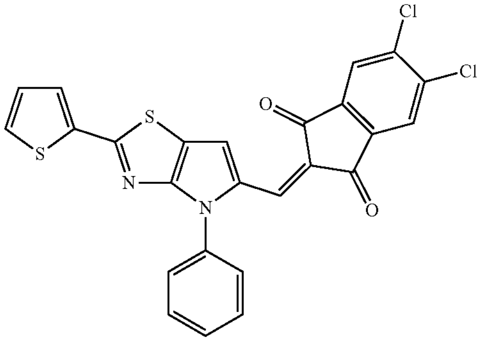
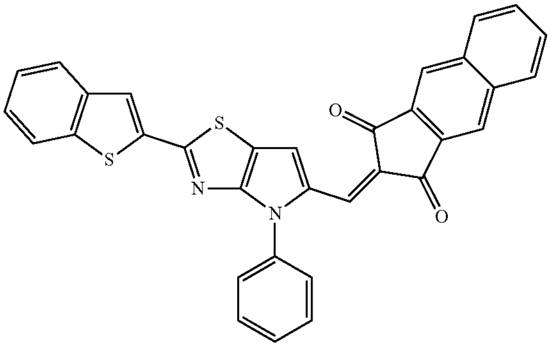
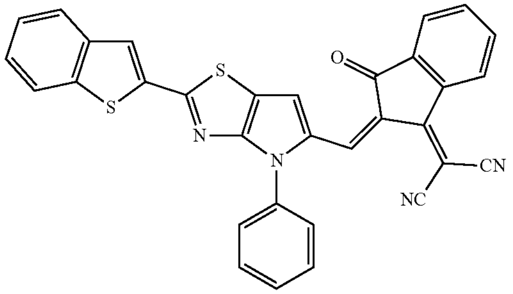
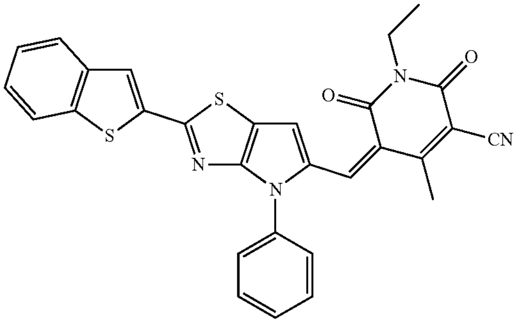
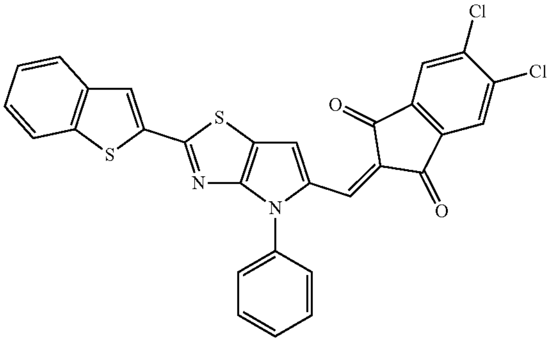

-continued
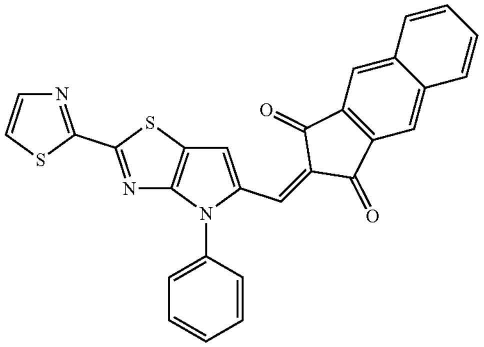
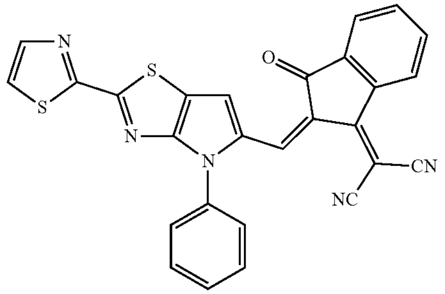
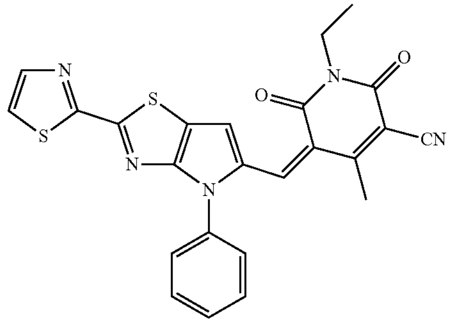
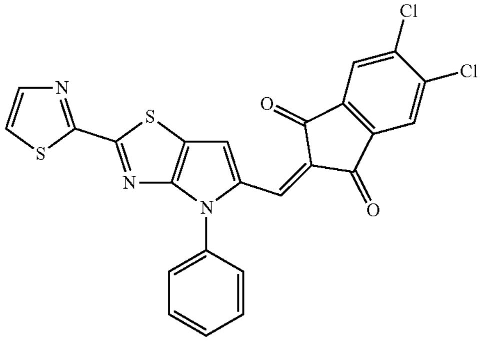
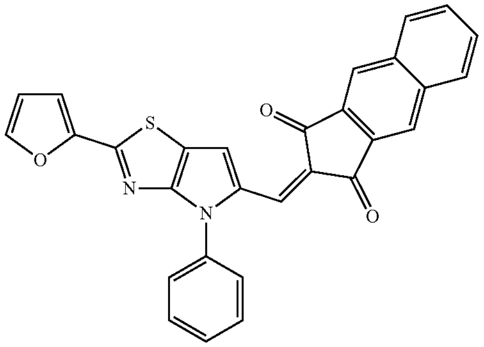
-continued
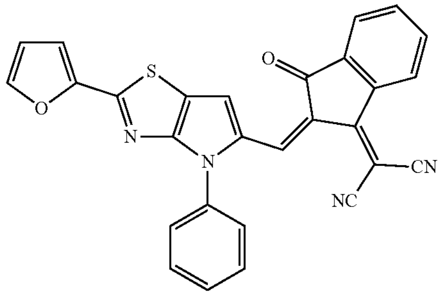
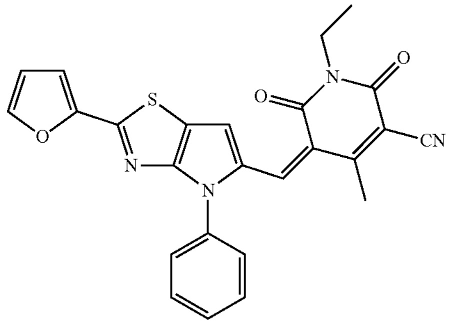
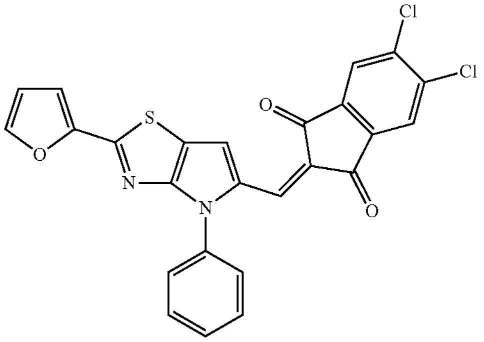
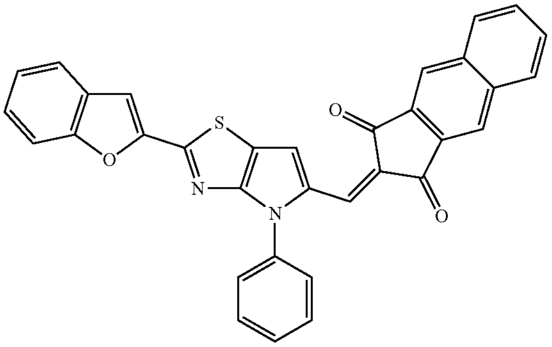
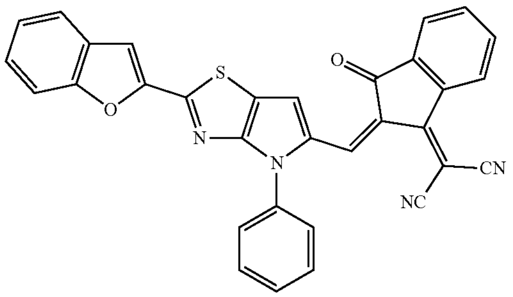

-continued
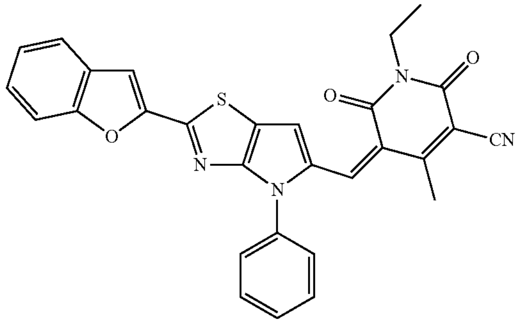
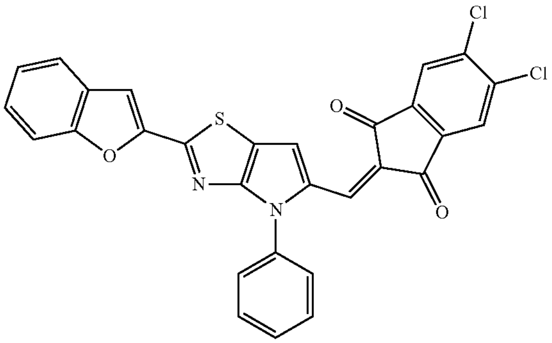
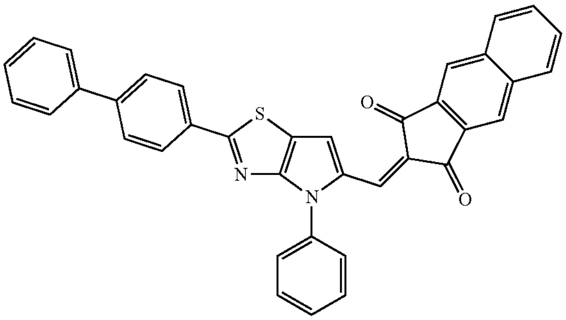
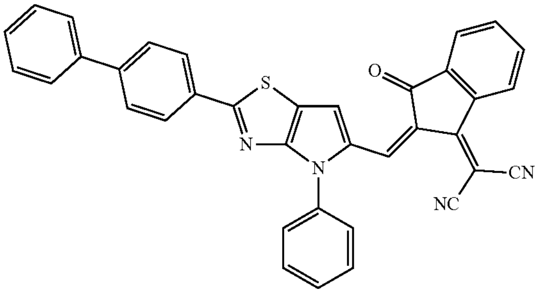
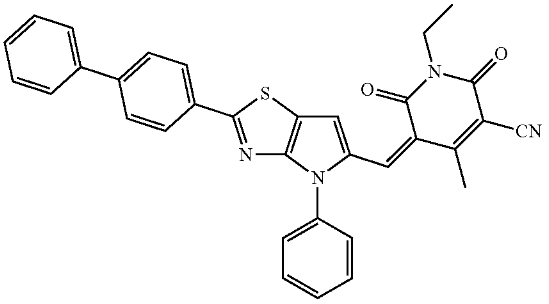
-continued
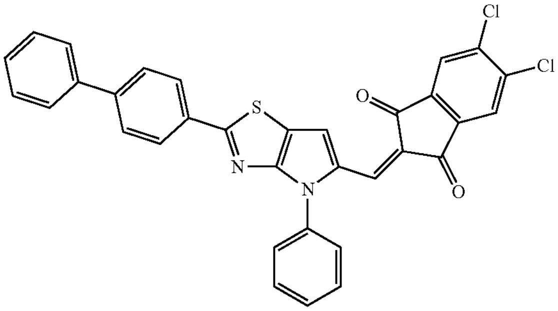
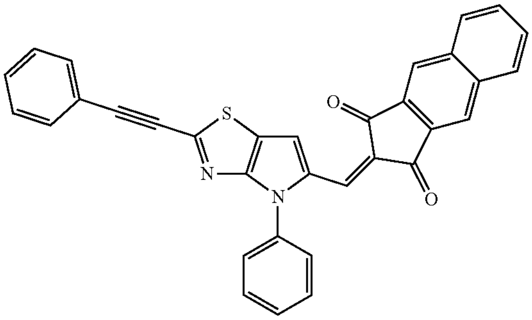
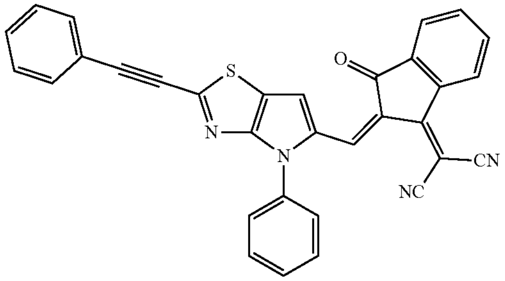
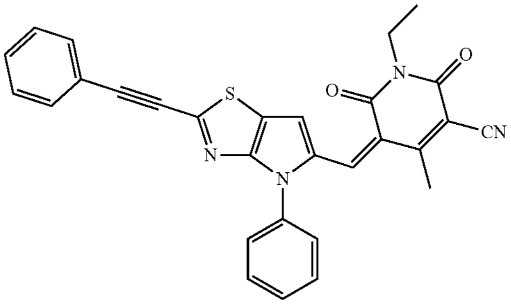
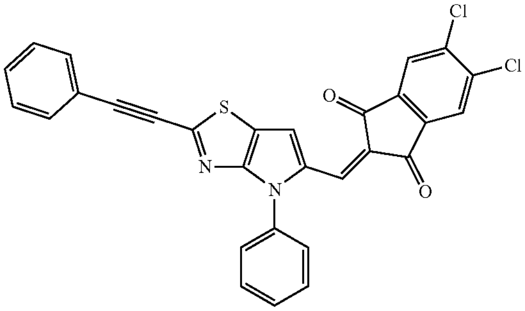

-continued
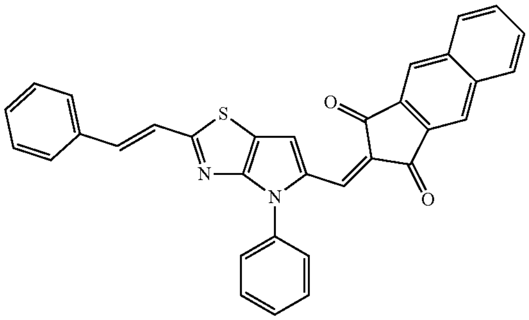
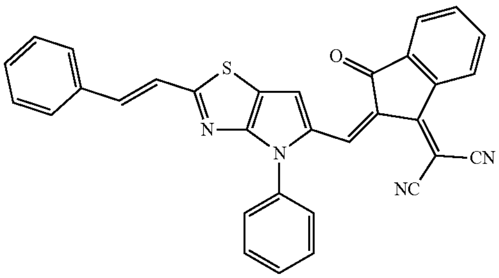
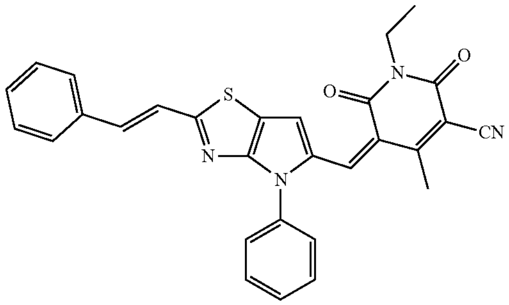
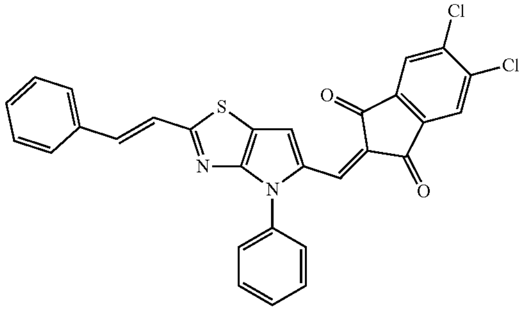
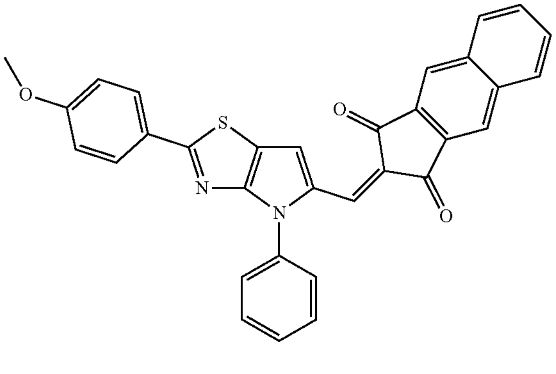
-continued
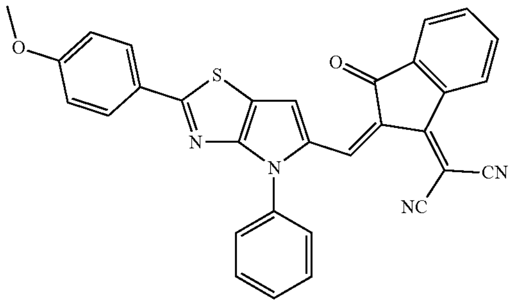
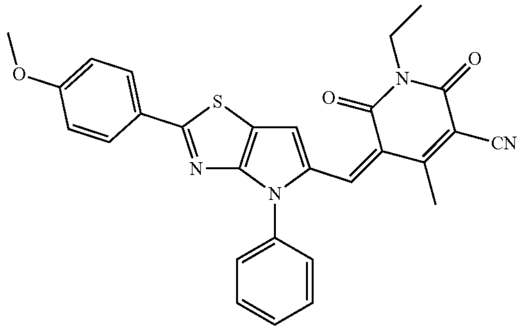
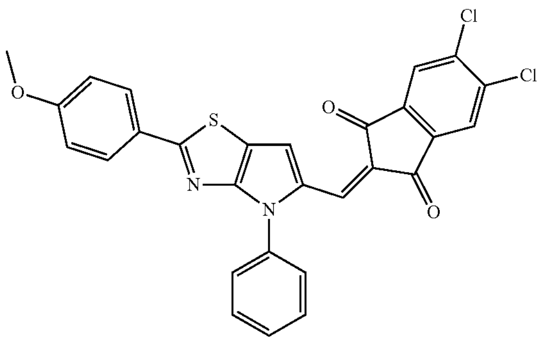
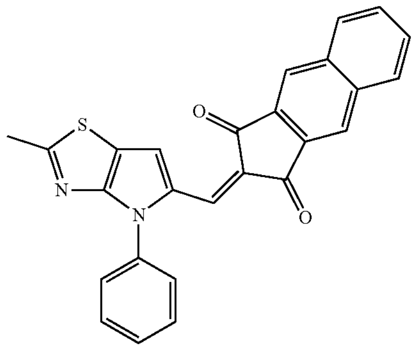
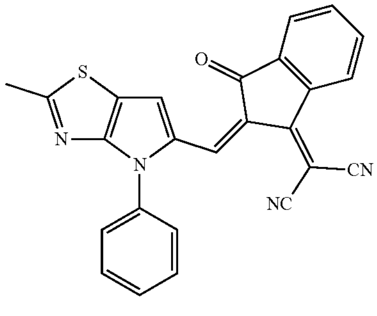

-continued
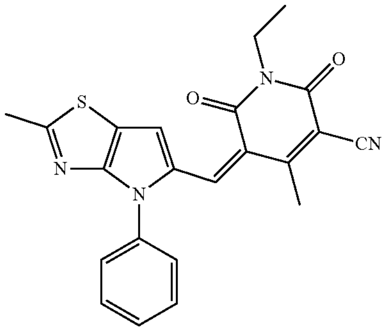
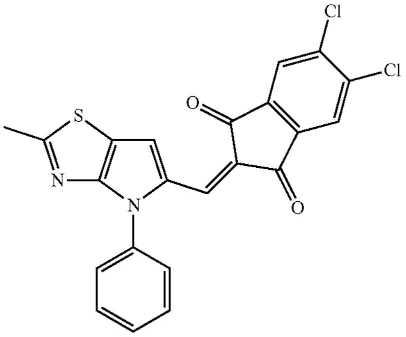
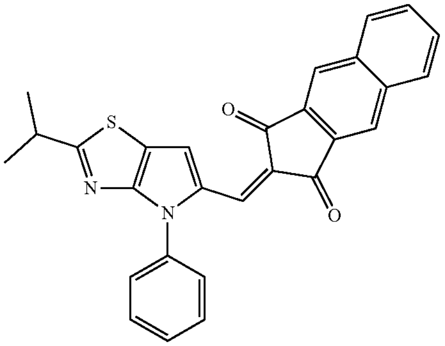
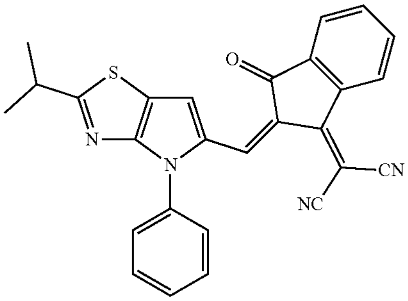
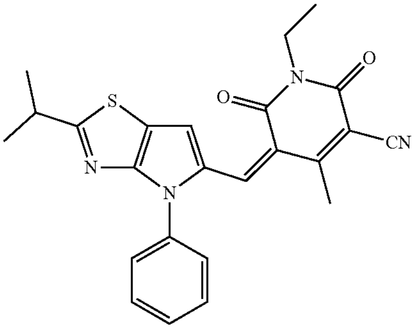
-continued
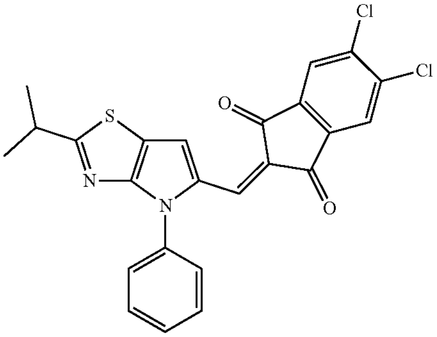
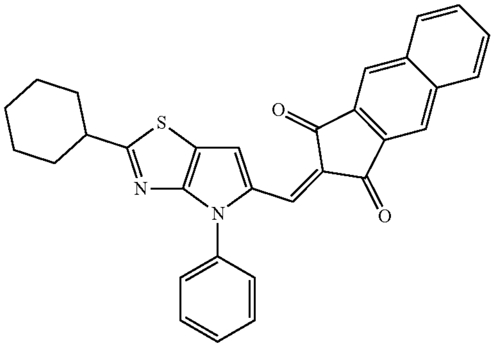
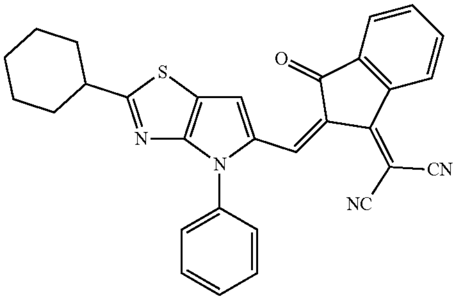
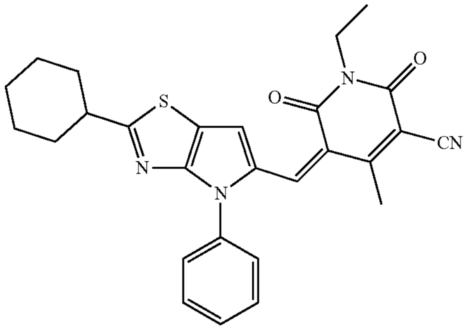
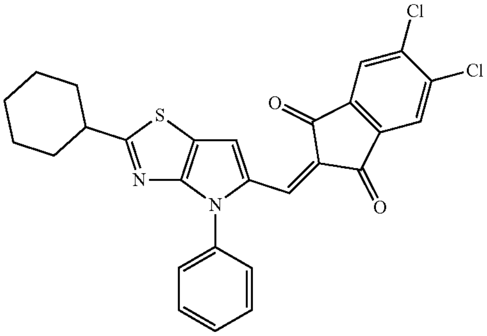

-continued
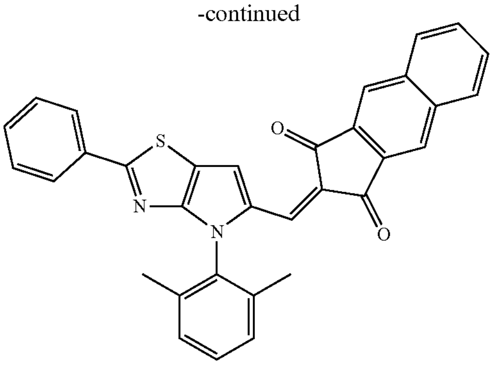
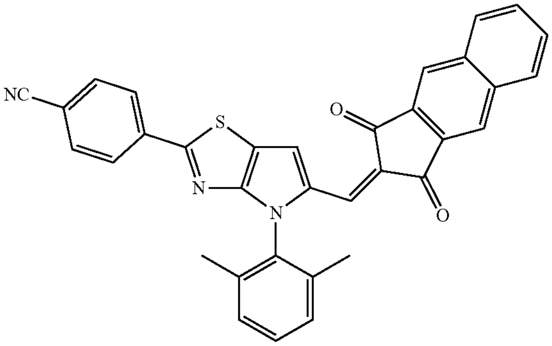
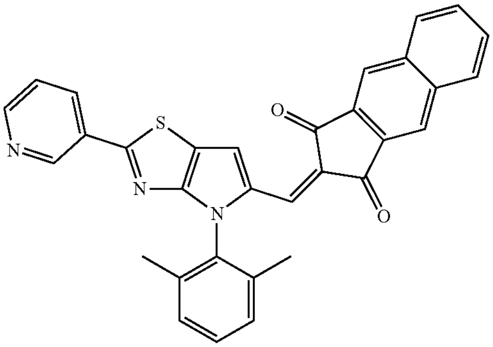
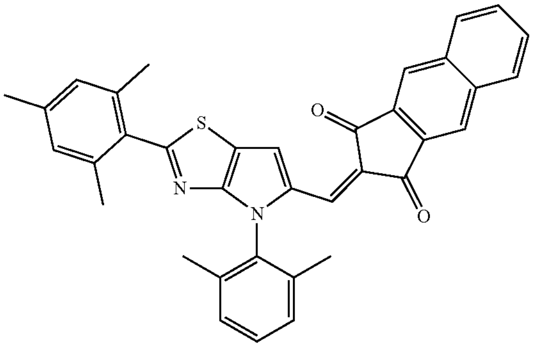
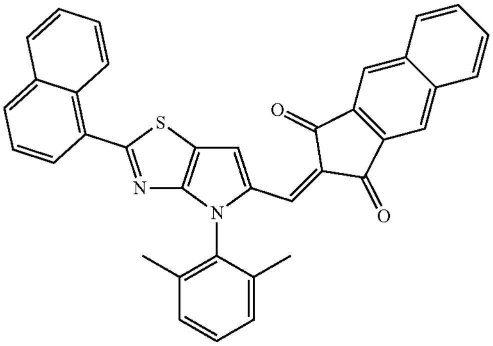
-continued
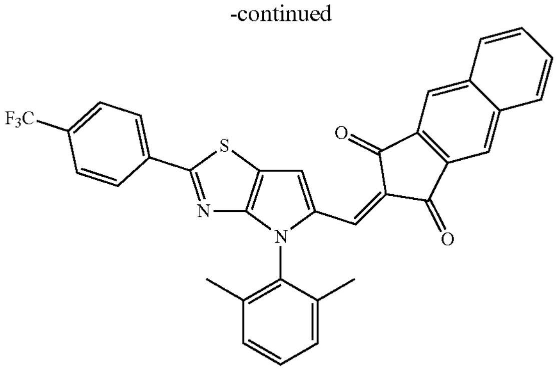
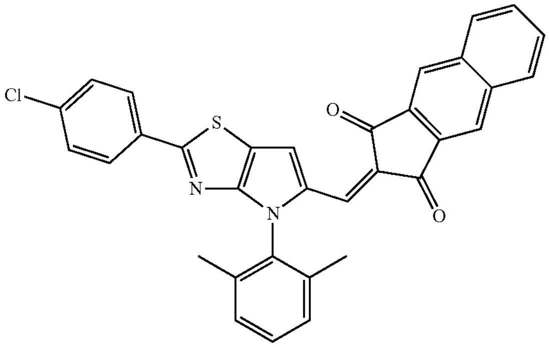
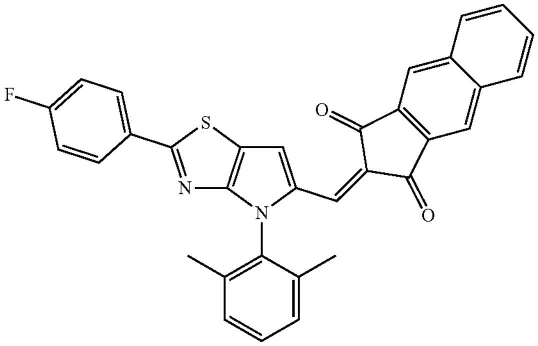
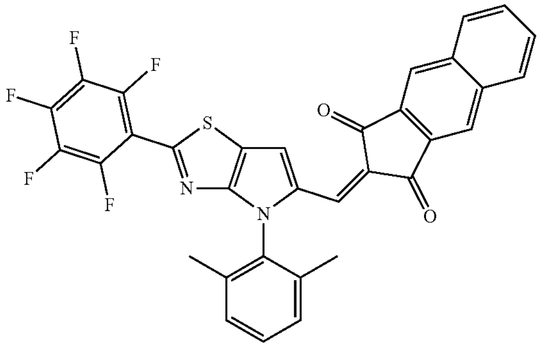
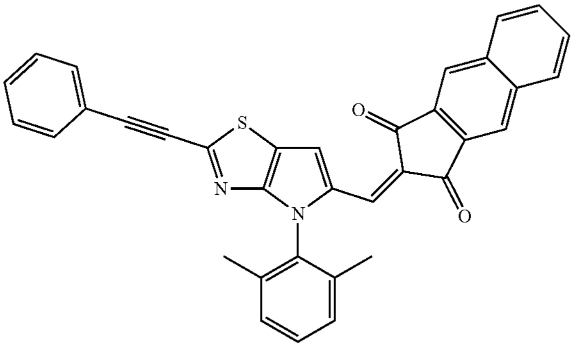

-continued
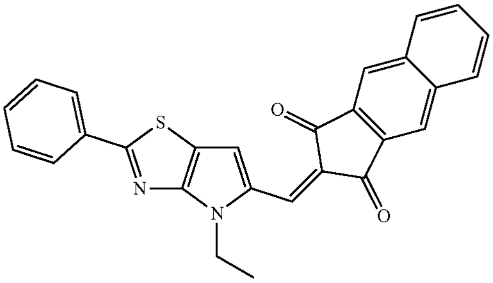
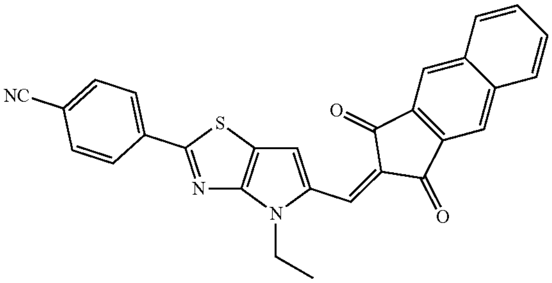
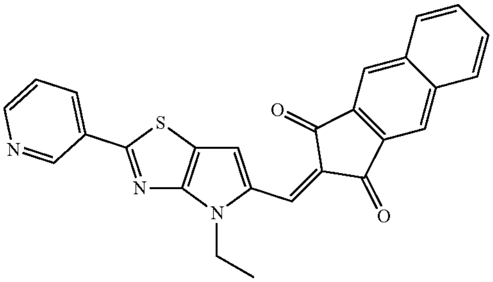
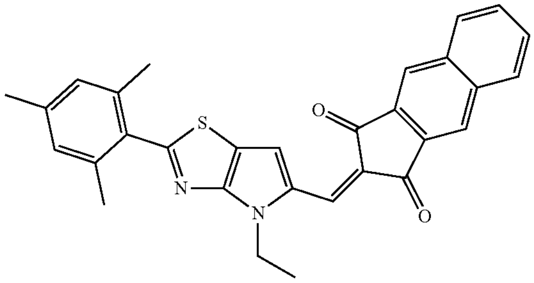
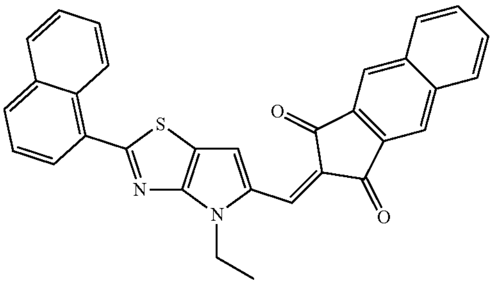
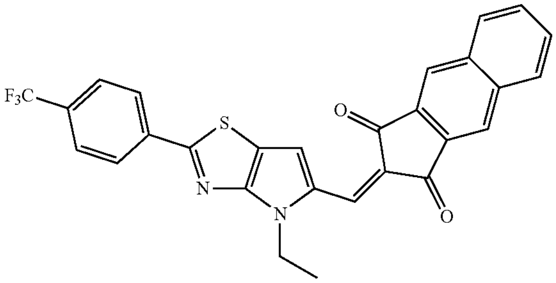
-continued
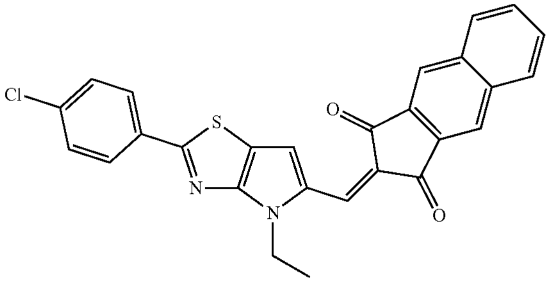
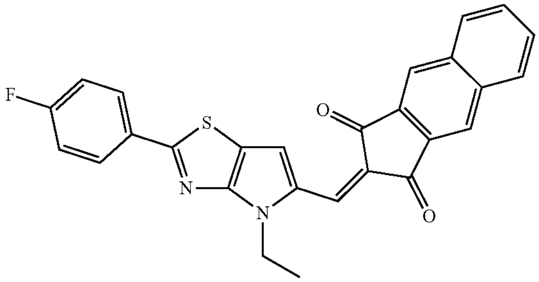
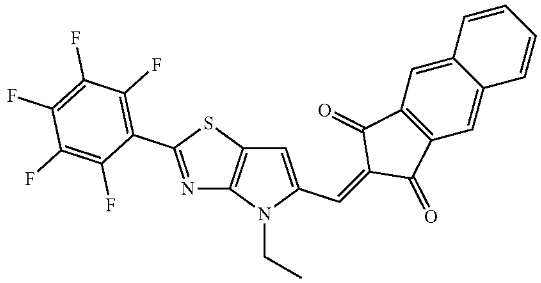
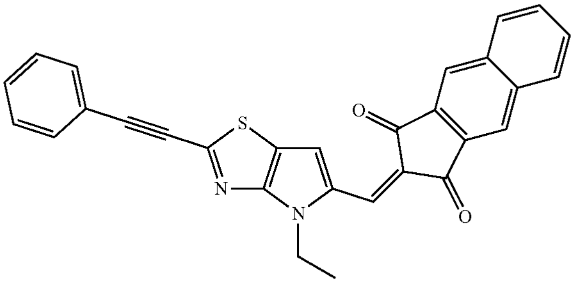
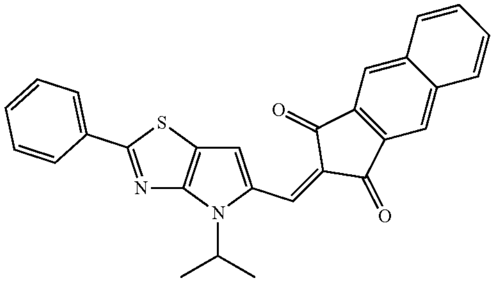

-continued
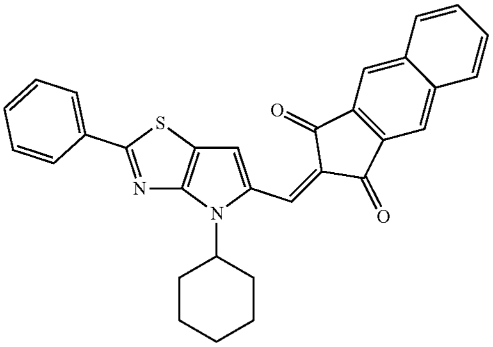
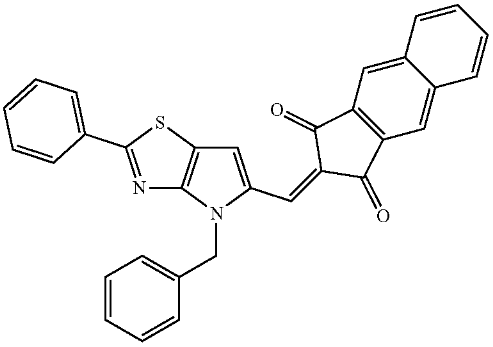
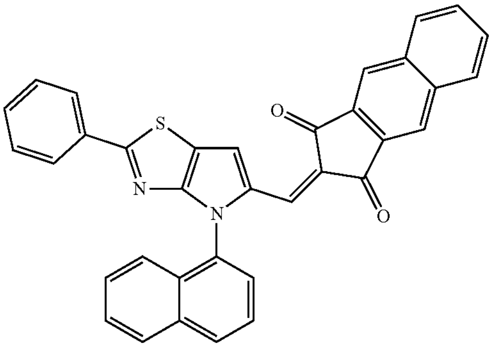
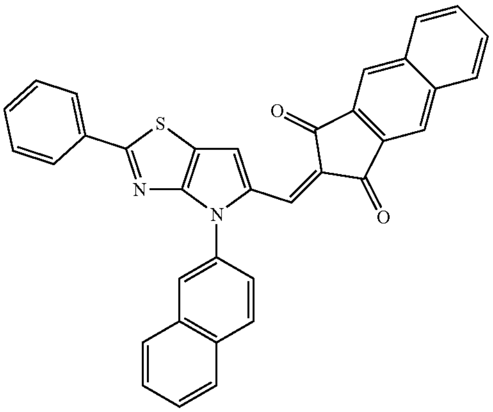
-continued
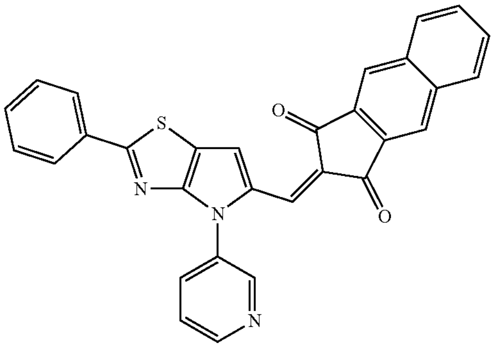
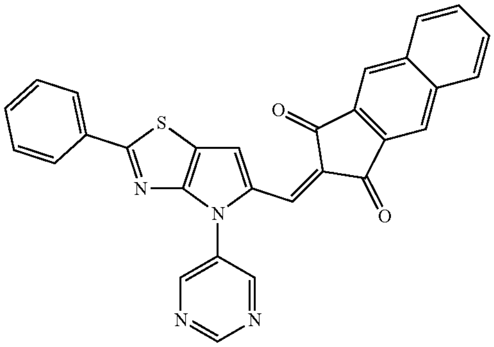
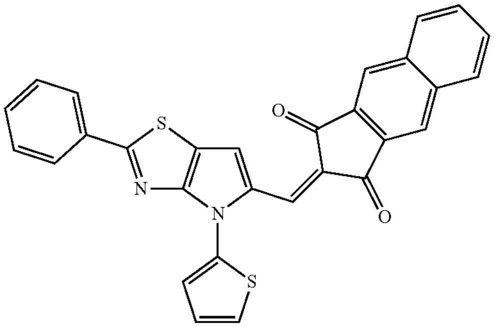
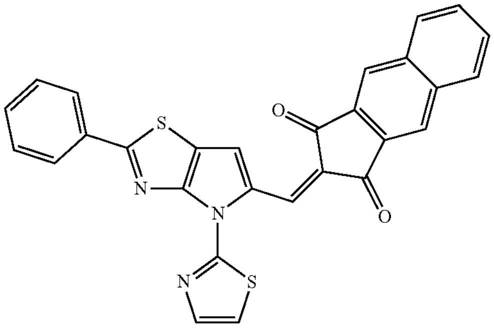

-continued
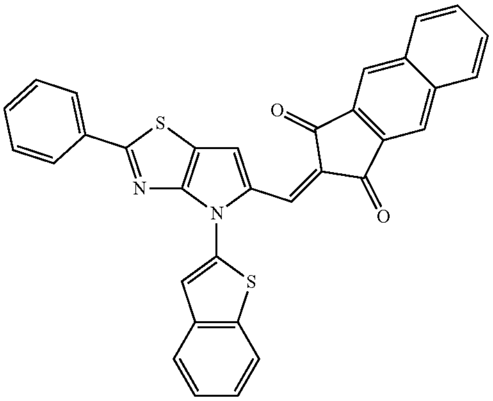
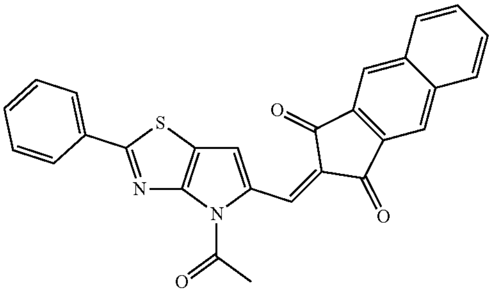
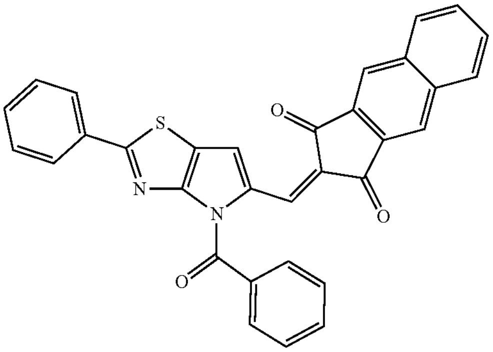
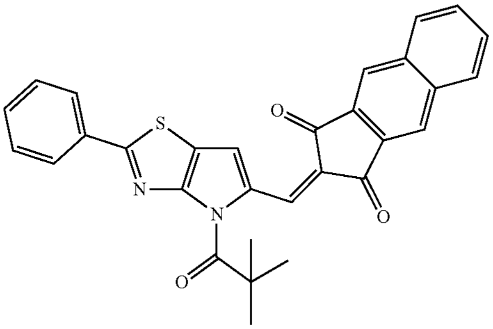
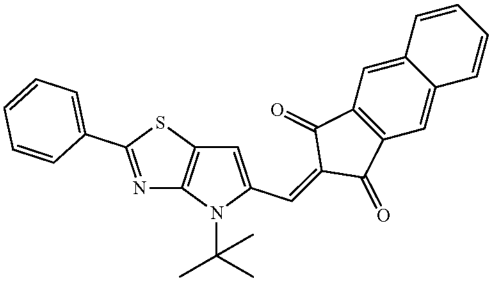
-continued
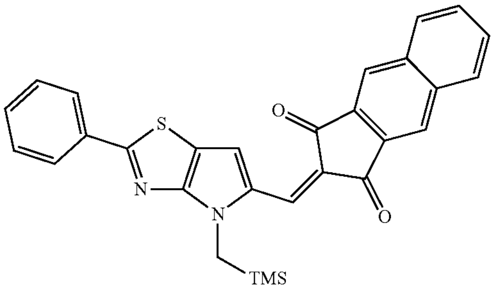
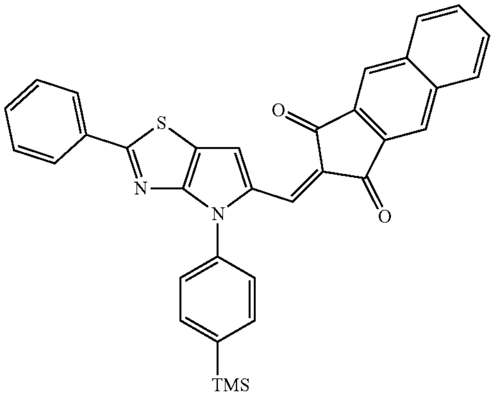
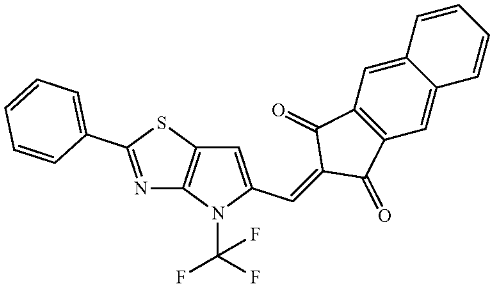
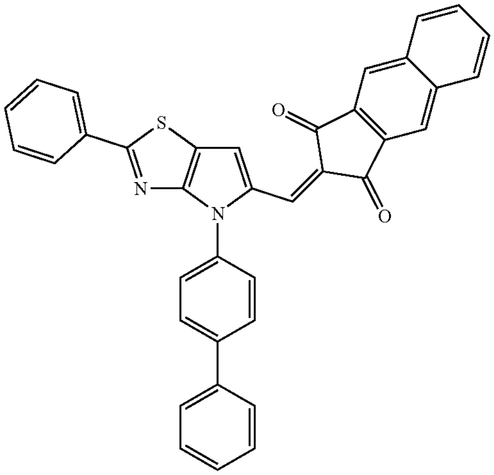

-continued
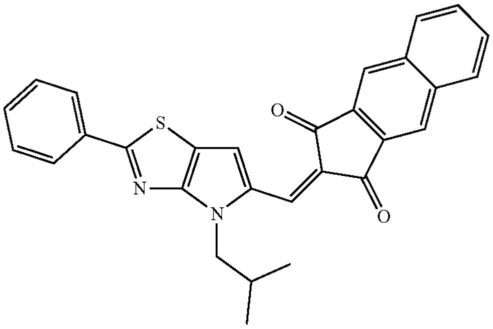
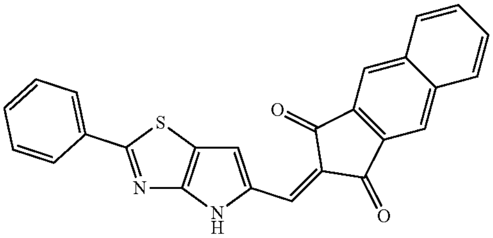
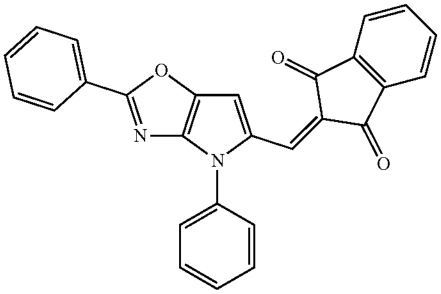
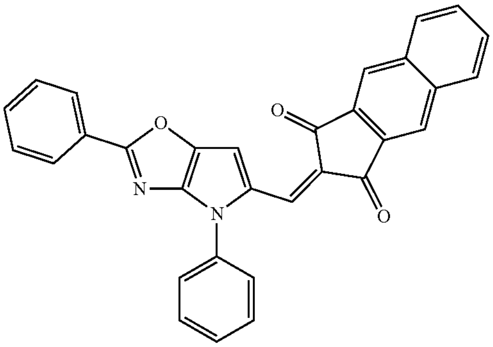
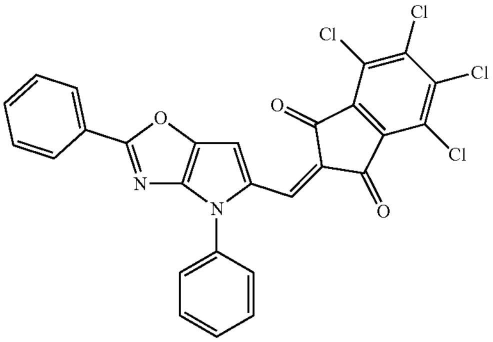
-continued
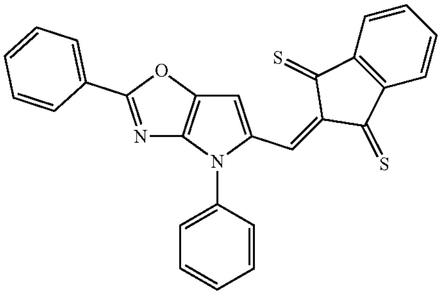
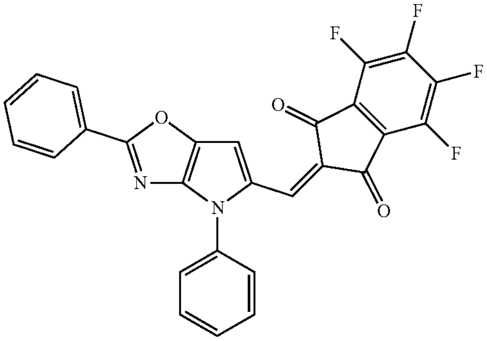
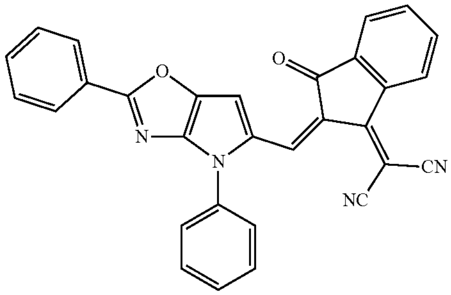
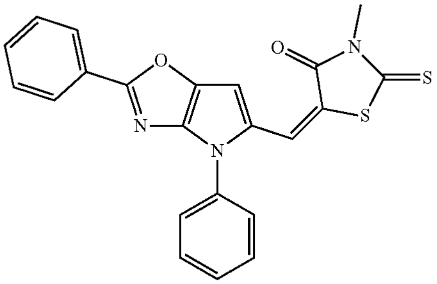
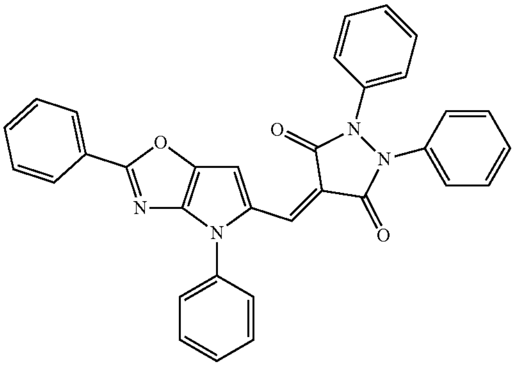

-continued
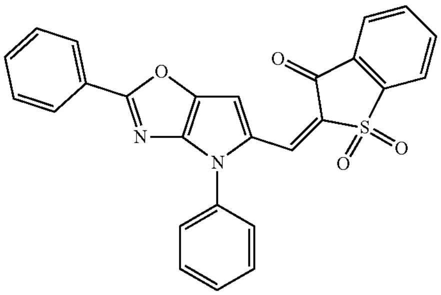
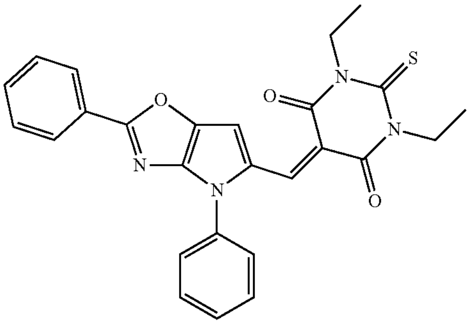
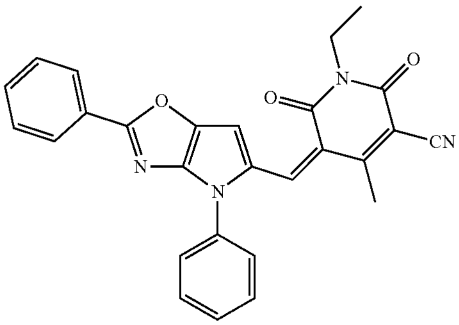
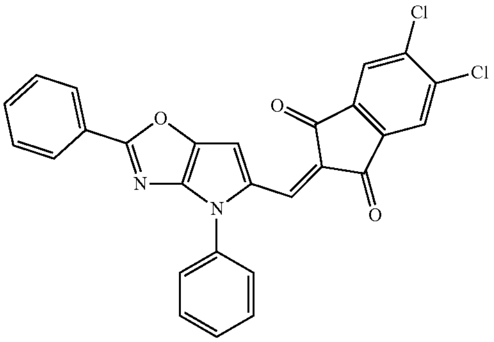
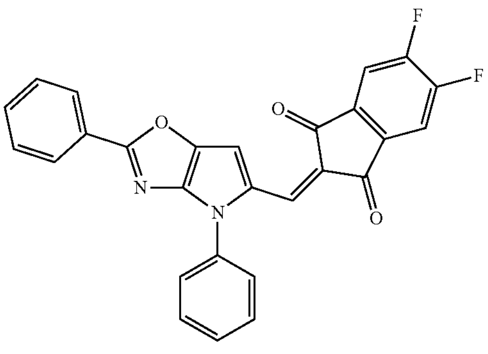
-continued
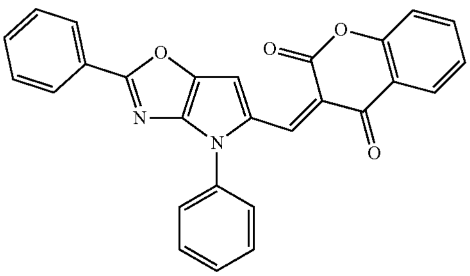
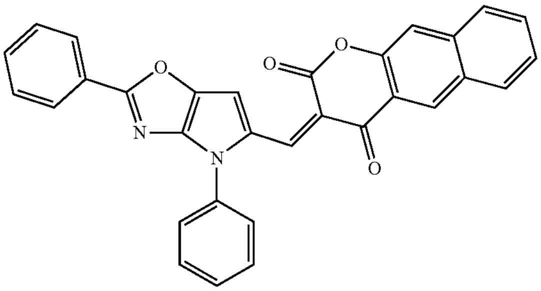
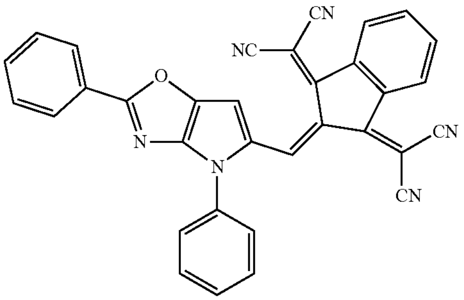
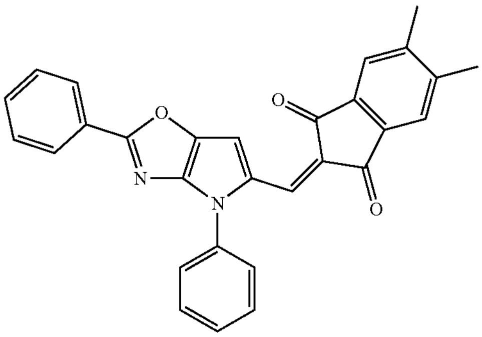
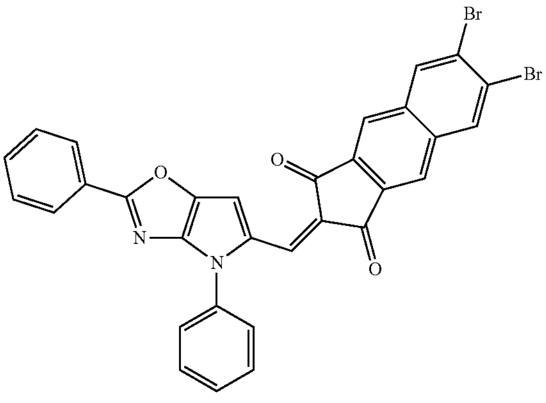

-continued
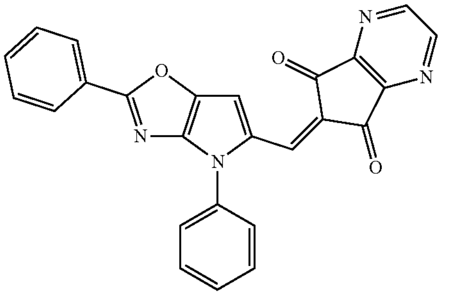
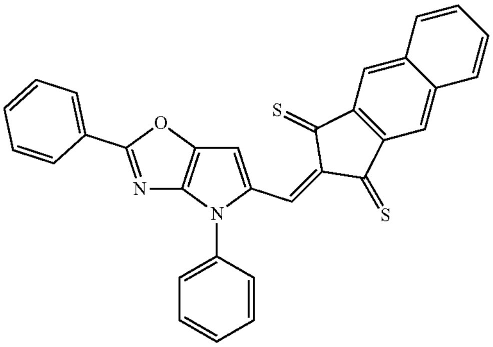
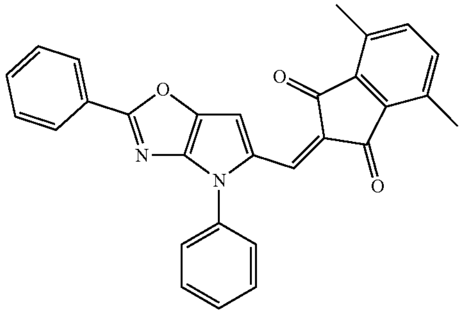
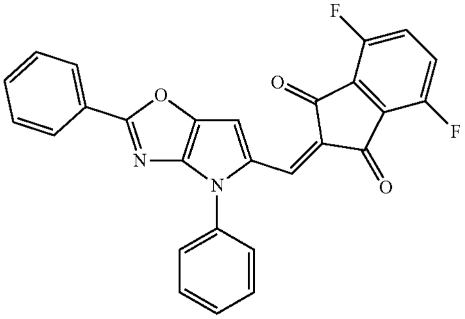
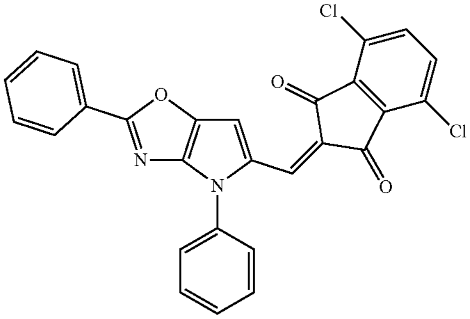
-continued
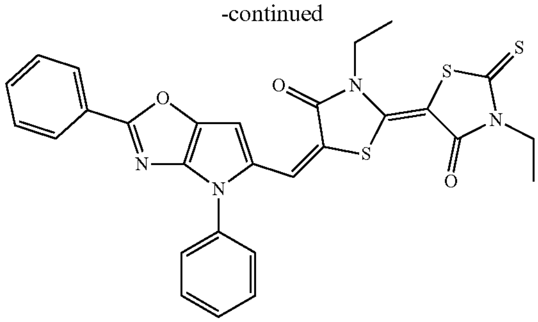
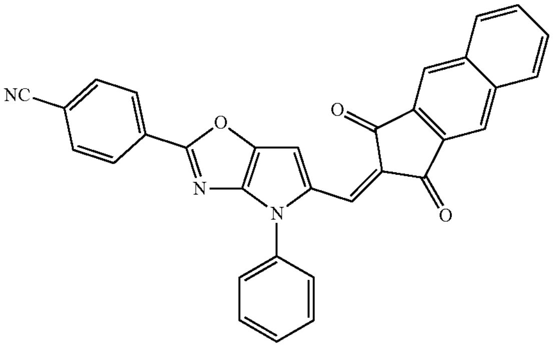
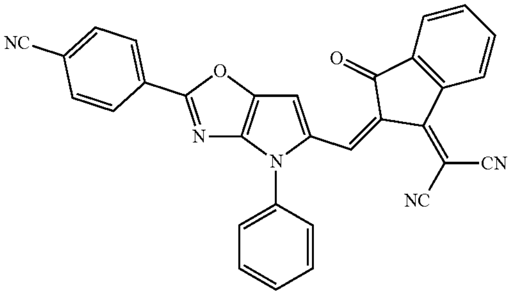
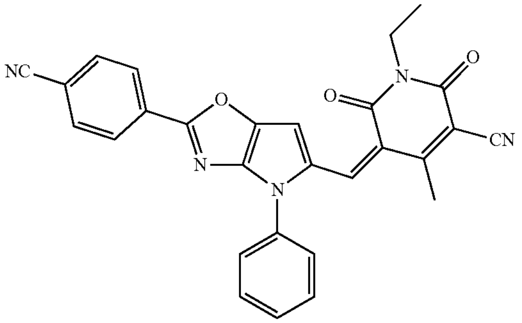
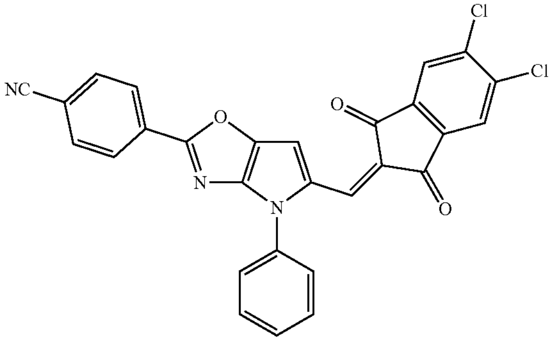

-continued
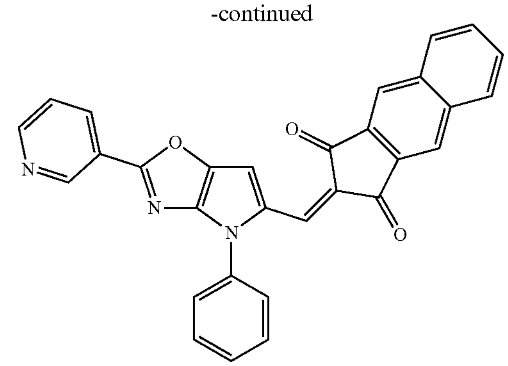
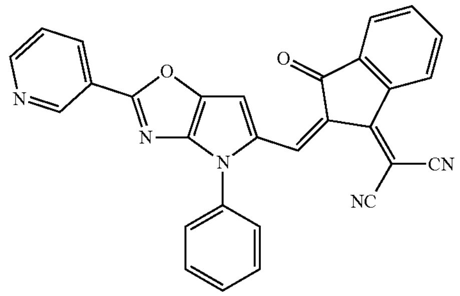
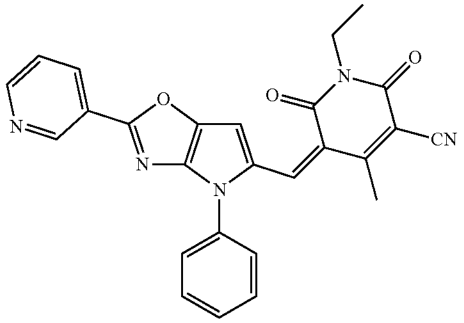
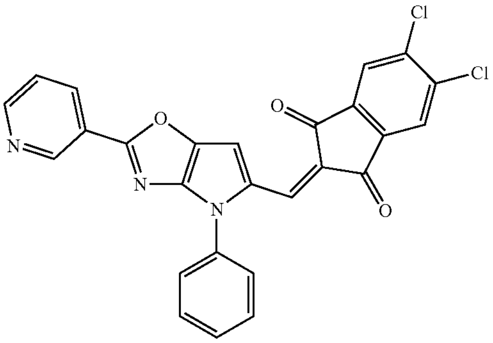
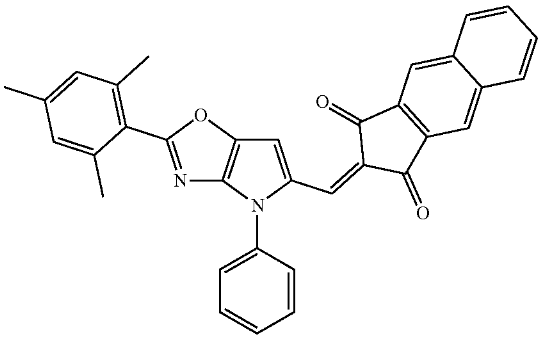
-continued
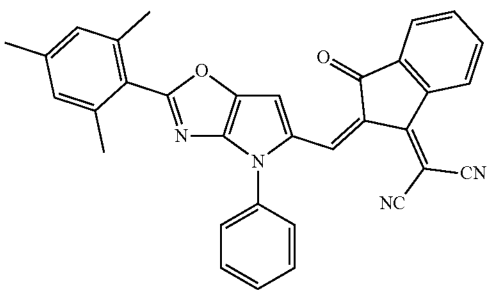
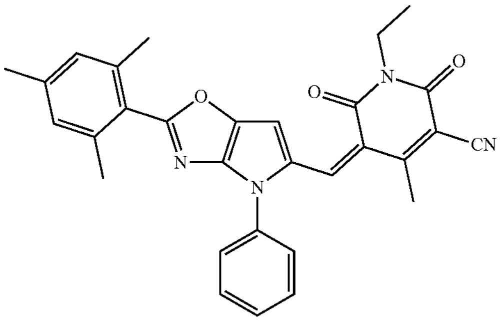
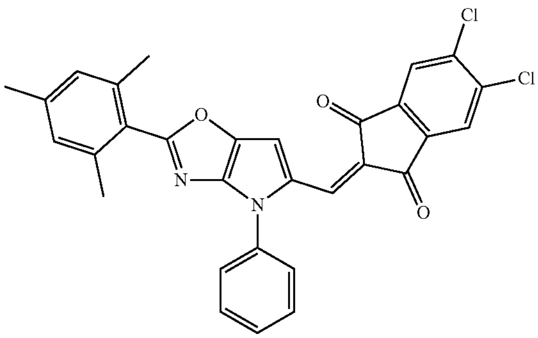
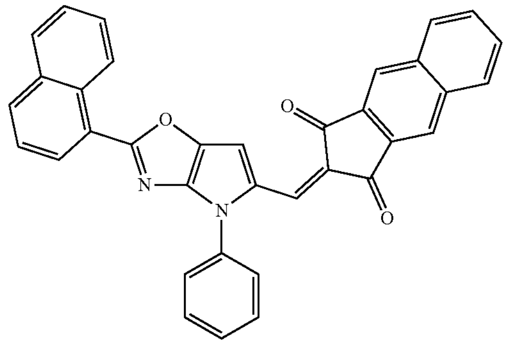
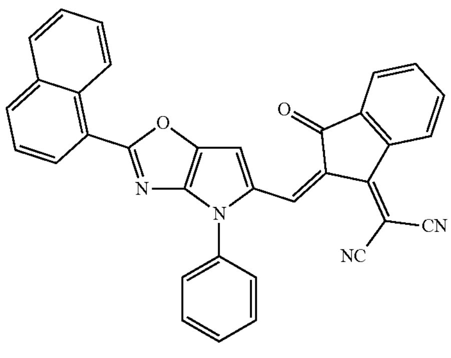

-continued
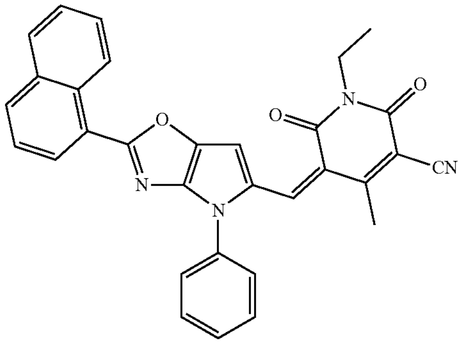
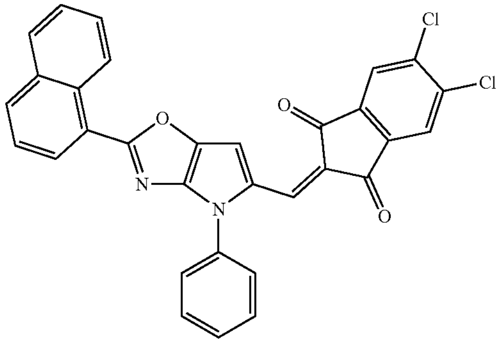
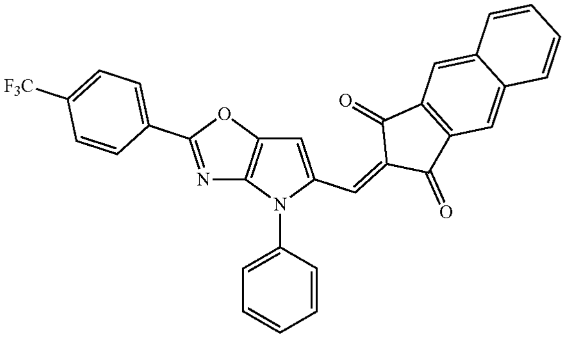
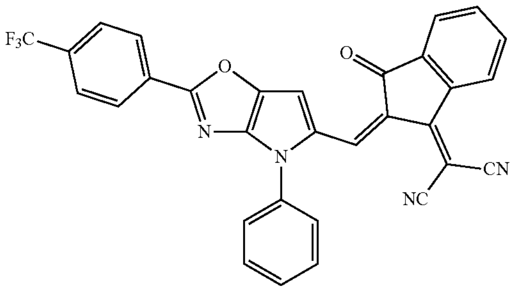
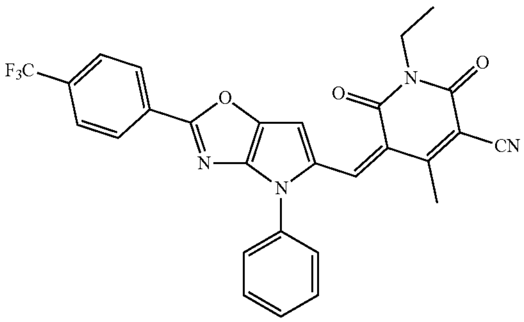
-continued
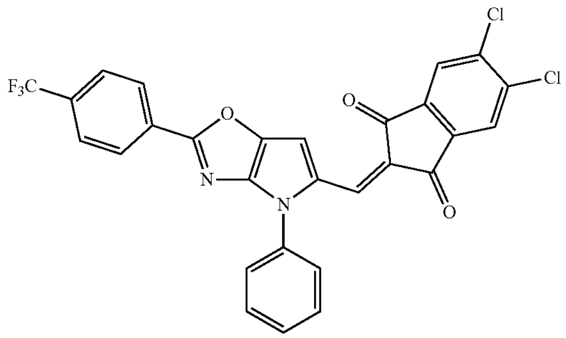
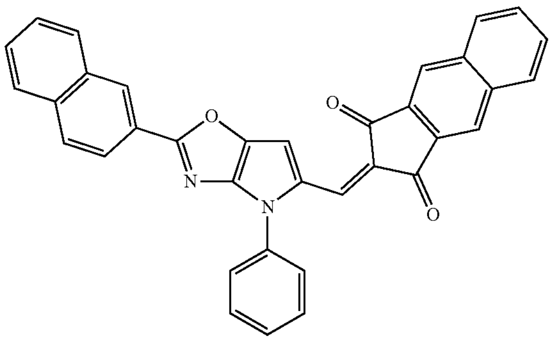
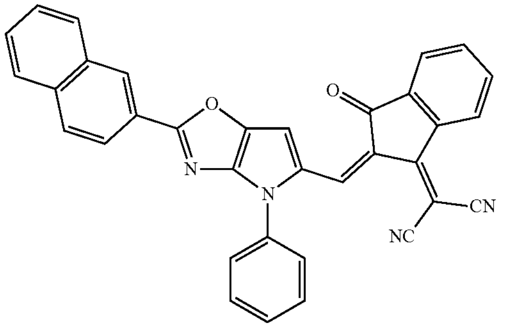
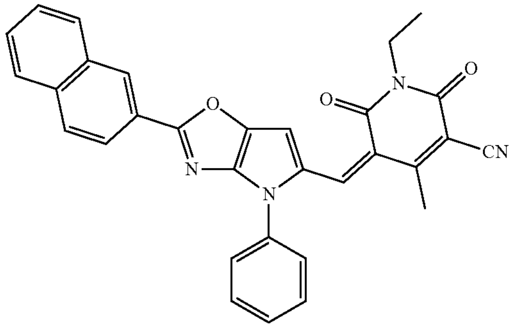
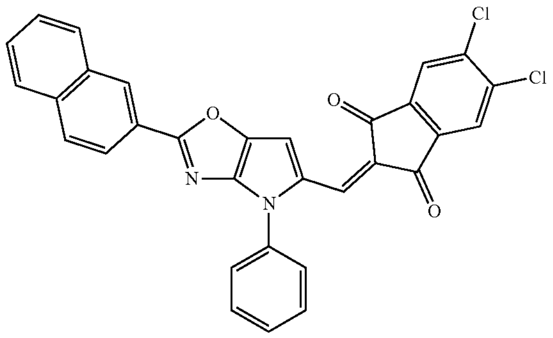

-continued
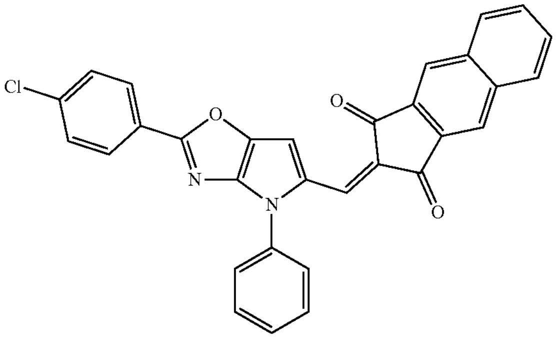
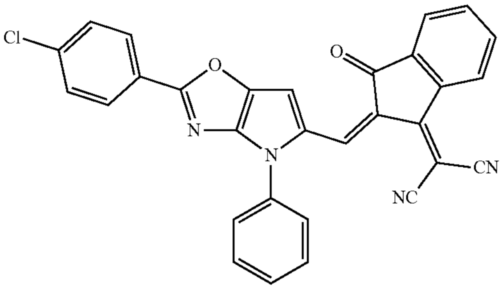
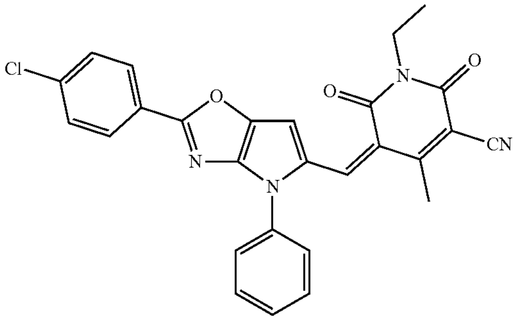
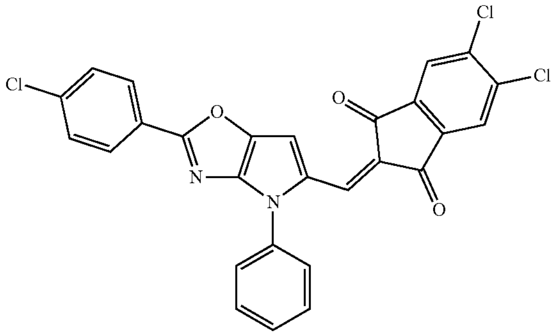
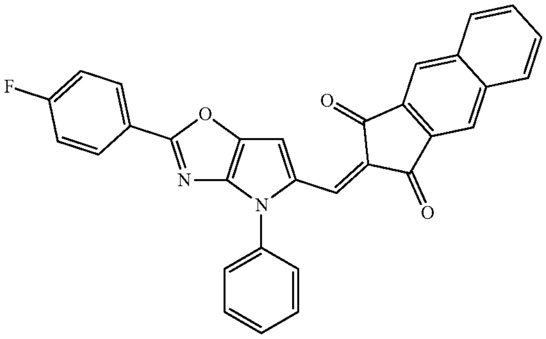
-continued
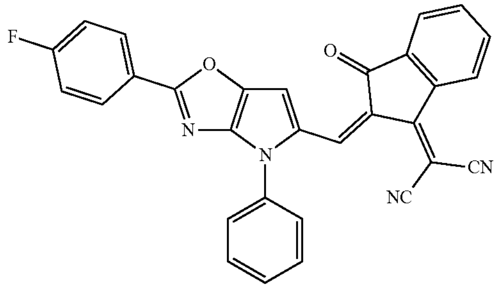
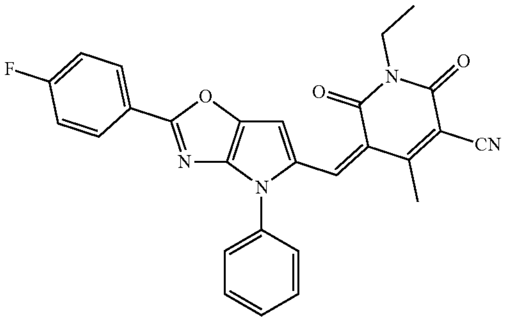
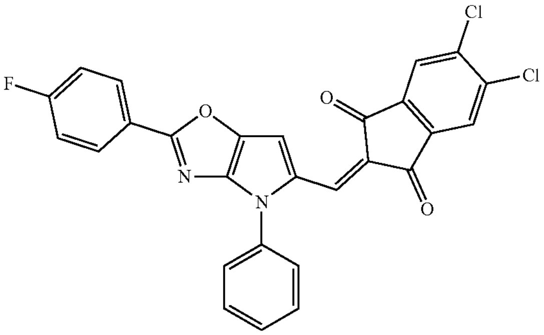
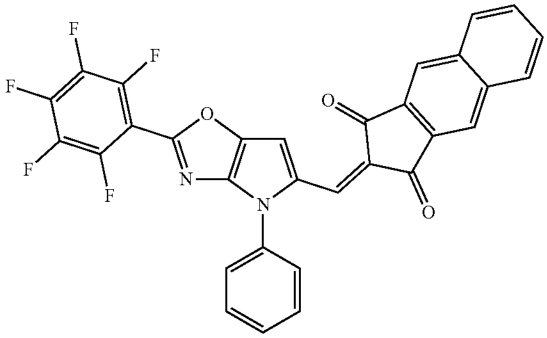
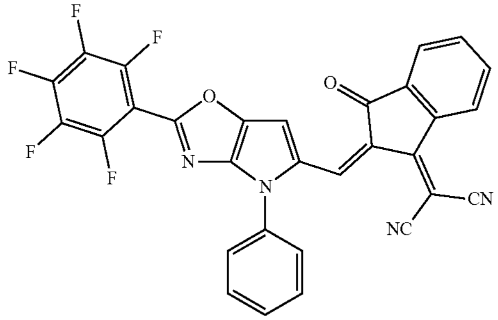

-continued
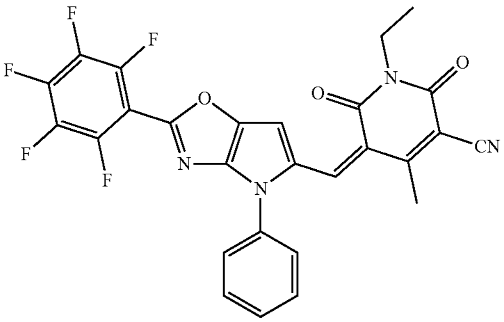
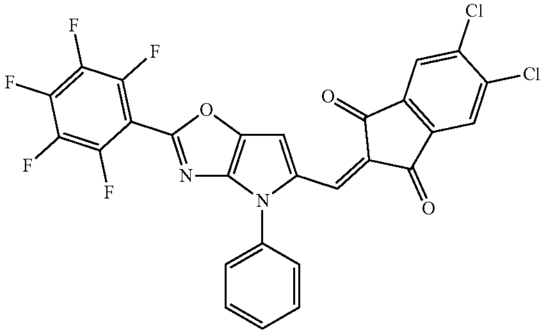
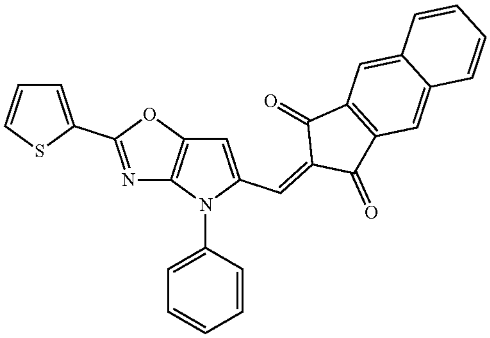
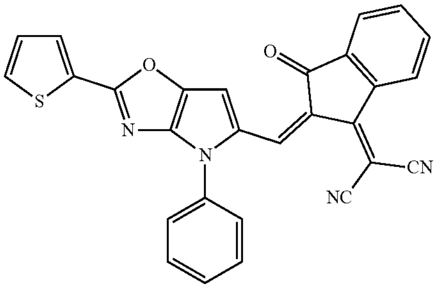
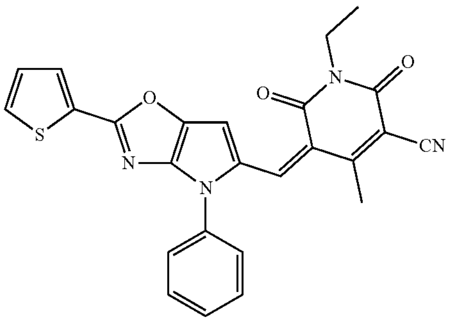
-continued
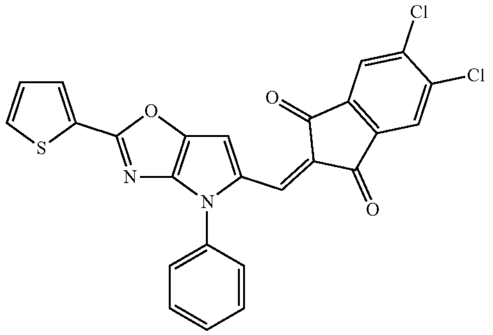
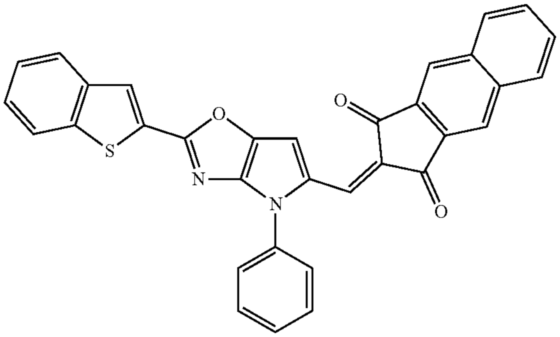
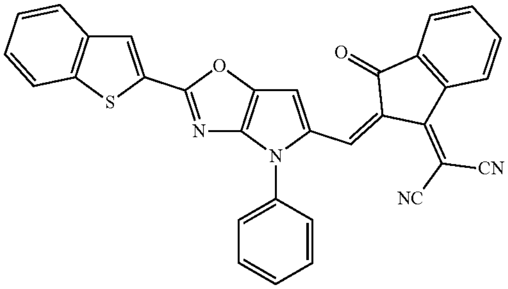
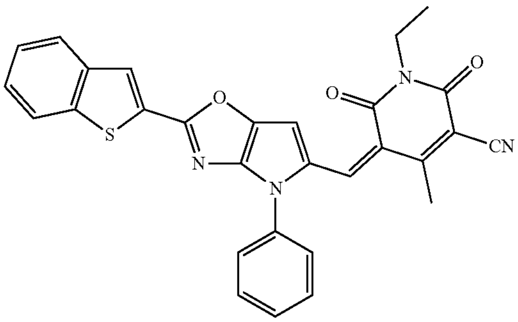
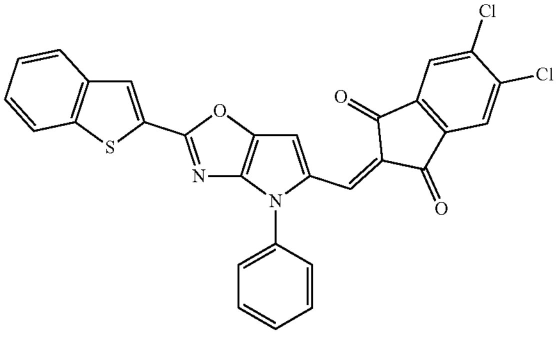

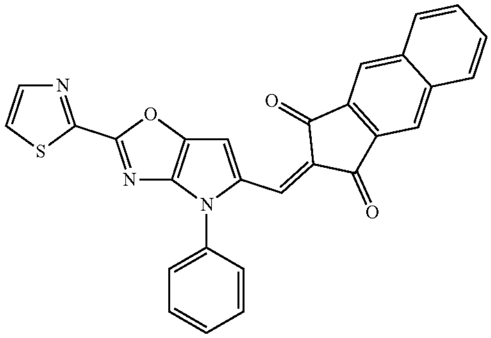
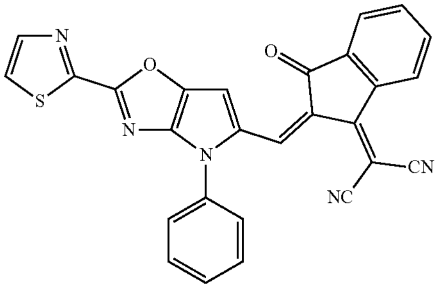
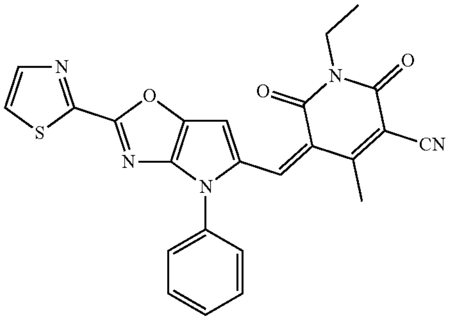
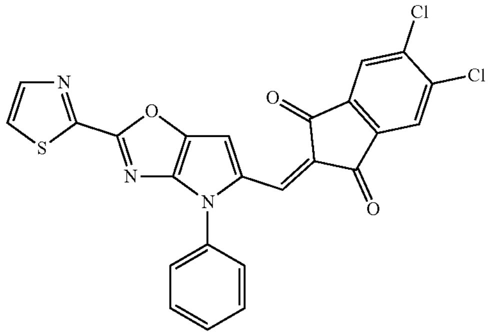
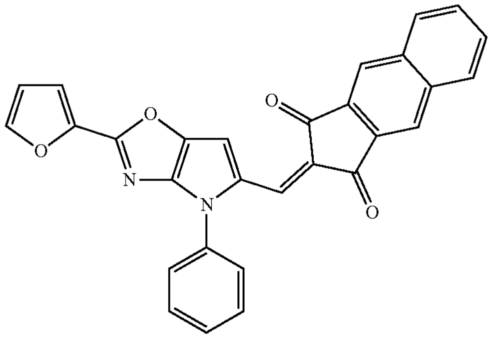
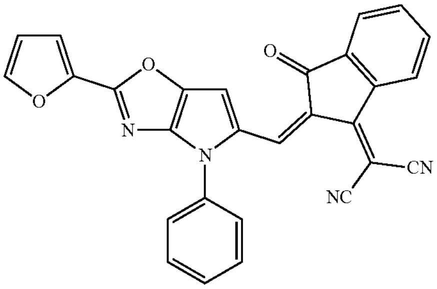
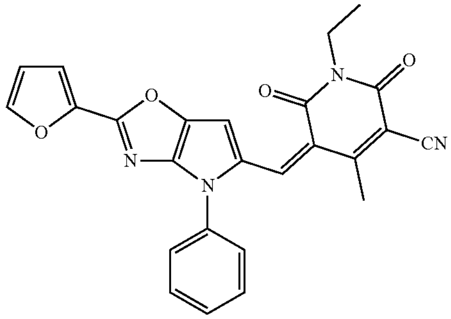
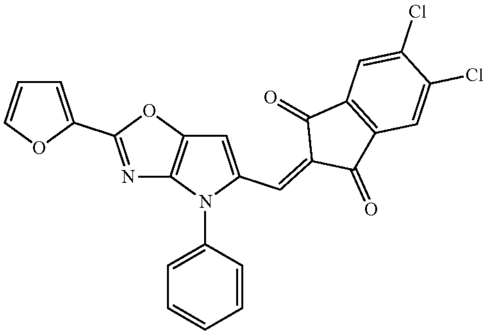
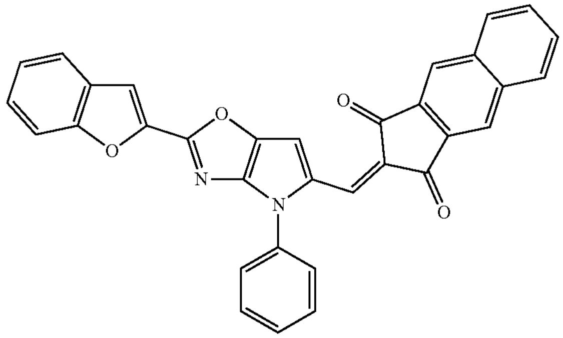
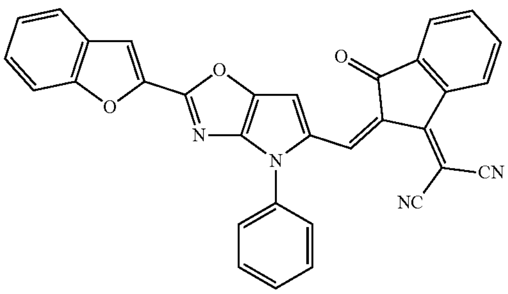

-continued
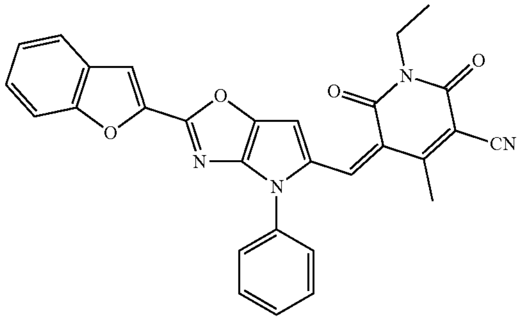
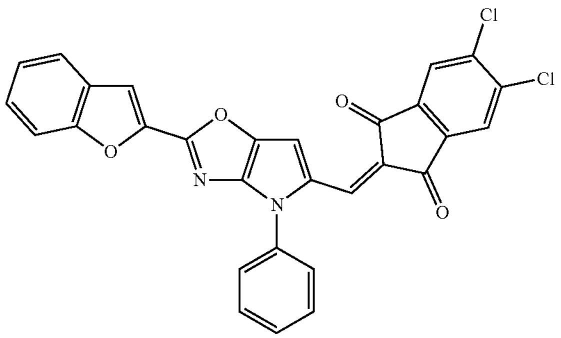
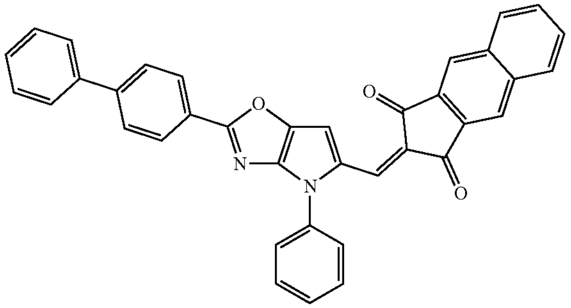
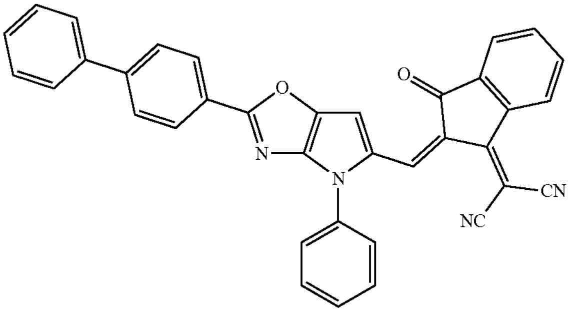
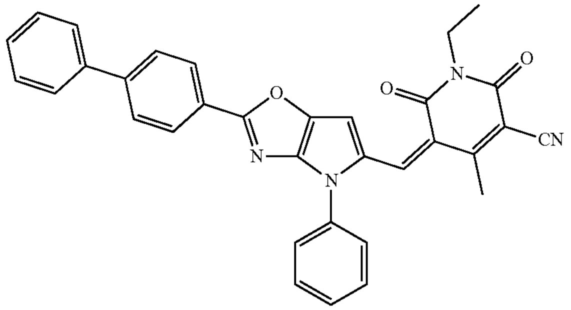
-continued
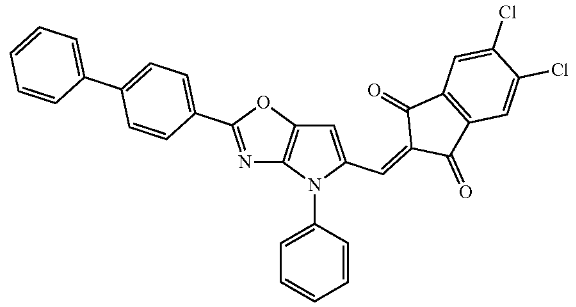
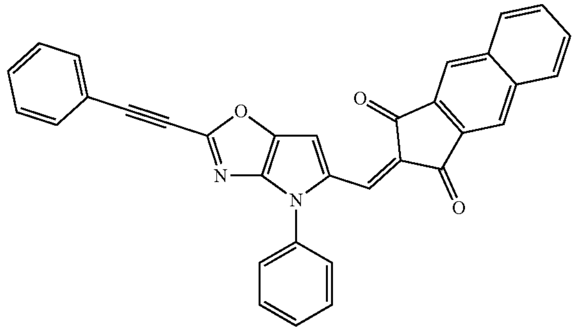
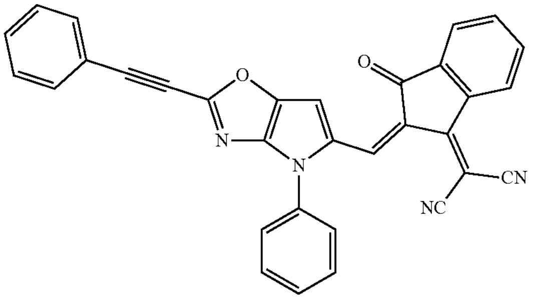
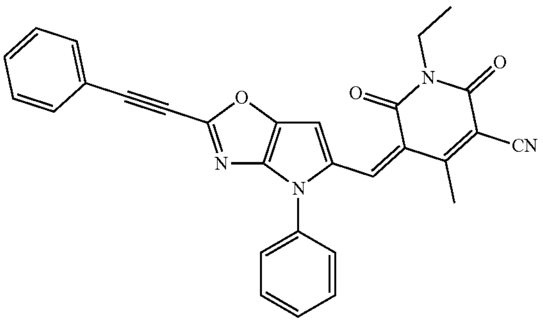
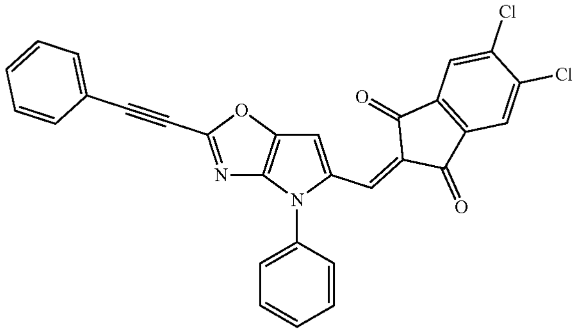

-continued
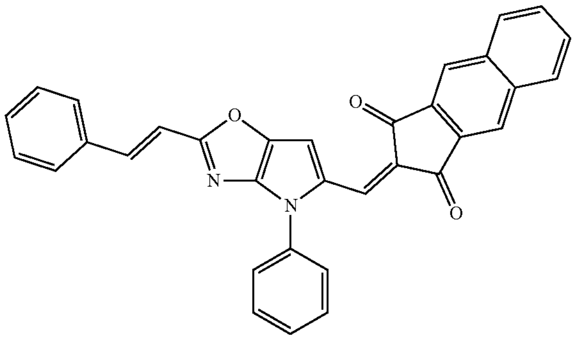
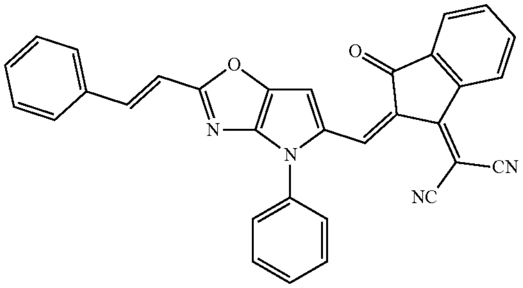
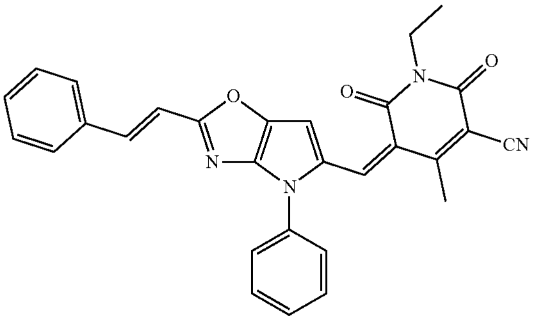
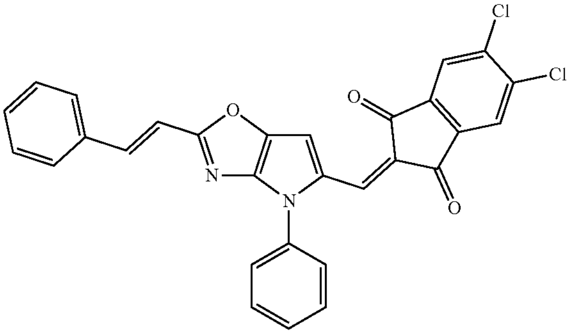
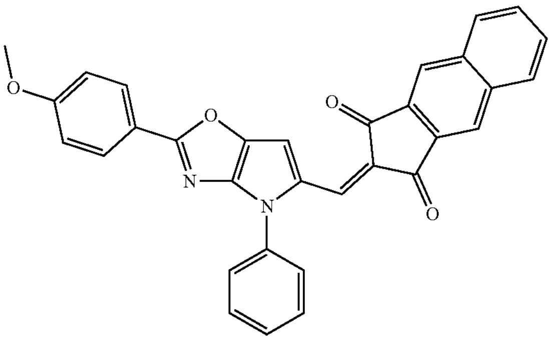
-continued
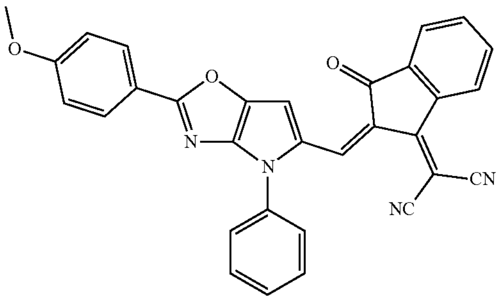
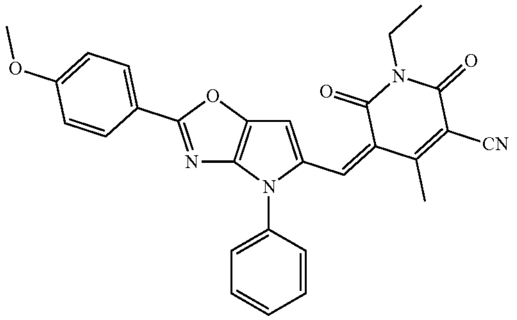
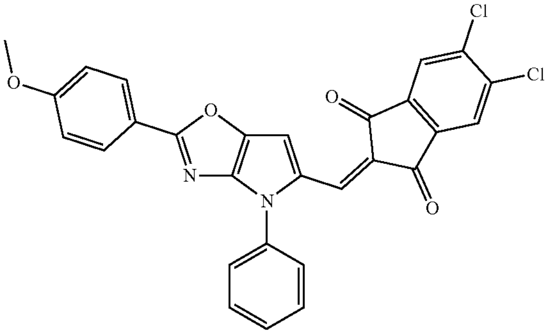
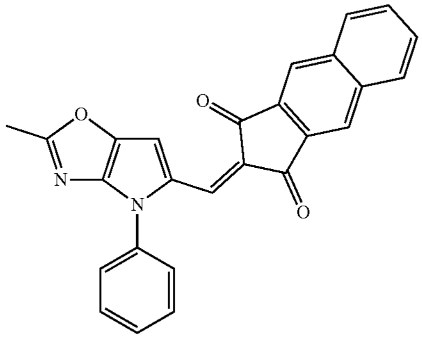
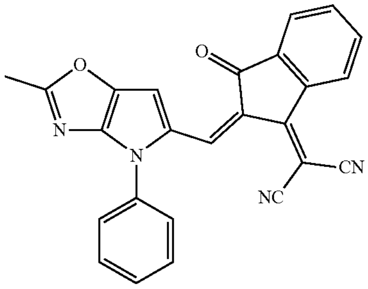

-continued
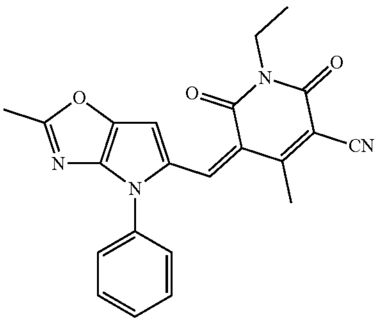
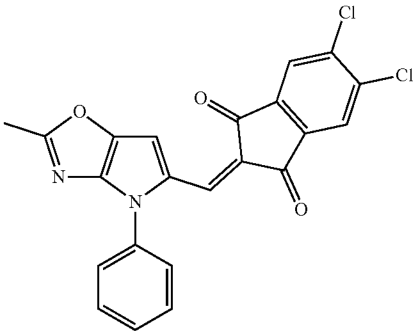
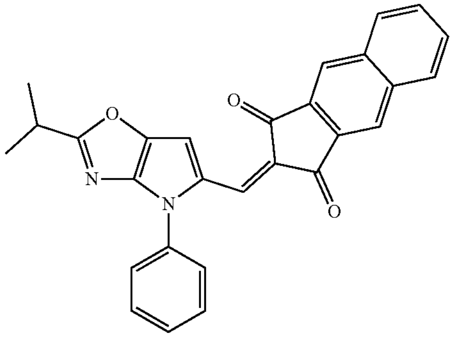
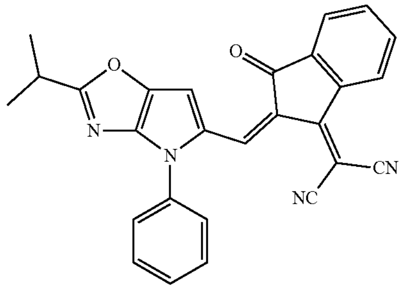
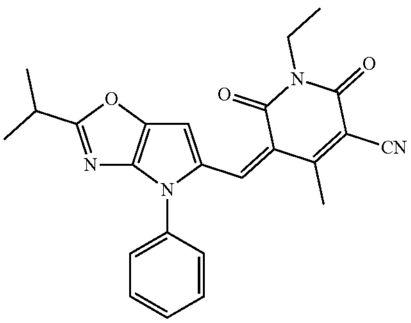
-continued
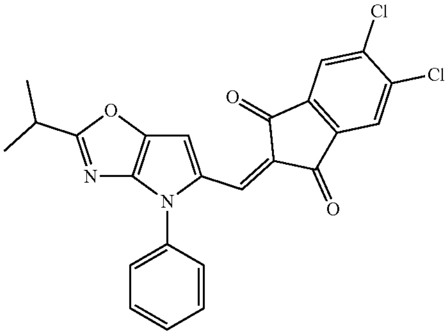
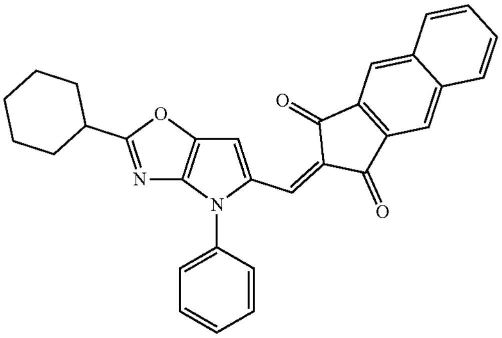
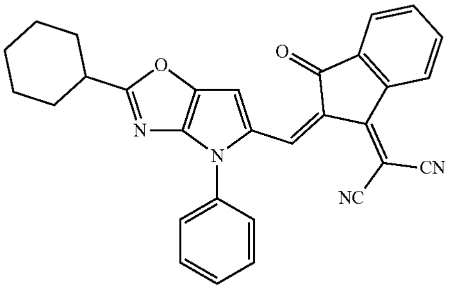
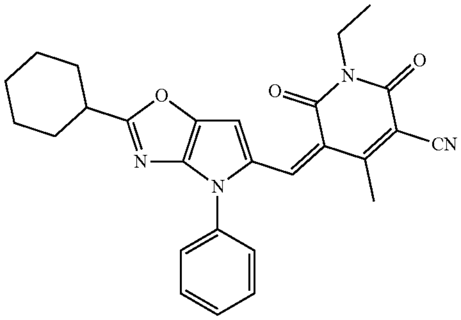
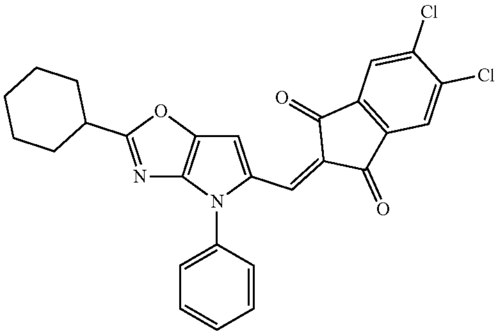

-continued
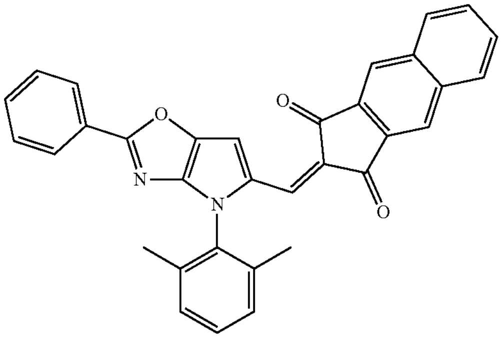
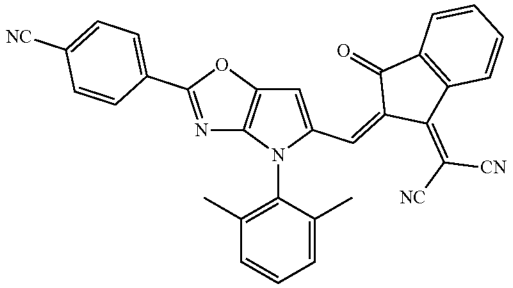
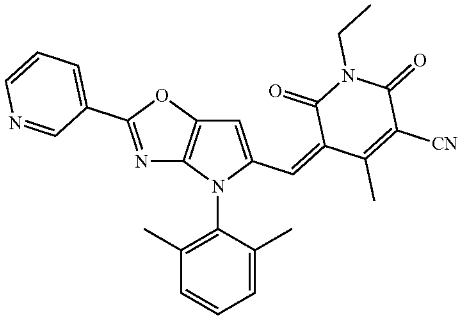
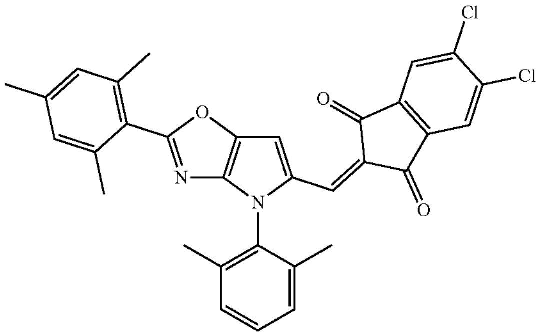
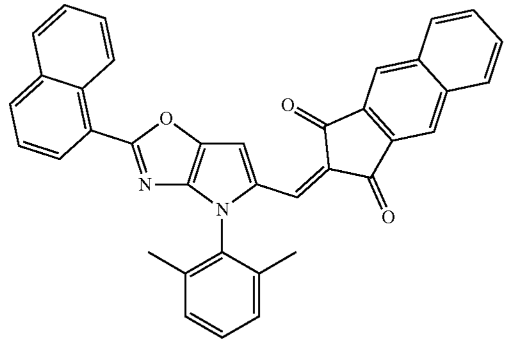
-continued
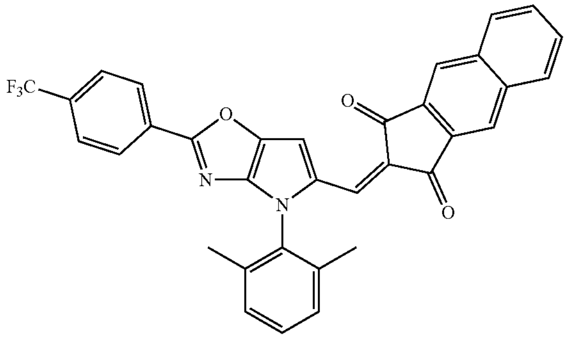
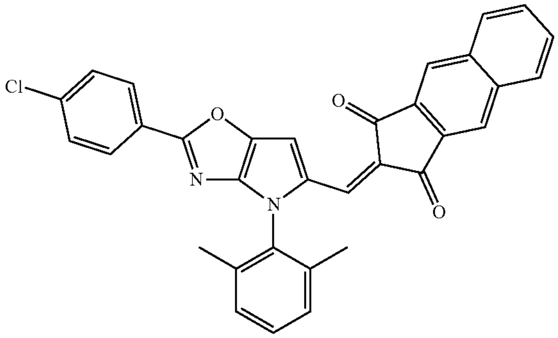
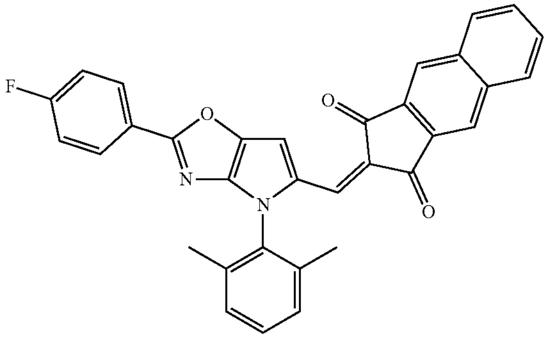
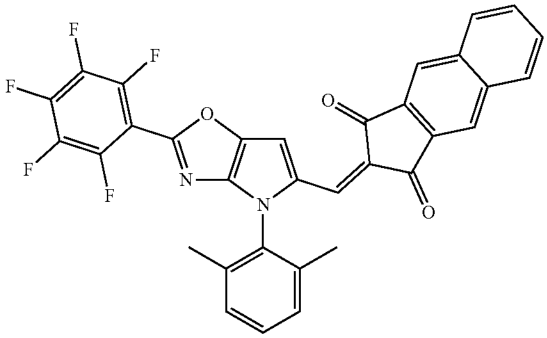
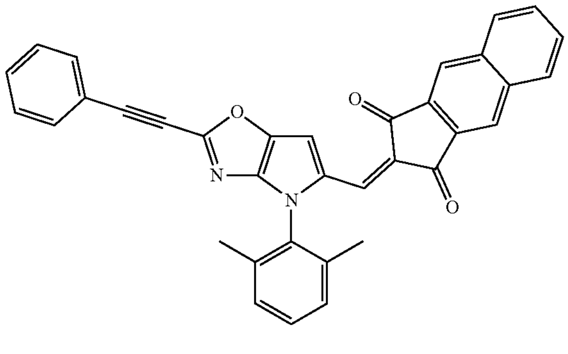

-continued
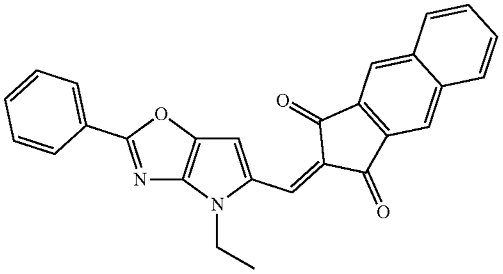
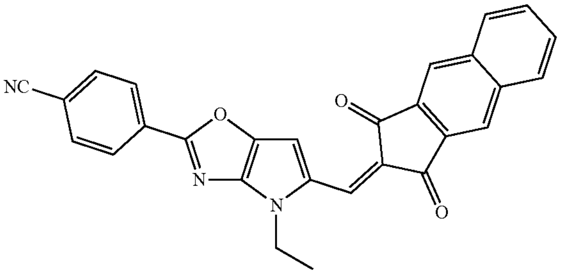
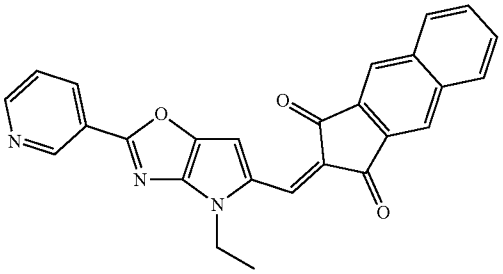
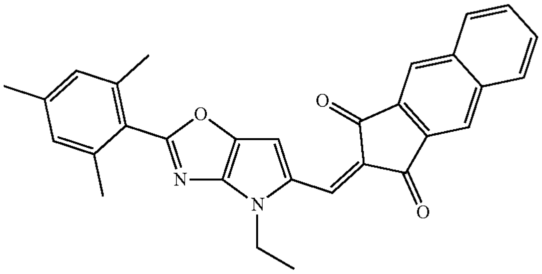
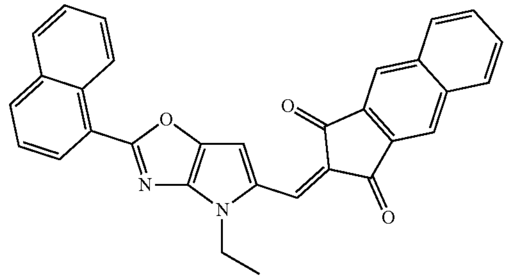
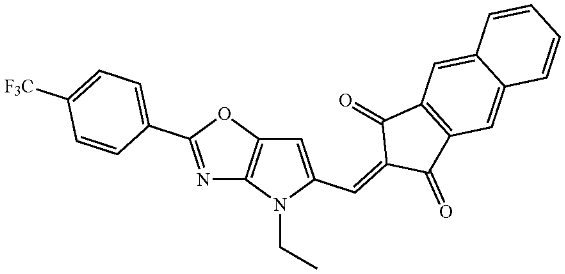
-continued
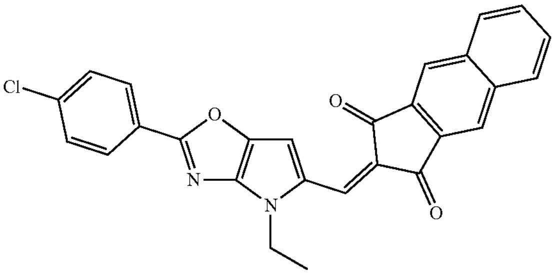
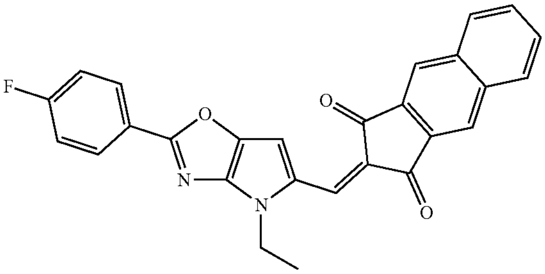
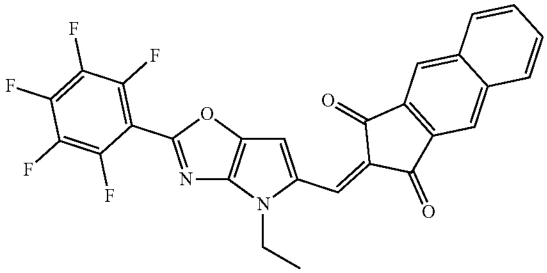
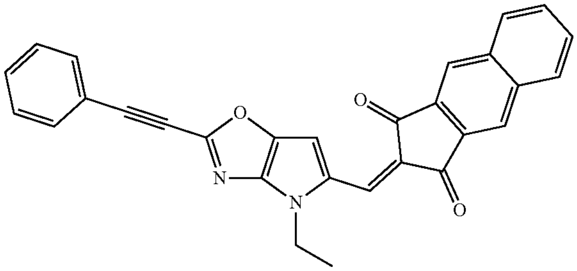
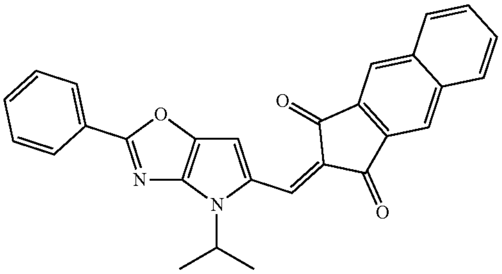
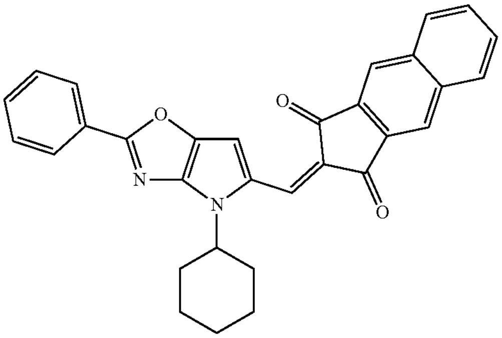

-continued
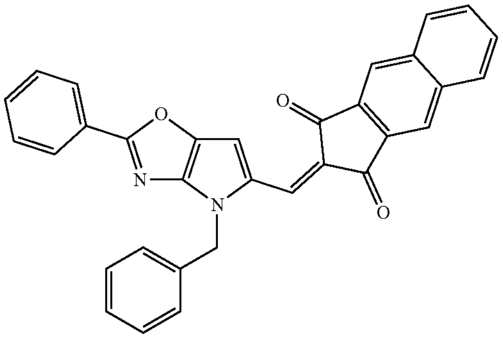
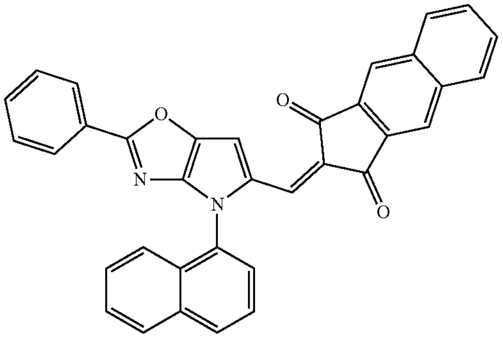
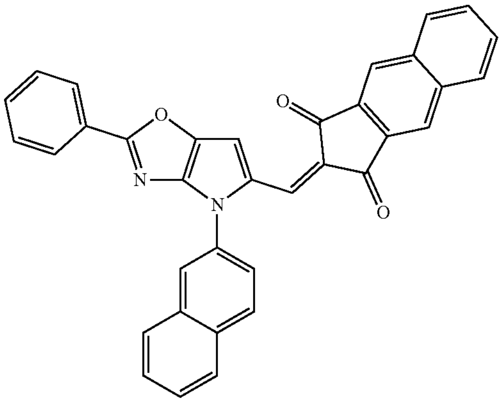
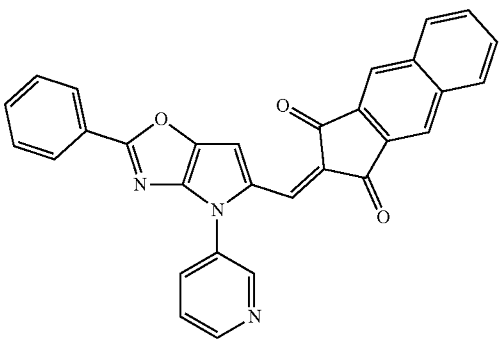
-continued
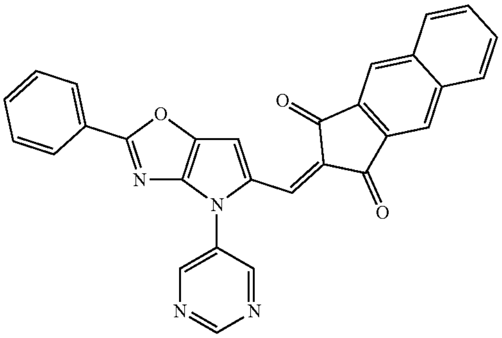
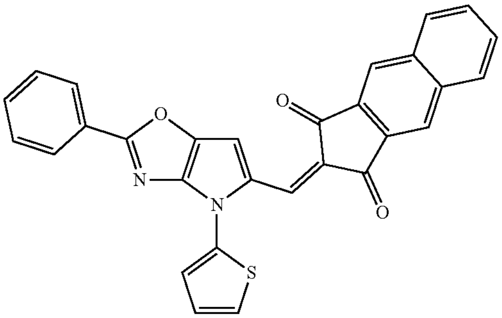
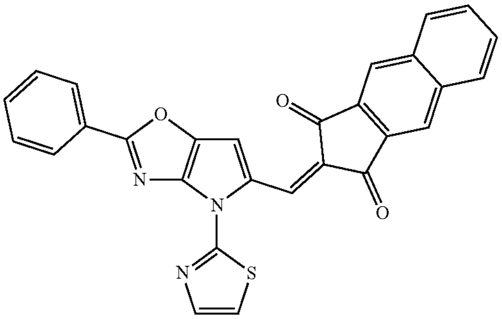
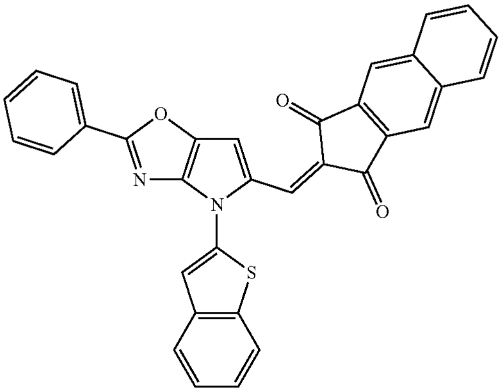
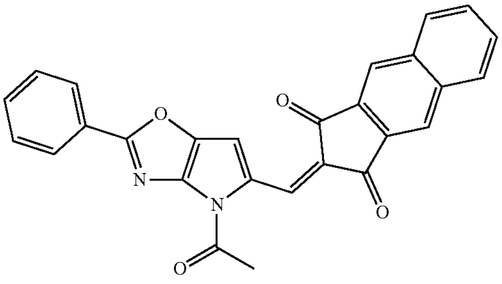

-continued
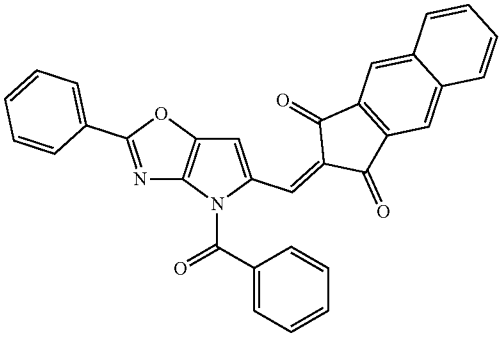
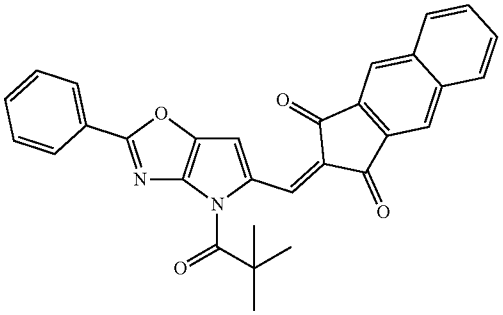
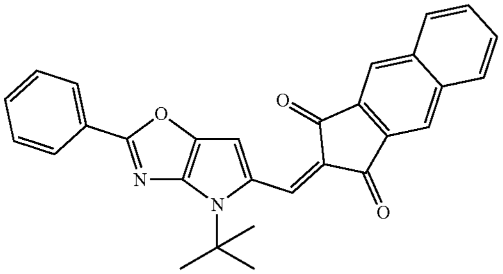
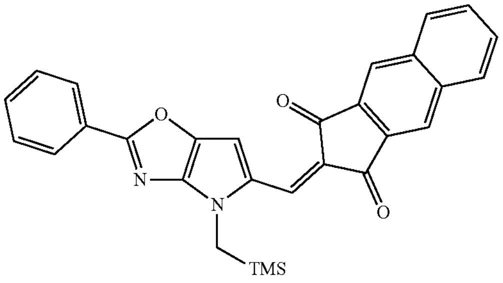
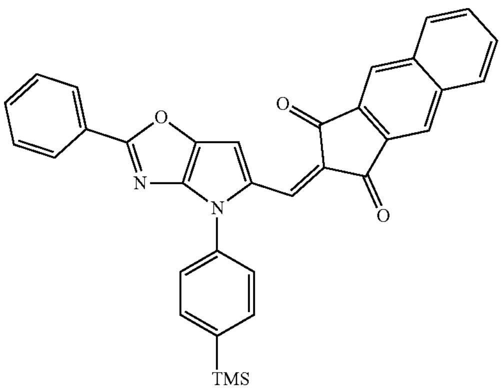
-continued
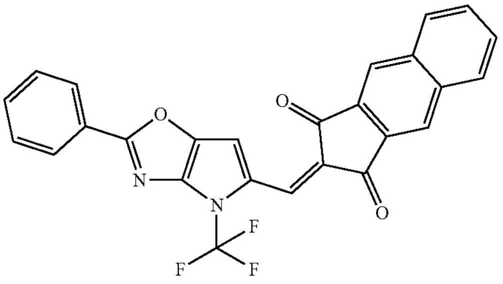
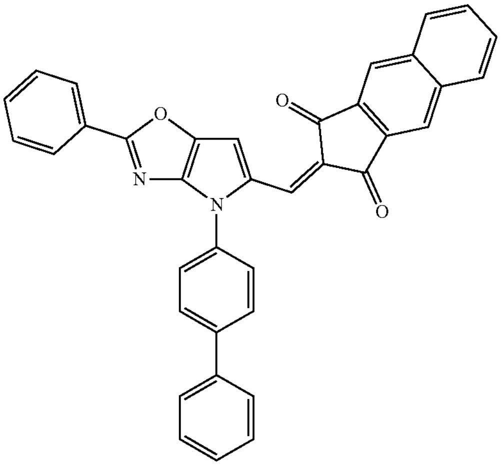
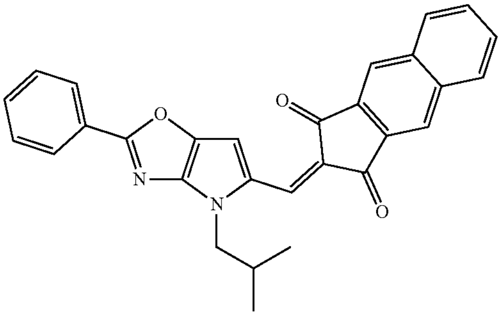
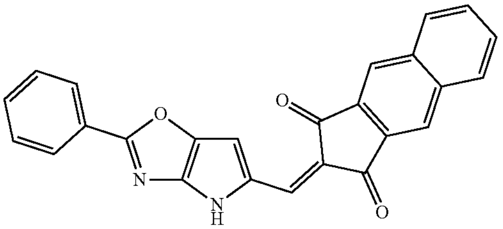
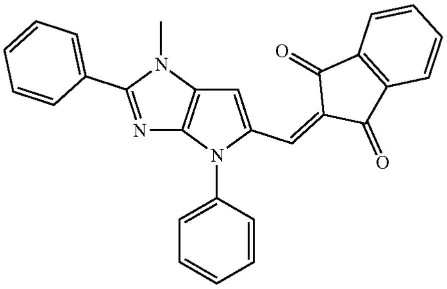

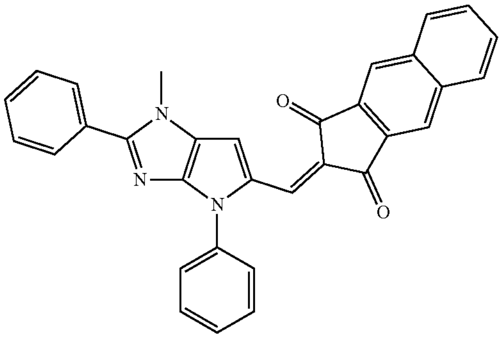
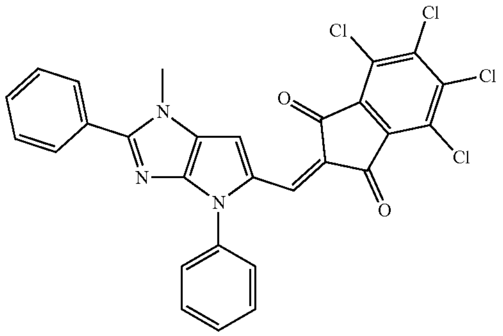
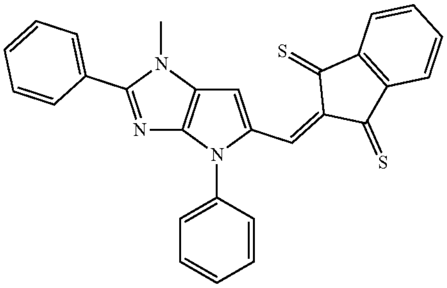
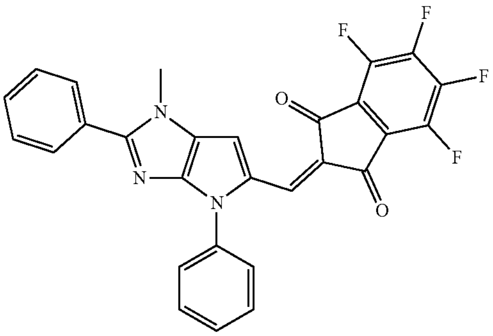
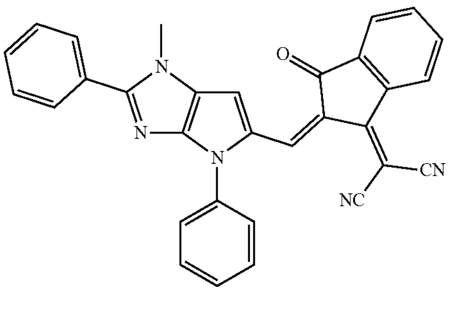
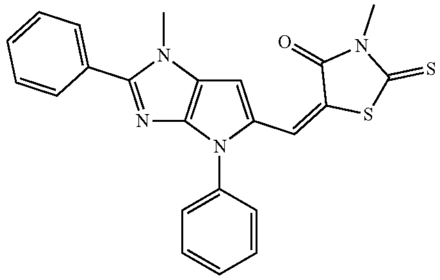
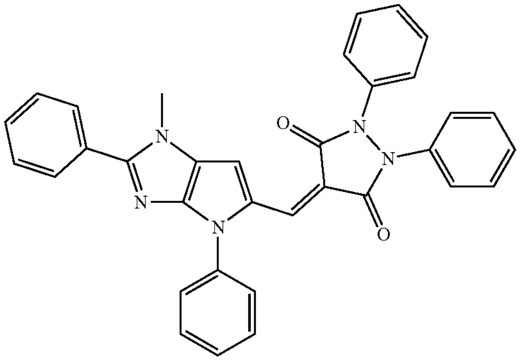
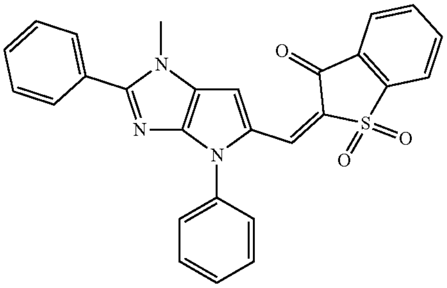
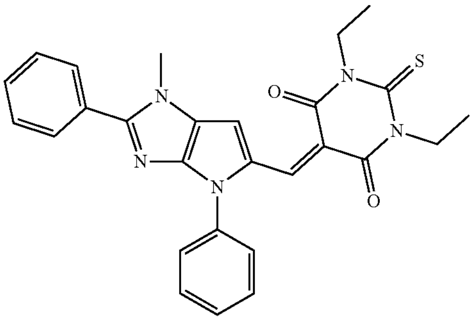
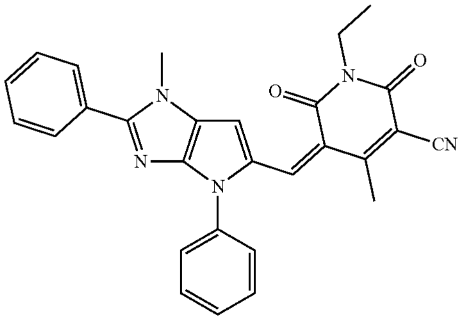

-continued
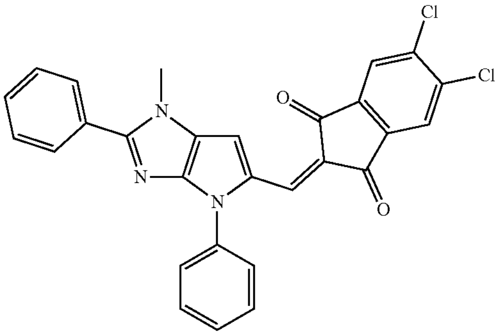
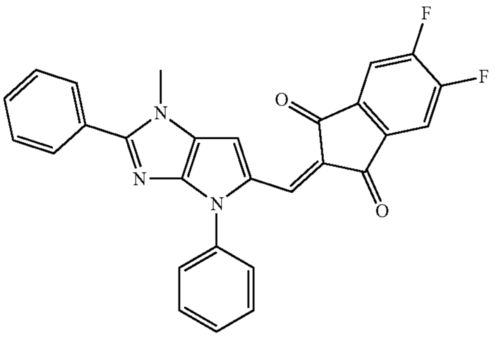
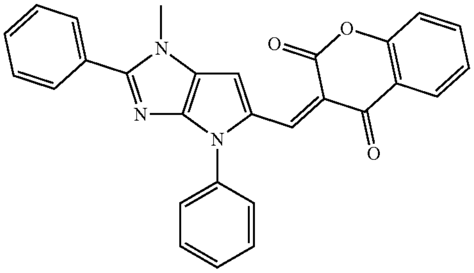
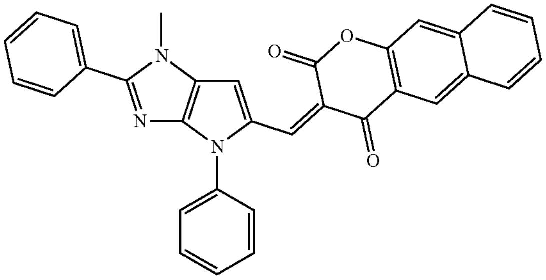
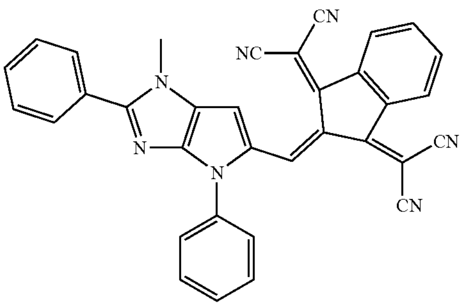
-continued
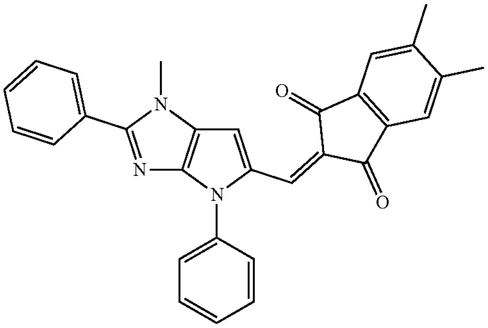
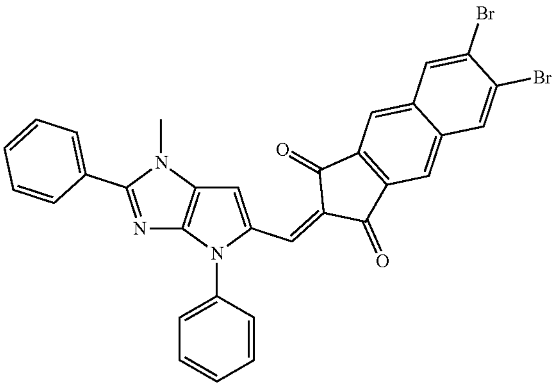
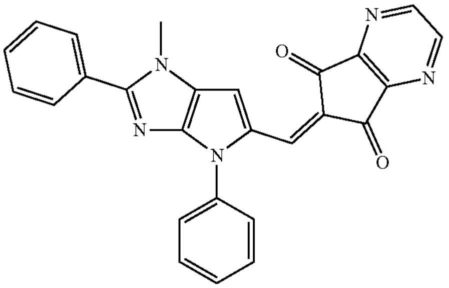
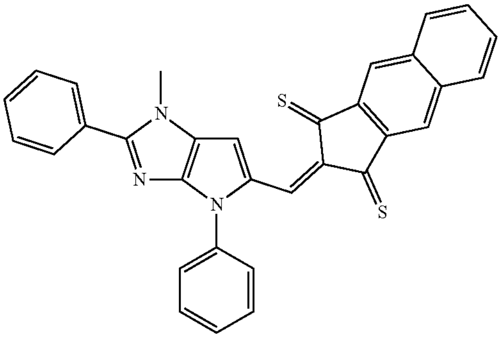
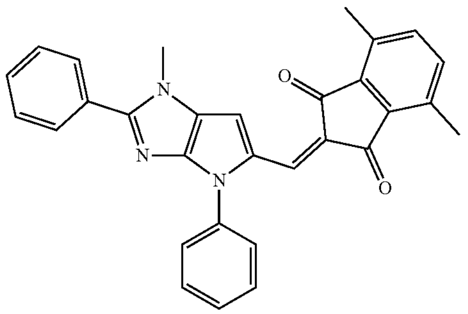

-continued
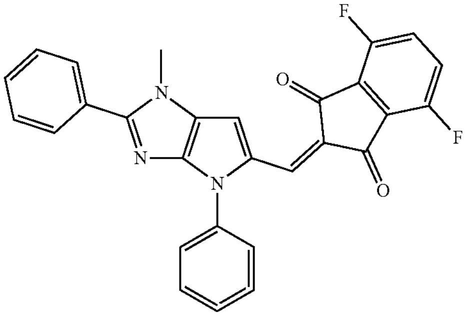
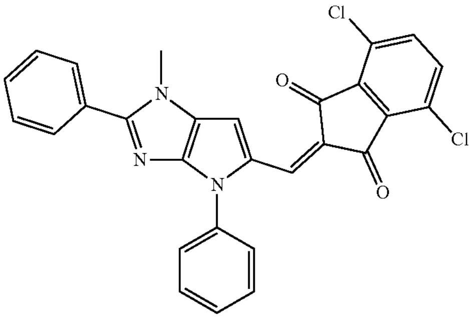
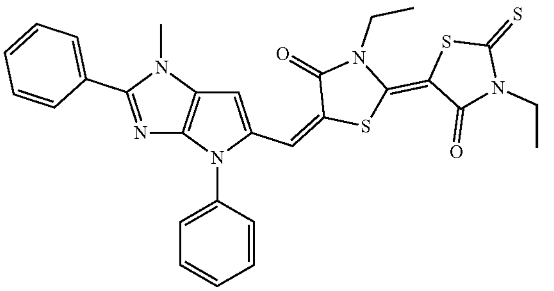
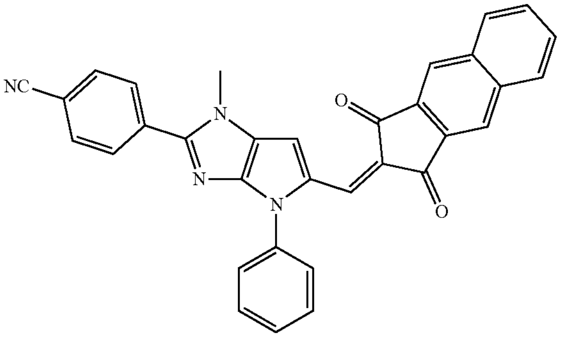
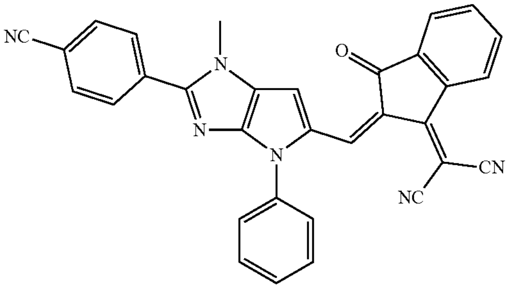
-continued
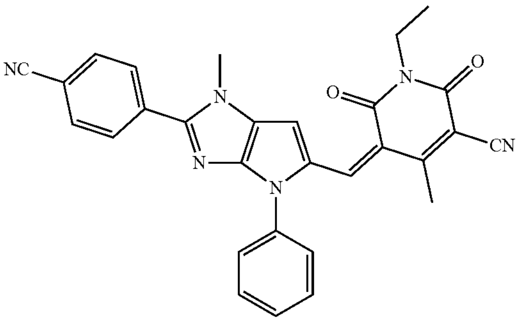
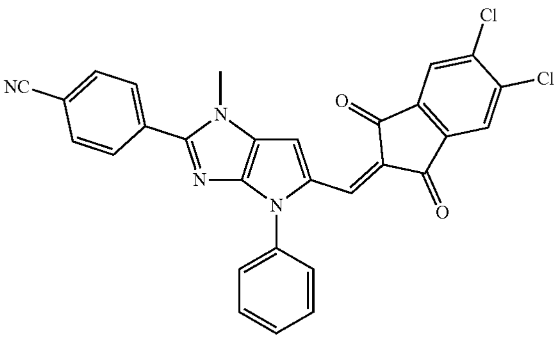
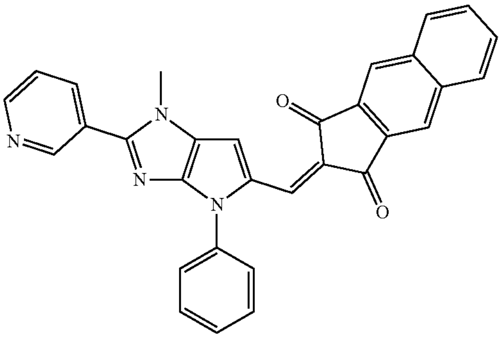
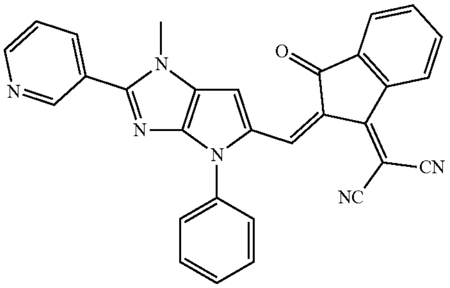
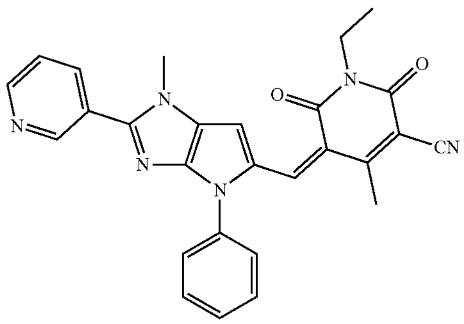

-continued
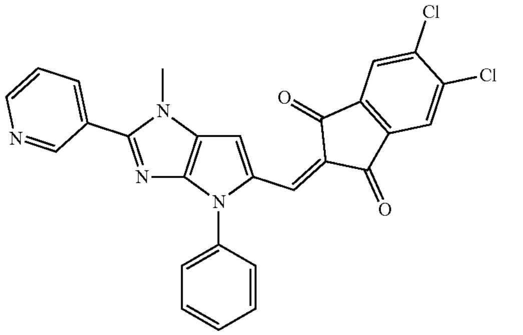
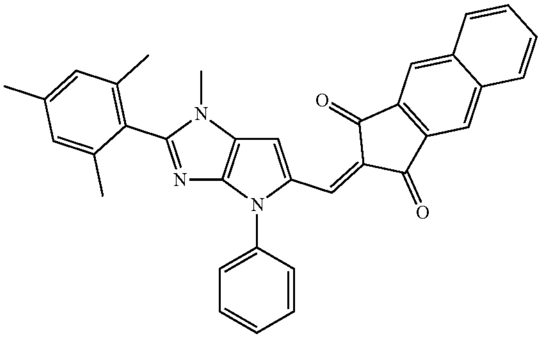
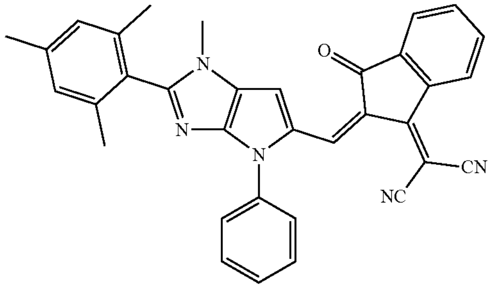
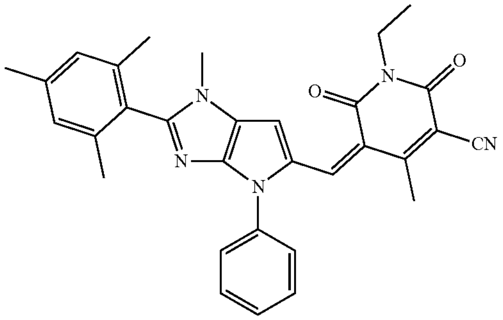
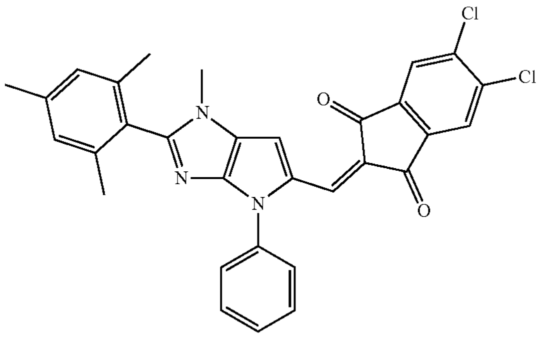
-continued
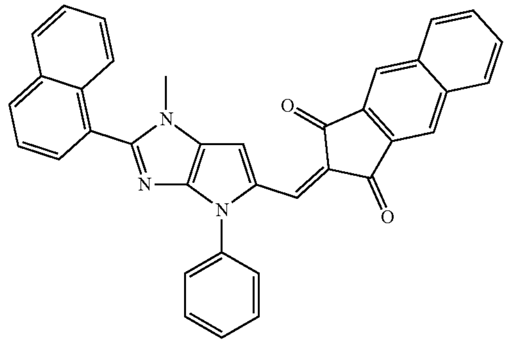
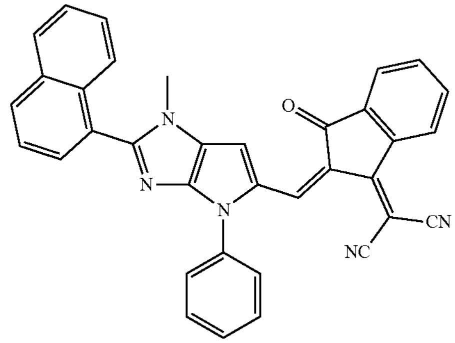
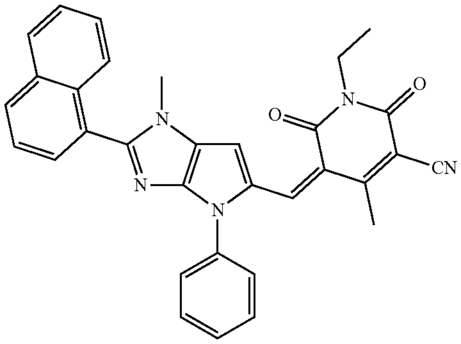
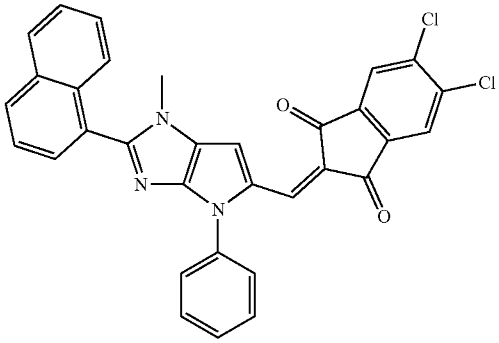
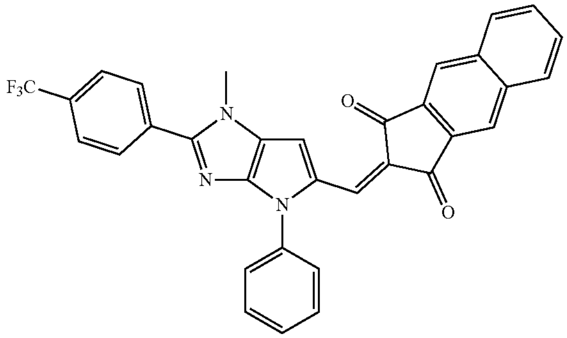

-continued
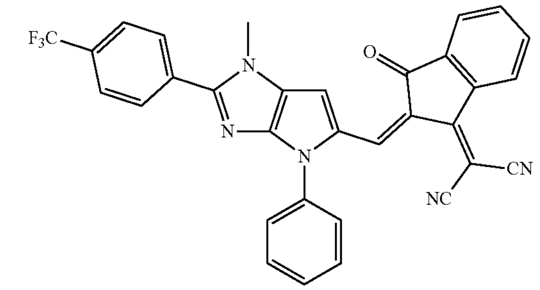
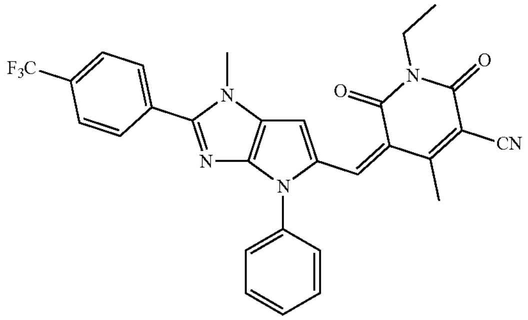
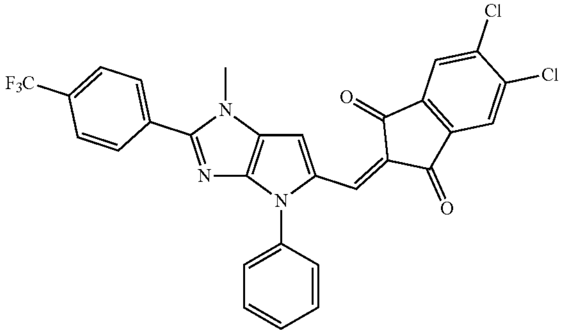
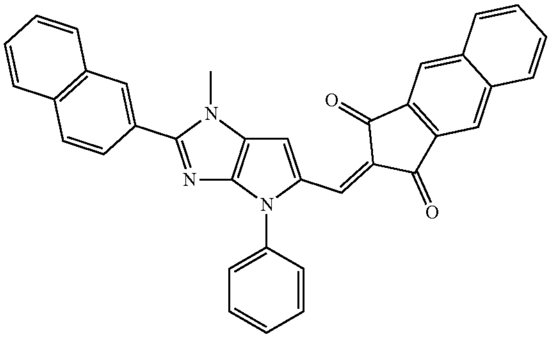
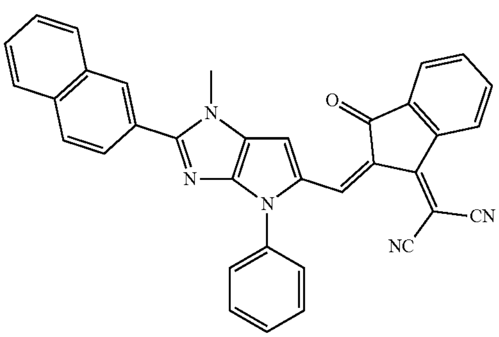
-continued
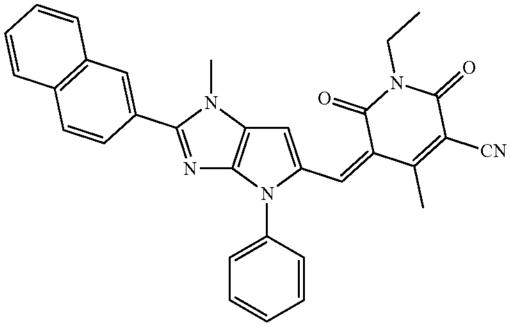
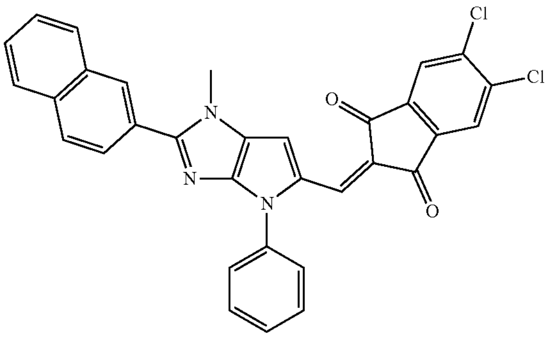
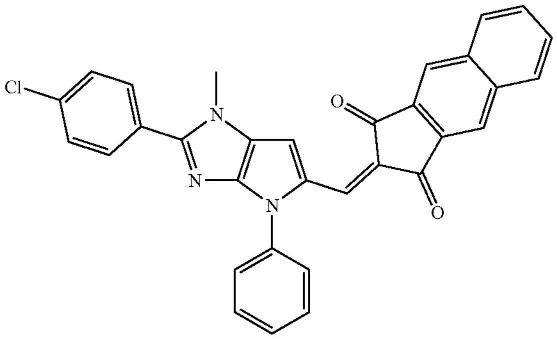
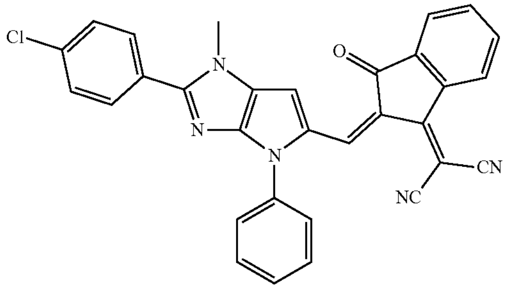
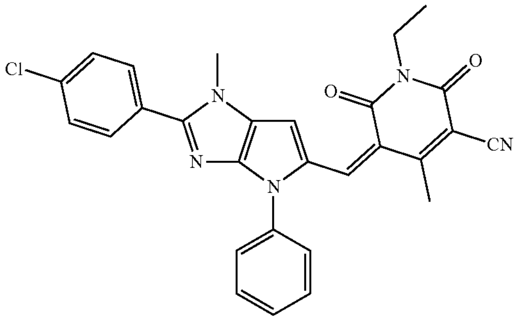

-continued
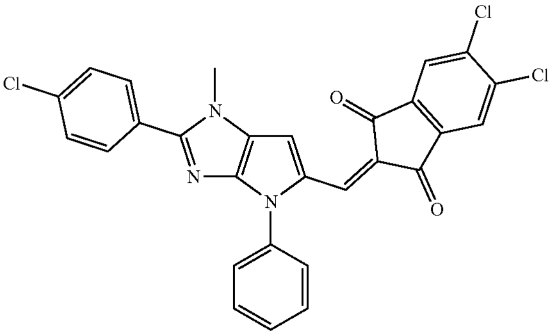
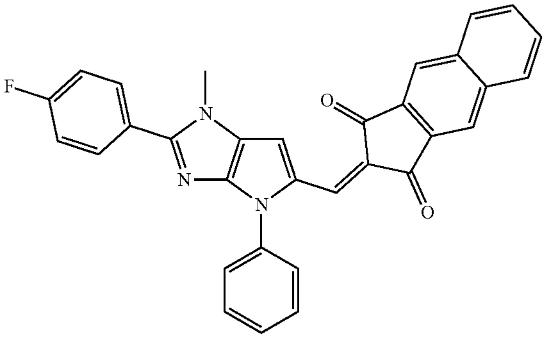
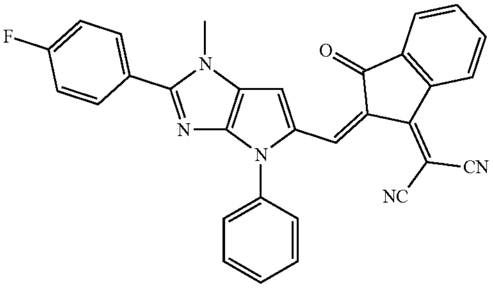
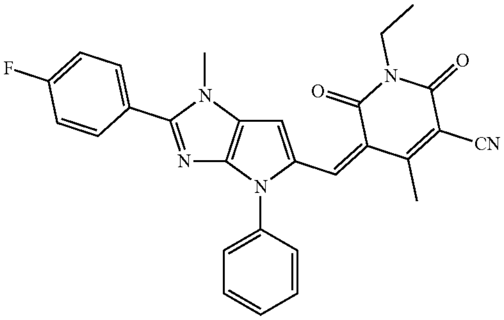
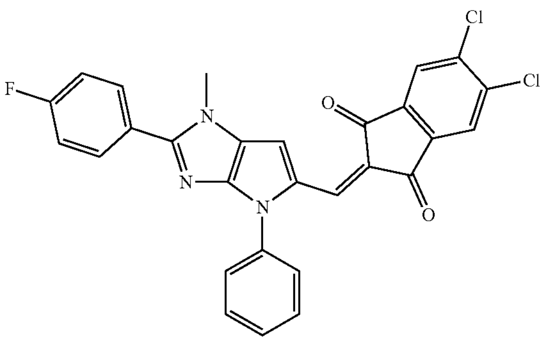
-continued
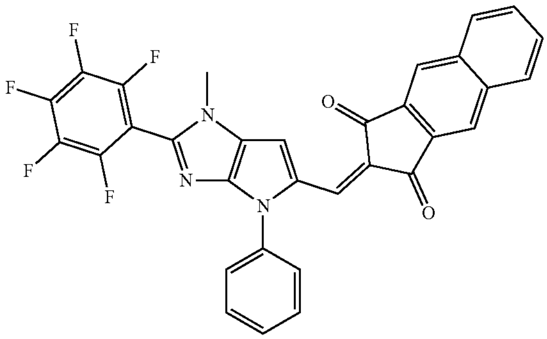
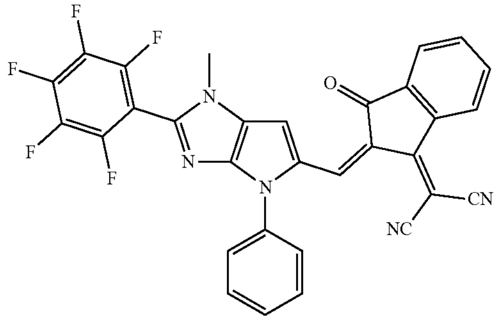
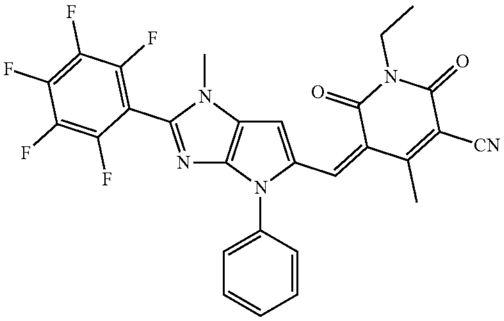
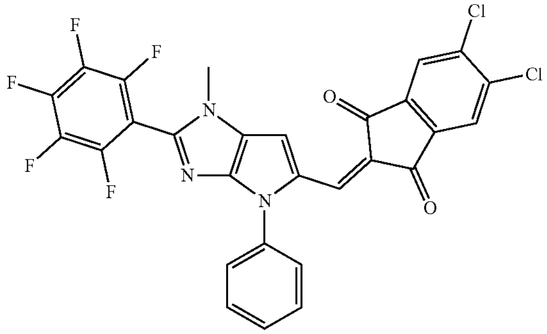
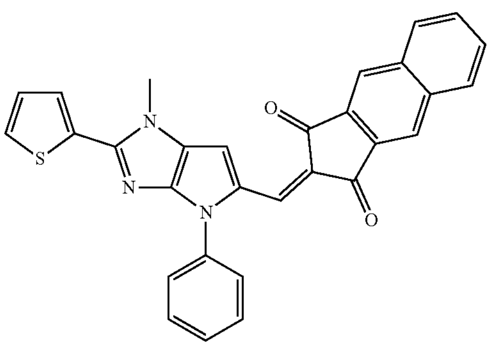

-continued
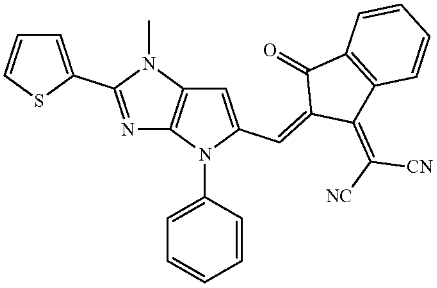
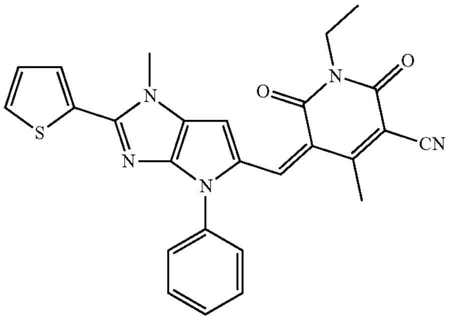
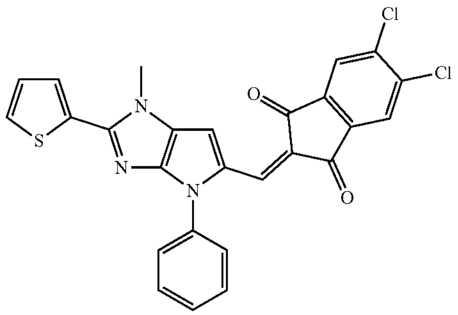
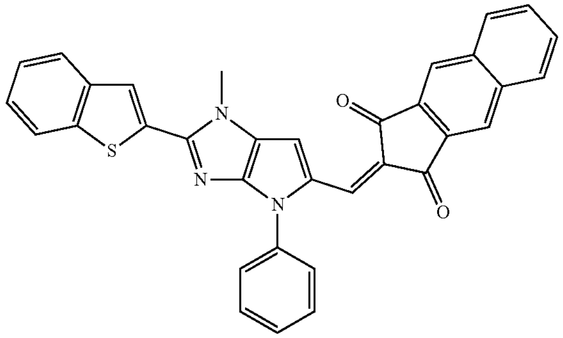
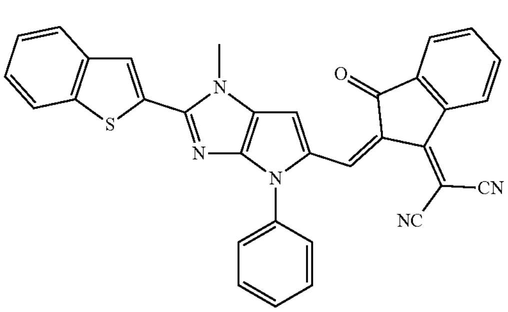
-continued
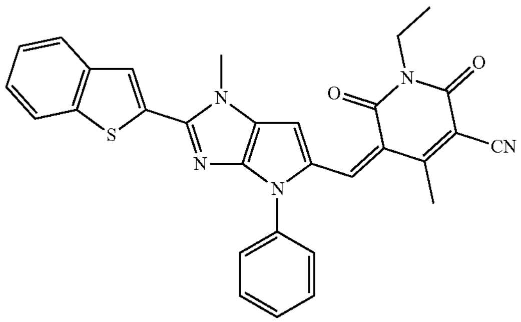
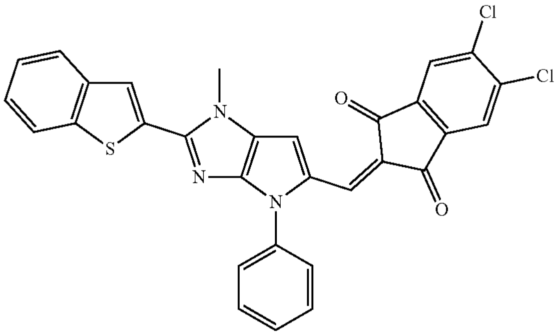
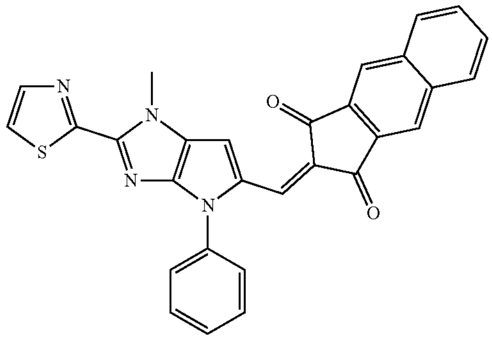
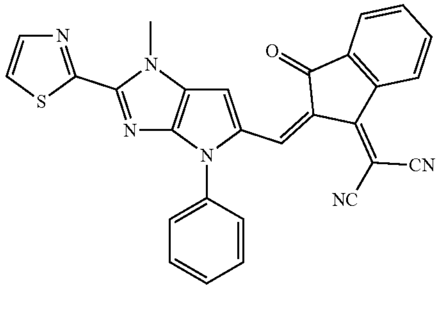
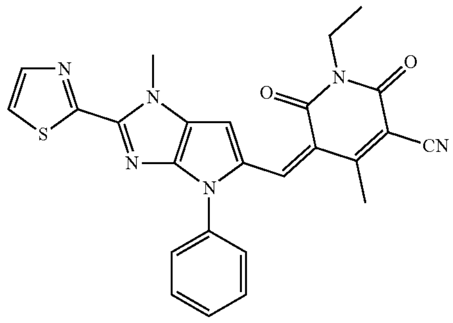

-continued
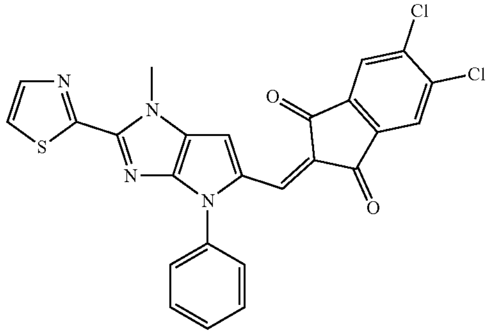
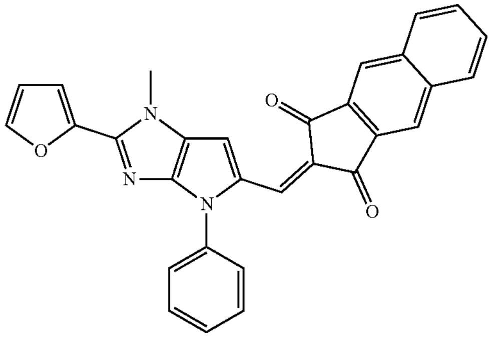
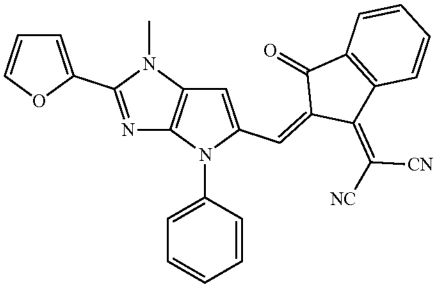
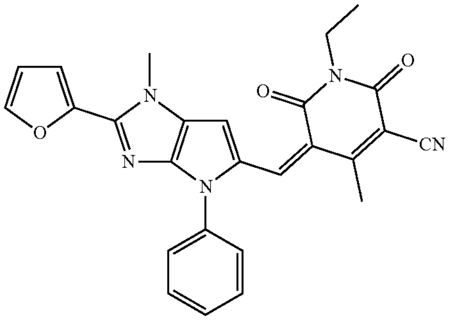
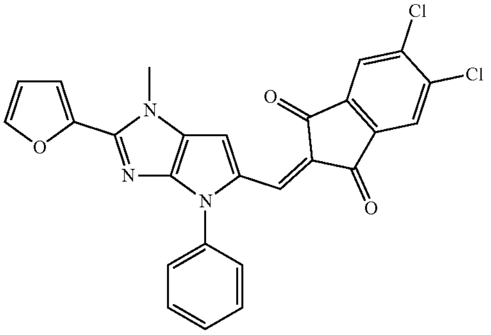
-continued
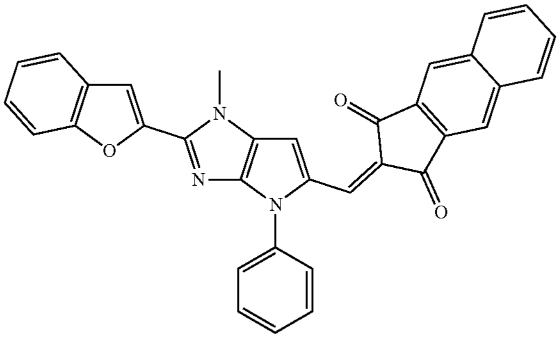
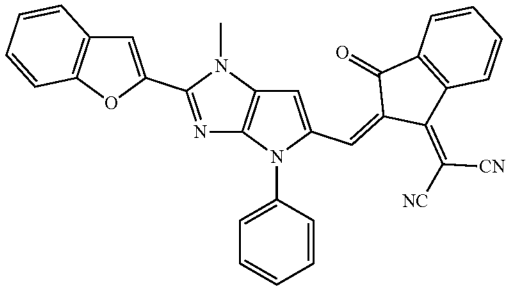
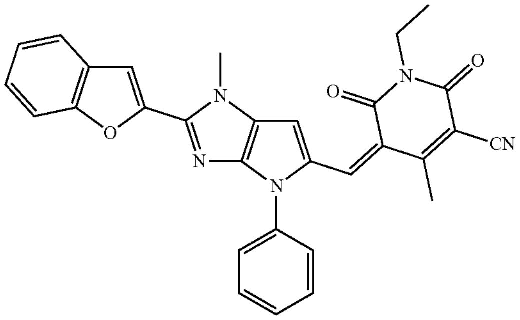
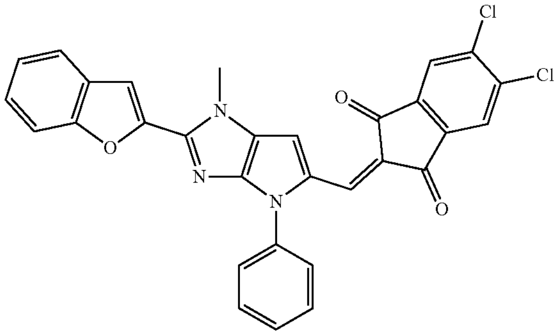
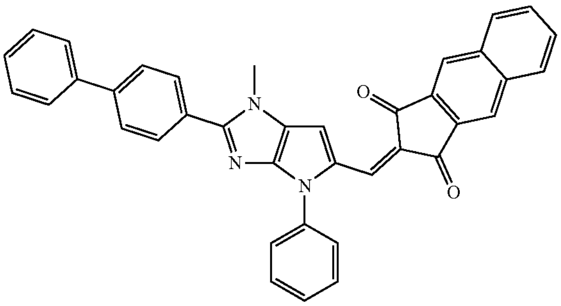

-continued
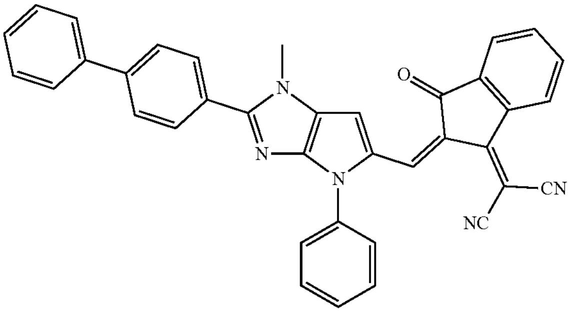
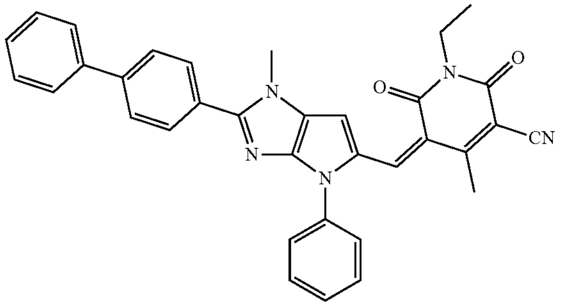
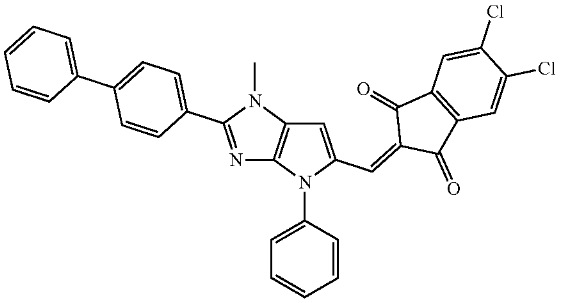
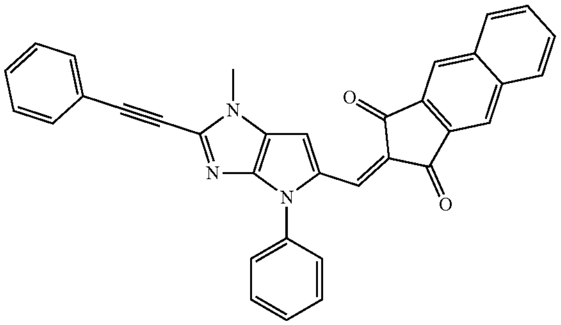
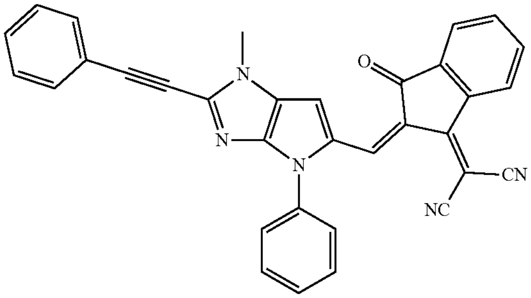
-continued
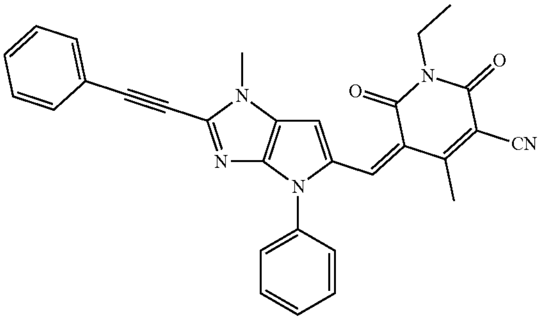
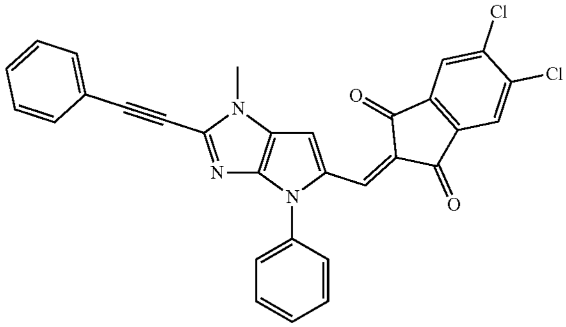
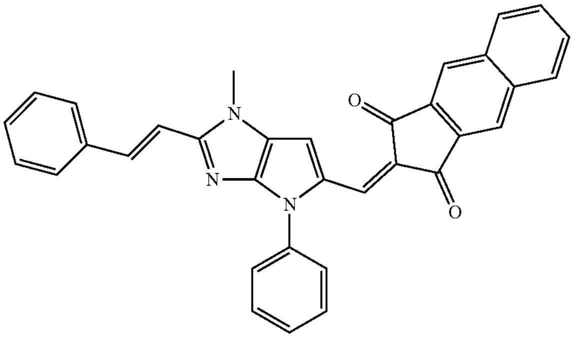
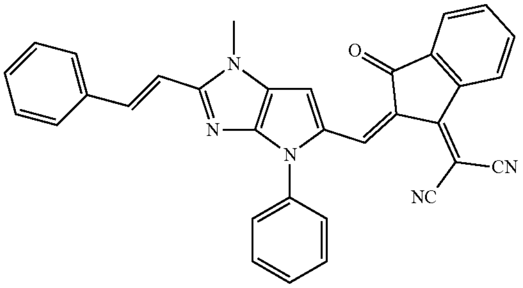
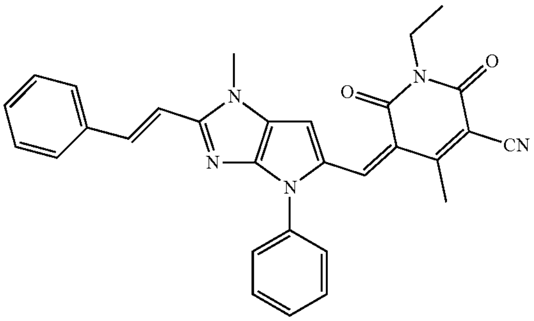

-continued
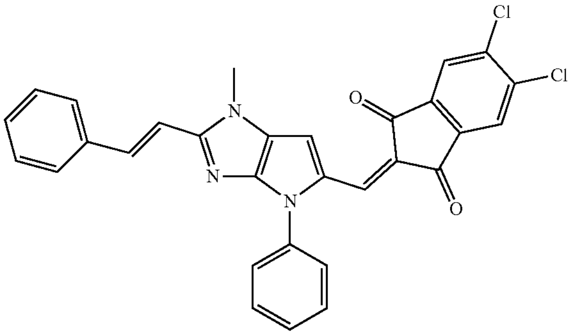
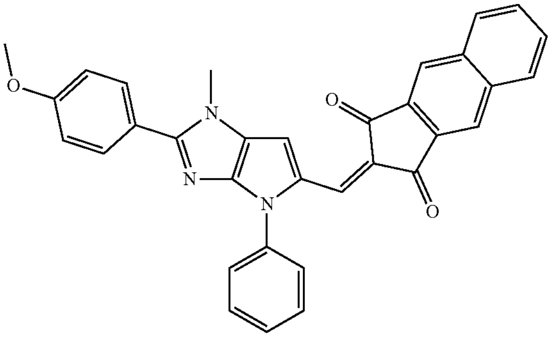
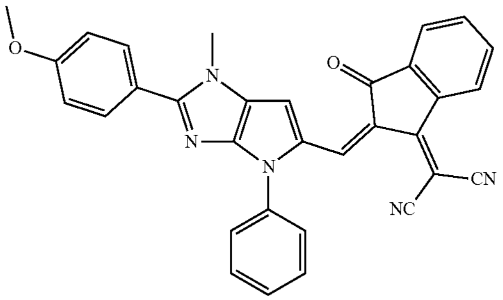
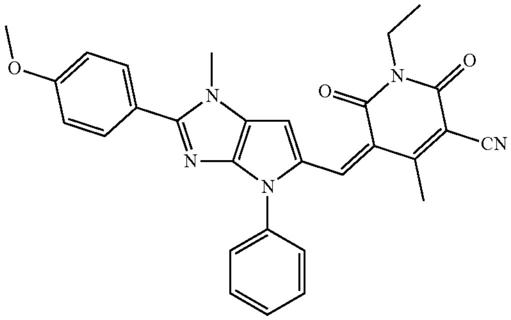
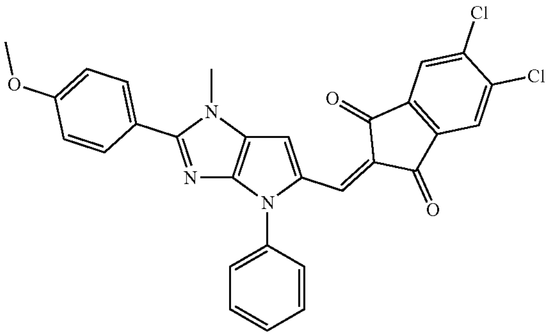
-continued
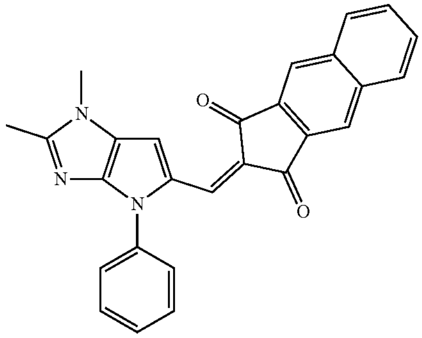
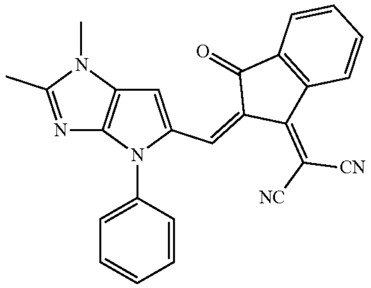
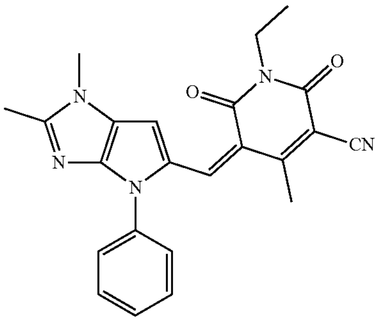
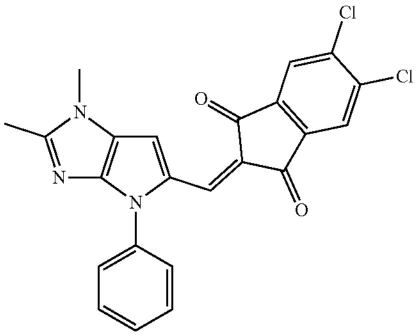
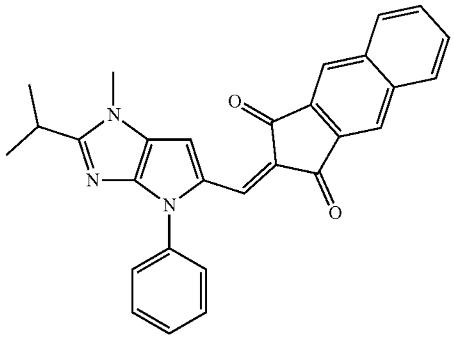

-continued
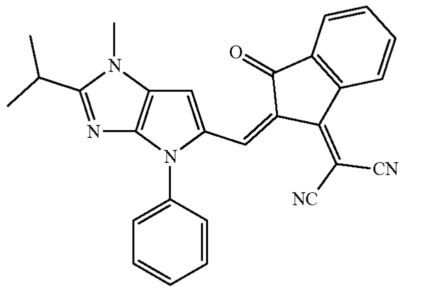
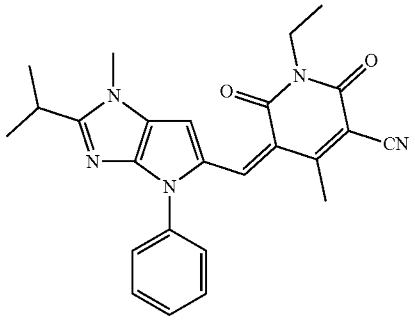
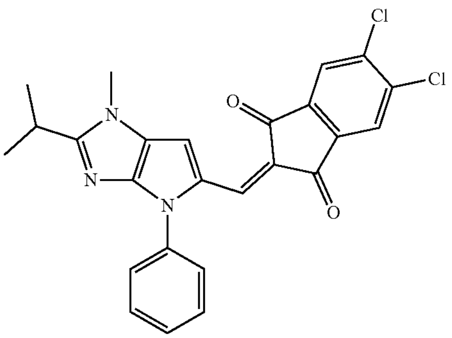
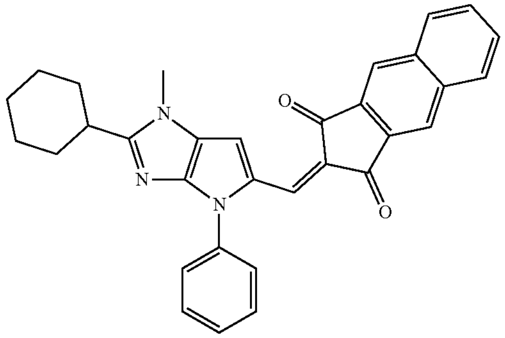
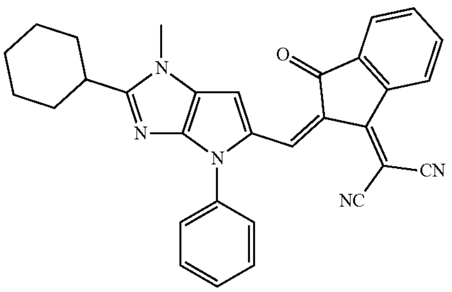
-continued
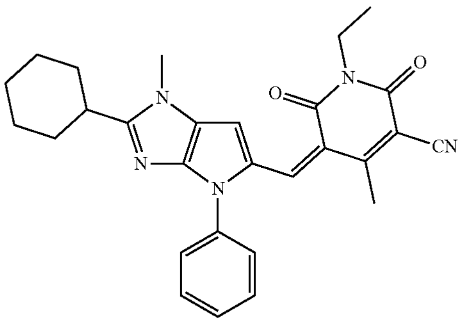
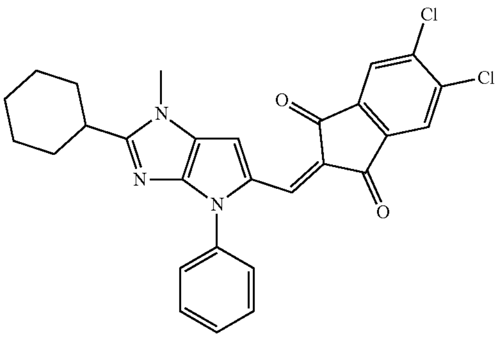
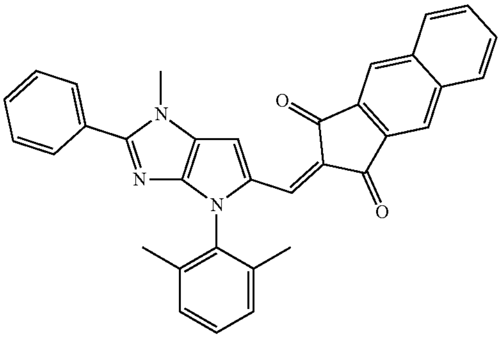
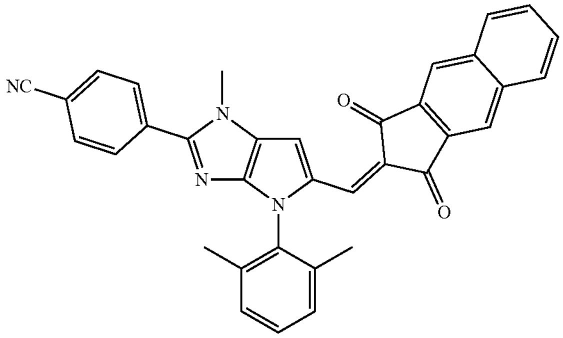
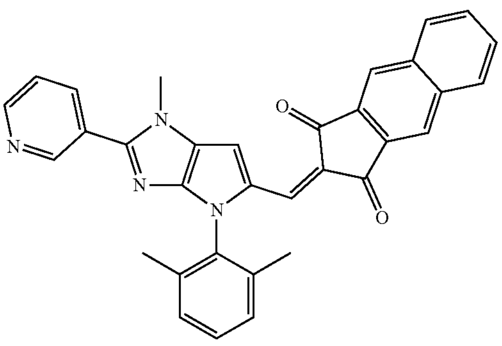

-continued
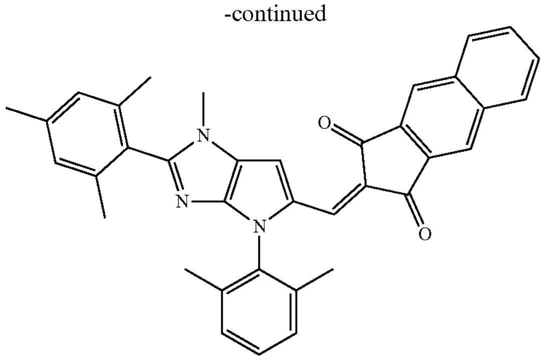
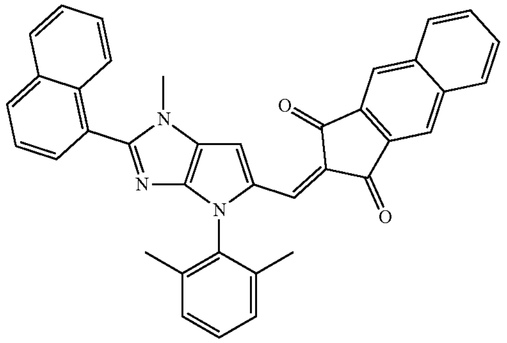
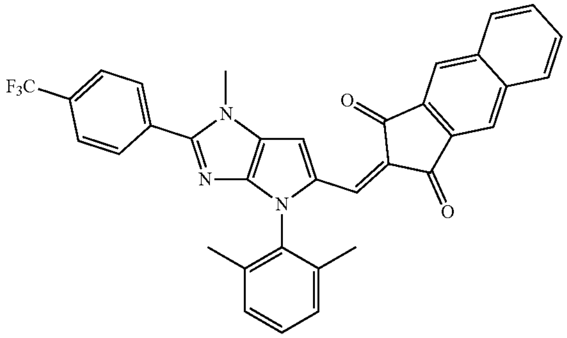
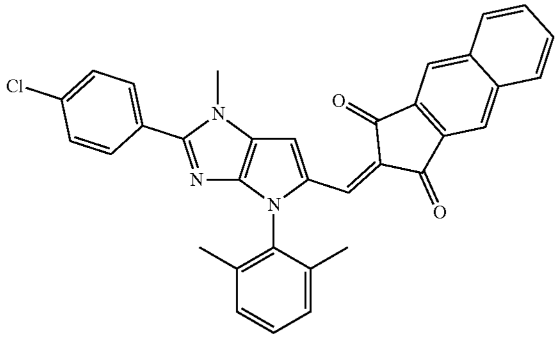
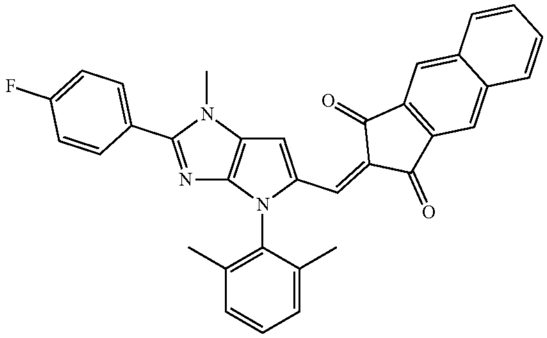
-continued
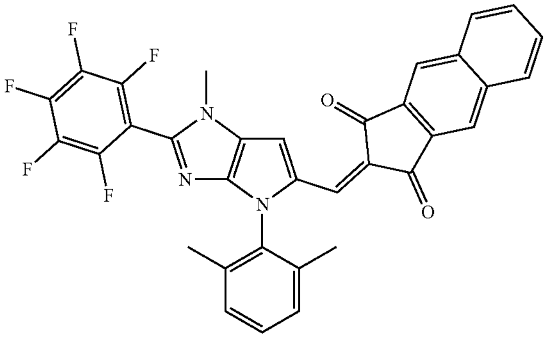
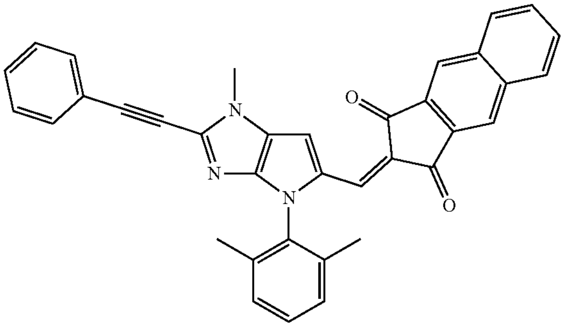
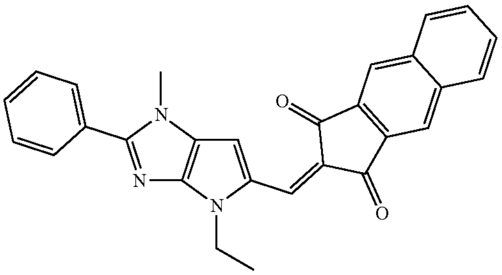
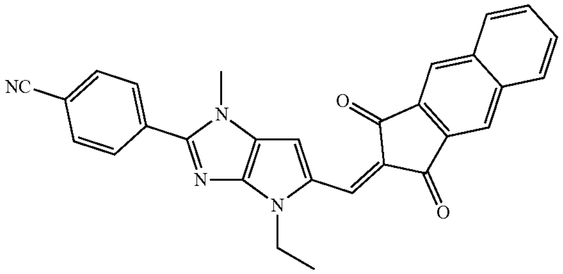
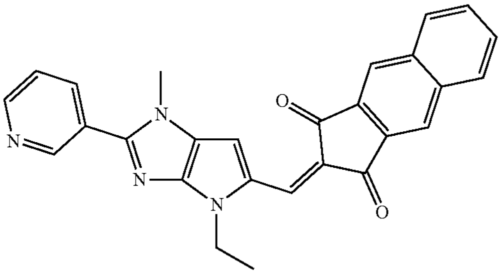

-continued
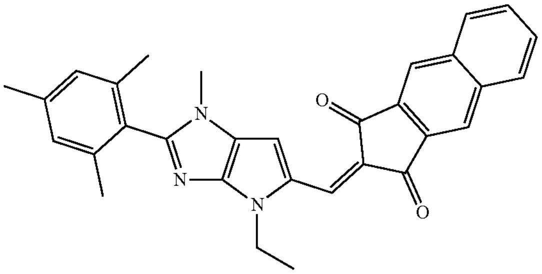
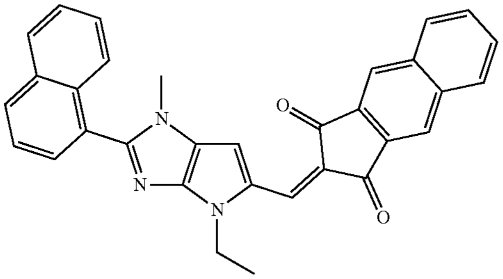
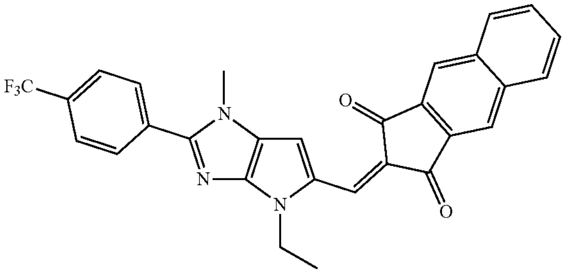
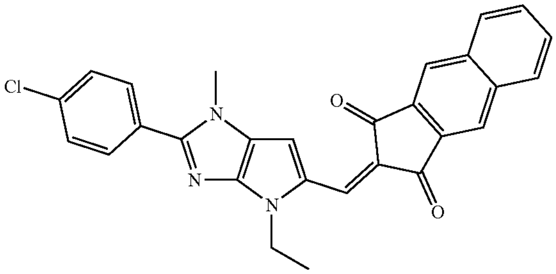
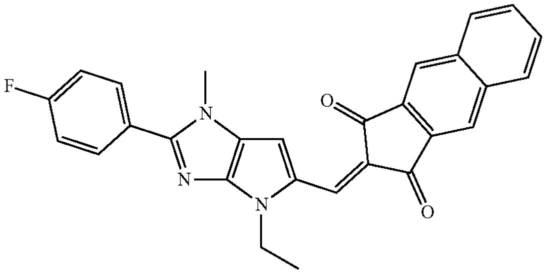
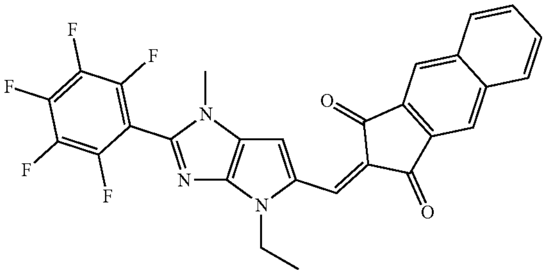
-continued
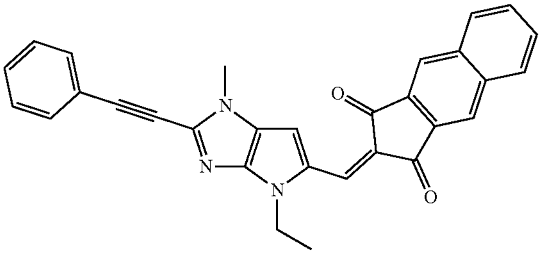
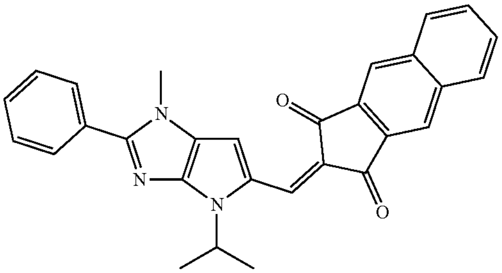
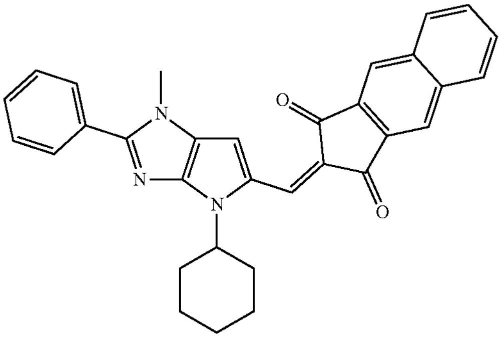
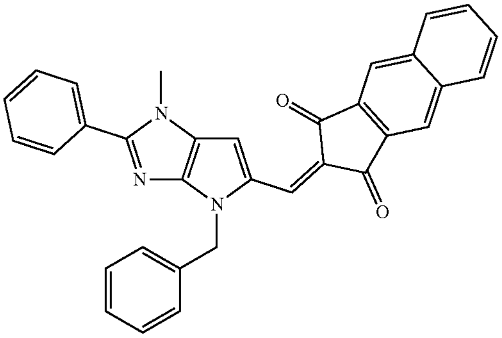
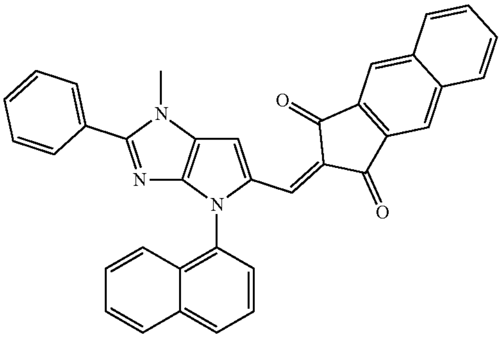

-continued
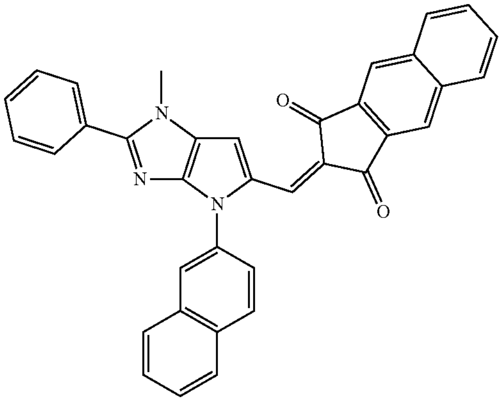
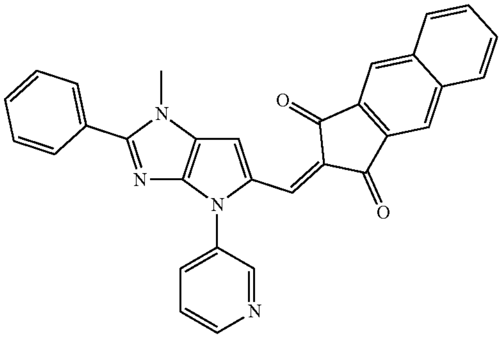
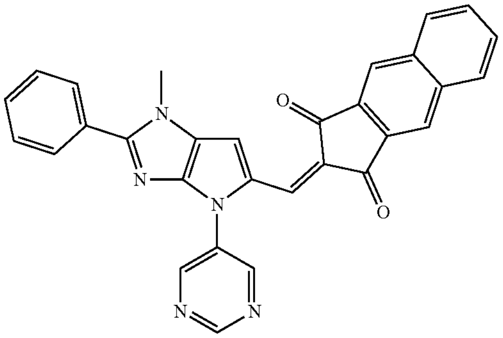
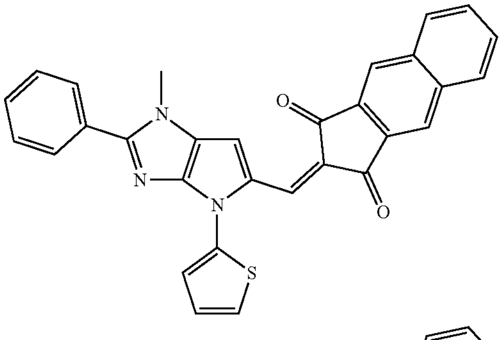
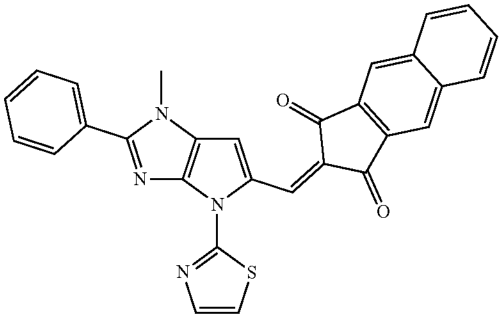
-continued
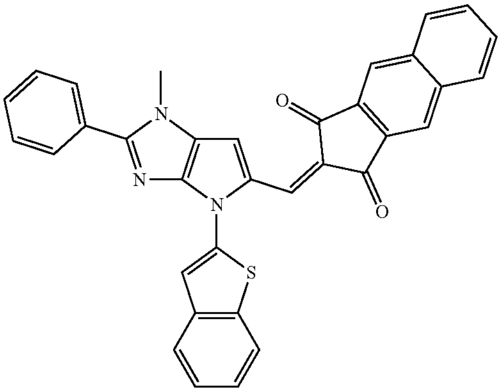
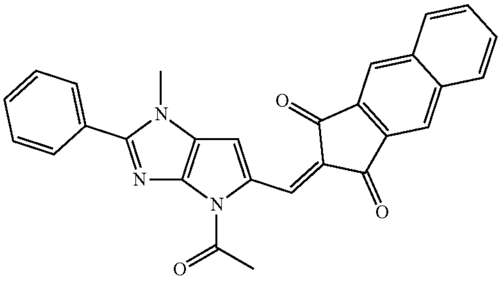
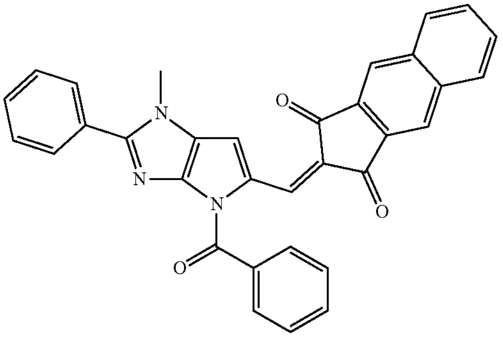
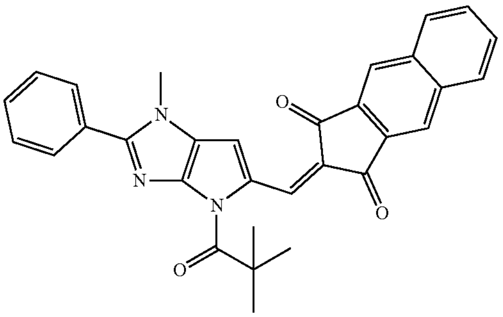
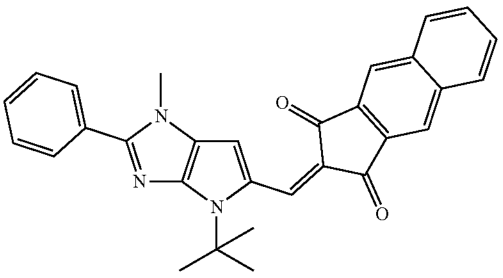

-continued
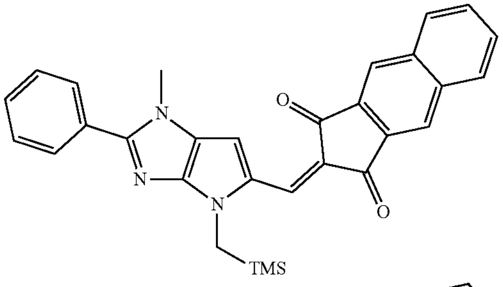
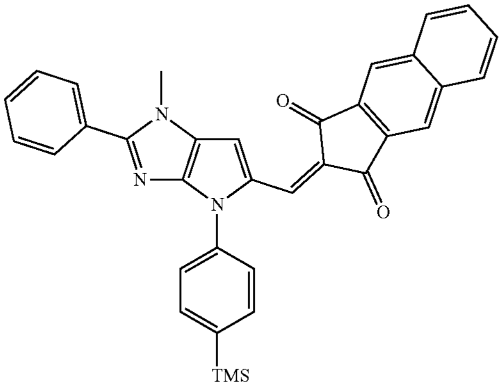
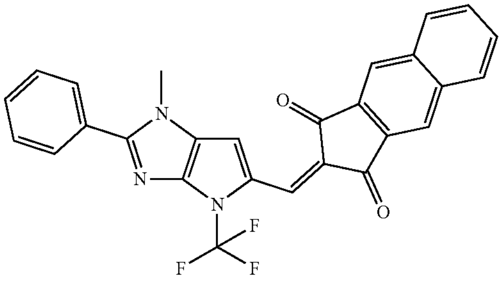
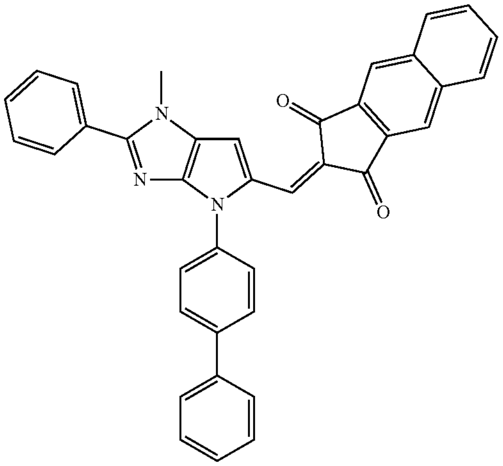
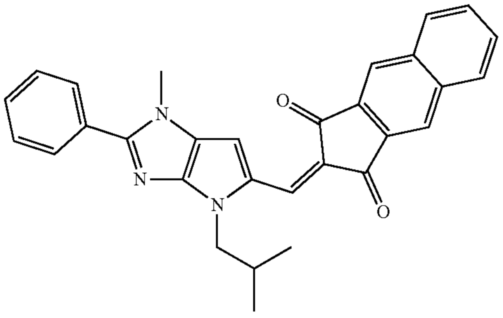
-continued
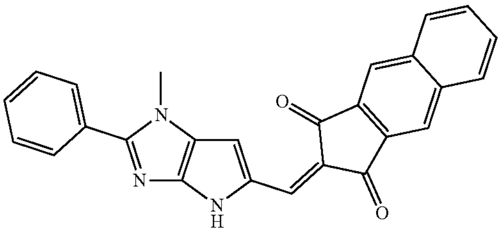
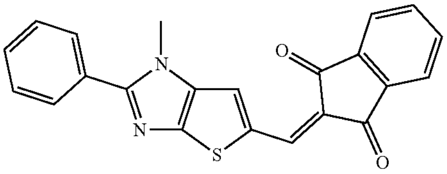
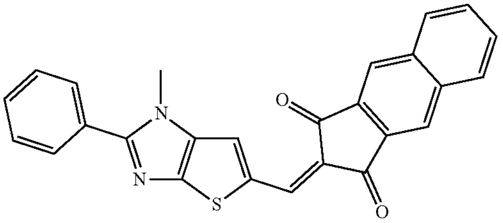
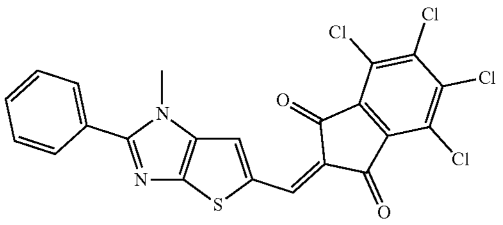
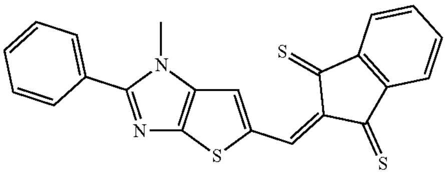
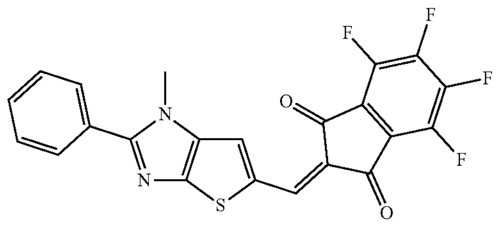
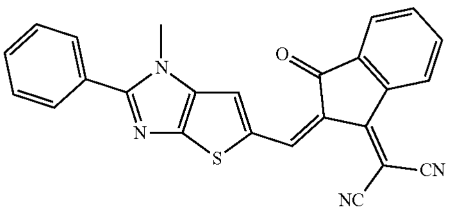
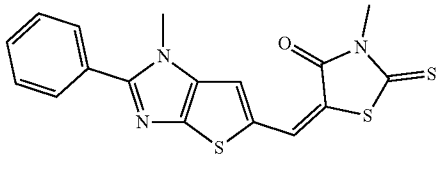

-continued
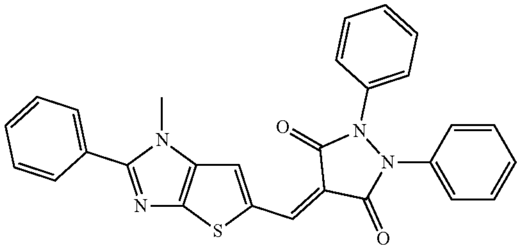
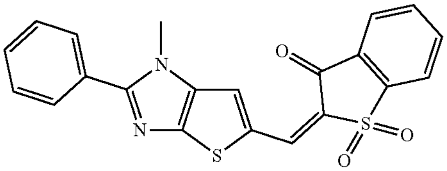
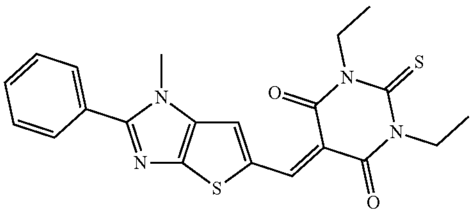
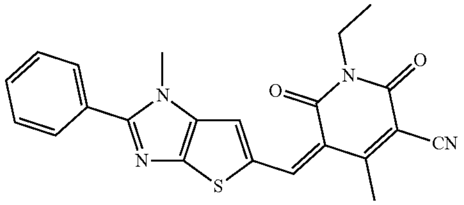
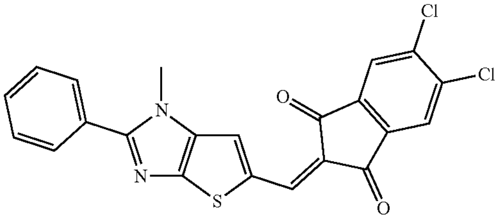
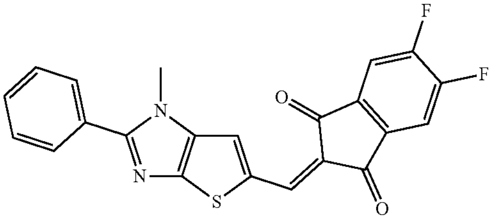
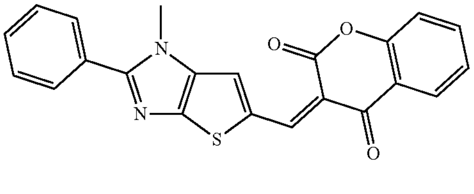
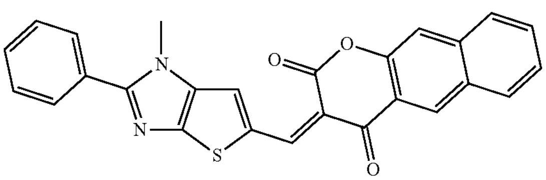
-continued
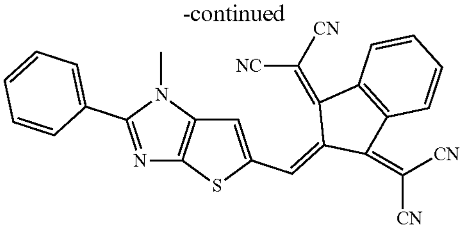
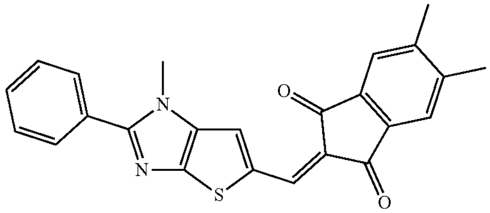
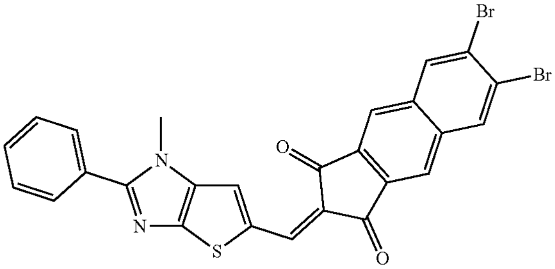
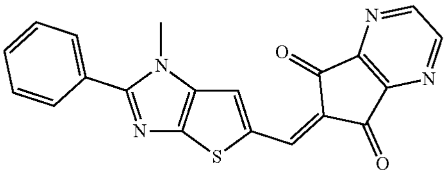
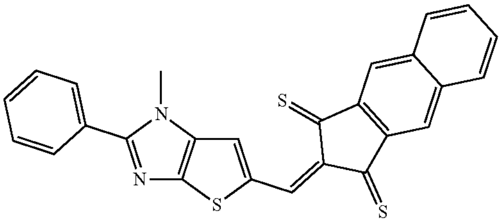
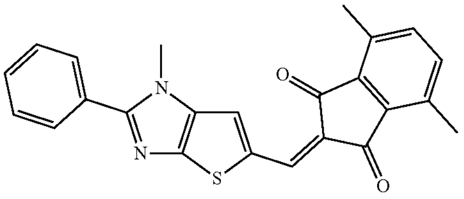
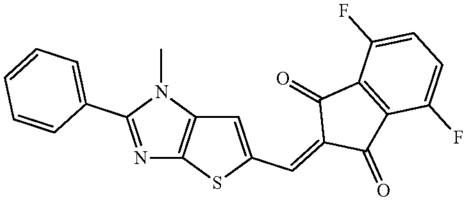
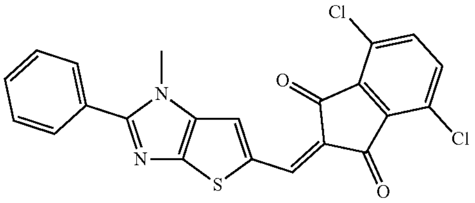

-continued
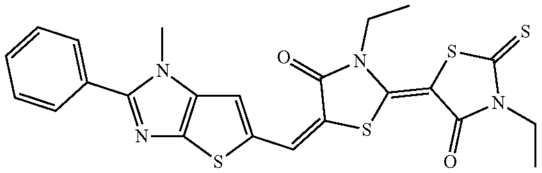
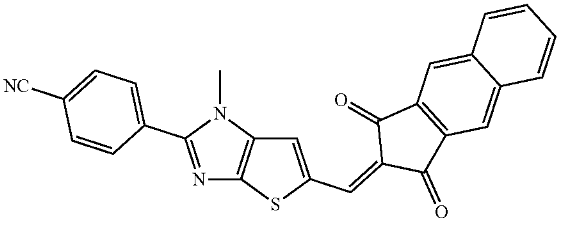
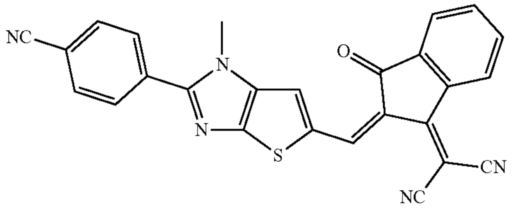
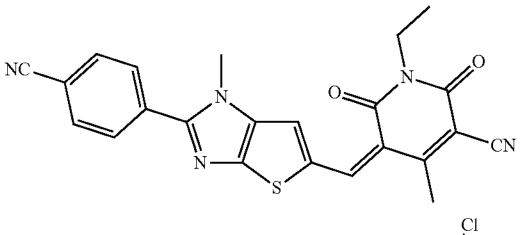
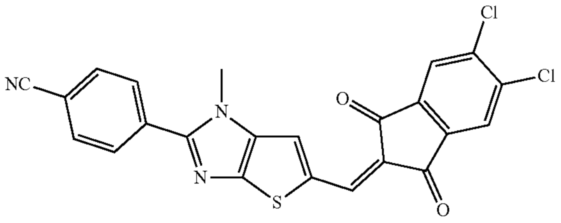
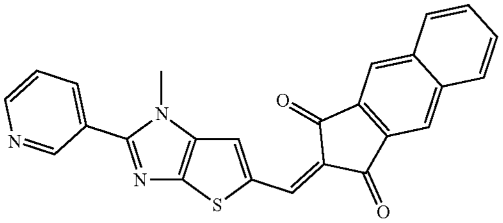
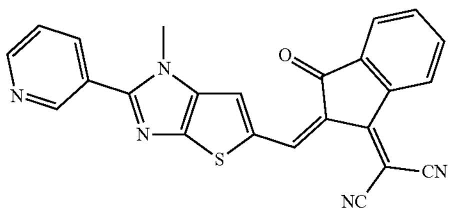
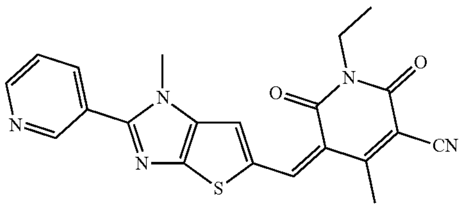
-continued
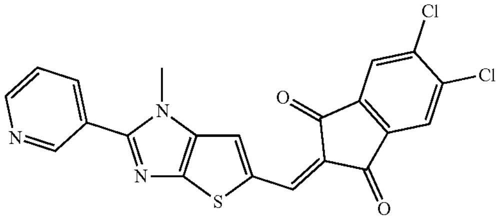
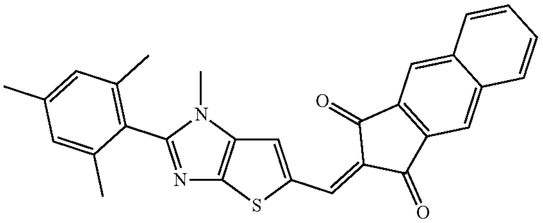
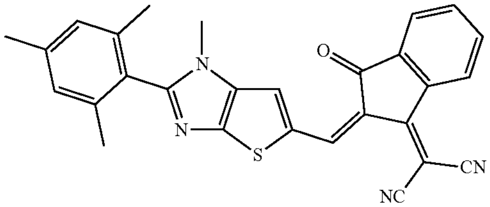
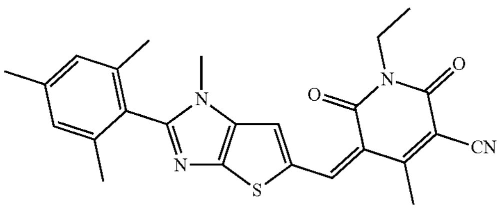
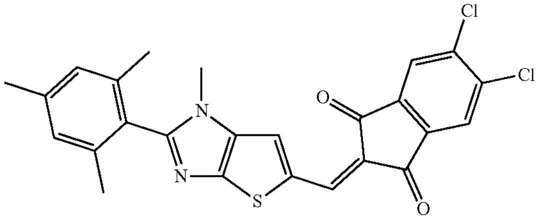
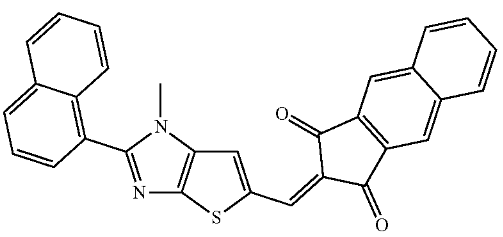
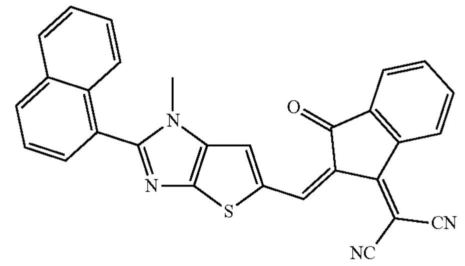

-continued
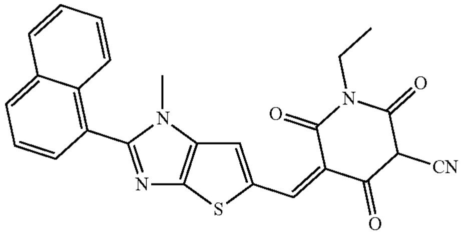
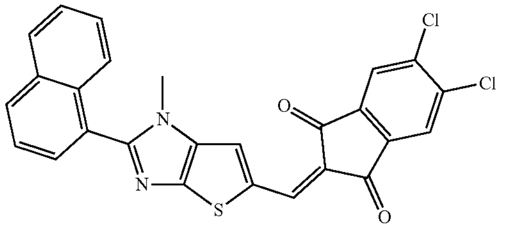
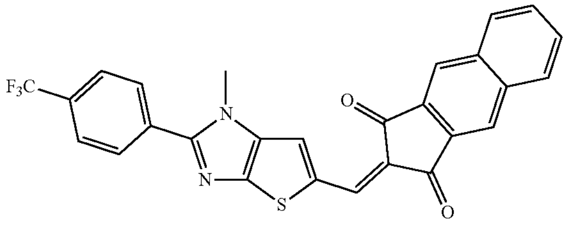
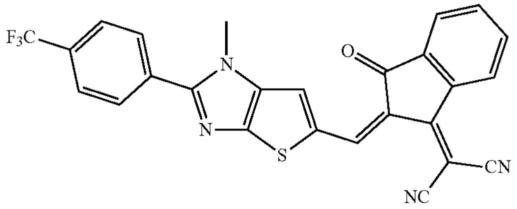
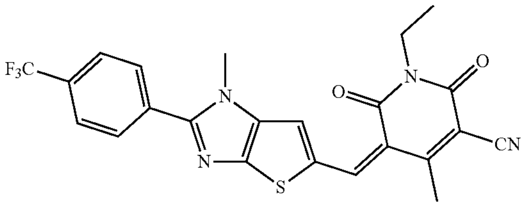
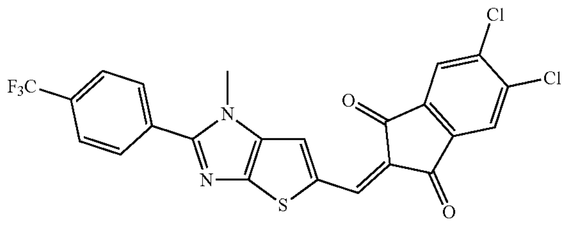
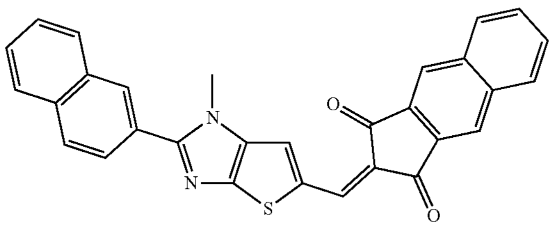
-continued
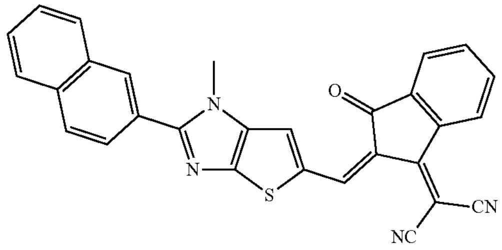
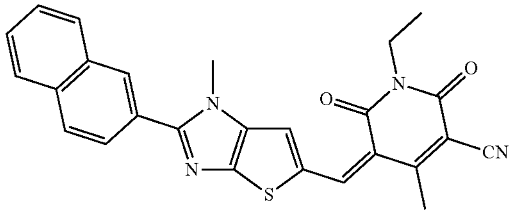
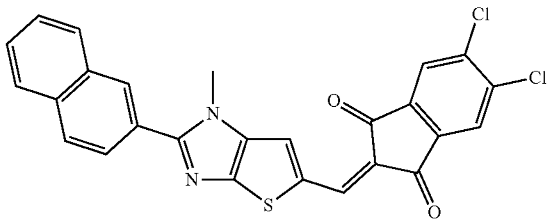
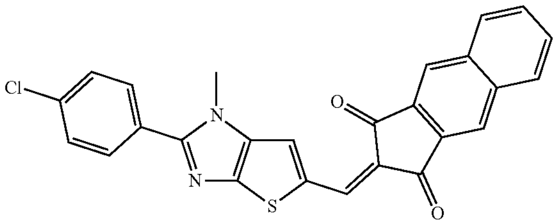
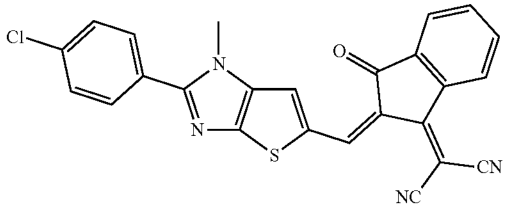
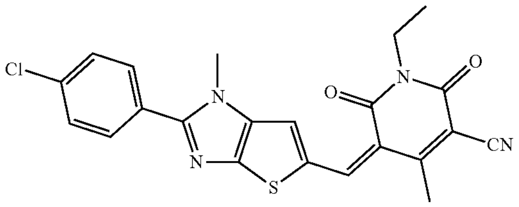
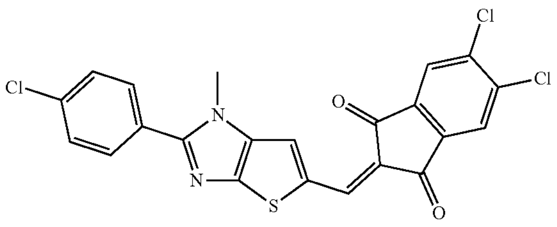

-continued
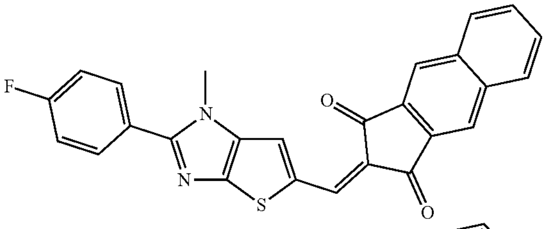
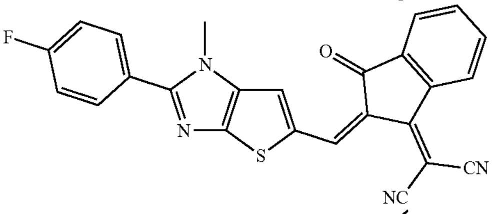
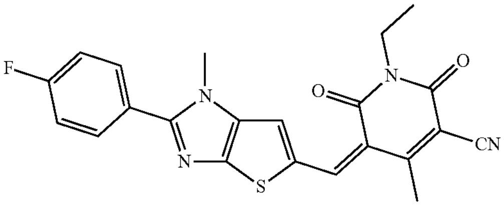
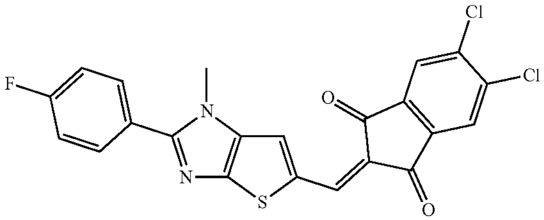
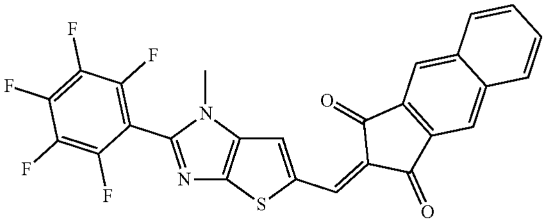
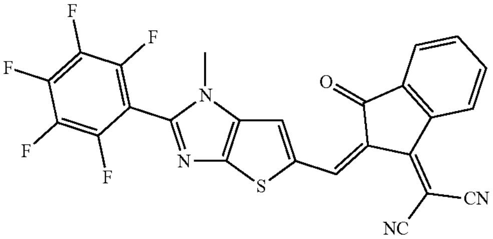
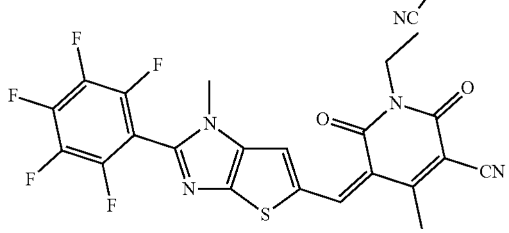
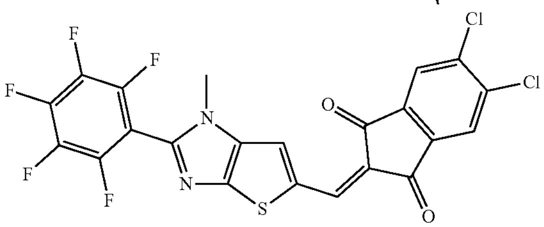
-continued
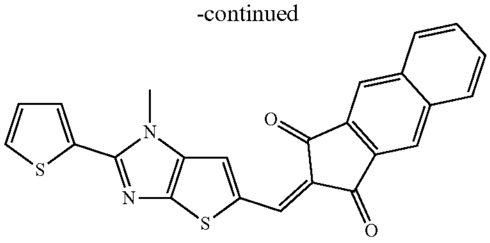
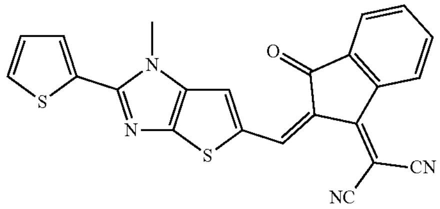
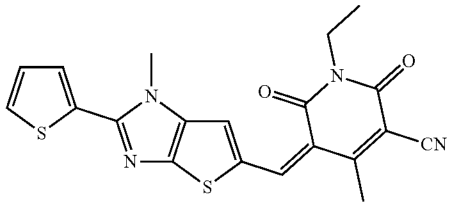
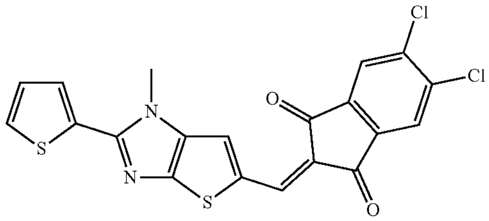
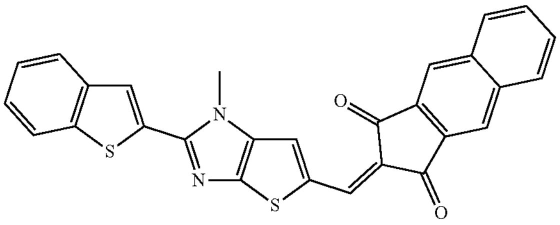
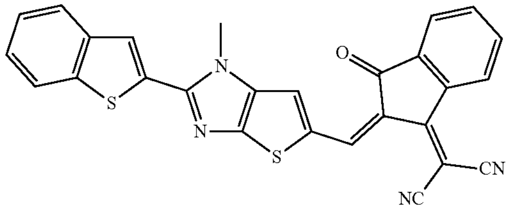
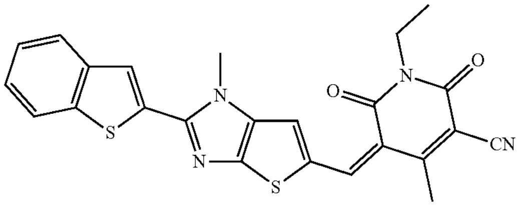
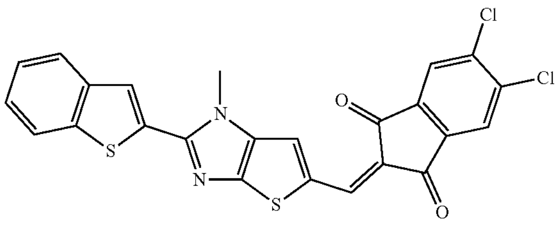

-continued
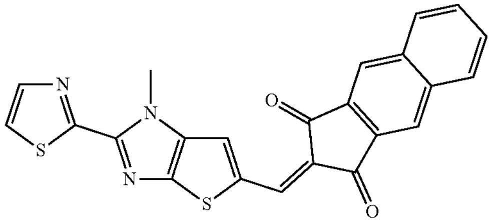
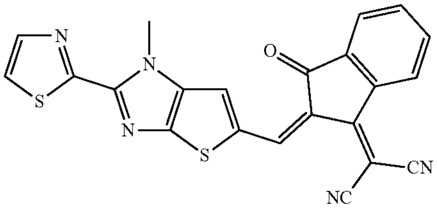
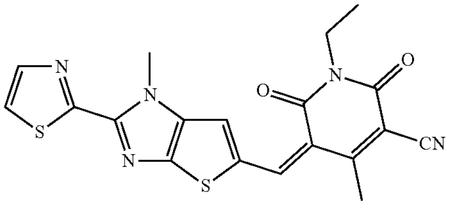
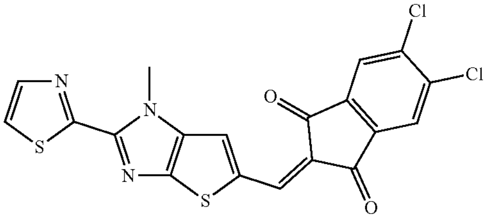
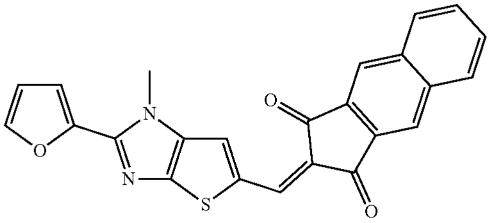
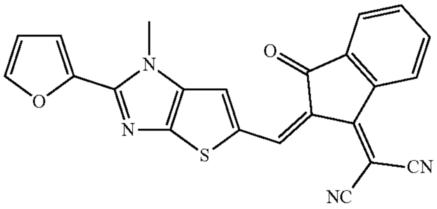
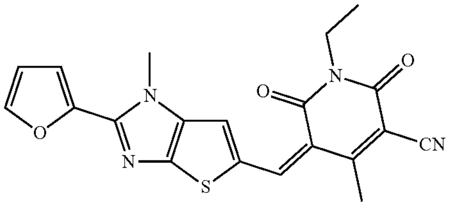
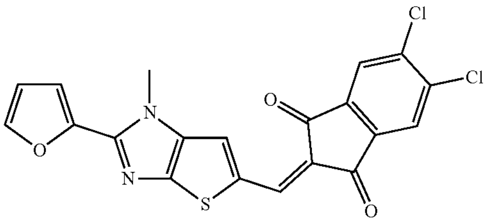
-continued
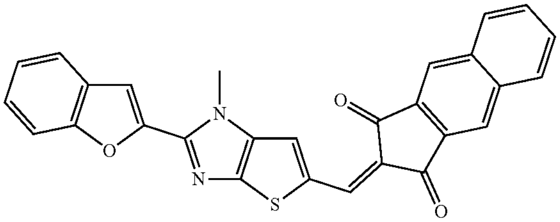
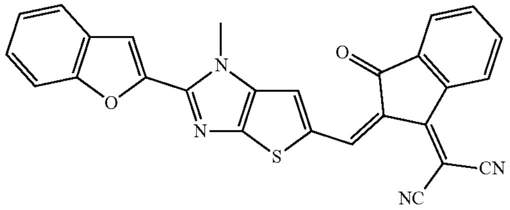
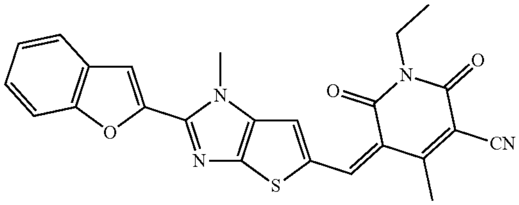
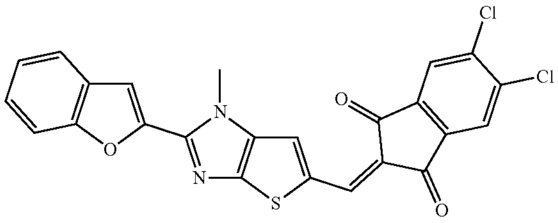
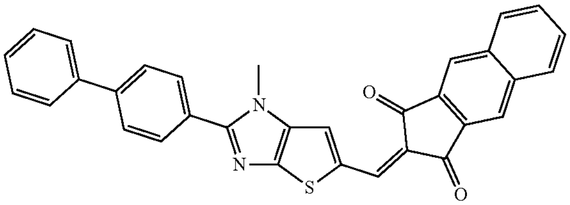
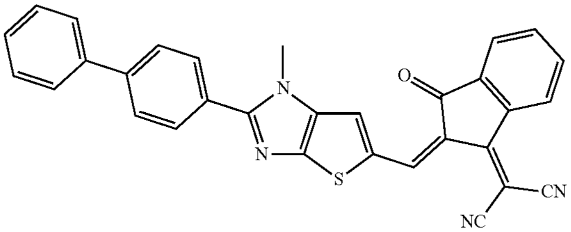
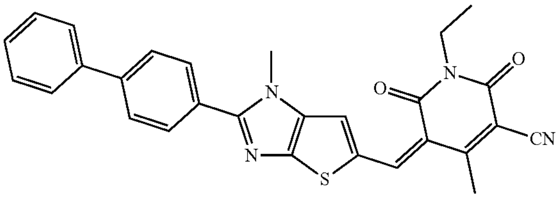
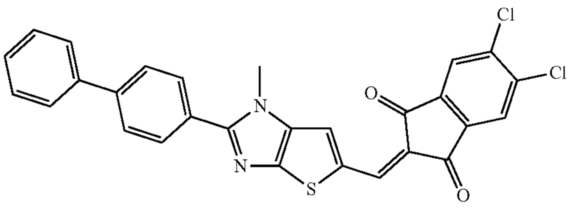

-continued
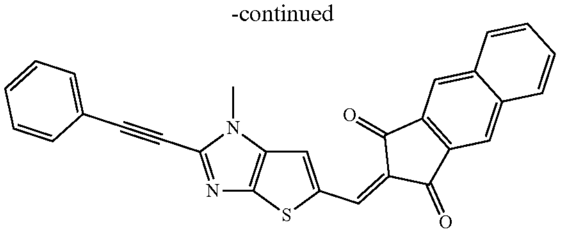
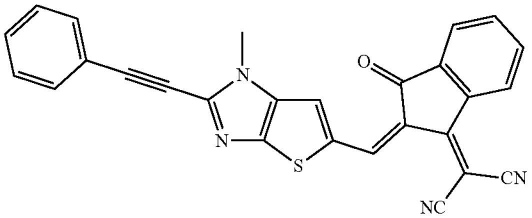
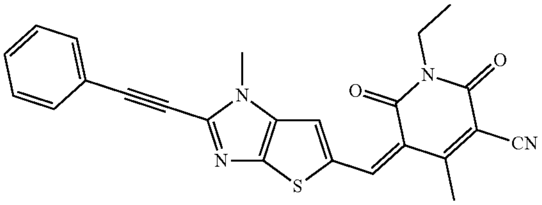
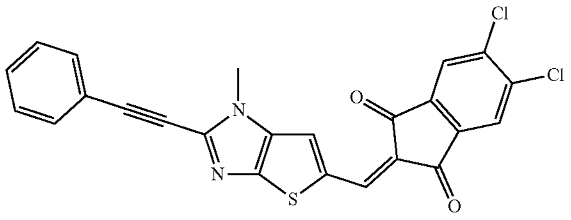
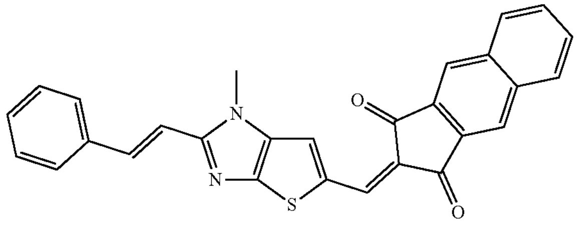
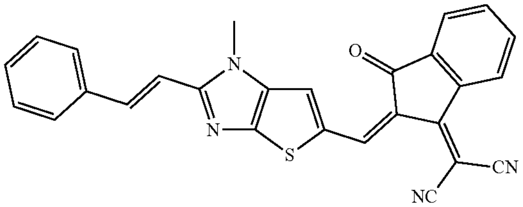
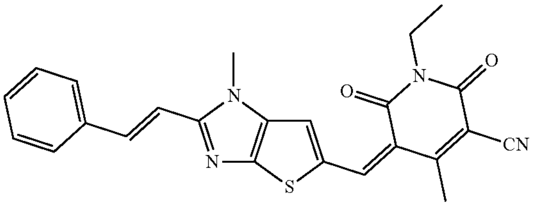
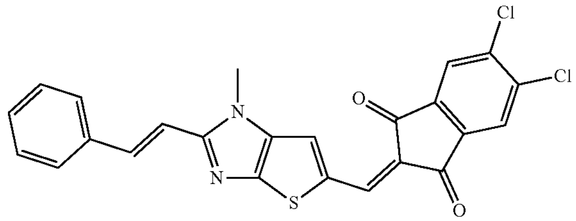
-continued
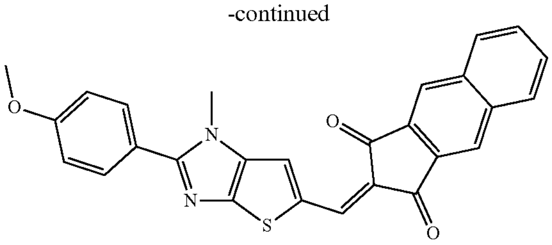
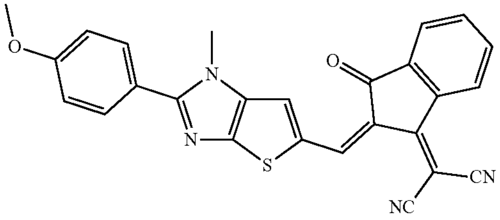
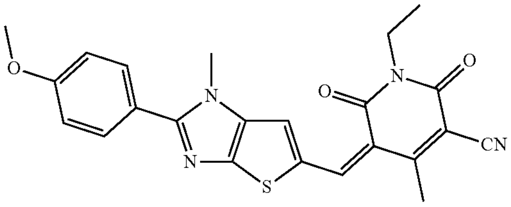
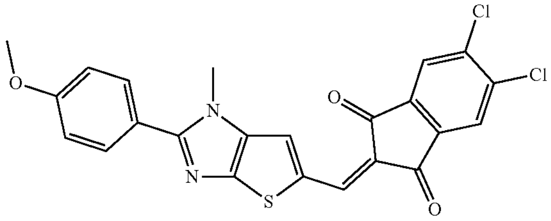
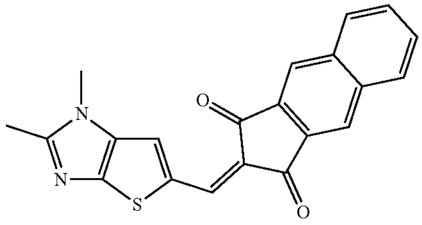
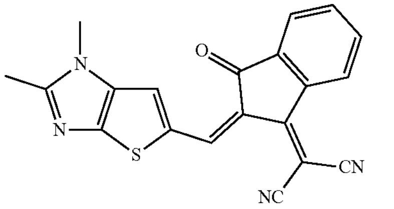
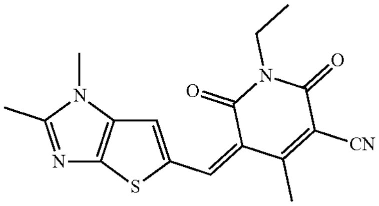
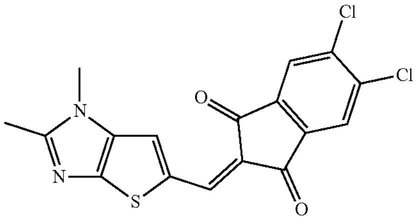

-continued
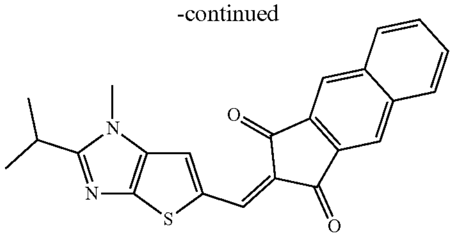
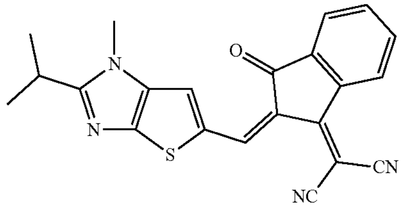
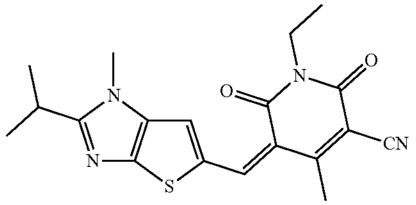
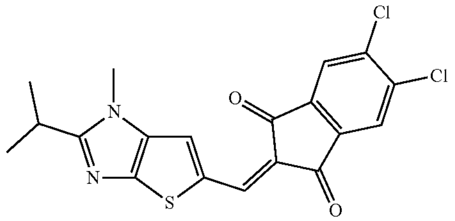
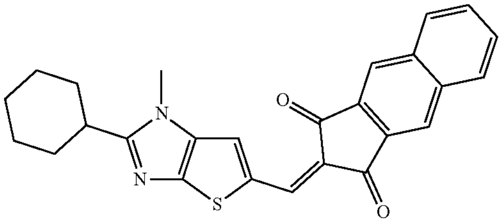
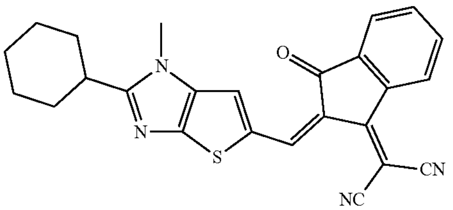
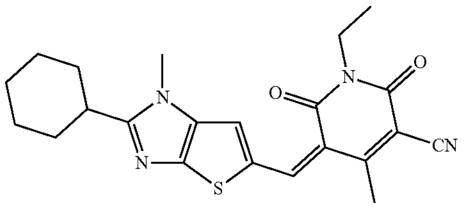
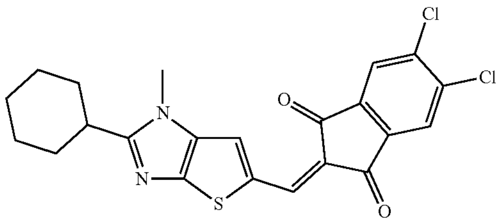
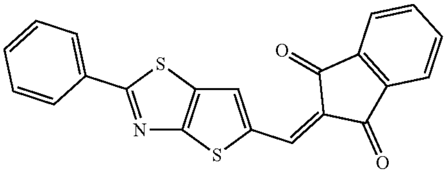
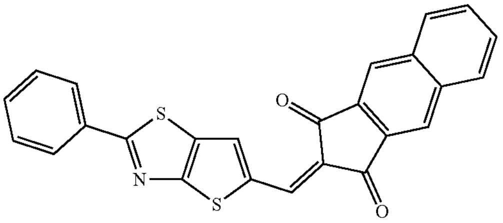
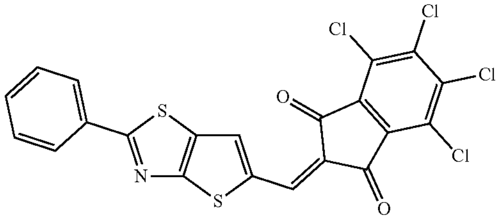
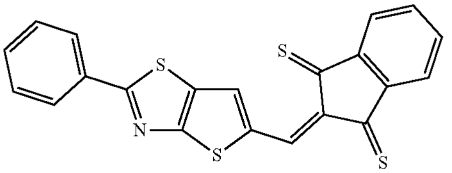
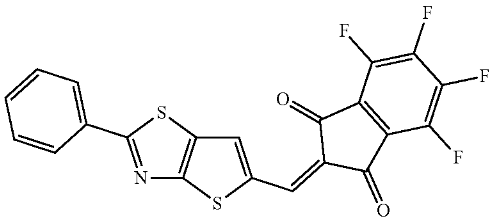
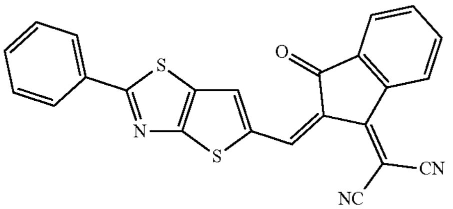
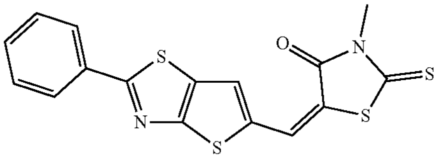
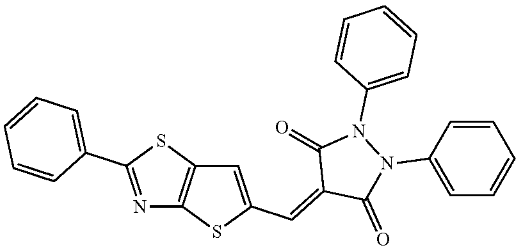

-continued
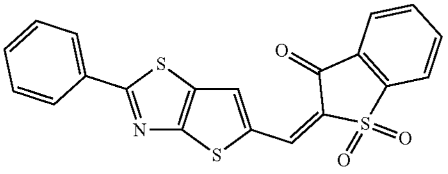
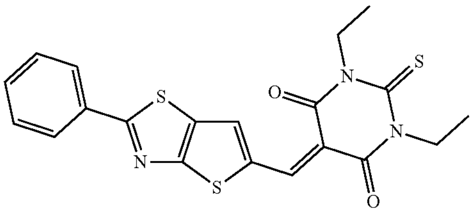
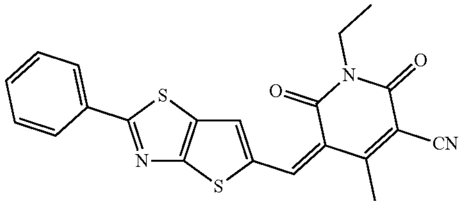
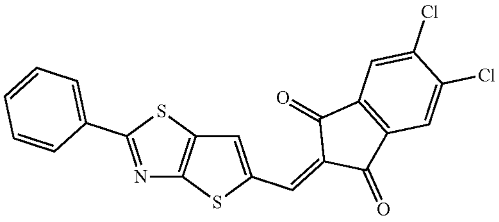
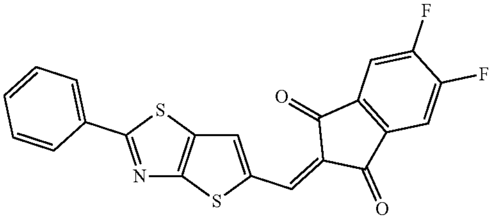
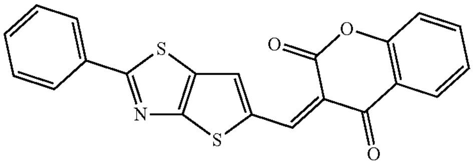
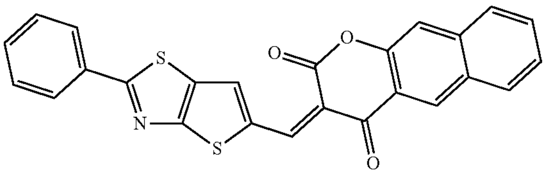
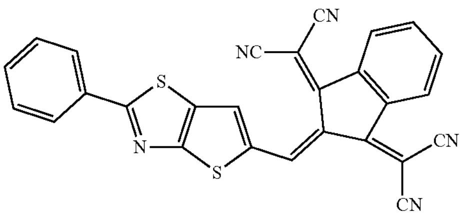
-continued
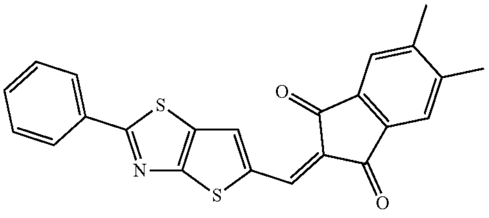
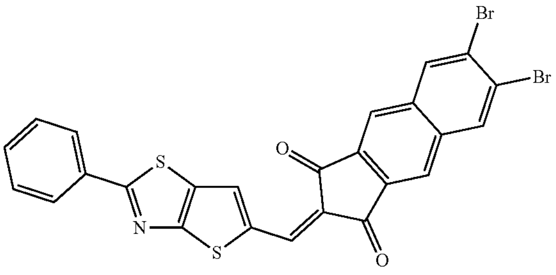
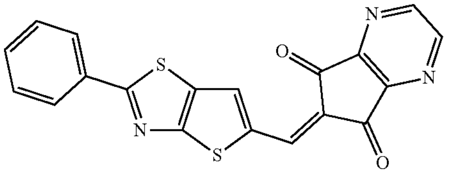
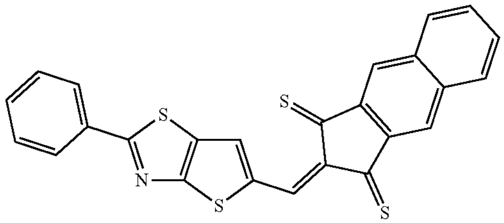
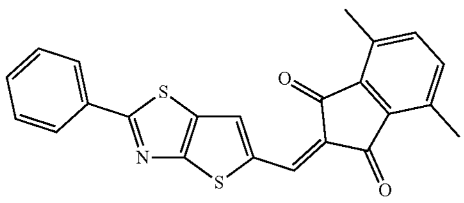
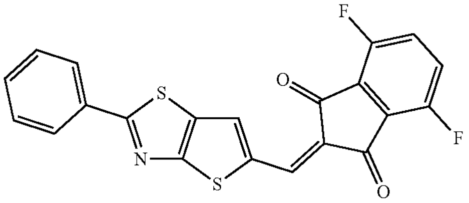
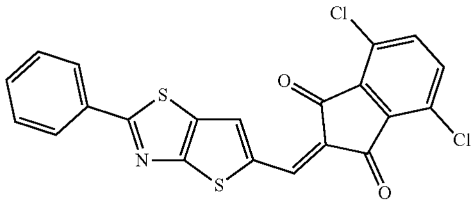
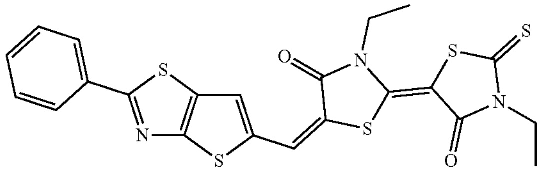

-continued
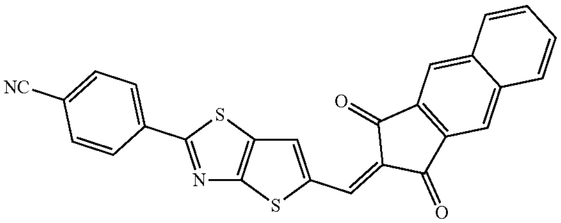
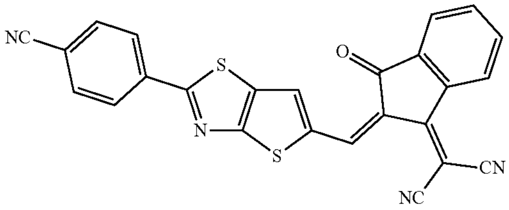
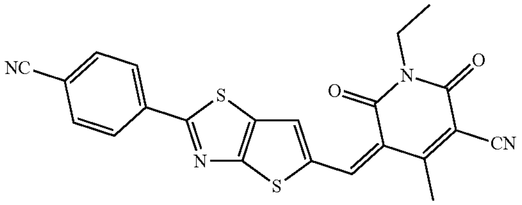
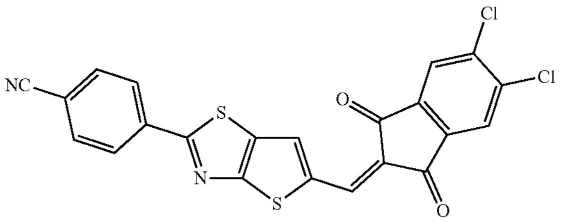
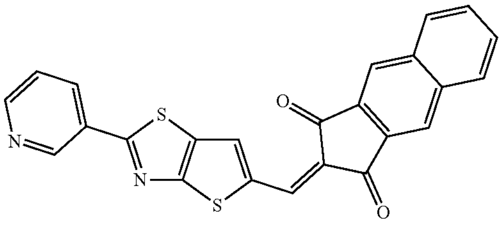
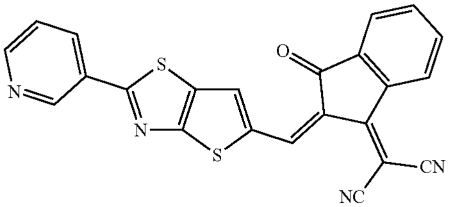
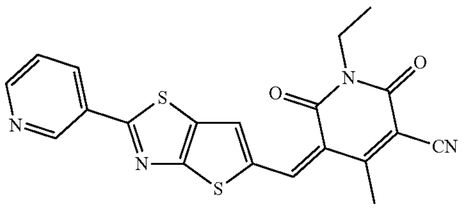
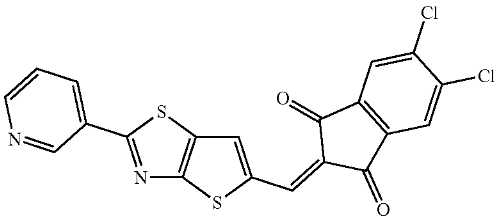
-continued
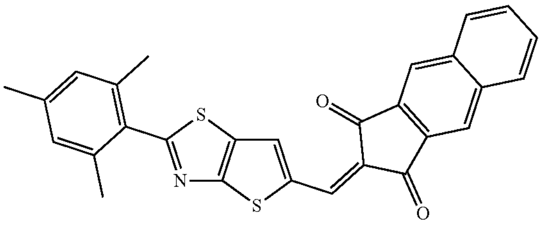
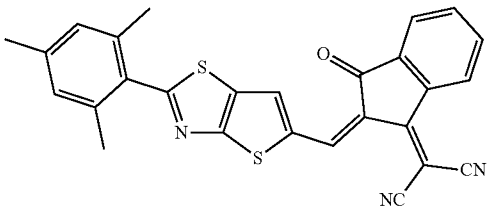
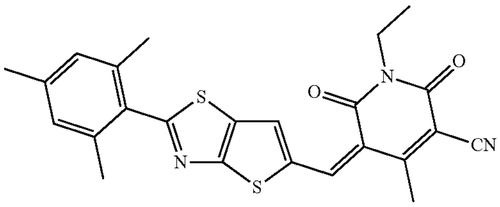
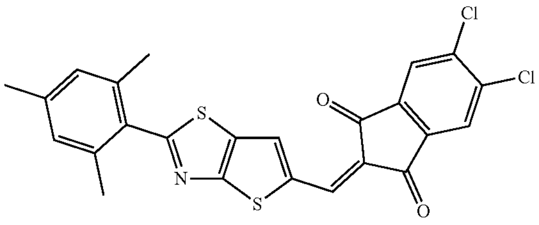
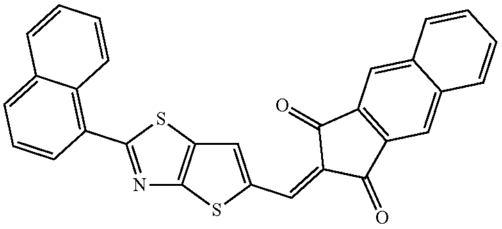
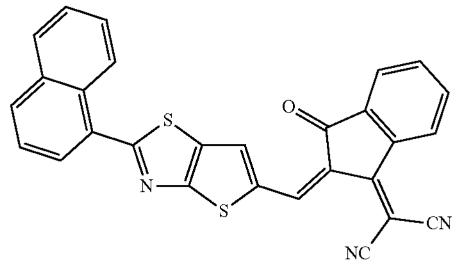
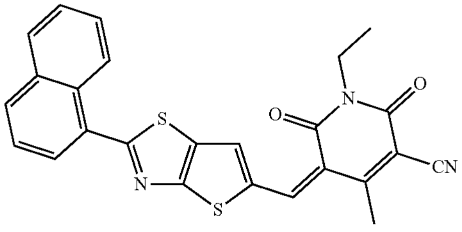

-continued
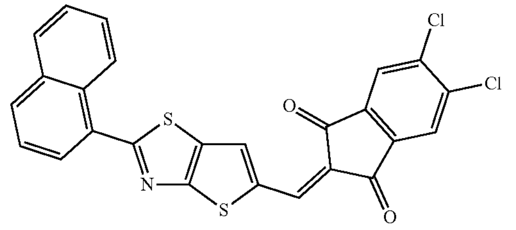
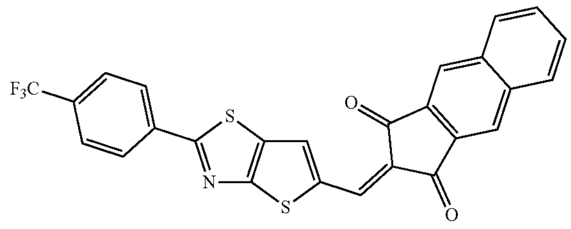
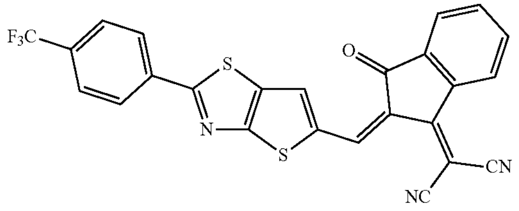
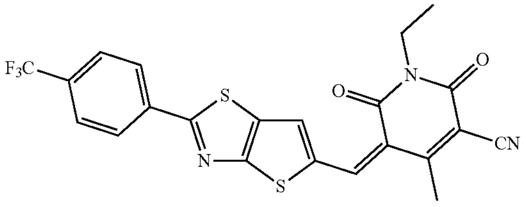
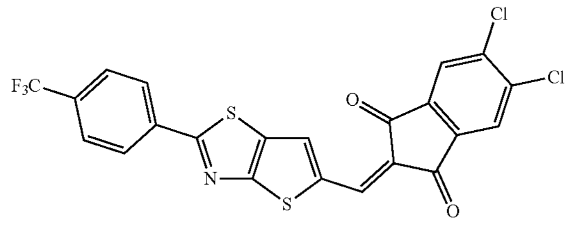
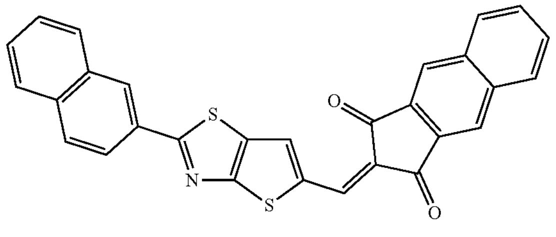
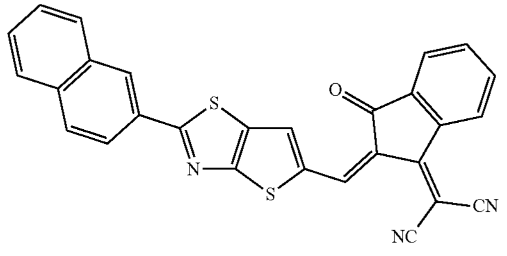
-continued
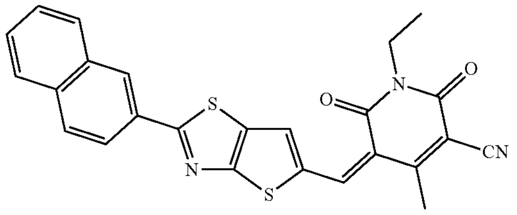
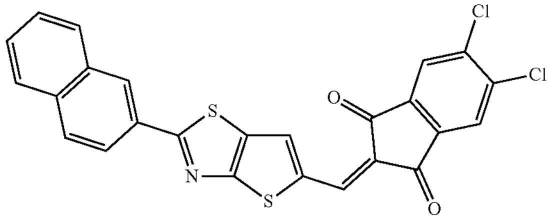
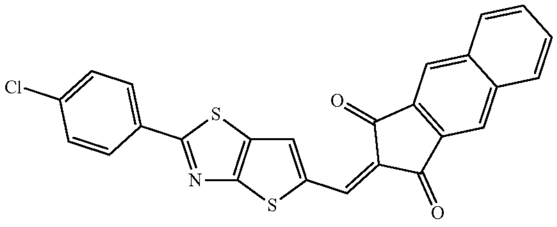
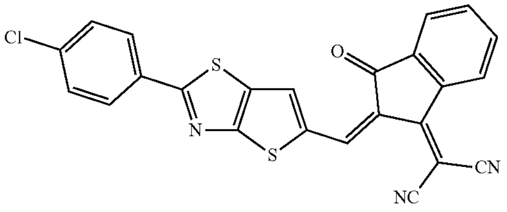
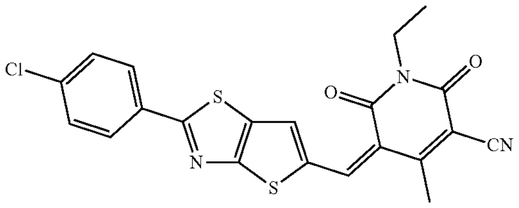
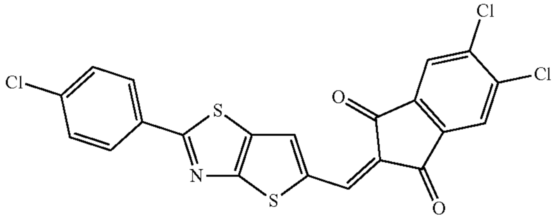
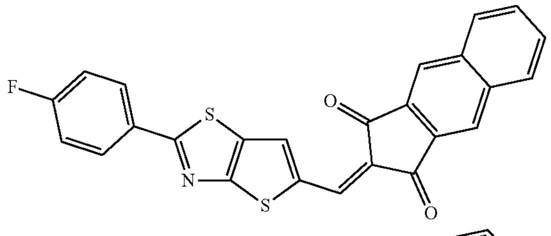
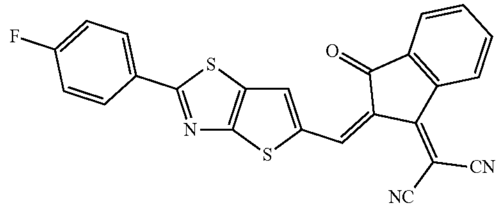

-continued
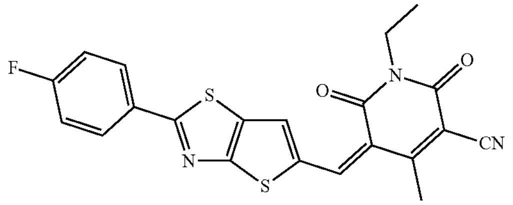
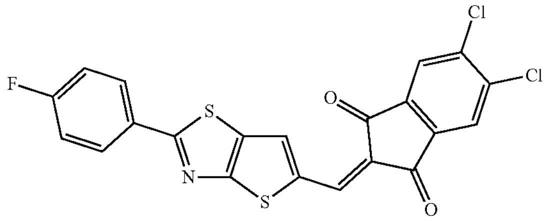
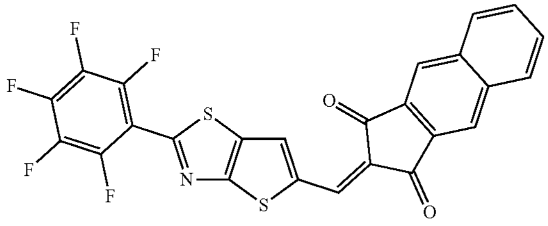
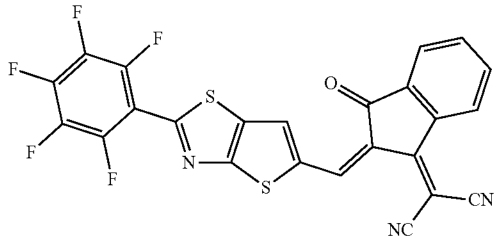
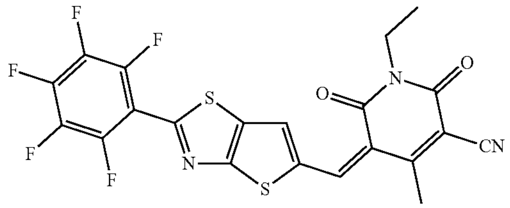
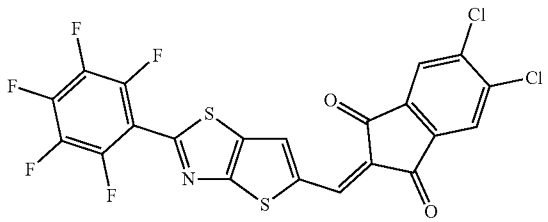
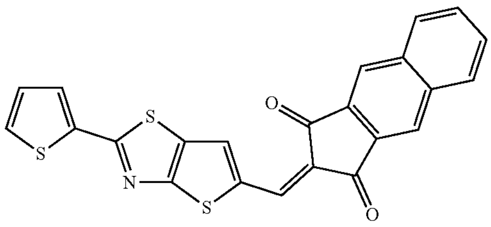
-continued
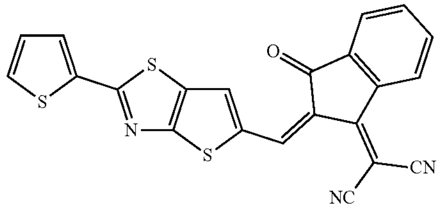
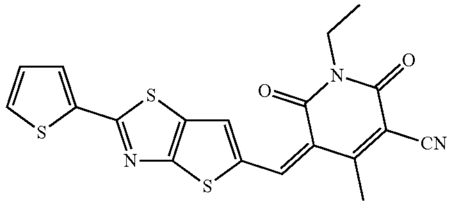
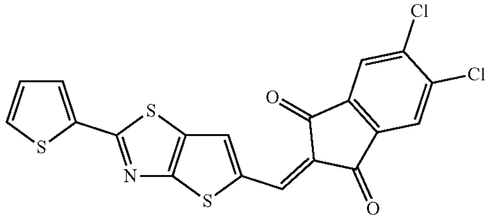
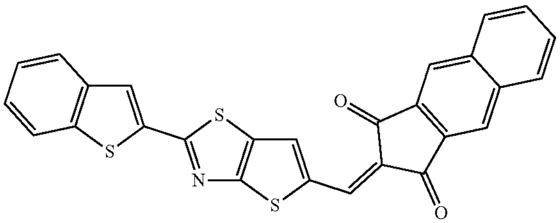
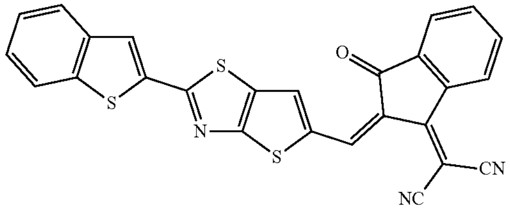
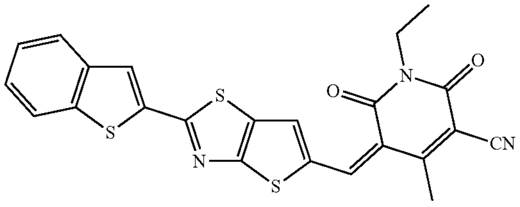
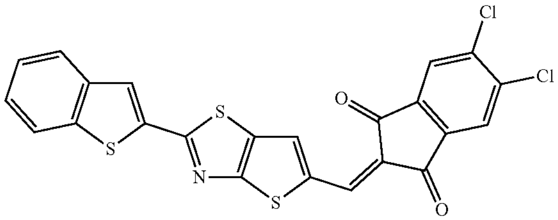
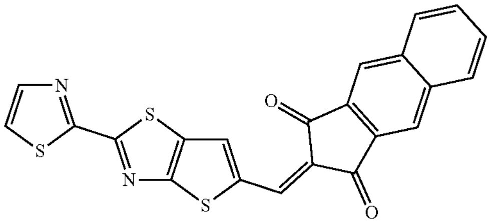

-continued
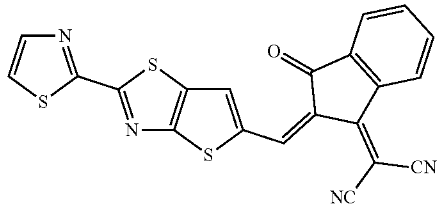
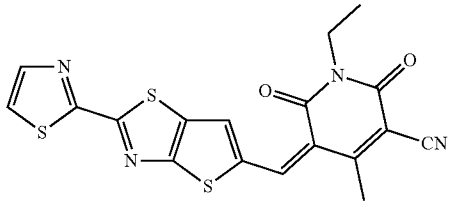
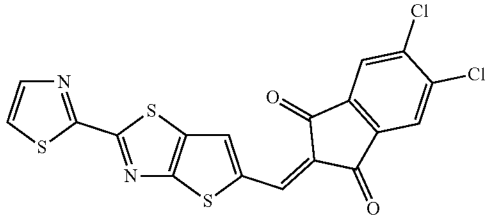
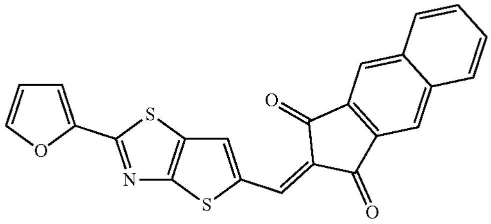
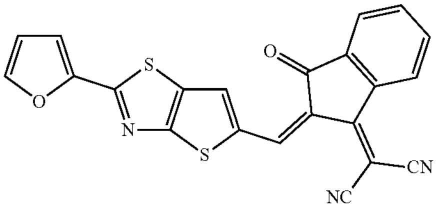
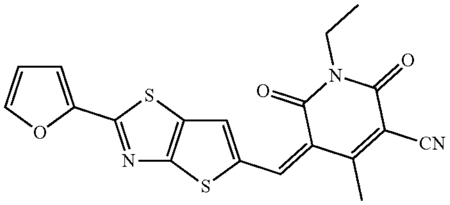
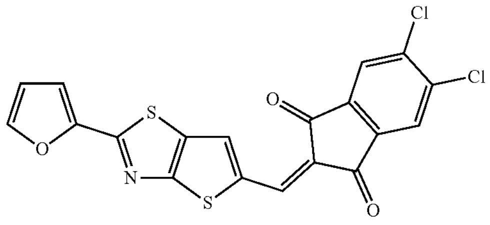
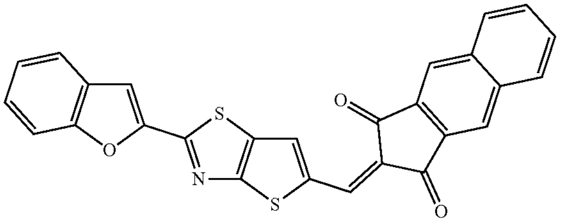
-continued
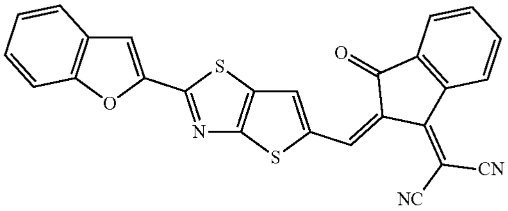
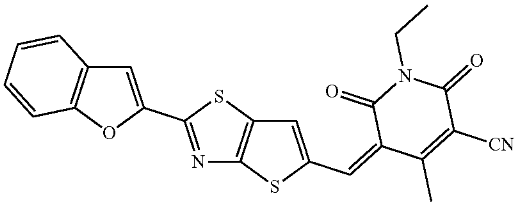
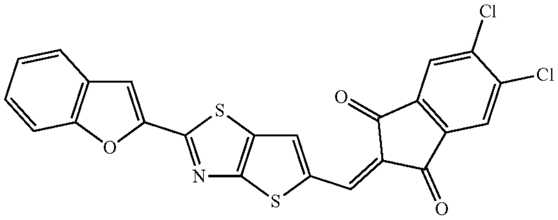
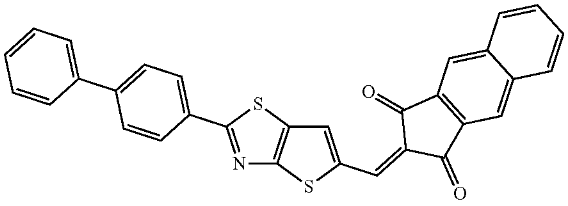
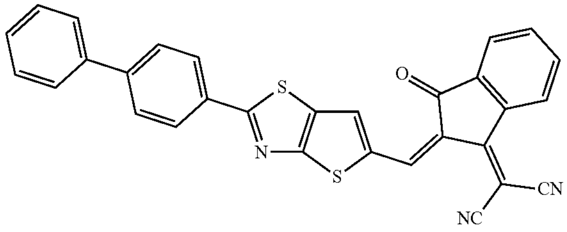
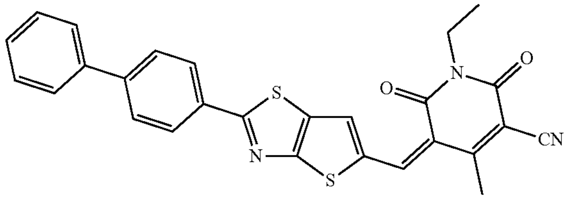
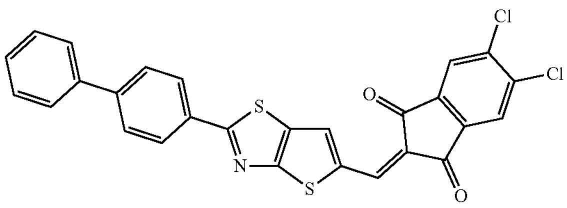
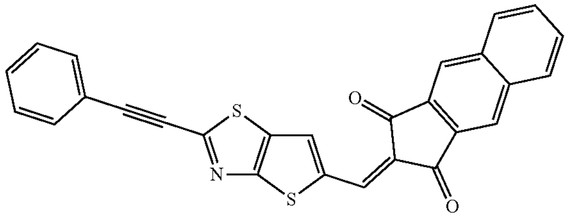

-continued
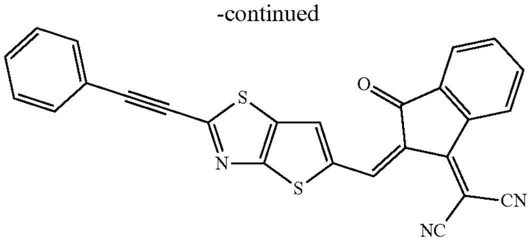
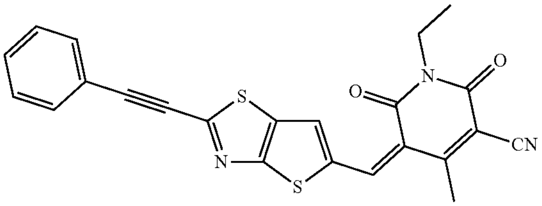
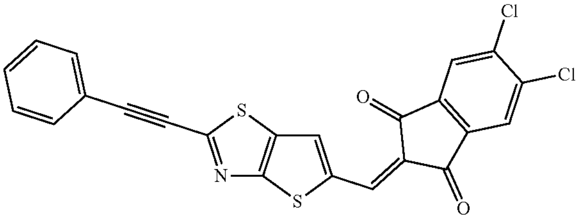
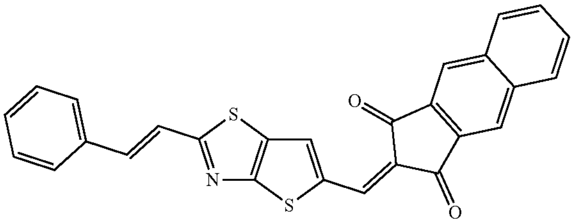
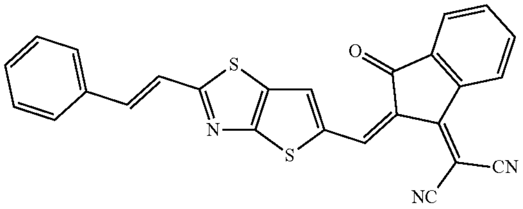
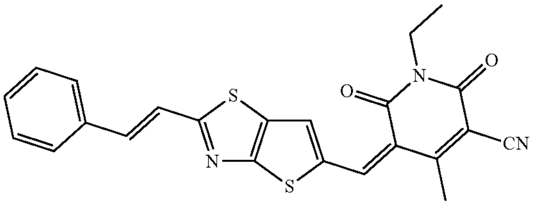
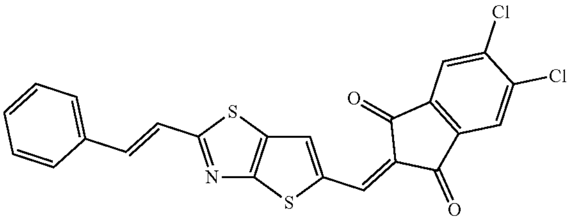
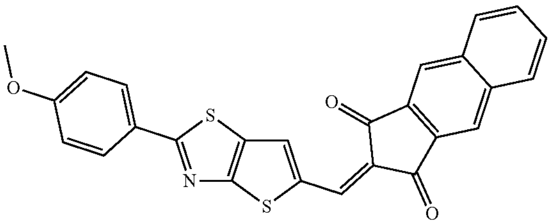
-continued
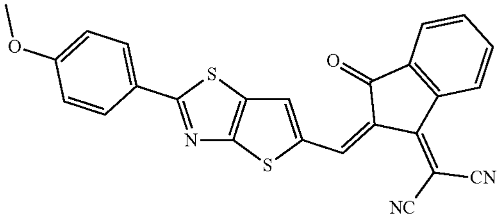
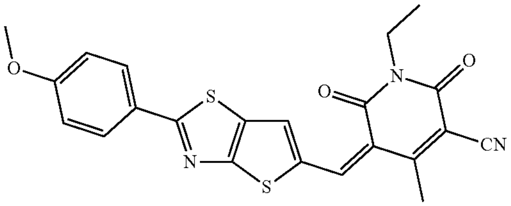
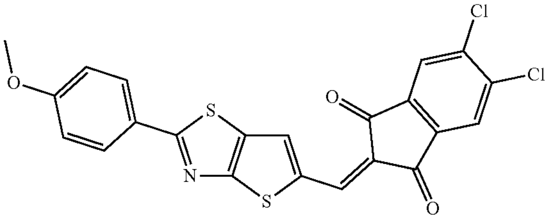
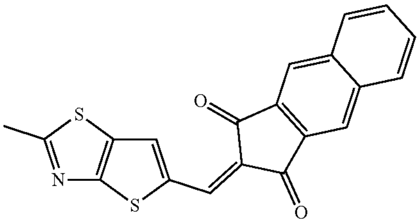
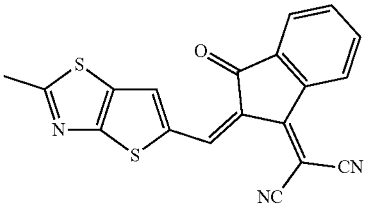
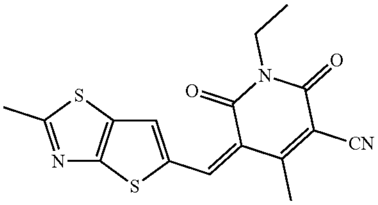
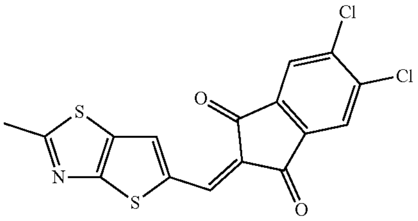
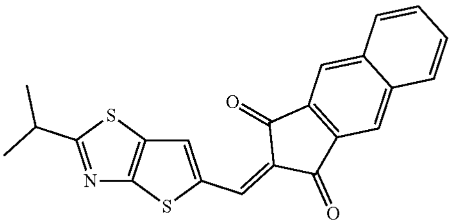

-continued
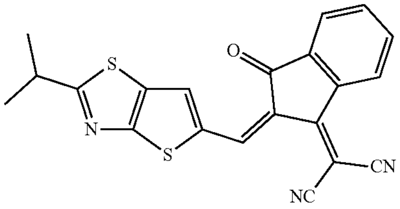
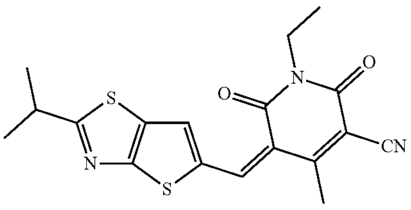
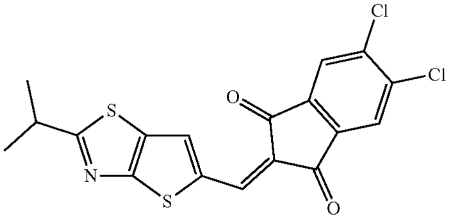
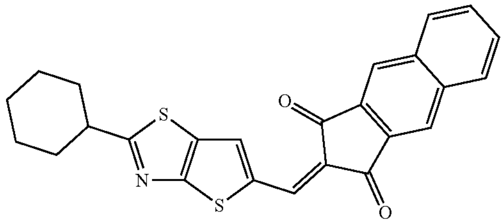
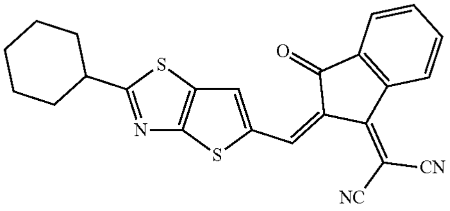
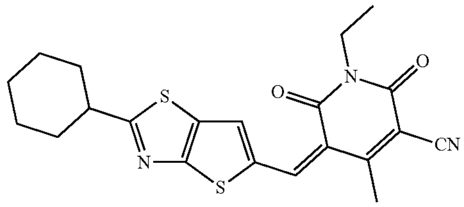
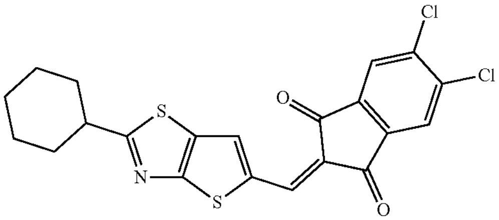
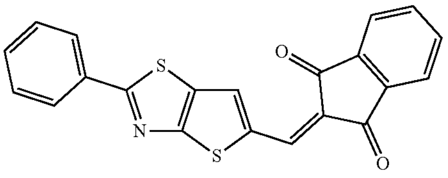
-continued
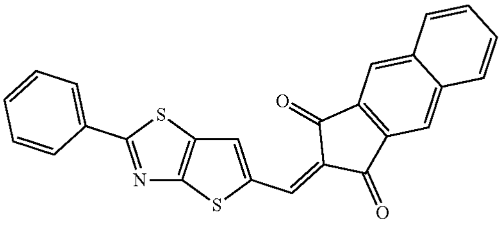
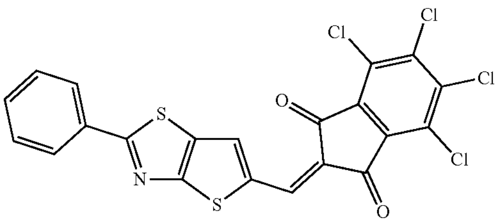
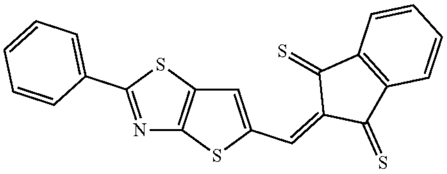
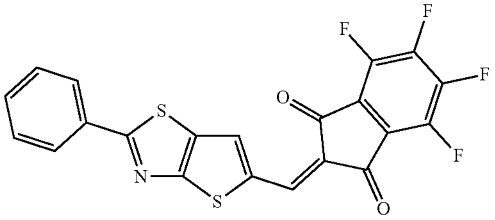
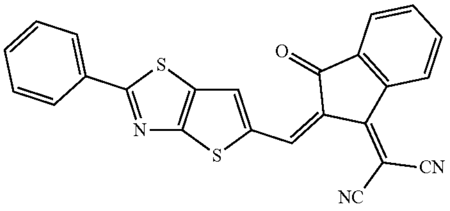
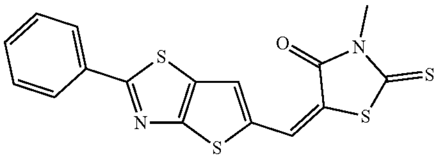
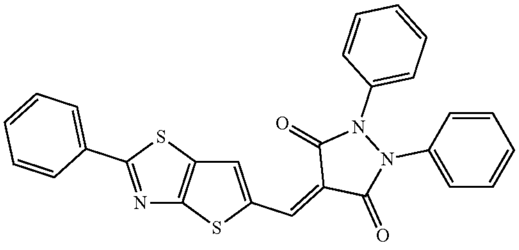
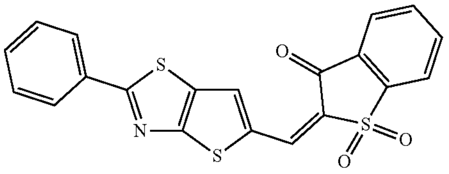

-continued
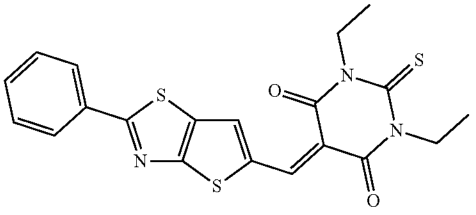
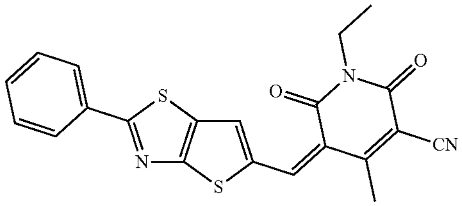
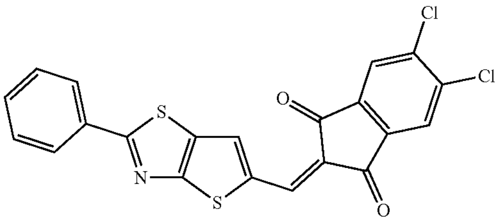
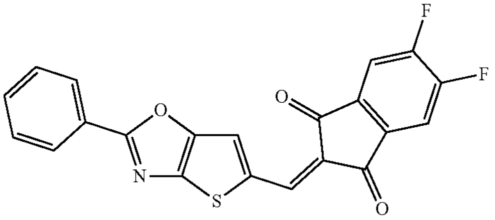
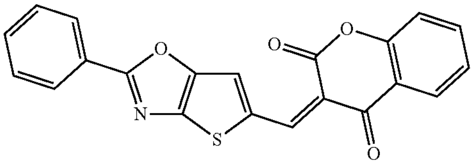
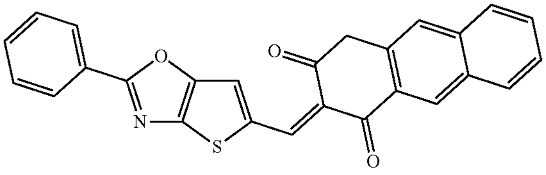
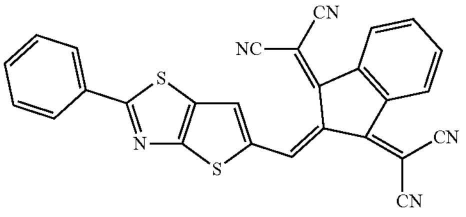
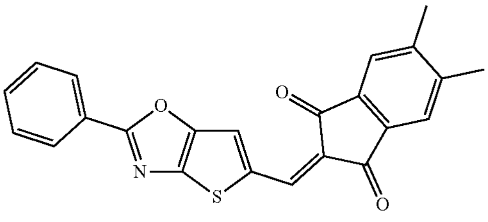
-continued
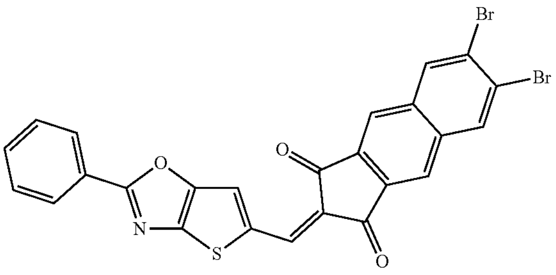
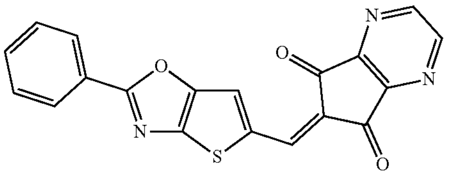
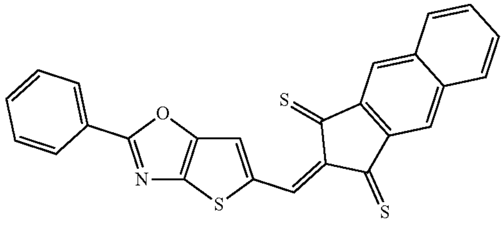
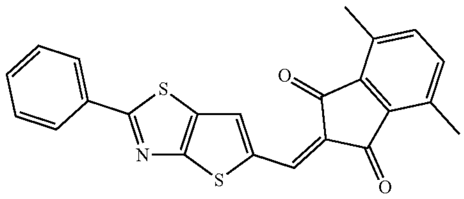
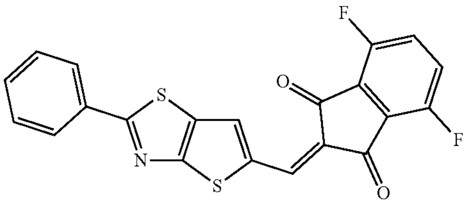
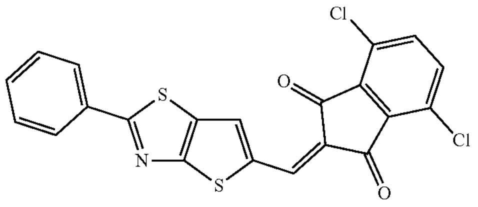
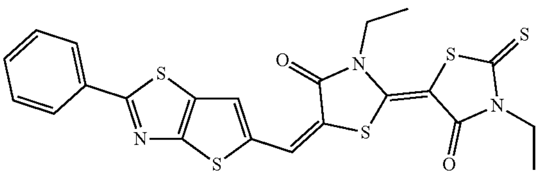
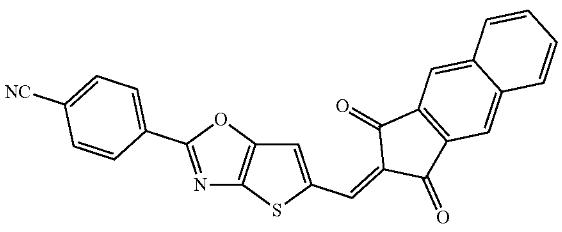

-continued
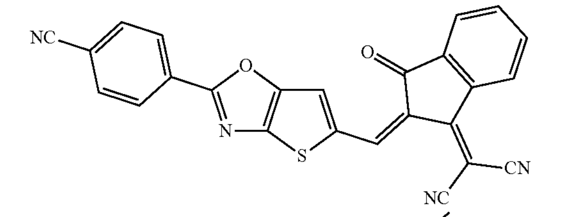
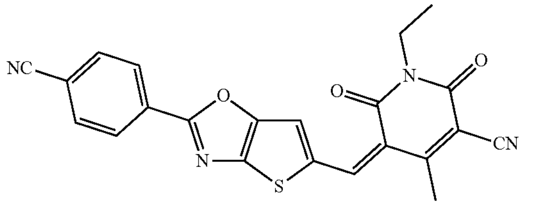
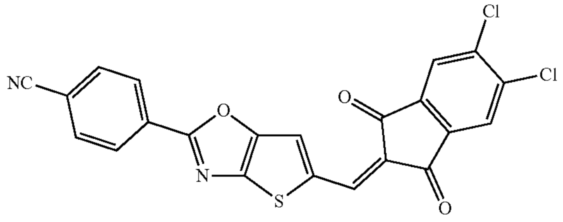
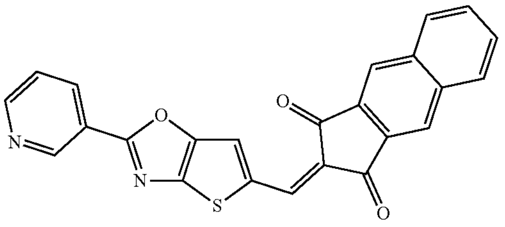
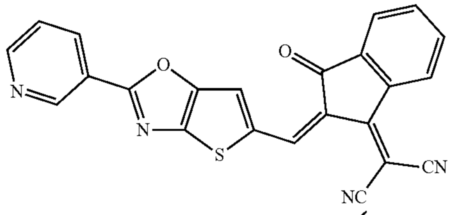
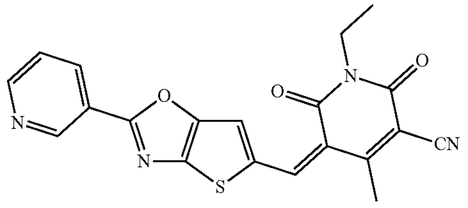
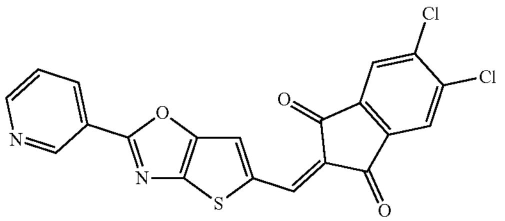
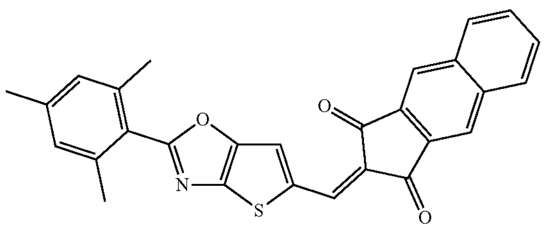
-continued
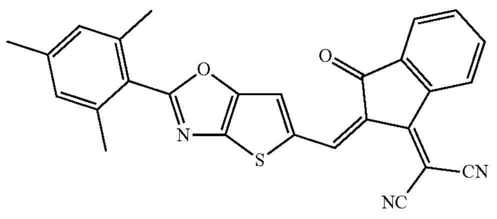
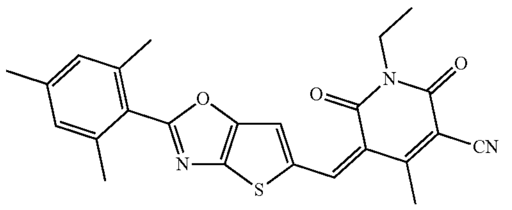
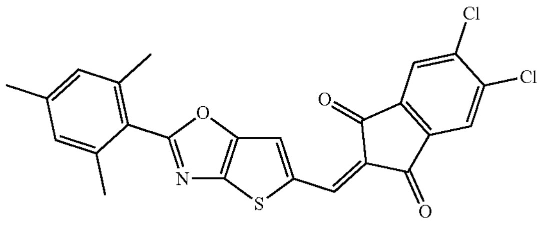
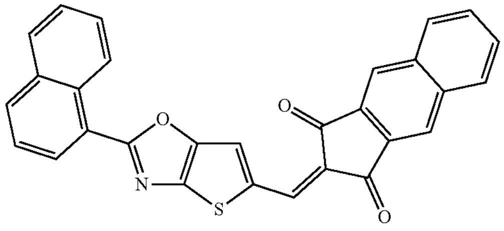
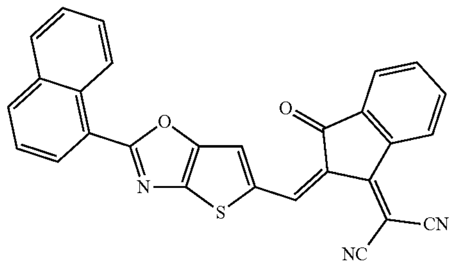
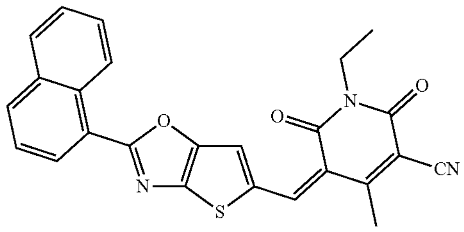
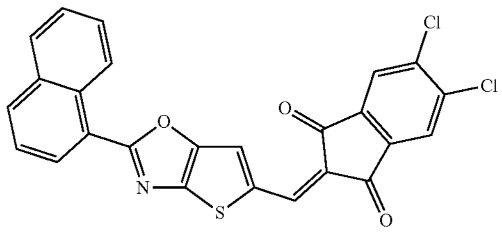

-continued
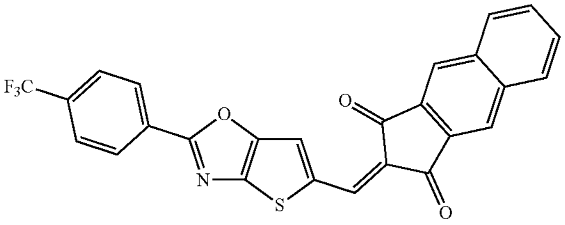
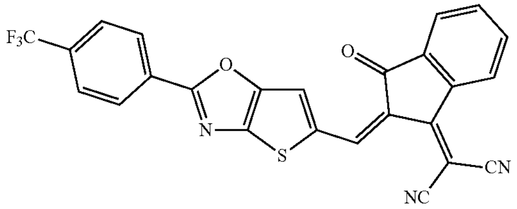
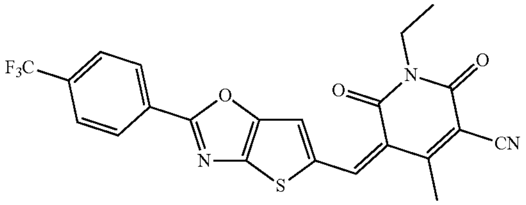
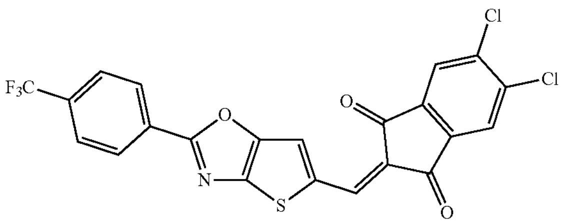
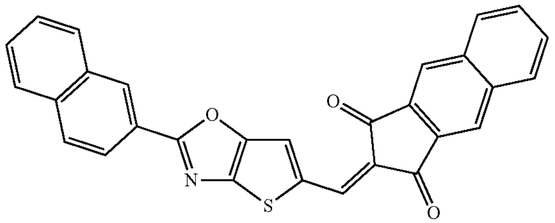
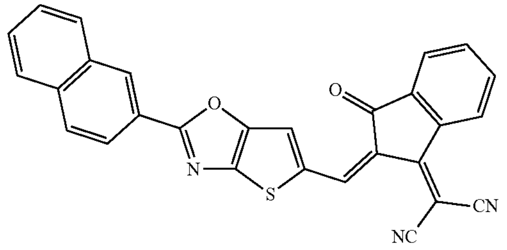
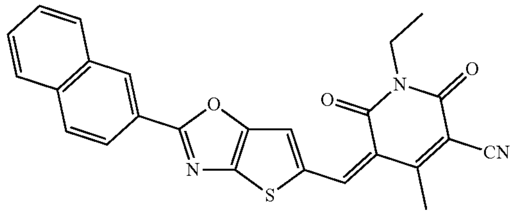
-continued
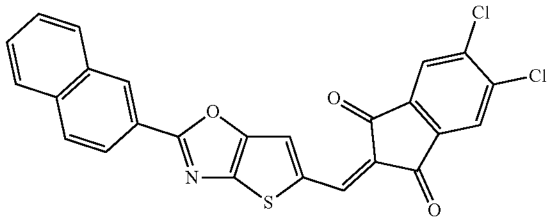
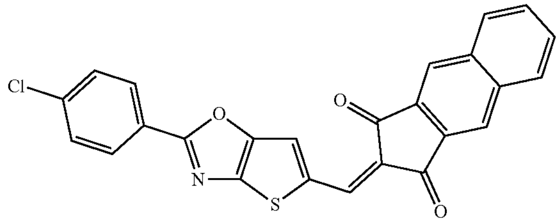
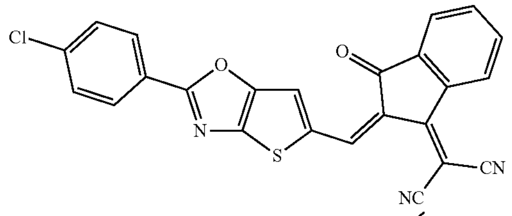
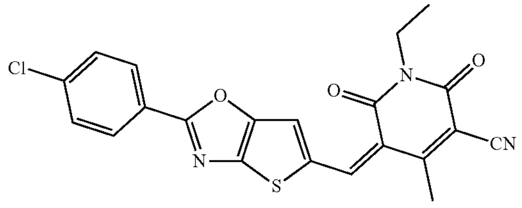
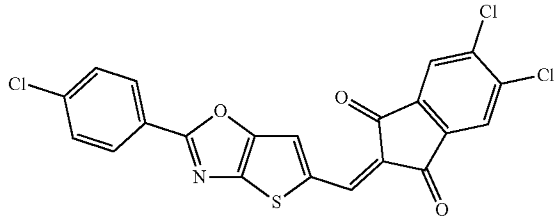
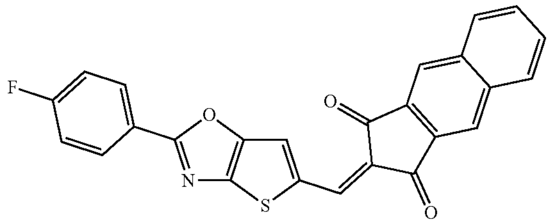
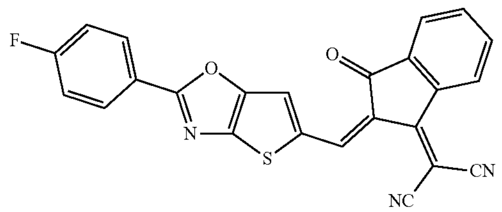
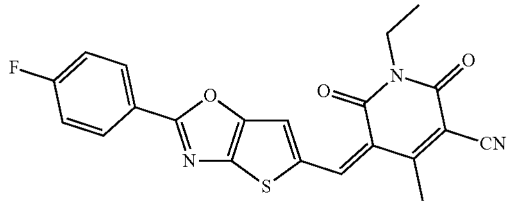

-continued
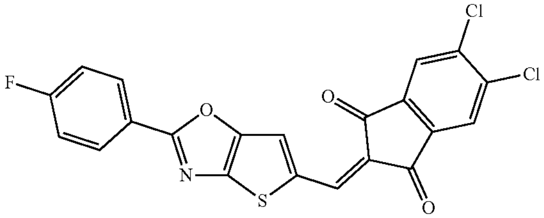
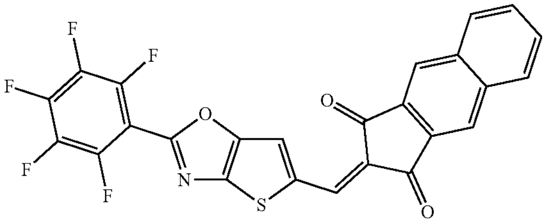
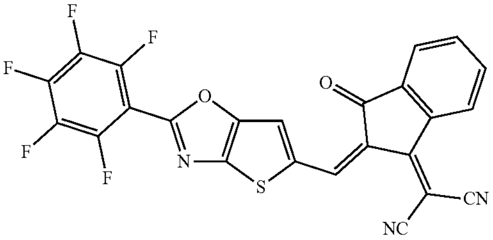
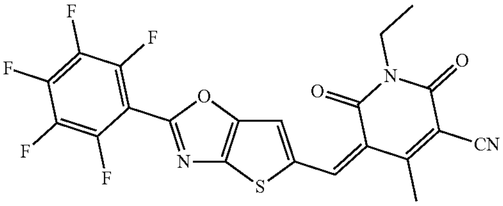
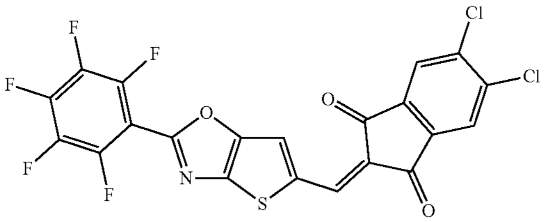
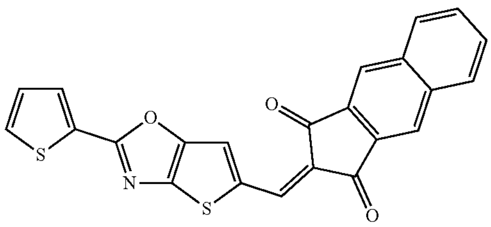
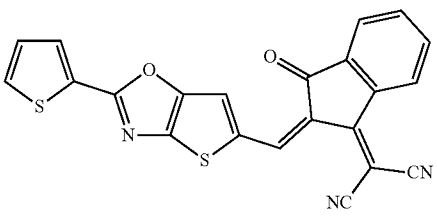
-continued
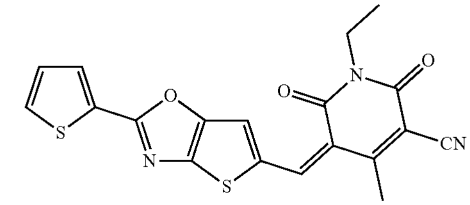
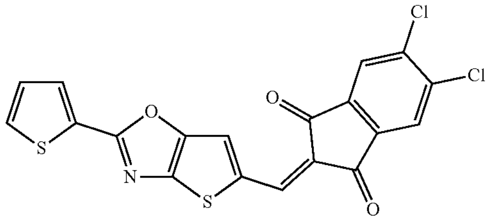
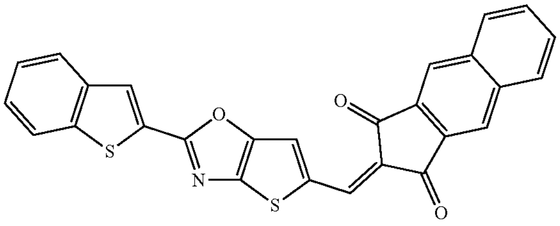
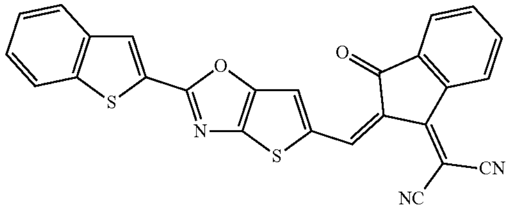
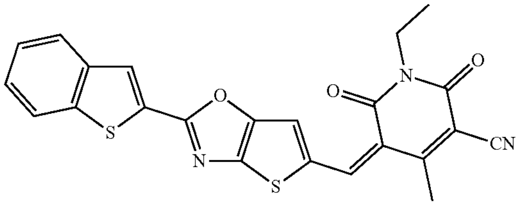
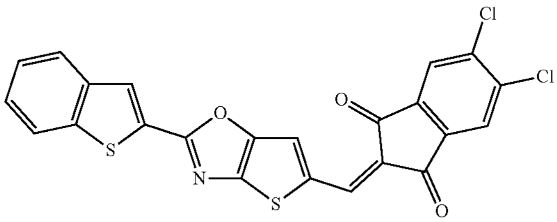
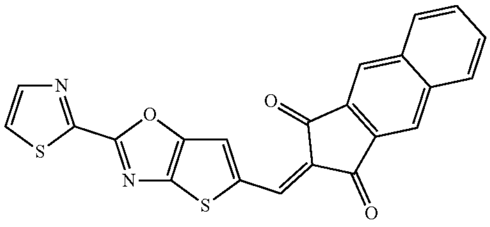
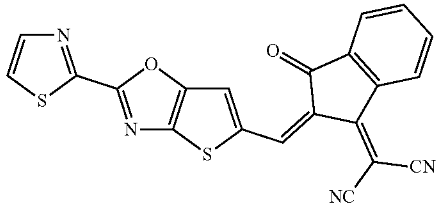

-continued
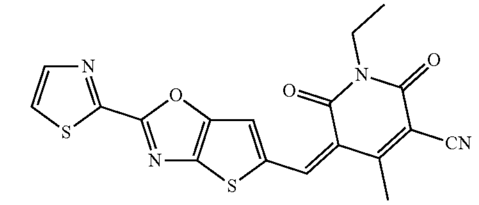
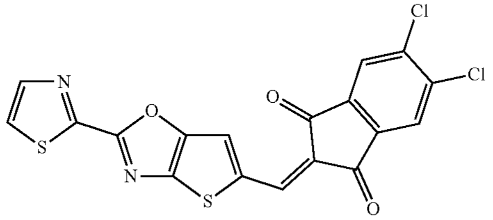
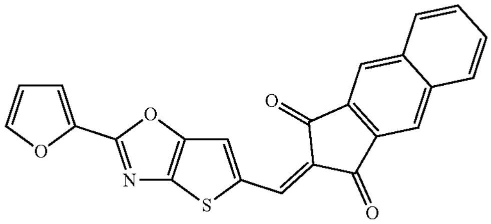
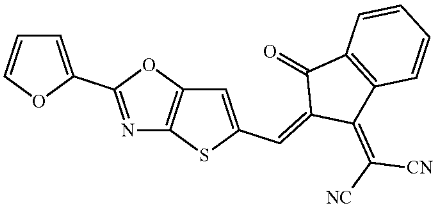
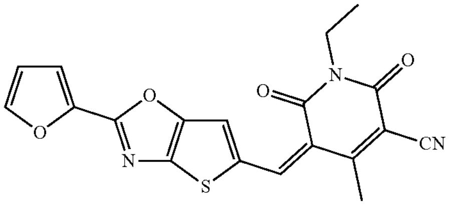
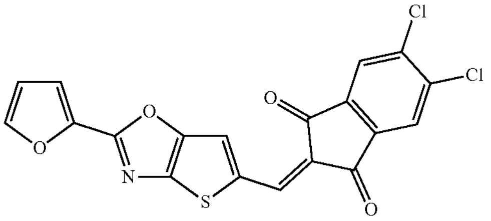
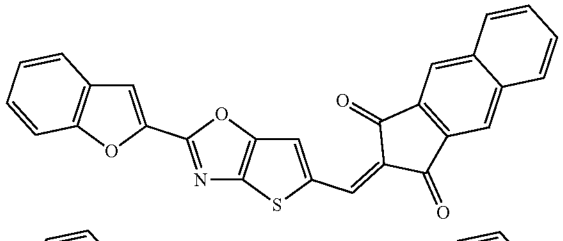
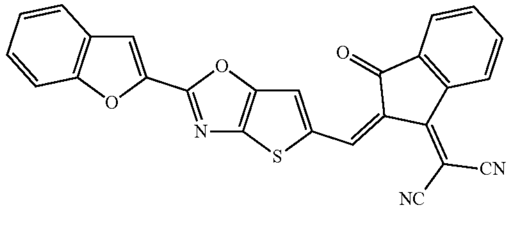
-continued
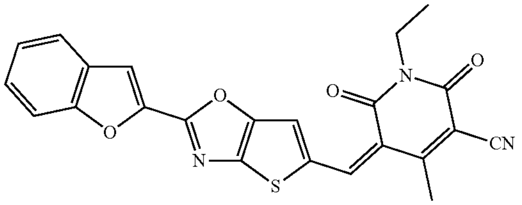
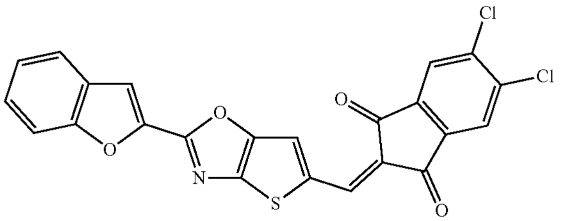
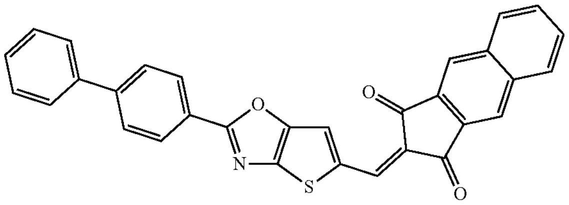
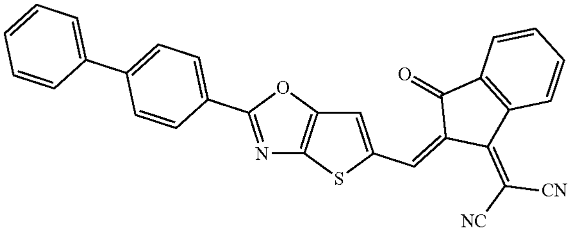
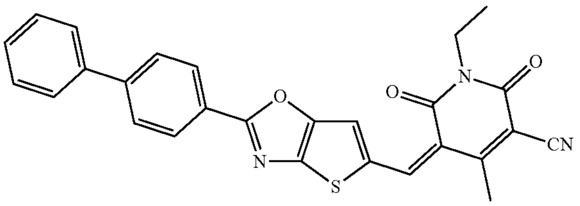
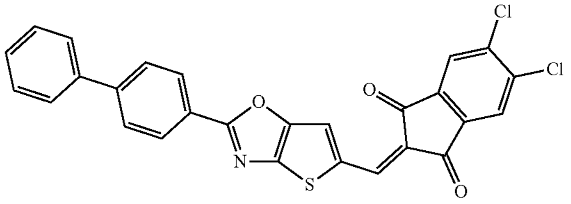
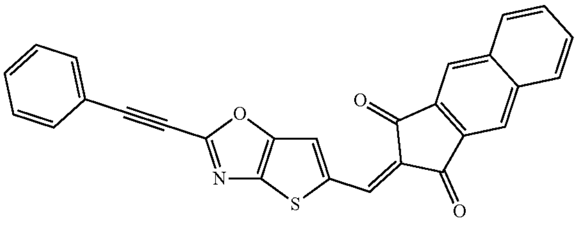
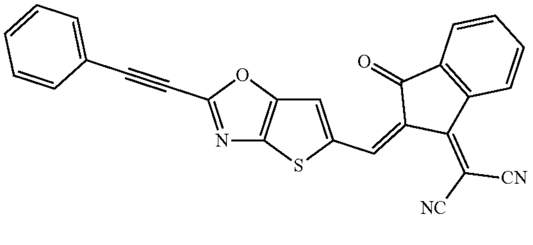

-continued
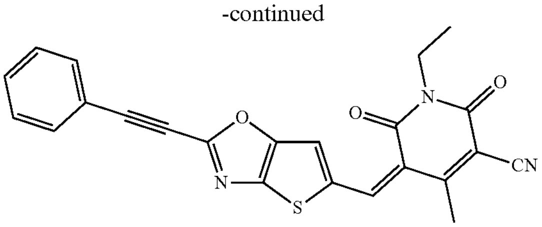
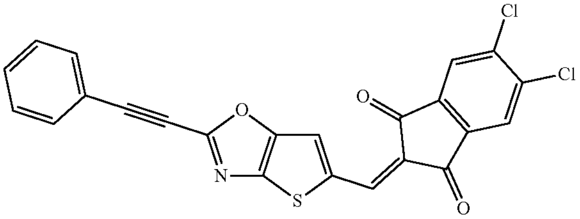
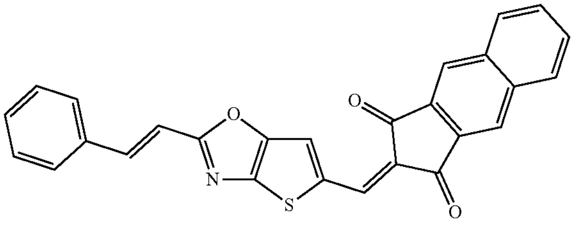
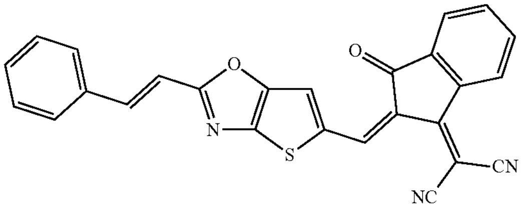
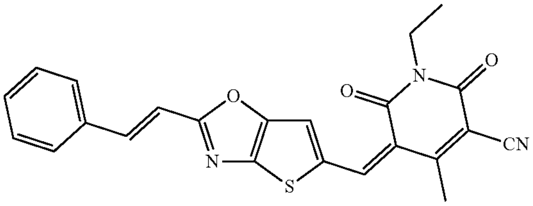
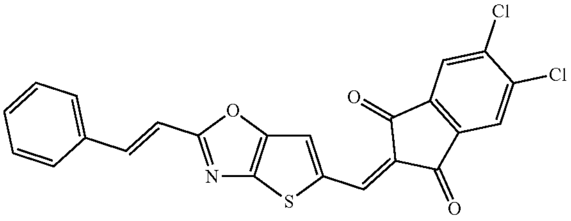
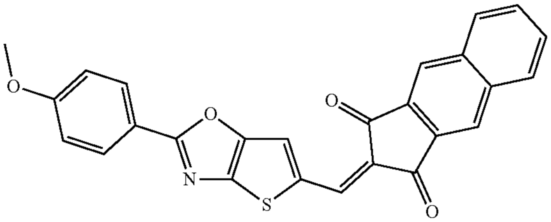
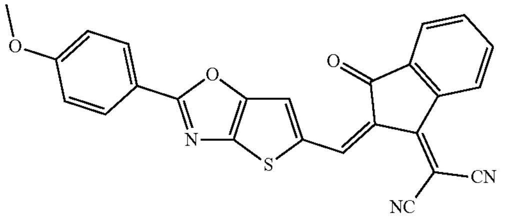
-continued
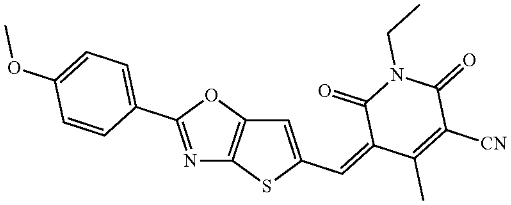
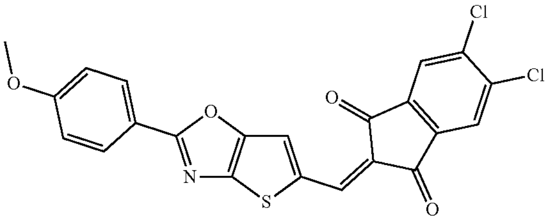
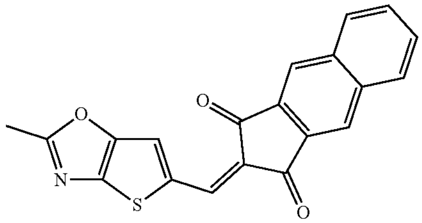
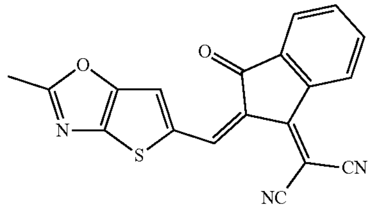
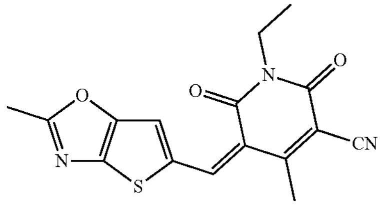
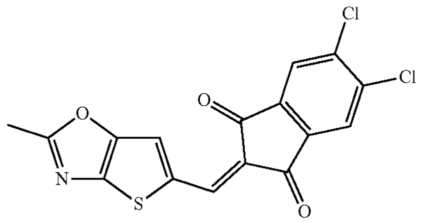
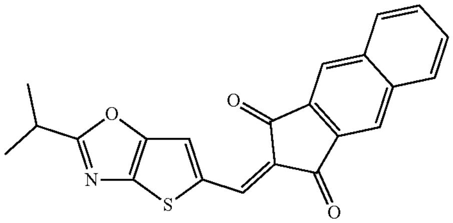
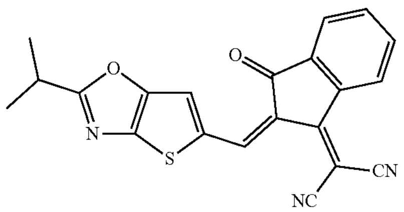

-continued
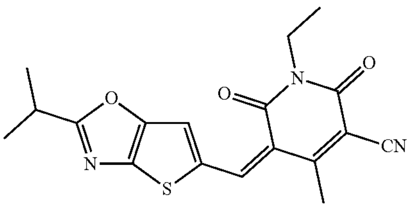
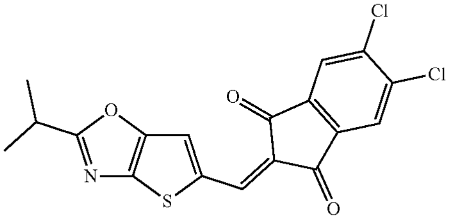
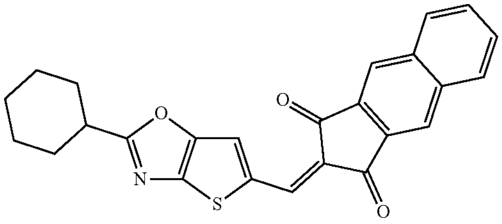
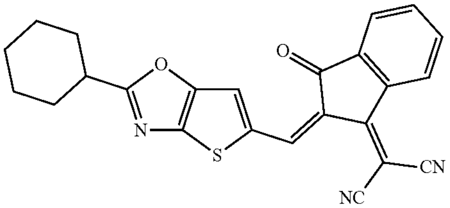
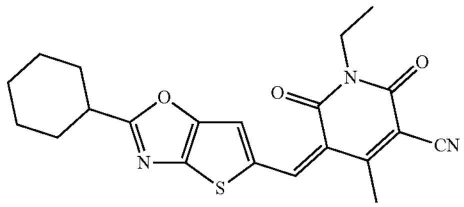
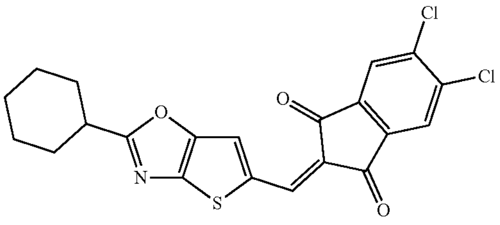
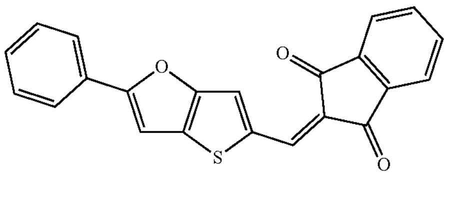
-continued
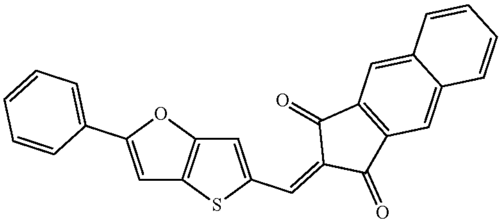
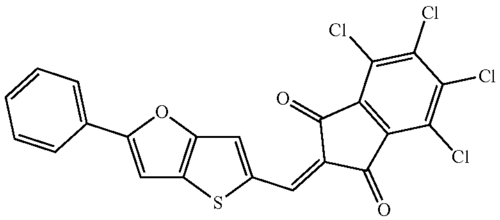
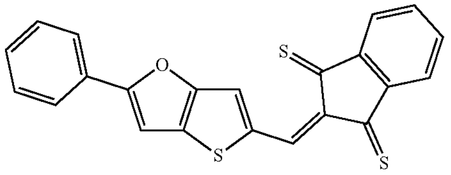
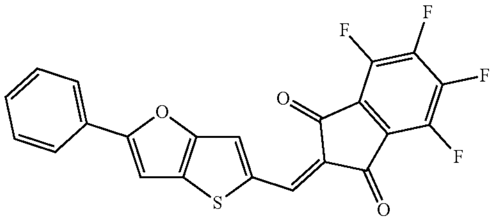
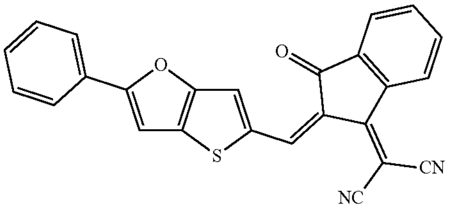
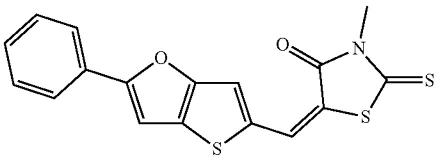
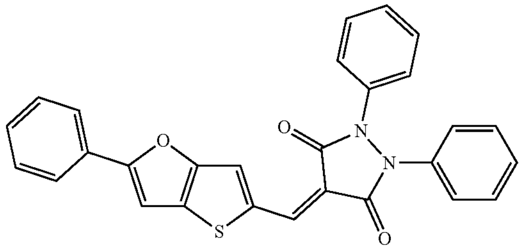
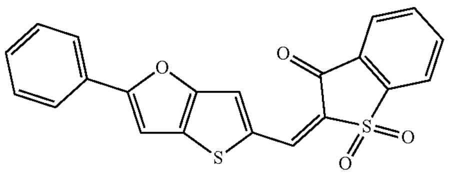

-continued
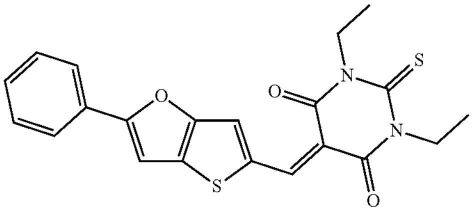
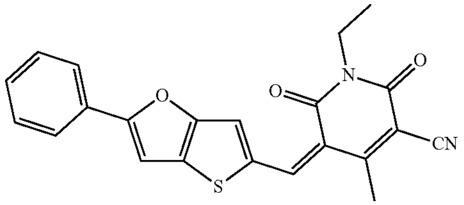
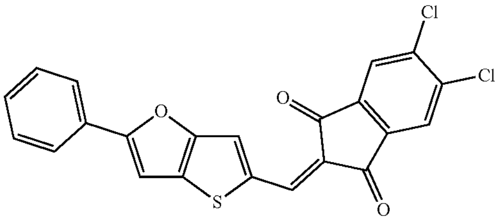
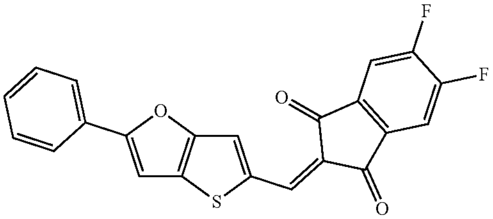
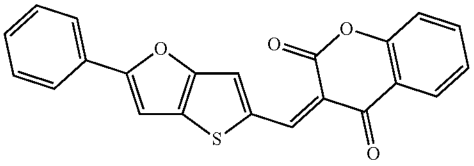
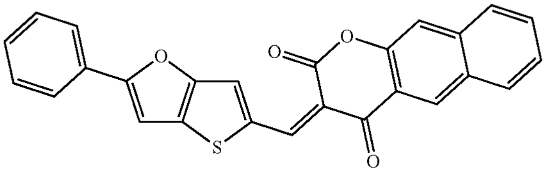
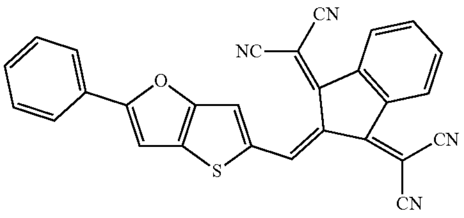
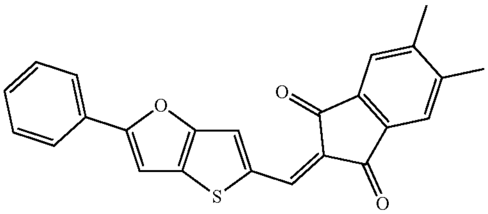
-continued
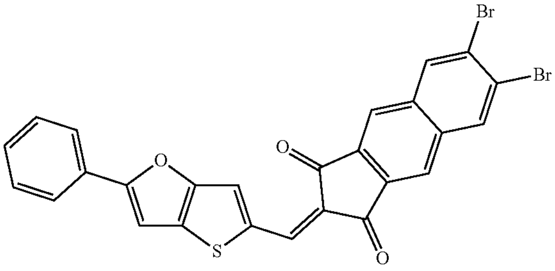
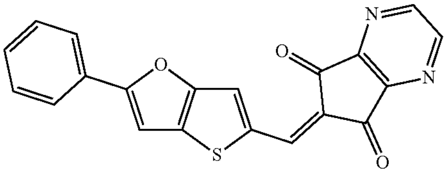
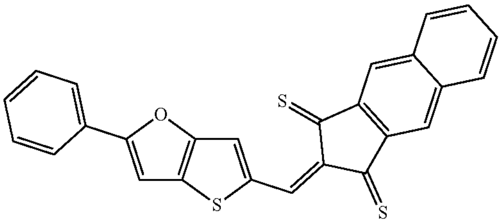
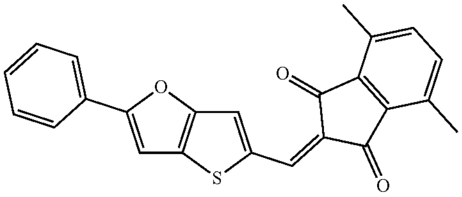
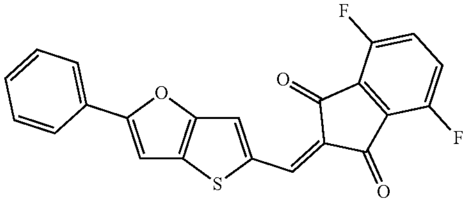
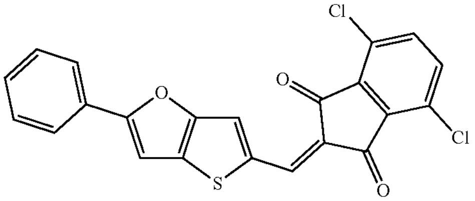
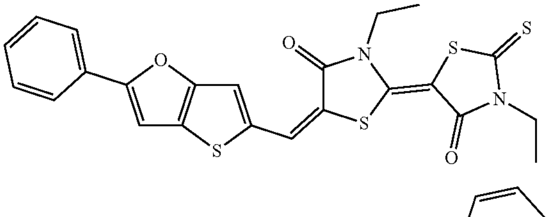
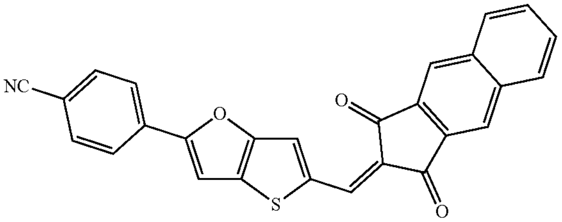

-continued
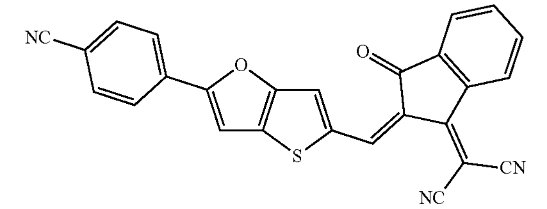
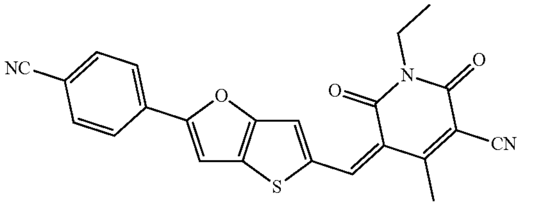
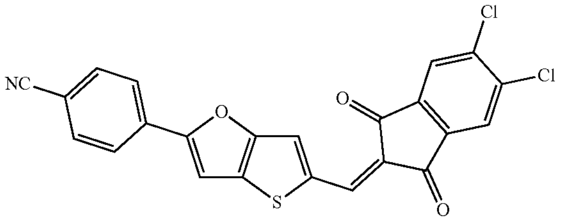
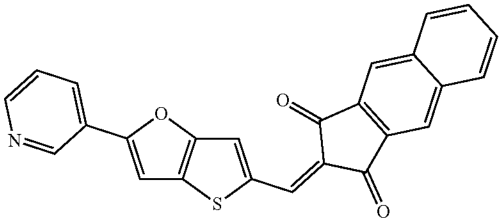
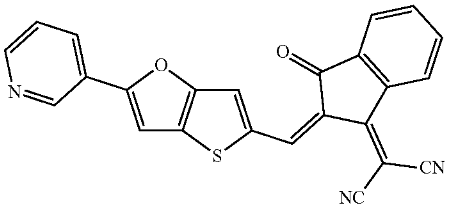
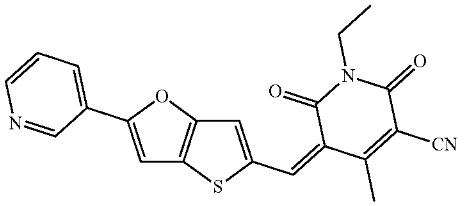
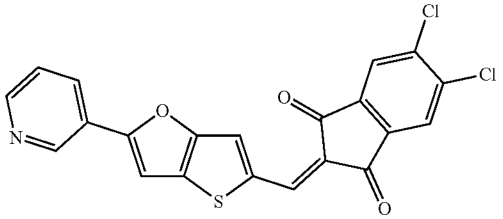
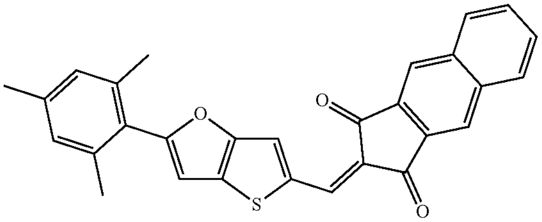
-continued
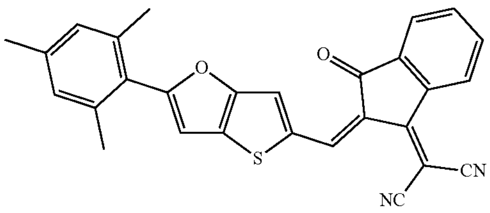
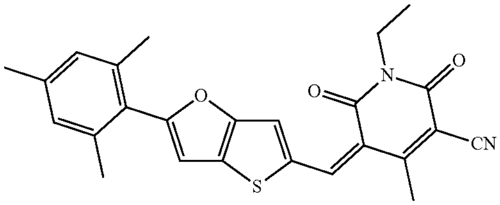
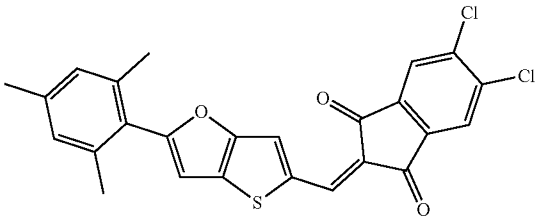
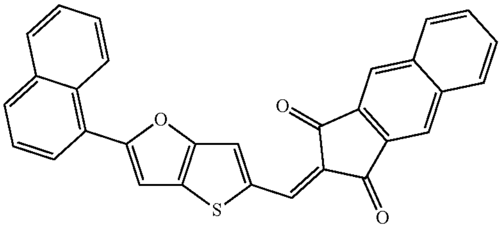
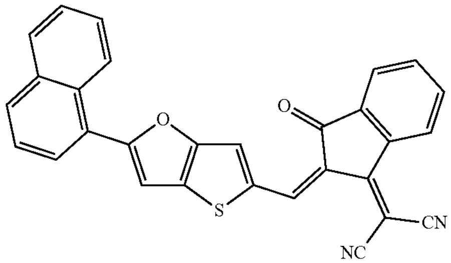
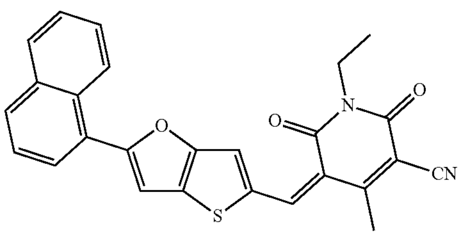
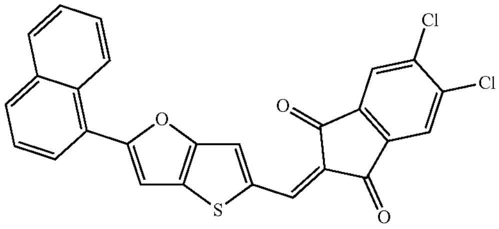

-continued
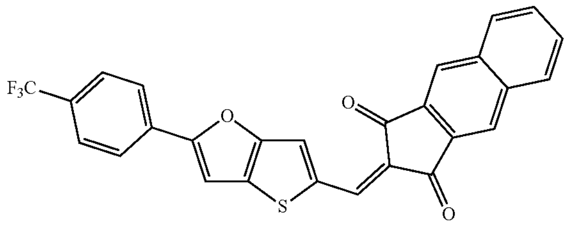
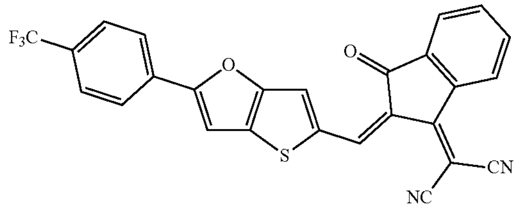
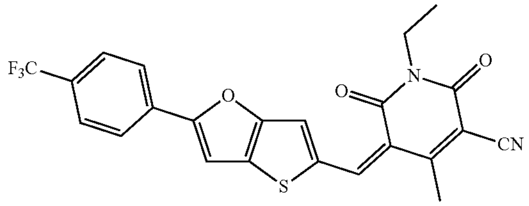
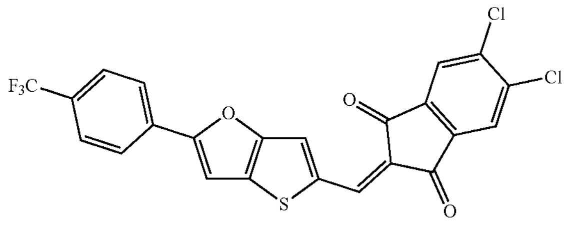
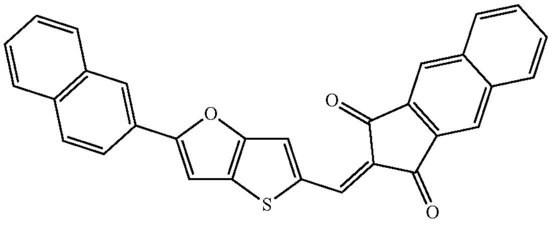
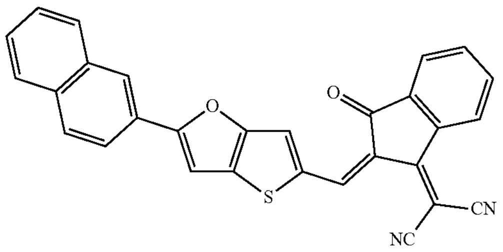
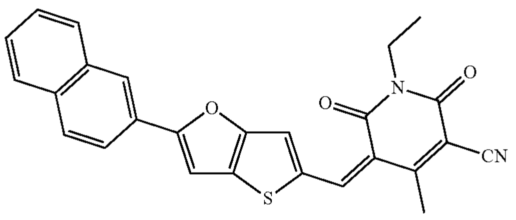
-continued
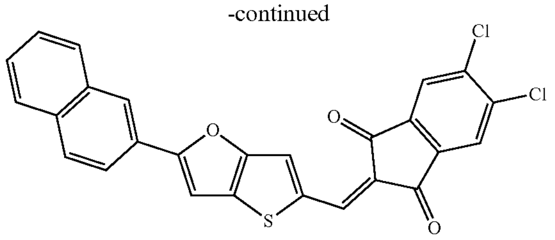
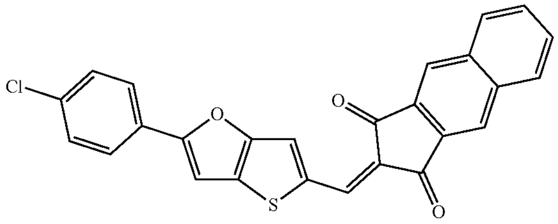
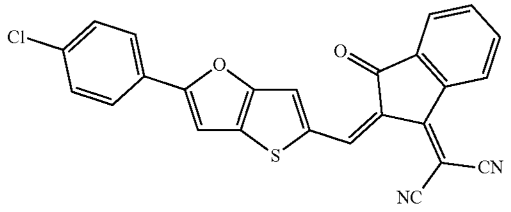
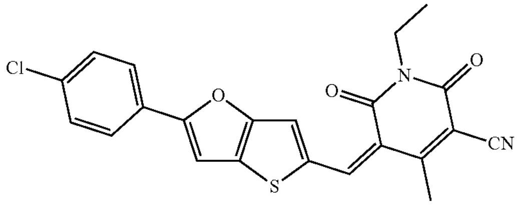
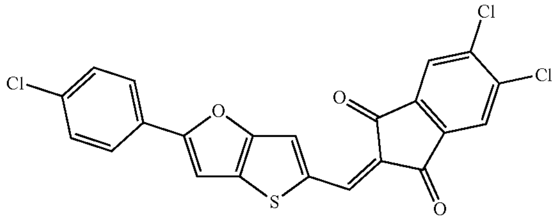
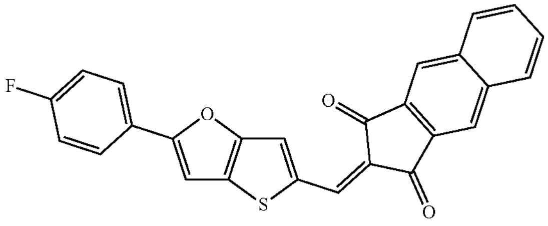
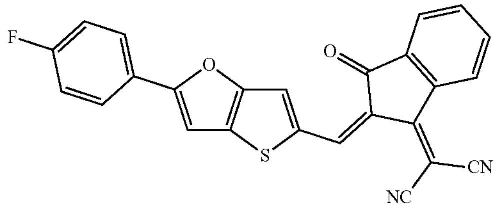
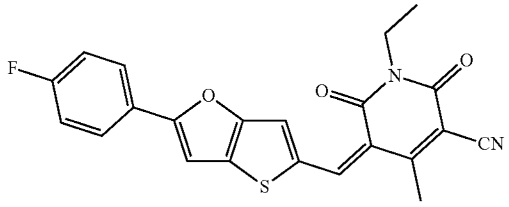

-continued
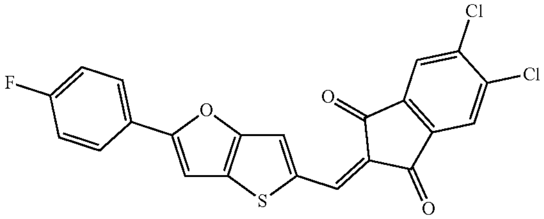
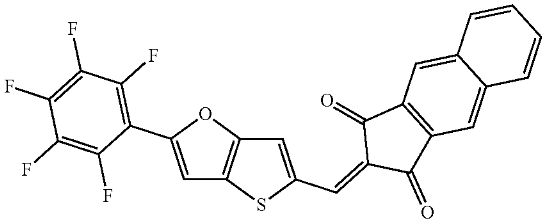
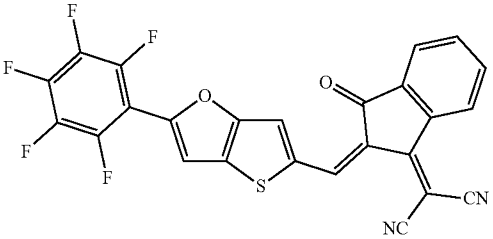
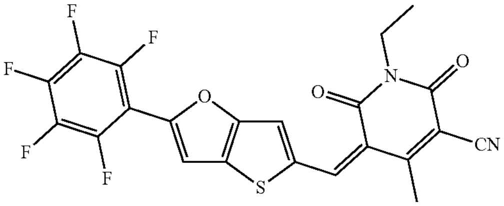
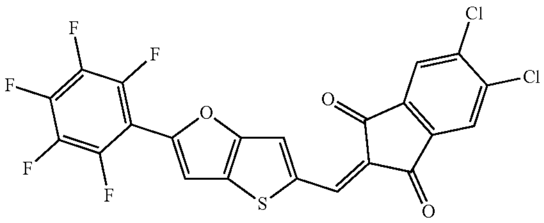
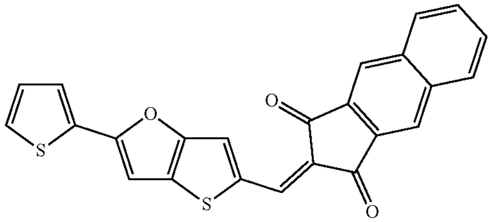
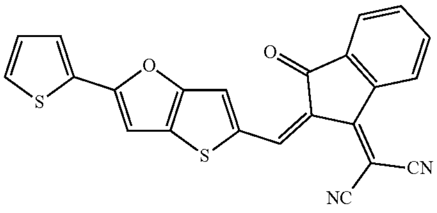
-continued
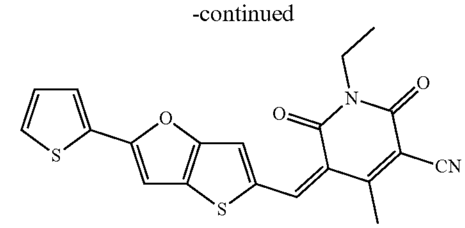
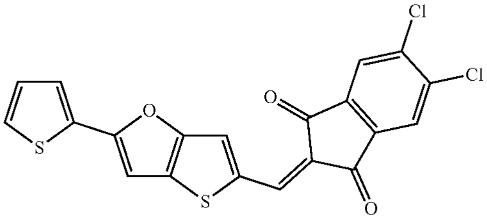
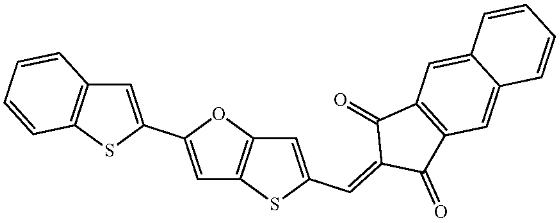
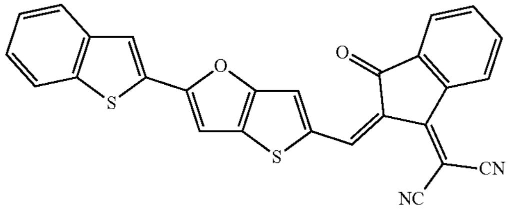
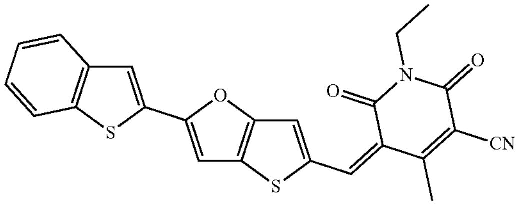
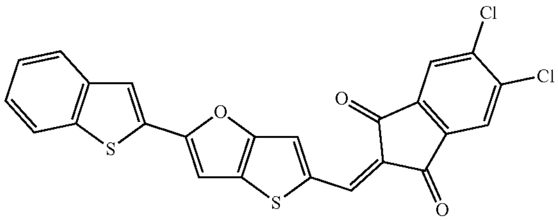
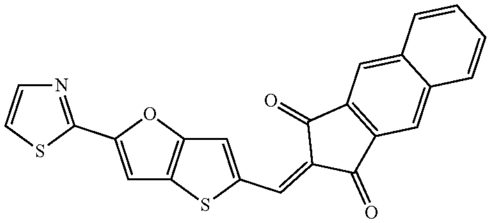
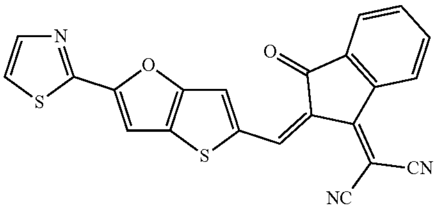

-continued
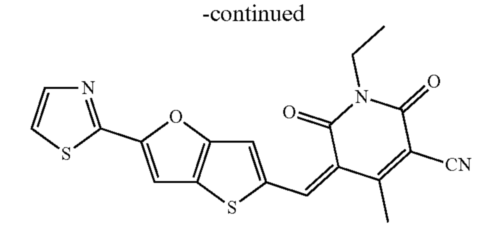
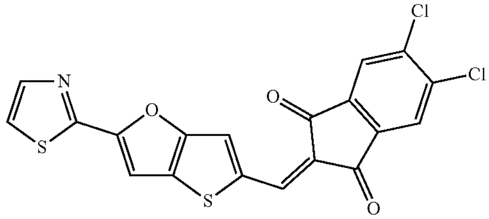
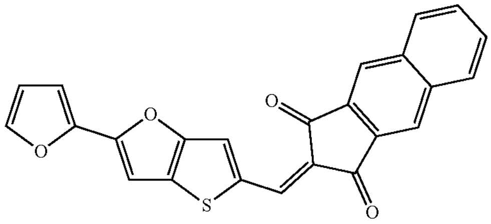
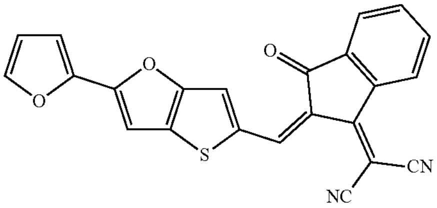
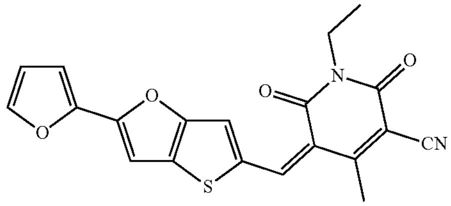
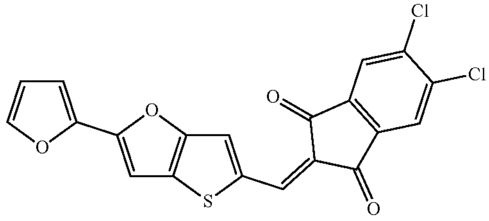
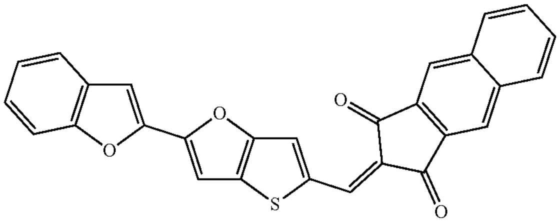
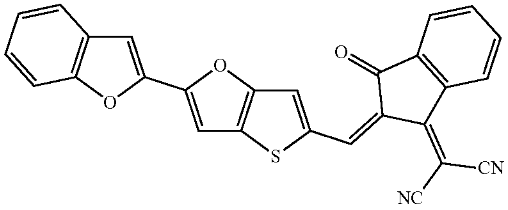
-continued
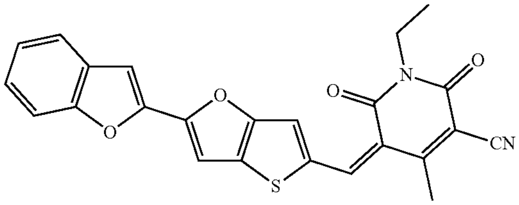
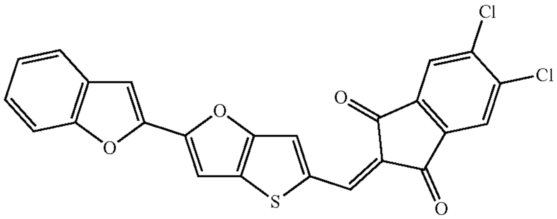
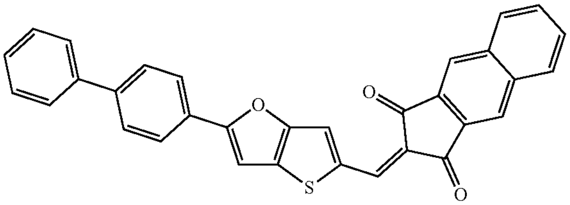
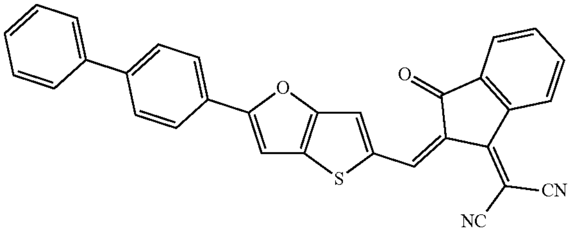
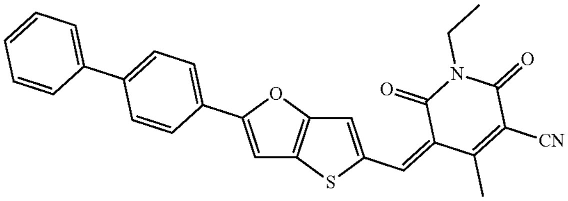
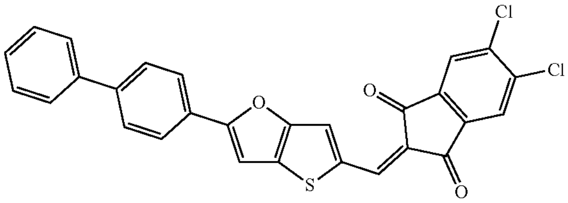
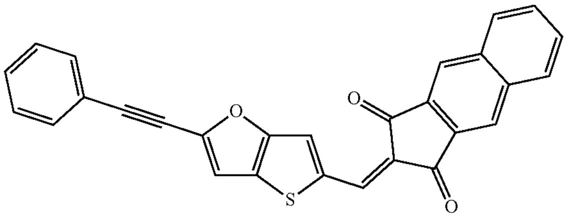
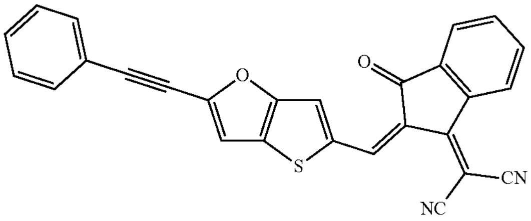

-continued
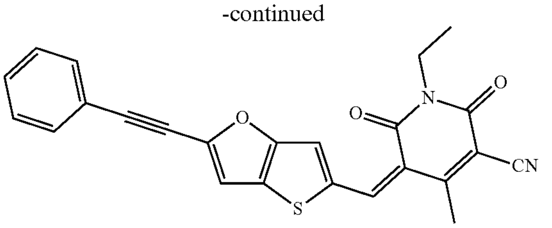
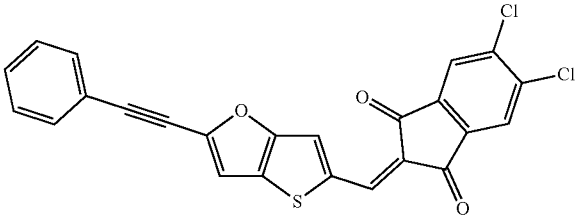
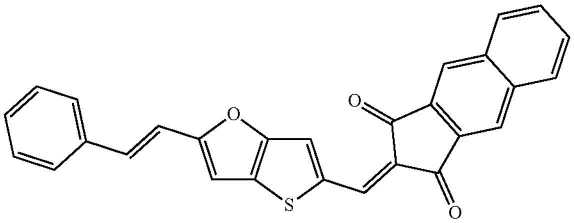
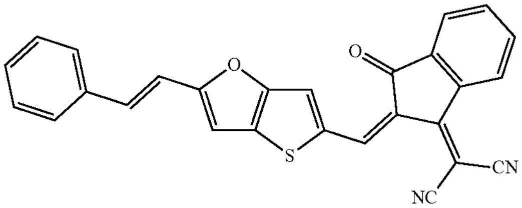
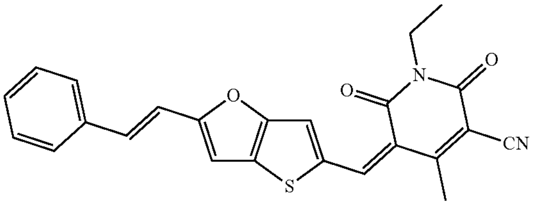
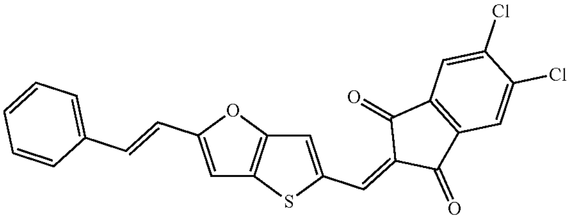
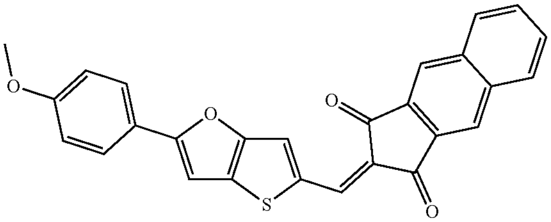
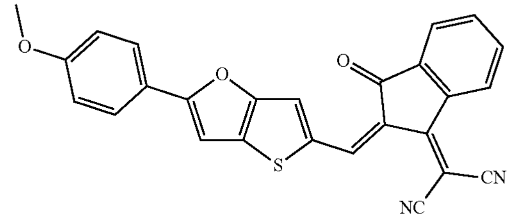
-continued
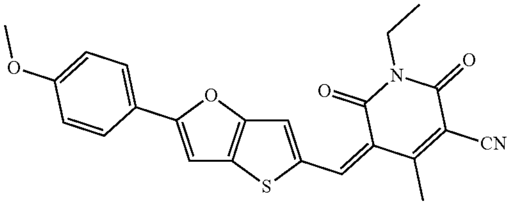
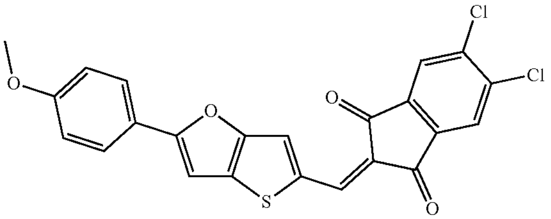
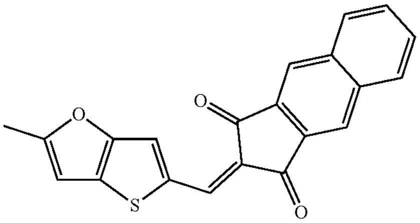
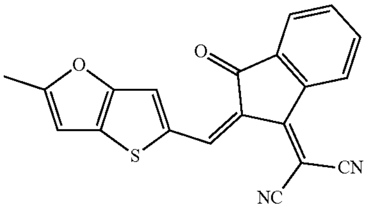
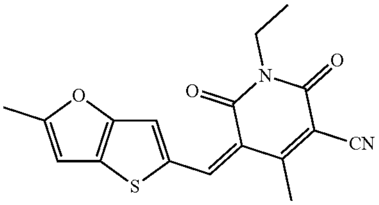
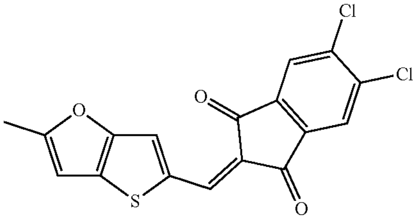
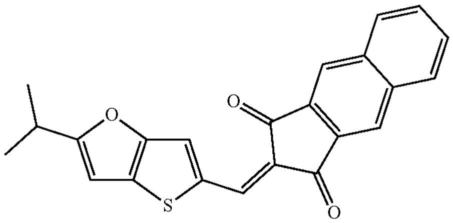
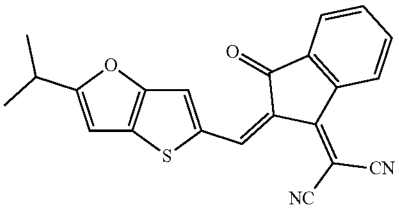

-continued
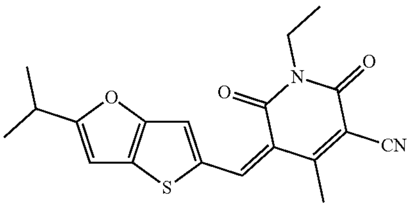
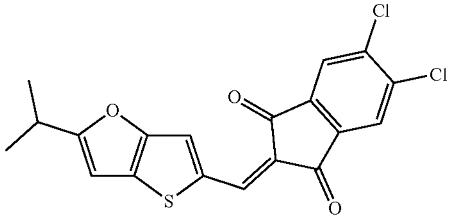
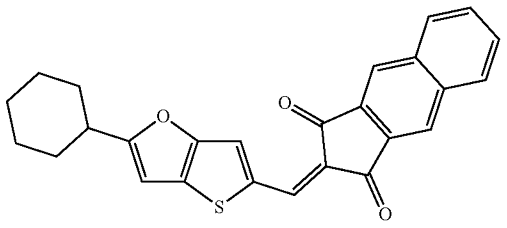
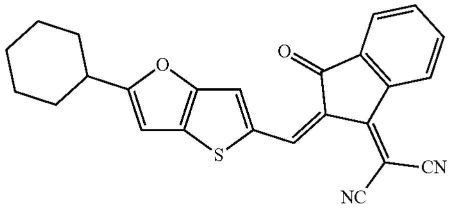
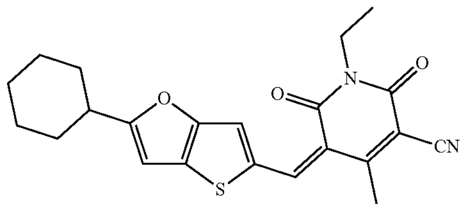
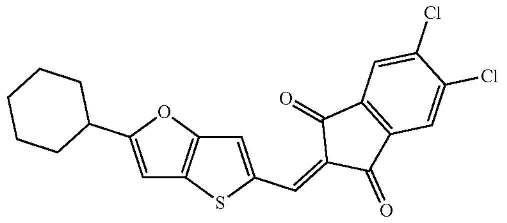
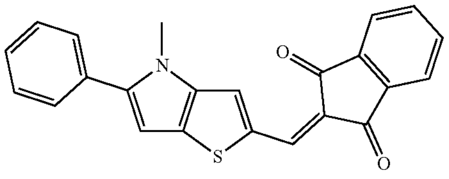
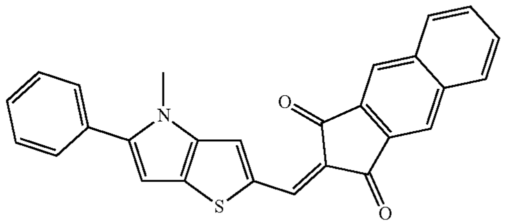
-continued
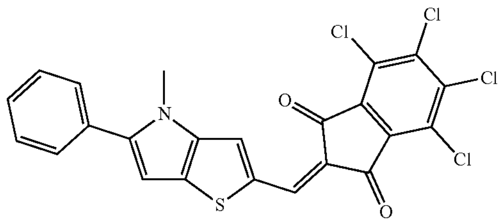
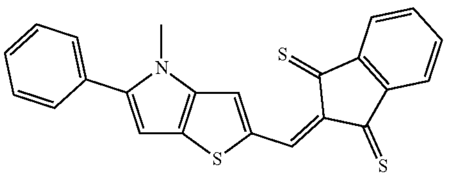
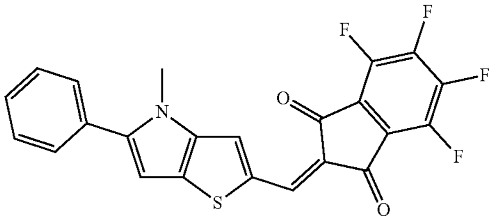
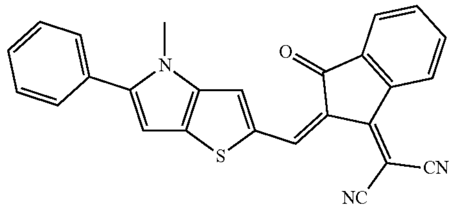
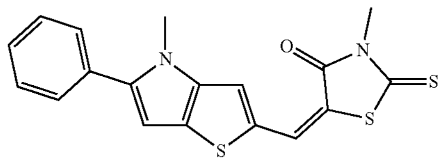
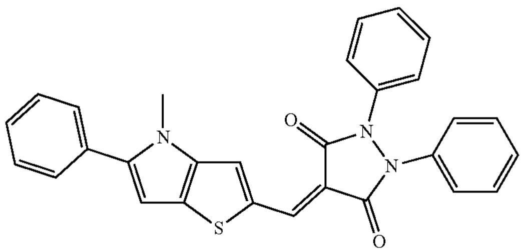
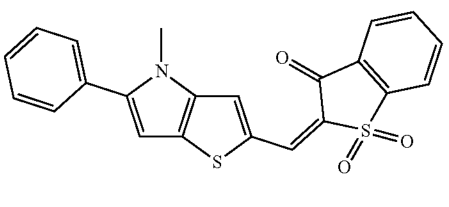
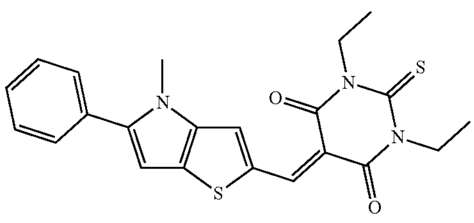

-continued
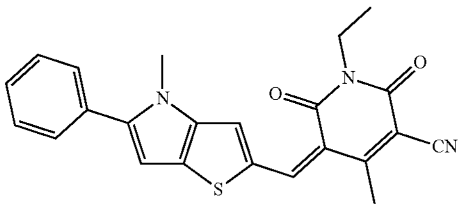
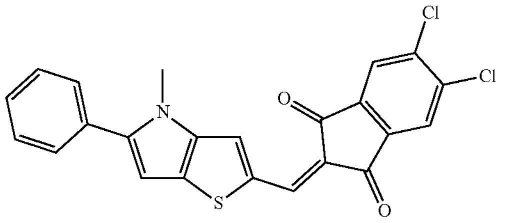
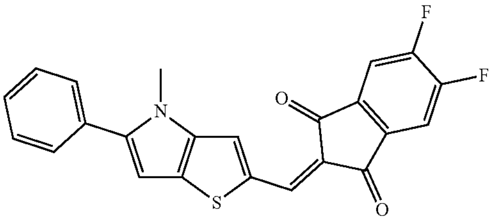
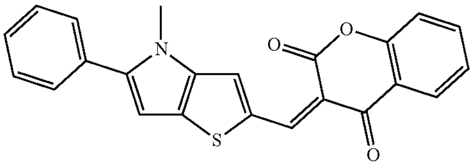
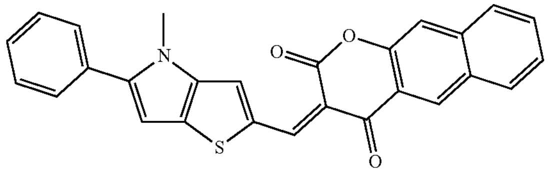
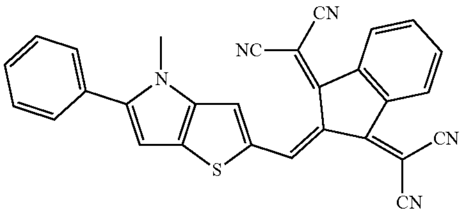
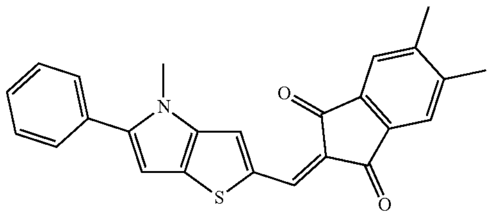
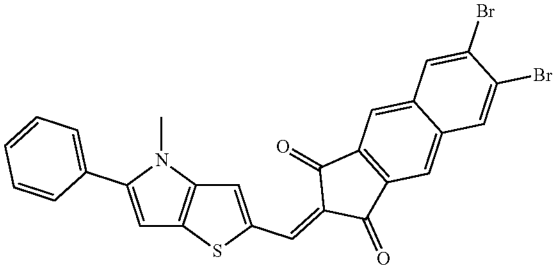
-continued
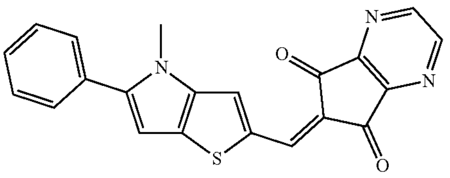
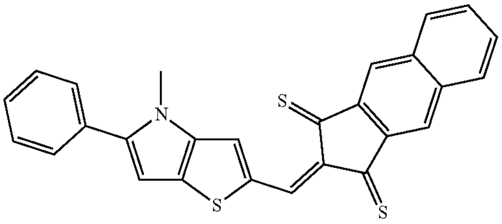
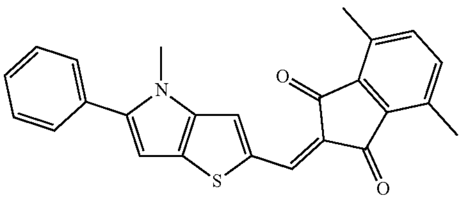
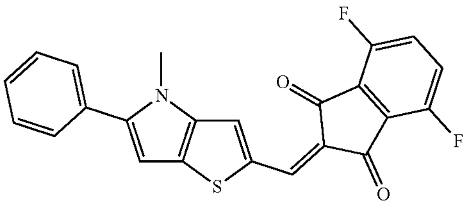
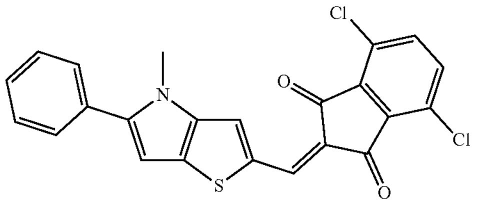
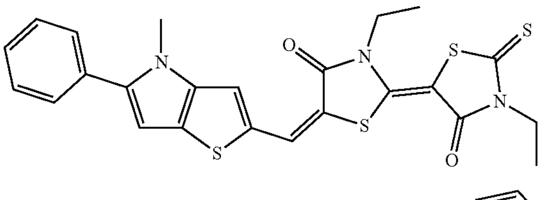
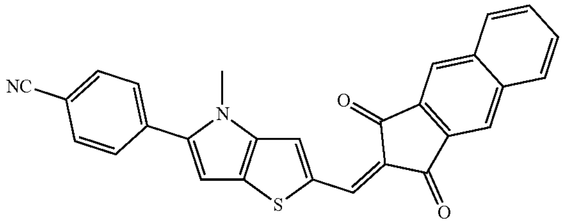
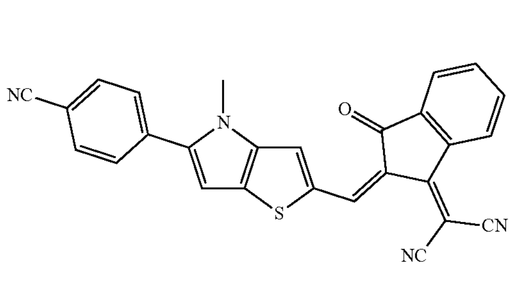

-continued
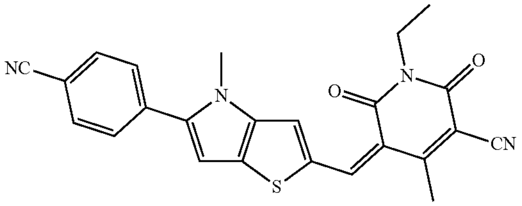
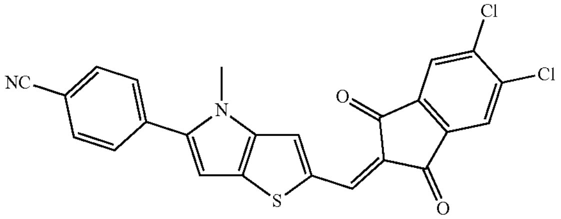
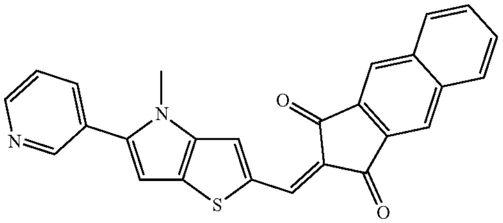
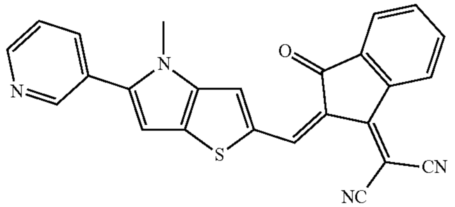
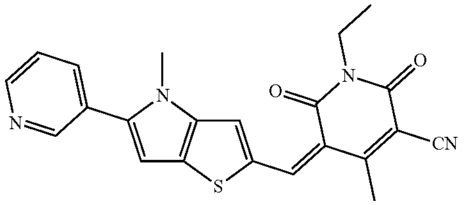
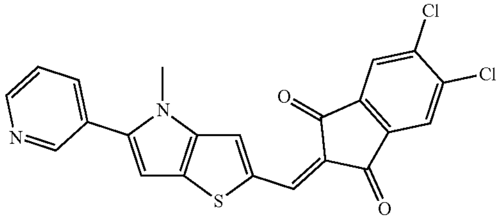
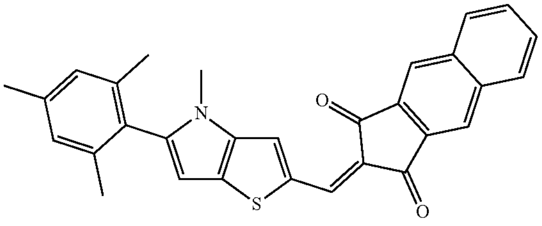
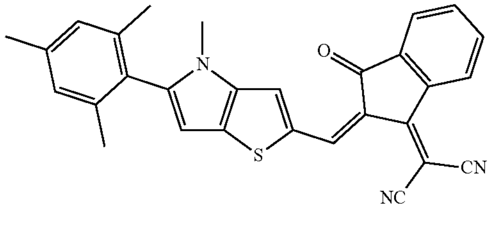
-continued
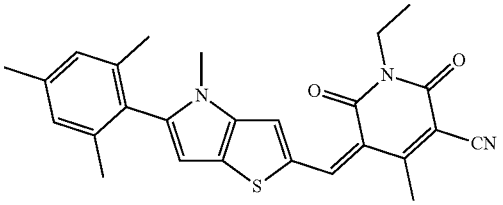
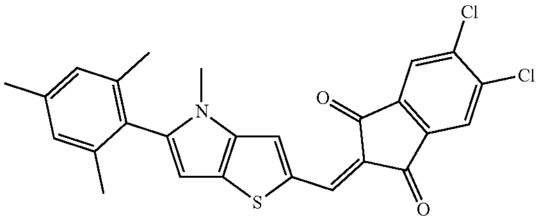
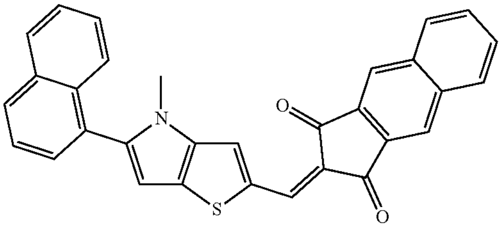
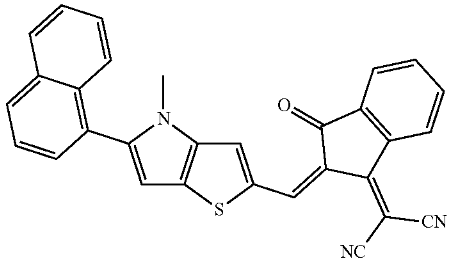
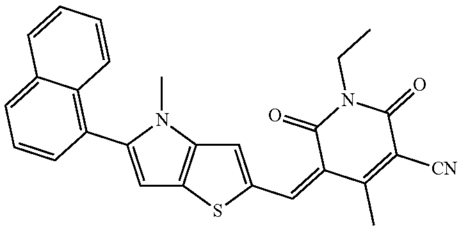
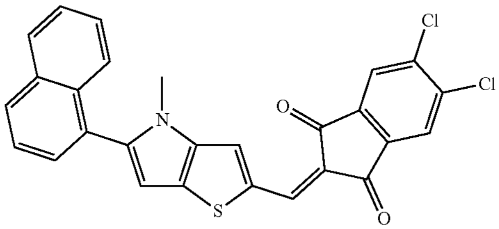
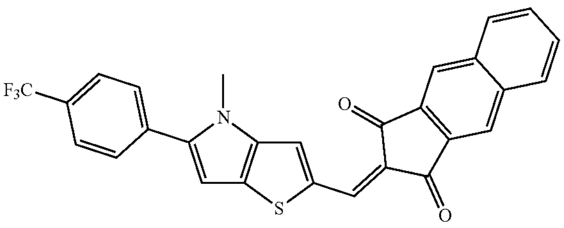

-continued
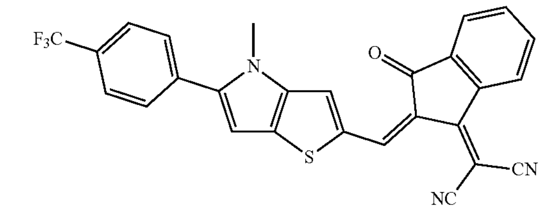
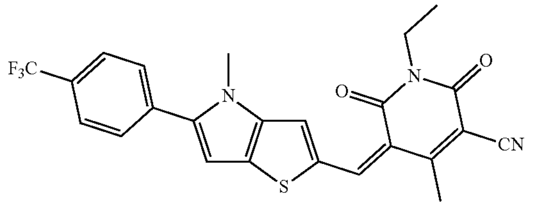
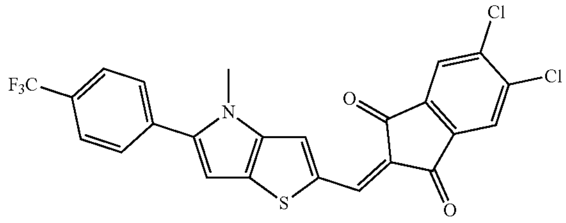
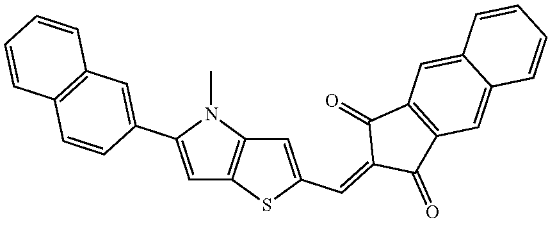
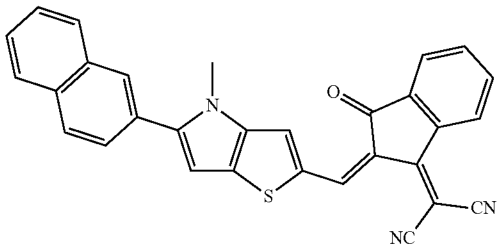
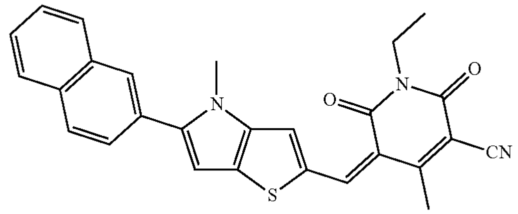
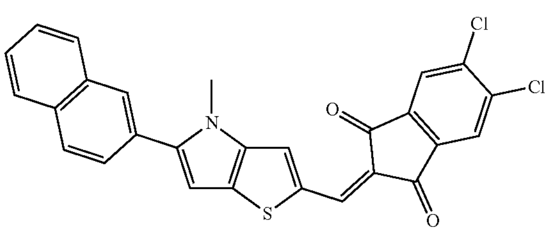
-continued
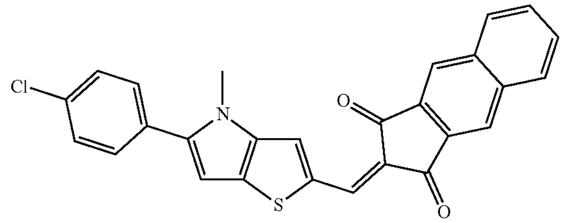
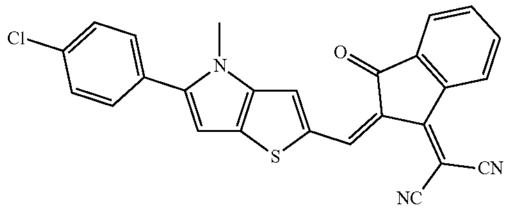
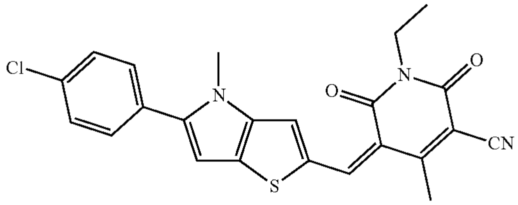
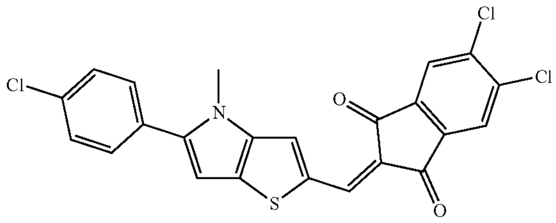
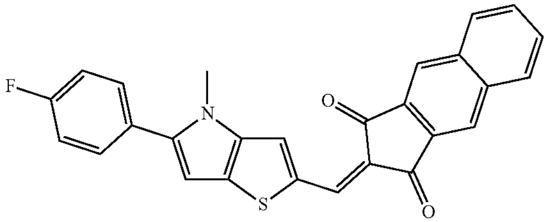
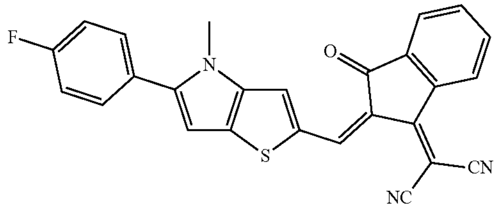
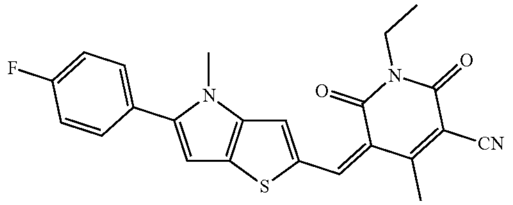
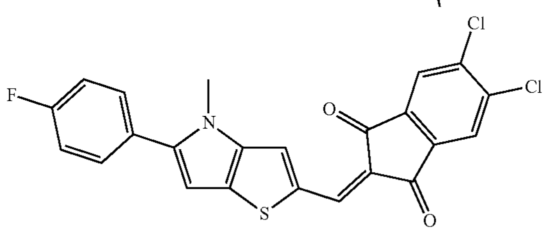

-continued
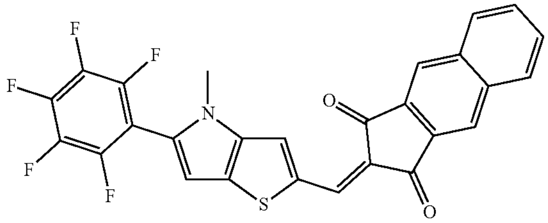
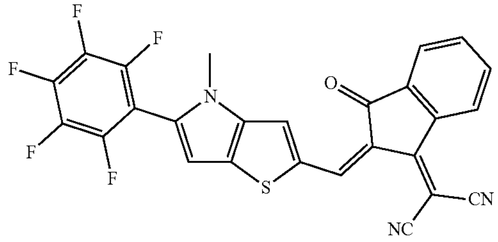
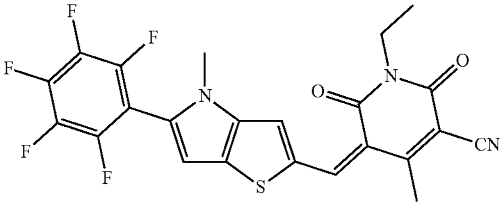
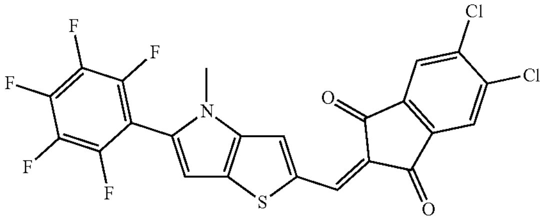
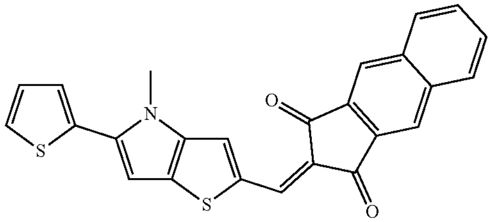
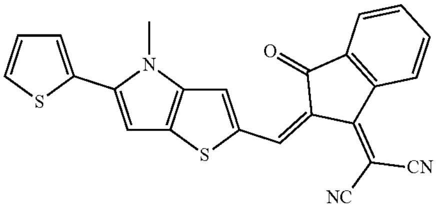
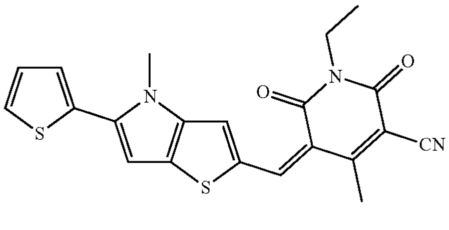
-continued
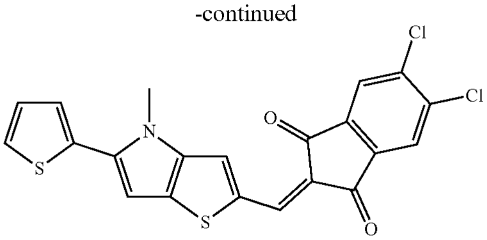
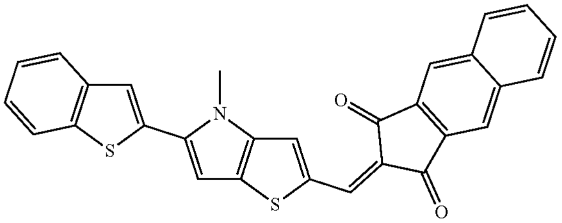
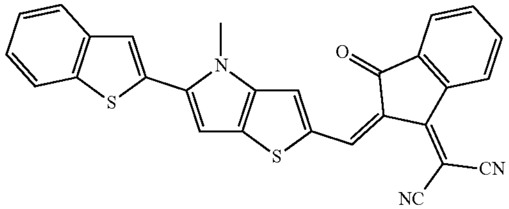
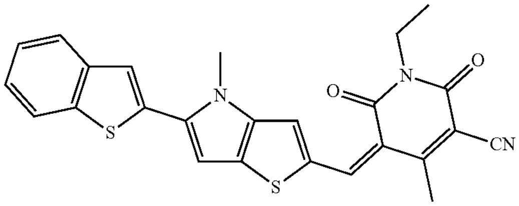
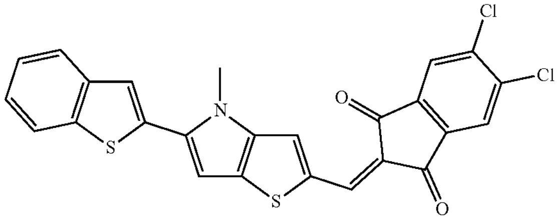
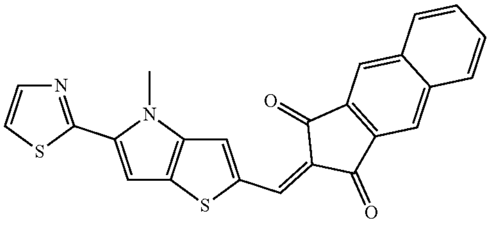
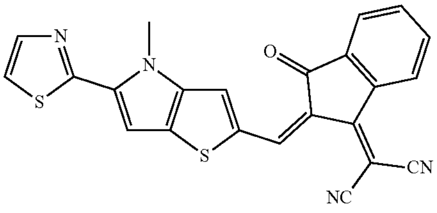
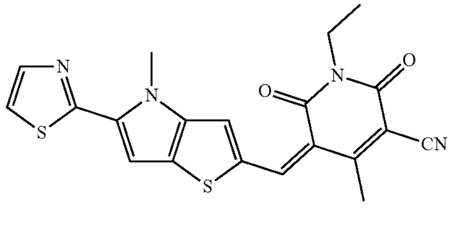

-continued
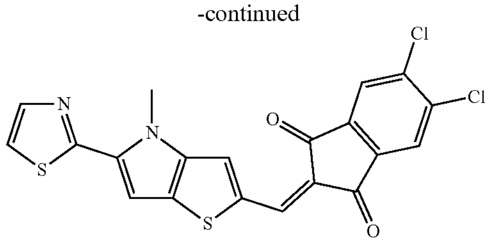
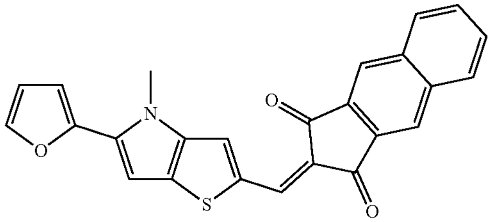
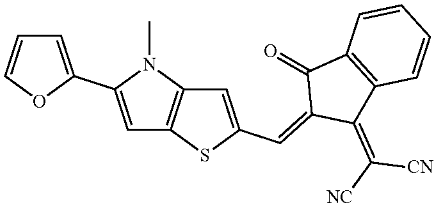
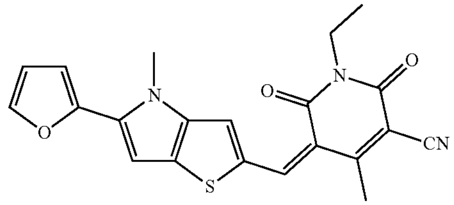
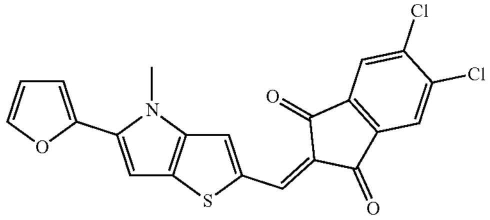
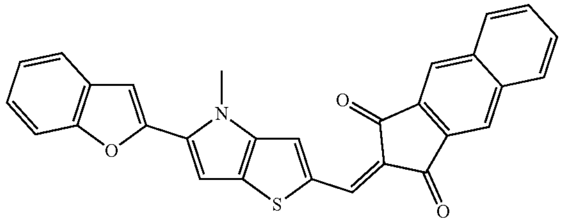
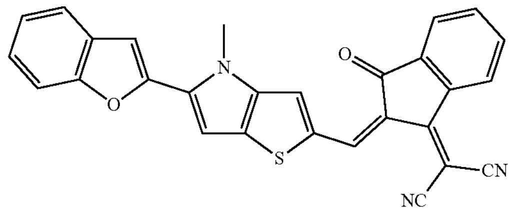
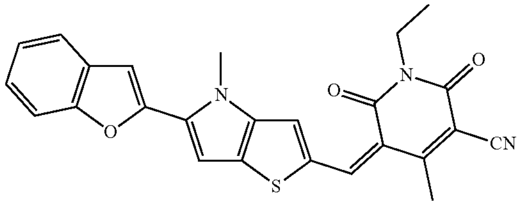
-continued
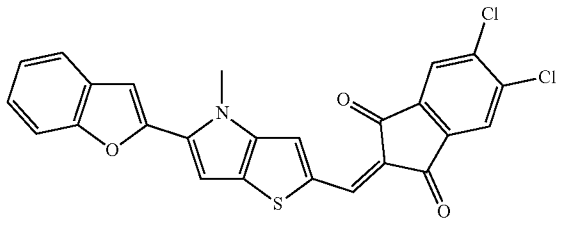
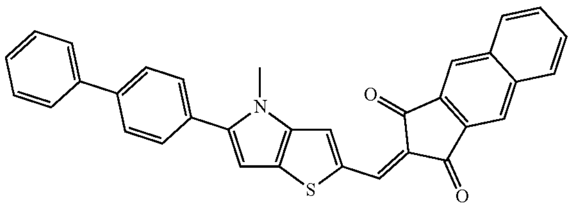
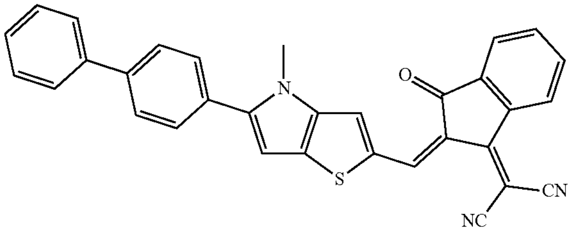
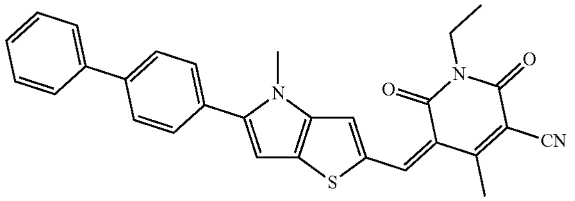
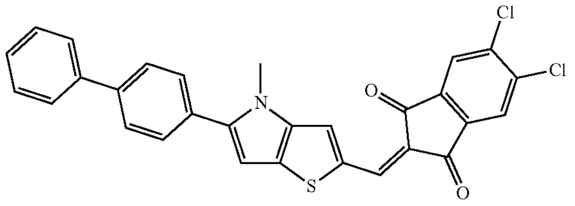
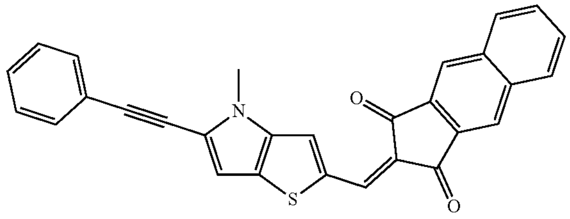
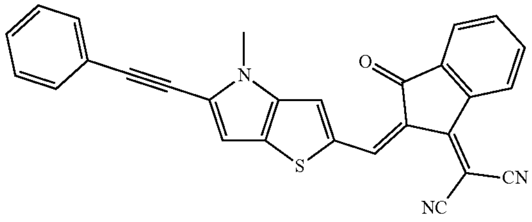
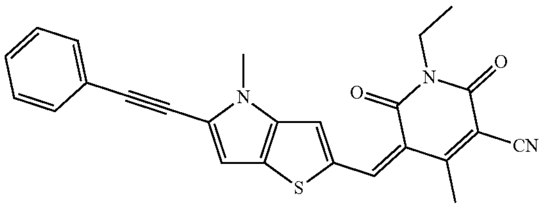

-continued
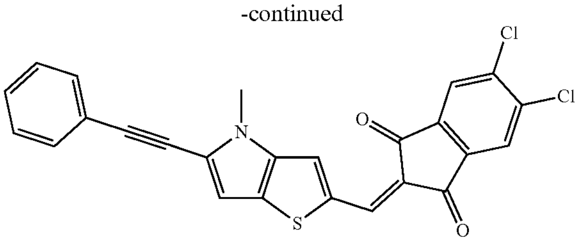
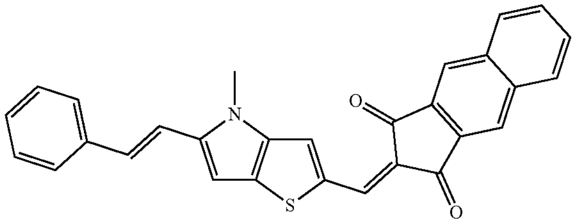
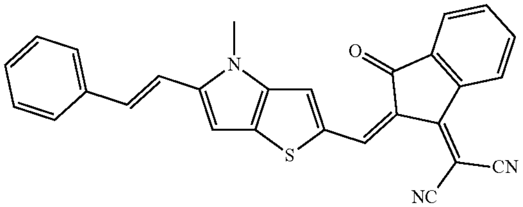
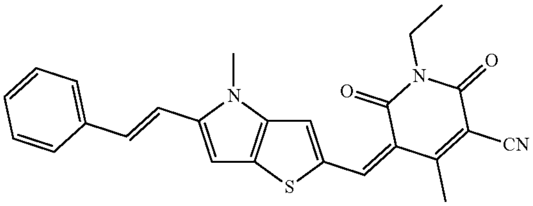
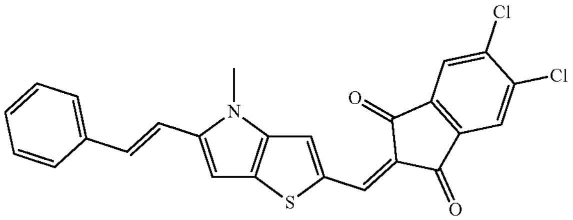
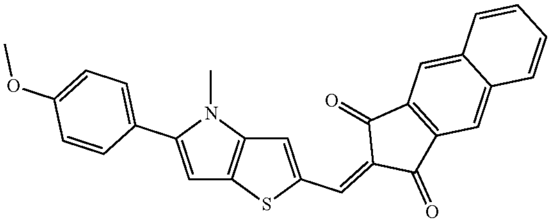
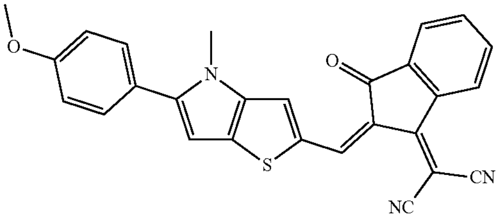
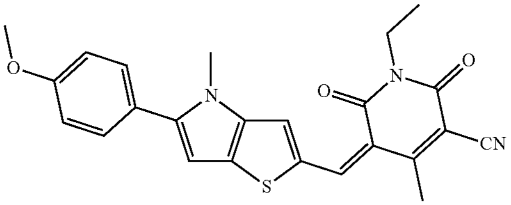
-continued
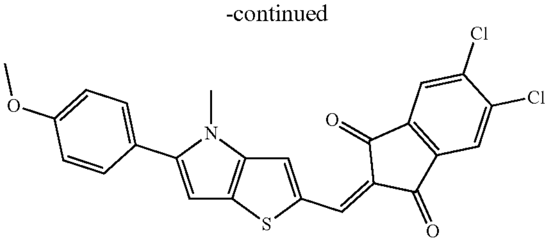
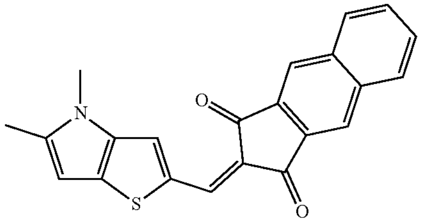
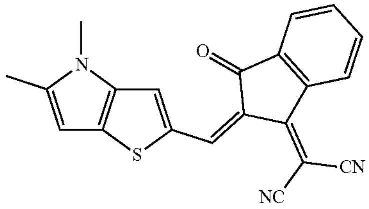
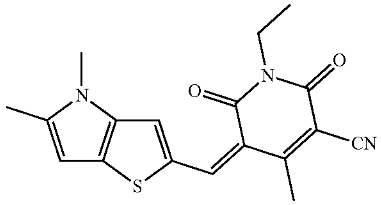
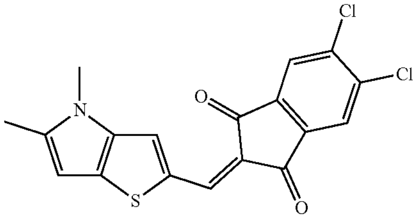
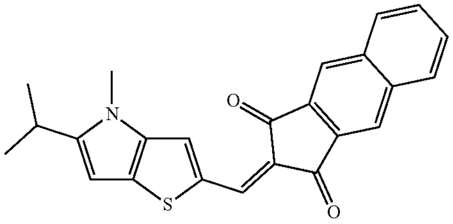
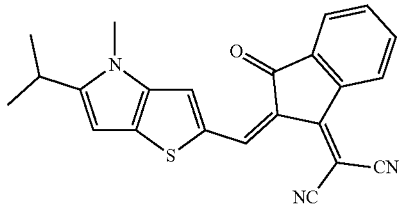
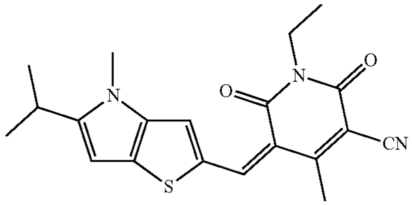

-continued
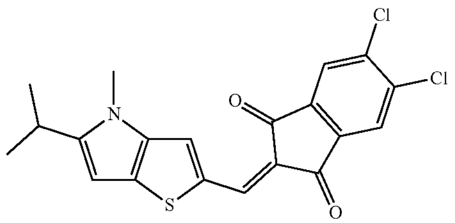
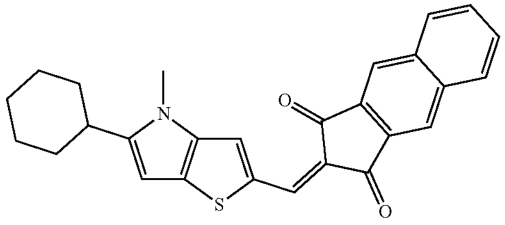
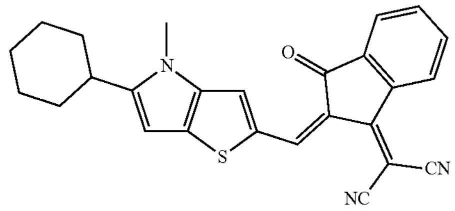
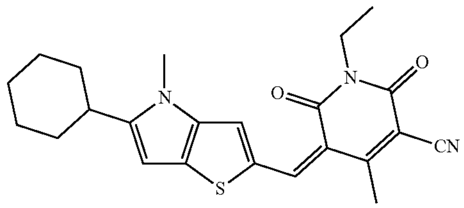
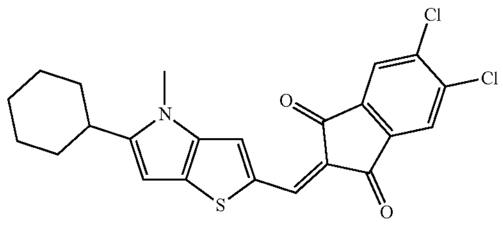
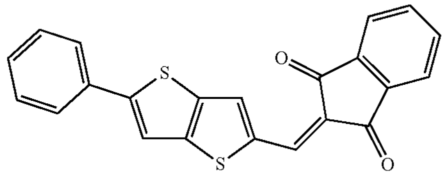
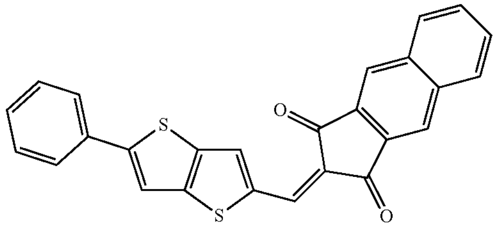
-continued
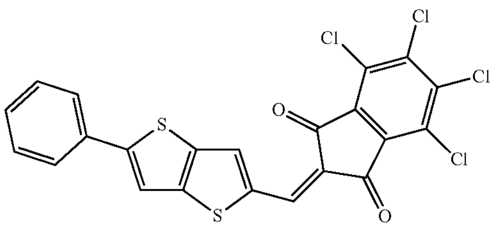
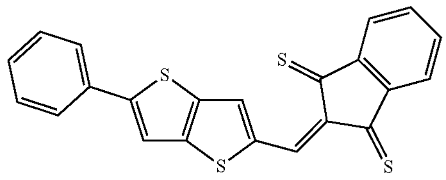
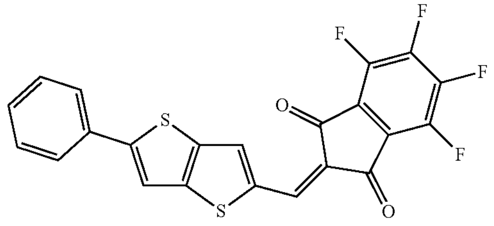
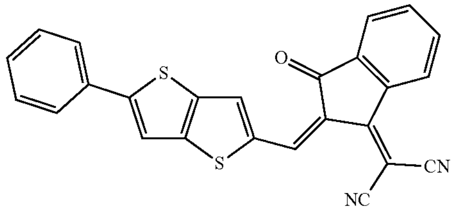
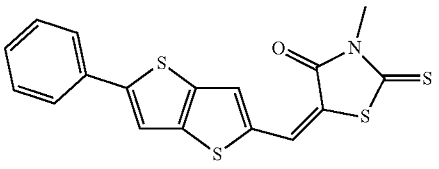
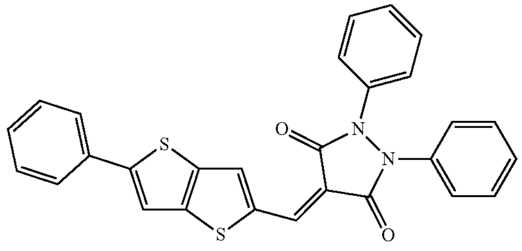
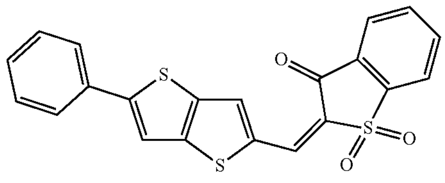
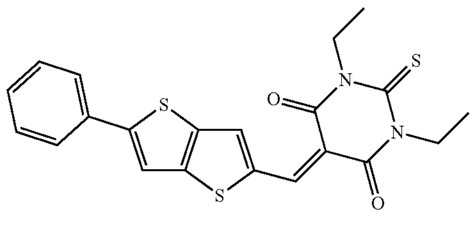

-continued
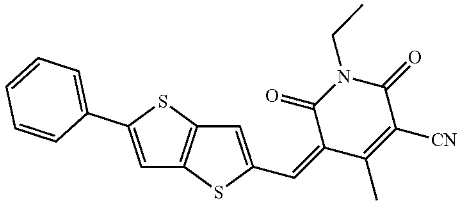
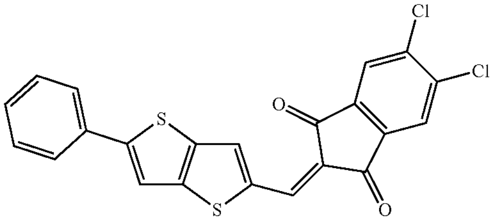
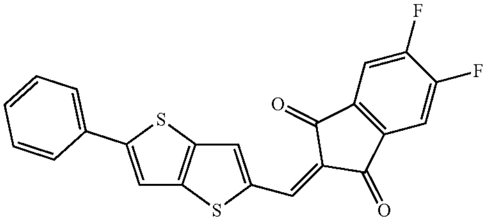
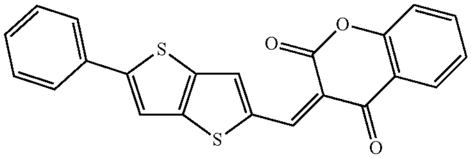
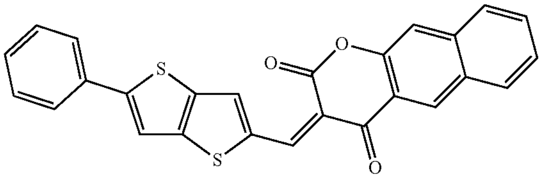
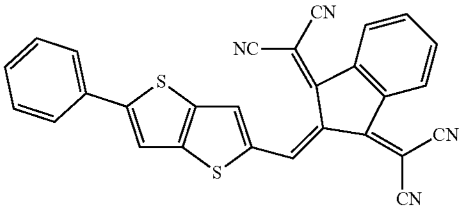
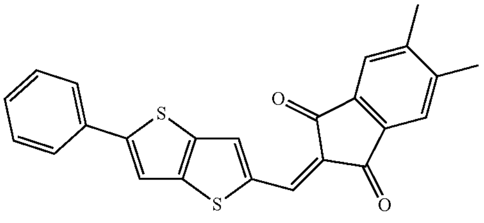
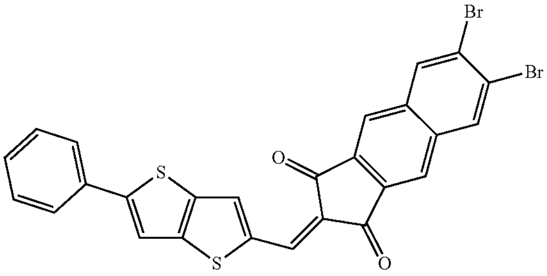
-continued
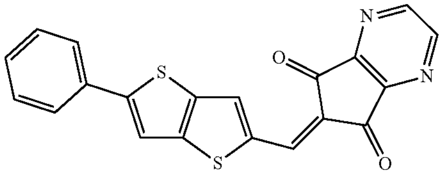
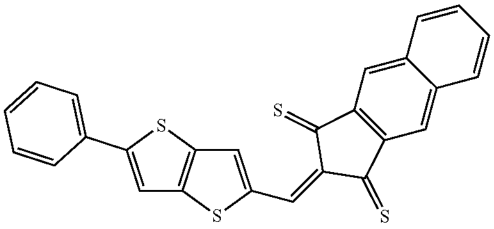
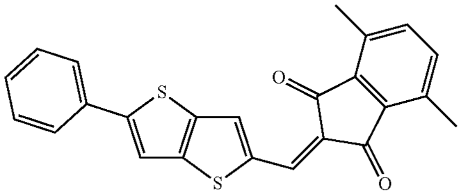
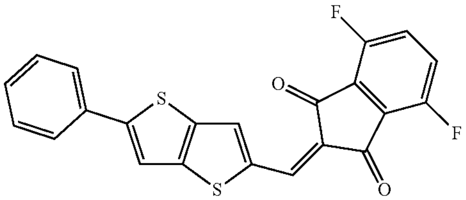
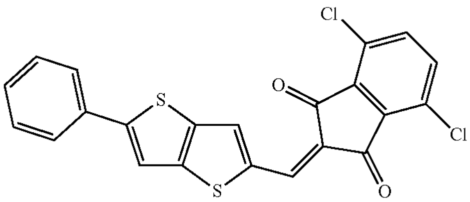
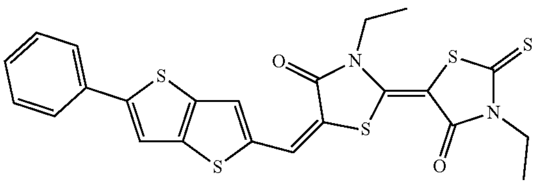
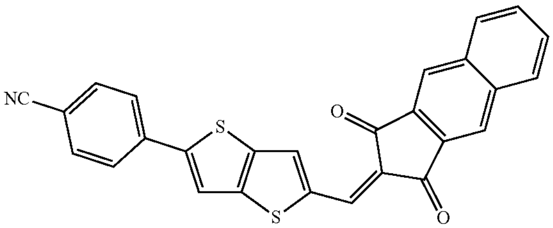
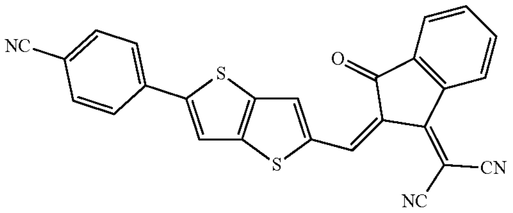

-continued
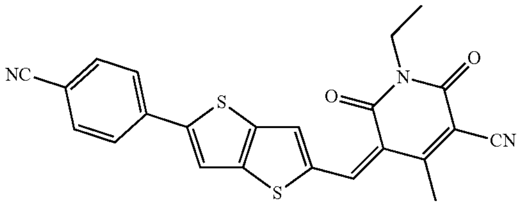
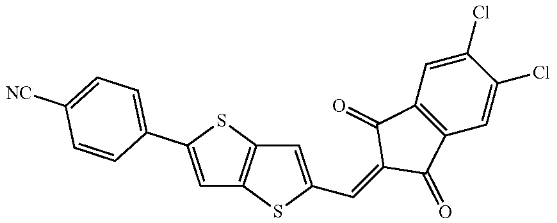
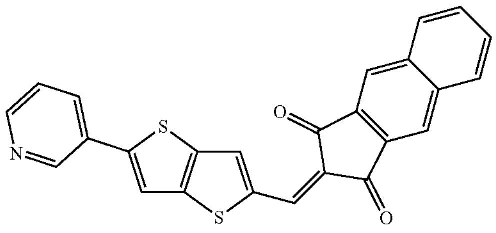
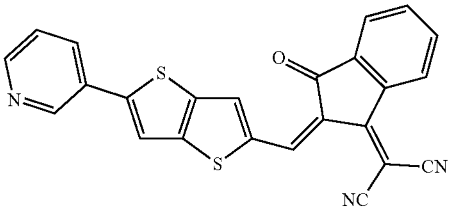
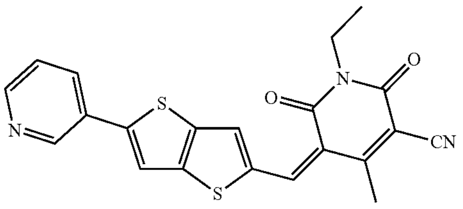
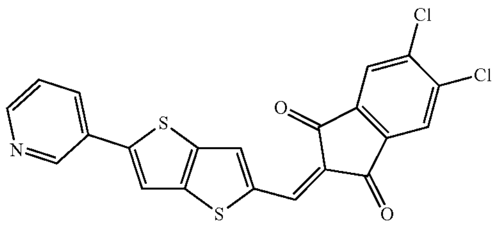
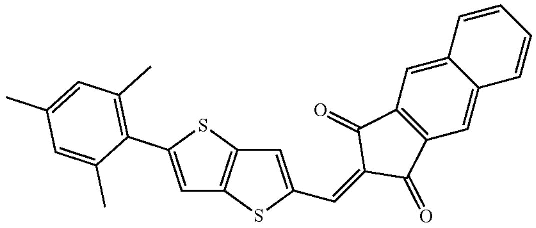
-continued
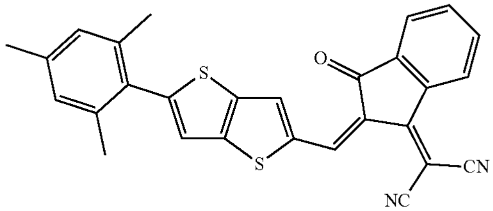
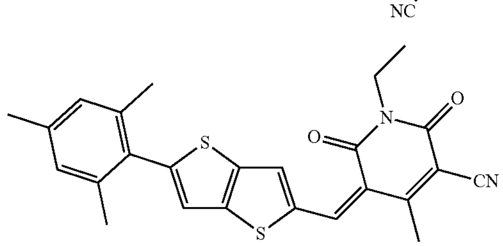
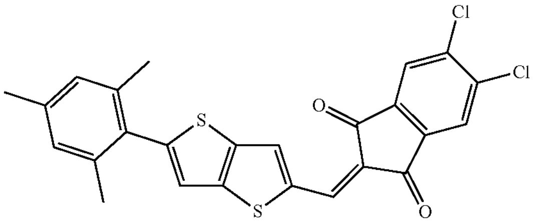
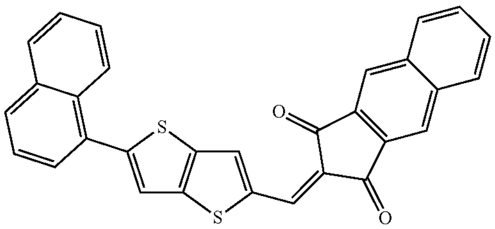
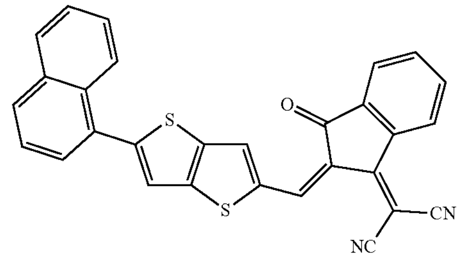
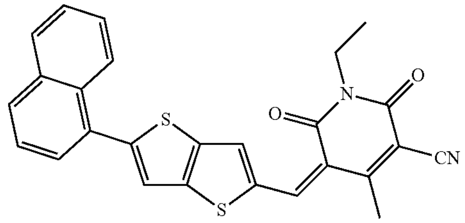
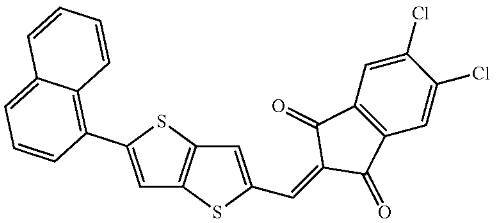

-continued
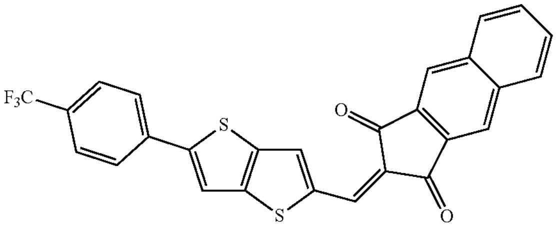
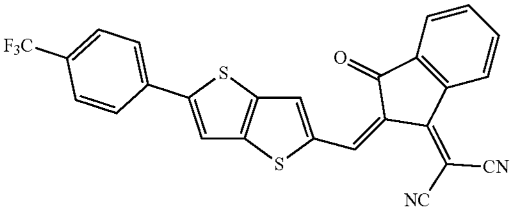
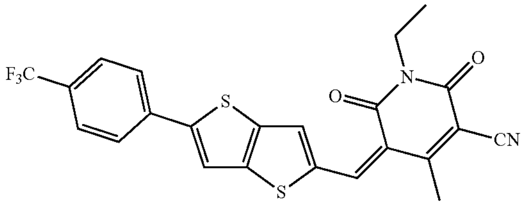
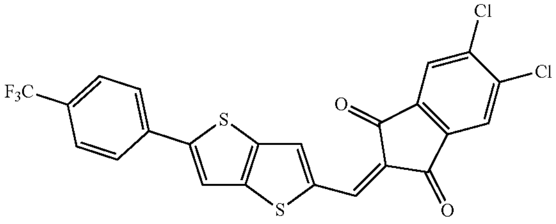
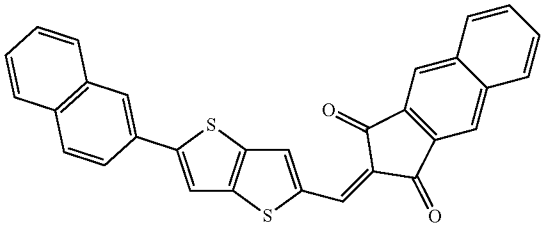
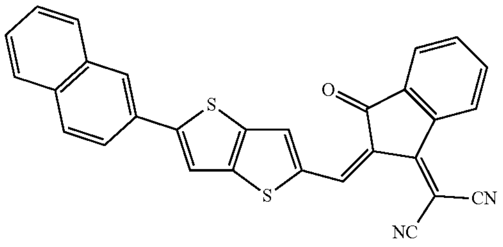
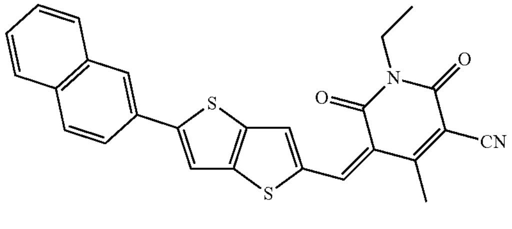
-continued
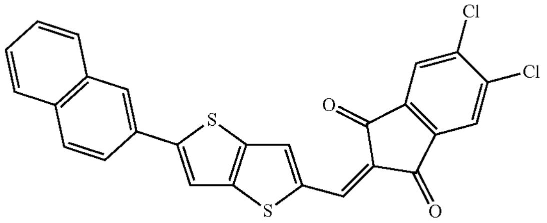
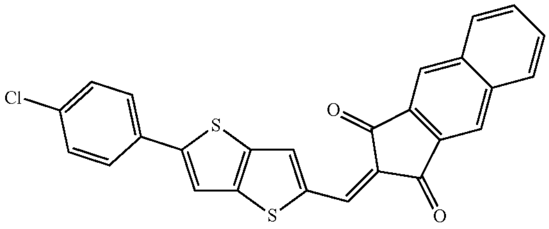
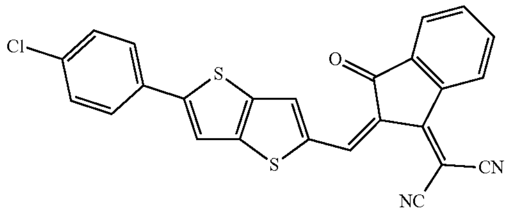
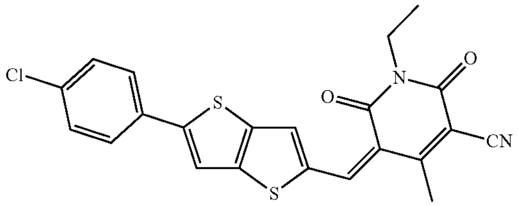
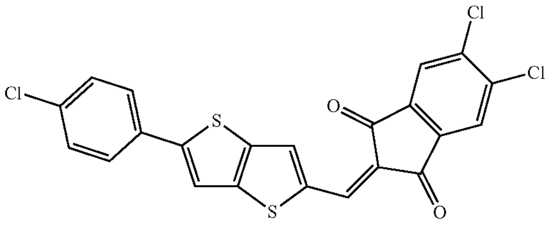
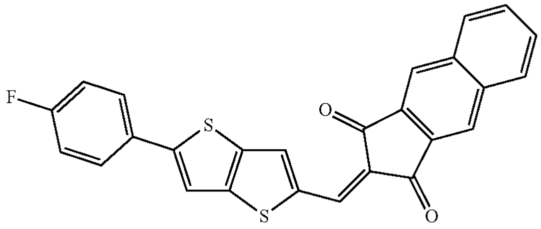
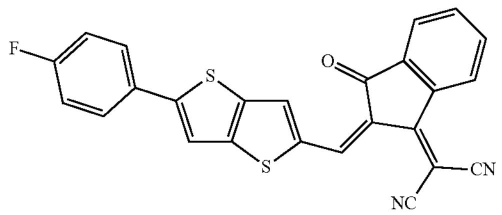

-continued
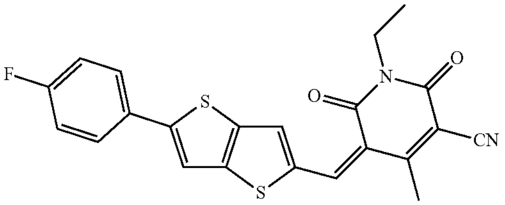
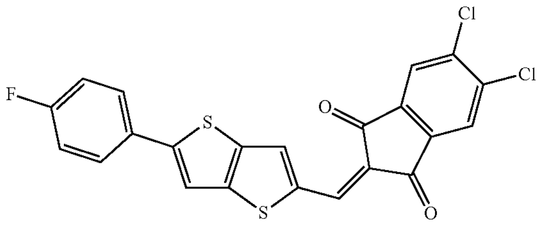
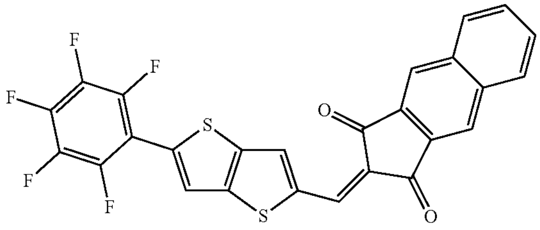
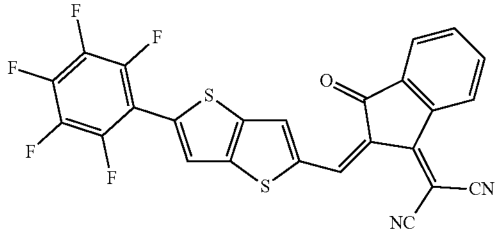
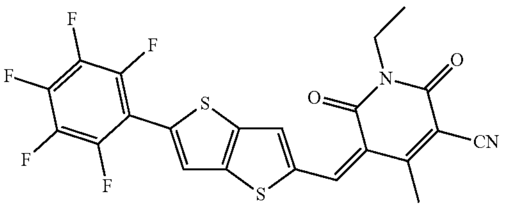
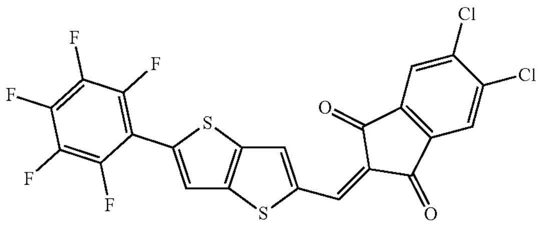
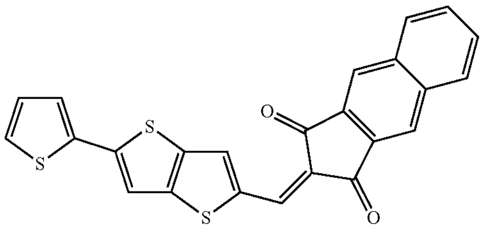
-continued
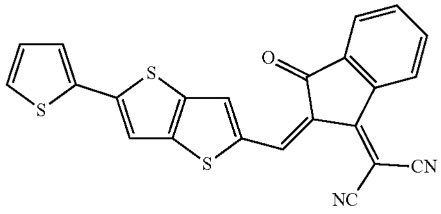
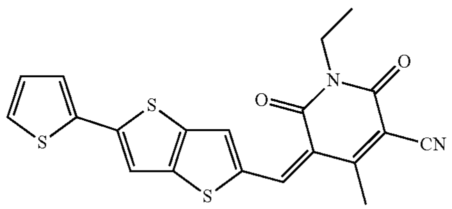
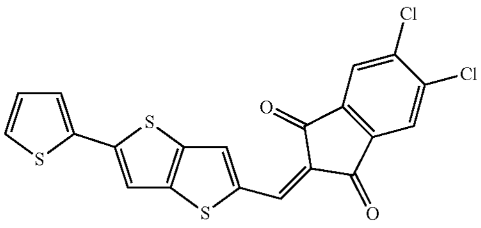
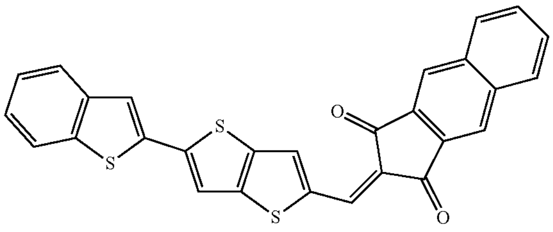
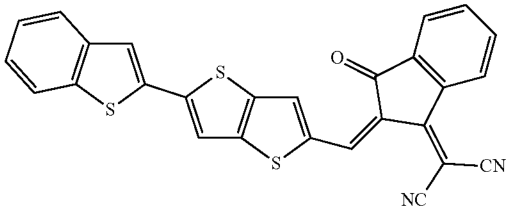
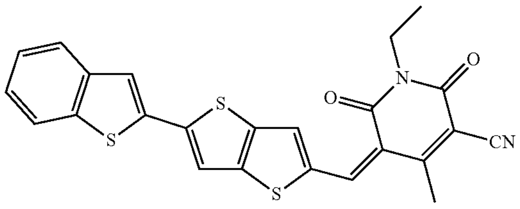
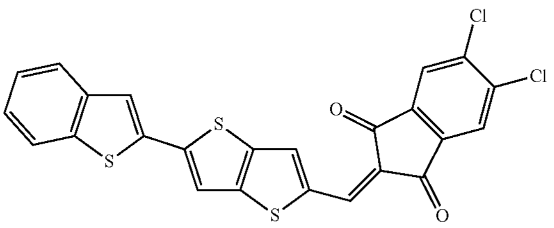

-continued
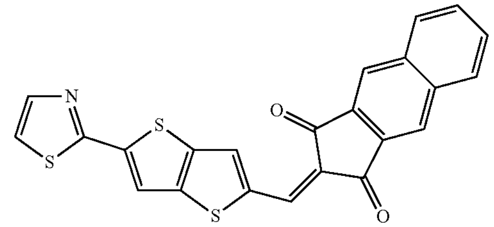
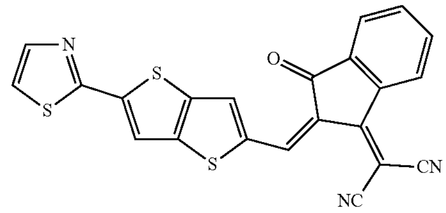
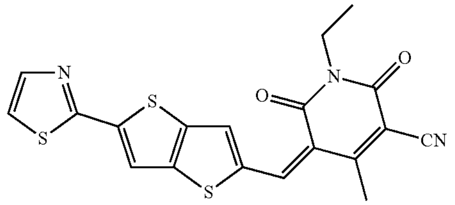
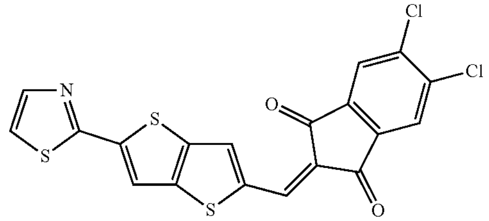
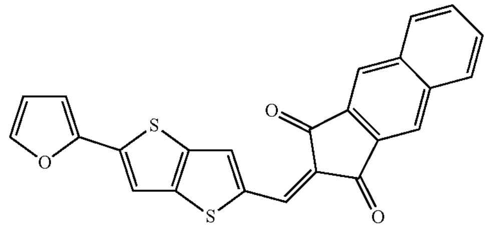
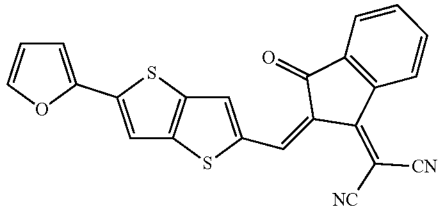
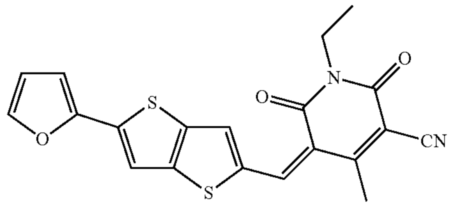
-continued
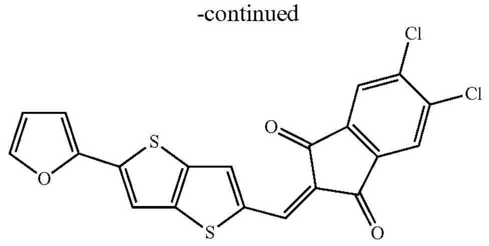
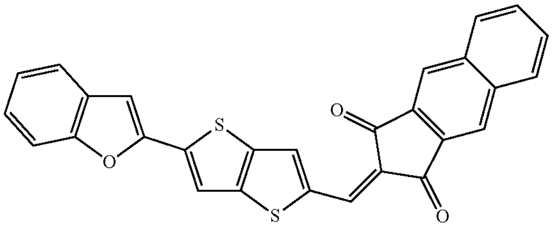
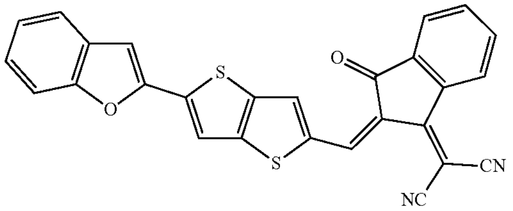
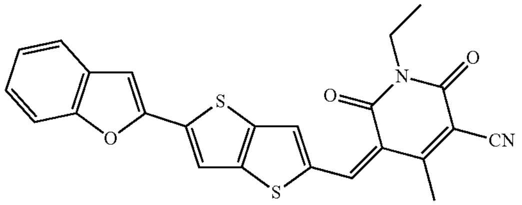
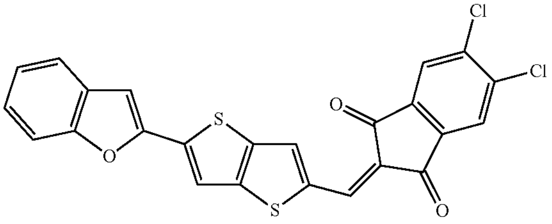
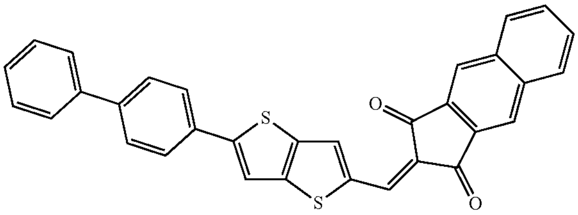
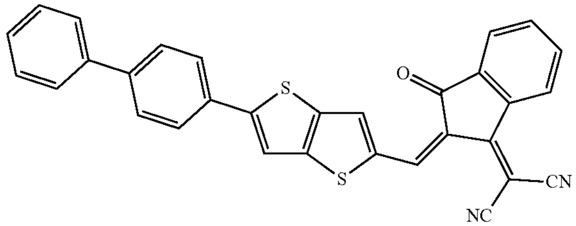
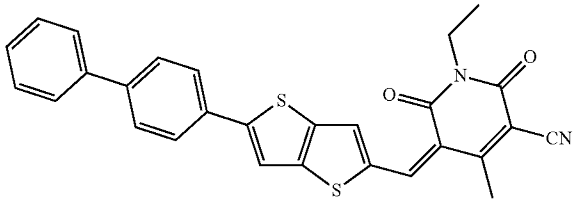

-continued
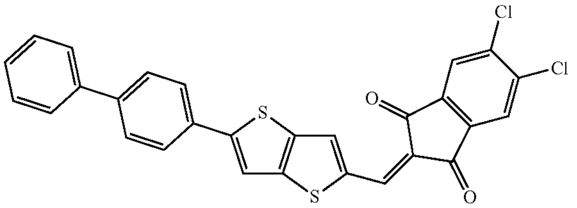
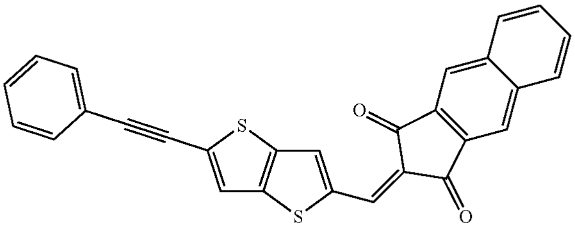
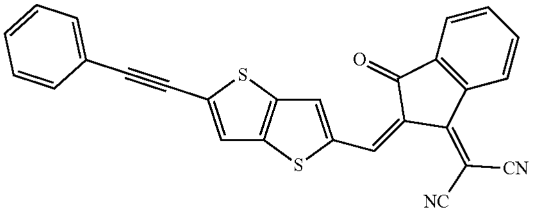
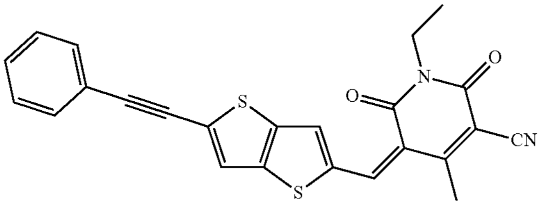
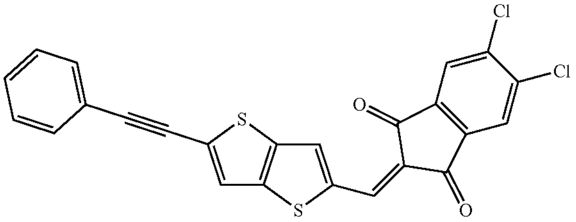
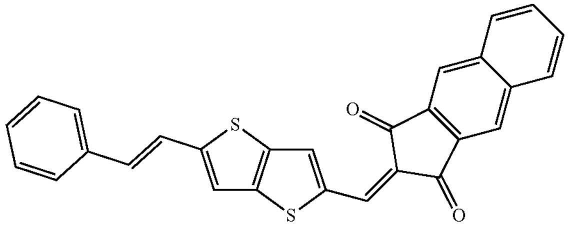
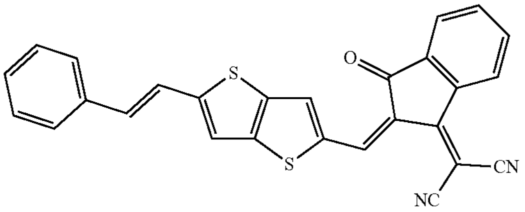
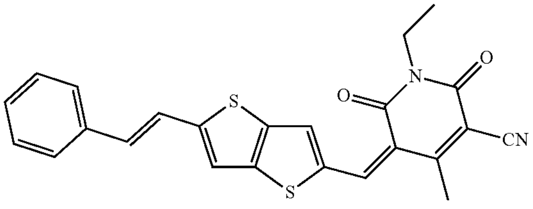
-continued
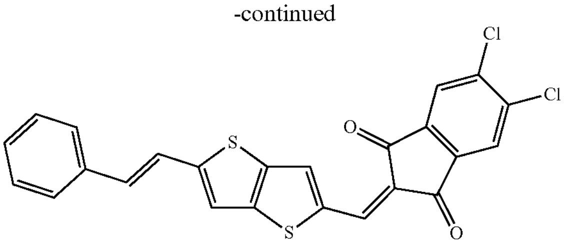
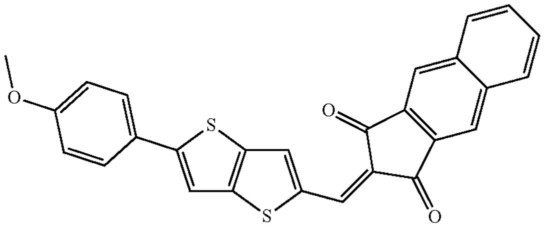
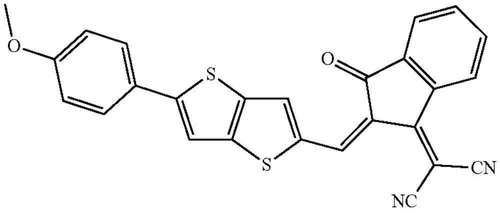
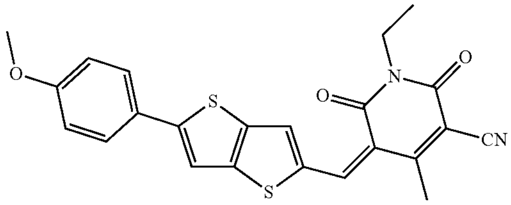
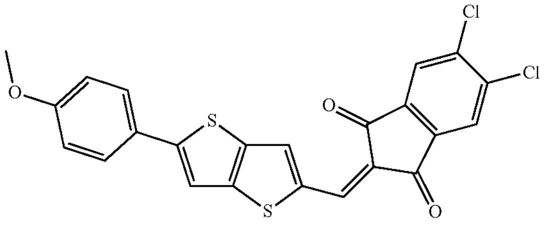
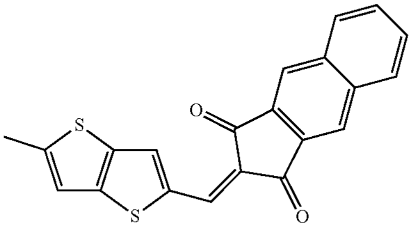
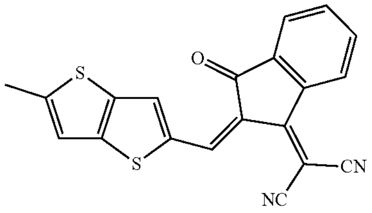
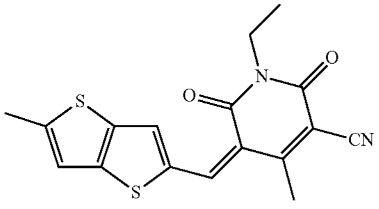

-continued
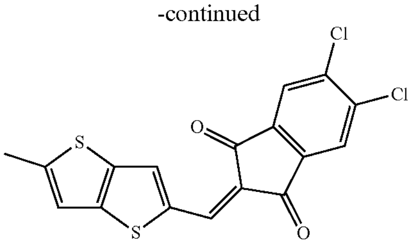
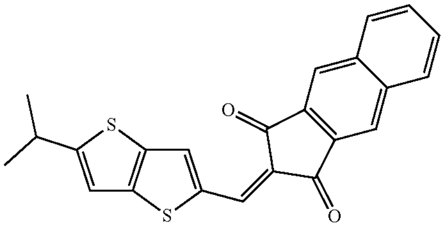
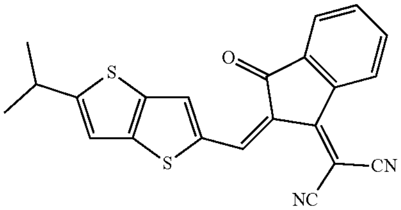
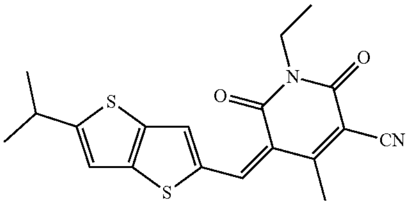
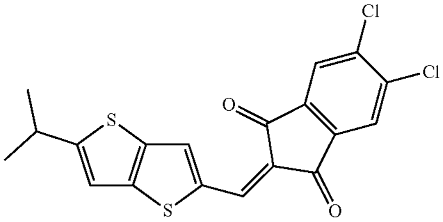
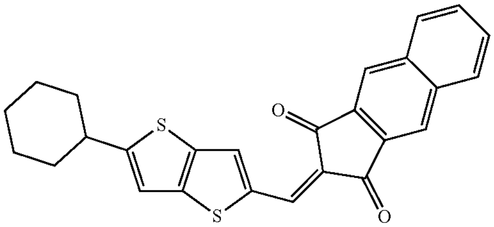
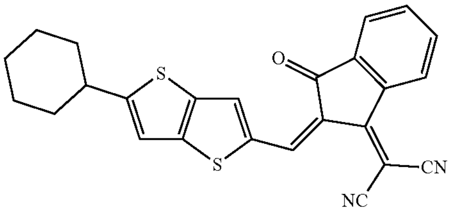
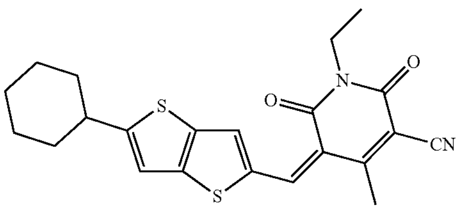
-continued
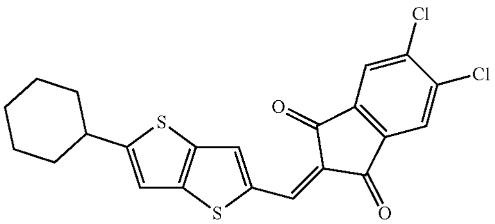
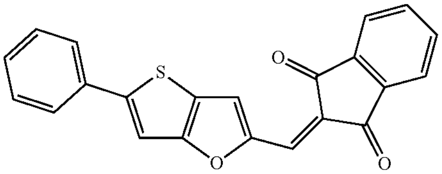
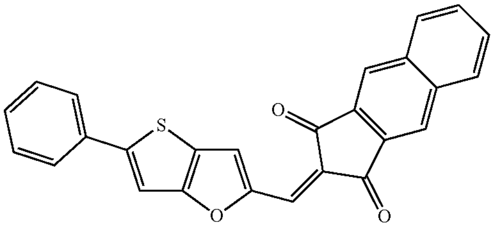
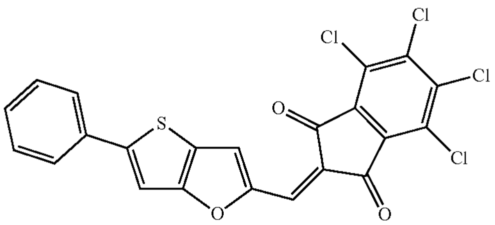
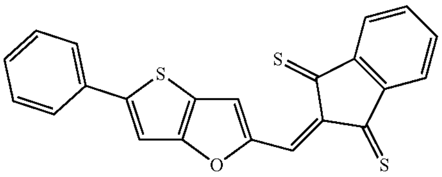
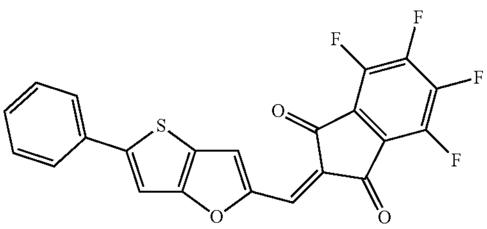
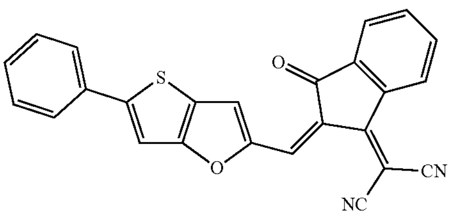
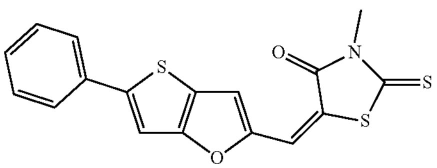

-continued
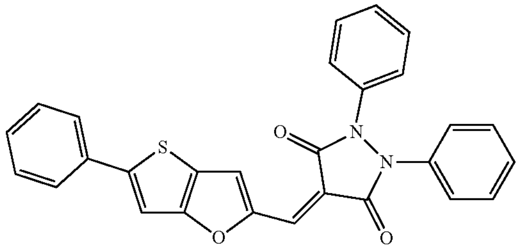
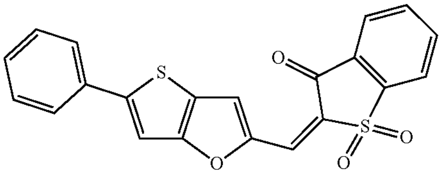
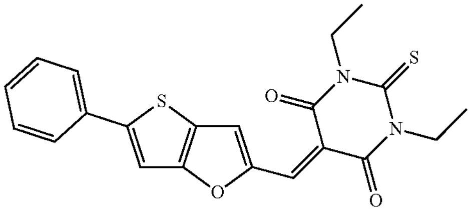
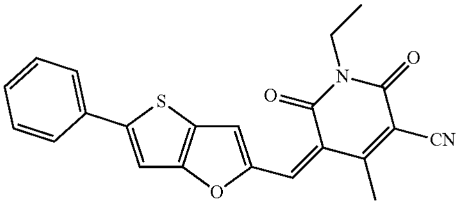
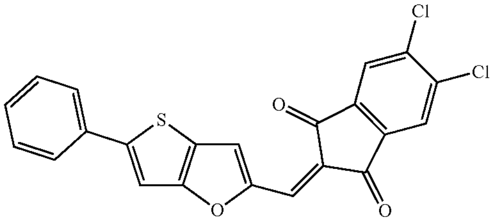
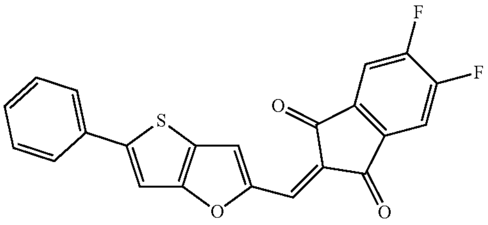
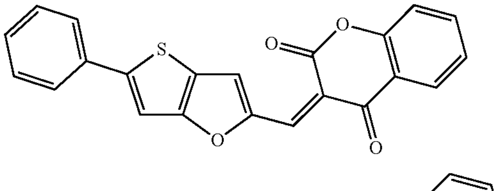
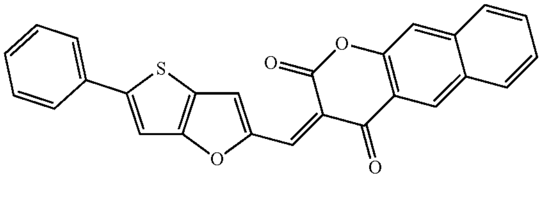
-continued
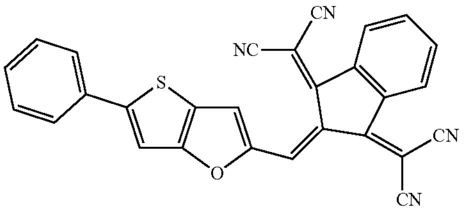
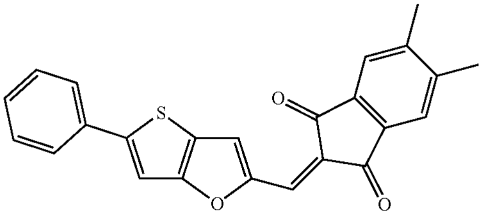
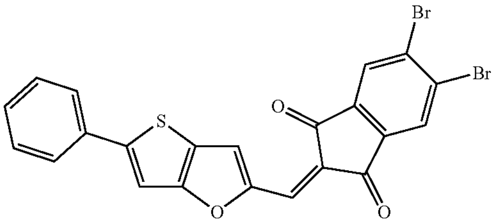
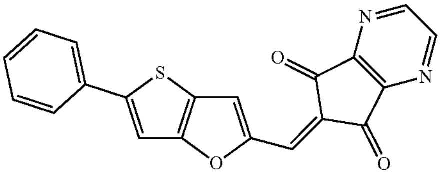
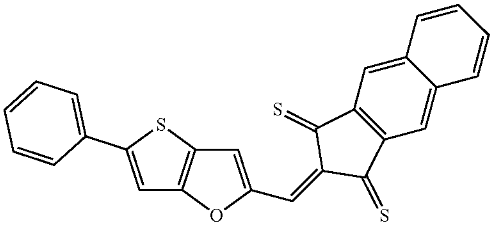
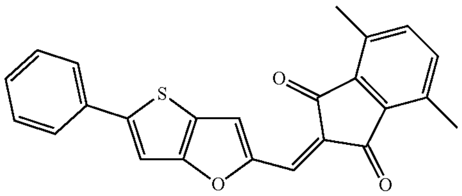
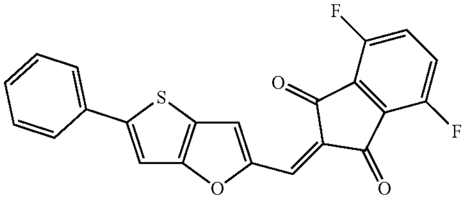
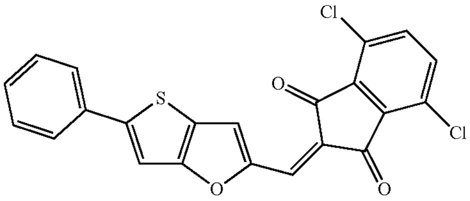

-continued
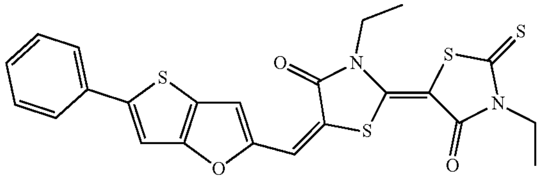
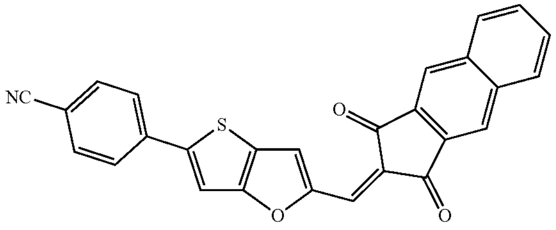
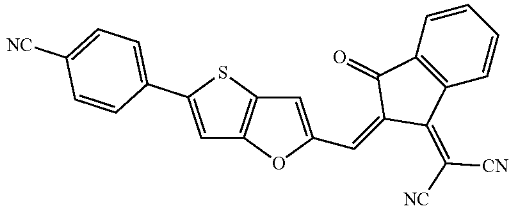
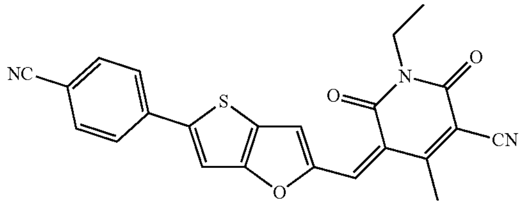
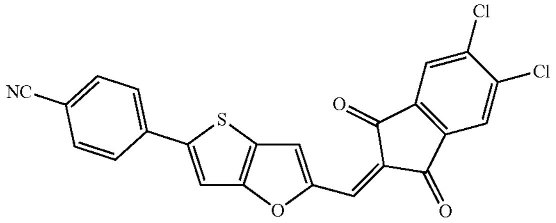
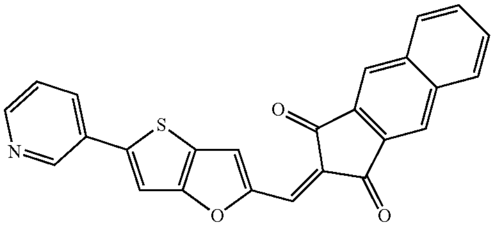
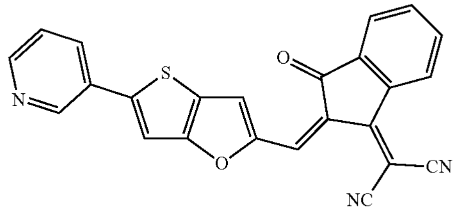
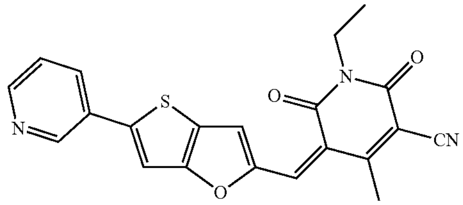
-continued
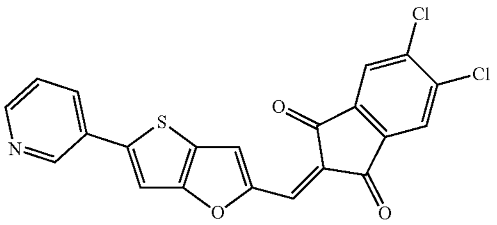
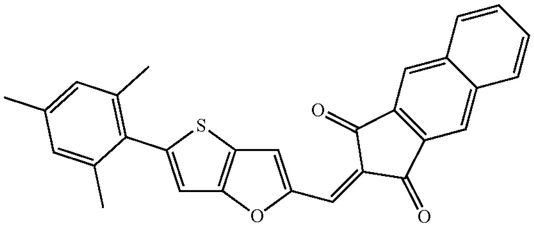
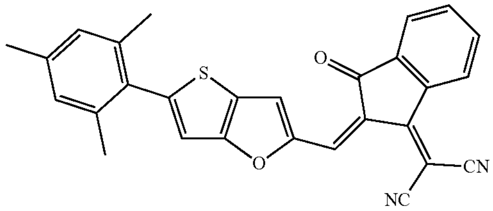
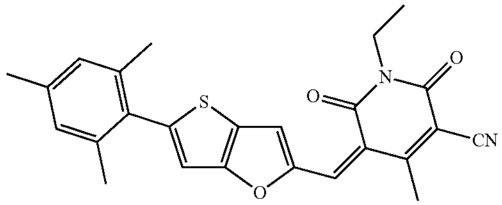
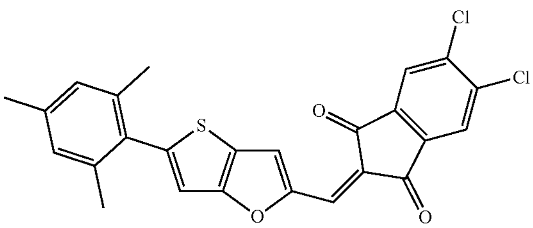
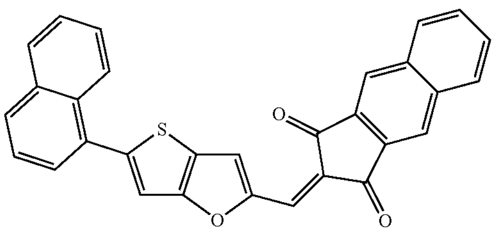
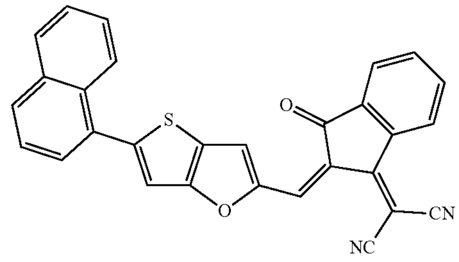

-continued
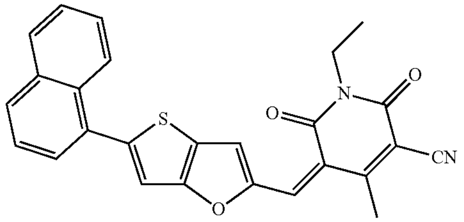
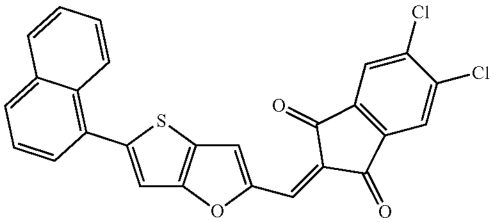
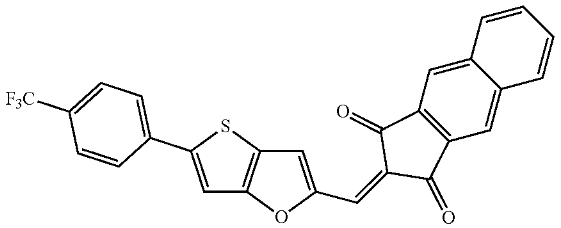
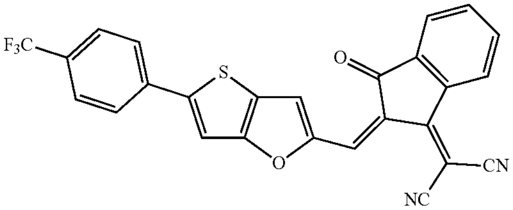
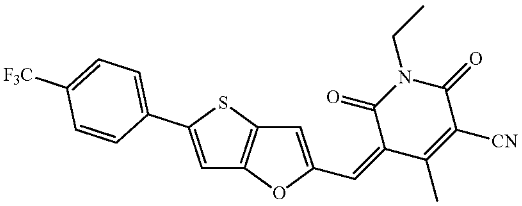
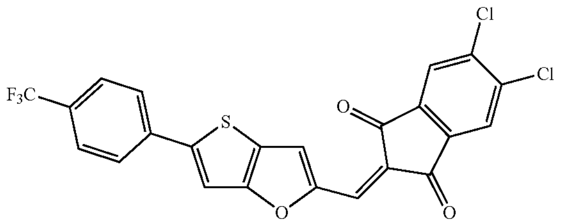
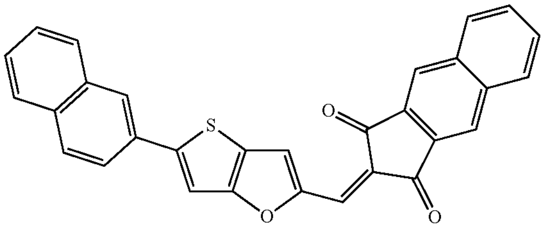
-continued
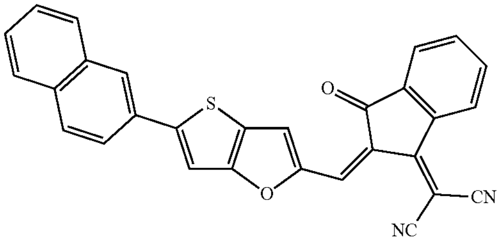
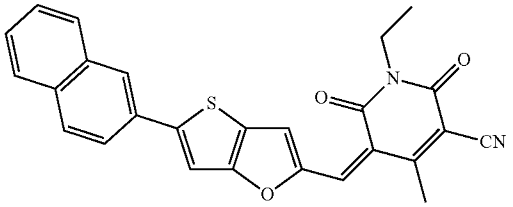
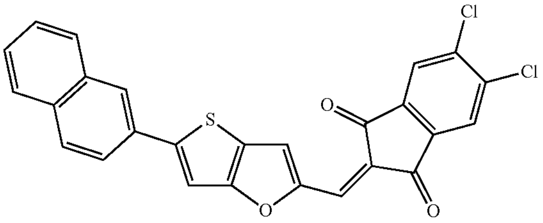
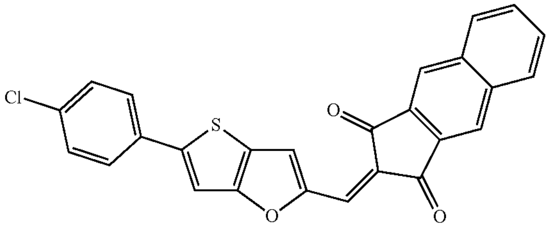
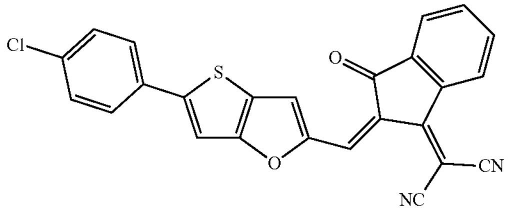
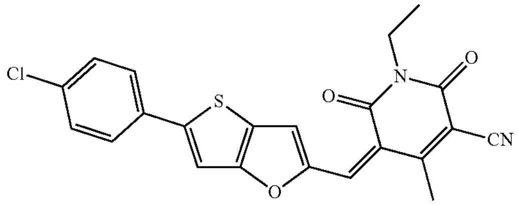
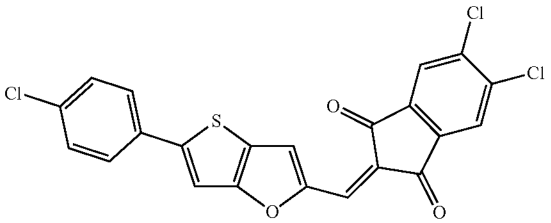

-continued
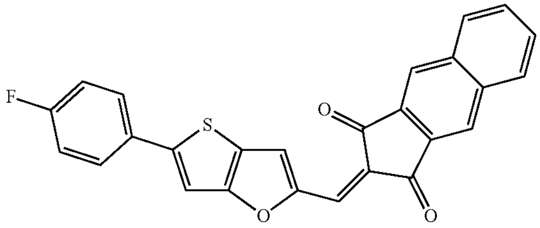
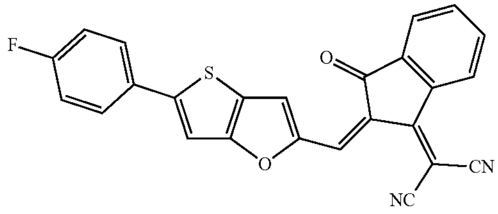
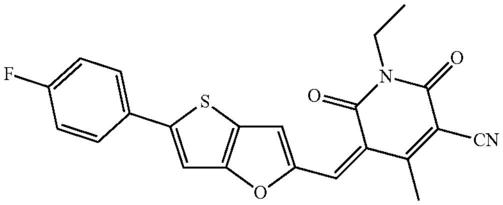
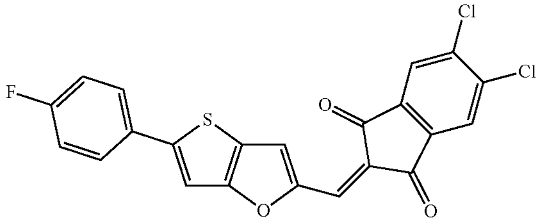
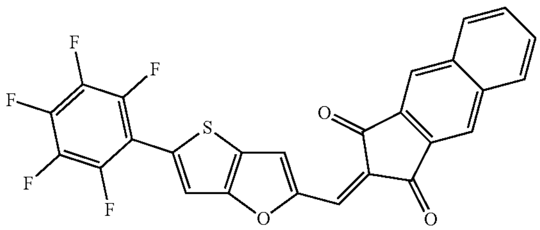
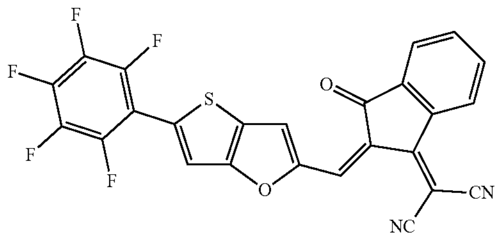
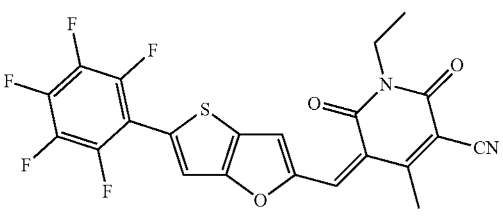
-continued
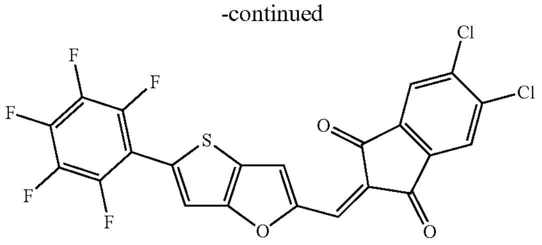
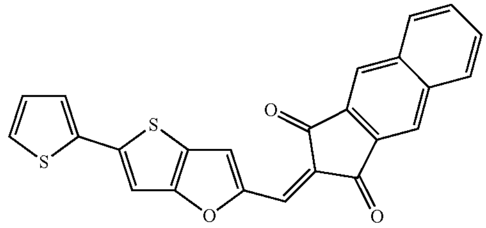
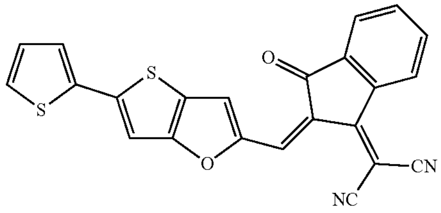
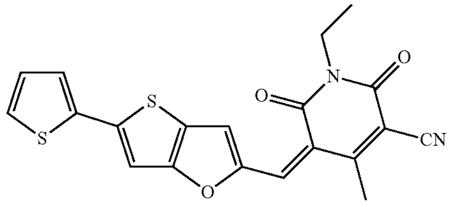
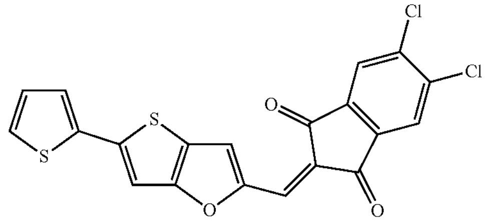
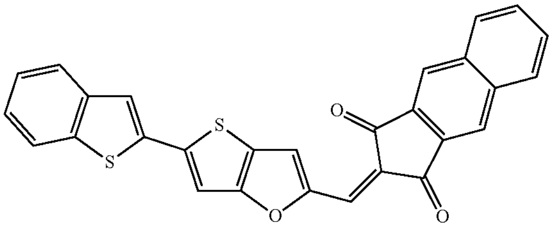
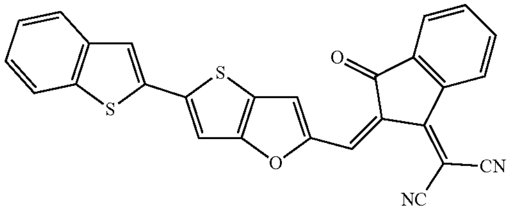
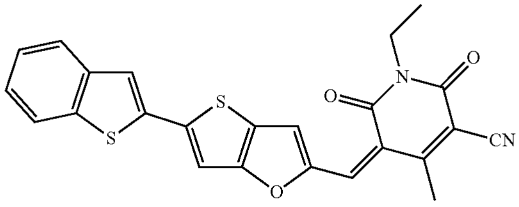

-continued
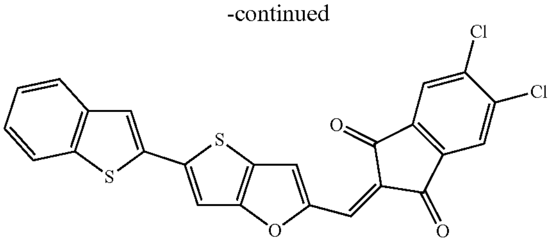
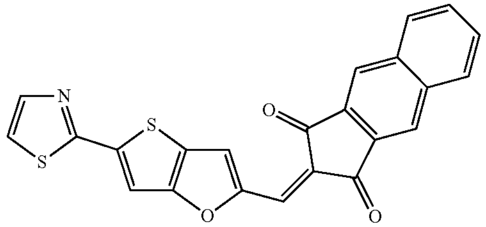
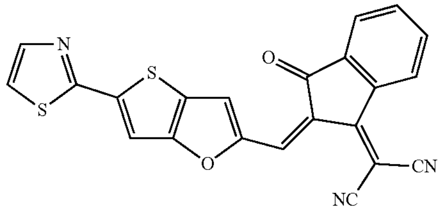
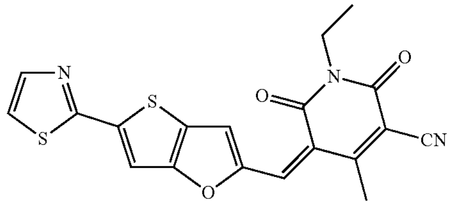
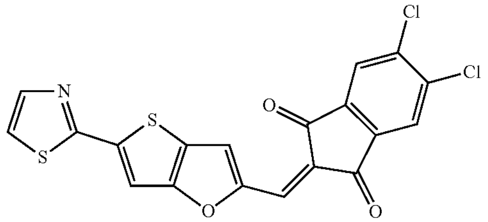
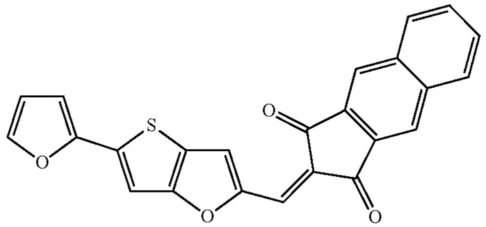
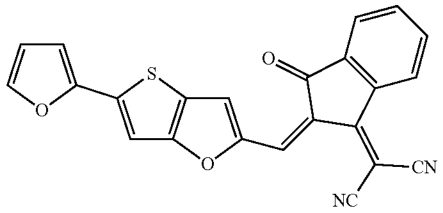
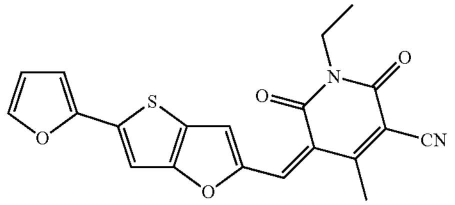
-continued
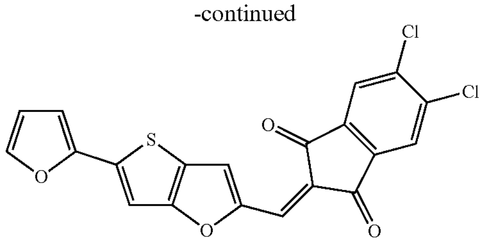
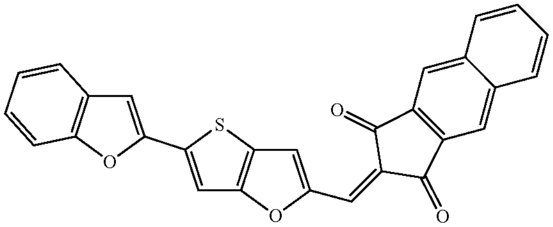
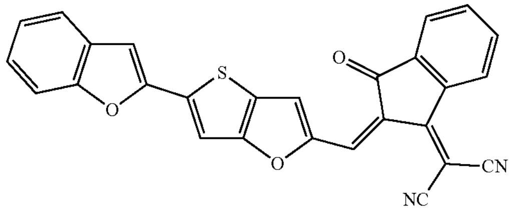
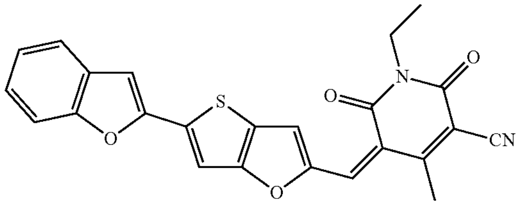
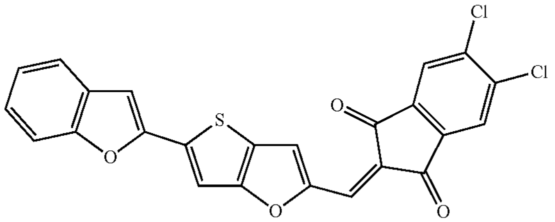
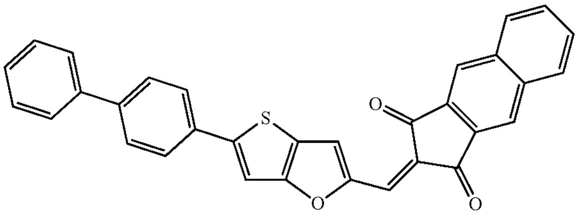
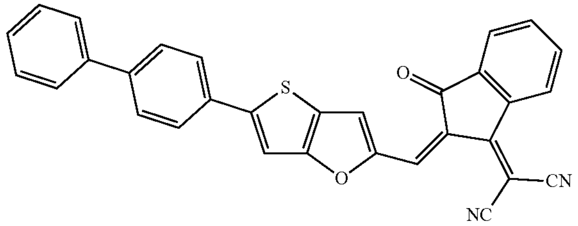
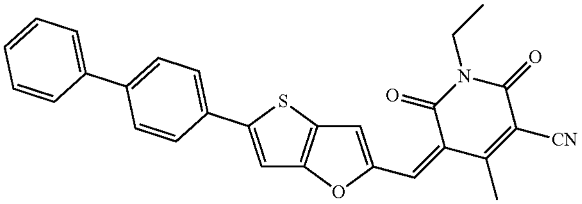

-continued
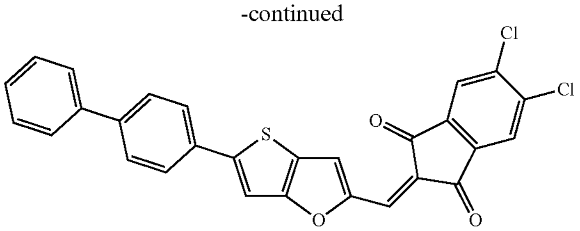
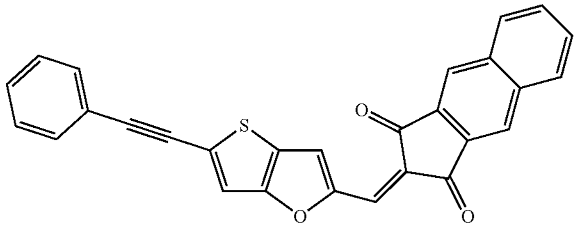
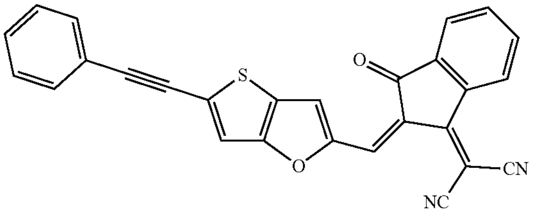
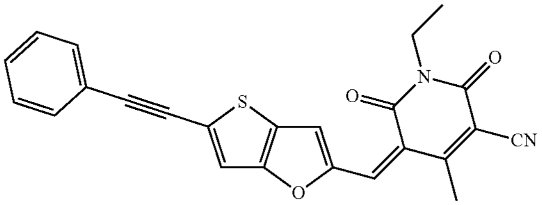
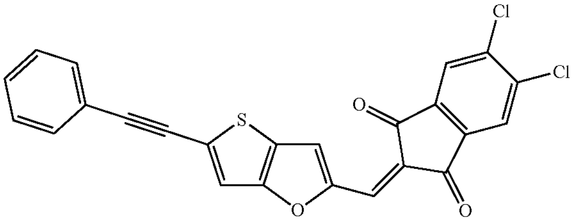
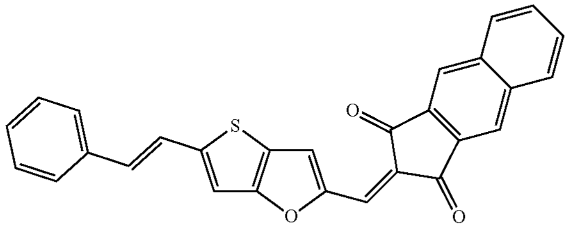
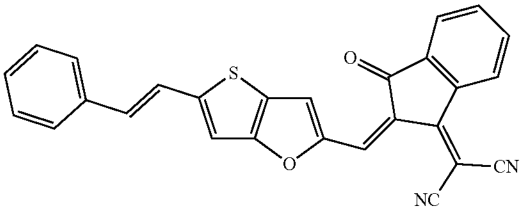
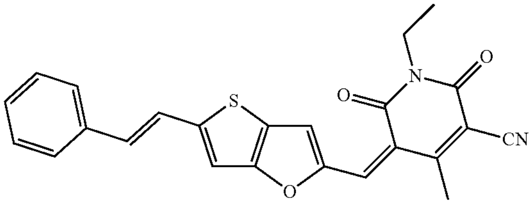
-continued
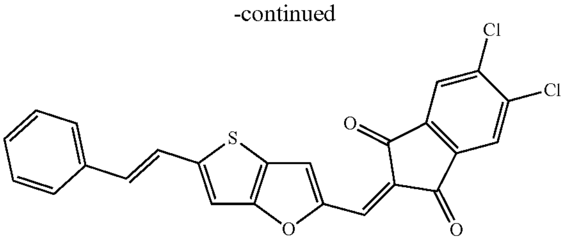
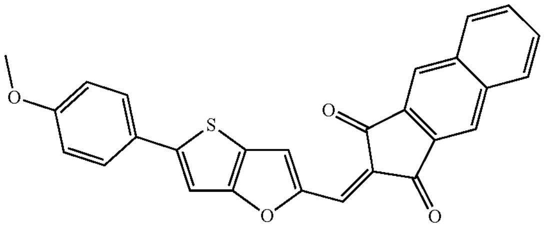
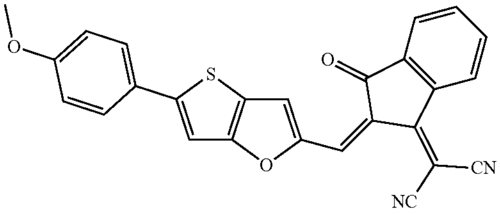
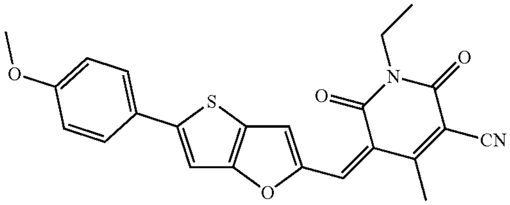
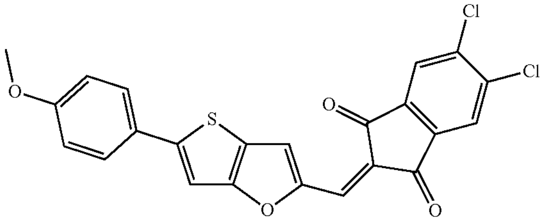
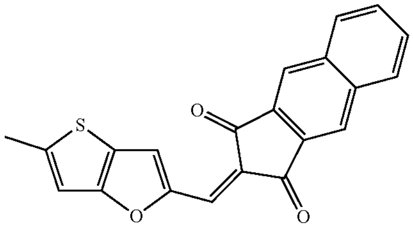
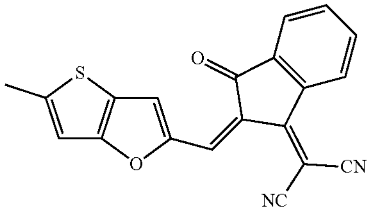
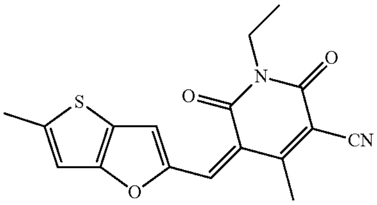

-continued
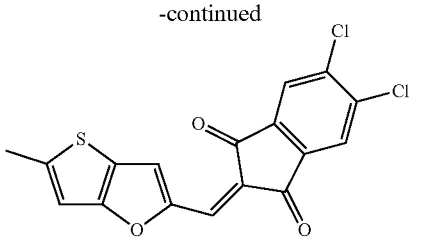
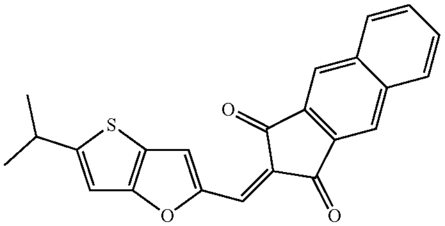
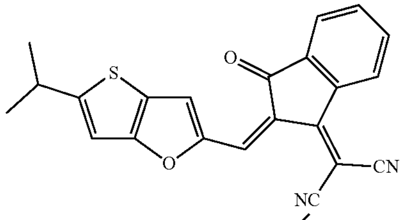
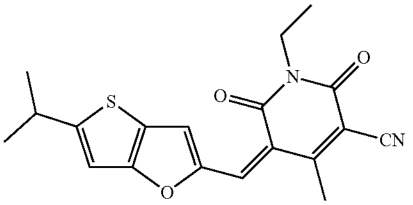
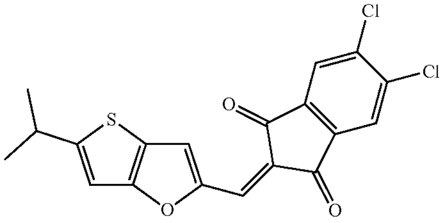
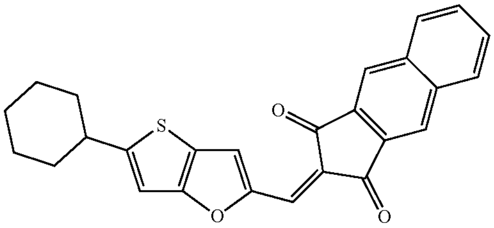
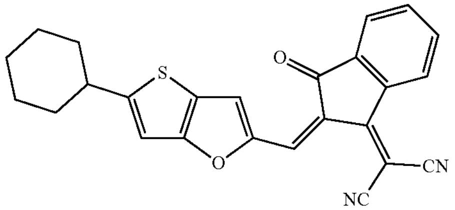
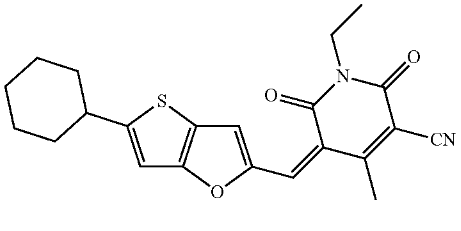
-continued
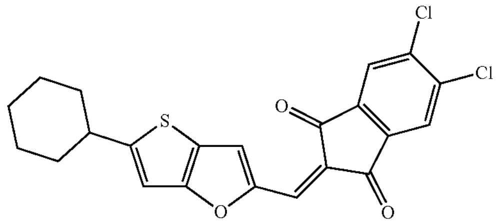
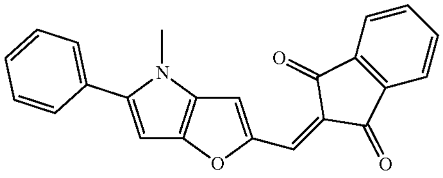
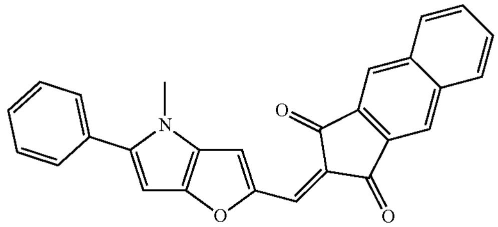
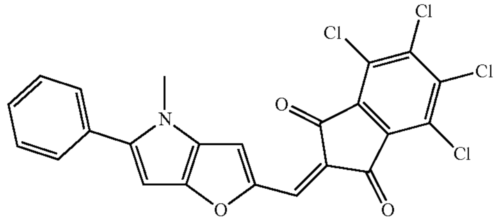
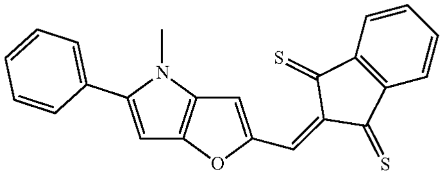
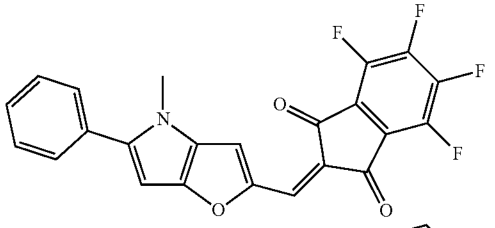
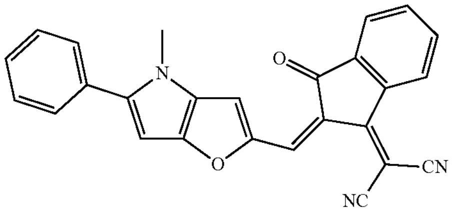
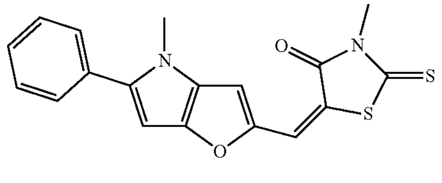

-continued
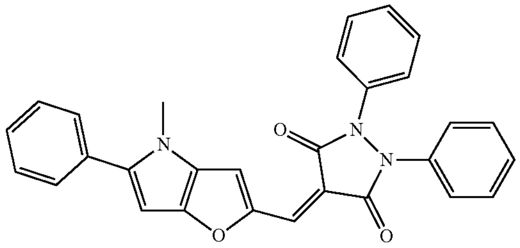
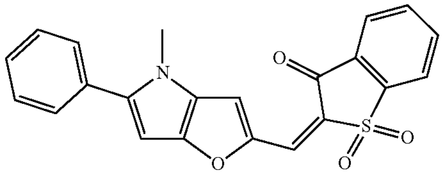
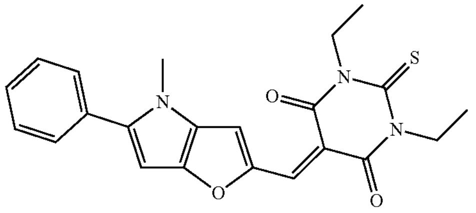
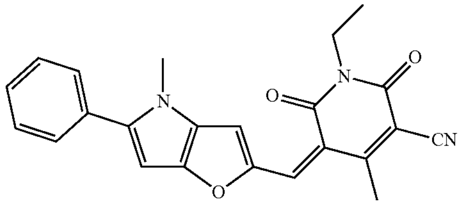
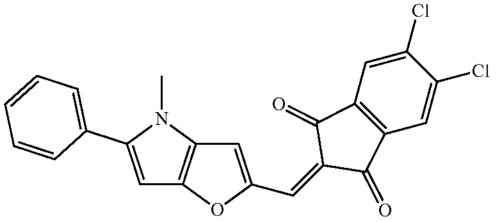
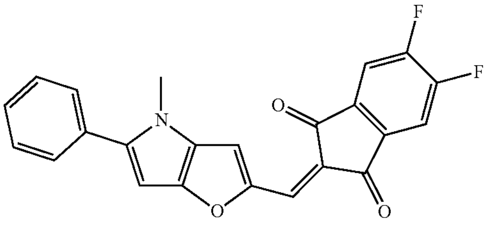
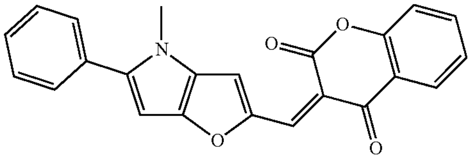
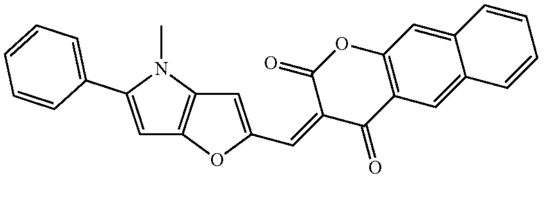
-continued
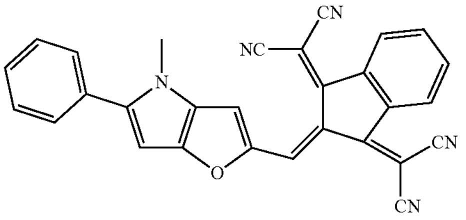
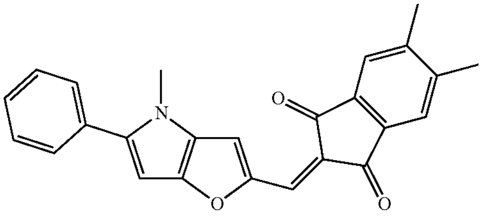
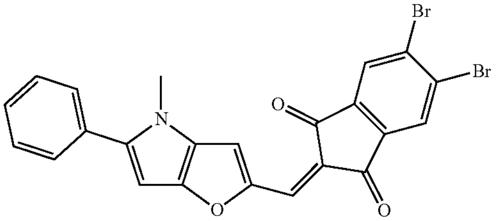
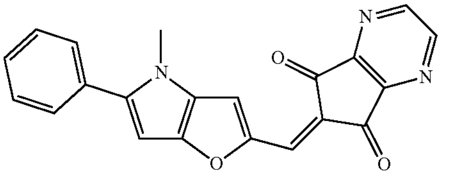
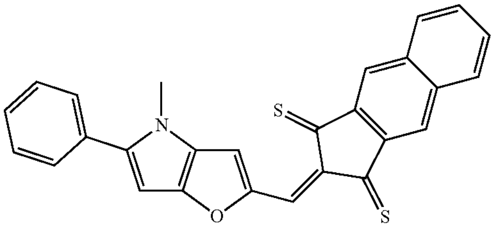
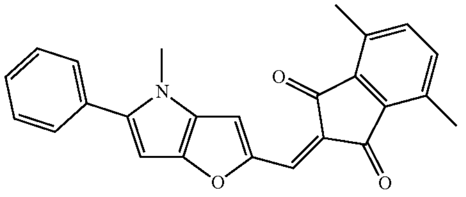
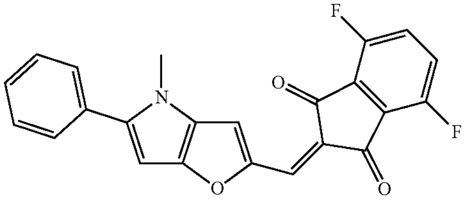
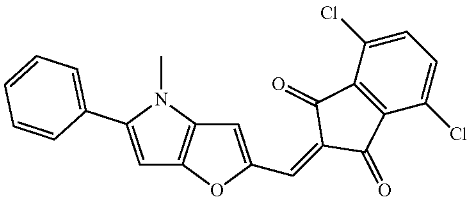

-continued
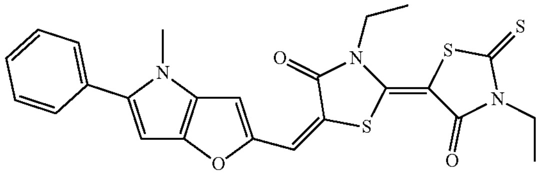
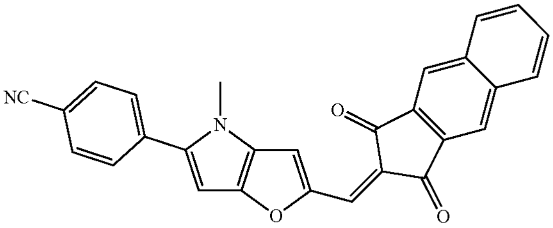
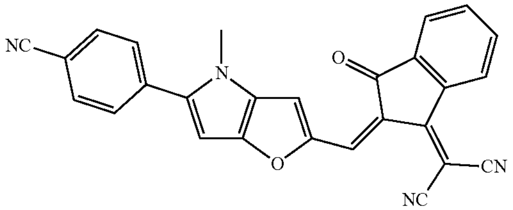
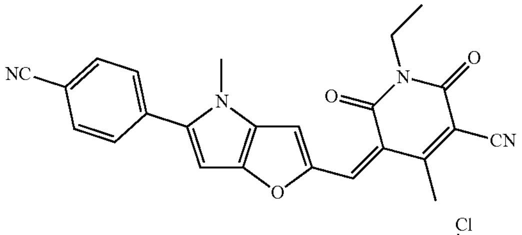
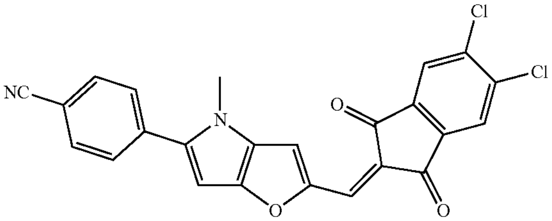
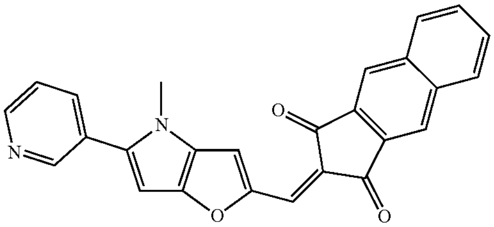
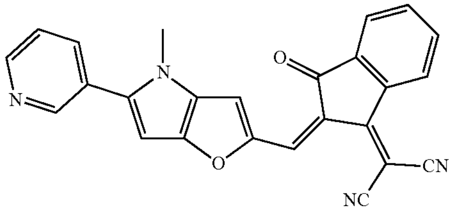
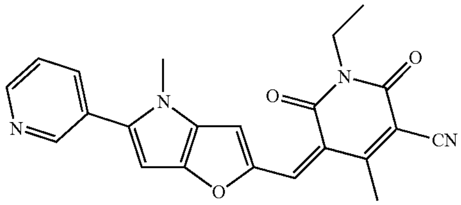
-continued
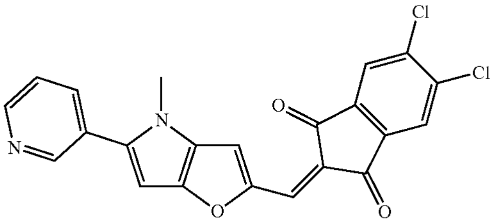
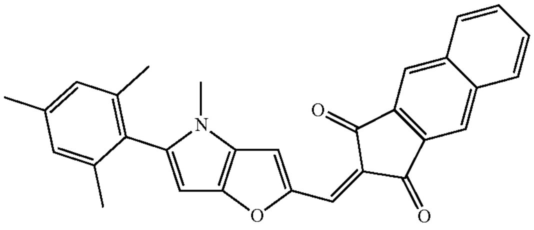
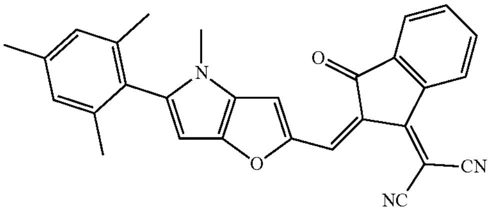
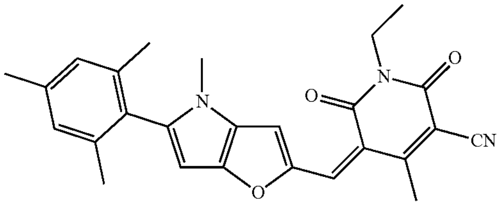
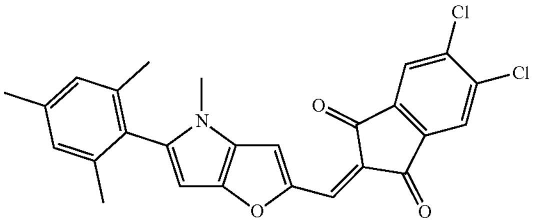
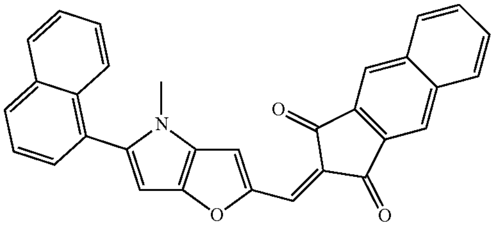
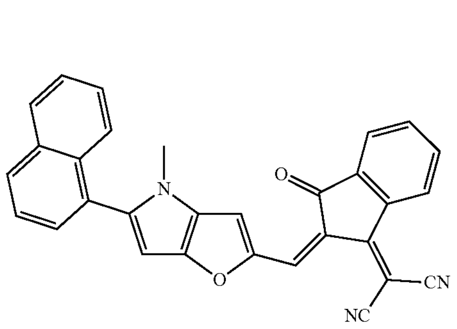

-continued
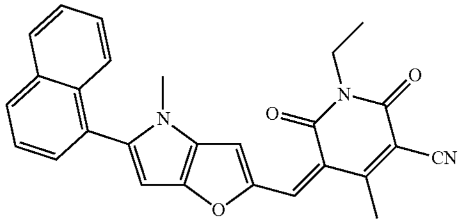
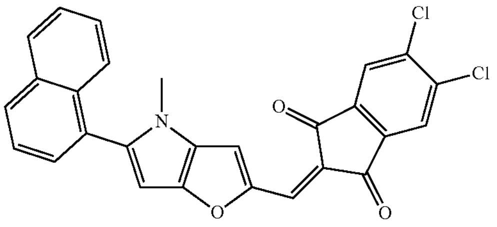
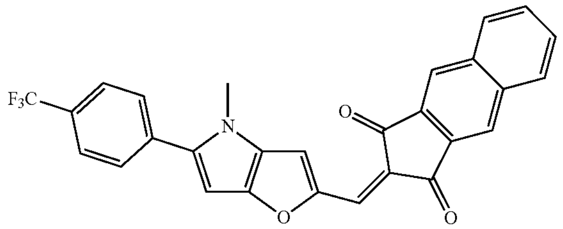
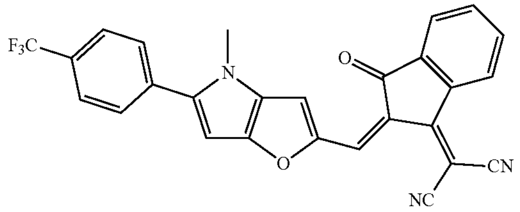
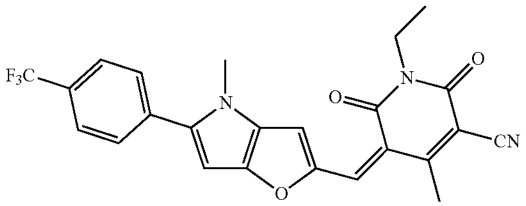
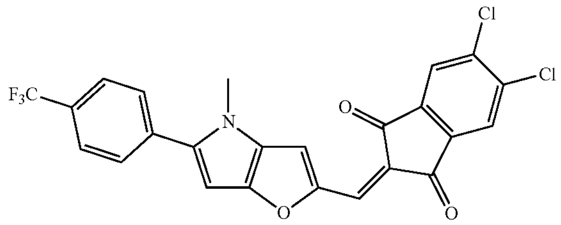
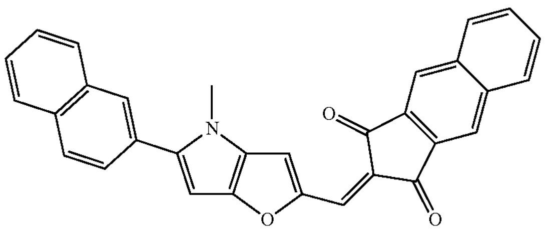
-continued
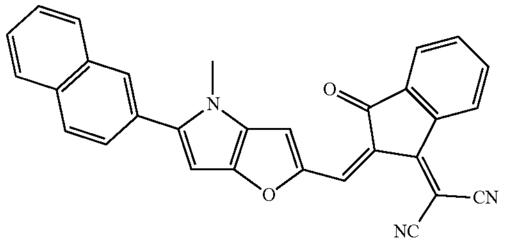
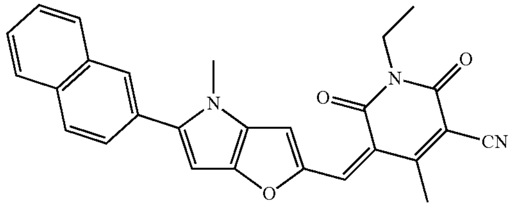
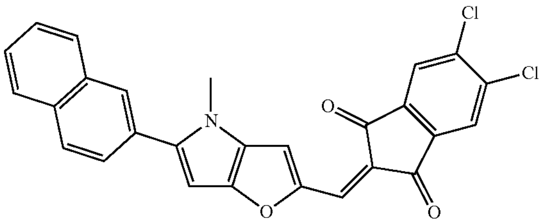
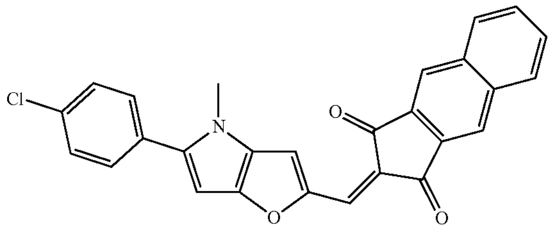
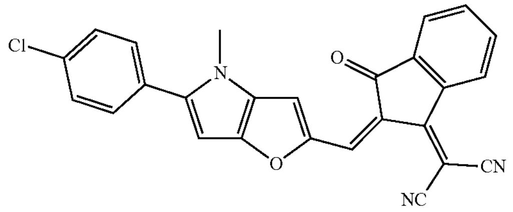
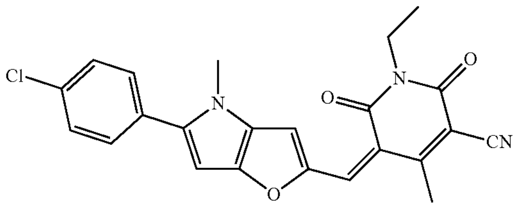
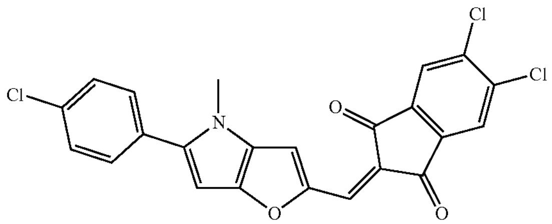

-continued
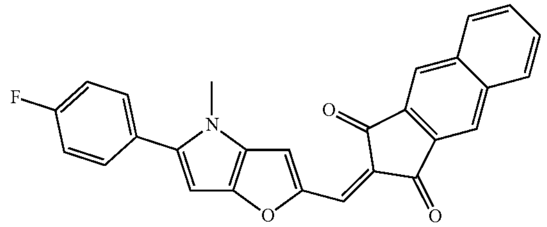
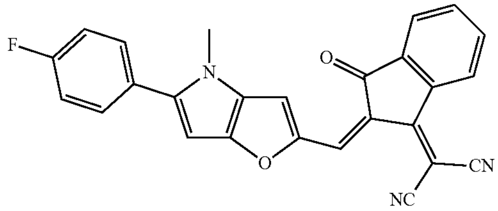
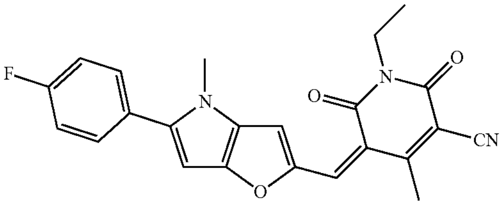
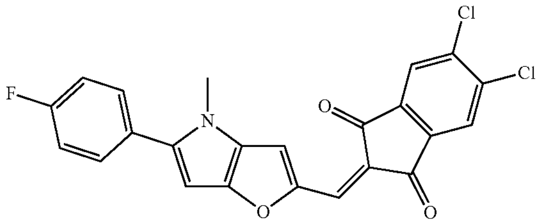
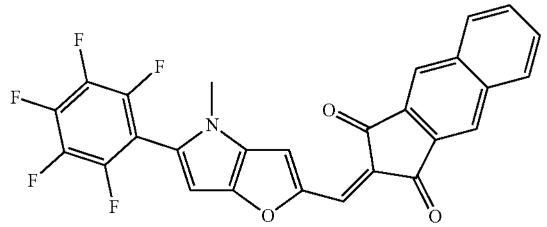
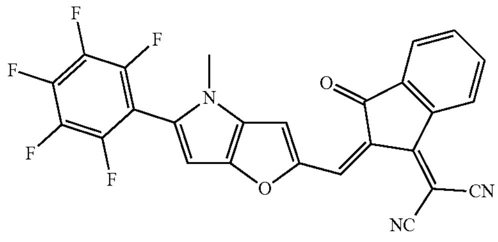
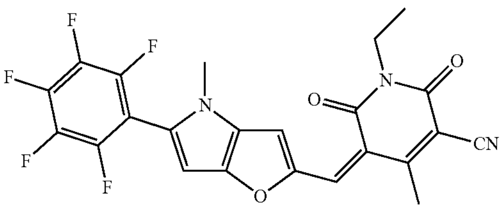
-continued
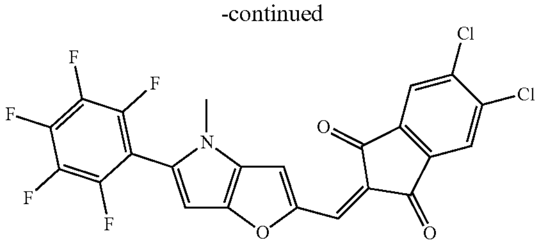
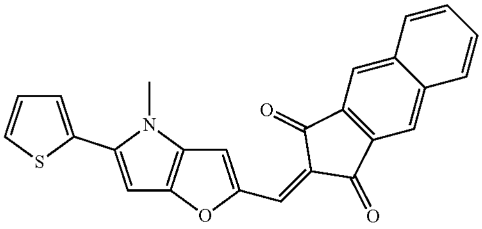
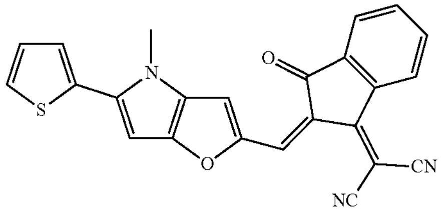
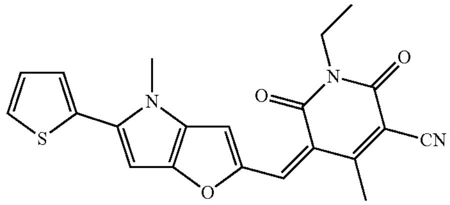
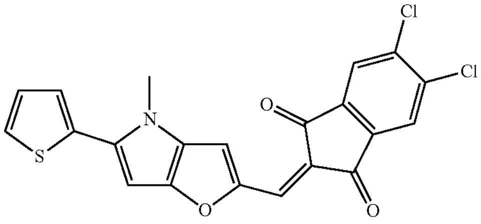
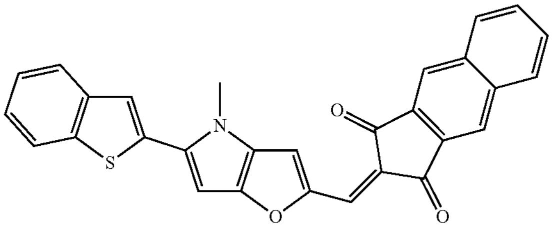
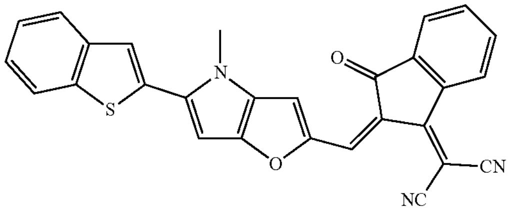
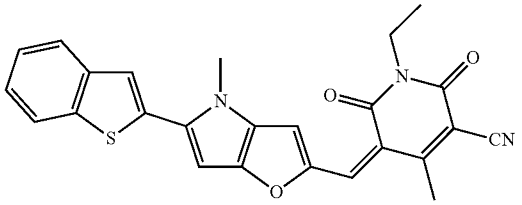

-continued
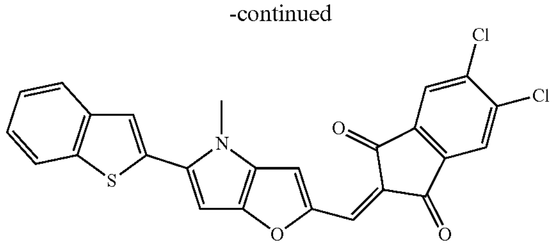
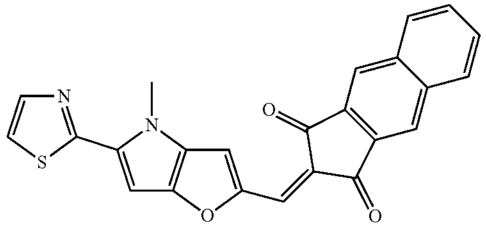
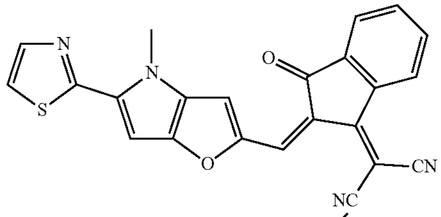
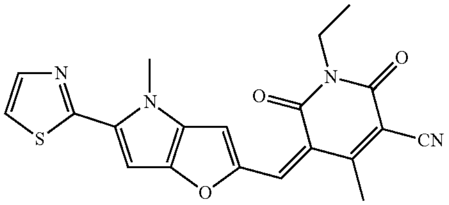
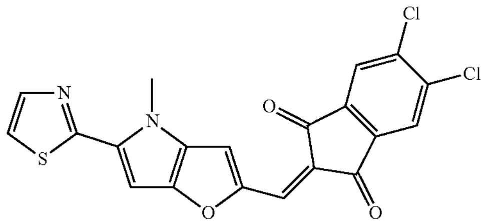
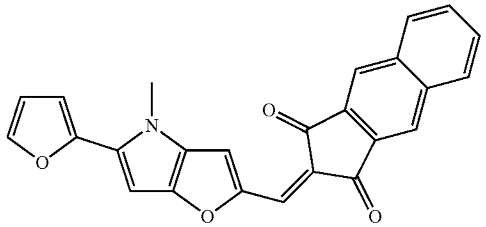
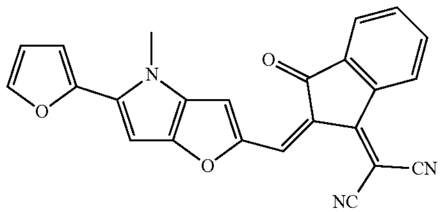
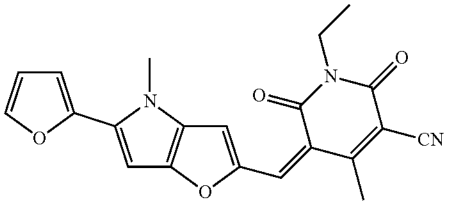
-continued
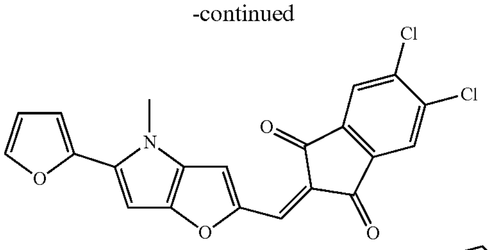
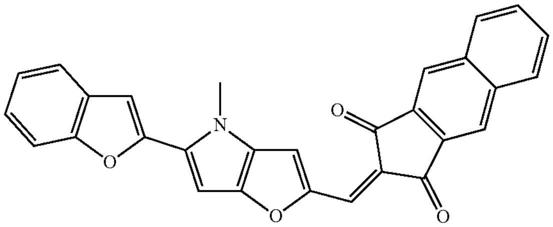
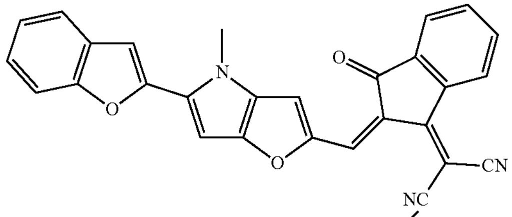
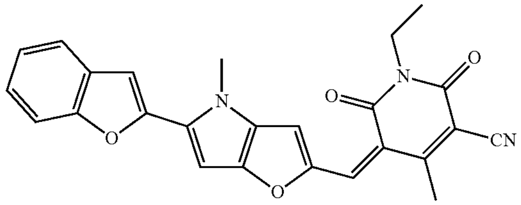
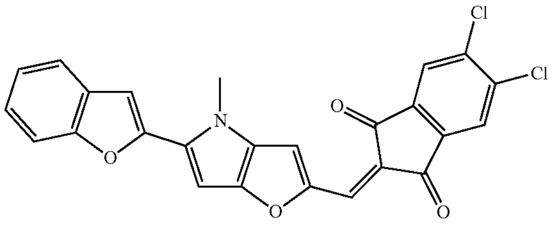
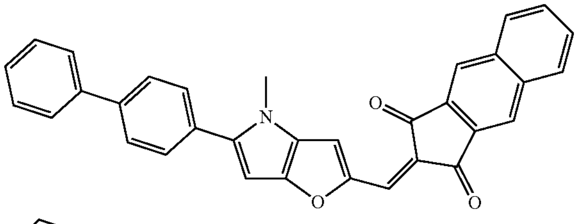
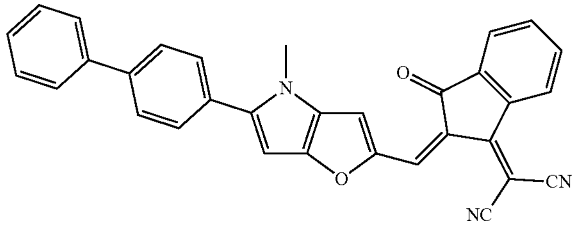
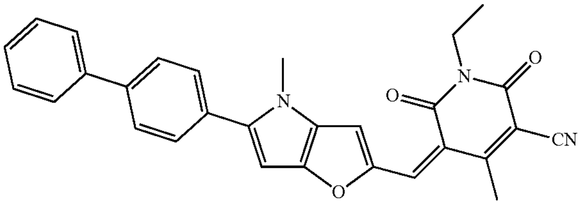

-continued
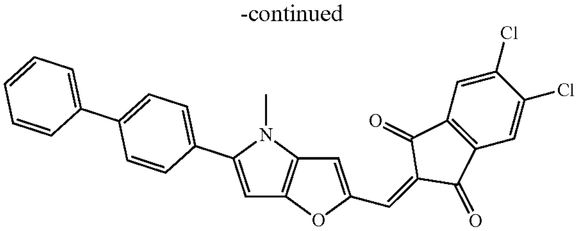
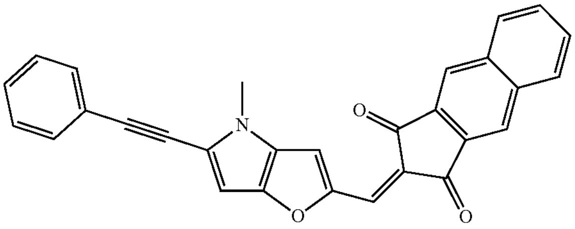
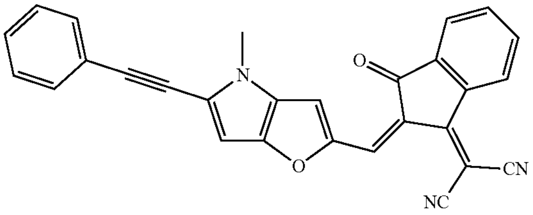
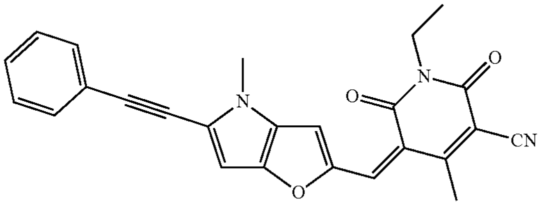
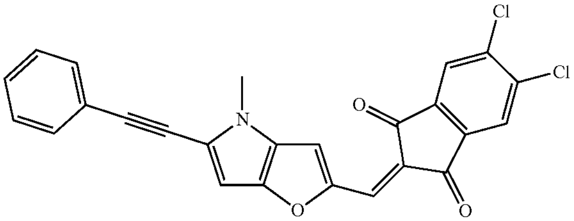
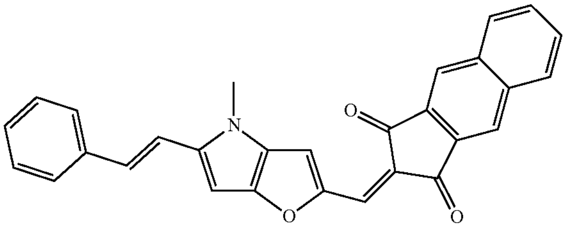
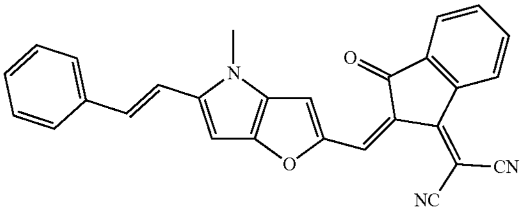
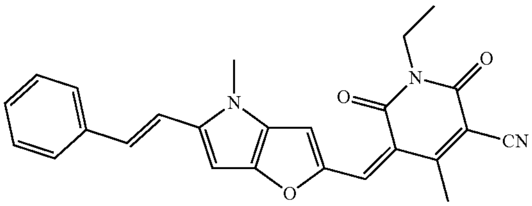
-continued
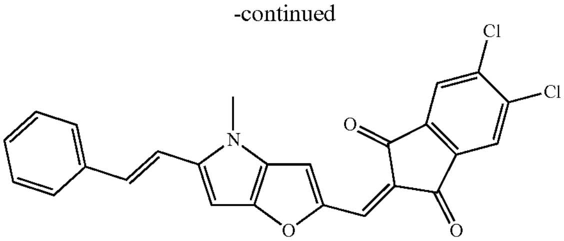
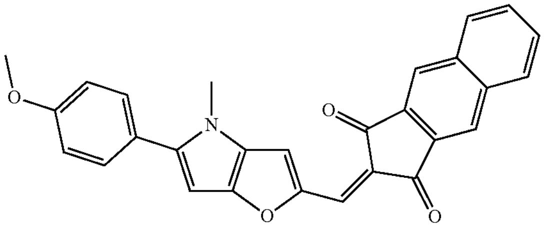
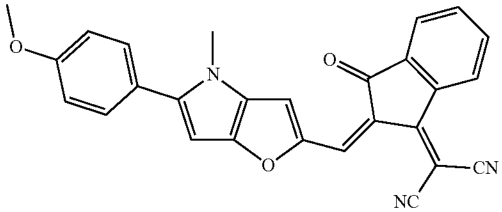
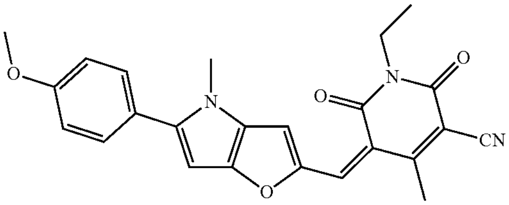
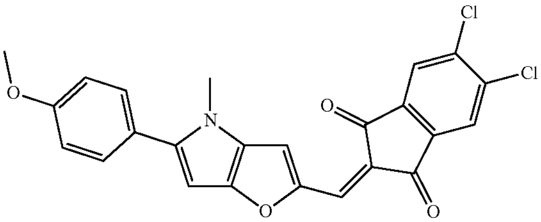
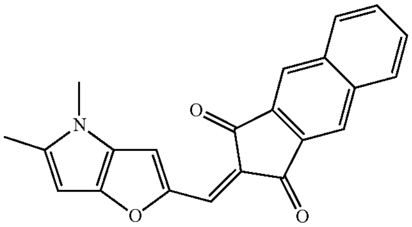
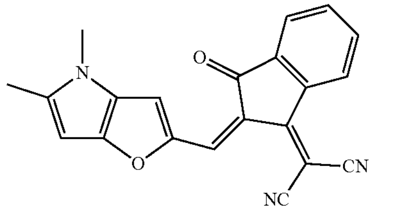
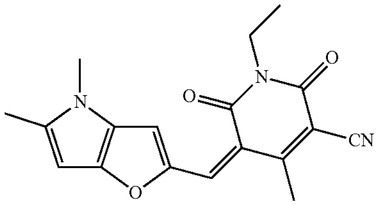

-continued
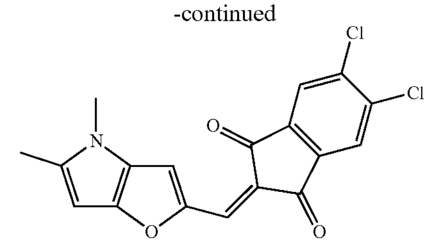
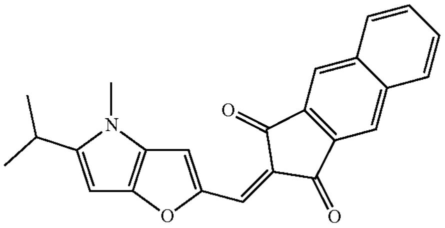
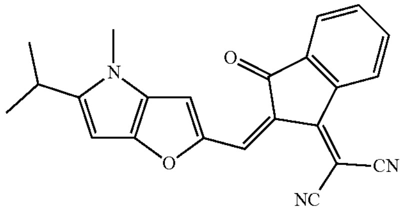
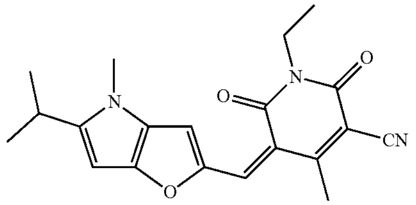
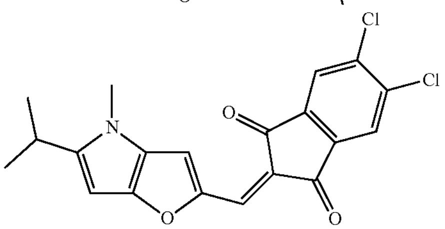
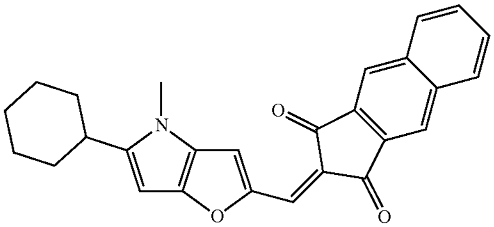
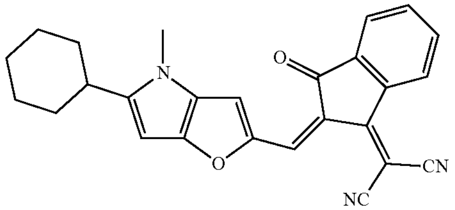
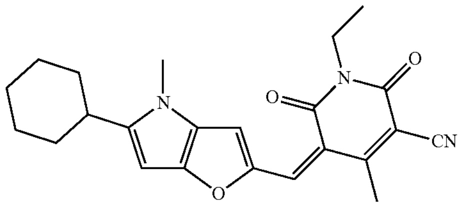
-continued
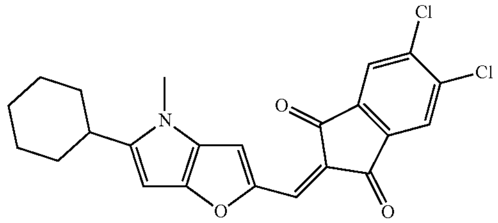
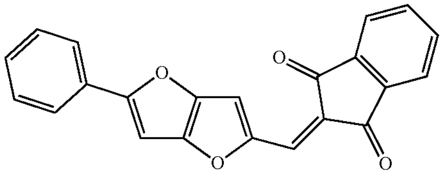
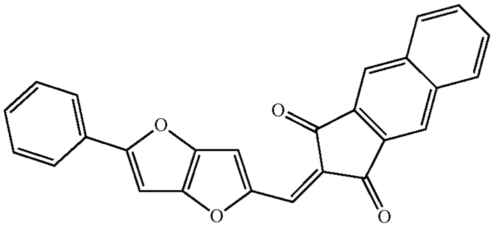
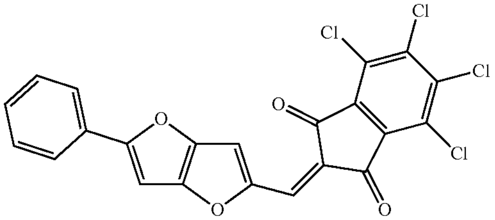
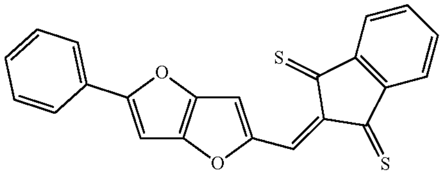
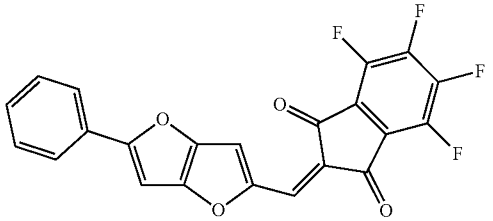
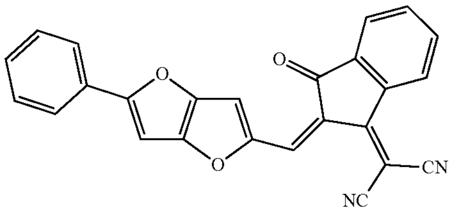
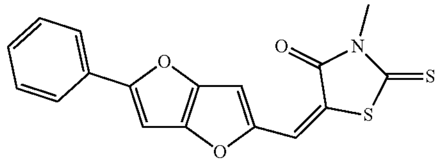

-continued
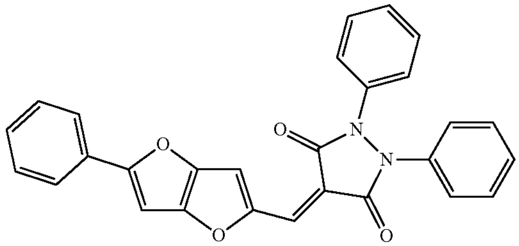
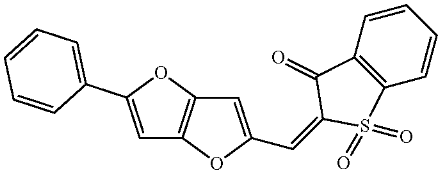
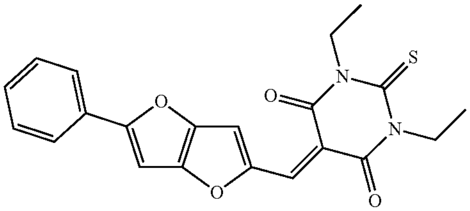
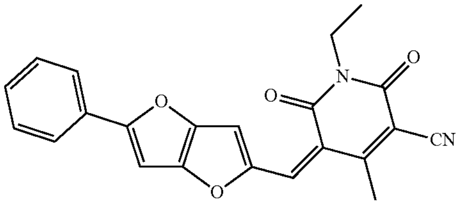
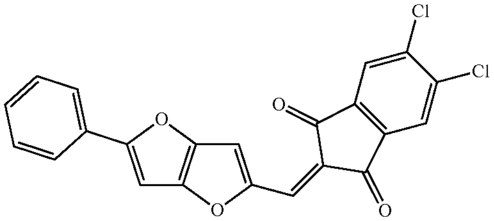
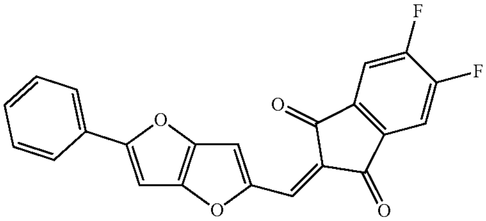
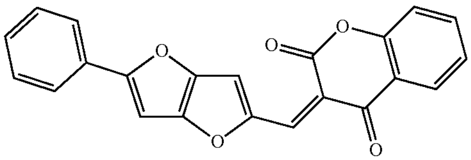
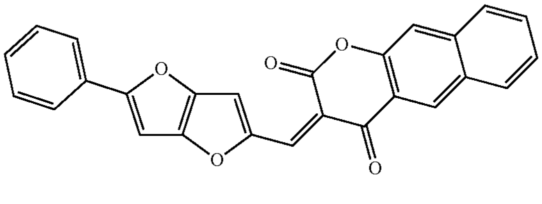
-continued
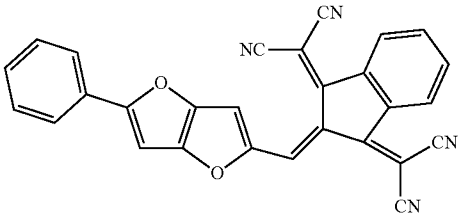
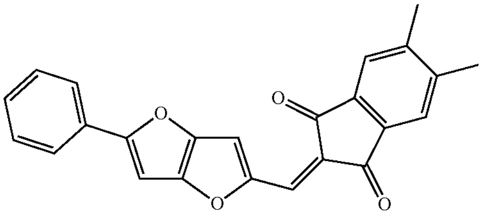
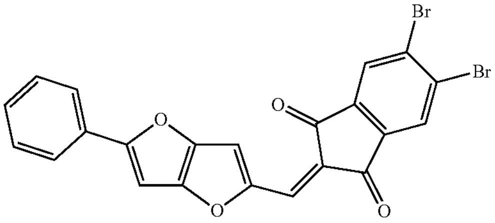
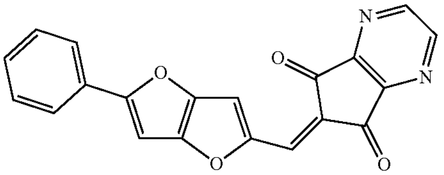
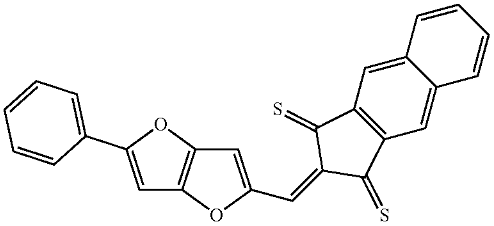
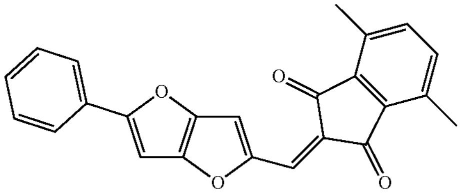
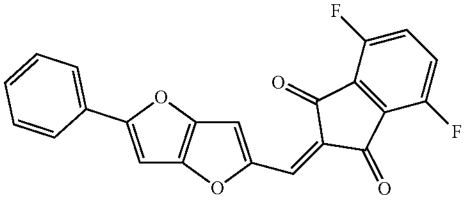
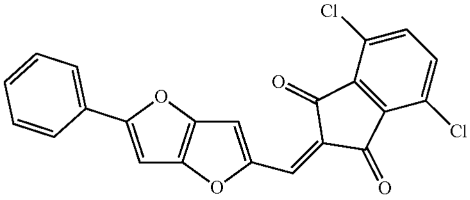

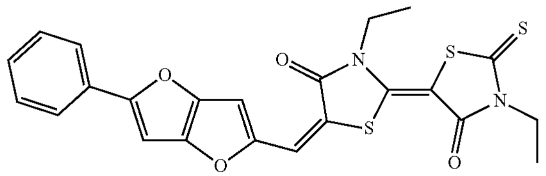
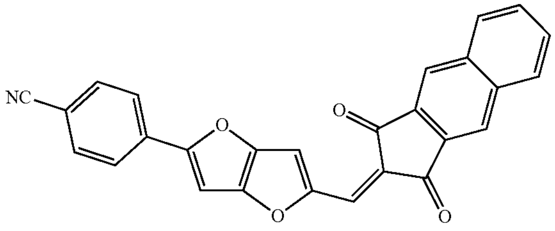
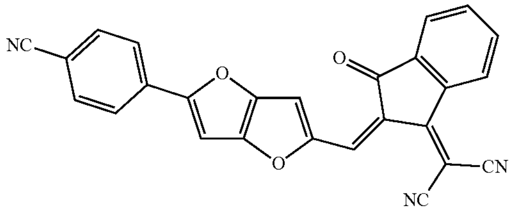
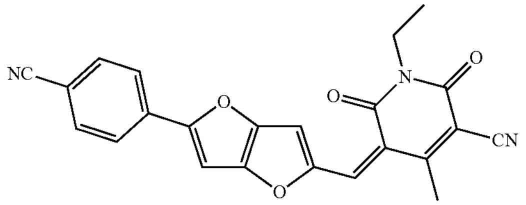
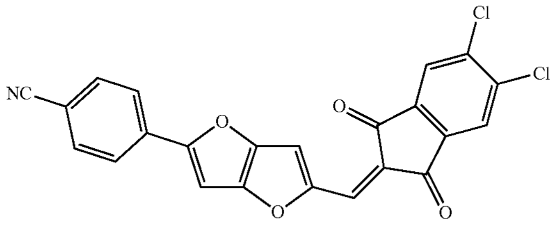
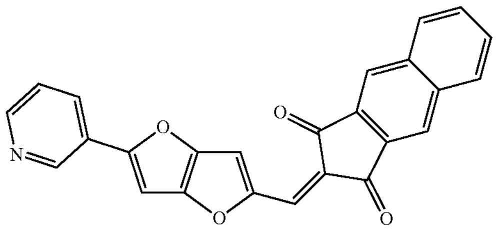
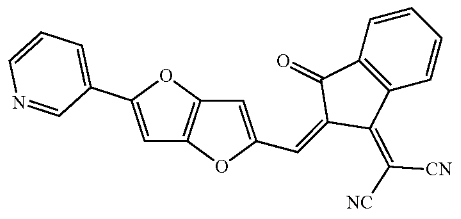
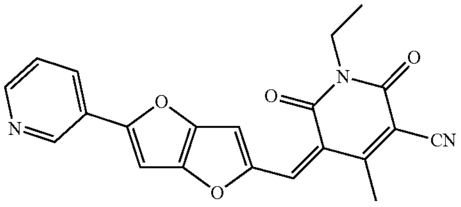
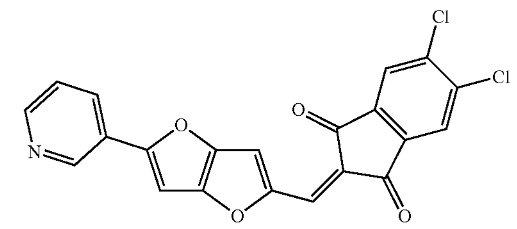
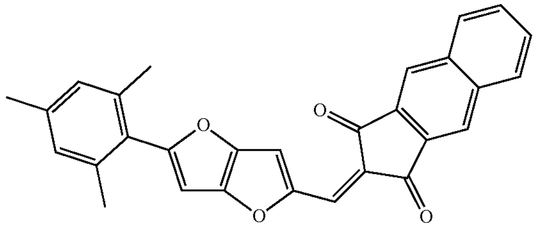
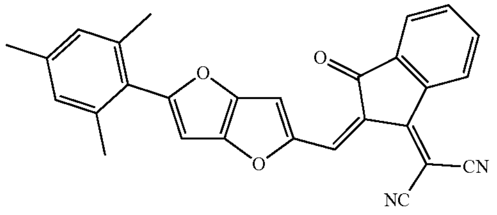
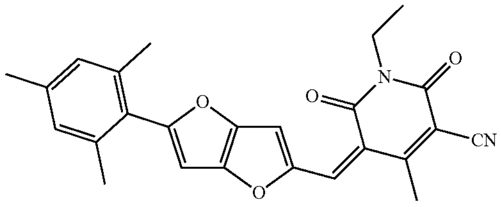
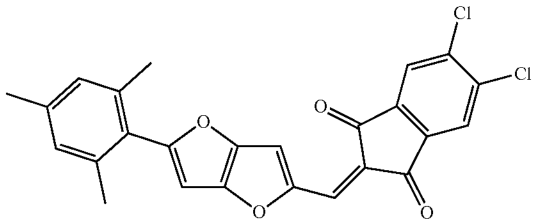
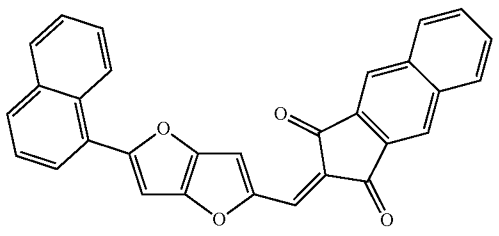
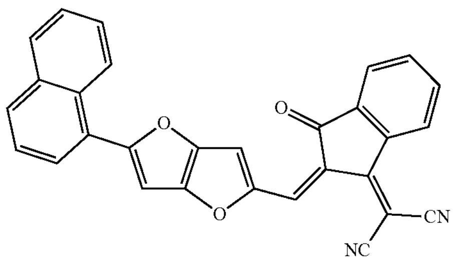

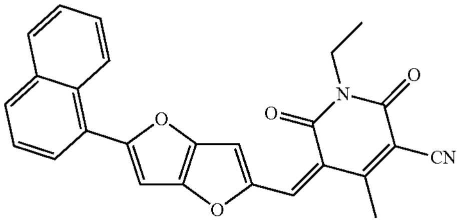
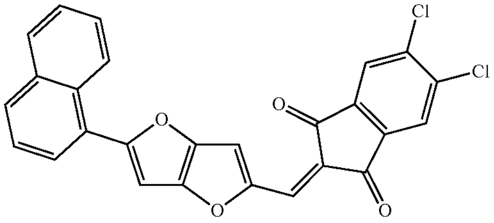
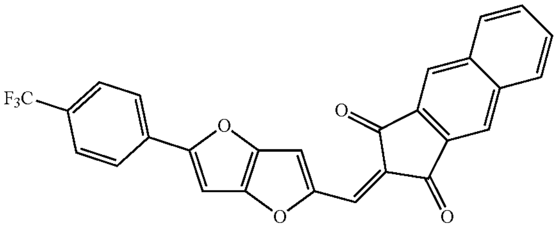
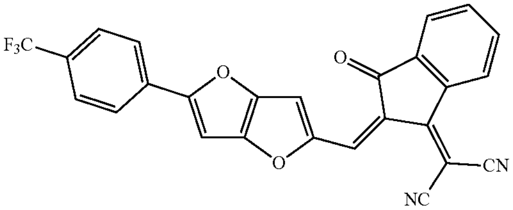
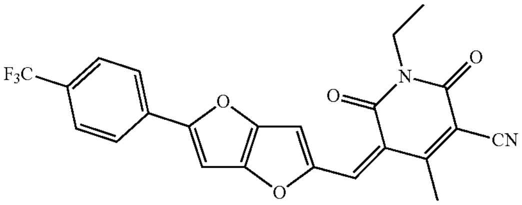
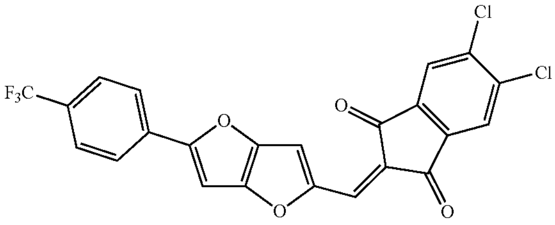
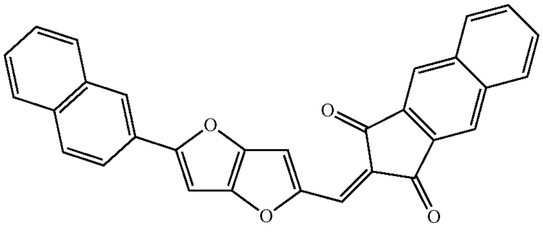
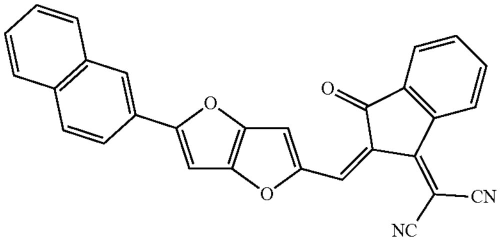
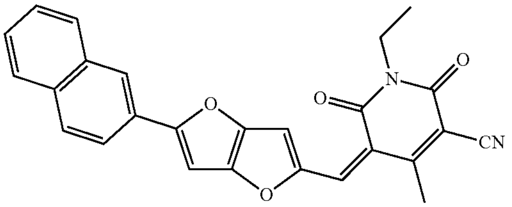
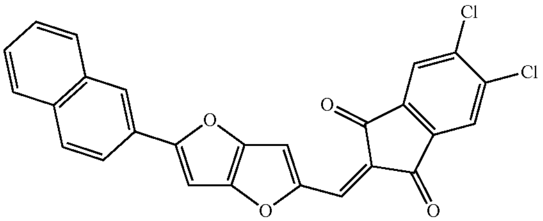
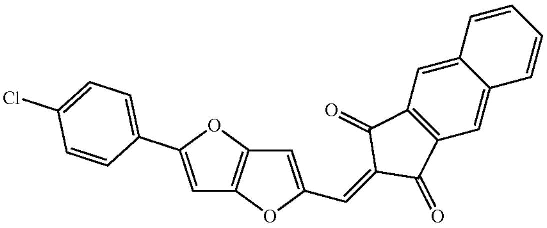
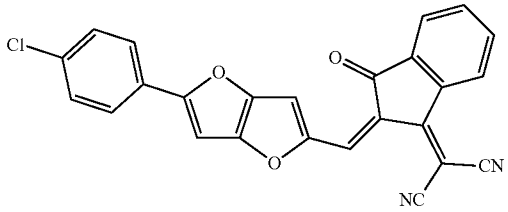
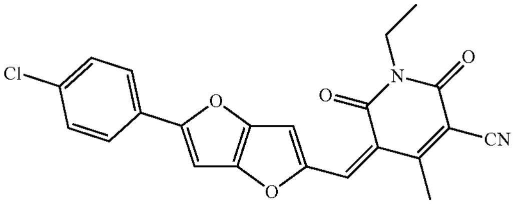
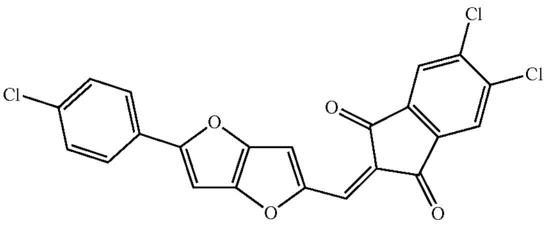

-continued
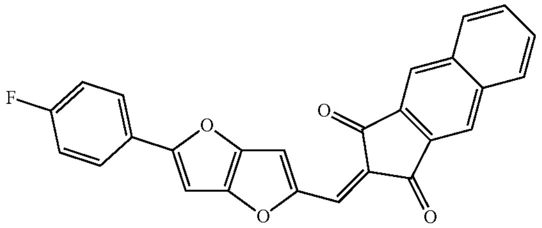
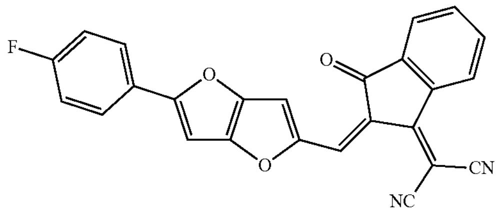
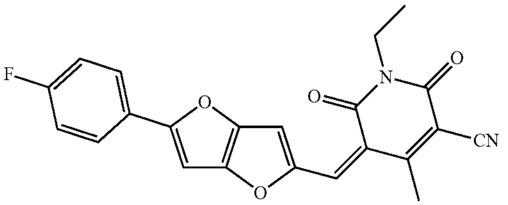
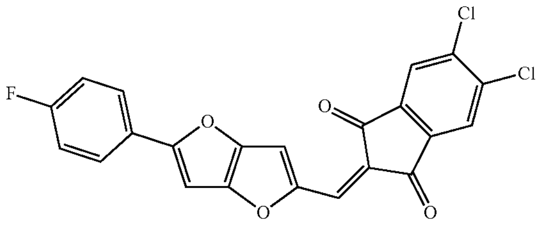
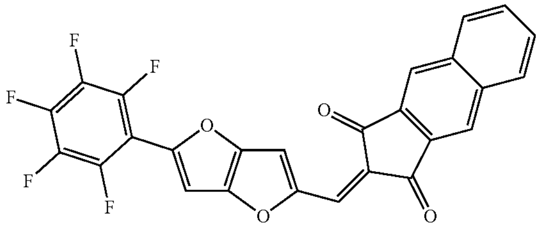
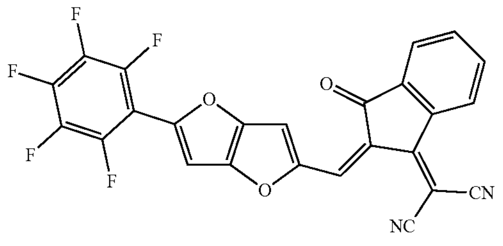
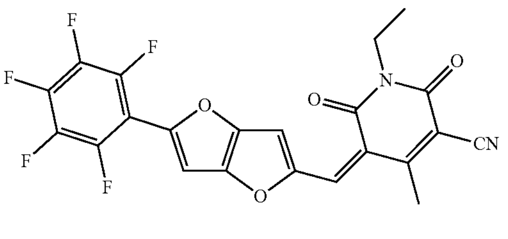
-continued
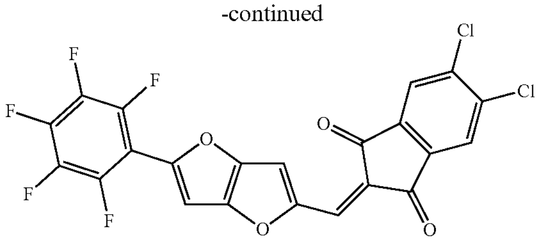
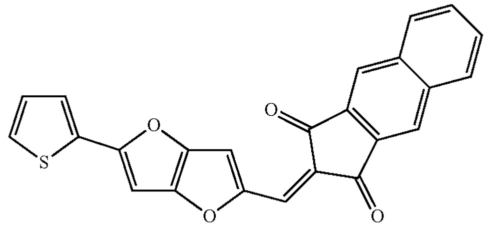
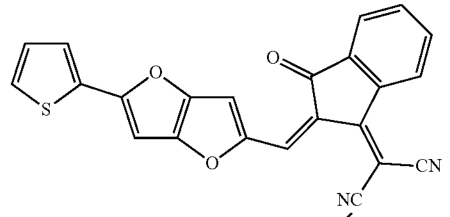
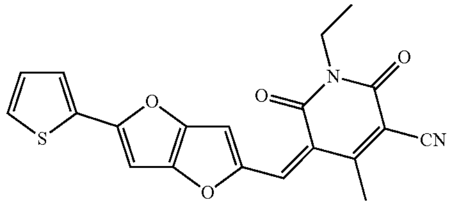
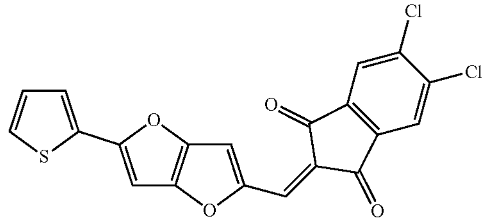
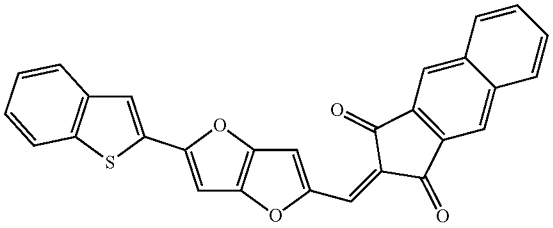
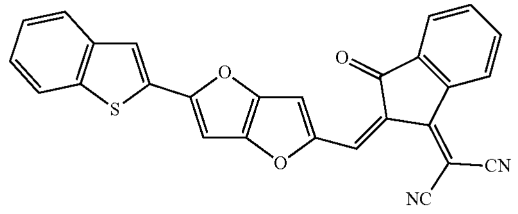
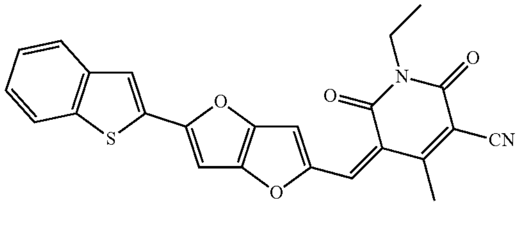

-continued
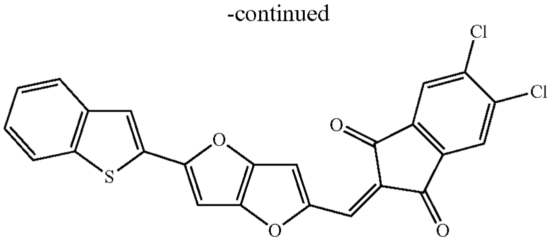
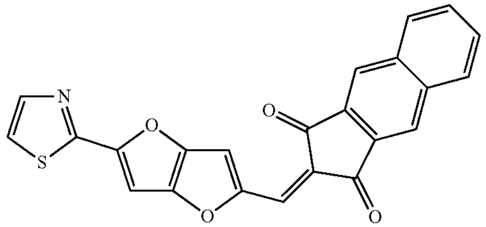
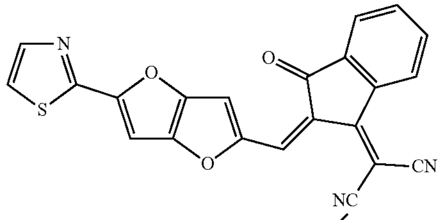
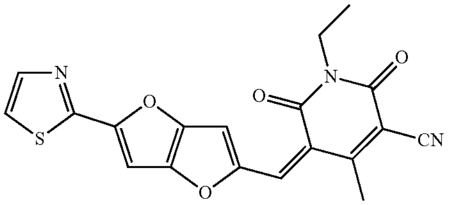
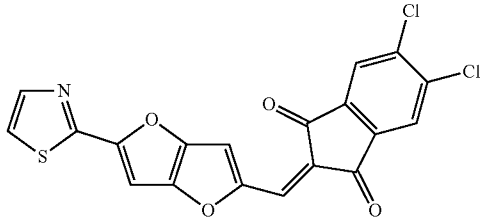
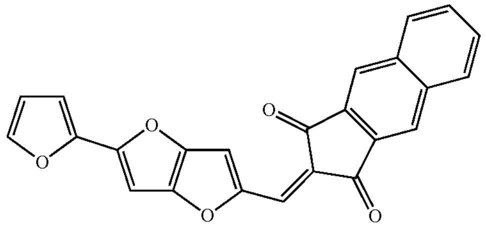
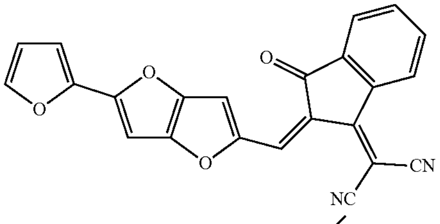
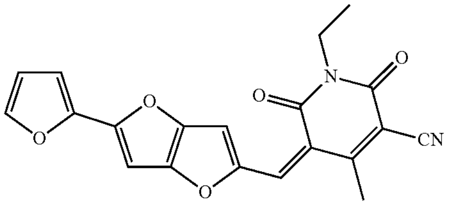
-continued
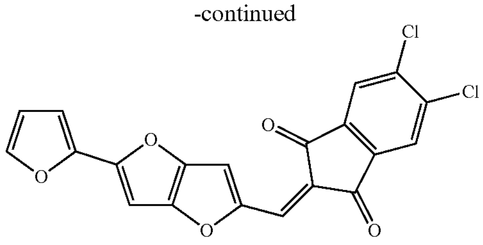
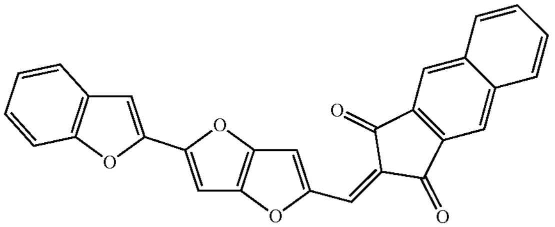
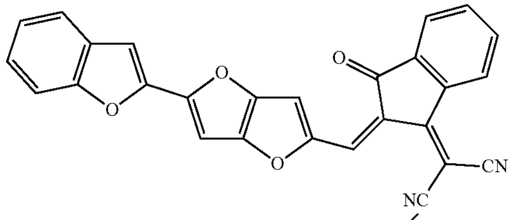
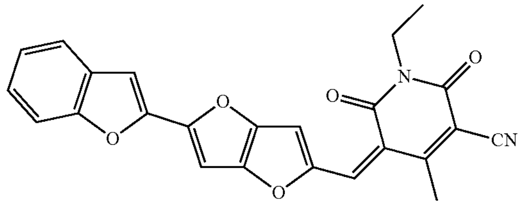
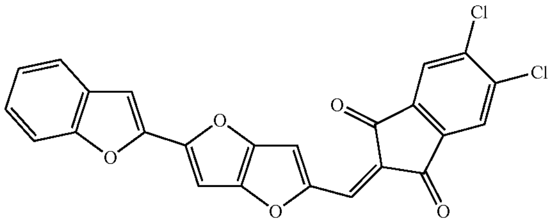
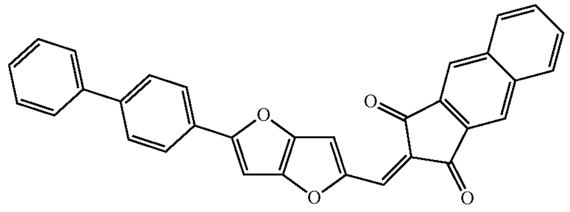
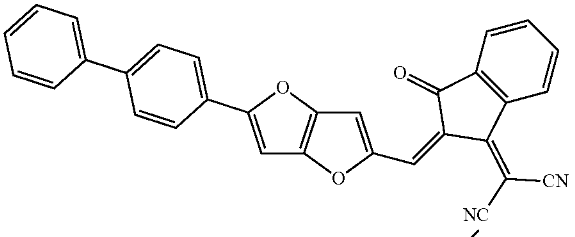
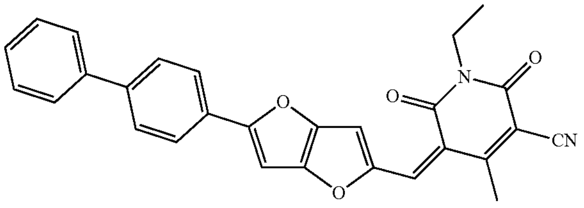

-continued
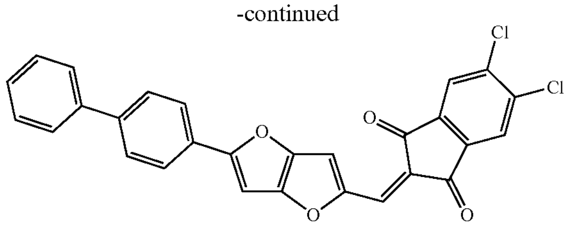
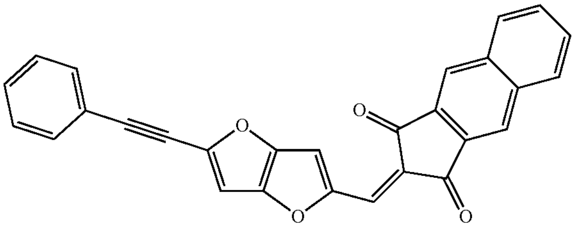
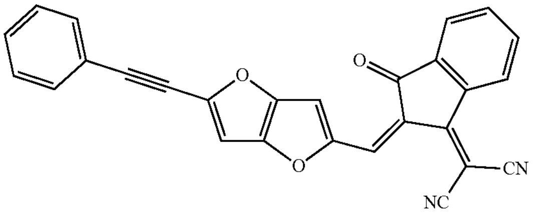
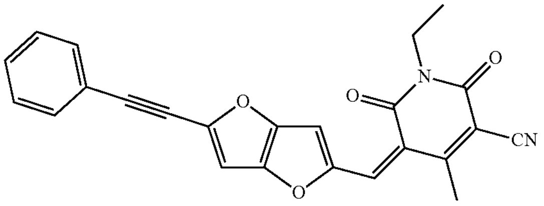
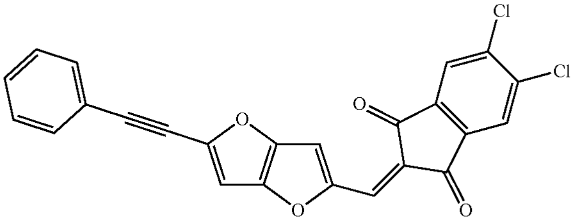
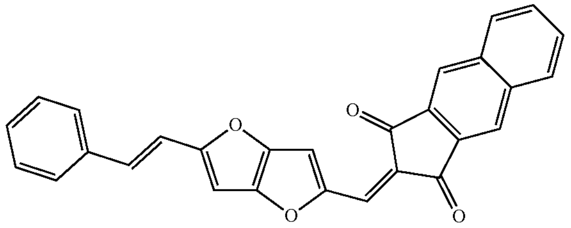
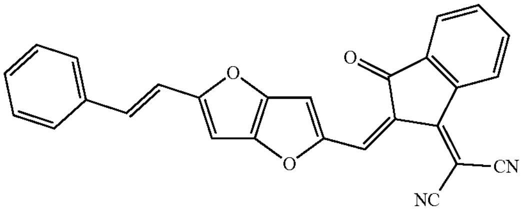
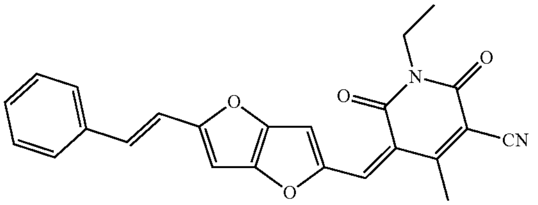
-continued
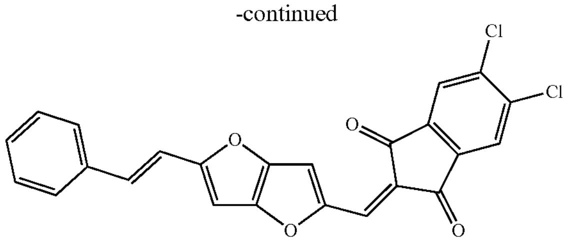
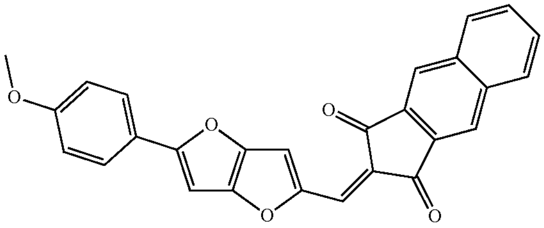
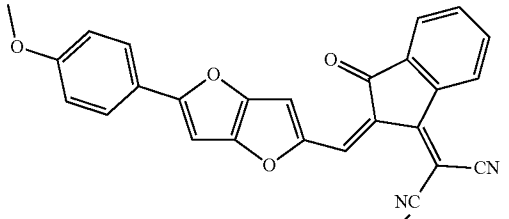
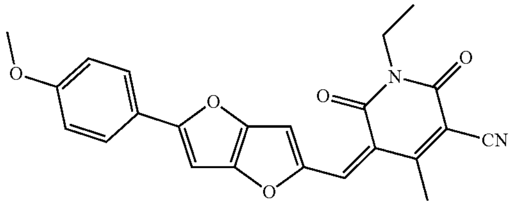
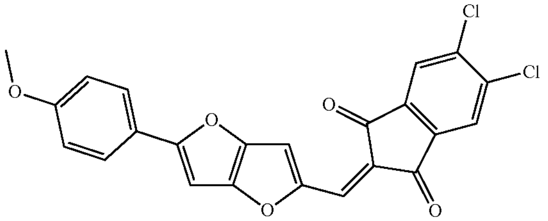
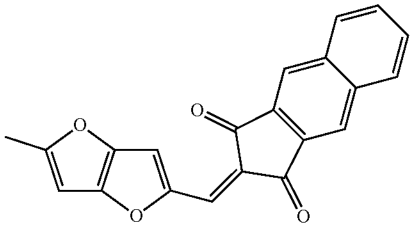
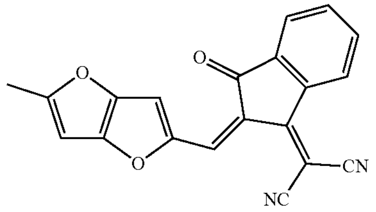
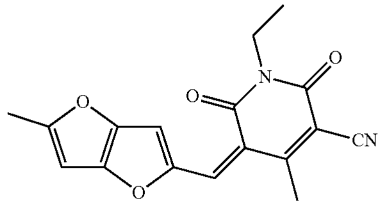

-continued
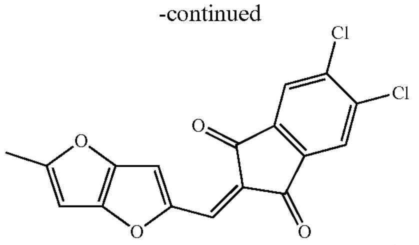
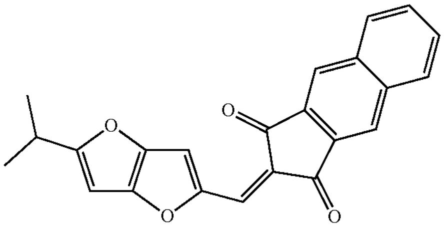
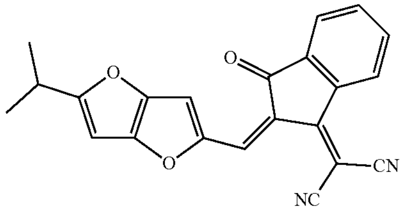
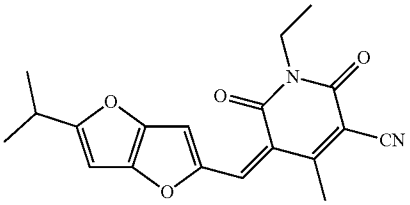
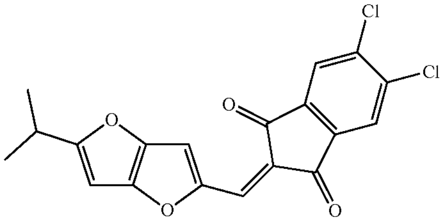
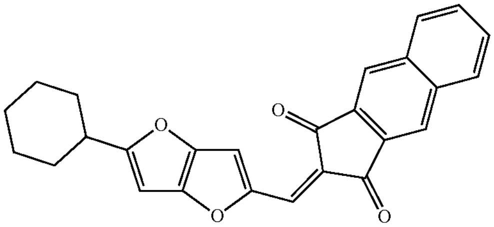
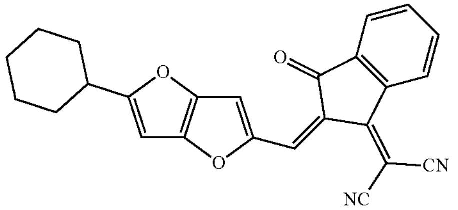
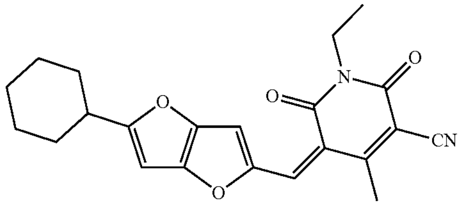
-continued
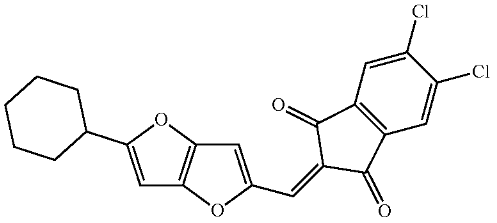
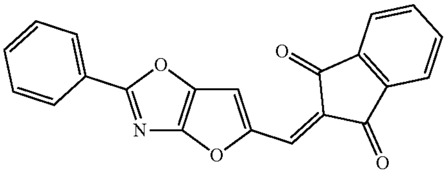
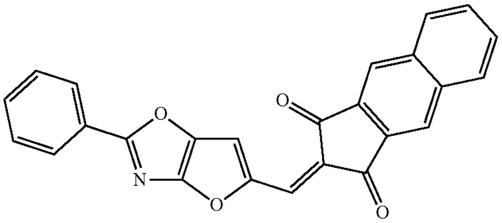
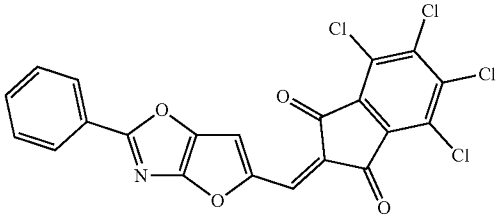
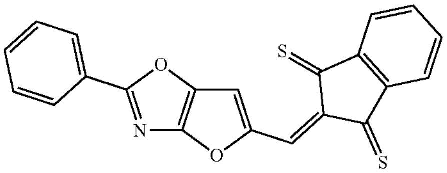
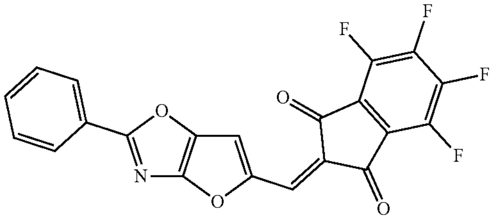
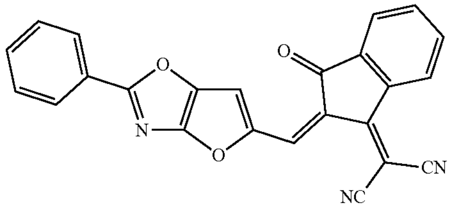
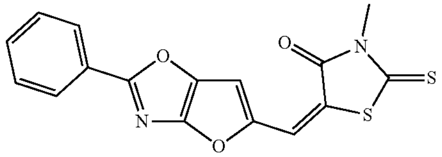

-continued
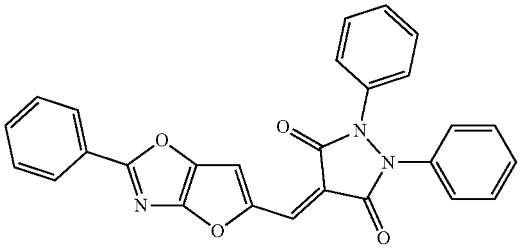
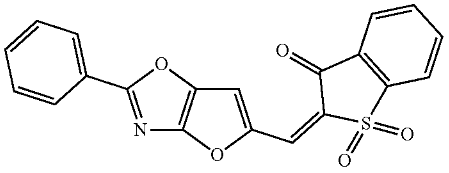
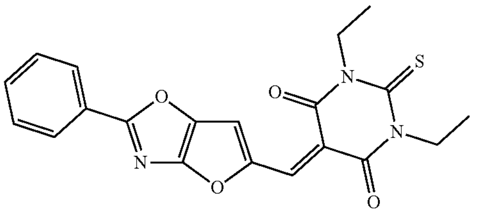
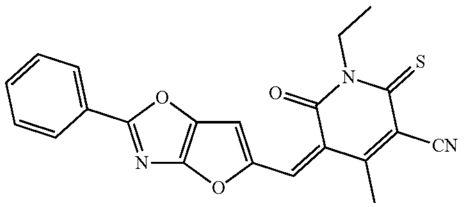
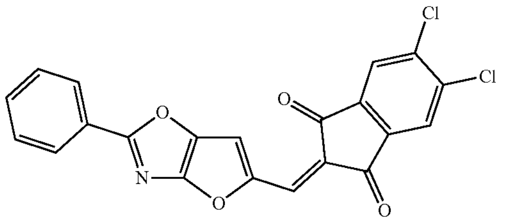
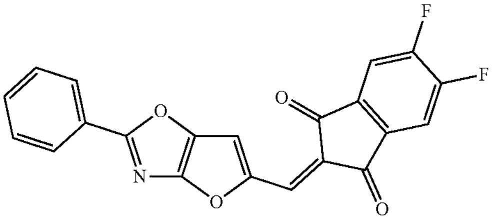
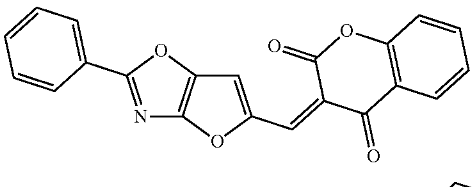
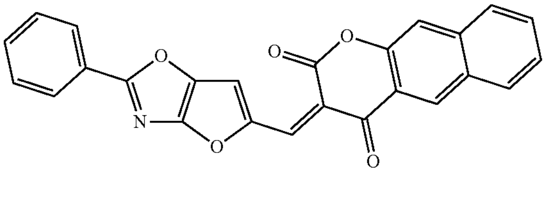
-continued
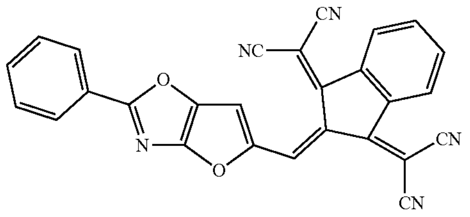
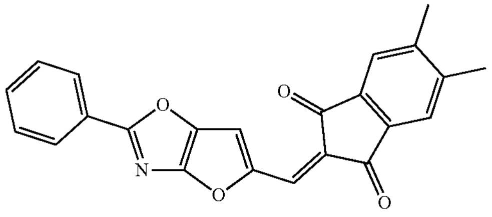
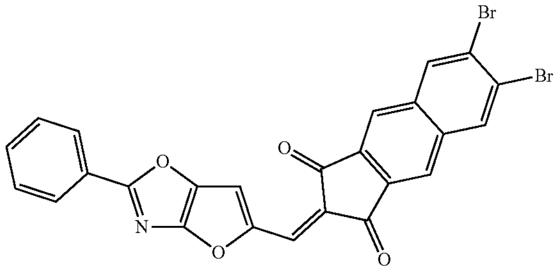
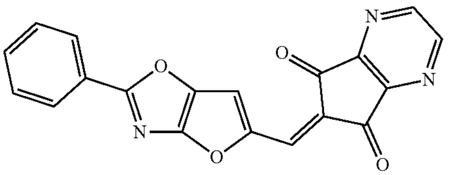
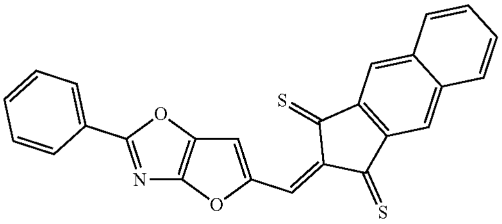
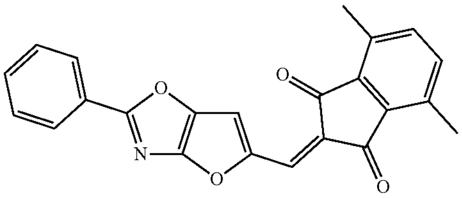
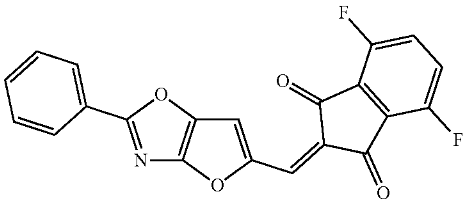
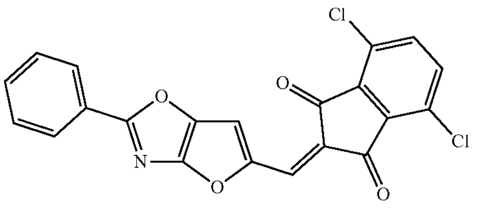

-continued
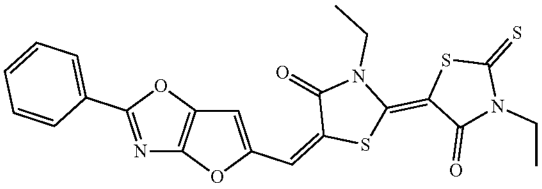
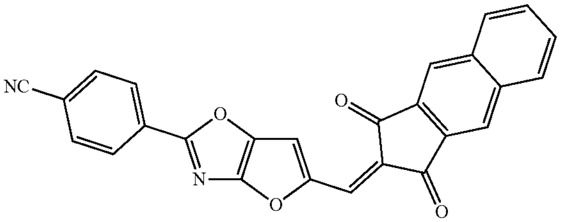
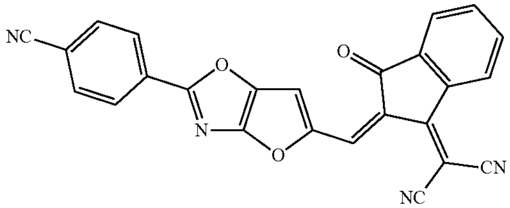
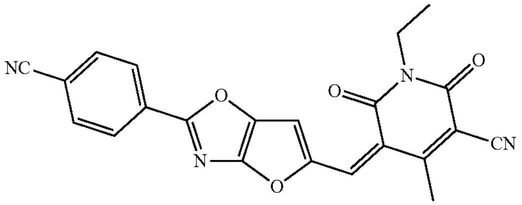
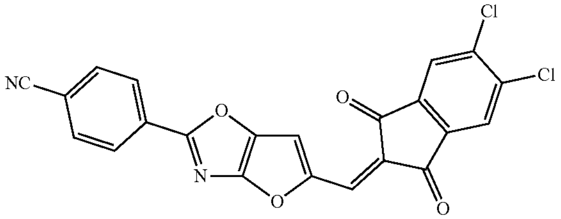
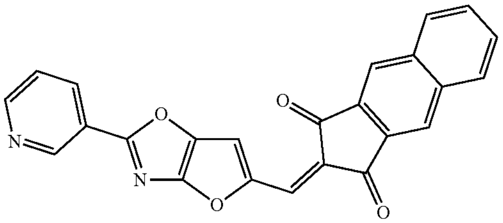
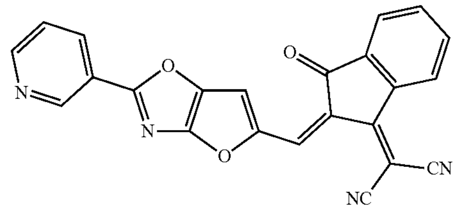
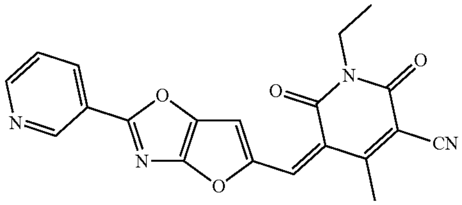
-continued
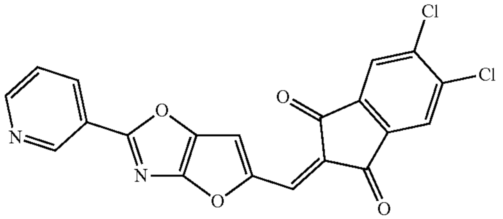
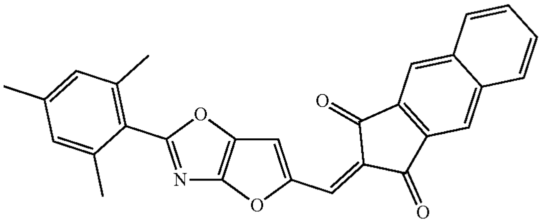
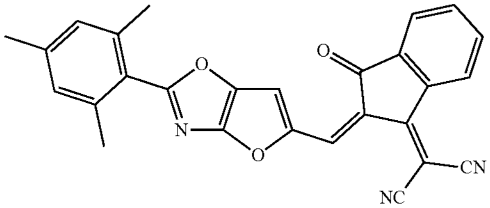
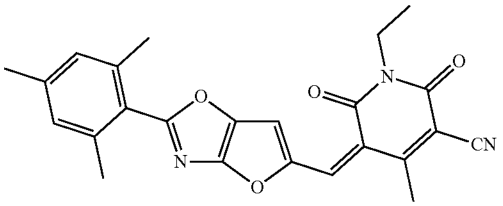
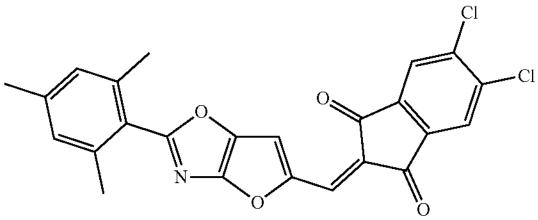
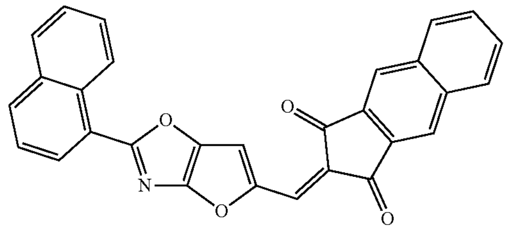
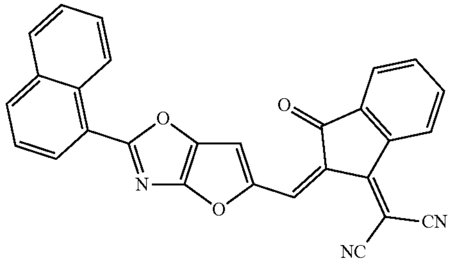

-continued
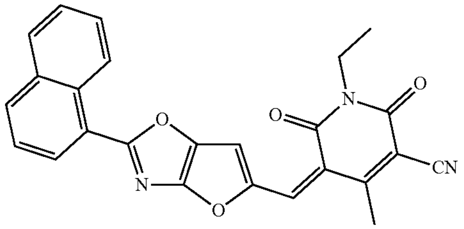
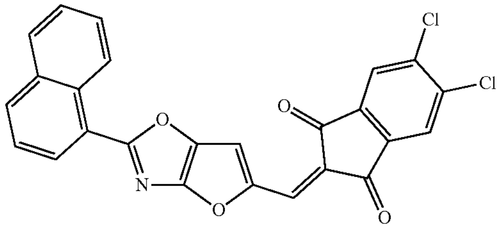
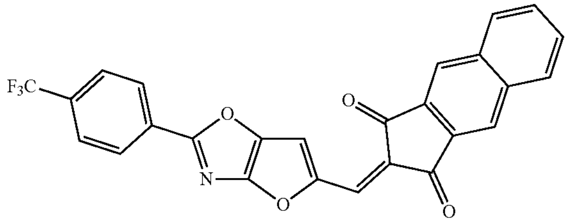
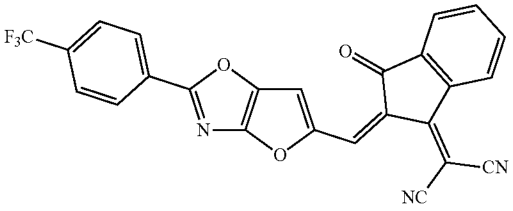
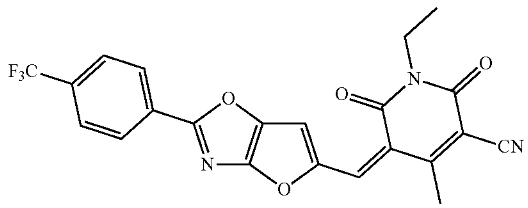
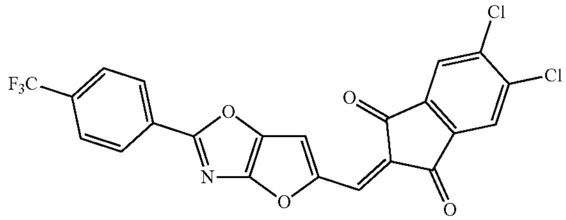
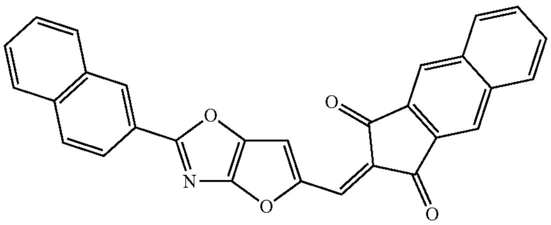
-continued
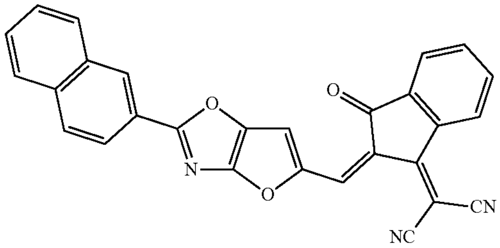
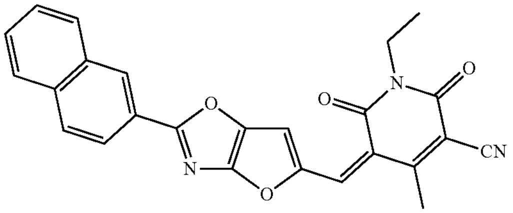
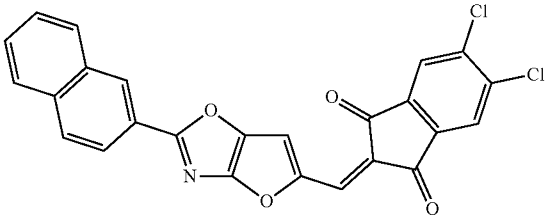
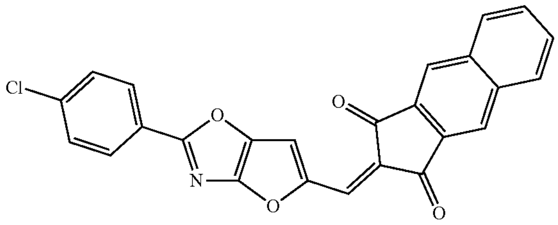
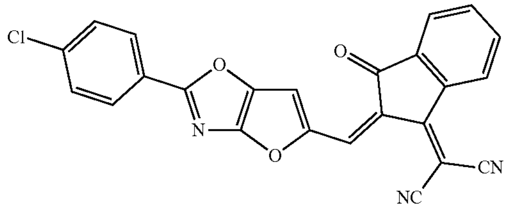
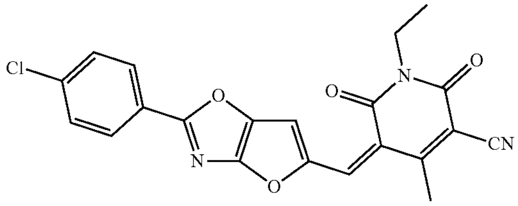
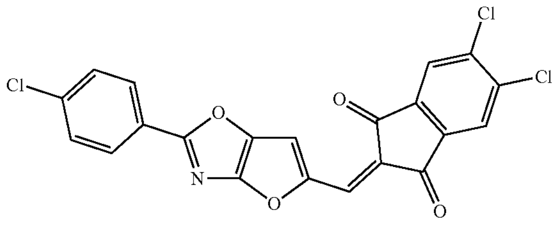

-continued
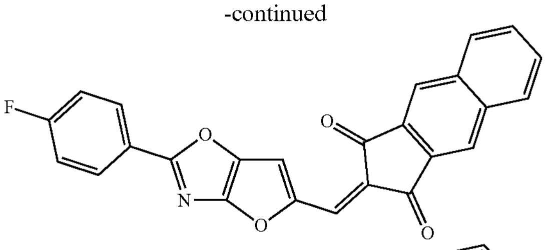
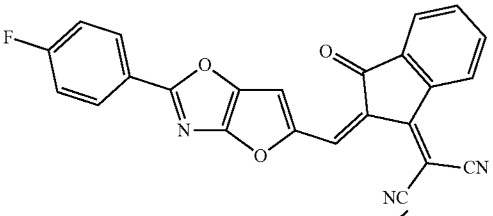
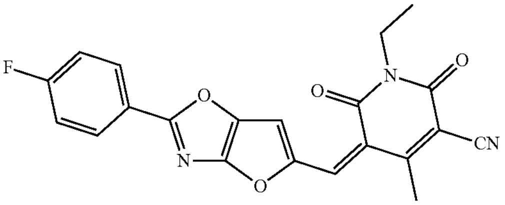
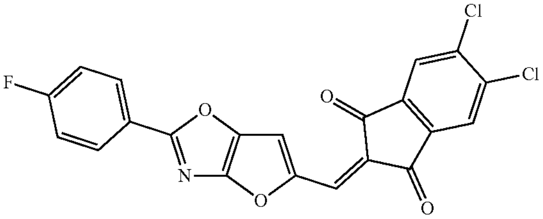
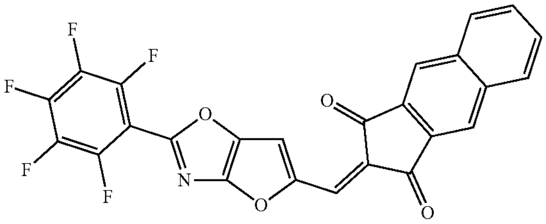
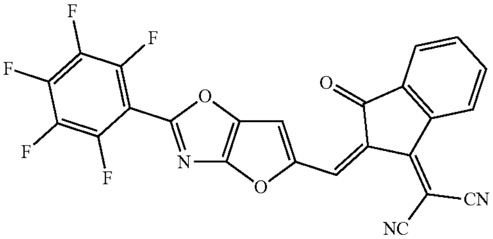
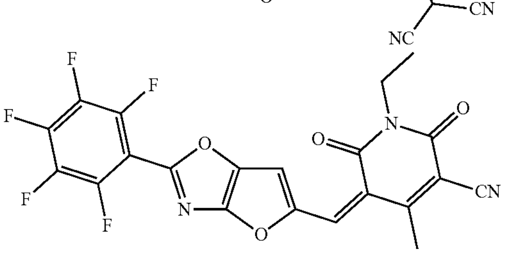
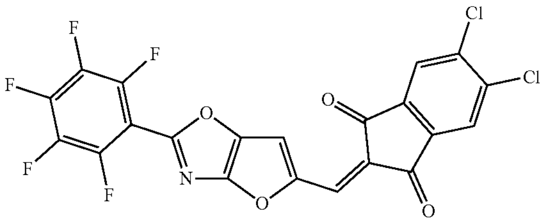
-continued
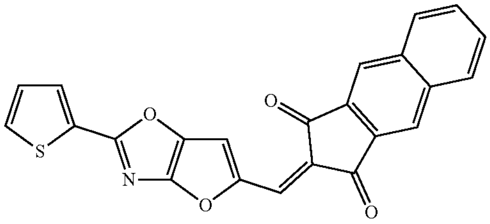
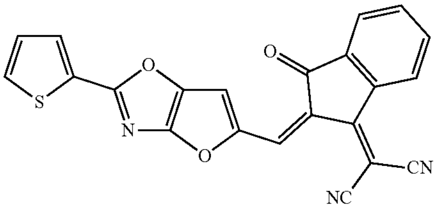
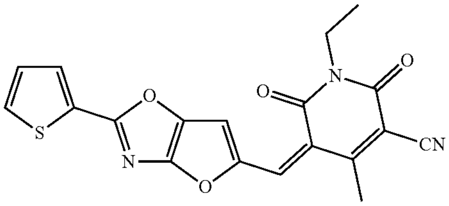
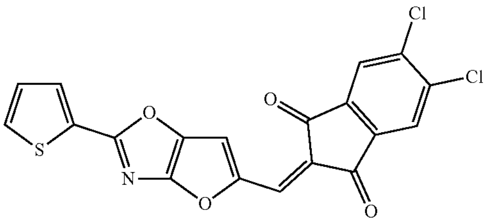
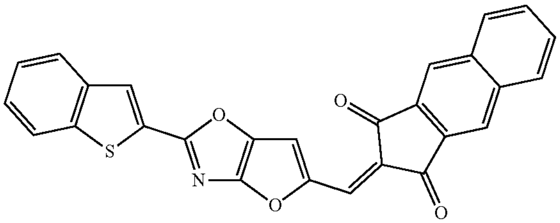
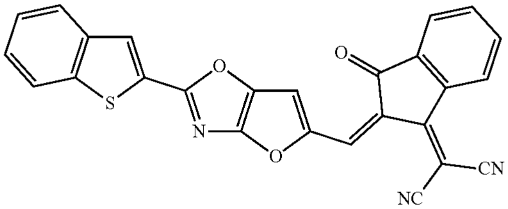
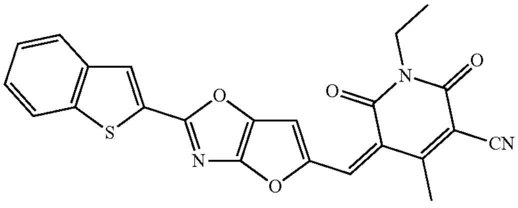
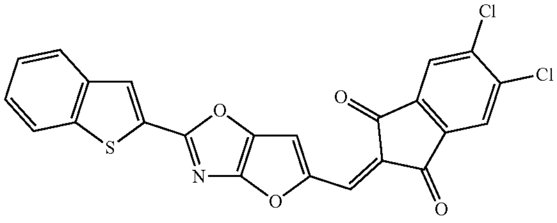

-continued
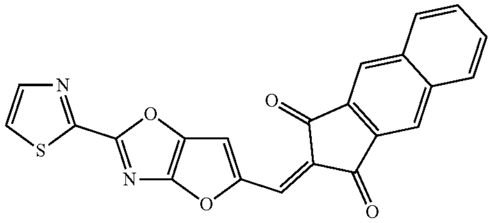
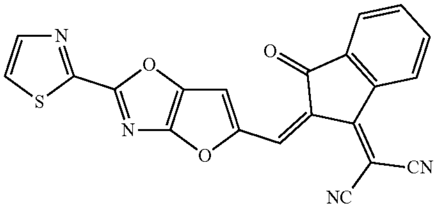
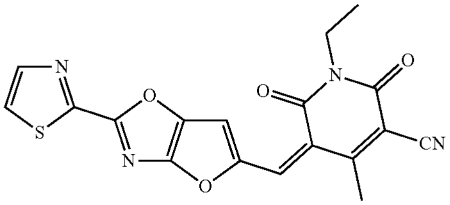
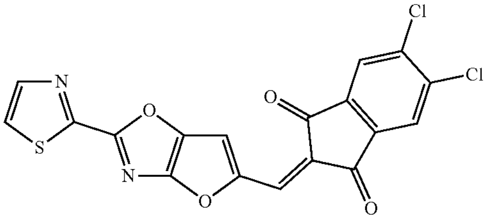
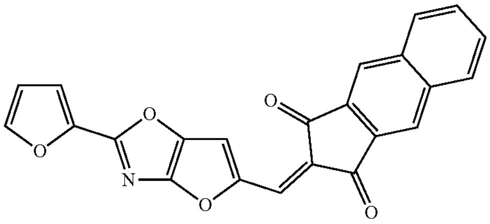
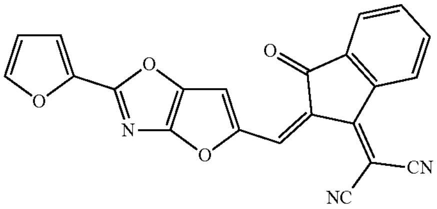
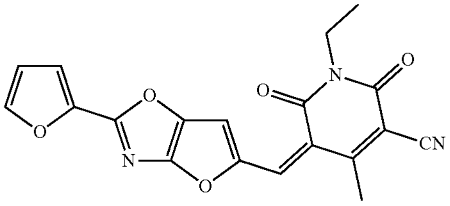
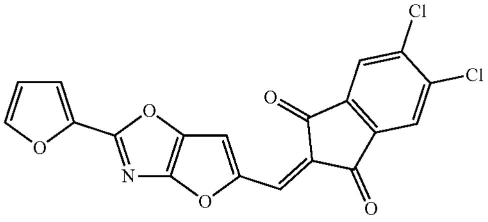
-continued
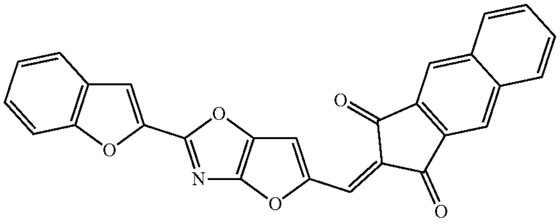
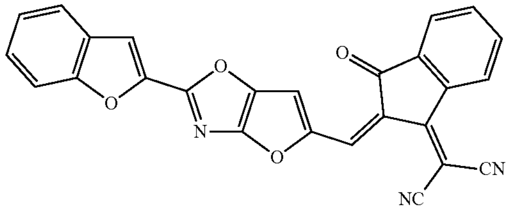
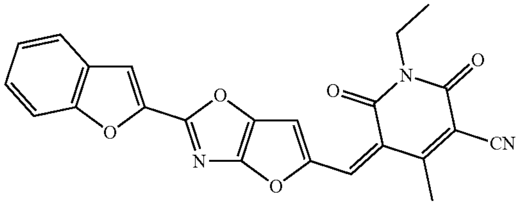
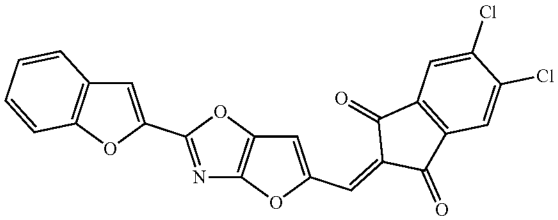
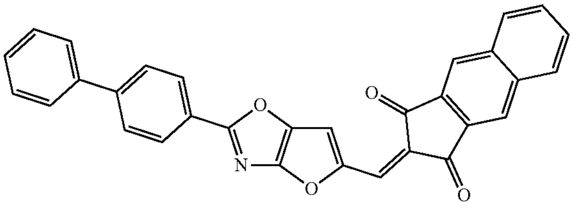
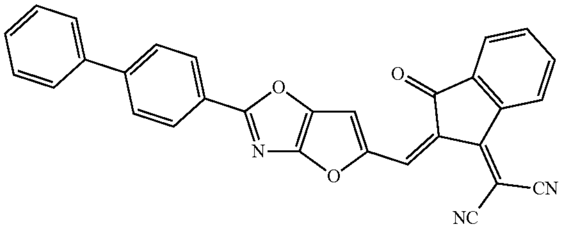
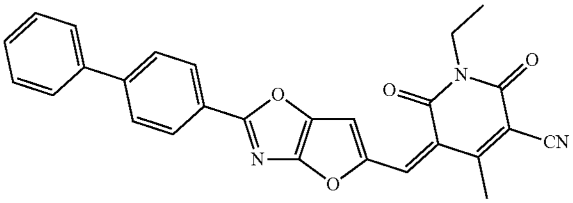
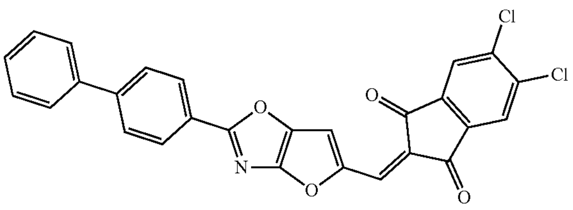

-continued
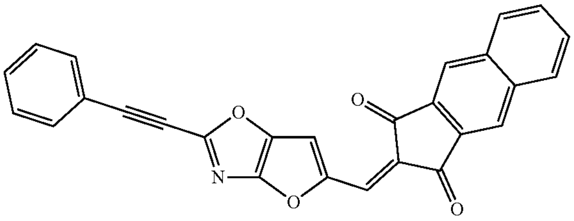
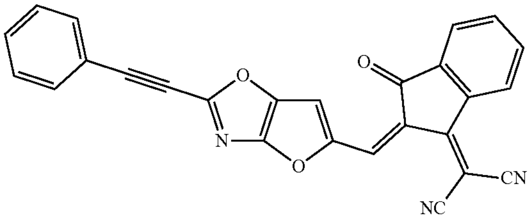
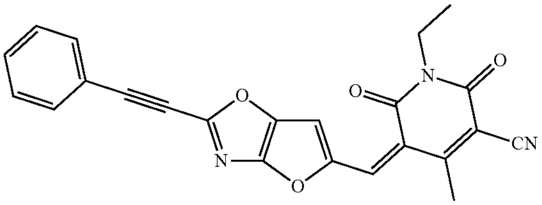
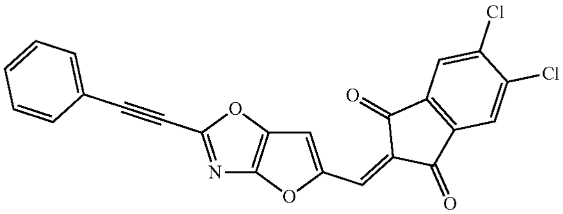
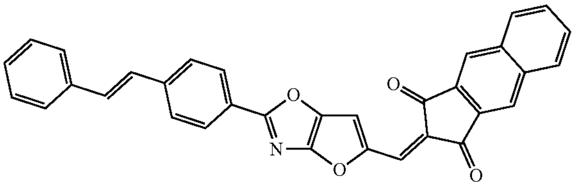
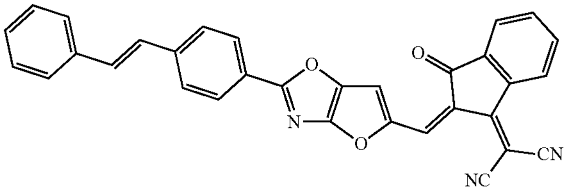
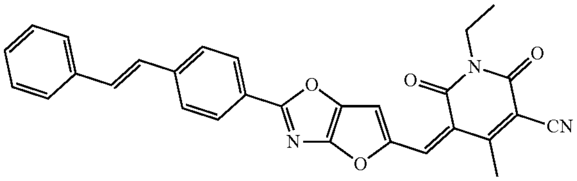
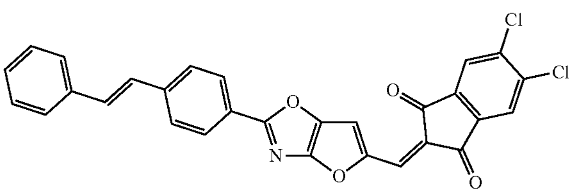
-continued
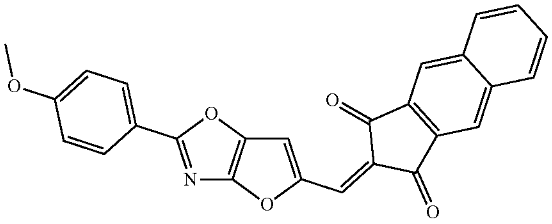
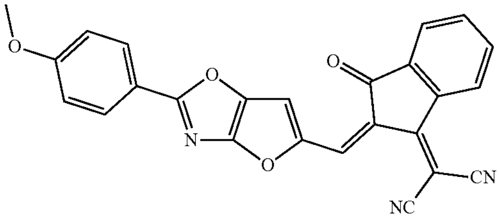
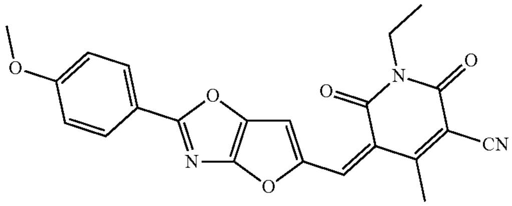
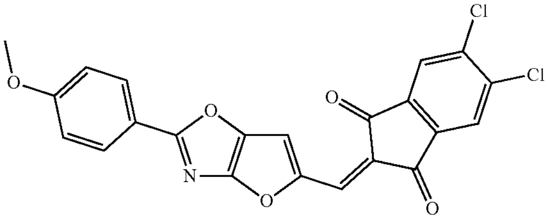
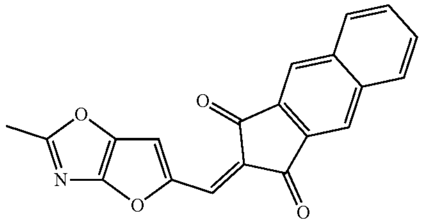
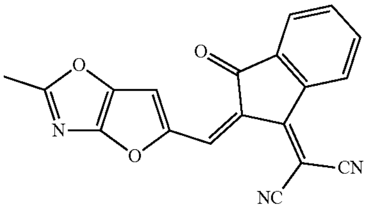
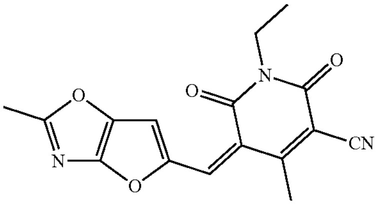
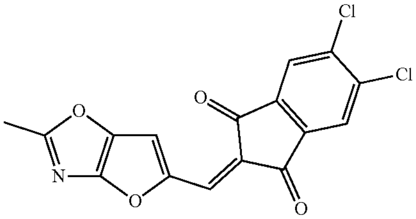

-continued
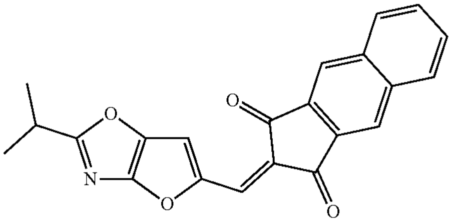
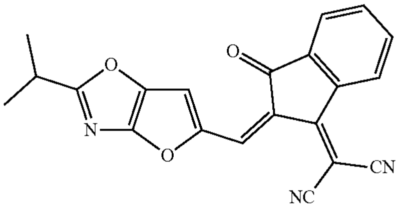
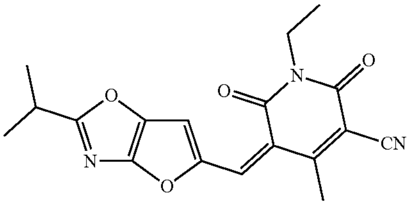
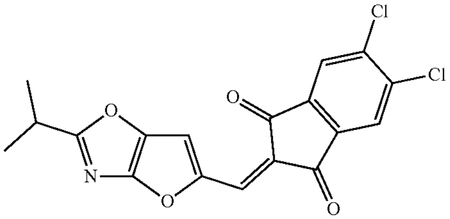
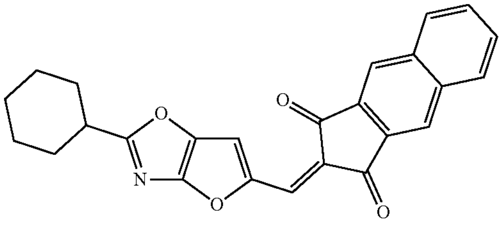
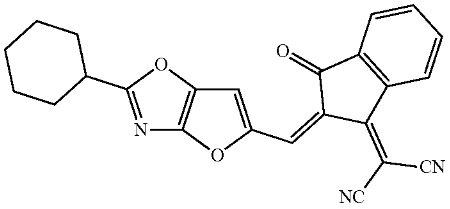
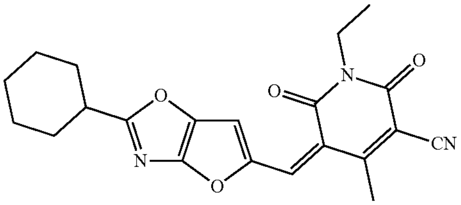
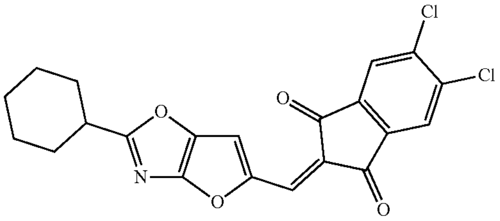
-continued
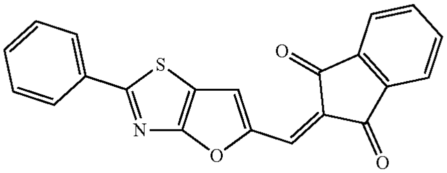
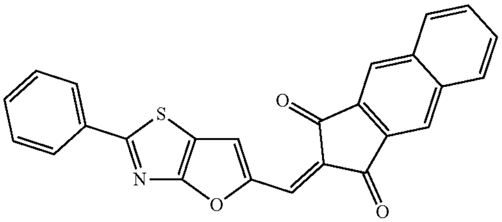
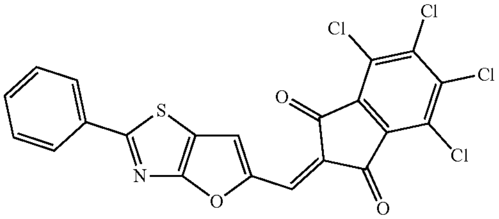
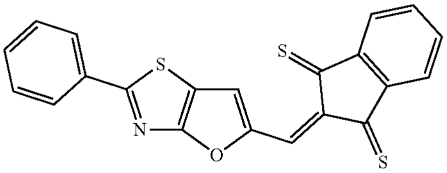
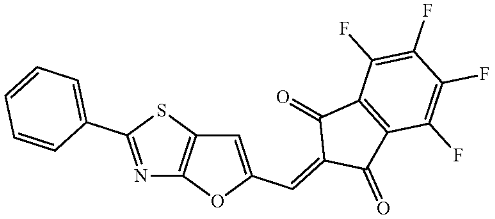
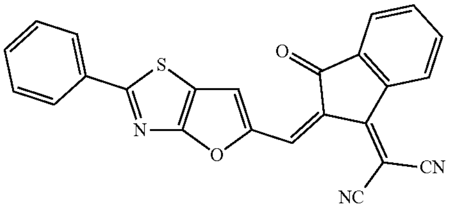
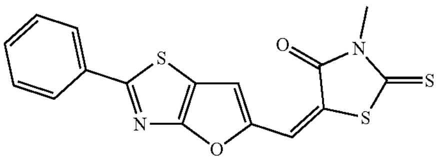
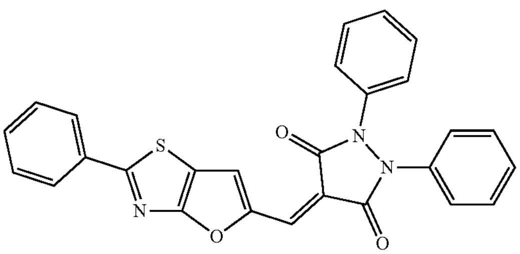

-continued
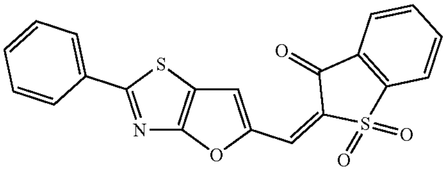
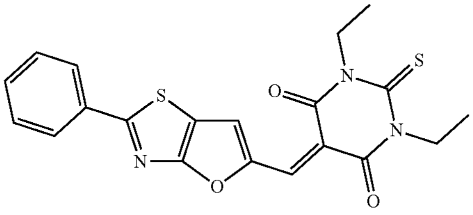
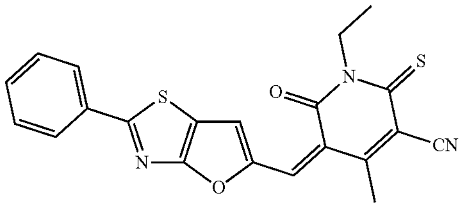
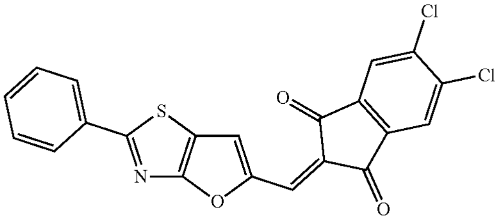
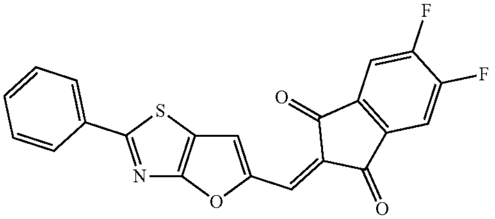
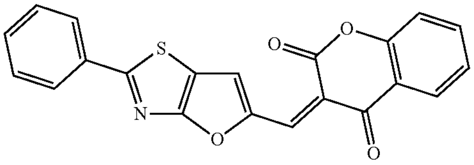
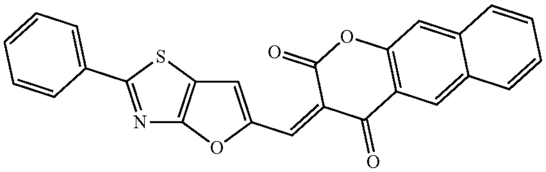
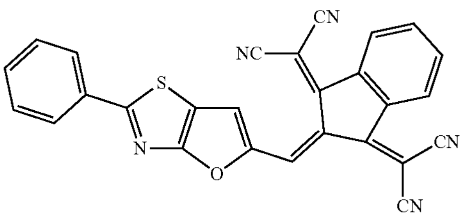
-continued
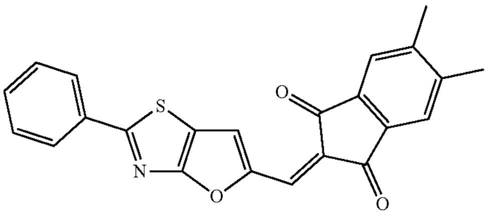
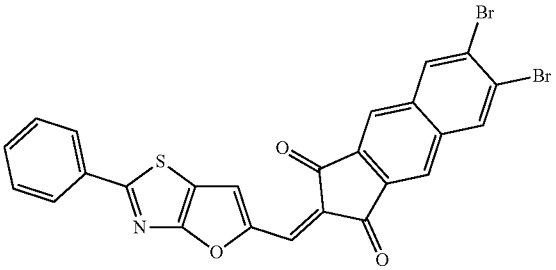
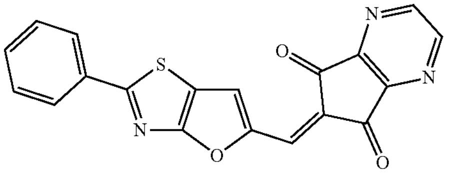
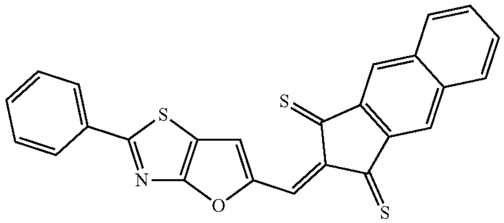
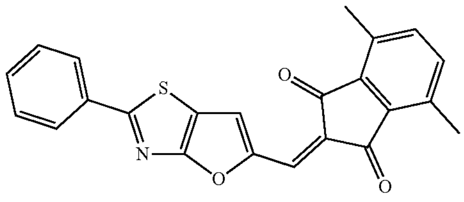
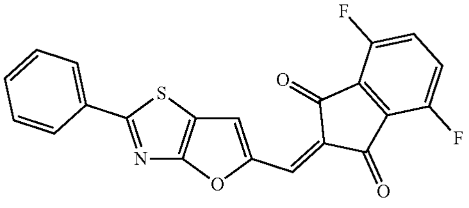
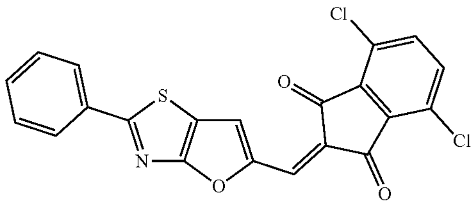
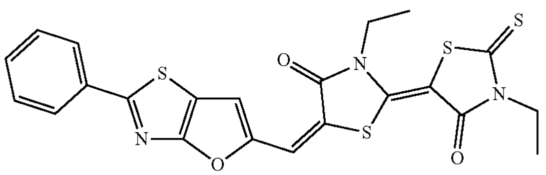

-continued
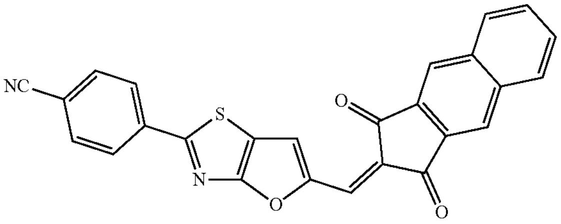
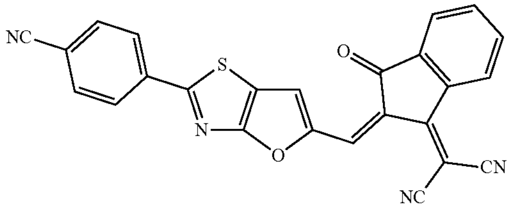
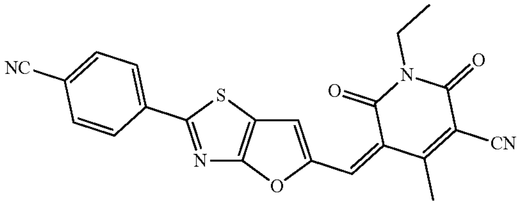
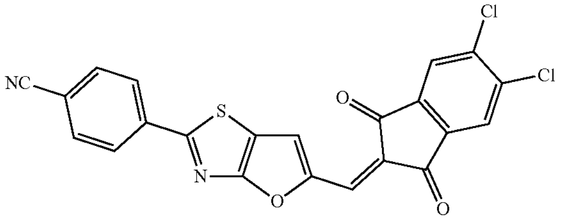
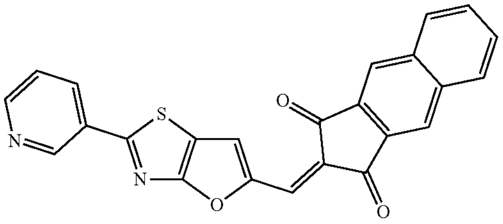
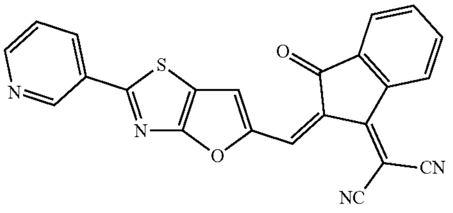
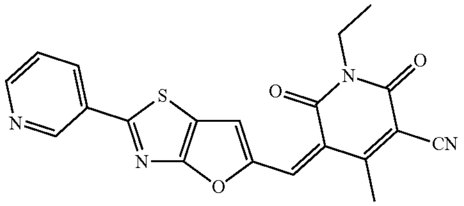
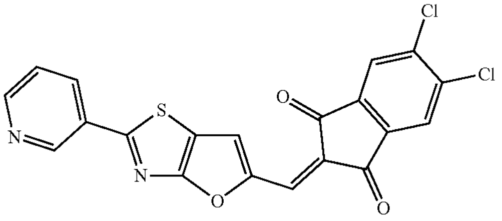
-continued
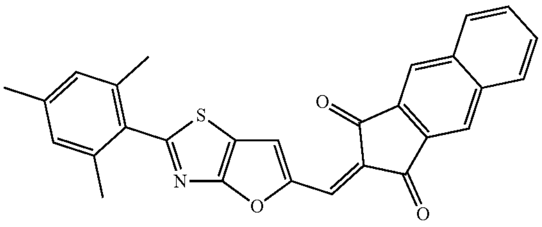
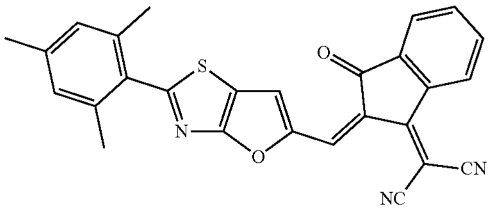
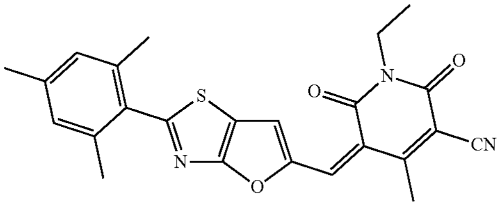
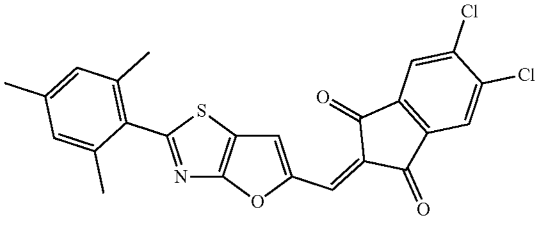
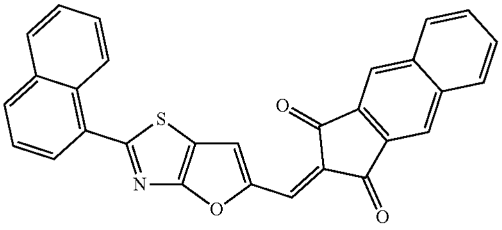
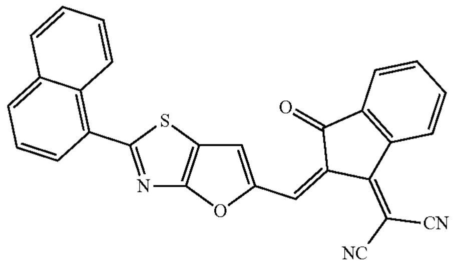
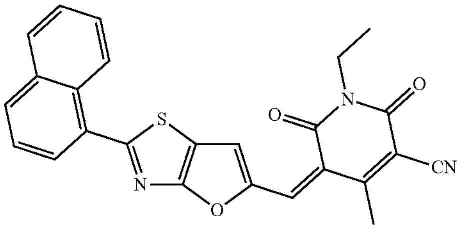

-continued
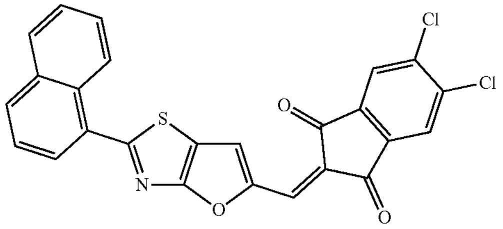
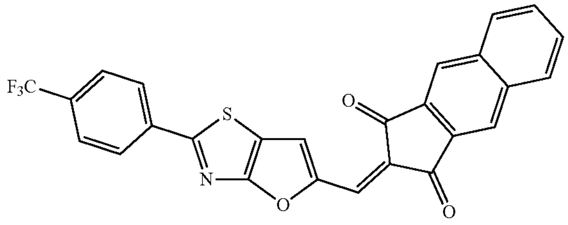
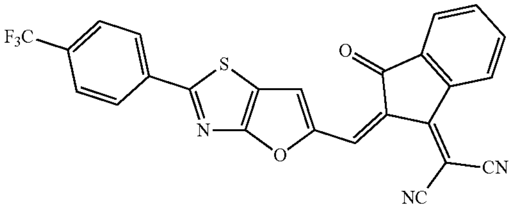
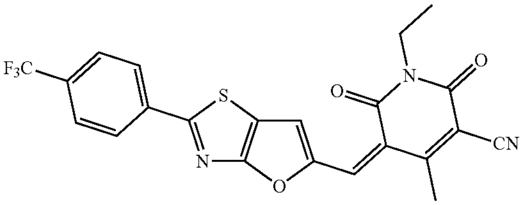
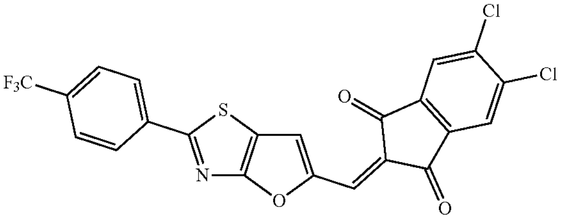
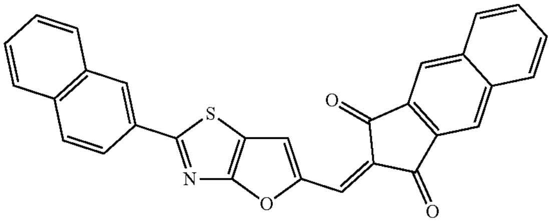
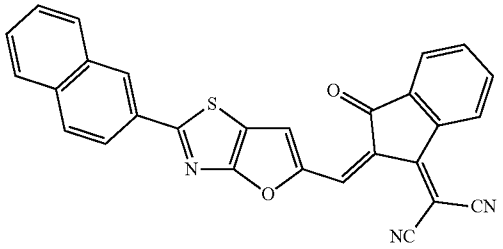
-continued
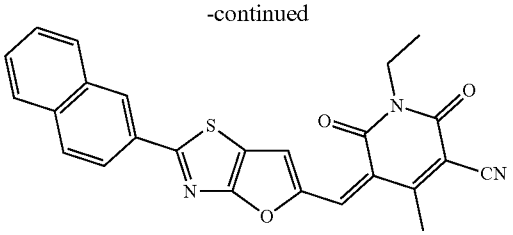
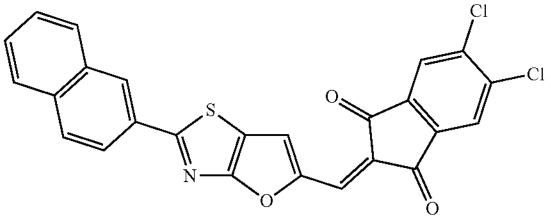
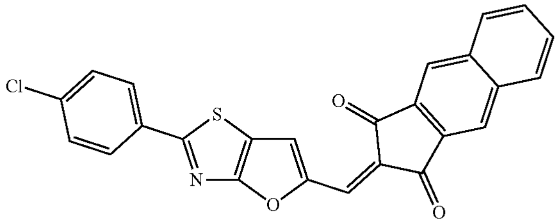
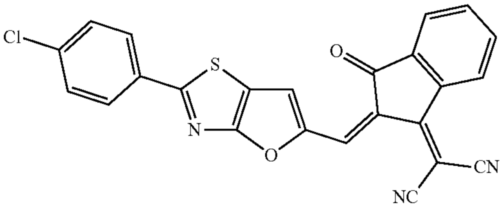
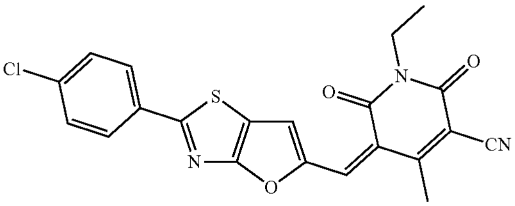
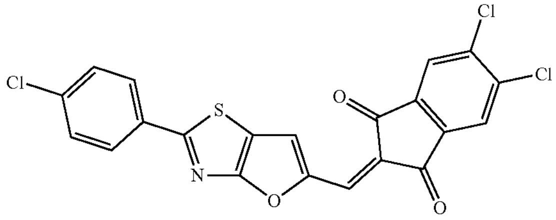
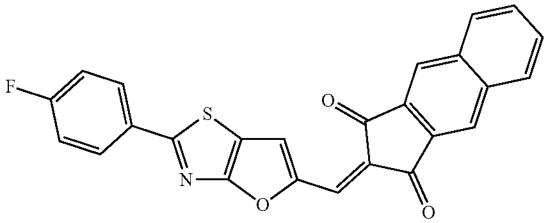
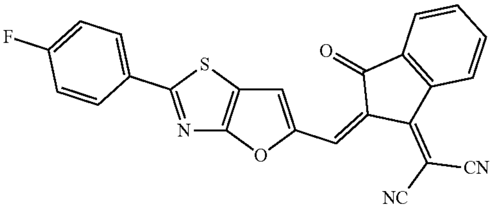

-continued
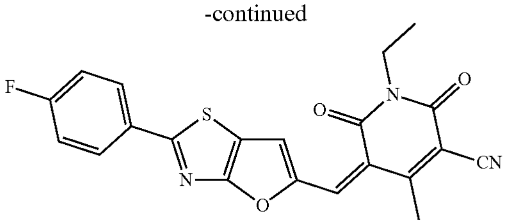
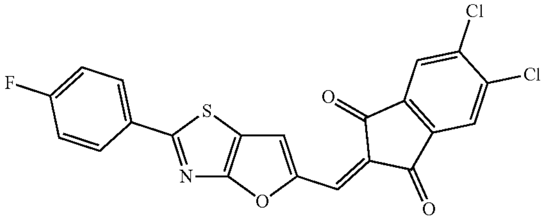
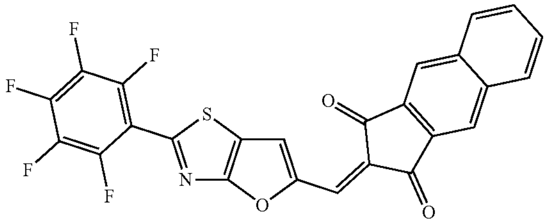
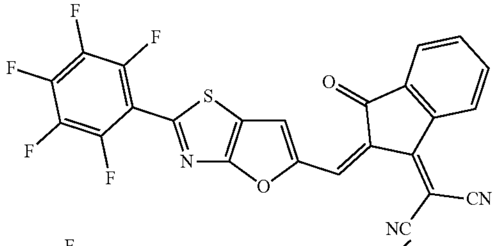
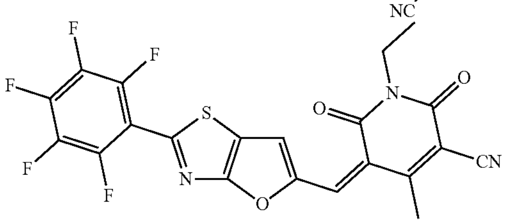
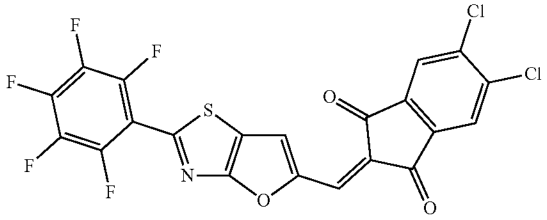
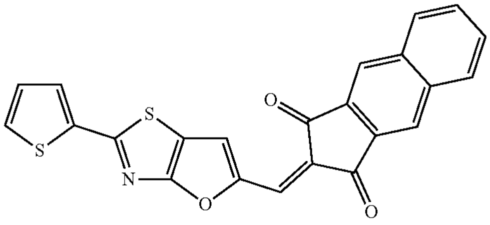
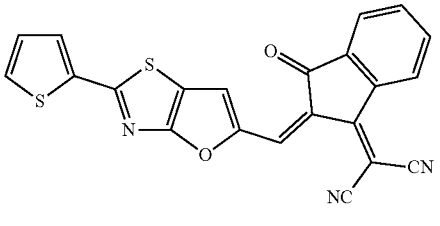
-continued
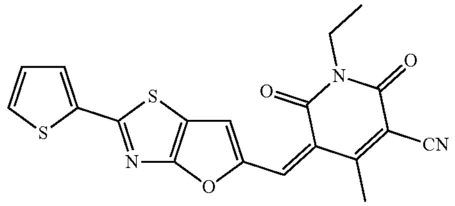
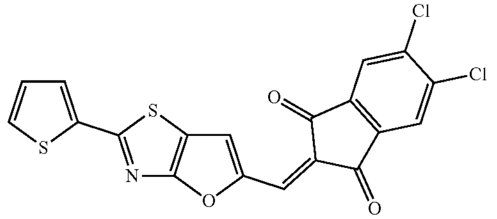
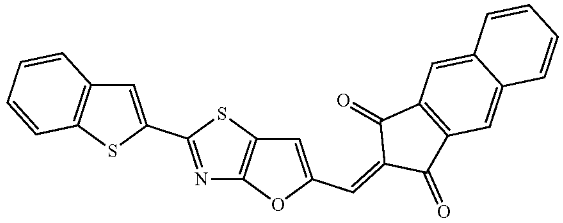
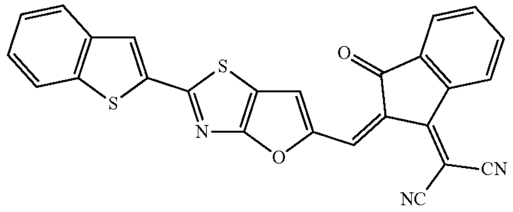
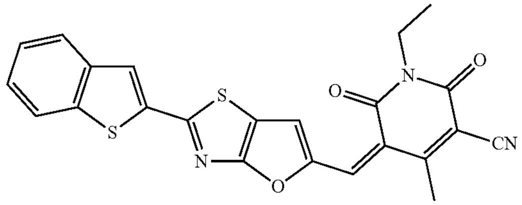
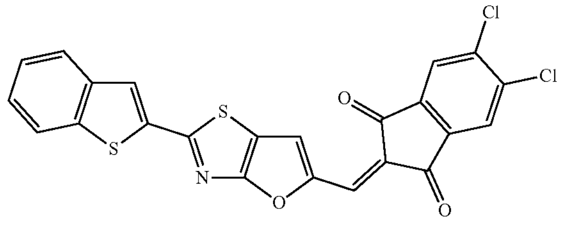
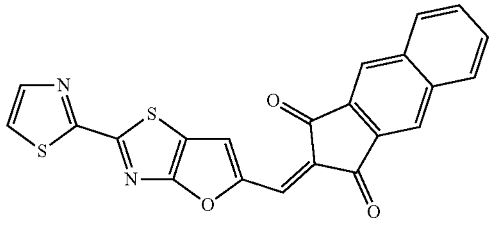
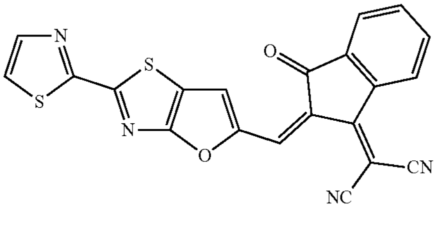

-continued
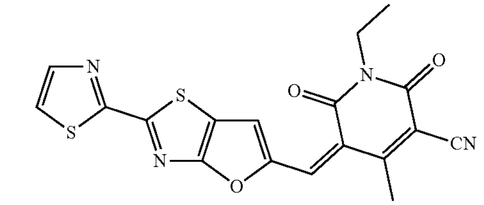
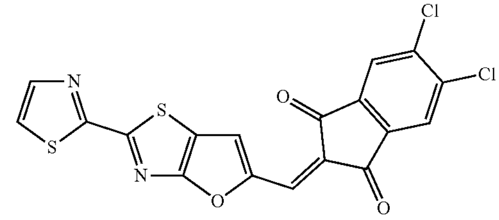
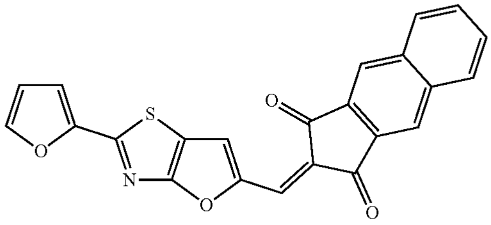
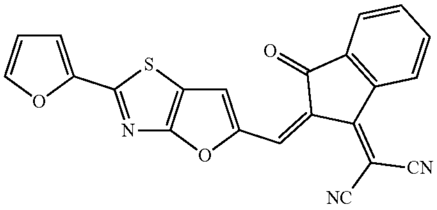
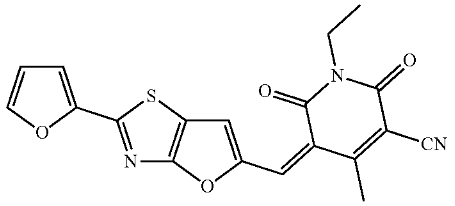
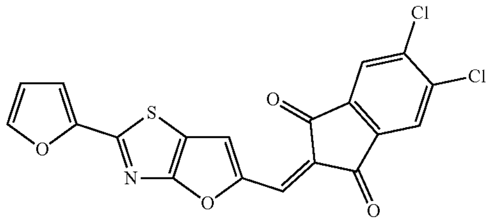
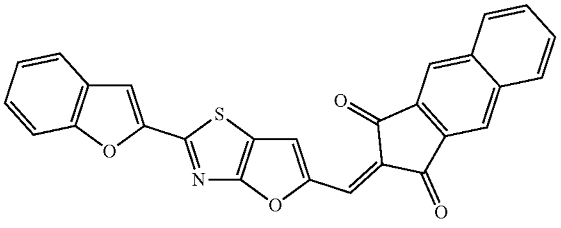
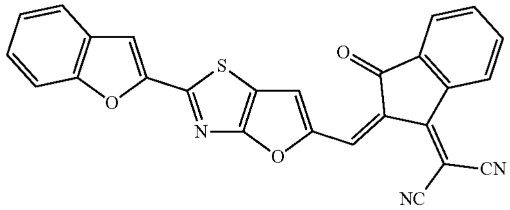
-continued
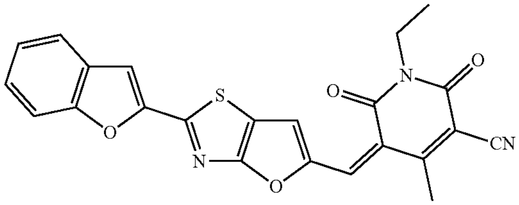
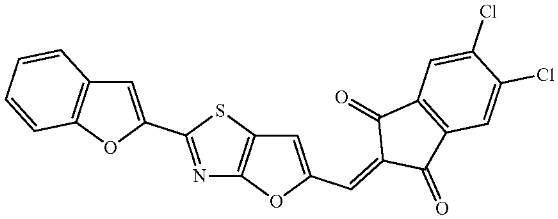
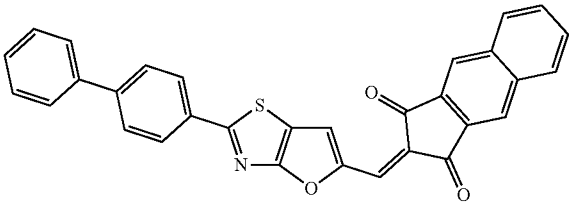
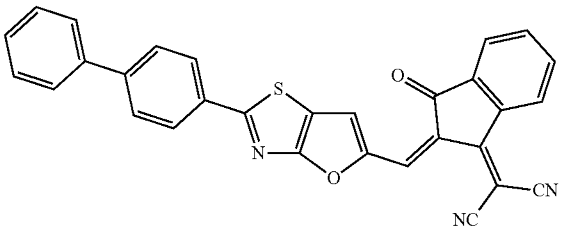
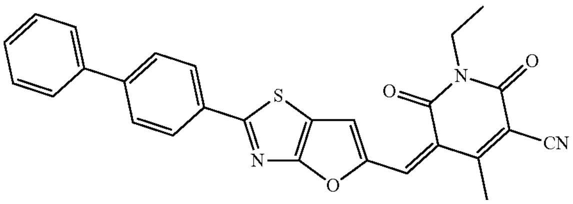
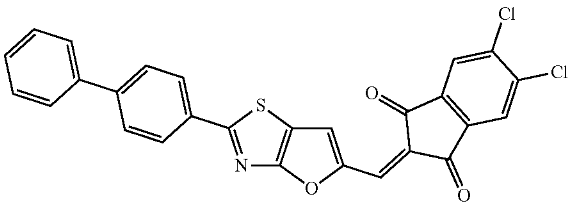
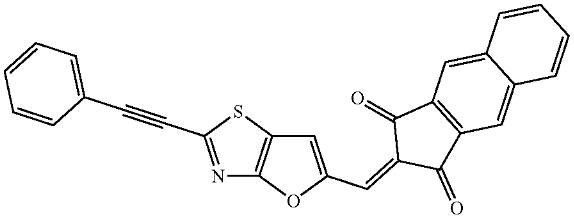
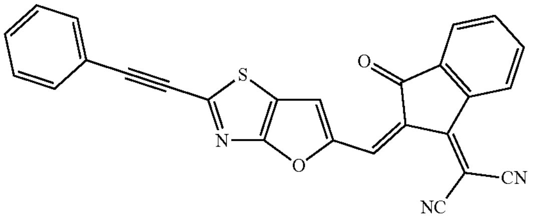

-continued
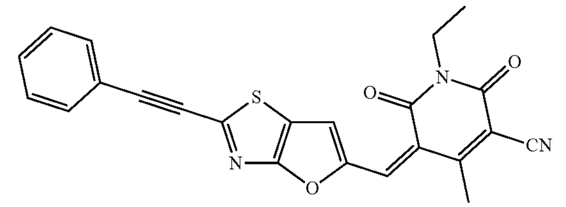
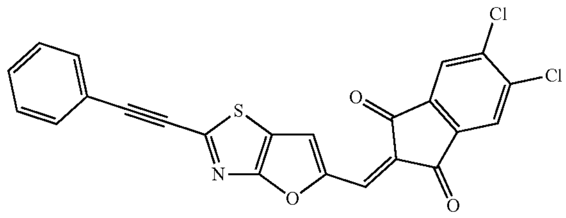
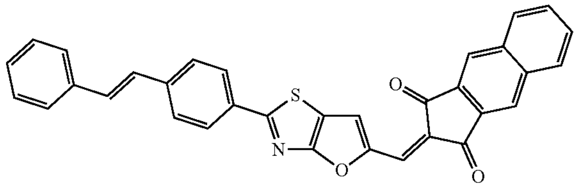
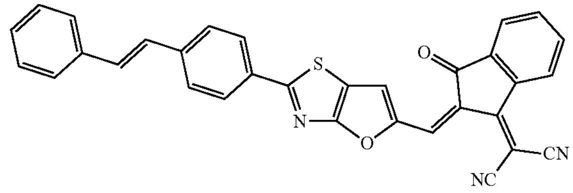
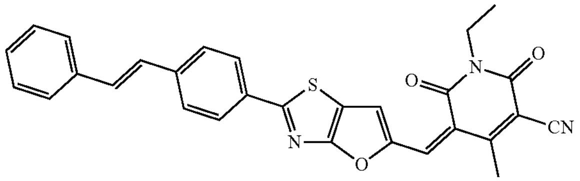
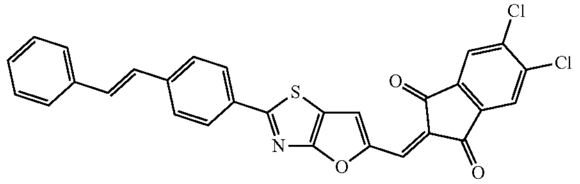
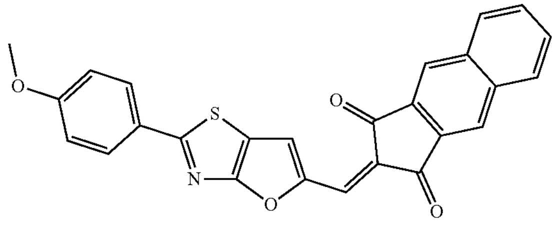
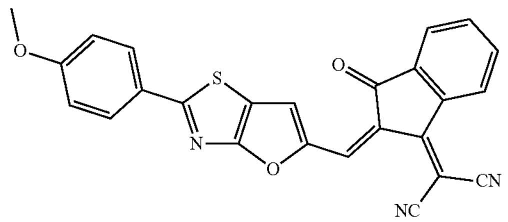
-continued
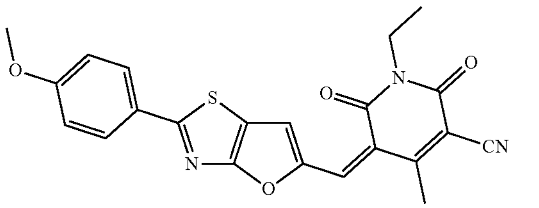
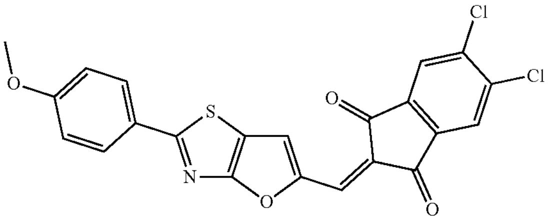
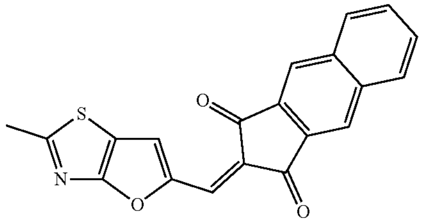
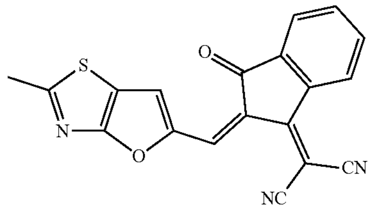
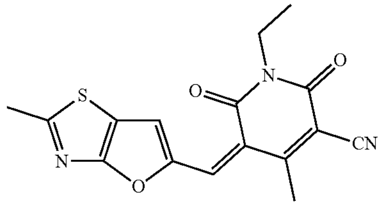
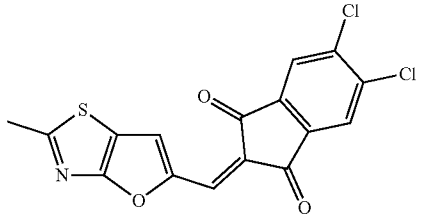
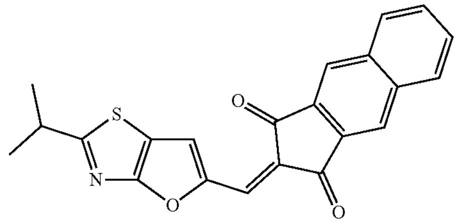
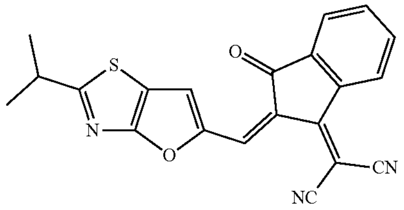

-continued
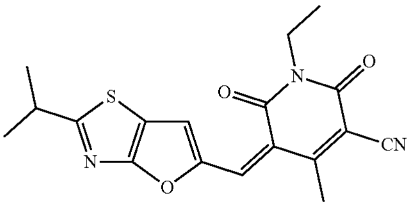
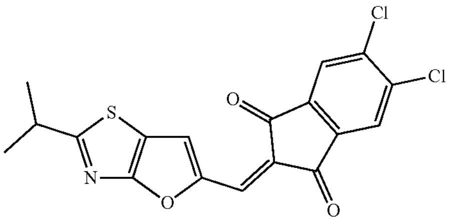
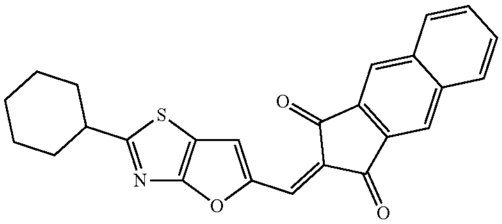
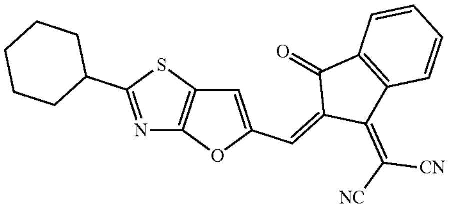
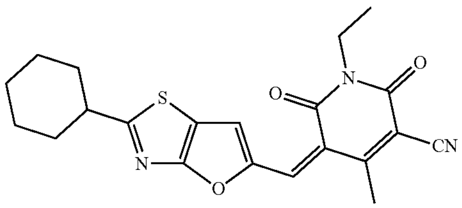
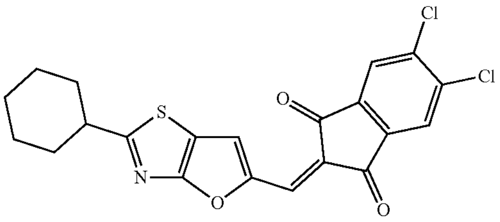
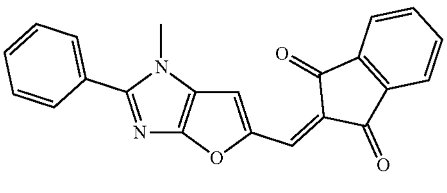
-continued
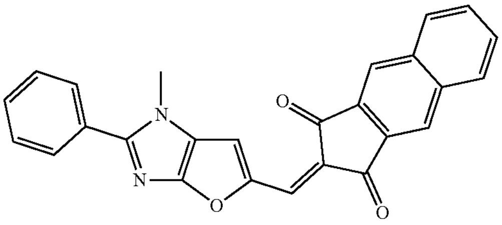
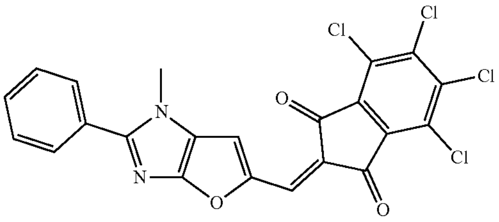
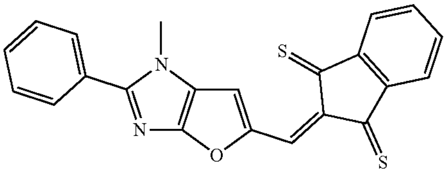
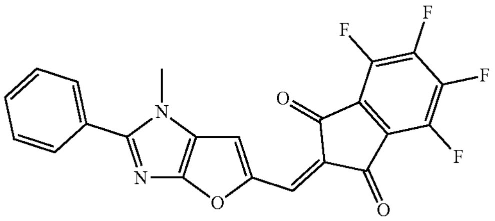
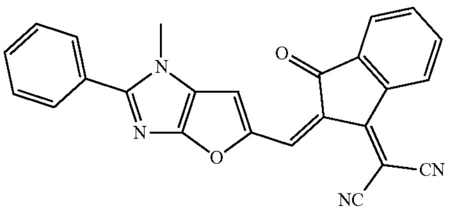
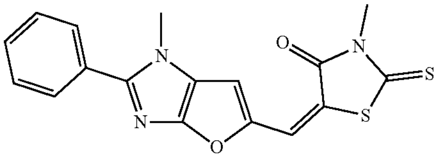
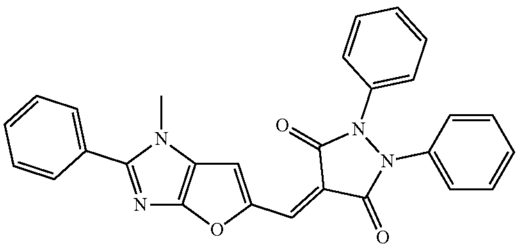
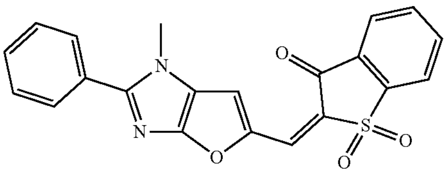

-continued
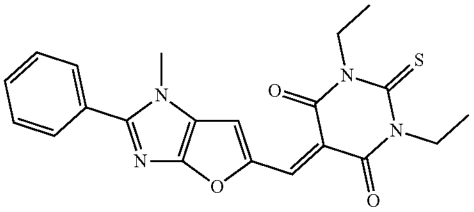
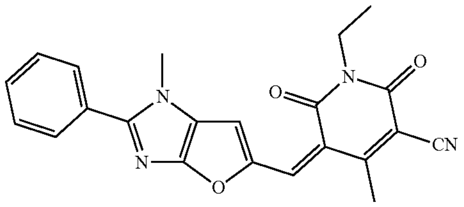
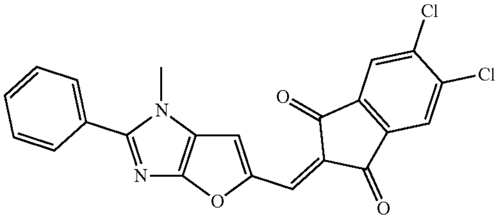
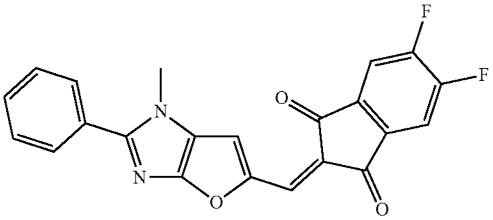
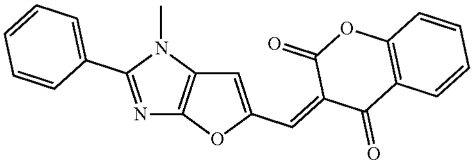
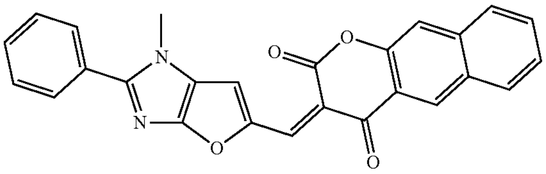
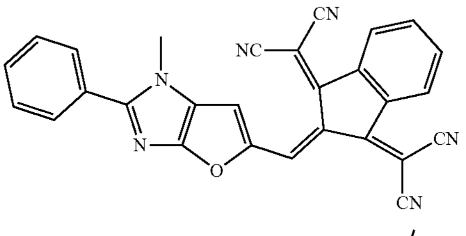
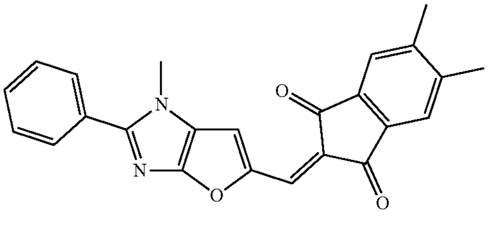
-continued
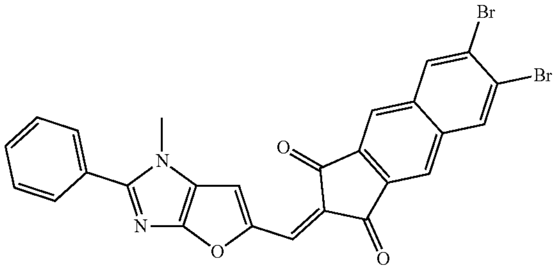
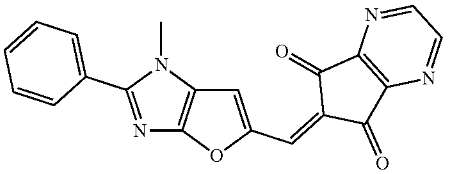
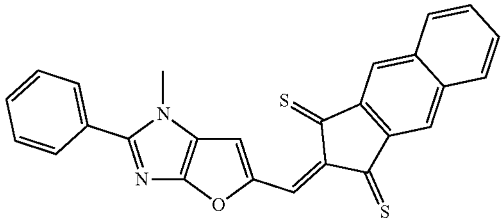
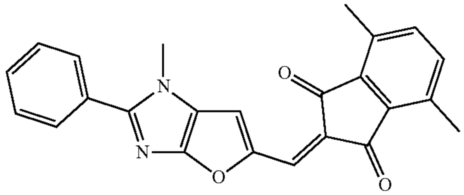
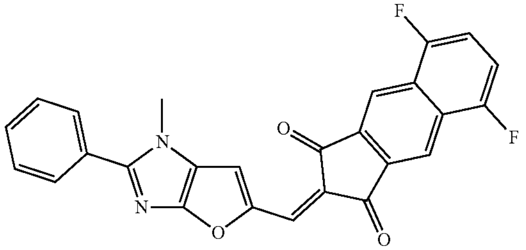
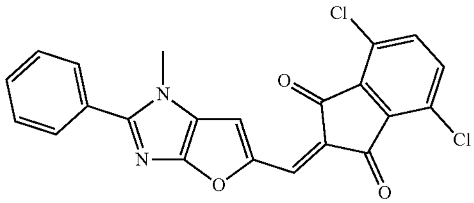
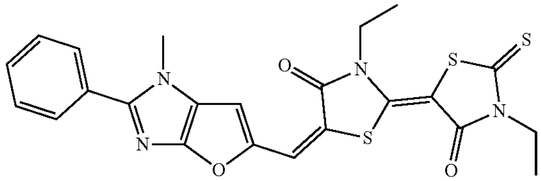
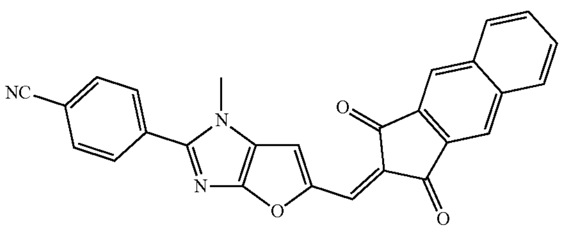

-continued
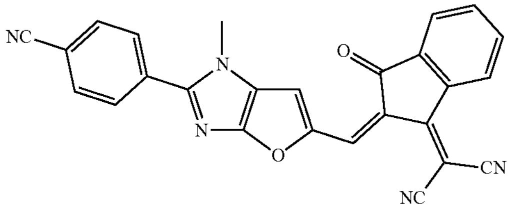
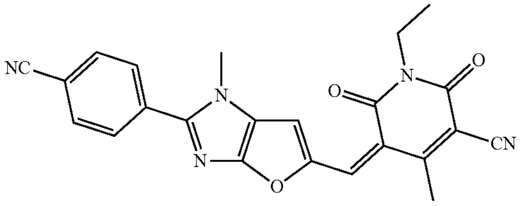
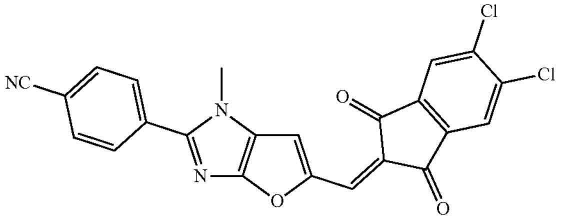
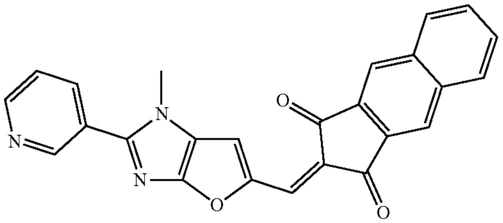
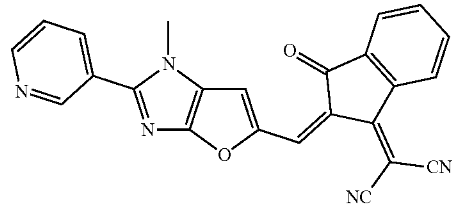
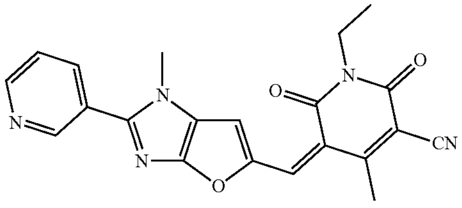
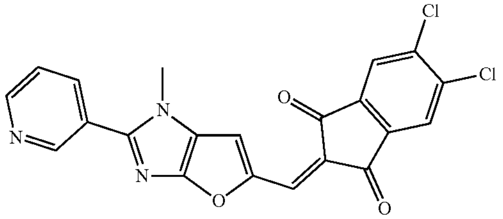
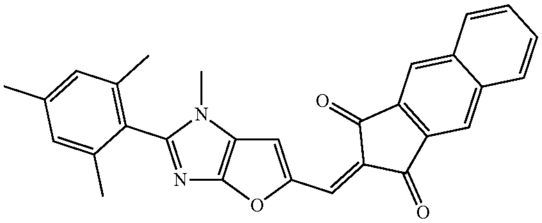
-continued
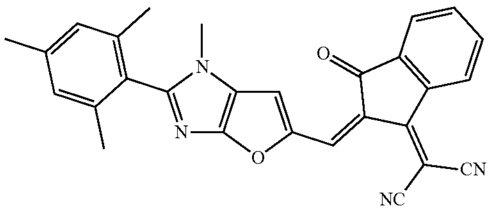
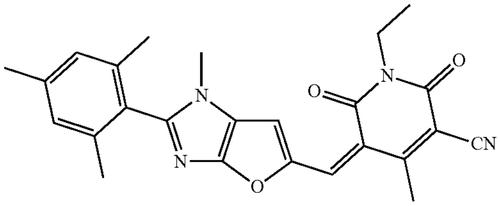
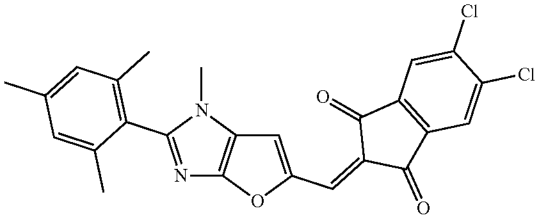
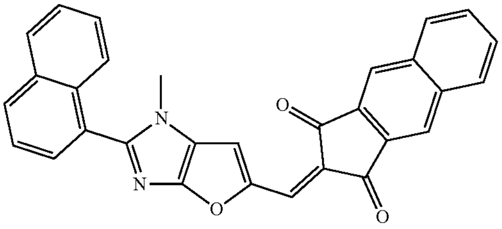
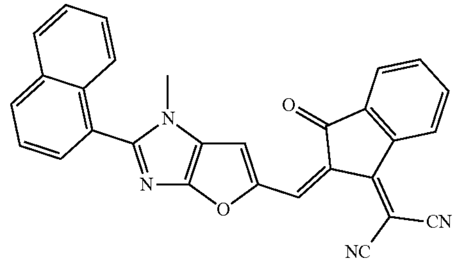
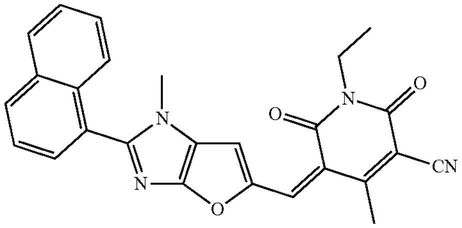
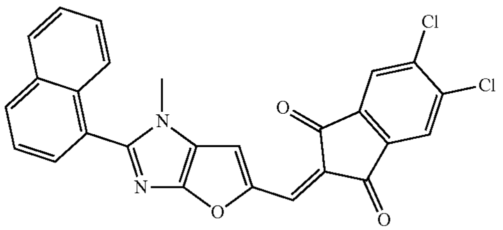

-continued
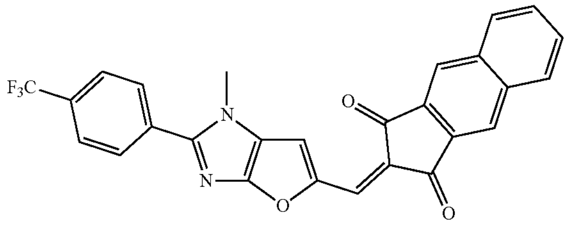
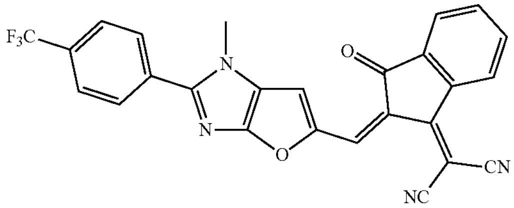
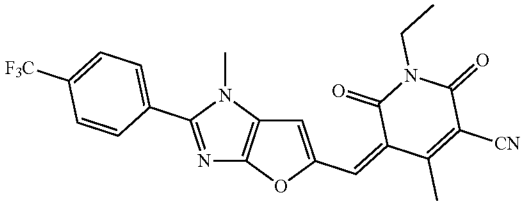
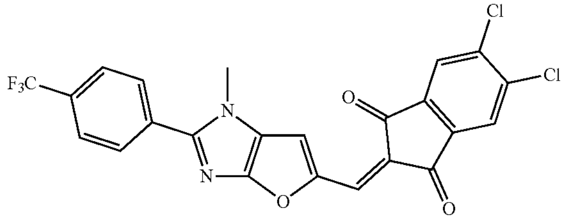
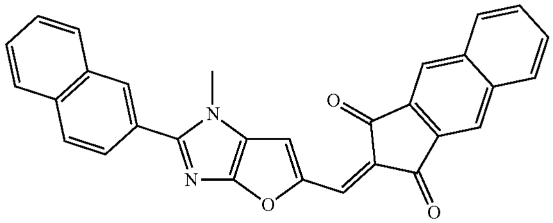
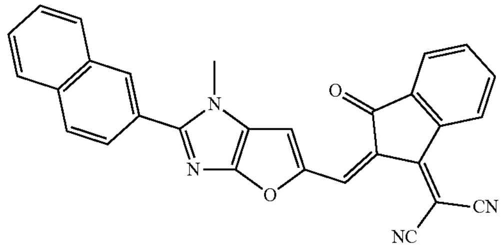
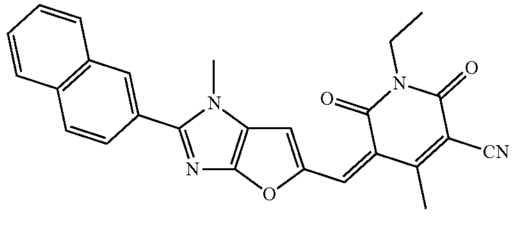
-continued
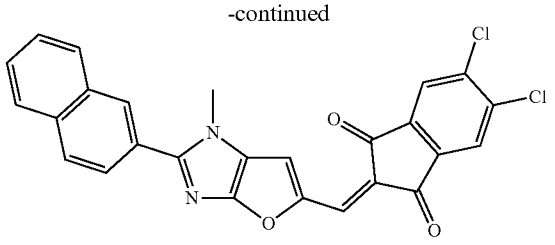
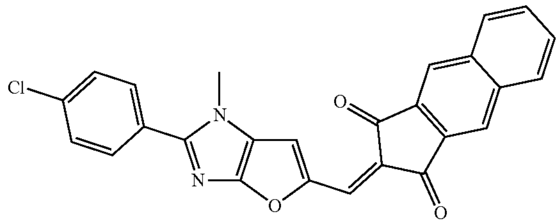
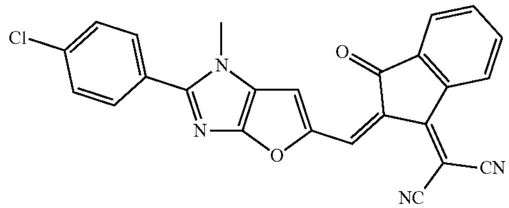
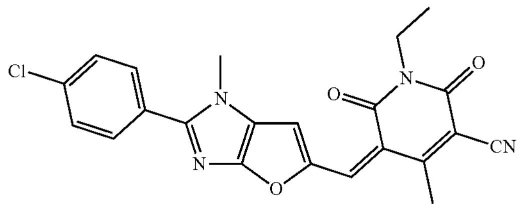
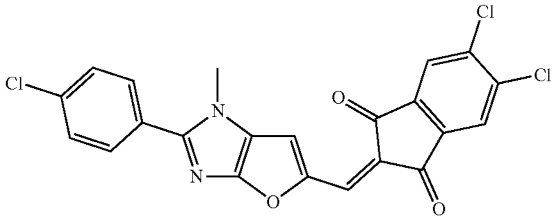
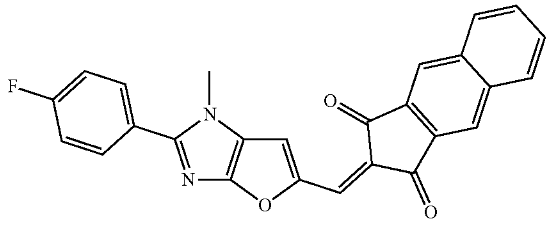
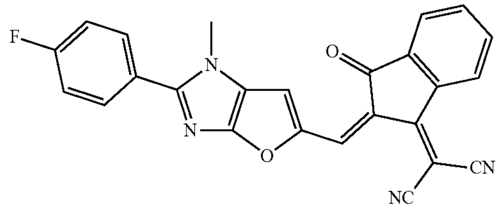
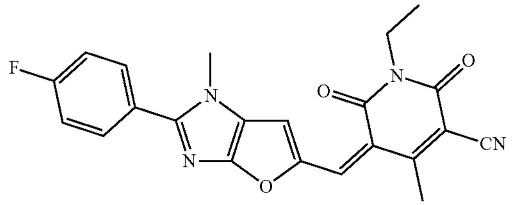

-continued
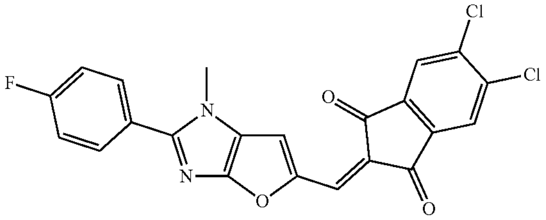
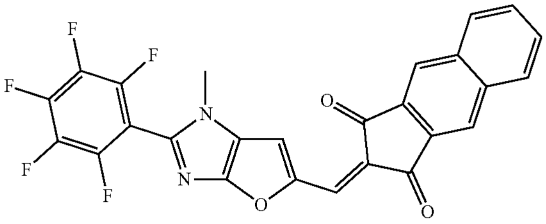
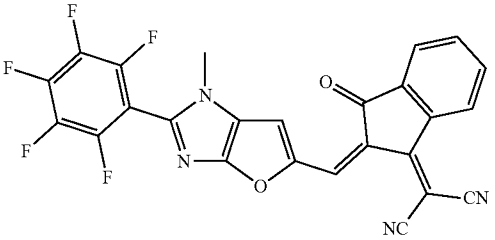
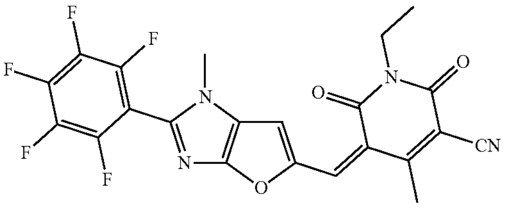
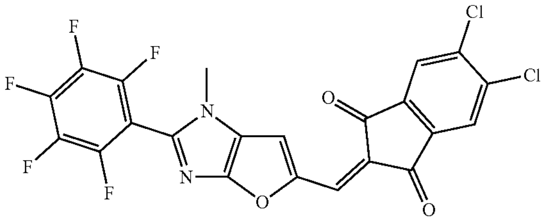
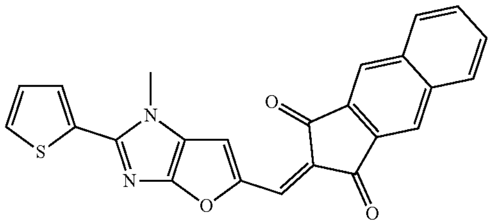
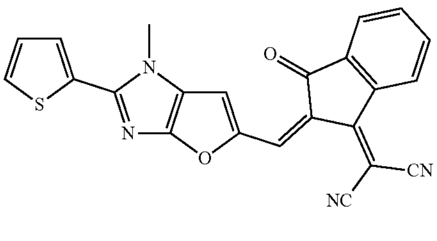
-continued
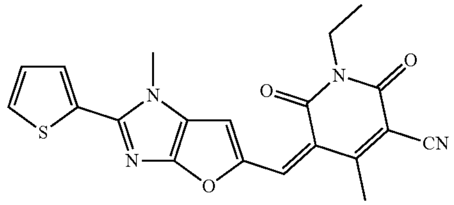
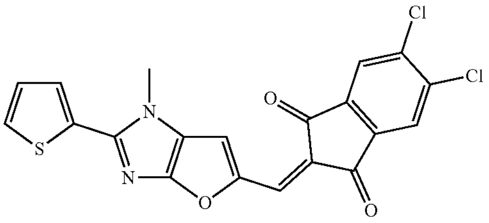
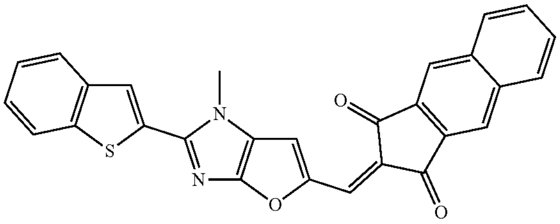
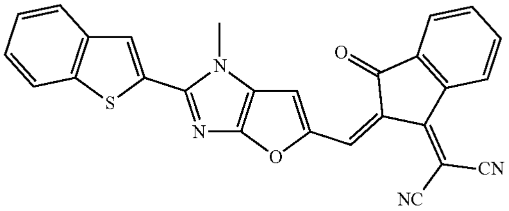
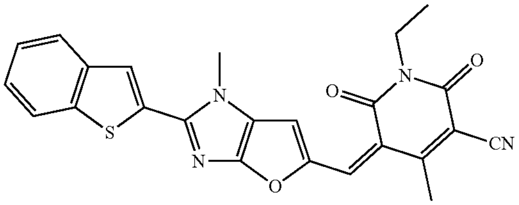
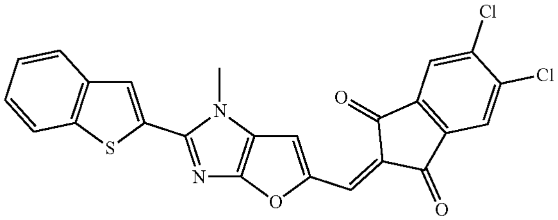
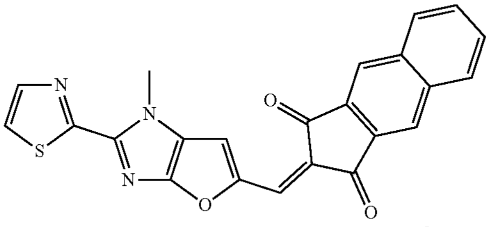
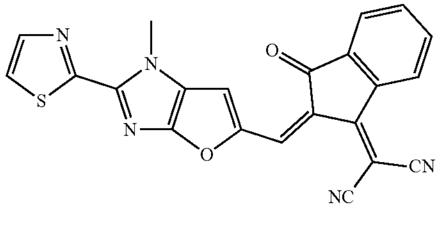

-continued
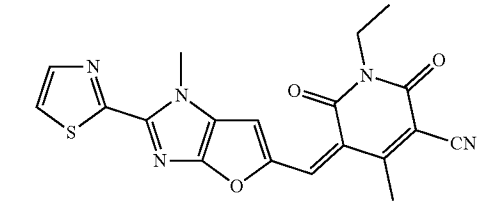
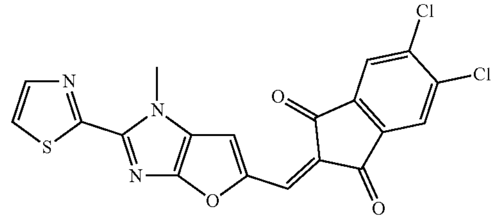
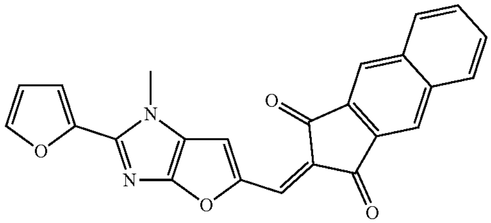
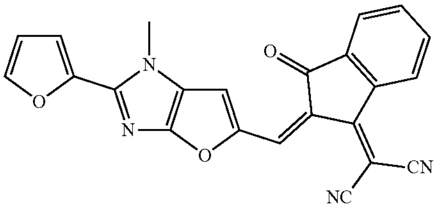
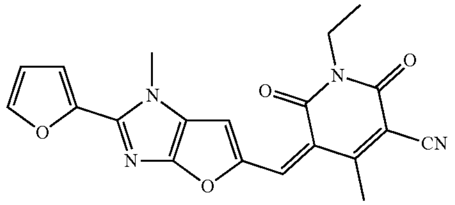
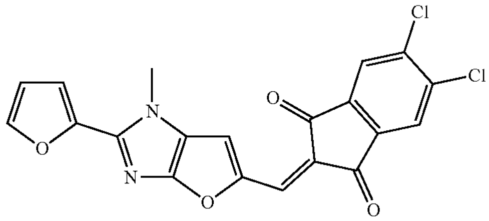
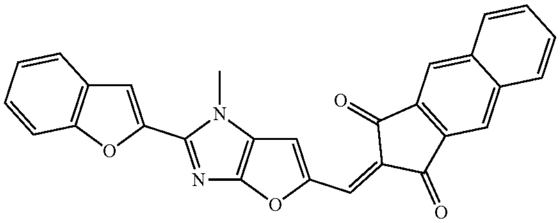
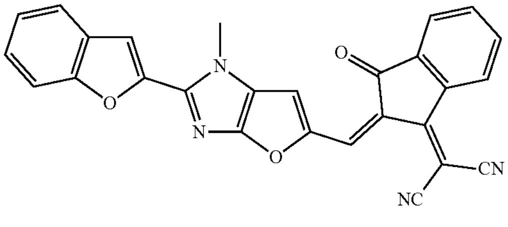
-continued
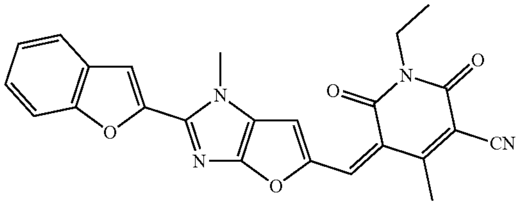
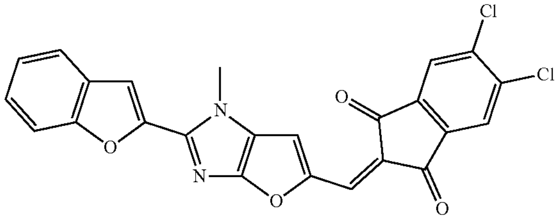
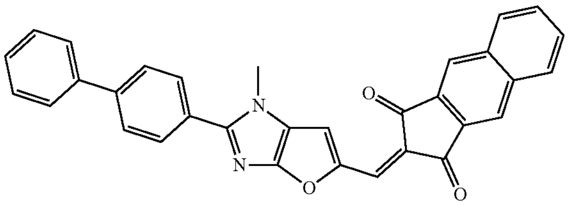
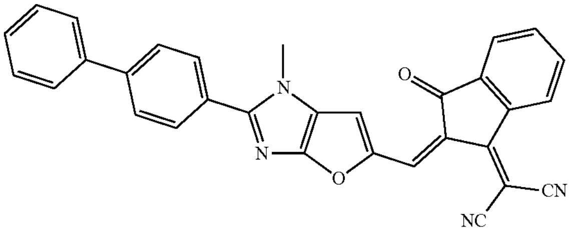
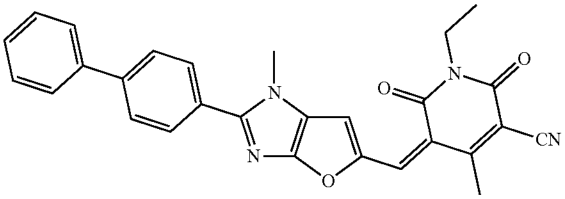
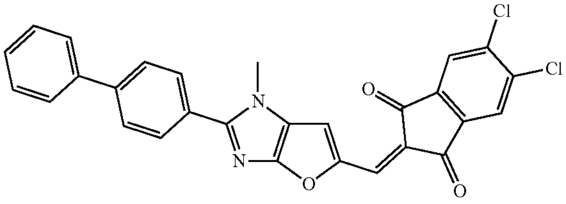
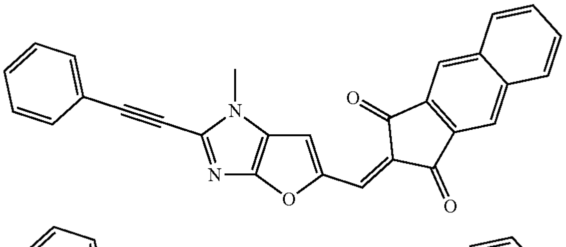
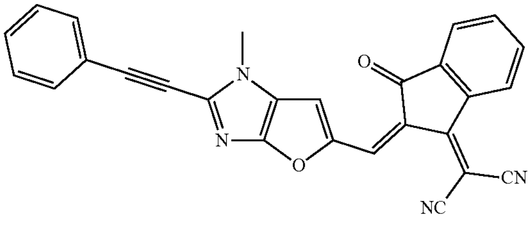

-continued
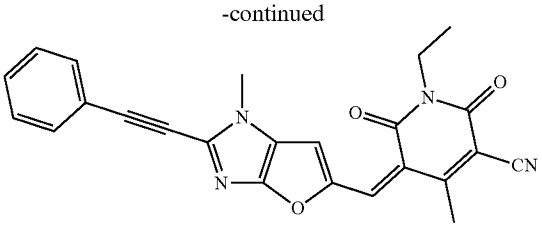
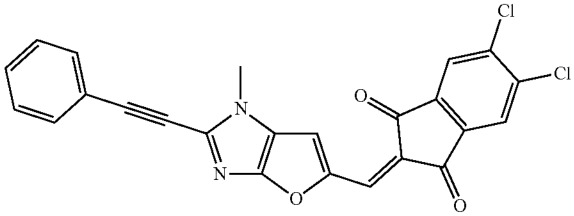
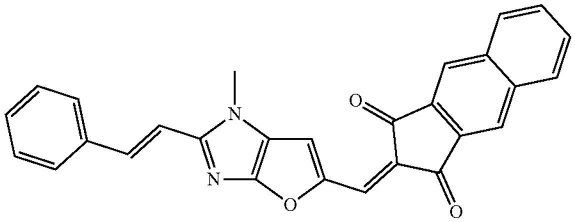
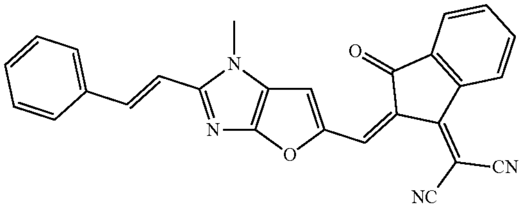
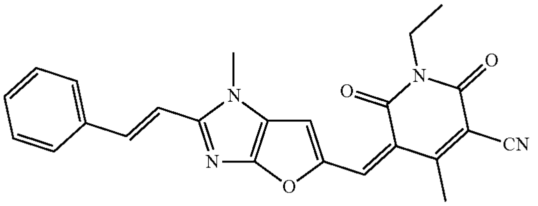
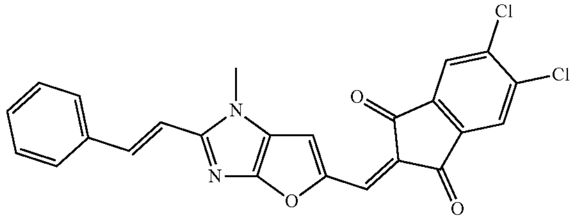
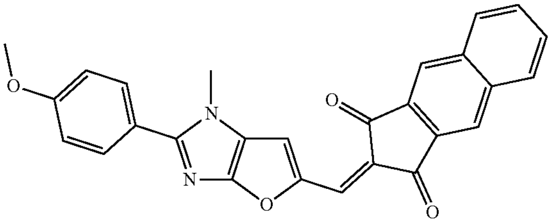
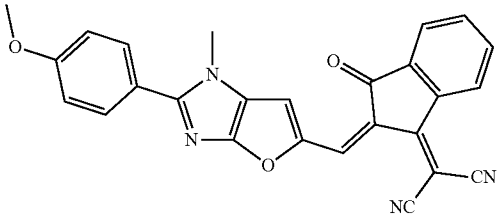
-continued
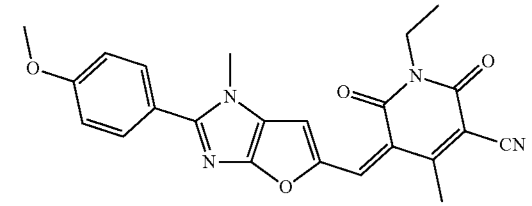
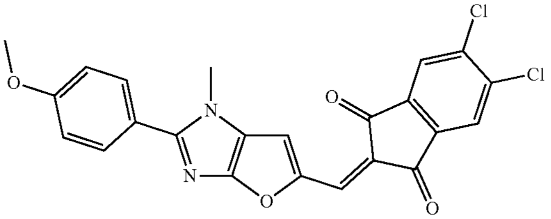
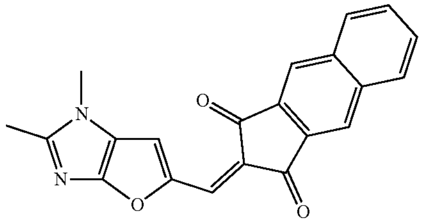
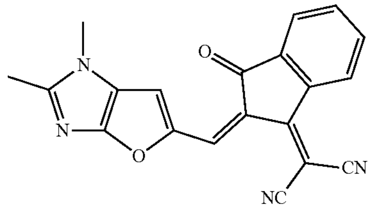
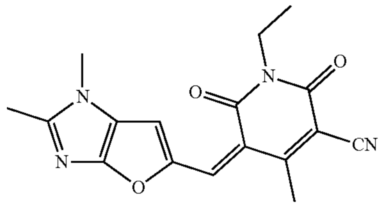
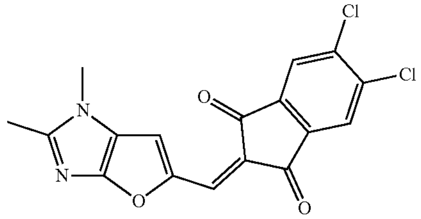
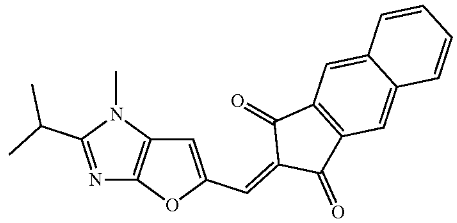
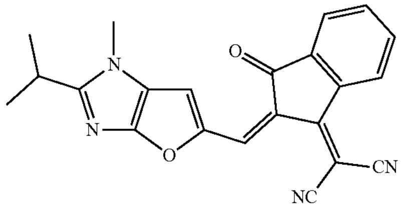

-continued

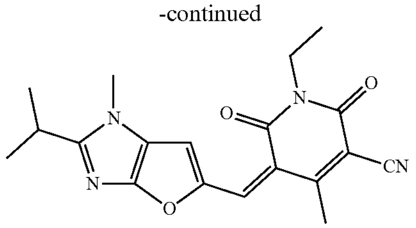

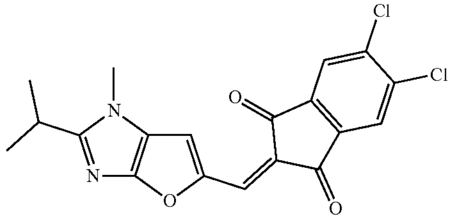

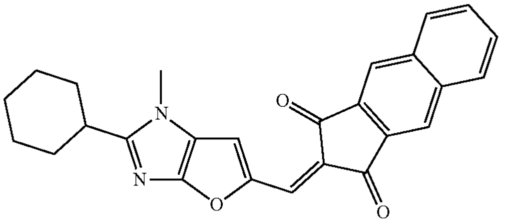

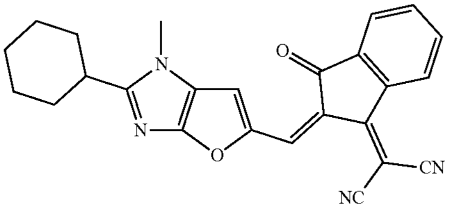

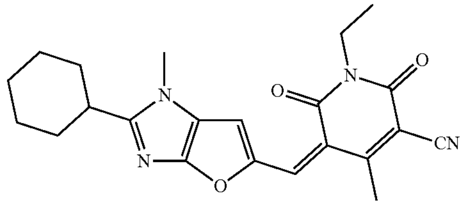

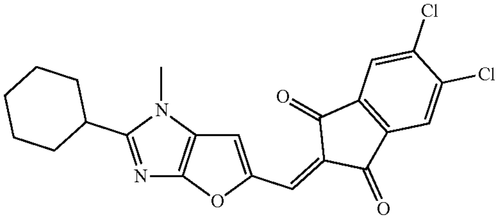

A molecular weight of the specific compound is not particularly limited, but is preferably 300 to 900. In a case where the molecular weight is 900 or less, a vapor deposition temperature is not increased, and the compound is not easily decomposed. In a case where the molecular weight is 300 or more, a glass transition point of a vapor deposition film is not lowered, and the heat resistance of the photoelectric conversion element is improved.

The maximum absorption wavelength of the specific compound is preferably within a range of 500 to 650 nm, and more preferably within a range of 540 to 620 nm.

The maximum absorption wavelength is a value measured in a solution state (solvent: chloroform) by an absorption spectrum of the specific compound being adjusted to a concentration having an absorbance of about 0.5 to 1.

The absorption coefficient of the specific compound at the maximum absorption wavelength is preferably 50000 $cm^{-1}$ or more, more preferably 75000 $cm^{-1}$ or more, and still more preferably 100000 $cm^{-1}$ or more. The upper limit of the light absorption coefficient is not particularly limited, and is, for example, 300000 $cm^{-1}$ or less.

The specific compound is preferably a compound having an ionization potential of 5.2 to 6.2 eV in a single film, more preferably a compound having an ionization potential of 5.2 to 6.1 eV, and still more preferably a compound having an ionization potential of 5.4 to 6.0 eV from the viewpoint of matching the p-type semiconductor material described later with the energy level.

The specific compound contained in the photoelectric conversion film may be used alone, or two or more thereof may be used in combination.

The photoelectric conversion film preferably further contains the n-type semiconductor material described later, or the n-type semiconductor material described later and the p-type semiconductor material described later, in addition to the specific compound described above.

In a case where the photoelectric conversion film includes the n-type semiconductor material described later, a content of the specific compound with respect to a total content of the specific compound and the n-type semiconductor material in the entire photoelectric conversion film (=sum of film thicknesses of specific compounds in terms of single layer/(sum of film thicknesses of specific compounds in terms of single layer+film thickness of n-type semiconductor material in terms of single layer)×100) is preferably 20% to 80% by volume, and more preferably 40% to 80% by volume, from the viewpoint of responsiveness of the photoelectric conversion element.

In addition, in a case where the photoelectric conversion film includes the n-type semiconductor material described later and the p-type semiconductor material described later, a content of the specific compounds in the entire photoelectric conversion film (=sum of film thicknesses of specific compounds in terms of single layer/(sum of film thicknesses of specific compounds in terms of single layer+film thickness of n-type semiconductor material in terms of single layer+film thickness of p-type semiconductor material in terms of single layer)×100) is preferably 15% to 75% by volume, and more preferably 25% to 75% by volume, from the viewpoint of responsiveness of the photoelectric conversion element.

It is preferable that the photoelectric conversion film is substantially composed of the specific compound and the n-type semiconductor material, or is substantially composed of the specific compound, the n-type semiconductor material, and the p-type semiconductor material. The term "substantially" is intended that the total content of the specific compound and the n-type semiconductor material is 95% by mass or more with respect to the total mass of the photoelectric conversion film in a case where the photoelectric conversion film is composed of the specific compound and the n-type semiconductor material, and that the total content of the specific compound, the n-type semiconductor material, and the p-type semiconductor material is 95% by mass or more with respect to the total mass of the photoelectric conversion film in a case where the photoelectric conversion film is composed of the specific compound, the n-type semiconductor material, and the p-type semiconductor material.

<n-Type Semiconductor Material>

The photoelectric conversion film preferably includes the n-type semiconductor material as another component in addition to the specific compound. The n-type semiconductor material is an acceptor-property organic semiconductor material (a compound), and refers to an organic compound having a property of easily accepting an electron.

Further specifically, the n-type semiconductor material is an organic compound having further excellent electron transport properties than the specific compound. The n-type semiconductor material preferably has a high electron affinity for the specific compound.

In the present specification, the electron transport properties (electron carrier mobility) of a compound can be evaluated by, for example, a time-of-flight method (a TOF method) or by using a field effect transistor element.

The electron carrier mobility of the n-type semiconductor material is preferably $10^{-4}$ $cm^2/V \cdot s$ or more, more preferably $10^{-3}$ $cm^2/V \cdot s$ or more, and still more preferably $10^{-2}$ $cm^2/V \cdot s$ or more. The upper limit of the electron carrier mobility described above is not particularly limited, but is preferably 10 $cm^2/V \cdot s$ or less, for example, from the viewpoint of suppressing the flow of a small amount of current without light irradiation.

In the present specification, a value (value multiplied by −1) of a reciprocal number of the LUMO value obtained by the calculation of B3LYP/6-31G (d) using Gaussian '09 (software manufactured by Gaussian, Inc.) as a value of the electron affinity.

The electron affinity of the n-type semiconductor material is preferably 3.0 to 5.0 eV.

Examples of the n-type semiconductor material include fullerenes selected from the group consisting of a fullerene and derivatives thereof, fused aromatic carbocyclic compounds (for example, a naphthalene derivative, an anthracene derivative, a phenanthrene derivative, a tetracene derivative, a pyrene derivative, a perylene derivative, and a fluoranthene derivative); a heterocyclic compound having a 5- to 7-membered ring having at least one of a nitrogen atom, an oxygen atom, or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, and thiazole); polyarylene compounds; fluorene compounds; cyclopentadiene compounds; silyl compounds; 1,4,5,8-naphthalenetetracarboxylic acid anhydride; 1,4,5,8-naphthalenetetracarboxylic acid anhydride imide derivative; oxadiazole derivative; anthraquinodimethane derivatives; diphenylquinone derivatives; bathocuproine, bathophenanthroline, and derivatives thereof; triazole compounds; a distyrylarylene derivative; a metal complex having a nitrogen-containing heterocyclic compound as a ligand; a silole compound; and compounds disclosed in paragraphs [0056] to [0057] of JP2006-100767A.

Among these, it is preferable that examples of the n-type semiconductor material include fullerenes selected from the group consisting of a fullerene and derivatives thereof.

Examples of the fullerenes include a fullerene $C_{60}$, a fullerene $C_{70}$, a fullerene $C_{76}$, a fullerene $C_{78}$, a fullerene $C_{80}$, a fullerene $C_{82}$, a fullerene $C_{84}$, a fullerene $C_{90}$, a fullerene $C_{96}$, a fullerene $C_{240}$, a fullerene $C_{540}$, and a mixed fullerene.

Examples of the fullerene derivatives include compounds in which a substituent is added to the above fullerenes. The substituent is preferably an alkyl group, an aryl group, or a heterocyclic group. The fullerene derivative is preferably compounds described in JP2007-123707A.

In a case where the n-type semiconductor material includes fullerenes, a content of the fullerenes to a total content of the n-type semiconductor materials in the photoelectric conversion film (=(film thickness of fullerenes in terms of single layer/film thickness of total n-type semiconductor material in terms of single layer)×100) is preferably 15% to 100% by volume, more preferably 35% to 100% by volume.

An organic coloring agent may be used as the n-type semiconductor material in place of the n-type semiconductor material described in the upper row or together with the n-type semiconductor material described in the upper row.

By using an organic coloring agent as the n-type semiconductor material, it is easy to control an absorption wavelength (maximum absorption wavelength) of the photoelectric conversion element to be within any wavelength range.

Examples of the organic coloring agent include a cyanine coloring agent, a styryl coloring agent, a hemicyanine coloring agent, a merocyanine coloring agent (including zeromethine merocyanine (simple merocyanine)), a rhodacyanine coloring agent, an allopolar coloring agent, an oxonol coloring agent, a hemioxonol coloring agent, a squarylium coloring agent, a croconium coloring agent, an azamethine coloring agent, a coumarin coloring agent, an arylidene coloring agent, an anthraquinone coloring agent, a triphenylmethane coloring agent, an azo coloring agent, an azomethine coloring agent, a metallocene coloring agent, a fluorenone coloring agent, a flugide coloring agent, a perylene coloring agent, a phenazine coloring agent, a phenothiazine coloring agent, a quinone coloring agent, a diphenylmethane coloring agent, a polyene coloring agent, an acridine coloring agent, an acridinone coloring agent, a diphenylamine coloring agent, a quinophthalone coloring agent, a phenoxazine coloring agent, a phthaloperylene coloring agent, a dioxane coloring agent, a porphyrin coloring agent, a chlorophyll coloring agent, a phthalocyanine coloring agent, a subphthalocyanine coloring agent, a metal complex coloring agent, compounds disclosed in paragraphs [0083] to [0089] of JP2014-082483A, compounds disclosed in paragraphs [0029] to [0033] of JP2009-167348A, compounds disclosed in paragraphs [0197] to [0227] of JP2012-077064A, compounds disclosed in paragraphs [0035] to [0038] of WO2018-105269A, compounds disclosed in paragraphs [0041] to [0043] of WO2018-186389A, compounds disclosed in paragraphs [0059] to [0062] of WO2018-186397A, compounds disclosed in paragraphs [0078] to [0083] of WO2019-009249A, compounds disclosed in paragraphs [0054] to [0056] of WO2019-049946A, compounds disclosed in paragraphs [0059] to [0063] of WO2019-054327A, and compounds disclosed in paragraphs [0086] to [0087] of WO2019-098161A.

In a case where the n-type semiconductor material includes an organic coloring agent, a content of the organic coloring agent described above to a total content of the n-type semiconductor material in the photoelectric conversion film (=(film thickness of organic coloring agent in terms of single layer/film thickness of total n-type semiconductor material in terms of single layer)×100) is preferably 15% to 100% by volume, more preferably 35% to 100% by volume.

The molecular weight of the n-type semiconductor material is preferably 200 to 1200, and more preferably 200 to 1000.

It is preferable that the photoelectric conversion film has a bulk hetero structure formed in a state where the specific compound and the n-type semiconductor material are mixed. The bulk hetero structure refers to a layer in which the specific compound and the n-type semiconductor material are mixed and dispersed in the photoelectric conversion film. The photoelectric conversion film having the bulk hetero structure can be formed by either a wet method or a dry method. The bulk hetero structure is described in detail in, for example, paragraphs [0013] and [0014] of JP2005-303266A and the like.

A content of the n-type semiconductor material in the photoelectric conversion film (=(film thickness of n-type semiconductor material in terms of single layer/film thickness of entire photoelectric conversion film)×100) is preferably 5% to 70% by volume, more preferably 10% to 60% by volume, and still more preferably 15% to 60% by volume.

The n-type semiconductor material contained in the photoelectric conversion film may be used alone, or two or more thereof may be used in combination.

<p-Type Semiconductor Material>

The photoelectric conversion film also further preferably includes the p-type semiconductor material as another component in addition to the specific compound and the n-type semiconductor material. In a case where the specific compound is used as the p-type semiconductor material, the above described p-type semiconductor material is intended to include a p-type semiconductor material other than the specific compound.

The p-type semiconductor material is a donor organic semiconductor material (a compound), and refers to an organic compound having a property of easily donating an electron.

Further specifically, the p-type semiconductor material is an organic compound having more excellent hole transport properties than the specific compound.

In the present specification, the hole transport properties (hole carrier mobility) of a compound can be evaluated by, for example, a time-of-flight method (a TOF method) or by using a field effect transistor element.

The hole carrier mobility of the p-type semiconductor material is preferably $10^{-4}$ $cm^2/V \cdot s$ or more, more preferably $10^{-3}$ $cm^2/V \cdot s$ or more, and still more preferably $10^{-2}$ $cm^2/V \cdot s$ or more. The upper limit of the hole carrier mobility described above is not particularly limited, but is preferably 10 $cm^2/V \cdot s$ or less, for example, from the viewpoint of suppressing the flow of a small amount of current without light irradiation.

In addition, the p-type semiconductor material also preferably has a small ionization potential with respect to both the specific compound.

In a case where the photoelectric conversion film includes the p-type semiconductor material, the photoelectric conversion film preferably has a bulk hetero structure formed in a state where the specific compound, the p-type semiconductor material, and the above-described n-type semiconductor material are mixed.

Examples of the p-type semiconductor material include triarylamine compounds (for example, N, N'-bis(3-methylphenyl)-(1,1'-biphenyl)-4,4'-diamine (TPD), 4,4'-bis [N-(naphthyl)-N-Phenyl-amino]biphenyl (α-NPD), compounds disclosed in paragraphs [0128] to [0148] of JP2011-228614A, compounds disclosed in paragraphs [0052] to [0063] of JP2011-176259A, compounds disclosed in paragraphs [0119] to [0158] of JP2011-225544A, compounds disclosed in paragraphs [0044] to [0051] of JP2015-153910A, and compounds disclosed in paragraphs [0086] to [0090] of JP2012-094660A, pyrazoline compounds, styrylamine compounds, hydrazone compounds, polysilane compounds, thiophene compounds (for example, a thienothiophene derivative, a dibenzothiophene derivative, a benzodithiophene derivative, a dithienothiophene derivative, a [1]benzothieno [3,2-b]thiophene (BTBT) derivative, a thieno [3,2-f: 4,5-f]bis [1]benzothiophene (TBBT) derivative, compounds disclosed in paragraphs [0031] to [0036] of JP2018-014474A, compounds disclosed in paragraphs [0043] to [0045] of WO2016-194630A, compounds disclosed in paragraphs [0025] to [0037], and [0099] to [0109] of WO2017-159684A, compounds disclosed in paragraphs [0029] to [0034] of JP2017-076766A, compounds disclosed in paragraphs [0015] to [0025] of WO2018-207722A, compounds disclosed in paragraphs [0045] to [0053] of JP2019-054228A, compounds disclosed in paragraphs [0045] to [0055] of WO2019-058995A, compounds disclosed in paragraphs [0063] to [0089] of WO2019-081416A, compounds disclosed in paragraphs [0033] to [0036] of JP2019-080052A, compounds disclosed in paragraphs [0044] to [0054] of WO2019-054125A, compounds disclosed in paragraphs [0041] to [0046] of WO2019-093188A, and the like), a cyanine compound, an oxonol compound, a polyamine compound, an indole compound, a pyrrole compound, a pyrazole compound, a polyarylene compound, a fused aromatic carbocyclic compound (for example, a naphthalene derivative, an anthracene derivative, a phenanthrene derivative, a tetracene derivative, a pentacene derivative, a pyrene derivative, a perylene derivative, and a fluoranthene derivative), a porphyrin compound, a phthalocyanine compound, a triazole compound, an oxadiazole compound, an imidazole compound, a polyarylalkane compound, a pyrazolone compound, an amino-substituted chalcone compound, an oxazole compound, a fluorenone compound, a silazane compound, and a metal complex having nitrogen-containing heterocyclic compounds as ligands.

The p-type semiconductor material is preferably a compound represented by Formula (p1), a compound represented by Formula (p2), a compound represented by Formula (p3), and a compound represented by Formula (p4), or is also preferably a compound represented by Formula (p5).

(p1)

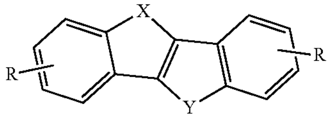

(p2)

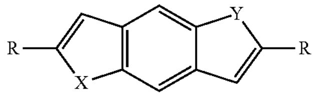

(p3)

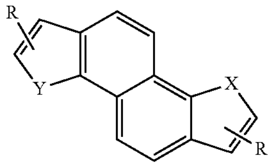

(p4)

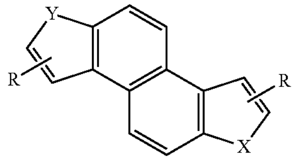

(p5)

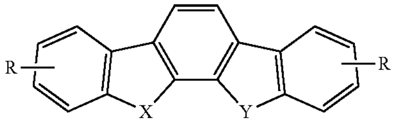

Two R's present in Formulae (p1) to (p5) each independently represent a hydrogen atom or a substituent. Examples of the substituent represented by R include an alkyl group, an alkoxy group, a halogen atom, an alkylthio group, a (hetero)arylthio group, an alkylamino group, a (hetero) arylamino group, and a (hetero)aryl group. These groups each may further have a substituent as much as possible. For example, the (hetero)aryl group may be an arylaryl group (that is, a biaryl group; at least one of aryl groups constituting this group may be a heteroaryl group), which may further have a substituent.

As substituents represented by R, groups represented by R in Formula (IX) of WO2019/081416A are also preferable.

X and Y each independently represent —$CR^2_2$—, a sulfur atom, an oxygen atom, —$NR^2$—, or —$SiR^2_2$—.

$R^2$ represents a hydrogen atom, an alkyl group (preferably a methyl group or a trifluoromethyl group), an aryl group, or a heteroaryl group, which may have a substituent. Two or more $R^2$'s may be the same or different from each other.

The compounds that can be used as the p-type semiconductor materials are exemplified below.

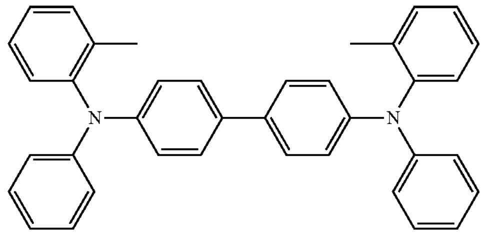

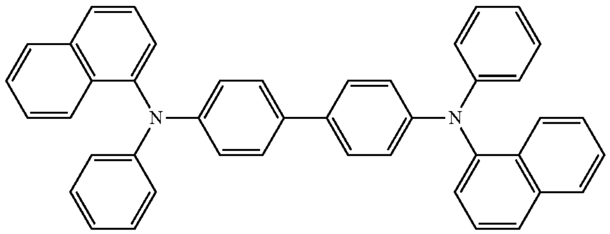

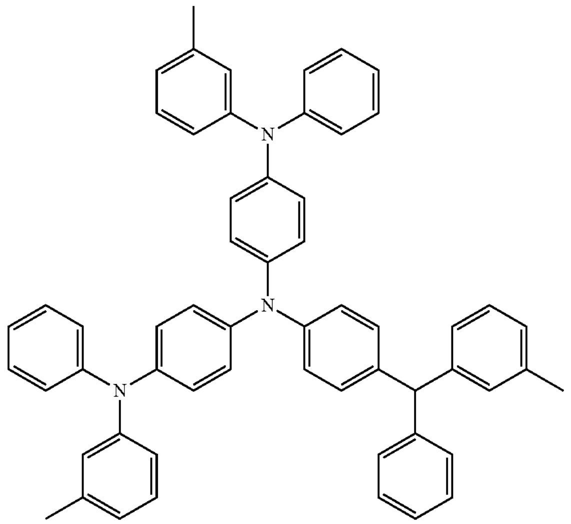

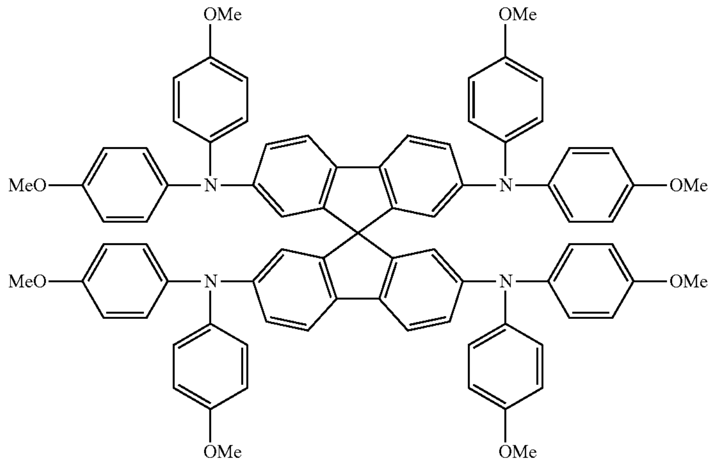

-continued
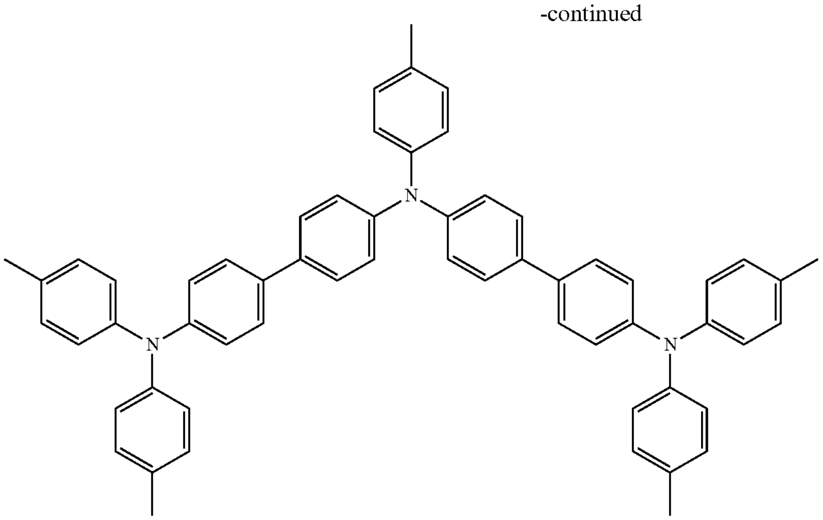
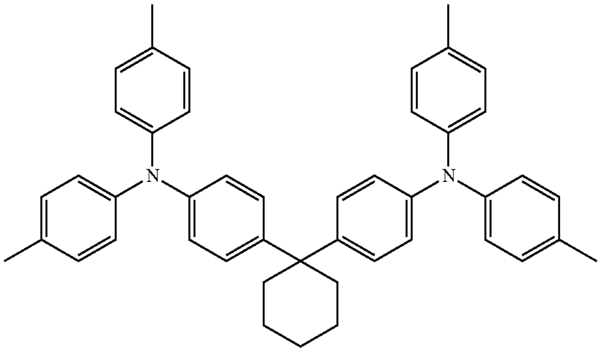
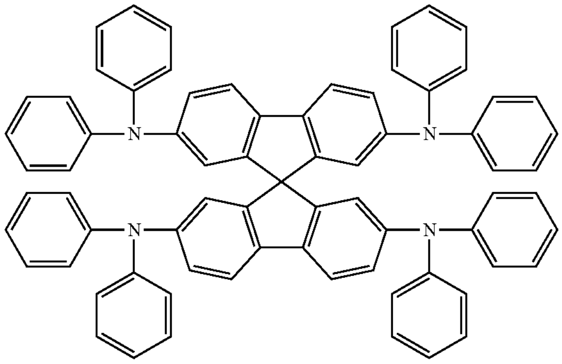
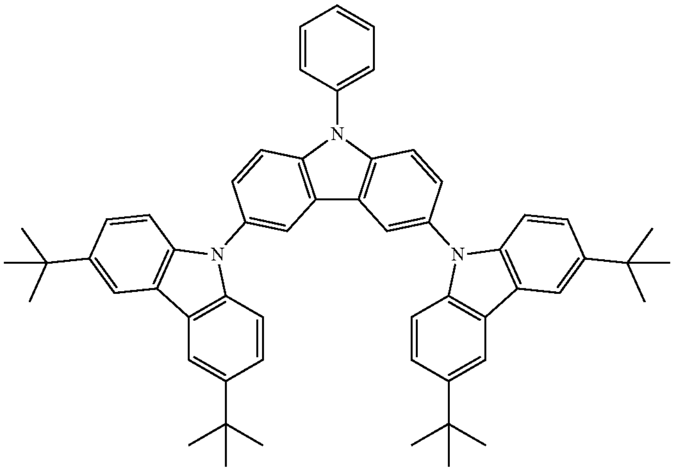
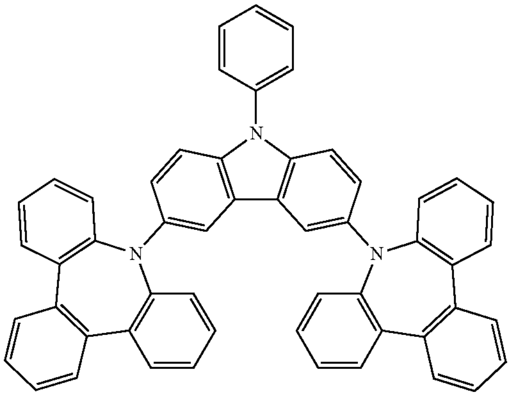
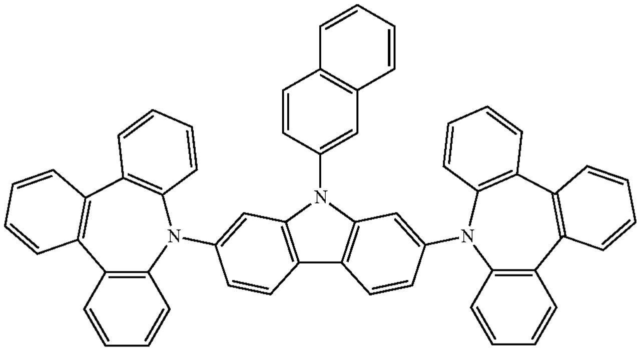

-continued
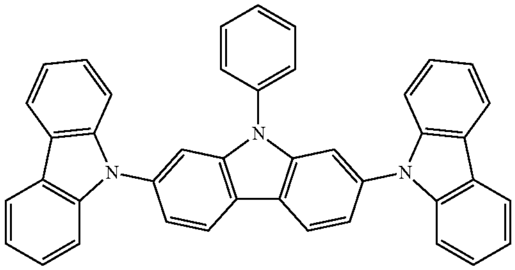
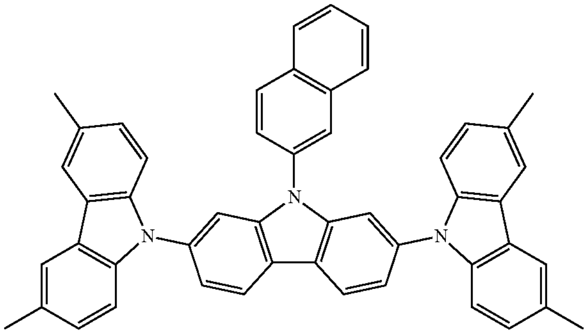
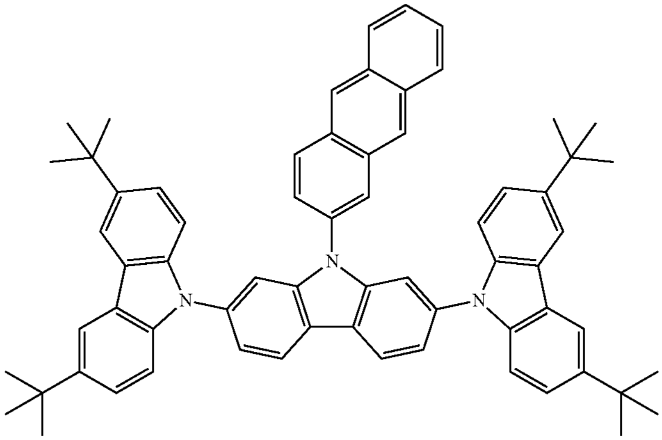
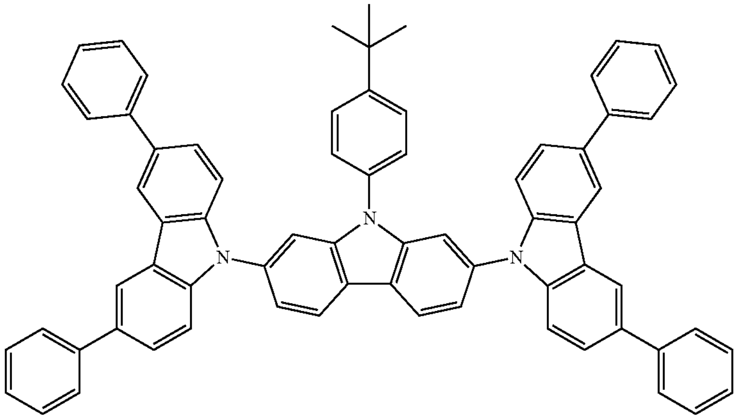
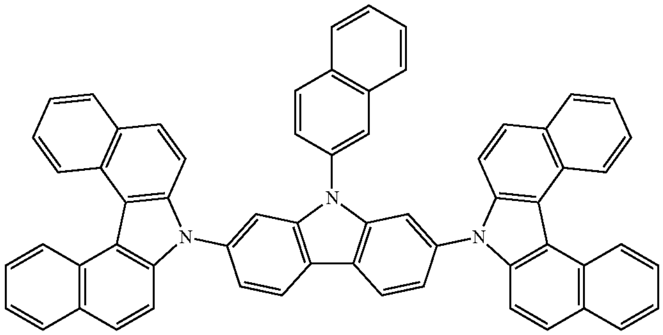

-continued
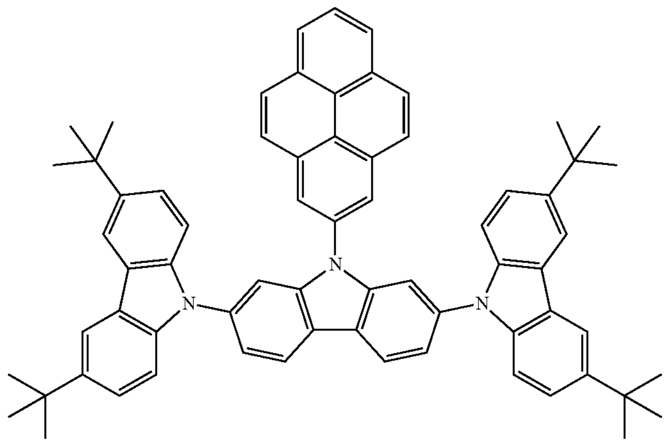
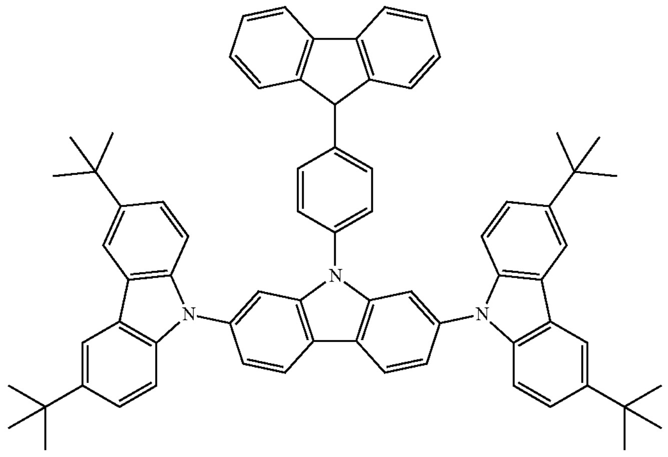
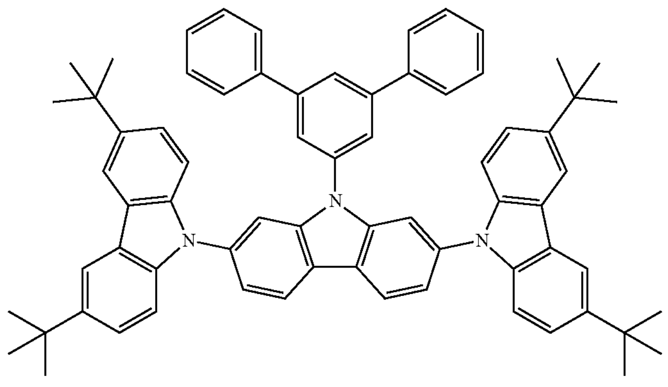

-continued
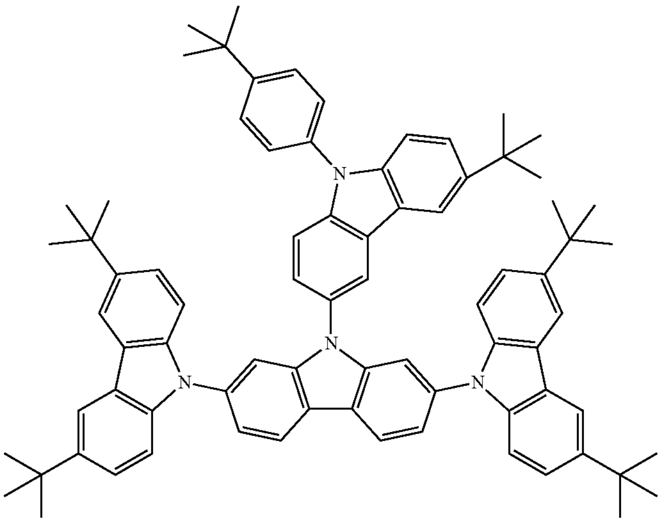
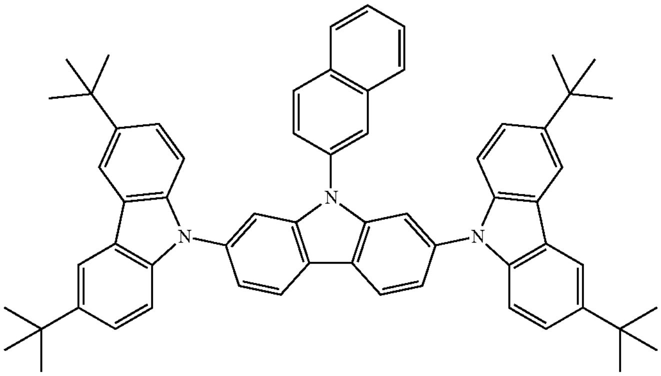
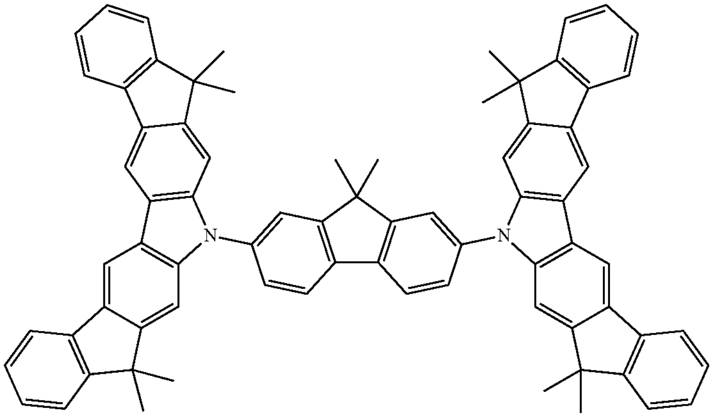
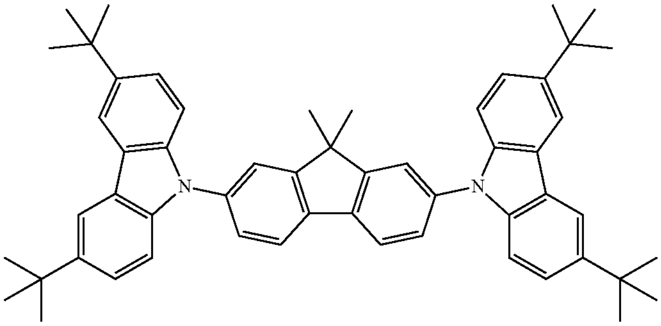

-continued
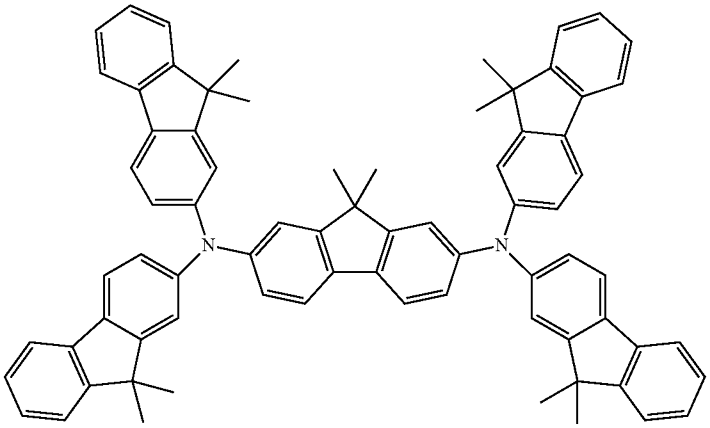
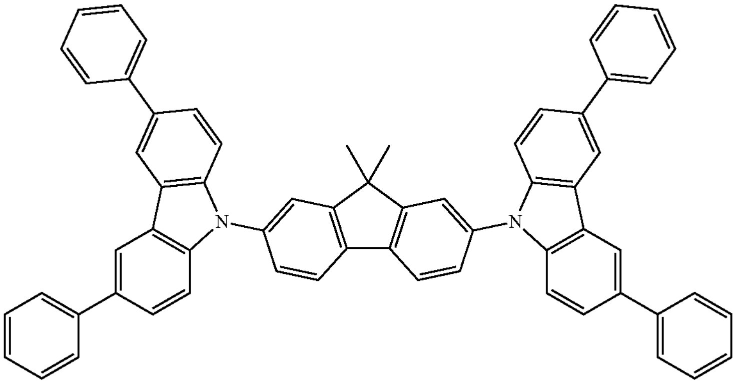
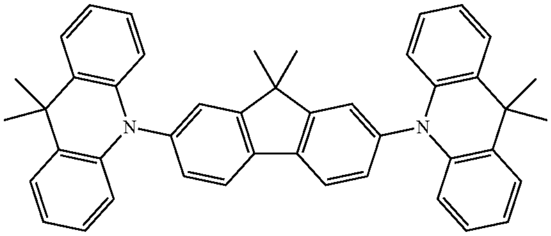
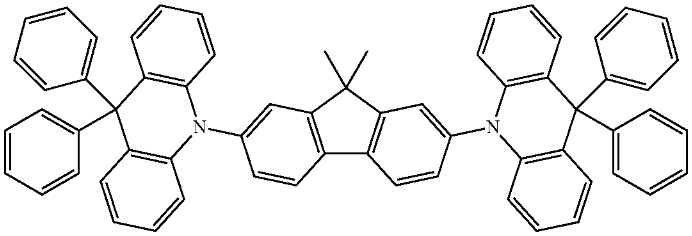
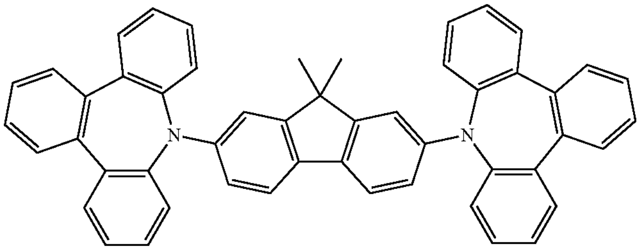

-continued
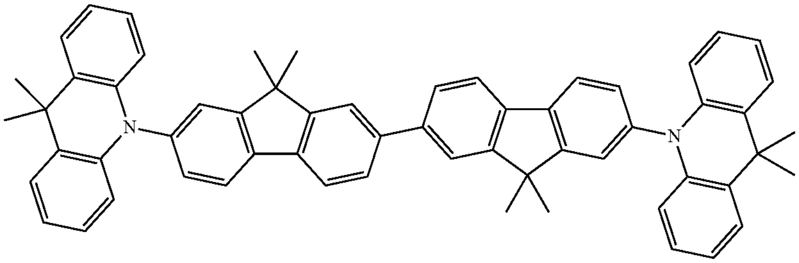
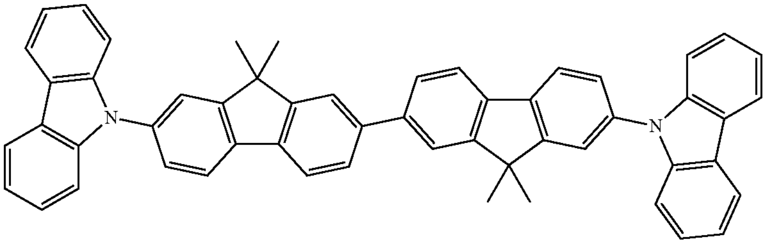
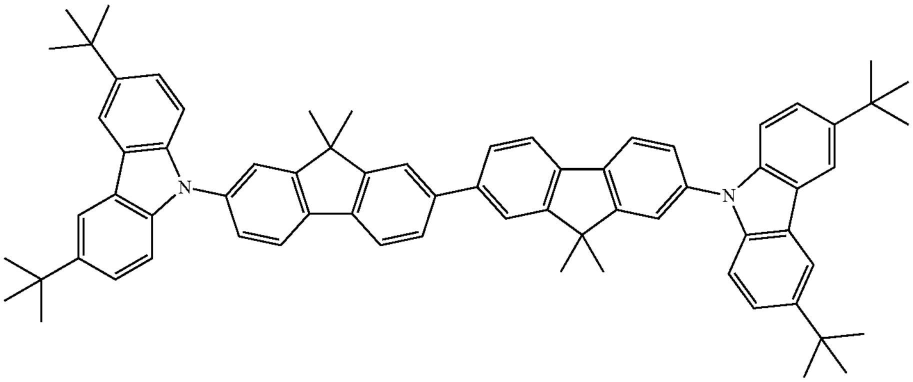
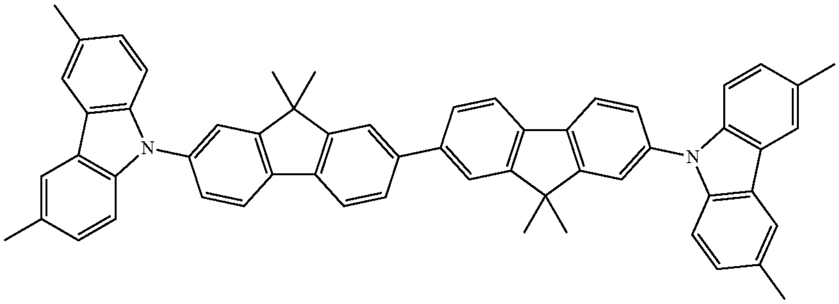
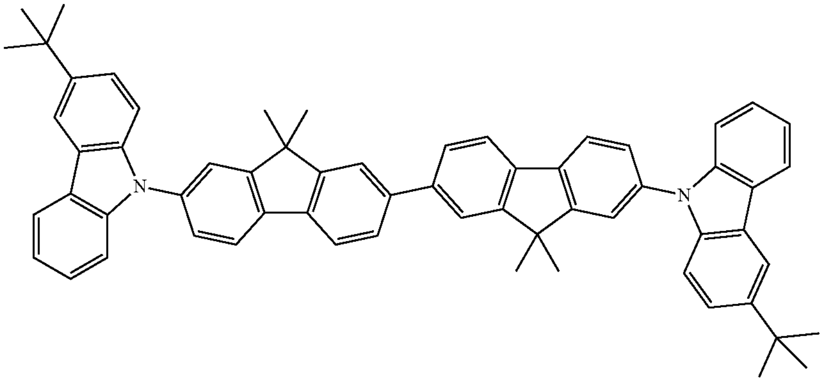

-continued
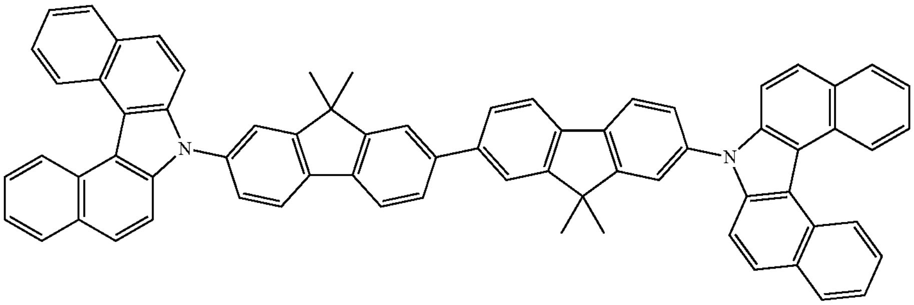
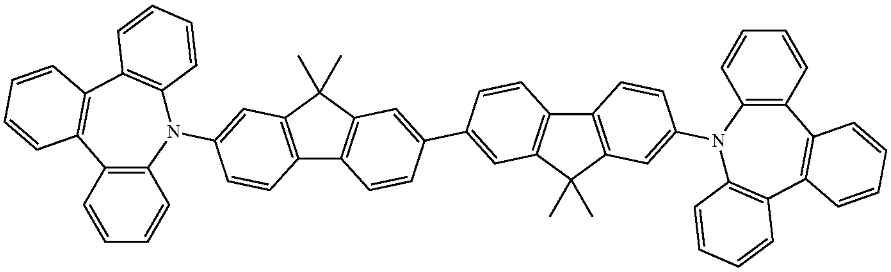
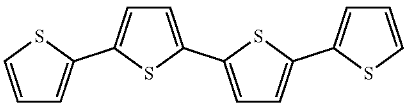
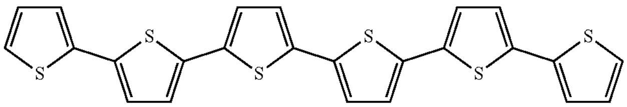
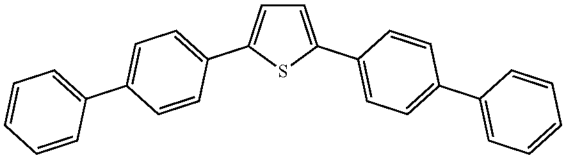
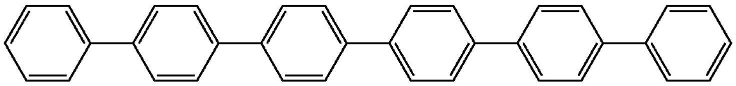
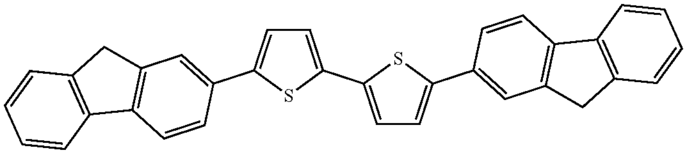
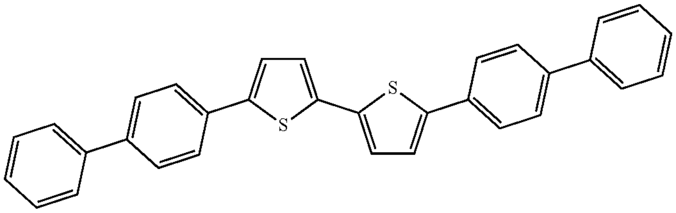
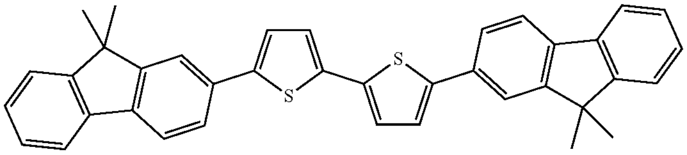
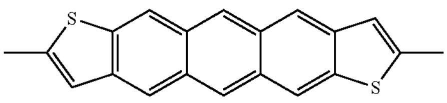
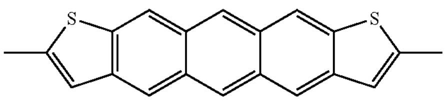
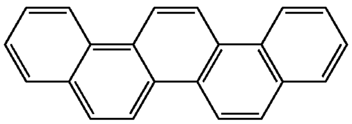
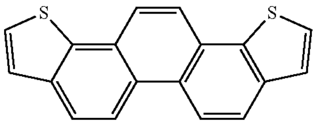

-continued
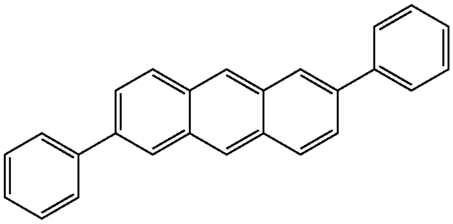
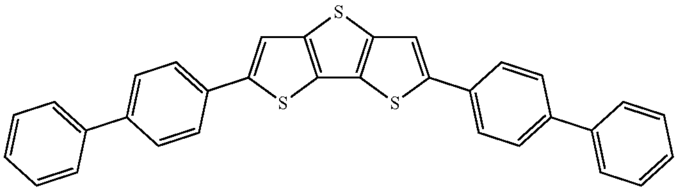
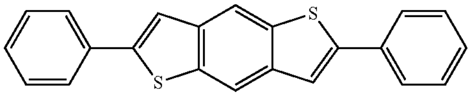
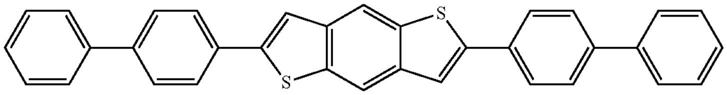
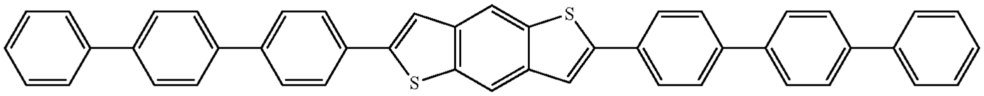
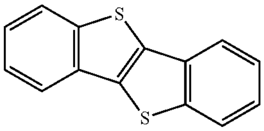
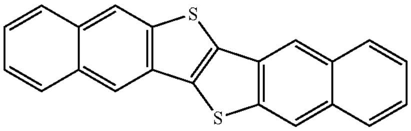
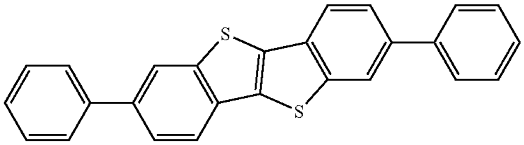
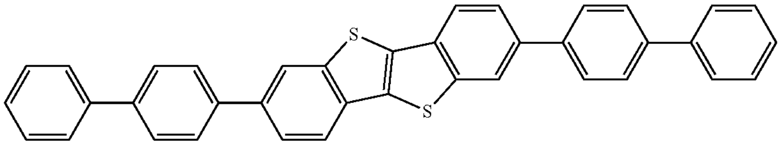
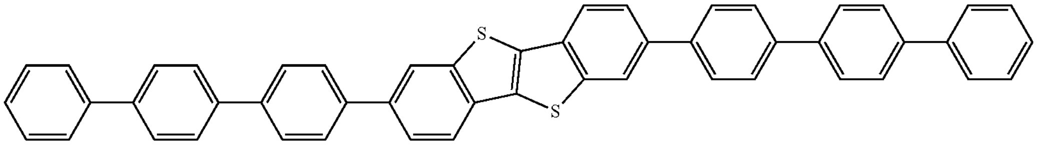
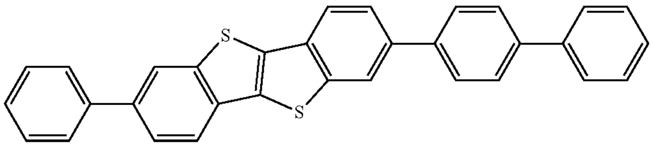
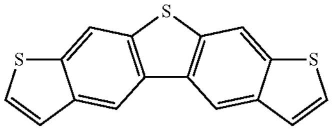
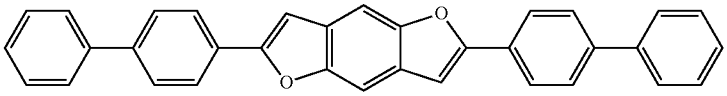
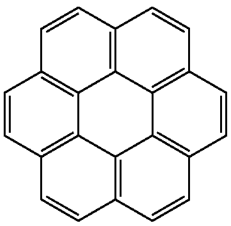

-continued
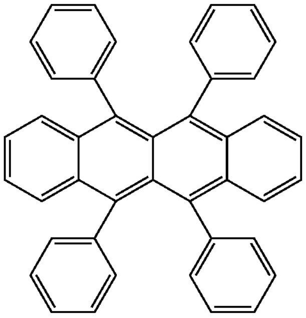
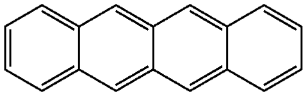
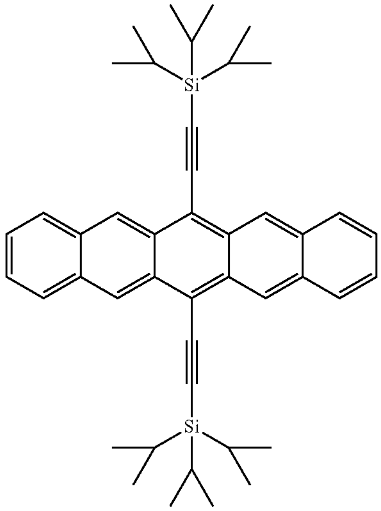
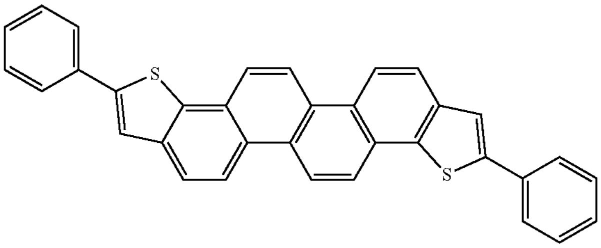
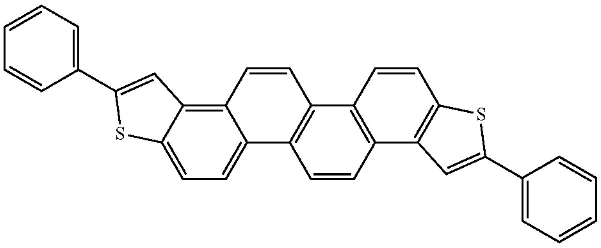
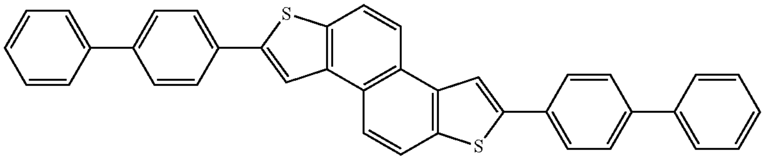
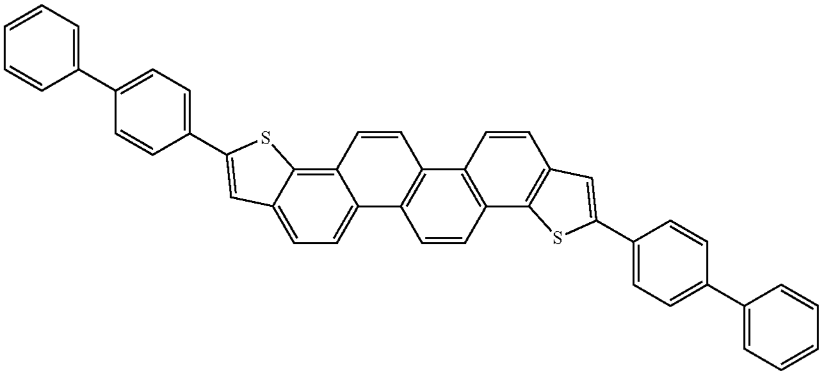

-continued
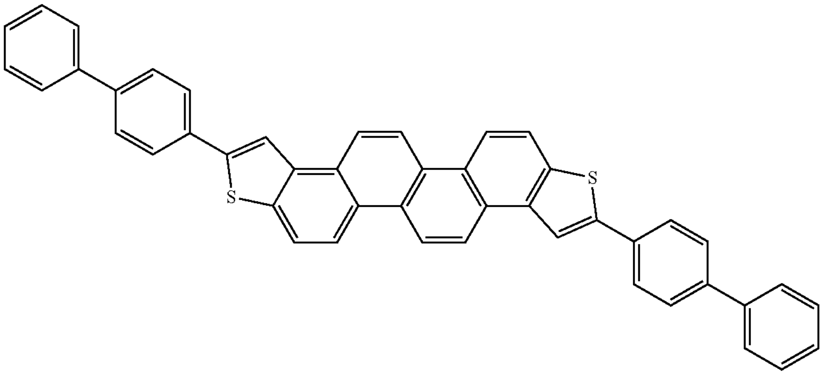
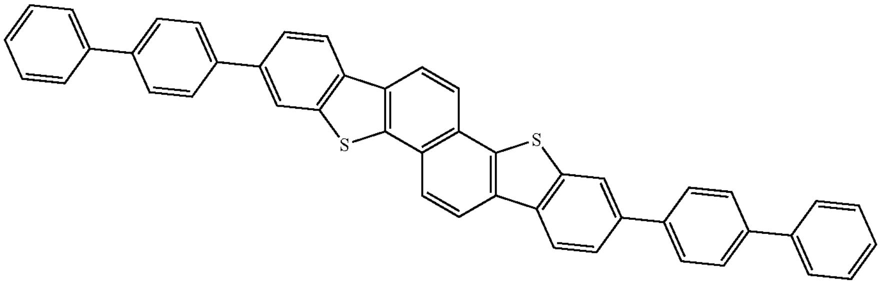
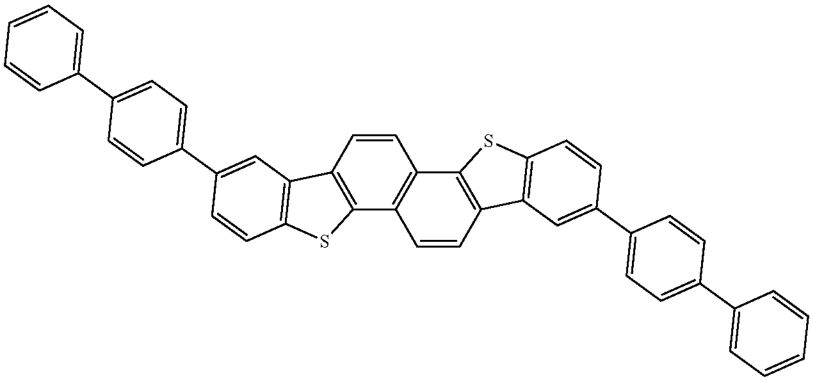
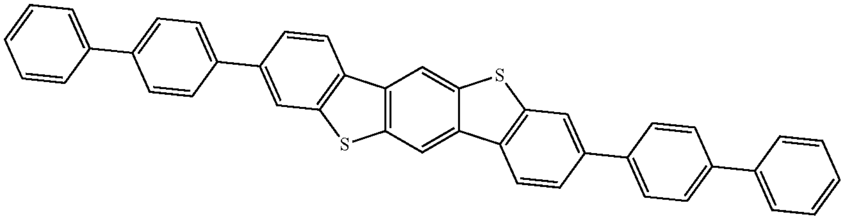
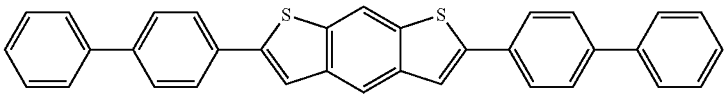

-continued

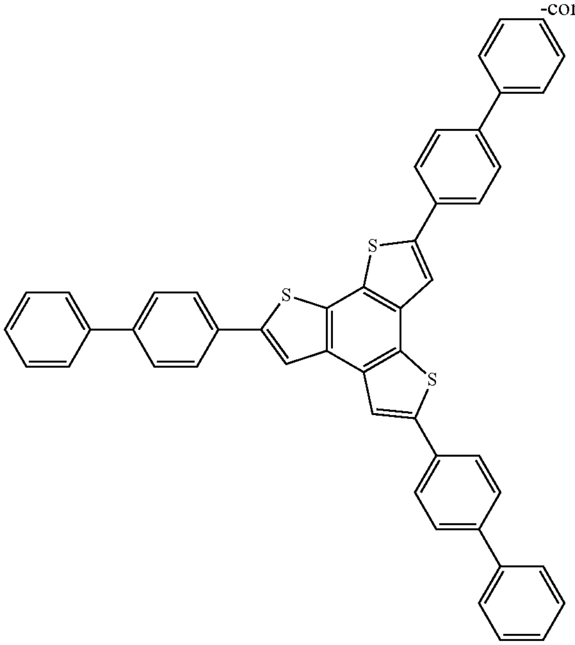

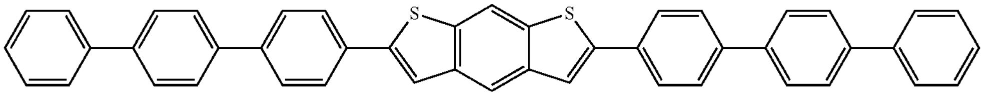

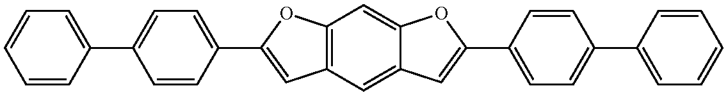

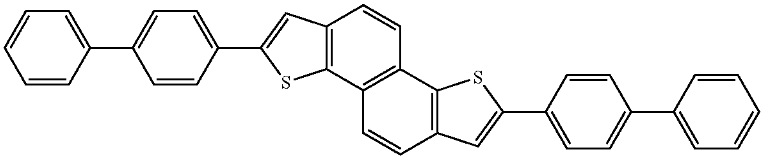

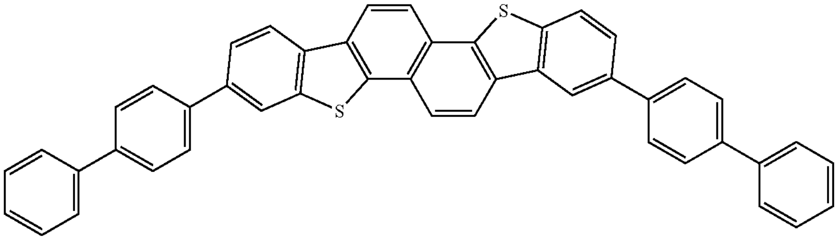

A content of the p-type semiconductor material in the photoelectric conversion film (=(film thickness of p-type semiconductor material in terms of single layer/film thickness of entire photoelectric conversion film)×100) is preferably 5% to 70% by volume, more preferably 10% to 50% by volume, and still more preferably 15% to 40% by volume.

The p-type semiconductor material contained in the photoelectric conversion film may be used alone, or two or more thereof may be used in combination.

The photoelectric conversion film according to the embodiment of the present invention is a non-light emitting film, and has a feature different from an organic light emitting diode (OLED). The non-light emitting film is intended for a film having a light emission quantum efficiency of 1% or less, and the light emission quantum efficiency is preferably 0.5% or less, and more preferably 0.1% or less.

<Film Formation Method>

The photoelectric conversion film can be formed mostly by a coating film formation method and a dry film formation method.

Examples of the coating film formation method include a coating methods such as a drop casting method, a casting method, a dip coating method, a die coater method, a roll coater method, a bar coater method, and a spin coating method, various printing methods such as an ink jet method, a screen printing method, a gravure printing method, a flexographic printing method, an offset printing method, and a microcontact printing method, and a Langmuir-Blodgett (LB) method.

Examples of the dry film formation method include a physical vapor deposition method such as a vapor deposition method (in particular, a vacuum vapor deposition method), a sputtering method, and an ion plating method, a molecular beam epitaxy (MBE) method, and a chemical vapor deposition (CVD) method such as plasma polymerization.

Among these, the dry film formation method is preferable, and the vacuum vapor deposition method is more preferable. In a case where the photoelectric conversion film is formed by the vacuum vapor deposition method, manufacturing conditions such as a degree of vacuum and a vapor deposition temperature can be set according to the normal method.

The thickness of the photoelectric conversion film is preferably 10 to 1000 nm, more preferably 50 to 800 nm, and still more preferably 50 to 500 nm.

<Electrode>

Electrodes (the upper electrode (the transparent conductive film) 15 and the lower electrode (the conductive film) 11) are formed of conductive materials. Examples of the conductive material include metals, alloys, metal oxides, electrically conductive compounds, and mixtures thereof.

Since light is incident through the upper electrode 15, the upper electrode 15 is preferably transparent to light to be detected. Examples of the materials constituting the upper electrode 15 include conductive metal oxides such as tin oxide (antimony tin oxide (ATO), fluorine doped tin oxide (FTO)) doped with antimony, fluorine, or the like, tin oxide, zinc oxide, indium oxide, indium tin oxide (ITO), and indium zinc oxide (IZO); metal thin films such as gold, silver, chromium, and nickel; mixtures or laminates of these metals and the conductive metal oxides; and organic conductive materials such as polyaniline, polythiophene, and polypyrrole. Among these, conductive metal oxides are preferable from the viewpoints of high conductivity, transparency, and the like.

In general, in a case where the conductive film is made to be thinner than a certain range, a resistance value is rapidly increased. However, in the solid-state imaging element into which the photoelectric conversion element according to the present embodiment is incorporated, the sheet resistance is preferably 100 to 10000 Ω/□, and a degree of freedom of a range of the film thickness that can be thinned is large. In addition, as the thickness of the upper electrode (the transparent conductive film) 15 is thinner, the amount of light that the upper electrode absorbs is smaller, and the light transmittance usually increases. The increase in the light transmittance causes an increase in light absorbance in the photoelectric conversion film and an increase in the photoelectric conversion ability, which is preferable. Considering the suppression of leakage current, an increase in the resistance value of the thin film, and an increase in transmittance accompanied by the thinning, the film thickness of the upper electrode 15 is preferably 5 to 100 nm, and more preferably 5 to 20 nm.

There is a case where the lower electrode 11 has transparency or an opposite case where the lower electrode 11 does not have transparency and reflects light, depending on the application. Examples of a material constituting the lower electrode 11 include conductive metal oxides such as tin oxide (ATO, FTO) doped with antimony, fluorine, or the like, tin oxide, zinc oxide, indium oxide, indium tin oxide (ITO), and indium zinc oxide (IZO); metals such as gold, silver, chromium, nickel, titanium, tungsten, and aluminum, conductive compounds (for example, titanium nitride (TiN)) such as oxides or nitrides of these metals; mixtures or laminates of these metals and conductive metal oxides; and organic conductive materials such as polyaniline, polythiophene, and polypyrrole.

The method of forming electrodes is not particularly limited, and can be appropriately selected in accordance with the electrode material. Specific examples thereof include a wet method such as a printing method and a coating method; a physical method such as a vacuum vapor deposition method, a sputtering method, and an ion plating method; and a chemical method such as a CVD method and a plasma CVD method.

In a case where the material of the electrode is ITO, examples thereof include an electron beam method, a sputtering method, a resistance heating vapor deposition method, a chemical reaction method (such as a sol-gel method), and a coating method with a dispersion of indium tin oxide.

<Charge Blocking Film: Electron Blocking Film and Positive Hole Blocking Film>

It is also preferable that the photoelectric conversion element according to the embodiment of the present invention has one or more interlayers between the conductive film and the transparent conductive film, in addition to the photoelectric conversion film. An example of the interlayer includes a charge blocking film. In a case where the photoelectric conversion element has this film, the characteristics (such as photoelectric conversion efficiency and responsiveness) of the obtained photoelectric conversion element are more excellent. Examples of the charge blocking film include an electron blocking film and a positive hole blocking film. The photoelectric conversion element preferably includes at least an electron blocking film as an interlayer.

Hereinafter, each of the films will be described in detail.

(Electron Blocking Film)

The electron blocking film is a donor organic semiconductor material (compound).

The electron blocking film preferably has an ionization potential of 4.8 to 5.8 eV.

An ionization potential Ip(B) of the electron blocking film, an ionization potential Ip (1) of the first compound, and an ionization potential Ip (2) of the second compound preferably satisfy a relationship of $Ip(B) \leq Ip\ (1)$ and $Ip(B) \leq Ip\ (2)$.

As the electron blocking film, for example, a p-type semiconductor material can be used. The p-type semiconductor material may be used alone, or two or more thereof may be used in combination.

Examples of the p-type semiconductor material include a p-type organic semiconductor material, and specific examples thereof include triarylamine compounds (for example, N, N'-bis (3-methylphenyl)-(1,1'-biphenyl)-4,4'-diamine (TPD), 4,4'-bis [N-(naphthyl)-N-Phenyl-amino]biphenyl (α-NPD), compounds disclosed in paragraphs [0128] to [0148] of JP2011-228614A, compounds disclosed in paragraphs [0052] to [0063] of JP2011-176259A, compounds disclosed in paragraphs [0119] to [0158] of JP2011-225544A, compounds disclosed in paragraphs [0044] to [0051] of JP2015-153910A, and compounds disclosed in paragraphs [0086] to [0090] of JP2012-094660A, pyrazoline compounds, styrylamine compounds, hydrazone compounds, polysilane compounds, thiophene compounds (for example, a thienothiophene derivative, a dibenzothiophene derivative, a benzodithiophene derivative, a dithienothiophene derivative, a [1] benzothieno [3,2-b]thiophene (BTBT) derivative, a thieno [3,2-f: 4,5-f]bis [1]benzothiophene (TBBT) derivative, compounds disclosed in paragraphs [0031] to [0036] of JP2018-014474A, compounds disclosed in paragraphs [0043] to [0045] of WO2016-194630A, compounds disclosed in paragraphs [0025] to [0037], and [0099] to [0109] of WO2017-159684A, compounds disclosed in paragraphs [0029] to [0034] of JP2017-076766A, compounds disclosed in paragraphs [0015] to [0025] of WO2018-207722A, compounds disclosed in paragraphs [0045] to [0053] of JP2019-054228A, compounds disclosed in paragraphs [0045] to [0055] of WO2019-058995A, compounds disclosed in paragraphs [0063] to [0089] of WO2019-081416A, compounds disclosed in paragraphs [0033] to [0036] of JP2019-80052A, compounds disclosed in paragraphs [0044] to [0054] of WO2019-054125A, compounds disclosed in paragraphs [0041] to [0046] of WO2019-093188A, and the like), a cyanine compound, an oxonol compound, a polyamine compound, an indole compound, a pyrrole compound, a pyrazole compound, a polyarylene compound, a fused aromatic carbocyclic compound (for example, a naphthalene derivative, an anthracene derivative, a phenanthrene derivative, a tetracene derivative, a pentacene derivative, a pyrene derivative, a perylene derivative, and a fluoranthene derivative), a porphyrin compound, a phthalocyanine compound, a triazole compound, an oxadiazole compound, an imidazole compound, a polyarylalkane compound, a pyrazolone compound, an amino-substituted chalcone compound, an oxazole compound, a fluorenone compound, a silazane compound, and a metal complex having nitrogen-containing heterocyclic compounds as ligands.

Examples of the p-type semiconductor material include compounds having an ionization potential smaller than that of the n-type semiconductor material, and in a case where this condition is satisfied, the organic coloring agents exemplified as the n-type semiconductor material can be used.

A polymer material can also be used as the electron blocking film.

Examples of the polymer material include a polymer such as phenylenevinylene, fluorene, carbazole, indole, pyrene, pyrrole, picoline, thiophene, acetylene, and diacetylene, and a derivative thereof.

The electron blocking film may be formed of a plurality of films.

The electron blocking film may be formed of an inorganic material. In general, since an inorganic material has a dielectric constant larger than that of an organic material, in a case where the inorganic material is used in the electron blocking film, a large voltage is applied to the photoelectric conversion film. Therefore, the photoelectric conversion efficiency increases.

Examples of the inorganic material that can be used for the electron blocking film include calcium oxide, chromium oxide, copper chromium oxide, manganese oxide, cobalt oxide, nickel oxide, copper oxide, copper gallium oxide, copper strontium oxide, niobium oxide, molybdenum oxide, copper indium oxide, silver indium oxide, and iridium oxide.

(Positive Hole Blocking Film)

A positive hole blocking film is an acceptor-property organic semiconductor material (compound), and the n-type semiconductor material described above can be used.

The method of manufacturing the charge blocking film is not particularly limited, and examples thereof include a dry film formation method and a wet film formation method. Examples of the dry film formation method include a vapor deposition method and a sputtering method. The vapor deposition method may be any of a physical vapor deposition (PVD) method and a chemical vapor deposition (CVD) method, and the physical vapor deposition method such as a vacuum vapor deposition method is preferable. Examples of the wet film formation method include an ink jet method, a spray method, a nozzle printing method, a spin coating method, a dip coating method, a casting method, a die coating method, a roll coating method, a bar coating method, and a gravure coating method, and an ink jet method is preferable from the viewpoint of high accuracy patterning.

Each thickness of the charge blocking films (the electron blocking film and the positive hole blocking film) is preferably 3 to 200 nm, more preferably 5 to 100 nm, and still more preferably 5 to 30 nm.

<Substrate>

The photoelectric conversion element may further include a substrate. Types of the substrate to be used are not particularly limited, and examples of the substrate include a semiconductor substrate, a glass substrate, and a plastic substrate.

A position of the substrate is not particularly limited, and in general, the conductive film, the photoelectric conversion film, and the transparent conductive film are laminated on the substrate in this order.

<Sealing Layer>

The photoelectric conversion element may further include a sealing layer. The performance of a photoelectric conversion material may deteriorate noticeably due to the presence of deterioration factors such as water molecules. The deterioration can be prevented by coating and sealing the entirety of the photoelectric conversion film with the sealing layer such as diamond-like carbon (DLC) or ceramics such as metal oxide, or metal nitride, and metal nitride oxide which are dense and into which water molecules do not permeate.

The material of the sealing layer may be selected and the sealing layer may be manufactured according to the description in paragraphs [0210] to [0215] of JP2011-082508A.

In the photoelectric conversion element according to the embodiment of the present invention, the photoelectric conversion film may have a configuration of only one layer or a multilayer structure with two or more layers. In a case where the photoelectric conversion film in the photoelectric conversion element according to the embodiment of the present invention has a multilayer structure with two or more layers, at least one layer may contain the specific compound.

In a case where the photoelectric conversion element according to the embodiment of the present invention is applied to an imaging element and an optical sensor described later, the photoelectric conversion film in the photoelectric conversion element is preferably composed as a laminate including, for example, a layer containing the specific compound and a layer having photosensitivity in the near-infrared region and infrared region. Configurations of photoelectric conversion elements disclosed in JP2019-208026A, JP2018-125850A, JP2018-125848A, and other related arts can apply to such a configuration of the photoelectric conversion element, for example.

[Imaging Element]

An example of the application of the photoelectric conversion element includes an imaging element having a photoelectric conversion element. The imaging element is an element that converts optical information of an image into an electric signal. In general, a plurality of the photoelectric conversion elements are arranged in a matrix on the same plane, and an optical signal is converted into an electric signal in each photoelectric conversion element (pixel) to sequentially output the electric signal to the outside of the imaging element for each pixel. Therefore, each pixel is formed of one or more photoelectric conversion elements and one or more transistors.

The imaging element is mounted on an imaging element such as a digital camera and a digital video camera, an electronic endoscope, and imaging modules such as a cellular phone.

The photoelectric conversion element according to the embodiment of the present invention is also preferably used for an optical sensor including the photoelectric conversion element according to the embodiment of the present invention. The photoelectric conversion element may be used alone as the optical sensor, and the photoelectric conversion element may be used as a line sensor in which the photoelectric conversion elements are linearly arranged or as a two-dimensional sensor in which the photoelectric conversion elements are arranged in plane.

[Compound]

The present invention also relates to a compound.

The compound according to an embodiment of the present invention is a compound (specific compound) represented by the above-described Formula (1), and suitable embodiments are also the same.

The specific compound is particularly useful as a material of the photoelectric conversion film used for the optical sensor, the imaging element, or a photoelectric cell. In addition, the specific compound usually functions as the p-type organic semiconductor in the photoelectric conversion film in many cases. The specific compound can also be used as a coloring material, a liquid crystal material, an organic semiconductor material, a charge transport material, a pharmaceutical material, and a fluorescent diagnostic material.

EXAMPLES

The present invention will be described in more detail based on Examples below. Materials, used amounts, ratios, treatment contents, treatment procedures, and the like described in the following Examples can be appropriately changed within the range that does not depart from the gist of the present invention. Therefore, the range of the present invention should not be limitatively interpreted by the following Examples.

Synthesis Examples

[Synthesis of Compounds (D-1) to (D-14)]

Synthesis of Compound (D-1)>

A compound (D-1) was synthesized according to the following scheme.

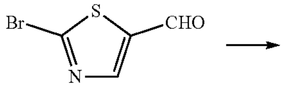

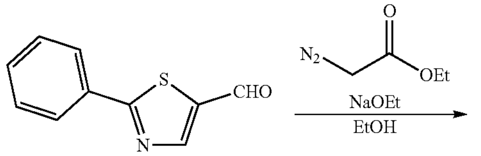

(A-1)

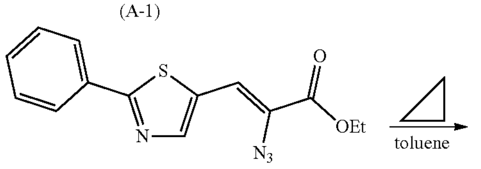

(A-2)

-continued

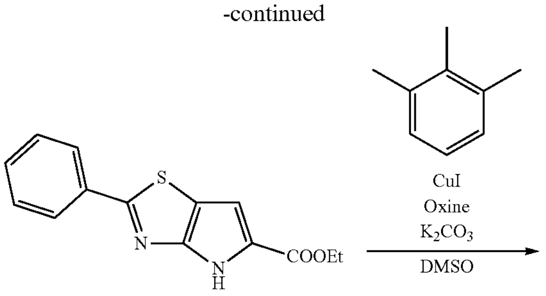

(A-3)

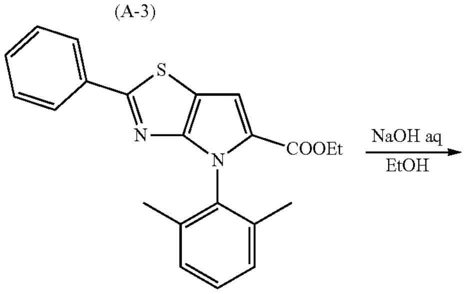

(A-4)

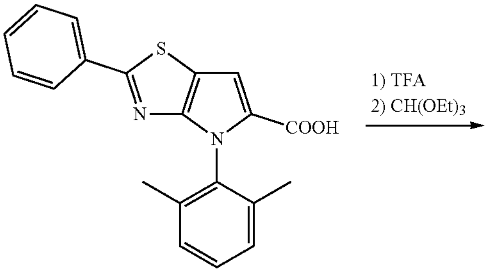

(A-5)

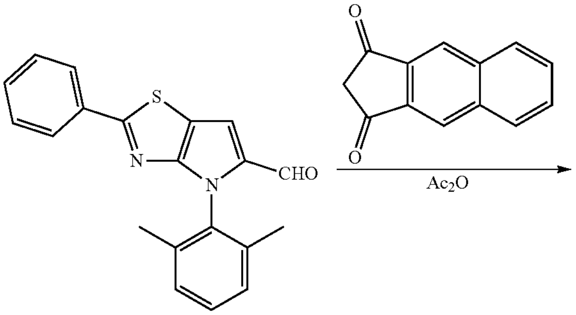

(A-6)

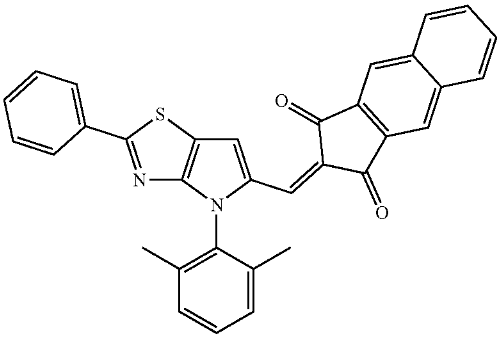

(D-1)

A compound (A-1) was synthesized by using 2-bromothiazole-5-carboxyaldehyde according to a method described in org. Lett. 2019, 21, 3028-3033.

A compound (A-1) (6.07 g, 32.1 mmol) and ethyl azidoacetate (8.29 g, 64.2 mmol) were dissolved in ethanol (200 mL) and stirred at 0° C., a 20 wt % sodium ethoxide ethanol solution (21.8 g, 64.2 mmol) was added thereto, and the mixed solution thus obtained was stirred at 0° C. for 8 hours. A saturated ammonium chloride aqueous solution and water were added to the mixed solution to precipitate a solid. The precipitated solid was collected by filtration and washed with water. The solid thus obtained was vacuum dried to obtain a compound (A-2) (6.07 g, yield 63%).

The compound (A-2) (6.07 g, 20.2 mmol) was dissolved in toluene (180 mL) and the solution thus obtained was stirred at 100° C. for 3 hours. After allowing the solution to cool, the solvent was distilled off under reduced pressure. The crude product thus obtained was purified by silica gel chromatography (eluent: chloroform) to obtain a solid. The solid thus obtained was dissolved in chloroform, and methanol was added thereto to precipitate a solid. The precipitated solid was collected by filtration and washed with methanol. The solid thus obtained was vacuum dried to obtain a compound (A-3) (3.14 g, yield 57%).

The compound (A-3) (1.43 g, 5.24 mmol), 2-iodo-m-xylene (15.7 mmol), oxine (495 mg, 2.6 mmol), copper (I) iodide (377 mg,). 2.6 mmol), potassium carbonate (2.17 g, 15.7 mmol), and dimethyl sulfooxide (16 mL) were mixed, and the mixed solution thus obtained was stirred at 140° C. for 4 hours. After allowing the compound (A-3) to cool, a saturated ammonium chloride aqueous solution was added thereto, and the mixture was subjected to extraction with ethyl acetate. The organic layer thus obtained was washed with water by using a separating funnel and concentrated under reduced pressure. The crude product thus obtained was purified by silica gel chromatography (eluent: hexane/ethyl acetate=95:5 to hexane/ethyl acetate=80:20) to obtain a compound (A-4) (1.30 g, yield 66%).

The compound (A-4) (1.29 g, 3.43 mmol) was dissolved in ethanol (40 mL), a 1 M sodium hydroxide aqueous solution (10.3 mL) was added thereto, and the mixed solution thus obtained was heated and refluxed, and stirred for 5 hours. After allowing the compound (A-4) to cool, a 1 M hydrochloric acid aqueous solution was added until the pH of the mixed solution became 1 to precipitate a solid. The precipitated solid was collected by filtration and washed with water. The solid thus obtained was vacuum dried to obtain a compound (A-5) (1.11 g, yield 93%).

The mixed solution obtained by adding trifluoroacetic acid (10 mL) to the compound (A-5) (1.05 g, 3.0 mmol) was stirred at room temperature for 15 minutes. Thereafter, ethyl orthoformate (5 mL) was added to the mixed solution, and the mixture was further stirred at room temperature for 15 minutes. The mixed solution was added to a saturated sodium bicarbonate aqueous solution (200 mL) and stirred for 30 minutes to precipitate a solid. The precipitated solid was collected by filtration and washed with water. The solid thus obtained was vacuum dried to obtain a compound (A-6) (689 mg, yield 70%).

The compound (A-6) (665 mg, 2.0 mmol), benzoin dandione (412 mg, 2.1 mmol), and acetic anhydride (15 mL) were mixed, and the mixed solution thus obtained was stirred at 70° C. for 4 hours. After allowing the compound (A-6) to cool, methanol (30 mL) was added to the mixed solution, and the mixture was stirred for 30 minutes to precipitate a solid. The precipitated solid was collected by filtration and washed with methanol to obtain a crude product. The crude product thus obtained was dissolved in chloroform, and methanol was added thereto to precipitate a solid. The precipitated solid was collected by filtration and washed with methanol. The solid thus obtained was vacuum dried to obtain a compound (D-1) (868 mg, yield 85%).

The obtained compound (D-1) was identified by mass spectrometry (MS). MS(ESI$^+$) m/z: 511.1 ([M+H]$^+$)

<Synthesis of Compounds (D-2) to (D-14)>

Compounds (D-2) to (D-14) were synthesized with reference to the synthesis method of the above-described compound (D-1).

[Synthesis of Compounds (D-15) to (D-26)]

<Synthesis of Compound (D-15)>

A compound (D-15) was synthesized according to the following scheme.

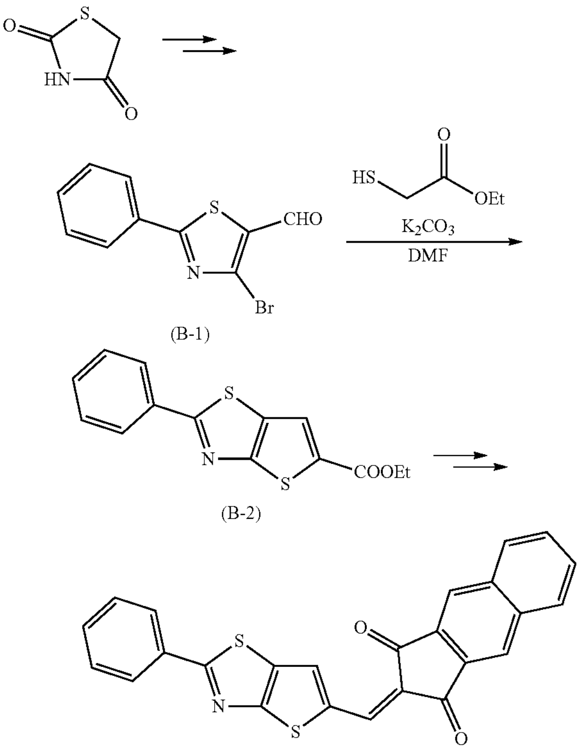

(B-1)

(B-2)

(D-15)

A compound (B-1) was synthesized by using 2,4-thiazolidinedione with reference to a method described in Bioorg. Med. Chem. Lett., 2006, 16, 49-54.

The compound (B-1) (3.49 g, 13 mmol), potassium carbonate (2.76 g, 20 mmol), and N,N-dimethylformamide (10 mL) were mixed, and was stirred at 60° C. Ethyl mercaptoacetate (1.4 mL, 13 mmol) and a catalytic amount of 18-crown ether were added thereto, and the mixed solution thus obtained was stirred at 60° C. for 12 hours. After allowing the mixture to cool, water was added to the mixed solution, and the mixed solution thus obtained was subjected to extraction with ethyl acetate. The organic layer thus obtained was washed with water by using a separating funnel and concentrated under reduced pressure. The crude product thus obtained was purified by silica gel chromatography (eluent: hexane/ethyl acetate=95:5) to obtain a compound (B-2) (2.97 g, yield 79%).

The compound (D-15) was synthesized by using the compound (B-2) with reference to the methods for synthesizing the above-described compound (D-1) (specifically, the synthesis method carried out after the synthesis method of the compound (A-3)).

<Synthesis of Compounds (D-16) to (D-26)>

Compounds (D-16) to (D-26) were synthesized with reference to the synthesis method of the above-described compound (D-15).

Structures of the compounds (D-1) to (D-26) and comparative compounds (R-1) to (R-3) will be specifically described below.

The structures of the compounds (D-1) to (D-26) described below include both cis and trans isomers. That is, in a case where the compounds (D-1) to (D-26) were applied to Formula (1), the structures of the compounds (D-1) to (D-26) are intended to include both cis and trans isomers, which can be distinguished based on a group corresponding to a C═C double bond composed of a carbon atom to which $R^{a2}$ is bonded and a carbon atom adjacent to the carbon atom to which $R^{a2}$ is bonded. In a case where $Y^{11}$ represents $=CR^{a7}R^{a8}$, it is intended to include both cis and trans isomers, which can be distinguished based on the C═C double bond composed of a carbon atom to which $R^{a7}$ and $R^{a8}$ are bonded and a carbon atom adjacent to the carbon atom to which $R^{a7}$ and $R^{a8}$ are bonded (corresponding to a carbon atom that is a constituent atom of a ring represented by $A^{11}$, which is specified in Formula (1)).

In addition, in a case where the compounds (D-1) to (D-26) were applied to Formula (2), the structures of the compounds (D-1) to (D-26) are intended to include both cis and trans isomers, which can be distinguished based on a group corresponding to a C═C double bond composed of a carbon atom to which $R^{b2}$ is bonded and a carbon atom adjacent to the carbon atom to which $R^{b2}$ is bonded. In a case where $Y^{41}$ represents $=CR^{16}R^{b7}$, it is intended to include both cis and trans isomers, which can be distinguished based on the C═C double bond composed of a carbon atom to which $R^{b6}$ and $R^{b7}$ are bonded and a carbon atom adjacent to the carbon atom to which $R^{b6}$ and $R^{b7}$ are bonded (corresponding to a carbon atom that is a constituent atom of a ring represented by $A^{41}$, which is specified in Formula (2)).

In addition, in a case where the compounds (D-1) to (D-26) were applied to Formula (3), the structures of the compounds (D-1) to (D-26) are intended to include both cis and trans isomers, which can be distinguished based on a group corresponding to a C═C double bond composed of a carbon atom to which $R^{c2}$ is bonded and a carbon atom adjacent to the carbon atom to which $R^{c2}$ is bonded. In a case where $Y^{51}$ represents $=CR^{C7}R$'s, it is intended to include both cis and trans isomers, which can be distinguished based on the C═C double bond composed of a carbon atom to which $R^{c7}$ and $R^{c8}$ are bonded and a carbon atom adjacent to the carbon atom to which $R^{c7}$ and $R^{c8}$ are bonded (corresponding to a carbon atom that is a constituent atom of a ring represented by $A^{51}$, which is specified in Formula (3)).

D-1

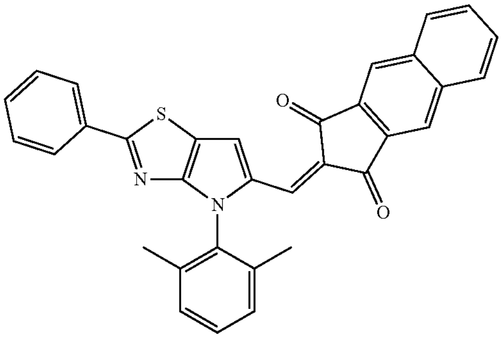

-continued

D-2

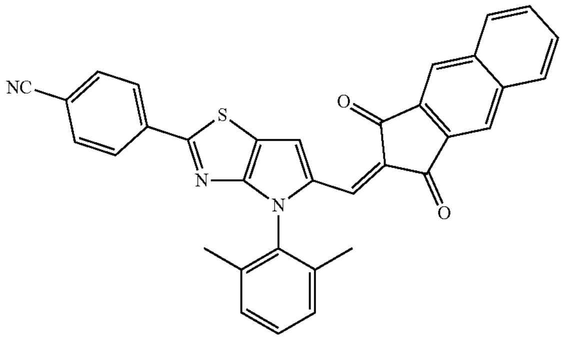

D-3

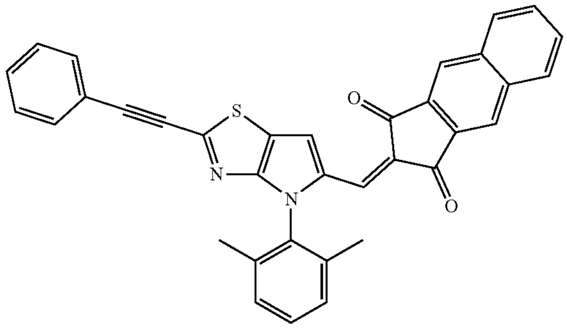

D-4

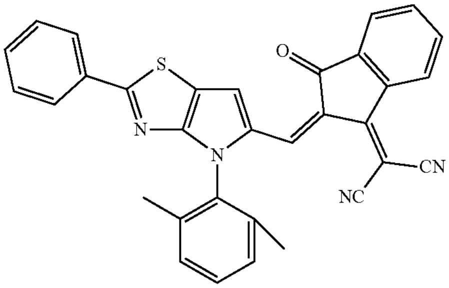

D-5

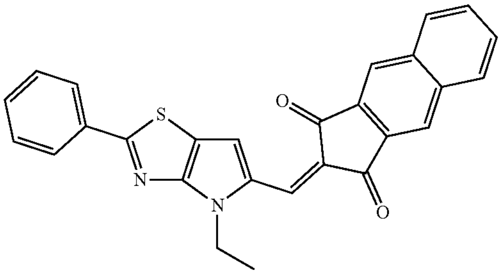

D-6

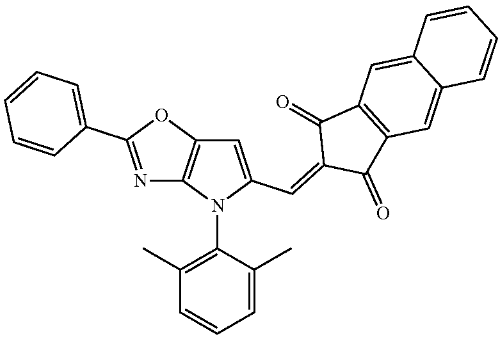

-continued
D-7
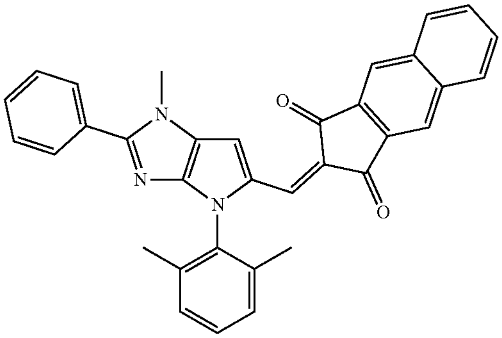
D-8
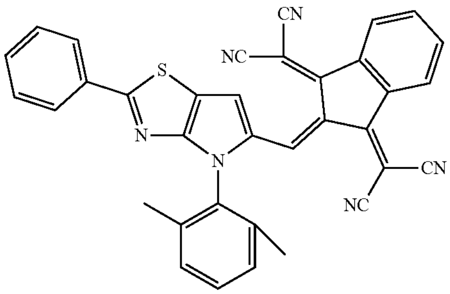
D-9
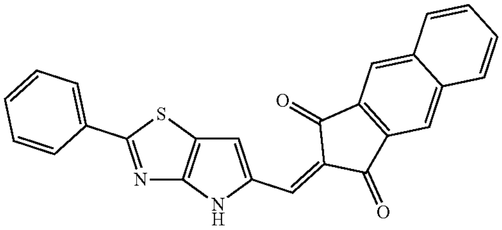
D-10
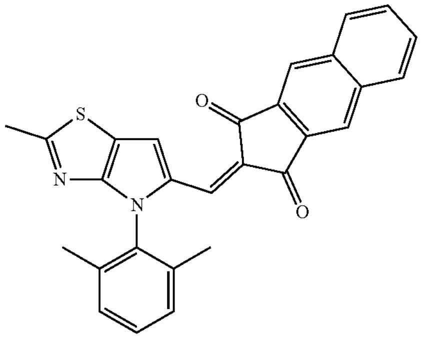
D-11
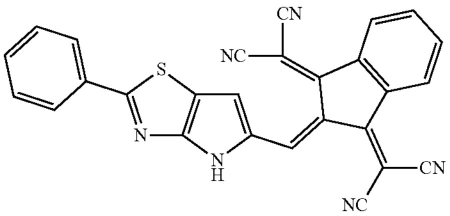
-continued
D-12
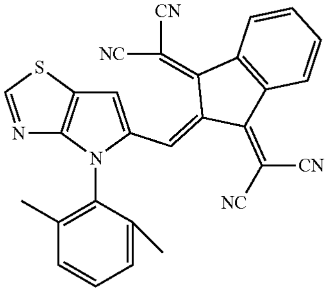
D-13
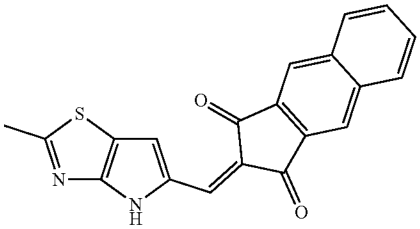
D-14
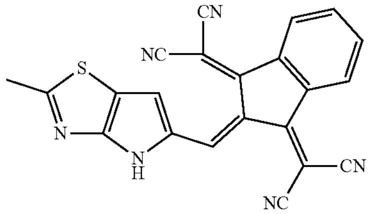
D-15
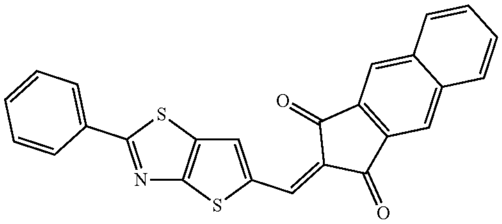
D-16
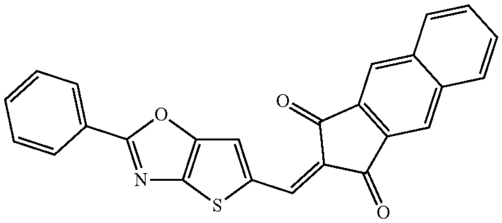
D-17
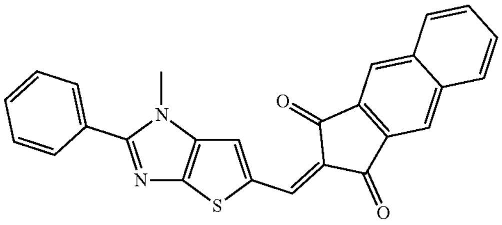

-continued

D-18

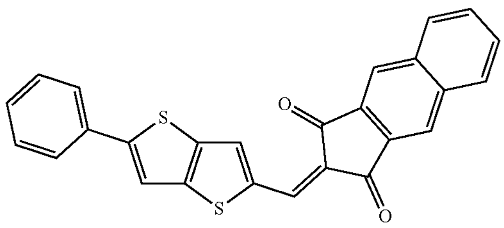

D-19

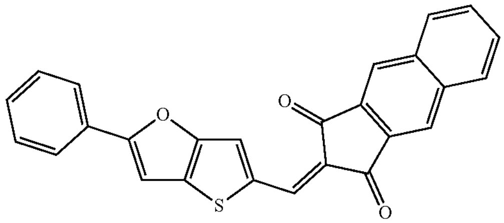

D-20

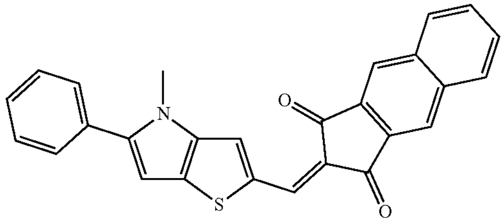

D-21

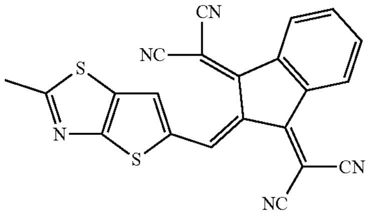

D-22

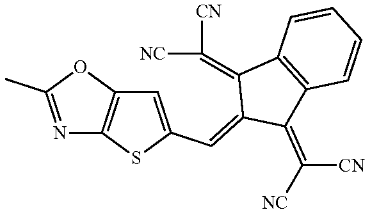

D-23

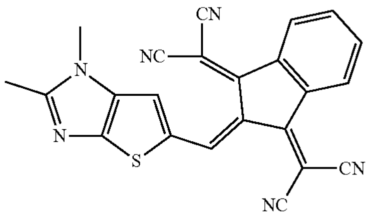

D-24

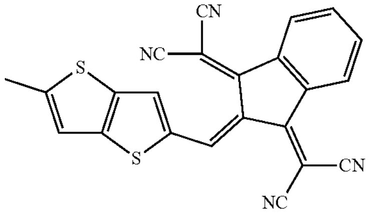

-continued

D-25

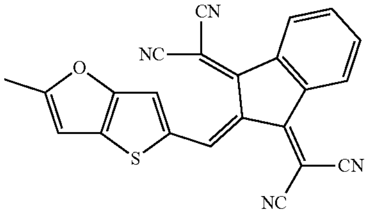

D-26

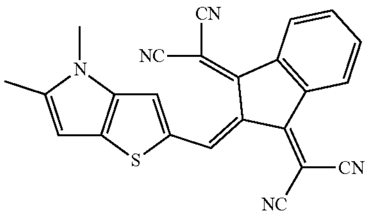

R-1

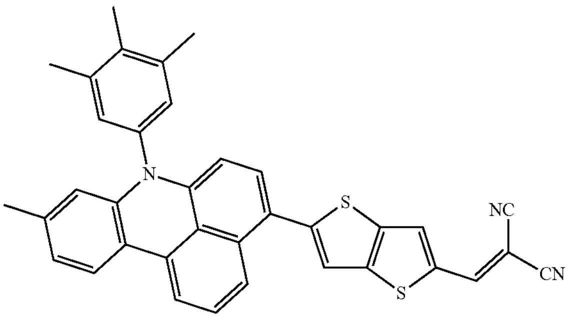

R-2

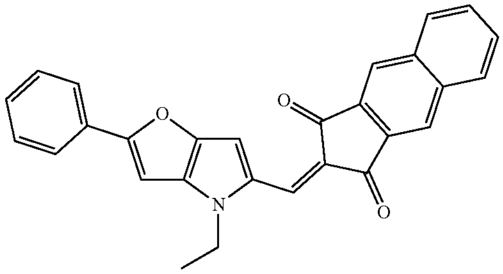

R-3

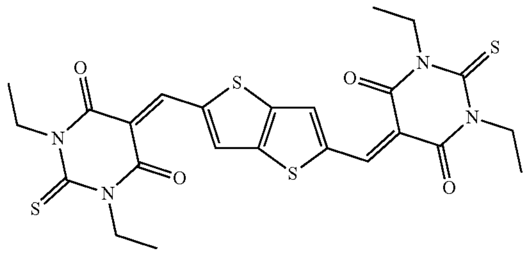

[Production of Photoelectric Conversion Element]

A photoelectric conversion element was produced by the following procedure.

[Production of Photoelectric Conversion Element]

A photoelectric conversion element having the form of FIG. 1 was produced using the obtained compound. Here, the photoelectric conversion element consists of a lower electrode 11, an electron blocking film 16A, a photoelectric conversion film 12, and an upper electrode 15.

Specifically, an amorphous ITO was formed into a film on a glass substrate by a sputtering method to form the lower electrode 11 (thickness: 30 nm). Furthermore, a compound (EB-1) described later was formed into a film on the lower electrode 11 by a vacuum thermal vapor deposition method to form the electron blocking film 16A (thickness: 30 nm).

Furthermore, in a state where the temperature of the substrate was controlled to 25° C., the above-described compound (D-1), the n-type semiconductor material (fullerene ($C_{60}$)), and the p-type semiconductor material (any compound of compounds (P-1) to (P-4) described later) as desired were subjected to co-vapor deposition by a vacuum vapor deposition method to be 80 nm respectively, in terms of a single layer, on the electron blocking film 16A, thereby being formed into a film. As a result, a photoelectric conversion film 12 having a bulk hetero structure of 160 nm (240 nm in a case where the p-type semiconductor material was also used) was formed.

Furthermore, amorphous ITO was formed into a film on the photoelectric conversion film 12 by a sputtering method to form the upper electrode 15 (the transparent conductive film) (the thickness: 10 nm). A SiO film was formed, as a sealing layer, on the upper electrode 15 by a vacuum vapor deposition method, and thereafter, an aluminum oxide ($Al_2O_3$) layer is formed on the SiO film by an atomic layer chemical vapor deposition (ALCVD) method to produce a photoelectric conversion element.

In addition, photoelectric conversion elements were produced by the same method, except that the compound (D-1) was changed to each of the compounds (D-2) to (D-26) or the comparative compounds (R-1) to (R-3). The same descriptions applied to the compounds (D-2) to (D-26) and the comparative compounds (R-1) to (R-3).

[Various Materials]

Various materials used for producing the above-described photoelectric conversion element will be described.

<Material for Forming Electron Blocking Film>

As an electron blocking film forming material, the following compound (EB-1) was used.

EB-1

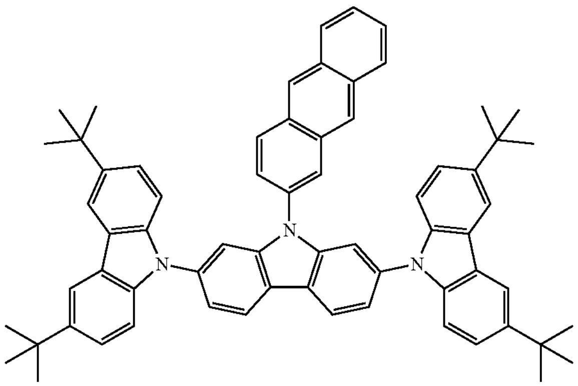

<n-Type Semiconductor Material>

Fullerene ($C_{60}$) was used as the n-type semiconductor material.

<p-Type Semiconductor Material>

The following compounds (P-1) to (P-4) were used as the p-type semiconductor material.

(P-1)

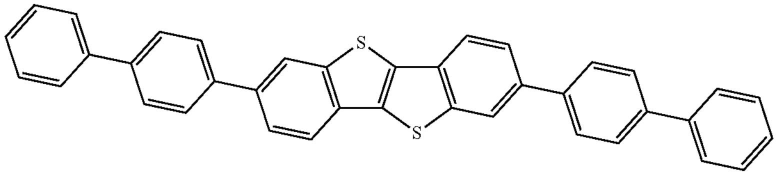

(P-2)

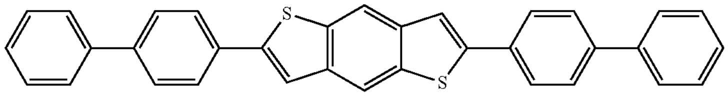

(P-3)

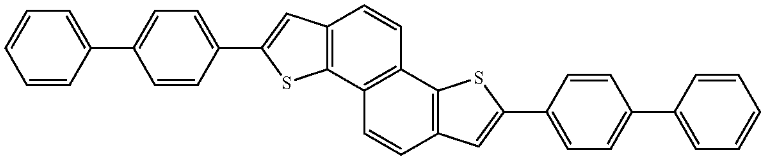

(P-4)

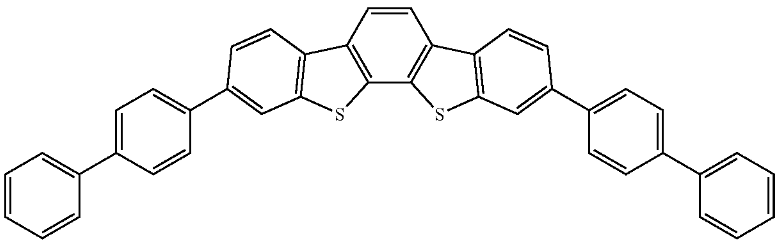

[Evaluation]

[Evaluation of Photoelectric Conversion Efficiency (External Quantum Efficiency)]

The drive of each photoelectric conversion element thus obtained was confirmed. A voltage was applied to each photoelectric conversion element to have an electric field strength of $2.0\times10^5$ V/cm. Thereafter, light is emitted from the upper electrode (transparent conductive film) side to perform the IPCE measurement, and the external quantum efficiency (external quantum efficiency before the continuous drive) at each of wavelengths of 450 nm, 580 nm, and 650 nm was then extracted. It was confirmed that all of the photoelectric conversion elements produced by using the compounds (D-1) to (D-26) and the comparative compounds (R-1) to (R-3) had a photoelectric conversion efficiency of 50% or more at all wavelengths of 450 nm, 580 nm, and 650 nm, and the photoelectric conversion elements had the sufficient external quantum efficiency. The external quantum efficiency was measured using a constant energy quantum efficiency measuring device manufactured by Optel Co., Ltd. The amount of light emitted was 50 W/$cm^2$.

In addition, the photoelectric conversion efficiency of the photoelectric conversion element obtained in Comparative Example 1 was standardized at each of wavelengths of 450 nm, 580 nm, and 650 nm to 1 to obtain a relative value of the photoelectric conversion efficiency of each photoelectric conversion element, and the value thus obtained was evaluated according to the standard described below. In terms of practicality, "A", "B", "C", and "D" are preferable evaluation results, and "A", "B", and "C" are more preferable evaluation results.

<Evaluation Standard>

"A": 1.8 or more

"B": 1.5 or more and less than 1.8

"C": 1.3 or more and less than 1.5

"D": 1.1 or more and less than 1.3

"E": less than 1.1

[Evaluation of Responsiveness]

The responsiveness of each of the obtained photoelectric conversion elements was evaluated. A voltage was applied to each photoelectric conversion element to have a strength of $2.0\times10^5$ V/cm. Thereafter, light emitting diodes (LEDs) were turned on momentarily to emit light from the upper electrode (transparent conductive film) side, a photocurrent at each of wavelengths of 450 nm, 580 nm, and 650 nm was measured with an oscilloscope, and a rise time of signal intensity from 0% to 97% was calculated. Next, a rise time of the photoelectric conversion element obtained in Comparative Example 1 was standardized at each of wavelengths of 450 nm, 580 nm, and 650 nm to 1 to obtain a relative value of the rise time of each photoelectric conversion element, and the value thus obtained was evaluated according to the standard described below.

In terms of practicality, "A", "B", "C", and "D" are preferable evaluation results, and "A", "B", and "C" are more preferable evaluation results.

<Evaluation Standard>

"A": less than 0.1

"B": 0.1 or more and less than 0.3

"C": 0.3 or more and less than 0.7

"D": 0.7 or more and less than 1.0

"E": 1.0 or more

The results are shown in Table 1.

The column "Remark" in Table 1 represents the main feature points of Examples 1 to 34.

In Table 1, the column "Formula (2)" indicates whether or not a compound is a coloring agent represented by Formula (2). A case where the compound is the coloring agent represented by Formula (2) is evaluated as "A", and a case where the compound is not the coloring agent represented by Formula (2) is evaluated as "B"

In Table 1, the column "Formula (3)" indicates whether or not a compound is a coloring agent represented by Formula (3). A case where the compound is the coloring agent represented by Formula (3) is evaluated as "A", and a case where the compound is not the coloring agent represented by Formula (3) is evaluated as "B"

In Table 1, in a case where the coloring agent is applied to the compound represented by Formula (1), Formula (2), or Formula (3), the column "$R^{a1}$/$R^{b1}$/$R^{c1}$" indicates that the group represented by $R^{a1}$, $R^{b1}$, or $R^{c1}$ is an aryl group, a heteroaryl group, an alkenyl group, or an alkynyl group, which may have a substituent. A case where the group represented by $R^{a1}$, $R^{b1}$, or $R^{c1}$ corresponds to the above-described group is evaluated as "A", and a case where the group represented by $R^{a1}$, $R^{b1}$, or $R^{c1}$ does not correspond to the above-described group is evaluated as "B".

In Table 1, the column "$R^{c4}$" indicates whether or not a group represented by $R^{c4}$ in a case where a coloring agent is applied to the compound represented by Formula (3) is an alkyl group, an aryl group, or a heteroaryl group, which may have a substituent, in the case where the compound is the coloring agent represented by Formula (3). A case where the group represented by $R^{c4}$ corresponds to the above-described group is evaluated as "A", and a case where the group represented by $R^{c4}$ does not correspond to the above-described group is evaluated as "B". The compounds, which are not applied to Formula (3), were denoted by "-".

In Table 1, the column "$Y^{11}$/$Y^{41}$/$Y^{51}$" indicates whether or not the group represented by $Y^{11}$, $Y^{41}$, or $Y^{51}$ is an oxygen atom in the case where the coloring agent is applied to a compound represented by Formula (1), Formula (2), or Formula (3). A case where the group represented by $Y^{11}$, $Y^{41}$, or $Y^{51}$ is an oxygen atom is evaluated as "A", and a case where the group represented by $Y^{11}$, $Y^{41}$, or $Y^{51}$ is not an oxygen atom is evaluated as "B".

TABLE 1

| | Photoelectric conversion film: Coloring agent (specific compound or comparative compound) | p-type semi-conductor material | n-type semi-conductor material | Evaluation: External quantum efficiency 430 nm | 580 nm | 630 nm | Responsiveness 430 nm | 580 nm | 630 nm | Remark: Formula (2) | Formula (3) | $R^{a1}/R^{b1}/R^{c1}$ | $R^{c4}$ | $Y^{11}Y^{41}Y^{51}$ |
|---|---|---|---|---|---|---|---|---|---|---|---|---|---|---|
| Example 1 | D-1 | — | C60 | A | A | A | B | B | B | A | A | A | A | A |
| Example 2 | D-2 | — | C60 | A | A | A | B | B | B | A | A | A | A | A |
| Example 3 | D-3 | — | C60 | A | A | A | B | B | B | A | A | A | A | A |
| Example 4 | D-4 | — | C60 | A | A | A | B | B | B | A | A | A | A | A |
| Example 5 | D-5 | — | C60 | A | A | A | B | B | B | A | A | A | A | A |
| Example 6 | D-6 | — | C60 | A | A | A | B | B | B | A | A | A | A | A |
| Example 7 | D-7 | — | C60 | A | A | A | B | B | B | A | A | A | A | A |
| Example 8 | D-8 | — | C60 | B | B | A | B | B | B | A | A | A | A | B |
| Example 9 | D-9 | — | C60 | B | A | B | B | B | B | A | A | A | B | A |
| Example 10 | D-10 | — | C60 | B | A | B | B | B | B | A | A | B | A | A |
| Example 11 | D-11 | — | C60 | B | B | B | B | B | B | A | A | A | B | B |
| Example 12 | D-12 | — | C60 | B | B | B | B | B | B | A | A | B | A | B |
| Example 13 | D-13 | — | C60 | B | B | B | B | B | B | A | A | B | B | A |
| Example 14 | D-14 | — | C60 | C | C | C | C | C | C | A | A | B | B | B |
| Example 15 | D-15 | — | C60 | C | B | C | C | C | C | A | B | A | — | A |
| Example 16 | D-16 | — | C60 | C | B | C | C | C | C | A | B | A | — | A |
| Example 17 | D-17 | — | C60 | C | B | C | C | C | C | A | B | A | — | A |
| Example 18 | D-18 | — | C60 | C | C | C | C | C | C | B | B | A | — | A |
| Example 19 | D-19 | — | C60 | C | C | C | C | C | C | B | B | A | — | A |
| Example 20 | D-20 | — | C60 | C | C | C | C | C | C | B | B | A | — | A |
| Example 21 | D-21 | — | C60 | D | C | D | C | C | C | A | B | B | — | B |
| Example 22 | D-22 | — | C60 | D | C | D | C | C | C | A | B | B | — | B |
| Example 23 | D-23 | — | C60 | D | C | D | C | C | C | A | B | B | — | B |
| Example 24 | D-24 | — | C60 | D | C | D | D | D | D | B | B | B | — | B |
| Example 25 | D-25 | — | C60 | D | C | D | D | D | D | B | B | B | — | B |
| Example 26 | D-26 | — | C60 | D | C | D | D | D | D | B | B | B | — | B |
| Example 27 | D-1 | P-1 | C60 | A | A | A | A | A | A | A | A | A | A | A |
| Example 28 | D-2 | P-1 | C60 | A | A | A | A | A | A | A | A | A | A | A |
| Example 29 | D-1 | P-2 | C60 | A | A | A | A | A | A | A | A | A | A | A |
| Example 30 | D-2 | P-2 | C60 | A | A | A | A | A | A | A | A | A | A | A |
| Example 31 | D-1 | P-3 | C60 | A | A | A | A | A | A | A | A | A | A | A |
| Example 32 | D-2 | P-3 | C60 | A | A | A | A | A | A | A | A | A | A | A |
| Example 33 | D-1 | P-4 | C60 | A | A | A | A | A | A | A | A | A | A | A |
| Example 34 | D-2 | P-4 | C60 | A | A | A | A | A | A | A | A | A | A | A |
| Comparative Example 1 | R-1 | — | C60 | E | E | E | E | E | E | — | — | — | — | — |
| Comparative Example 2 | R-2 | — | C60 | E | D | E | E | E | E | — | — | — | — | — |
| Comparative Example 3 | R-3 | — | C60 | E | E | E | E | E | E | — | — | — | — | — |
| Comparative Example 4 | R-1 | P-1 | C60 | E | E | D | D | D | D | — | — | — | — | — |

It was confirmed from the result of Table 1 that the photoelectric conversion elements obtained in Examples exhibit excellent external quantum efficiency and responsiveness to light at all wavelengths in the red wavelength region, the green wavelength region, and the blue wavelength region.

In addition, it was confirmed that the external quantum efficiency and/or responsiveness of the specific compound that is the compound represented by Formula (2) (preferably, the compound represented by Formula (3)) is more excellent (for example, see a comparison between Example 14 and Examples 21 to 26, and a comparison between Example 9, Examples 15 to 17, and Examples 18 to 20).

Furthermore, it was confirmed that the external quantum efficiency and/or responsiveness of the specific compound is more excellent in the case where the specific compound is the compound represented by any one of Formulae (1) to (3), the group represented by $R^{a1}$, $R^{b1}$, or $R^{c1}$ is an aryl group, a heteroaryl group, an alkenyl group, or an alkynyl group, which may have a substituent, and the group represented by $Y^{11}$, $Y^{41}$, or $Y^{51}$ is an oxygen atom (for example, see a comparison between Example 9 and Example 14, a comparison between Examples 18 to 20 and Examples 24 to 26, and a comparison between Examples 15 to 17 and Examples 21 to 23).

Furthermore, it was confirmed that in the case where the specific compound is the compound represented by Formula (3) and satisfies one or more of the following (X1) to (X3) (preferably satisfies two or more, and more preferably satisfies all of (X1) to (X3)), the external quantum efficiency and/or responsiveness of the specific compound is more excellent (see a comparison between Examples 1 to 14).

(X1) A group represented by $R^{c1}$ is an aryl group, a heteroaryl group, an alkenyl group, or an alkynyl group, which may have a substituent.

(X2) A group represented by $Y^{51}$ is an oxygen atom.

(X3) A group represented by $R^{c4}$ is an alkyl group, an aryl group, or a heteroaryl group, which may have a substituent.

Furthermore, it was confirmed that the external quantum efficiency and/or responsiveness of the specific compound is more excellent in the case where the photoelectric conversion film includes the p-type semiconductor material in addition to the specific compound and the n-type semiconductor material (see a comparison between Examples 1 to 7 and Examples 27 to 34).

It was clarified that the photoelectric conversion elements obtained in Comparative Examples did not satisfy the desired demands.

In Comparative Example 1, the comparative compound (R-1) does not satisfy the condition B. That is, the comparative compound (R-1) has a substituent represented by Formula (DK-3). In addition, in Comparative Example 2, the comparative compound (R-2) does not satisfy the condition A. Furthermore, in Comparative Example 3, the comparative compound (R-3) does not satisfy the condition B. That is, the comparative compound (R-3) has a substituent represented by Formula (DK-2).

EXPLANATION OF REFERENCES

10*a*, 10*b*: Photoelectric conversion element

11: Conductive film (lower electrode)

12: Photoelectric conversion film

15: Transparent conductive film (upper electrode)

16A: Electron blocking film

16B: Positive hole blocking film

What is claimed is:

1. A photoelectric conversion element comprising, in the following order:

a conductive film;

a photoelectric conversion film; and a transparent conductive film, wherein the photoelectric conversion film contains a compound represented by Formula (1), (1)

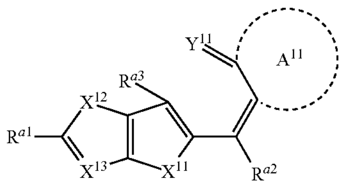

in Formula (1), $X^{11}$ and $X^{12}$ each independently represent an oxygen atom, a sulfur atom, a selenium atom, or $-NR^{a4}-$, $X^{13}$ represents a nitrogen atom, $R^{a1}$ to $R^{a4}$ each independently represent a hydrogen atom or a substituent, $A^{11}$ represents a ring containing at least two carbon atoms, $Y^{11}$ represents an oxygen atom, a sulfur atom, $=NR^{a6}$ or $=CR^{a7}R^{a8}$, $R^{a6}$ represents a hydrogen atom or a substituent, $R^{a7}$ and $R^{as}$ each independently represent a cyano group or $-COOR^{a9}$, $R^{ag}$ represents an alkyl group, an aryl group, or a heteroaryl group, which may have a substituent.

2. The photoelectric conversion element according to claim 1, wherein the compound represented by Formula (1) is a compound represented by Formula (3), (3)

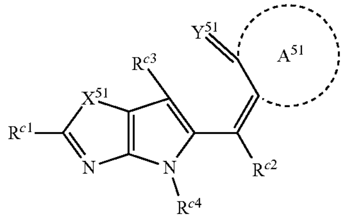

in Formula (3), $X^{51}$ represents an oxygen atom, a sulfur atom, a selenium atom, or $-NR^{c5}-$, $R^{c1}$ to $R^{c5}$ each independently represent a hydrogen atom or a substituent, $A^{51}$ represents a ring containing at least two carbon atoms, $Y^{51}$ represents an oxygen atom, a sulfur atom, $=NR^{c6}$, or $=CR^{c7}R^{c8}$, $R^{c6}$ represents a hydrogen atom or a substituent, $R^{c7}$ and $R^{c8}$ each independently represent a cyano group or $-COOR^{c9}$, and $R^{c9}$ represents an alkyl group, an aryl group, or a heteroaryl group, which may have a substituent.

3. The photoelectric conversion element according to claim 2, wherein in Formula (3), $R^{c4}$ represents an alkyl group, an aryl group, or a heteroaryl group, which may have a substituent.

4. The photoelectric conversion element according to claim 3, wherein in Formula (3), $Y^{51}$ represents an oxygen atom.

5. The photoelectric conversion element according to claim 2, wherein in Formula (3), $Y^{51}$ represents an oxygen atom.

6. The photoelectric conversion element according to claim 1, wherein the photoelectric conversion film further contains a n-type semiconductor material, and has a bulk hetero structure formed in a state where the compound represented by Formula (1) and the n-type semiconductor material are mixed with each other.

7. The photoelectric conversion element according to claim 1, wherein the photoelectric conversion film further contains a p-type semiconductor material.

8. The photoelectric conversion element according to claim 1, further comprising one or more interlayers between the conductive film and the transparent conductive film, in addition to the photoelectric conversion film.

9. An imaging element comprising the photoelectric conversion element according to claim 1.

10. An optical sensor comprising the photoelectric conversion element according to claim 1.

11. A compound represented by Formula (1), (1)

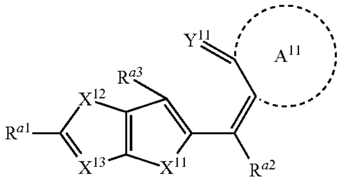

in Formula (1), $X^{11}$ and $X^{12}$ each independently represent an oxygen atom, a sulfur atom, a selenium atom, or $-NR^{a4}-$, $X^{13}$ represents a nitrogen atom, $R^{a1}$ to $R^{a4}$ each independently represent a hydrogen atom or a substituent, $A^{11}$ represents a ring containing at least two carbon atoms, $Y^{11}$ represents an oxygen atom, a sulfur atom, $=NR^{a6}$ or $=CR^{a7}R^{a8}$, $R^{a6}$ represents a hydrogen atom or a substituent, $R^{a7}$ and $R^{a8}$ each independently represent a cyano group or $-COOR^{a9}$, $R^{ag}$ represents an alkyl group, an aryl group or a heteroaryl group, which may have a substituent.

12. The compound according to claim 11, wherein the compound is represented by Formula (3),

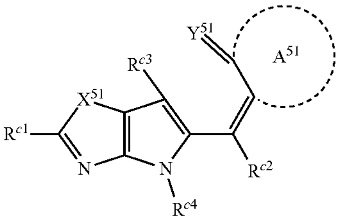
(3)

in Formula (3), $X^{51}$ represents an oxygen atom, a sulfur atom, a selenium atom, or $-NR^{c5}-$, $R^{c1}$ to $R^{c5}$ each independently represent a hydrogen atom or a substituent, $A^{51}$ represents a ring containing at least two carbon atoms, $Y^{51}$ represents an oxygen atom, a sulfur atom, $=NR^{c6}$, or $=CR^{c7}R^{c8}$, $R^{c6}$ represents a hydrogen atom or a substituent, $R^{c7}$ and $R^{c8}$ each independently represent a cyano group or $-COOR^{c9}$, and $R^{c9}$ represents an alkyl group, an aryl group, or a heteroaryl group, which may have a substituent.

13. The compound according to claim 12, wherein in Formula (3), $R^{c4}$ represents an alkyl group, an aryl group, or a heteroaryl group, which may have a substituent.

14. The compound according to claim 12, wherein in Formula (3), $Y^{51}$ represents an oxygen atom.

* * * * *